US008633766B2

(12) United States Patent
Khlat et al.

(10) Patent No.: US 8,633,766 B2
(45) Date of Patent: Jan. 21, 2014

(54) PSEUDO-ENVELOPE FOLLOWER POWER MANAGEMENT SYSTEM WITH HIGH FREQUENCY RIPPLE CURRENT COMPENSATION

(75) Inventors: Nadim Khlat, Cugnaux (FR); Michael R. Kay, Summerfield, NC (US); Philippe Gorisse, Brax (FR)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/316,229

(22) Filed: Dec. 9, 2011

(65) Prior Publication Data

US 2012/0313701 A1 Dec. 13, 2012

Related U.S. Application Data

(63) Continuation-in-part of application No. 13/089,917, filed on Apr. 19, 2011, now Pat. No. 8,493,141, and a continuation-in-part of application No. 13/218,400, filed on Aug. 25, 2011, now Pat. No. 8,519,788, which is a continuation-in-part of application No. 13/089,917, filed on Apr. 19, 2011, now Pat. No. 8,493,141.

(60) Provisional application No. 61/421,348, filed on Dec. 9, 2010, provisional application No. 61/421,475, filed on Dec. 9, 2010, provisional application No. 61/469,276, filed on Mar. 30, 2011, provisional application No. 61/325,659, filed on Apr. 19, 2010, provisional application No. 61/376,877, filed on Aug. 25, 2010.

(51) Int. Cl.
*H03G 3/00* (2006.01)

(52) U.S. Cl.
USPC ......... 330/127; 330/297; 455/127.1; 323/222

(58) Field of Classification Search
USPC ................. 330/127, 297; 455/127.1; 323/222
See application file for complete search history.

(56) References Cited

U.S. PATENT DOCUMENTS

| | | |
|---|---|---|
| 4,996,500 A | 2/1991 | Larson et al. |
| 5,311,309 A | 5/1994 | Ersoz et al. |

(Continued)

FOREIGN PATENT DOCUMENTS

| | | |
|---|---|---|
| EP | 0755121 A2 | 1/1997 |
| EP | 1492227 A1 | 12/2004 |

(Continued)

OTHER PUBLICATIONS

International Search Report for PCT/US2012/023495 mailed May 7, 2012, 13 pages.

(Continued)

*Primary Examiner* — Patricia Nguyen
(74) *Attorney, Agent, or Firm* — Withrow & Terranova, P.L.L.C.

(57) ABSTRACT

Embodiments disclosed in the detailed description relate to a pseudo-envelope follower power management system including a parallel amplifier and a switch mode power supply converter cooperatively coupled to generate a power supply voltage at a power supply output coupled to a linear RF power amplifier. The parallel amplifier output is in communication with the power amplifier supply output. The parallel amplifier governs operation of the switch mode power supply converter and regulates the power amplifier supply voltage base on a $V_{RAMP}$ signal. The parallel amplifier circuit includes an open loop high frequency compensation assist circuit that generates a high frequency ripple compensation current based on an estimate of the high frequency ripple currents contained in a ripple current of the power inductor. The high frequency ripple compensation current is injected into the parallel amplifier circuit output to cancel out high frequency ripple currents at the power amplifier supply output.

33 Claims, 119 Drawing Sheets

(56) References Cited

U.S. PATENT DOCUMENTS

| | | | |
|---|---|---|---|
| 5,351,087 | A | 9/1994 | Christopher et al. |
| 5,414,614 | A | 5/1995 | Fette et al. |
| 5,420,643 | A | 5/1995 | Romesburg et al. |
| 5,486,871 | A | 1/1996 | Filliman et al. |
| 5,532,916 | A | 7/1996 | Tamagawa |
| 5,581,454 | A | 12/1996 | Collins |
| 5,646,621 | A | 7/1997 | Cabler et al. |
| 5,715,526 | A | 2/1998 | Weaver, Jr. et al. |
| 5,767,744 | A | 6/1998 | Irwin et al. |
| 5,822,318 | A | 10/1998 | Tiedemann, Jr. et al. |
| 5,898,342 | A * | 4/1999 | Bell .............................. 330/297 |
| 5,905,407 | A | 5/1999 | Midya |
| 5,936,464 | A | 8/1999 | Grondahl |
| 6,043,610 | A | 3/2000 | Buell |
| 6,043,707 | A | 3/2000 | Budnik |
| 6,055,168 | A | 4/2000 | Kotowski et al. |
| 6,070,181 | A | 5/2000 | Yeh |
| 6,118,343 | A | 9/2000 | Winslow |
| 6,141,541 | A | 10/2000 | Midya et al. |
| 6,147,478 | A | 11/2000 | Skelton et al. |
| 6,198,645 | B1 | 3/2001 | Kotowski et al. |
| 6,204,731 | B1 | 3/2001 | Jiang et al. |
| 6,256,482 | B1 | 7/2001 | Raab |
| 6,300,826 | B1 | 10/2001 | Mathe et al. |
| 6,348,780 | B1 | 2/2002 | Grant |
| 6,559,689 | B1 | 5/2003 | Clark |
| 6,583,610 | B2 | 6/2003 | Groom et al. |
| 6,617,930 | B2 | 9/2003 | Nitta |
| 6,621,808 | B1 | 9/2003 | Sadri |
| 6,624,712 | B1 | 9/2003 | Cygan et al. |
| 6,658,445 | B1 | 12/2003 | Gau et al. |
| 6,681,101 | B1 | 1/2004 | Eidson et al. |
| 6,690,652 | B1 | 2/2004 | Sadri |
| 6,701,141 | B2 | 3/2004 | Lam |
| 6,728,163 | B2 | 4/2004 | Gomm et al. |
| 6,819,938 | B2 | 11/2004 | Sahota |
| 6,995,995 | B2 | 2/2006 | Zeng et al. |
| 7,058,373 | B2 * | 6/2006 | Grigore ...................... 455/127.1 |
| 7,164,893 | B2 | 1/2007 | Leizerovich et al. |
| 7,233,130 | B1 | 6/2007 | Kay |
| 7,411,316 | B2 | 8/2008 | Pai |
| 7,528,807 | B2 | 5/2009 | Kim et al. |
| 7,529,523 | B1 | 5/2009 | Young et al. |
| 7,539,466 | B2 | 5/2009 | Tan et al. |
| 7,595,569 | B2 | 9/2009 | Amerom et al. |
| 7,609,114 | B2 | 10/2009 | Hsieh et al. |
| 7,615,979 | B2 | 11/2009 | Caldwell |
| 7,627,622 | B2 | 12/2009 | Conrad et al. |
| 7,646,108 | B2 | 1/2010 | Paillet et al. |
| 7,653,366 | B2 | 1/2010 | Grigore |
| 7,696,735 | B2 | 4/2010 | Oraw et al. |
| 7,715,811 | B2 | 5/2010 | Kenington |
| 7,724,837 | B2 | 5/2010 | Filimonov et al. |
| 7,773,691 | B2 | 8/2010 | Khlat et al. |
| 7,777,459 | B2 | 8/2010 | Williams |
| 7,782,036 | B1 | 8/2010 | Wong et al. |
| 7,783,269 | B2 | 8/2010 | Vinayak et al. |
| 7,805,115 | B1 | 9/2010 | McMorrow et al. |
| 7,859,336 | B2 | 12/2010 | Markowski et al. |
| 7,880,547 | B2 | 2/2011 | Lee et al. |
| 7,894,216 | B2 | 2/2011 | Melanson |
| 7,907,010 | B2 * | 3/2011 | Wendt et al. .................. 330/251 |
| 7,923,974 | B2 | 4/2011 | Martin et al. |
| 7,994,864 | B2 | 8/2011 | Chen et al. |
| 8,000,117 | B2 | 8/2011 | Petricek |
| 8,008,970 | B1 | 8/2011 | Homol et al. |
| 8,022,761 | B2 | 9/2011 | Drogi et al. |
| 8,026,765 | B2 | 9/2011 | Giovannotto |
| 8,068,622 | B2 | 11/2011 | Melanson et al. |
| 8,081,199 | B2 | 12/2011 | Takata et al. |
| 8,093,951 | B1 | 1/2012 | Zhang et al. |
| 8,164,388 | B2 | 4/2012 | Iwamatsu |
| 8,174,313 | B2 | 5/2012 | Vice et al. |
| 8,198,941 | B2 | 6/2012 | Lesso |
| 8,204,456 | B2 | 6/2012 | Xu et al. |
| 8,542,061 | B2 | 9/2013 | Levesque et al. |
| 2002/0071497 | A1 | 6/2002 | Bengtsson et al. |
| 2003/0017286 | A1 | 1/2003 | Williams et al. |
| 2003/0031271 | A1 | 2/2003 | Bozeki et al. |
| 2003/0062950 | A1 | 4/2003 | Hamada et al. |
| 2003/0137286 | A1 | 7/2003 | Kimball et al. |
| 2003/0206603 | A1 | 11/2003 | Husted |
| 2003/0220953 | A1 | 11/2003 | Allred |
| 2003/0232622 | A1 | 12/2003 | Seo et al. |
| 2004/0047329 | A1 | 3/2004 | Zheng |
| 2004/0124913 | A1 | 7/2004 | Midya et al. |
| 2004/0196095 | A1 | 10/2004 | Nonaka |
| 2004/0219891 | A1 | 11/2004 | Hadjichristos |
| 2004/0266366 | A1 | 12/2004 | Robinson et al. |
| 2004/0267842 | A1 | 12/2004 | Allred |
| 2005/0008093 | A1 | 1/2005 | Matsuura et al. |
| 2005/0032499 | A1 | 2/2005 | Cho |
| 2005/0047180 | A1 | 3/2005 | Kim |
| 2005/0064830 | A1 | 3/2005 | Grigore |
| 2005/0093630 | A1 | 5/2005 | Whittaker et al. |
| 2005/0122171 | A1 | 6/2005 | Miki et al. |
| 2005/0156662 | A1 | 7/2005 | Raghupathy et al. |
| 2005/0157778 | A1 | 7/2005 | Trachewsky et al. |
| 2006/0128324 | A1 | 6/2006 | Tan et al. |
| 2006/0178119 | A1 | 8/2006 | Jarvinen |
| 2006/0181340 | A1 | 8/2006 | Dhuyvetter |
| 2006/0244513 | A1 | 11/2006 | Yen et al. |
| 2007/0014382 | A1 | 1/2007 | Shakeshaft et al. |
| 2007/0024360 | A1 | 2/2007 | Markowski |
| 2007/0183532 | A1 | 8/2007 | Matero |
| 2007/0259628 | A1 | 11/2007 | Carmel et al. |
| 2008/0044041 | A1 | 2/2008 | Tucker et al. |
| 2008/0081572 | A1 | 4/2008 | Rofougaran |
| 2008/0150619 | A1 | 6/2008 | Lesso et al. |
| 2008/0205095 | A1 * | 8/2008 | Pinon et al. ..................... 363/39 |
| 2008/0242246 | A1 | 10/2008 | Minnis et al. |
| 2008/0252278 | A1 | 10/2008 | Lindeberg et al. |
| 2008/0280577 | A1 | 11/2008 | Beukema et al. |
| 2009/0004981 | A1 | 1/2009 | Eliezer et al. |
| 2009/0097591 | A1 | 4/2009 | Kim |
| 2009/0167260 | A1 | 7/2009 | Pauritsch et al. |
| 2009/0174466 | A1 | 7/2009 | Hsieh et al. |
| 2009/0190699 | A1 | 7/2009 | Kazakevich et al. |
| 2009/0218995 | A1 | 9/2009 | Ahn |
| 2009/0289720 | A1 | 11/2009 | Takinami et al. |
| 2009/0319065 | A1 | 12/2009 | Risbo |
| 2010/0017553 | A1 | 1/2010 | Laurencin et al. |
| 2010/0171553 | A1 | 7/2010 | Okubo et al. |
| 2010/0301947 | A1 | 12/2010 | Fujioka et al. |
| 2010/0308654 | A1 | 12/2010 | Chen |
| 2010/0311365 | A1 | 12/2010 | Vinayak et al. |
| 2010/0321127 | A1 | 12/2010 | Watanabe et al. |
| 2011/0018626 | A1 | 1/2011 | Kojima |
| 2011/0084760 | A1 | 4/2011 | Guo et al. |
| 2011/0148375 | A1 | 6/2011 | Tsuji |
| 2011/0235827 | A1 | 9/2011 | Lesso et al. |
| 2012/0034893 | A1 | 2/2012 | Baxter et al. |
| 2012/0068767 | A1 | 3/2012 | Henshaw et al. |
| 2012/0133299 | A1 | 5/2012 | Capodivacca et al. |
| 2012/0139516 | A1 | 6/2012 | Tsai et al. |
| 2012/0170334 | A1 | 7/2012 | Menegoli et al. |
| 2012/0176196 | A1 | 7/2012 | Khlat |
| 2012/0236444 | A1 | 9/2012 | Srivastava et al. |
| 2012/0299647 | A1 | 11/2012 | Honjo et al. |
| 2013/0034139 | A1 | 2/2013 | Khlat et al. |

FOREIGN PATENT DOCUMENTS

| | | | |
|---|---|---|---|
| EP | 1569330 | A1 | 8/2005 |
| EP | 2214304 | A1 | 8/2010 |
| EP | 2244366 | A1 | 10/2010 |
| GB | 2462204 | A | 2/2010 |
| GB | 2465552 | A | 5/2010 |
| WO | 0048306 | A1 | 8/2000 |
| WO | 2004002006 | A1 | 12/2003 |
| WO | 2004082135 | A2 | 9/2004 |
| WO | 2005013084 | A2 | 2/2005 |
| WO | 2006073208 | A1 | 7/2006 |

(56) References Cited

FOREIGN PATENT DOCUMENTS

OTHER PUBLICATIONS

Hekkala, A. et al., "Adaptive time misalignment compensation in envelope tracking amplifiers," International Symposium on Spread Spectrum Techniques and Applications, Aug. 2008, pp. 761-765.
Invitation to Pay Additional Fees and Where Applicable Protest Fee for PCT/US2012/024124 mailed Jun. 1, 2012, 7 pages.
Dixon, N., "Standardization boosts momentum for Envelope tracking," Microwave Engineers, Europe, Apr. 20, 2011, 2 pages, http://www.mwee.com/en/standardisation-boosts-momentum-for-envelope-tracking.html? cmp_ids=71&news_ids=222901746.
Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.
Le, Hanh-Phuc et al., "A 32nm Fully Integrated Reconfigurable Switched-Capacitor DC-DC Convertor Delivering 0.55W/mm^2 at 81% Efficiency," 2010 IEEE International Solid State Circuits Conference, Feb. 20-24, 2010, pp. 210-212.
Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.
Unknown, "Nujira files 100th envelope tracking patent," CS: Compound Semiconductor, Apr. 11, 2011, 1 page.
Non-final Office Action for U.S. Appl. No. 12/112,006 mailed Apr. 5, 2010, 6 pages.
Notice of Allowance for U.S. Appl. No. 12/112,006 mailed Jul. 19, 2010, 6 pages.
International Search Report for PCT/US11/033037 mailed Aug. 9, 2011, 10 pages.
International Search Report for PCT/US2011/044857 mailed Oct. 24, 2011, 10 pages.
International Search Report for PCT/US11/49243 mailed Dec. 22, 2011, 9 pages.
Non-final Office Action for U.S. Appl. No. 11/113,873, now Patent No. 7,773,691 mailed Feb. 1, 2008, 17 pages.
Final Office Action for U.S. Appl. No. 11/113,873, now Patent No. 7,773,691, mailed Jul. 30, 2008, 19 pages.
Non-final Office Action for U.S. Appl. No. 11/113,873, now Patent No. 7,773,691, mailed Nov. 26, 2008, 22 pages.
Final Office Action for U.S. Appl. No. 11/113,873, now Patent No. 7,773,691, mailed May 4, 2009, 20 pages.
Non-final Office Action for U.S. Appl. No. 11/113,873, now Patent No. 7,773,691, mailed Feb. 3, 2010, 21 pages.
Notice of Allowance for U.S. Appl. No. 11/113,873, now Patent No. 7,773,691, mailed Jun. 9, 2010, 7 pages.
Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.
International Search Report for PCT/US06/12619 mailed May 8, 2007, 2 pages.
International Search Report for PCT/US2011/061009 mailed Feb. 8, 2012, 14 pages.
Invitation to Pay Additional Fees and Where Applicable Protest Fee for PCT/US2011/061007 mailed Feb. 13, 2012, 7 pages.
Kim et al., "High Efficiency and Wideband Envelope Tracking Power Amplifiers with Sweet Spot Tracking," 2010 IEEE Radio Frequency Integrated Circuits Symposium, May 23-25, 2010, pp. 255-258.
International Search Report for PCT/US2011/064255 mailed Apr. 3, 2012, 12 pages.
Extended European Search Report for application 06740532.4 mailed Dec. 7, 2010, 7 pages.
Choi, J. et al., "A New Power Management IC Architecture for Envelope Tracking Power Amplifier," IEEE Transactions on Microwave Theory and Techniques, vol. 59, No. 7, Jul. 2011, pp. 1796-1802.
Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.
Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.
International Search Report for PCT/US2011/061007 mailed Aug. 16, 2012, 16 pages.
International Search Report for PCT/US2012/024124 mailed Aug. 24, 2012, 14 pages.
International Search Report for US PCT/US2012/036858 mailed Aug. 9, 2012, 7 pages.
International Search Report for US PCT/US2012/036858 mailed Aug. 10, 2012, 8 pages.
International Preliminary Report on Patentability for PCT/US2011/033037 mailed Oct. 23, 2012, 7 pages.
International Preliminary Report on Patentability for PCT/US11/49243 mailed Nov. 13, 2012, 33 pages.
Non-final Office Action for U.S. Appl. No. 13/218,400 mailed Nov. 8, 2012, 7 pages.
Notice of Allowance for U.S. Appl. No. 13/316,229 mailed Nov. 14, 2012, 9 pages.
Non-final Office Action for U.S. Appl. No. 13/222,484 mailed Nov. 8, 2012, 9 pages.
Non-final Office Action for U.S. Appl. No. 13/089,917 mailed Nov. 23, 2012, 6 pages.
Non final Office Action for U.S. Appl. No. 13/222,453 mailed Dec. 6, 2012, 13 pages.
Notice of Allowance for U.S. Appl. No. 13/188,024, mailed Jun. 18, 2013, 7 pages.
International Preliminary Report on Patentability for PCT/US2011/054106 mailed Apr. 11, 2013, 8 pages.
International Preliminary Report on Patentability for PCT/US2011/061007 mailed May 30, 2013, 11 pages.
International Preliminary Report on Patentability for PCT/US2011/061009 mailed May 30, 2013, 10 pages.
Non-Final Office Action for U.S. Appl. No. 13/423,649, mailed May 22, 2013, 7 pages.
Advisory Action for U.S. Appl. No. 13/222,484, mailed Jun. 14, 2013, 3 pages.
International Preliminary Report on Patentability for PCT/US2011/064255, mailed Jun. 20, 2013, 7 pages.
Notice of Allowance for U.S. Appl. No. 13/343,840, mailed Jul. 1, 2013, 8 pages.
International Search Report for PCT/US2011/054106 mailed Feb. 9, 2012, 11 pages.
International Search Report for PCT/US12/40317 mailed Sep. 7, 2012, 7 pages.
International Search Report for PCT/US2012/046887 mailed Dec. 21, 2012, 12 pages.
Non-Final Office Action for U.S. Appl. No. 13/188,024 mailed Feb. 5, 2013, 8 pages.
International Search Report for PCT/US2012/062070 mailed Jan. 21, 2013, 12 pages.
International Preliminary Report on Patentability for PCT/US2011/044857 mailed Mar. 7, 2013, 6 pages.
Notice of Allowance for U.S. Appl. No. 13/218,400 mailed Apr. 11, 2013, 7 pages.
Non-Final Office Action for U.S. Appl. No. 13/297,470 mailed May 8, 2013, 15 pages.
Notice of Allowance for U.S. Appl. No. 13/222,453 mailed Feb. 21, 2013, 7 pages.
Final Office Action for U.S. Appl. No. 13/222,484 mailed Apr. 10, 2013, 10 pages.
International Search Report and Written Opinion for PCT/US2012/053654 mailed Feb. 15, 2013, 11 pages.
International Search Report and Written Opinion for PCT/US2012/067230 mailed Feb. 21, 2013, 10 pages.
International Preliminary Report on Patentability for PCT/US2012/024124, mailed Aug. 22, 2013, 8 pages.

(56) References Cited

OTHER PUBLICATIONS

International Preliminary Report on Patentability for PCT/US2012/023495, mailed Aug. 15, 2013, 10 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/222,484, mailed Aug. 26, 2013, 8 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/602,856, mailed Sep. 24, 2013, 9 pages.
Notice of Allowance for U.S. Appl. No. 13/423,649, mailed Aug. 30, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/363,888, mailed Jul. 18, 2013, 9 pages.
Non-Final Office Action for U.S. Appl. No. 12/836,307, mailed Nov. 5, 2013, 6 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.

* cited by examiner

PSEUDO-ENVELOPE FOLLOWER POWER MANAGEMENT SYSTEM WITH HIGH FREQUENCY RIPPLE CURRENT COMPENSATION

RELATED APPLICATIONS

The present application claims priority to U.S. Provisional Patent Application No. 61/421,348, filed Dec. 9, 2010.

The present application claims priority to U.S. Provisional Patent Application No. 61/421,475, filed Dec. 9, 2010.

The present application claims priority to U.S. Provisional Patent Application No. 61/469,276, filed Mar. 30, 2011.

The present application claims priority to and is a continuation-in-part of U.S. patent application Ser. No. 13/089,917, filed Apr. 19, 2011, entitled "PSEUDO-ENVELOPE FOLLOWING POWER MANAGEMENT SYSTEM," which claims priority to U.S. Provisional Patent Application No. 61/325,659, filed Apr. 19, 2010.

The present application claims priority to and is a continuation-in-part of U.S. patent application Ser. No. 13/218,400, filed Aug. 25, 2011, entitled "BOOST CHARGE-PUMP WITH FRACTIONAL RATIO AND OFFSET LOOP FOR SUPPLY MODULATION," which claims priority to U.S. Provisional Patent Application No. 61/376,877, filed Aug. 25, 2010. U.S. patent application Ser. No. 13/218,400, is a continuation-in-part of U.S. patent application Ser. No. 13/089,917, filed Apr. 19, 2011, which claims priority to U.S. Provisional Patent Application No. 61/325,659, filed Apr. 19, 2010.

All of the applications listed above are hereby incorporated herein by reference in their entireties.

FIELD OF THE DISCLOSURE

The embodiments described herein relate to a power management system for delivering current to a linear RF power amplifier. More particularly, the embodiments relate to the use of a pseudo-envelope tracker in a power management system of mobile communications equipment.

BACKGROUND

Next-generation mobile devices are morphing from voice-centric telephones to message and multimedia-based "smart" phones that offer attractive new features. As an example, smart phones offer robust multimedia features such as web-browsing, audio and video playback and streaming, email access and a rich gaming environment. But even as manufacturers race to deliver ever more feature rich mobile devices, the challenge of powering them looms large.

In particular, the impressive growth of high bandwidth applications for radio-frequency (RF) hand-held devices has led to increased demand for efficient power saving techniques to increase battery life. Because the power amplifier of the mobile device consumes a large percentage of the overall power budget of the mobile device, various power management systems have been proposed to increase the overall power efficiency of the power amplifier.

As an example, some power managements systems may use a $V_{RAMP}$ power control voltage to control the voltage presented on a power amplifier collector of a linear RF power amplifier. As another example, other power management schemes may use a buck converter power supply and a class AB amplifier in tandem to provide power to the linear RF power amplifier.

Even so, there remains a need to further improve the power efficiency of mobile devices to provide extended battery life. As a result, there is a need to improve the power management system of mobile devices.

SUMMARY

Embodiments disclosed in the detailed description relate to a pseudo-envelope follower power management system including a parallel amplifier and a switch mode power supply converter cooperatively coupled to generate a power supply voltage at a power supply output coupled to a linear RF power amplifier. The parallel amplifier output is in communication with the power amplifier supply output. The parallel amplifier governs operation of the switch mode power supply converter and regulates the power amplifier supply voltage base on a $V_{RAMP}$ signal. The parallel amplifier circuit includes an open loop high frequency compensation assist circuit that generates a high frequency ripple compensation current based on an estimate of the high frequency ripple currents contained in a ripple current of the power inductor. The high frequency ripple compensation current is injected into the parallel amplifier circuit output to cancel out high frequency ripple currents at the power amplifier supply output A first embodiment of pseudo-envelope follower power management system with high frequency ripple compensation includes a switch mode power supply converter and an open loop high frequency ripple compensation assist circuit. For example, the switch mode power supply converter may be configured to operate as a buck converter. As another example, the switch mode power supply converter may be configured to operate as a multi-level charge pump buck converter. The switch mode power supply may generate a switching output voltage and a switching voltage output estimate. The switching voltage output estimate may provide an early indication of a future voltage level of the switching output voltage. For example, in some embodiments, the switch mode power supply converter may also include programmable delay circuitry, a switcher control circuit, and a buffer scalar. The switcher control circuit may generate a digital switching voltage output signal that represents a state of the switcher control circuit used to control generation of the switching output voltage by the switch mode power supply converter. The programmable delay circuitry may receive the digital switching voltage output signal, and delay the digital switching voltage output signal by a programmable delay period to generate a delayed digital switching voltage output signal. The buffer scalar is configured to receive the delayed digital switching voltage output signal, and generate the switching voltage output estimate based on the delayed digital switching voltage output signal and a buffer scalar.

The open loop high frequency ripple compensation assist circuit is configured to receive the switching voltage output estimate and a $V_{RAMP}$ signal. Based on the based on the switching voltage output estimate and the $V_{RAMP}$ signal, the open loop high frequency ripple compensation assist circuit generates a high frequency ripple compensation current. The open loop high frequency ripple compensation assist circuit applies the high frequency ripple compensation current to a power amplifier supply output to reduce high frequency ripple current at the power amplifier supply output. The power amplifier supply output is configured to power a linear radio frequency power amplifier. The high frequency ripple compensation current is generated in a frequency band located substantially near a transmit to receive duplex offset for a band of operation in a communication network, where the frequency band of the high frequency ripple compensation current has a bandwidth substantially equal to a bandwidth of a receiver channel frequency band for the band of operation.

In some embodiments, the switch mode power supply converter further includes a programmable delay circuitry configured to delay generation of the switching voltage output estimate by a programmable delay period. The programmable delay period may be configured to temporally align the switching voltage output estimate and the $V_{RAMP}$ signal to position a notch in a ripple rejection response of the power amplifier supply output near the transmit to receive duplex offset for the band of operation. In addition, the open loop high frequency ripple compensation assist circuit may generate a scaled high frequency ripple compensation current estimate based on the high frequency ripple compensation current, which can be used as part of a feedback signal to the switch mode power supply converter. As an example, the switch mode power supply converter may receive a feedback signal, wherein the feedback signal is based on the scaled high frequency ripple compensation current estimate, where the switch mode power supply converter adjusts the switching output voltage based on the feedback signal. In some embodiments, the pseudo-envelope follower power management system with high frequency ripple compensation further includes a parallel amplifier. The parallel amplifier receives the $V_{RAMP}$ signal and a power amplifier supply voltage from the power amplifier supply output. Based on a difference between the $V_{RAMP}$ signal and the power amplifier supply voltage, the parallel amplifier generates a parallel amplifier output current. The parallel amplifier applies the parallel amplifier output current to the power amplifier supply output to control the power amplifier supply voltage. In addition, the parallel amplifier may generate a scaled parallel amplifier output current estimate based on the parallel amplifier output current. The scaled parallel amplifier output current estimate may be combined with the scaled high frequency ripple compensation current estimate to create the feedback signal provided to the switch mode power supply converter.

Some embodiments of open loop high frequency ripple compensation assist circuit may include a filter network having a first node and a second node, a feedback network having a first node and a second node, and an operational amplifier including a non-inverting input, an inverting input, and an operational amplifier output. The first node of the filter network may be configured to receive the switching voltage output estimate. The second node of the filter network may be in communication with the inverting input of the operational amplifier. The first node of the feedback network may be in communication with the second node of the filter network and the inverting input of the operational amplifier. In addition, the second node of the feedback network may be in communication with the operational amplifier output. The operational amplifier may be configured to generate the high frequency ripple compensation current. The operational amplifier may also be configured to generate a scaled high frequency ripple compensation current estimate as a function of the high frequency ripple compensation current. The operational amplifier may include a first push-pull output stage in communication with the operational amplifier output, where the first push-pull output stage generates an operational amplifier output current. A bias capacitor having a bias capacitance and a bias resistor may be arranged in series between the operational amplifier output and a reference voltage. For example, the reference voltage may be ground. The first push-pull output stage may have a first stage transconductance. The bias capacitance may be configured such that the first stage transconductance of the first push-pull output stage is substantially equal to a transconductance of the bias resistor in a frequency band located substantially near a transmit to receive duplex offset for a band of operation in a communication network. The open loop high frequency ripple compensation assist circuit may also include an operational amplifier output isolation circuit including a high impedance input in communication with the operational amplifier output and an isolated feedback node in communication with the second node of the feedback network. The operational amplifier may also include a second push-pull output stage configured to generate the high frequency ripple compensation current, where the high frequency ripple compensation current is mirrored to the operational amplifier output current. The second push-pull output stage may include a programmable second output stage transconductance. The programmable second output stage transconductance second output stage transconductance may be a substantially linear function of a programmable transconductance parameter. The open loop high frequency ripple compensation assist circuit may adjust a magnitude of the high frequency ripple compensation current based on the programmable second output stage transconductance. The operational amplifier may also include a third push-pull output stage configured to generate the scaled high frequency ripple compensation current estimate as a function of the high frequency ripple compensation current based on a sense scaling factor.

The filter network may be associated with a first corner frequency of a filter response of the open loop ripple compensation assist circuit. The feedback network may be associated with a second corner frequency of the frequency response of the open loop ripple compensation assist circuit. In some cases, the first corner frequency has a programmable range between 3 MHz and 11.5 MHz and the second corner frequency has a programmable range between 3 MHz and 11.5 MHz. In other cases, the first corner frequency is substantially equal to 6 MHz, and the second corner frequency is substantially equal to 6 MHz.

Another example embodiment includes a method for reducing high frequency ripple currents at a power amplifier supply output. The method may include a first step of generating a switching output voltage and a switching voltage output estimate with a switch mode power supply converter, where the switching voltage output estimate provides an early indication of a future voltage level of the switching output voltage. The method may include the step of receiving the switching voltage output estimate and a $V_{RAMP}$ signal at an open loop high frequency ripple compensation assist circuit. The method may include the step of generating a high frequency ripple compensation current based on the switching voltage output estimate and the $V_{RAMP}$ signal. The method may include the step of applying the high frequency ripple compensation current to a power amplifier supply output to reduce high frequency ripple current at the power amplifier supply output. In some embodiments the generation of the high frequency ripple compensation current based on the switching voltage output estimate and the $V_{RAMP}$ signal may include generating the high frequency ripple compensation current within in a frequency band located substantially near a transmit to receive duplex offset for a band of operation in a communication network. In addition, the frequency band of the high frequency ripple compensation current may have a bandwidth substantially equal to a bandwidth of a receiver channel frequency band for the band of operation. In some embodiments, generation of the switching voltage output estimate may include delaying generation of the switching voltage output estimate by a programmable delay period to temporally align the switching voltage output estimate and the $V_{RAMP}$ signal to position a notch in a ripple rejection response of the power amplifier supply output near the transmit to receive duplex offset for the band of operation. In addition, the method may further include a step for generating a scaled high frequency ripple compensation current estimate based on the high frequency ripple compensation current. Based on the scaled high frequency ripple compensation current estimate, the method may form a feedback signal, which is provided to the switch mode power supply converter. The switch mode power supply converter may adjust the switching output voltage based on the feedback signal. In some embodiments, the switch mode power supply converter is configured to be a buck converter. Alternatively, in other embodiments, the switch mode power supply converter is configured to be a multi-level charge pump buck converter.

One example embodiment of the pseudo-envelope follower power management system may include a switch mode power supply converter and a parallel amplifier cooperatively coupled to provide a linear RF power amplifier supply to a linear RF power amplifier. The pseudo-envelope follower power management system may include a charge pump configured to power the parallel amplifier. The charge pump may generate a plurality of output voltage levels. The charge pump may be either a boost charge pump or a boost/buck charge pump. The pseudo-envelope follower power management system may include an offset voltage control circuit configured to provide feedback to the switch mode power supply converter to regulate an offset voltage developed across a coupling device that couples the output of the parallel amplifier to the linear RF power amplifier supply.

Another example embodiment of a power management system for a linear radio frequency power amplifier includes a switch mode power supply converter and a parallel amplifier operatively coupled to generate a linear radio frequency power amplifier supply output for a linear radio frequency power amplifier of a radio frequency device. The switch mode power supply converter may be configured to generate a plurality of switching voltage levels on a switching voltage output. The switching voltage output of the switch mode power supply converter may be coupled via a power inductor to the linear radio frequency power amplifier supply output. A bypass capacitor may be coupled between the linear radio frequency power amplifier supply output and ground such that the power inductor and bypass capacitor form a low pass filter for the switch mode power supply converter. The parallel amplifier may include a parallel amplifier output coupled, via a coupling device, to the linear radio frequency power amplifier supply output. As an example, the coupling device may be a coupling capacitor. The power management system may further include a charge pump configured to provide a charge pump parallel amplifier power supply output. The charge pump may include a first flying capacitor, a second flying capacitor, a plurality of switches operably coupled to form the charge pump parallel amplifier power supply output. The charge pump may be configured to selectively generate various output voltage levels, derived from a supply voltage, on the charge pump parallel amplifier power supply output. In addition, the charge pump parallel amplifier power supply output may be configured to provide an operational power supply voltage to the parallel amplifier.

Another example embodiment of a pseudo-envelope follower power management system may include a multi-level charge pump buck converter and a parallel amplifier configured to operate in tandem to generate a power amplifier supply voltage output for a linear RF power amplifier. The multi-level charge pump buck converter may include a supply input configured to receive a direct current (DC) voltage, and a switching voltage output. The switching voltage output is coupled to the power amplifier supply voltage output by a power inductor, where the power inductor couples to a bypass capacitor to form an output filter for the switching voltage output of the multi-level charge pump buck converter. The parallel amplifier may include a supply input configured to receive the direct current (DC) voltage, an amplifier output, a first control input configured to receive a $V_{RAMP}$ signal, and a second control input configured to receive the power amplifier supply voltage. The amplifier output may be coupled to the power amplifier supply voltage by a coupling circuit. In some embodiments of the pseudo-envelope follower system, the coupling circuit may be an offset capacitor. In other embodiments of the pseudo-envelope follower system, the coupling circuit may be a wire trace such that the offset voltage between the amplifier output and the power amplifier supply voltage is zero volts.

In addition, the multi-level charge pump buck converter may generate a feed forward control signal configured to provide an indication of the output state of the switching voltage output to the parallel amplifier. In some embodiments, the switching voltage output is provided as the feed forward control signal. In other embodiments, the feed forward control signal is generated by a switcher control circuit and provides an indication of the switching voltage output based on the state of the switcher control circuit. The parallel amplifier may include a power amplifier output current estimate signal that provides an estimate of the output current of the parallel amplifier. In some embodiments of the pseudo-envelope follower system, the parallel amplifier may also generate a threshold offset signal. The threshold offset signal may be configured to estimate the magnitude of the offset voltage appearing across the coupling circuit.

The multi-level buck converter may include a supply input configured to receive a direct current (DC) voltage, a switching voltage output coupled to a power inductor, a switcher control circuit, a multi-level charge pump circuit having a control input, a charge pump supply input configured to receive the DC voltage, a series switch having a first switch terminal, a second switch terminal, and a series control terminal and a shunt switch having a first switch terminal, a second switch terminal, and a shunt control terminal. The first terminal of the series switch may be coupled to the supply input of the multi-level buck converter. The second terminal of the series switch may be coupled to the first terminal of the series switch to form a switching voltage output. The second terminal of the series switch may be coupled to ground. The boost charge pump circuit may include a charge pump control input, a charge pump supply input coupled to the supply input of the multi-level buck converter, and a charge pump output coupled to the supply input of the multi-level buck converter. The boost charge pump includes a plurality of switches and two flying capacitors that provide for three modes of operation. In a charging mode of operation, the flying capacitors are coupled in series between the charge pump supply input and ground, wherein the flying capacitors are switchably disconnected from the charge pump output. In a first boost mode of operation, the flying capacitors are arranged in parallel between the charge pump output and the charge pump supply input to generate a 1.5× the DC voltage output at the charge pump output. In a second boost mode of operation, the flying capacitors are arranged in series between the charge pump output and the charge pump supply input to generate a 2× the DC voltage output at the charge pump output. The multi-level buck converter may include four modes of operation. In a first mode of operation, the series switch is open, the boost charge pump is in the charging mode of operation, and the shunt switch is closed to generate zero volts at the switching voltage output. In a second mode of operation, the series switch is closed, the boost charge pump is in the charging mode of operation, and the shunt switch is open to generate the DC voltage output at the switching voltage output. In a third mode of operation, both the series switch and the shunt switch are open and the boost charge pump is in the first boost mode of operation to generate a 1.5× the DC voltage output at the switching mode output. In a fourth mode of operation, both the series switch and the shunt switch are open and the boost charge pump is in the second boost mode of operation to generate a 2× the DC voltage output at the switching mode output.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 38B depicts an example embodiment of a pseudo-envelope follower power management system that includes a feedback delay compensation circuit in combination with a buck converter.

FIG. 39A depicts a block diagram of an embodiment of the feedback delay compensation circuit of FIG. 38A and FIG. 38B.

FIG. 39B depicts another embodiment of the feedback delay compensation circuit of FIG. 38A and FIG. 38B.

DETAILED DESCRIPTION

Figure 1A:
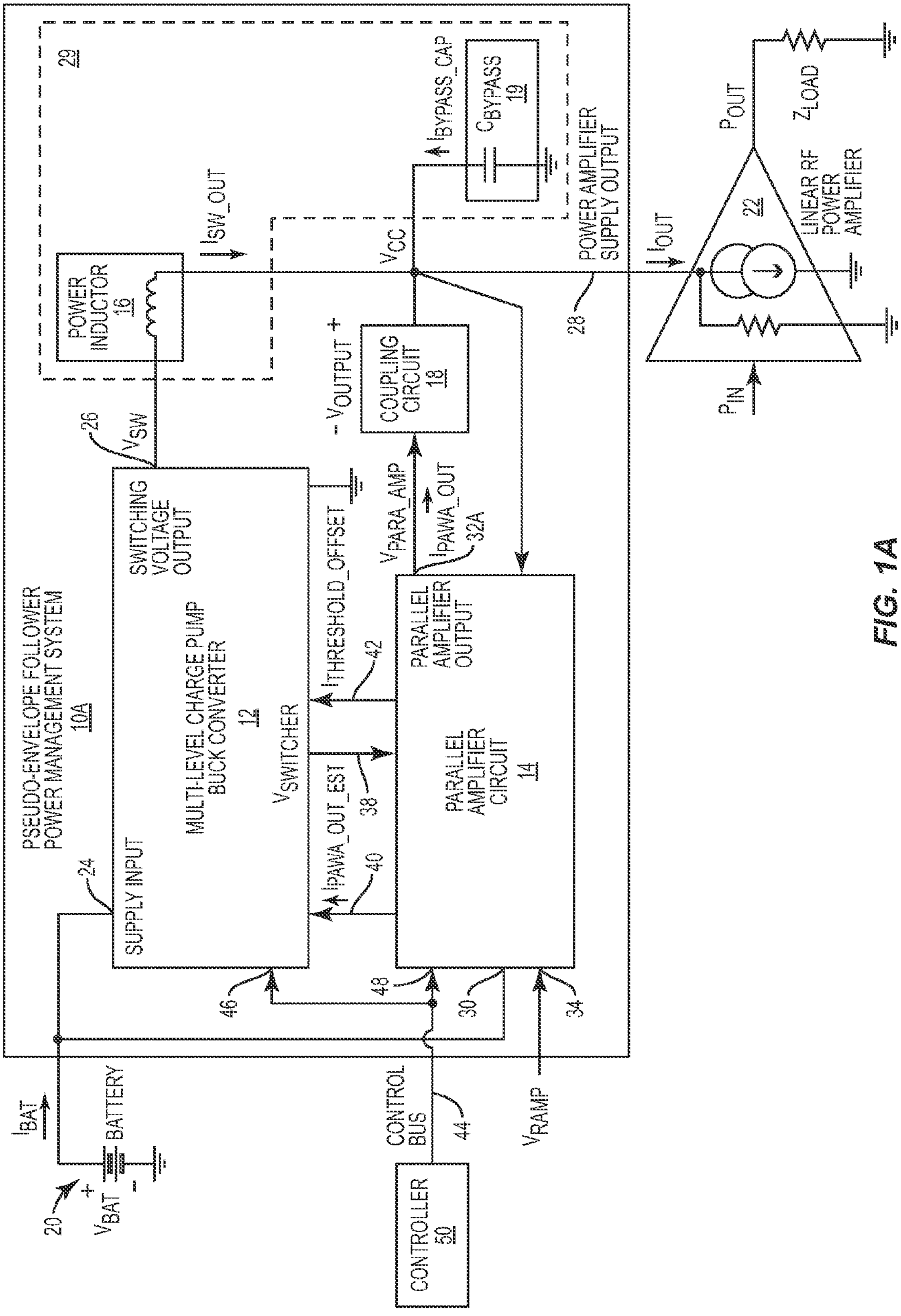
FIG. 1A depicts an embodiment of a pseudo-envelope follower power management system for managing power supplied to a linear RF power amplifier.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Embodiments disclosed herein relate to a pseudo-envelope follower power management system including a parallel amplifier and a switch mode power supply converter cooperatively coupled to generate a power supply voltage at a power supply output coupled to a linear RF power amplifier. The parallel amplifier output is in communication with the power amplifier supply output. The parallel amplifier governs operation of the switch mode power supply converter and regulates the power amplifier supply voltage base on a $V_{RAMP}$ signal. The parallel amplifier circuit includes an open loop high frequency compensation assist circuit that generates a high frequency ripple compensation current based on an estimate of the high frequency ripple currents contained in a ripple current of the power inductor. The high frequency ripple compensation current is injected into the parallel amplifier circuit output to cancel out high frequency ripple currents at the power amplifier supply output.

A first embodiment of the pseudo-envelope follower power management system with high frequency ripple compensation includes a switch mode power supply converter and an open loop high frequency ripple compensation assist circuit. For example, the switch mode power supply converter may be configured to operate as a buck converter. As another example, the switch mode power supply converter may be configured to operate as a multi-level charge pump buck converter. The switch mode power supply may generate a switching output voltage and a switching voltage output estimate. The switching voltage output estimate may provide an early indication of a future voltage level of the switching output voltage. For example, in some embodiments, the switch mode power supply converter may also include programmable delay circuitry, a switcher control circuit, and a buffer scalar. The switcher control circuit may generate a digital switching voltage output signal that represents a state of the switcher control circuit used to control generation of the switching output voltage by the switch mode power supply converter. The programmable delay circuitry may receive the digital switching voltage output signal, and delay the digital switching voltage output signal by a programmable delay period to generate a delayed digital switching voltage output signal. The buffer scalar is configured to receive the delayed digital switching voltage output signal, and generate the switching voltage output estimate based on the delayed digital switching voltage output signal and a buffer scalar.

The open loop high frequency ripple compensation assist circuit is configured to receive the switching voltage output estimate and a $V_{RAMP}$ signal. Based on the switching voltage output estimate and the $V_{RAMP}$ signal, the open loop high frequency ripple compensation assist circuit generates a high frequency ripple compensation current. The open loop high frequency ripple compensation assist circuit applies the high frequency ripple compensation current to a power amplifier supply output to reduce high frequency ripple current at the power amplifier supply output. The power amplifier supply output is configured to power a linear radio frequency power amplifier. The high frequency ripple compensation current is generated in a frequency band located substantially near a transmit to receive duplex offset for a band of operation in a communication network, where the frequency band of the high frequency ripple compensation current has a bandwidth substantially equal to a bandwidth of a receiver channel frequency band for the band of operation.

In some embodiments, the switch mode power supply converter further includes programmable delay circuitry configured to delay generation of the switching voltage output estimate by a programmable delay period. The programmable delay period may be configured to temporally align the switching voltage output estimate and the $V_{RAMP}$ signal to position a notch in a ripple rejection response of the power amplifier supply output near the transmit to receive duplex offset for the band of operation. In addition, the open loop high frequency ripple compensation assist circuit may generate a scaled high frequency ripple compensation current estimate based on the high frequency ripple compensation current, which can be used as part of a feedback signal to the switch mode power supply converter. As an example, the switch mode power supply converter may receive a feedback signal, wherein the feedback signal is based on the scaled high frequency ripple compensation current estimate, where the switch mode power supply converter adjusts the switching output voltage based on the feedback signal. In some embodiments, the pseudo-envelope follower power management system with high frequency ripple compensation further includes a parallel amplifier. The parallel amplifier receives the $V_{RAMP}$ signal and a power amplifier supply voltage from the power amplifier supply output. Based on a difference between the $V_{RAMP}$ signal and the power amplifier supply voltage, the parallel amplifier generates a parallel amplifier output current. The parallel amplifier applies the parallel amplifier output current to the power amplifier supply output to control the power amplifier supply voltage. In addition, the parallel amplifier may generate a scaled parallel amplifier output current estimate based on the parallel amplifier output current. The scaled parallel amplifier output current estimate may be combined with the scaled high frequency ripple compensation current estimate to create the feedback signal provided to the switch mode power supply converter.

Some embodiments of the open loop high frequency ripple compensation assist circuit may include a filter network having a first node and a second node, a feedback network having a first node and a second node, and an operational amplifier including a non-inverting input, an inverting input, and an operational amplifier output. The first node of the filter network may be configured to receive the switching voltage output estimate. The second node of the filter network may be in communication with the inverting input of the operational amplifier. The first node of the feedback network may be in communication with the second node of the filter network and the inverting input of the operational amplifier. In addition, the second node of the feedback network may be in communication with the operational amplifier output. The operational amplifier may be configured to generate the high frequency ripple compensation current. The operational amplifier may also be configured to generate a scaled high frequency ripple compensation current estimate as a function of the high frequency ripple compensation current. The operational amplifier may include a first push-pull output stage in communication with the operational amplifier output, where the first push-pull output stage generates an operational amplifier output current. A bias capacitor having a bias capacitance and a bias resistor may be arranged in series between the operational amplifier output and a reference voltage. For example, the reference voltage may be ground. The first push-pull output stage may have a first stage transconductance. The bias capacitance may be configured such that the first stage transconductance of the first push-pull output stage is substantially equal to a transconductance of the bias resistor in a frequency band located substantially near a transmit to receive duplex offset for a band of operation in a communication network. The open loop high frequency ripple compensation assist circuit may also include an operational amplifier output isolation circuit including a high impedance input in communication with the operational amplifier output and an isolated feedback node in communication with the second node of the feedback network. The operational amplifier may also include a second push-pull output stage configured to generate the high frequency ripple compensation current, where the high frequency ripple compensation current is mirrored to the operational amplifier output current. The second push-pull output stage may include a programmable second output stage transconductance. The programmable second output stage transconductance second output stage transconductance may be a substantially linear function of a programmable transconductance parameter. The open loop high frequency ripple compensation assist circuit may adjust a magnitude of the high frequency ripple compensation current based on the programmable second output stage transconductance. The operational amplifier may also include a third push-pull output stage configured to generate the scaled high frequency ripple compensation current estimate as a function of the high frequency ripple compensation current based on a sense scaling factor.

The filter network may be associated with a first corner frequency of a filter response of the open loop high frequency ripple compensation assist circuit. The feedback network may be associated with a second corner frequency of the frequency response of the open loop high frequency ripple compensation assist circuit. In some cases, the first corner frequency has a programmable range between 3 MHz and 11.5 MHz and the second corner frequency has a programmable range between 3 MHz and 11.5 MHz. In other cases, the first corner frequency is substantially equal to 6 MHz, and the second corner frequency is substantially equal to 6 MHz.

Another example embodiment includes a method for reducing high frequency ripple currents at a power amplifier supply output. The method may include a first step of generating a switching output voltage and a switching voltage output estimate with a switch mode power supply converter, where the switching voltage output estimate provides an early indication of a future voltage level of the switching output voltage. The method may include the step of receiving the switching voltage output estimate and a $V_{RAMP}$ signal at an open loop high frequency ripple compensation assist circuit. The method may include the step of generating a high frequency ripple compensation current based on the switching voltage output estimate and the $V_{RAMP}$ signal. The method may include the step of applying the high frequency ripple compensation current to a power amplifier supply output to reduce high frequency ripple currents at the power amplifier supply output. In some embodiments, the generation of the high frequency ripple compensation current based on the switching voltage output estimate and the $V_{RAMP}$ signal may include generating the high frequency ripple compensation current within in a frequency band located substantially near a transmit to receive duplex offset for a band of operation in a communication network. In addition, the frequency band of the high frequency ripple compensation current may have a bandwidth substantially equal to a bandwidth of a receiver channel frequency band for the band of operation. In some embodiments, generation of the switching voltage output estimate may include delaying generation of the switching voltage output estimate by a programmable delay period to temporally align the switching voltage output estimate and the $V_{RAMP}$ signal to position a notch in a ripple rejection response of the power amplifier supply output near the transmit to receive duplex offset for the band of operation. In addition, the method may further include a step for generating a scaled high frequency ripple compensation current estimate based on the high frequency ripple compensation current. Based on the scaled high frequency ripple compensation current estimate, the method may form a feedback signal, which is provided to the switch mode power supply converter. The switch mode power supply converter may adjust the switching output voltage based on the feedback signal. In some embodiments, the switch mode power supply converter is configured to be a buck converter. Alternatively, in other embodiments, the switch mode power supply converter is configured to be a multi-level charge pump buck converter.

Embodiments disclosed herein further relate to a pseudo-envelope follower power management system used to manage the power delivered to a linear RF power amplifier. One example embodiment of the pseudo-envelope follower power management system may include a switch mode power supply converter and a parallel amplifier cooperatively coupled to provide a linear RF power amplifier supply to a linear RF power amplifier. The pseudo-envelope follower power management system may include a charge pump configured to power the parallel amplifier. The charge pump may generate a plurality of output voltage levels. The charge pump may be either a boost charge pump or a boost/buck charge pump. The pseudo-envelope follower power management system may include an offset voltage control circuit configured to provide feedback to the switch mode power supply converter to regulate an offset voltage developed across a coupling device that couples the output of the parallel amplifier to the linear RF power amplifier supply.

Another example embodiment of a power management system for a linear radio frequency power amplifier includes a switch mode power supply converter and a parallel amplifier operatively coupled to generate a linear radio frequency power amplifier supply output for a linear radio frequency power amplifier of a radio frequency device. The switch mode power supply converter may be configured to generate a plurality of switching voltage levels on a switching voltage output. The switching voltage output of the switch mode power supply converter may be coupled via a power inductor to the linear radio frequency power amplifier supply output. A bypass capacitor may be coupled between the linear radio frequency power amplifier supply output and ground such that the power inductor and bypass capacitor form a low pass filter for the switch mode power supply converter. The parallel amplifier may include a parallel amplifier output coupled, via a coupling device, to the linear radio frequency power amplifier supply output. As an example, the coupling device may be a coupling capacitor. The power management system may further include a charge pump configured to provide a charge pump parallel amplifier power supply output. The charge pump may include a first flying capacitor, a second flying capacitor, a plurality of switches operably coupled to form the charge pump parallel amplifier power supply output. The charge pump may be configured to selectively generate various output voltage levels, derived from a supply voltage, on the charge pump parallel amplifier power supply output. In addition, the charge pump parallel amplifier power supply output may be configured to provide an operational power supply voltage to the parallel amplifier.

Another example embodiment of a pseudo-envelope follower power management system may include a multi-level charge pump buck converter and a parallel amplifier configured to operate in tandem to generate a power amplifier supply voltage output for a linear RF power amplifier. The multi-level charge pump buck converter may include a supply input configured to receive a direct current (DC) voltage, and a switching voltage output. The switching voltage output is coupled to the power amplifier supply voltage output by a power inductor, where the power inductor couples to a bypass capacitor to form an output filter for the switching voltage output of the multi-level charge pump buck converter. The parallel amplifier may include a supply input configured to receive the direct current (DC) voltage, an amplifier output, a first control input configured to receive a $V_{RAMP}$ signal, and a second control input configured to receive the power amplifier supply voltage. The amplifier output may be coupled to the power amplifier supply voltage by a coupling circuit. In some embodiments of the pseudo-envelope follower system, the coupling circuit may be an offset capacitor. In other embodiments of the pseudo-envelope follower system, the coupling circuit may be a wire trace such that the offset voltage between the amplifier output and the power amplifier supply voltage is zero volts.

In addition, the multi-level charge pump buck converter may generate a feed forward control signal configured to provide an indication of the output state of the switching voltage output to the parallel amplifier. In some embodiments, the switching voltage output is provided as the feed forward control signal. In other embodiments, the feed forward control signal is generated by a switcher control circuit and provides an indication of the switching voltage output based on the state of the switcher control circuit. The parallel amplifier may include a power amplifier output current estimate signal that provides an estimate of the output current of the parallel amplifier. In some embodiments of the pseudo-envelope follower system, the parallel amplifier may also generate a threshold offset signal. The threshold offset signal may be configured to estimate the magnitude of the offset voltage appearing across the coupling circuit.

The multi-level buck converter may include a supply input configured to receive a direct current (DC) voltage, a switching voltage output coupled to a power inductor, a switcher control circuit, a multi-level charge pump circuit having a control input, a charge pump supply input configured to receive the DC voltage, a series switch having a first switch terminal, a second switch terminal, and a series control terminal and a shunt switch having a first switch terminal, a second switch terminal, and a shunt control terminal. The first terminal of the series switch may be coupled to the supply input of the multi-level buck converter. The second terminal of the series switch may be coupled to the first terminal of the series switch to form a switching voltage output. The second terminal of the series switch may be coupled to ground. The boost charge pump circuit may include a charge pump control input, a charge pump supply input coupled to the supply input of the multi-level buck converter, and a charge pump output coupled to the supply input of the multi-level buck converter. The boost charge pump includes a plurality of switches and two flying capacitors that provide for three modes of operation. In a charging mode of operation, the flying capacitors are coupled in series between the charge pump supply input and ground, where the flying capacitors are switchably disconnected from the charge pump output. In a first boost mode of operation, the flying capacitors are arranged in parallel between the charge pump output and the charge pump supply input to generate a 1.5× the DC voltage output at the charge pump output. In a second boost mode of operation, the flying capacitors are arranged in series between the charge pump output and the charge pump supply input to generate a 2× the DC voltage output at the charge pump output. The multi-level buck converter may include four modes of operation. In a first mode of operation, the series switch is open, the boost charge pump is in the charging mode of operation, and the shunt switch is closed to generate zero volts at the switching voltage output. In a second mode of operation, the series switch is closed, the boost charge pump is in the charging mode of operation, and the shunt switch is open to generate the DC voltage output at the switching voltage output. In a third mode of operation, both the series switch and the shunt switch are open and the boost charge pump is in the first boost mode of operation to generate a 1.5× the DC voltage output at the switching mode output. In a fourth mode of operation, both the series switch and the shunt switch are open and the boost charge pump is in the second boost mode of operation to generate a 2× the DC voltage output at the switching mode output.

Figure 2A:
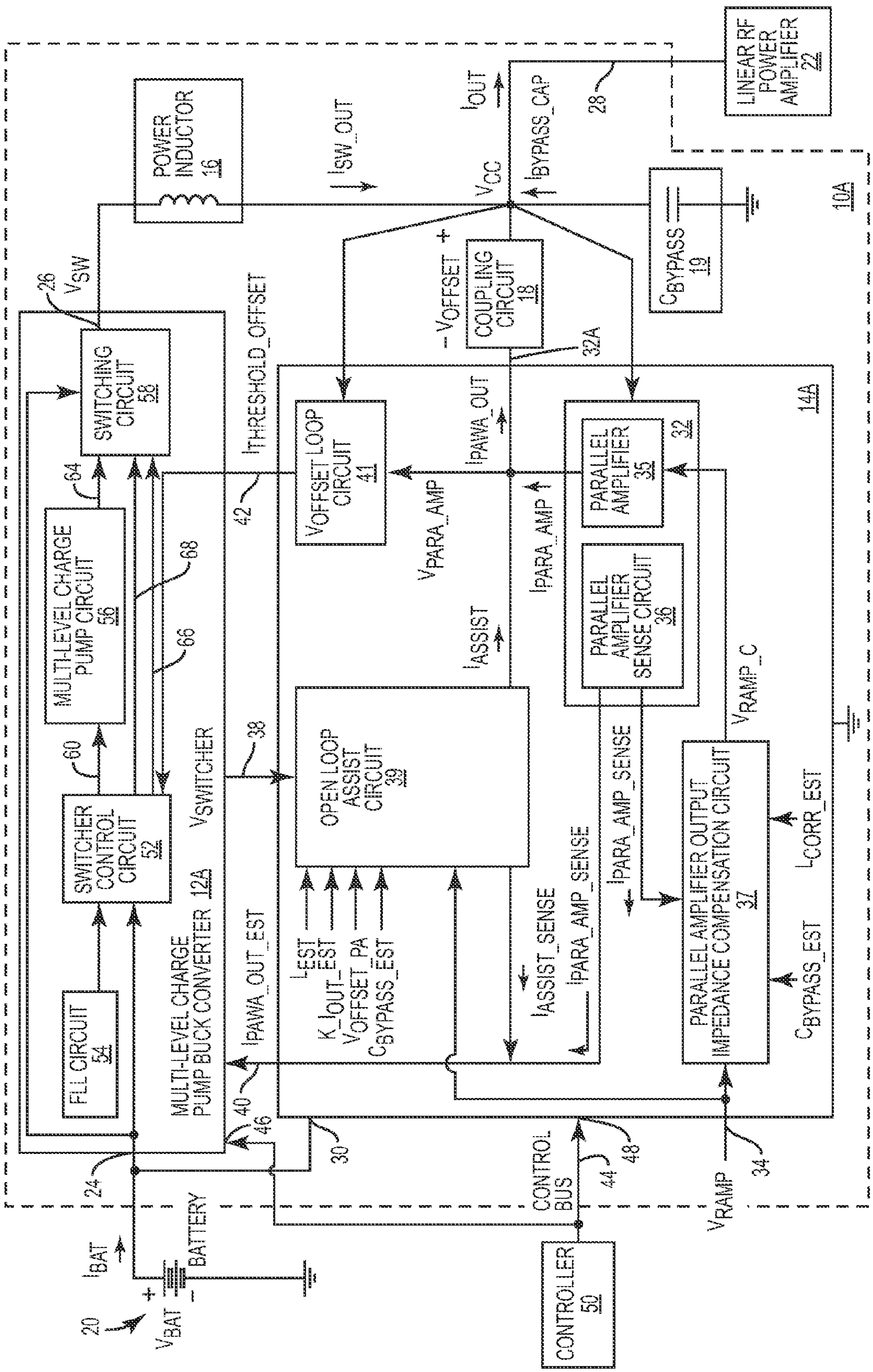
FIG. 2A depicts an embodiment of the pseudo-envelope follower power management system of FIG. 1A in further detail.

FIGS. 1A and 2A depict an example embodiment of pseudo-envelope follower power management system 10A including a multi-level charge pump buck converter 12, a parallel amplifier circuit 14, a power inductor 16, a coupling circuit 18, and a bypass capacitor 19. The bypass capacitor 19 has a bypass capacitor capacitance, $C_{BYPASS}$. The multi-level charge pump buck converter 12 and the parallel amplifier circuit 14 may be configured to operate in tandem to generate a power amplifier supply voltage, $V_{CC}$, at the power amplifier supply output 28 of the pseudo-envelope follower power management system 10A for a linear RF power amplifier 22. The power amplifier supply output 28 provides an output current, $I_{OUT}$, to the linear RF power amplifier 22. The linear RF power amplifier 22 may include a power amplifier input, $P_{IN}$, configured to receive a modulated RF signal and a power amplifier output, $P_{OUT}$, coupled to an output load, $Z_{LOAD}$. As an example, the output load, $Z_{LOAD}$, may be an antenna.

The multi-level charge pump buck converter 12 may include a supply input 24, ($V_{BAT}$), configured to receive a direct current (DC) voltage, $V_{BAT}$, from a battery 20 and a switching voltage output 26 configured to provide a switching voltage, $V_{SW}$. The switching voltage output 26 may be coupled to the power amplifier supply output 28 by the power inductor 16, where the power inductor 16 couples to a bypass capacitor 19 to form an output filter 29 for the switching voltage output 26 of the multi-level charge pump buck converter 12. The power inductor 16 provides an inductor current, $I_{SW\_OUT}$, to the power amplifier supply output 28. The parallel amplifier circuit 14 may include a parallel amplifier supply input 30 configured to receive the direct current (DC) voltage, $V_{BAT}$, from the battery 20, a parallel amplifier output 32A, a first control input 34 configured to receive a $V_{RAMP}$ signal, and a second control input configured to receive the power amplifier supply voltage, $V_{CC}$. The parallel amplifier output 32A of the parallel amplifier circuit 14 may be coupled to the power amplifier supply voltage $V_{CC}$, by a coupling circuit 18. The parallel amplifier output voltage, $V_{PARA\_AMP}$, is provided by the parallel amplifier circuit 14.

As an example, the parallel amplifier circuit 14 may generate the parallel amplifier output voltage, $V_{PARA\_AMP}$, based on the difference between the $V_{RAMP}$ signal and the power amplifier supply voltage, $V_{CC}$. Thus, the $V_{RAMP}$ signal may represent either an analog or digital signal that contains the required supply modulation information for a power amplifier collector of a linear RF power amplifier. Typically, the $V_{RAMP}$ signal is provided to the parallel amplifier circuit 14 as a differential analog signal to provide common mode rejection against any noise or spurs that could appear on this signal. The $V_{RAMP}$ signal may be a time domain signal, $V_{RAMP}(t)$, generated by a transceiver or modem and used to transmit radio-frequency (RF) signals. For example, the $V_{RAMP}$ signal may be generated by a digital baseband processing portion of the transceiver or modem, where the digital $V_{RAMP}$ signal, $V_{RAMP\_DIGITAL}$, is digital-to-analog converted to form the $V_{RAMP}$ signal in the analog domain. In some embodiments, the "analog" $V_{RAMP}$ signal is a differential signal. The transceiver or a modem may generate the $V_{RAMP}$ signal based upon a known RF modulation Amp(t)*cos(2*pi*$f_{RF}$*t+Phase(t)). The $V_{RAMP}$ signal may represent the target voltage for the power amplifier supply voltage, $V_{CC}$, to be generated at the power amplifier supply output 28 of the pseudo-envelope follower power management system 10A, where the pseudo-envelope follower power management system 10A provides the power amplifier supply voltage, $V_{CC}$, to the linear RF power amplifier 22. Also the $V_{RAMP}$ signal may be generated from a detector coupled to the RF input power amplifier.

For example, the parallel amplifier circuit 14 includes a parallel amplifier output 32A that provides a parallel amplifier output voltage, $V_{PARA\_AMP}$, to the coupling circuit 18. The parallel amplifier output 32A sources a parallel amplifier circuit output current, $I_{PAWA\_OUT}$, to the coupling circuit 18. The parallel amplifier circuit 14, depicted in FIG. 1A and FIG. 1B, may provide a parallel amplifier circuit output current estimate 40, $I_{PAWA\_OUT\_EST}$, to the multi-level charge pump buck converter 12 as an estimate of the parallel amplifier circuit output current $I_{PAWA\_OUT}$, of the parallel amplifier circuit 14. Thus, the parallel amplifier circuit output current estimate 40, $I_{PAWA\_OUT\_EST}$, represents an estimate of the parallel amplifier circuit output current $I_{PAWA\_OUT}$, provided by the parallel amplifier circuit as a feedback signal to the multi-level charge pump buck converter 12. Based on the parallel amplifier circuit output current estimate 40, $I_{PAWA\_OUT\_EST}$, multi-level charge pump buck converter 12 may be configured to control the switching voltage, $V_{SW}$, provided at the switching voltage output 26 of the multi-level charge pump buck converter 12.

Figure 1B:
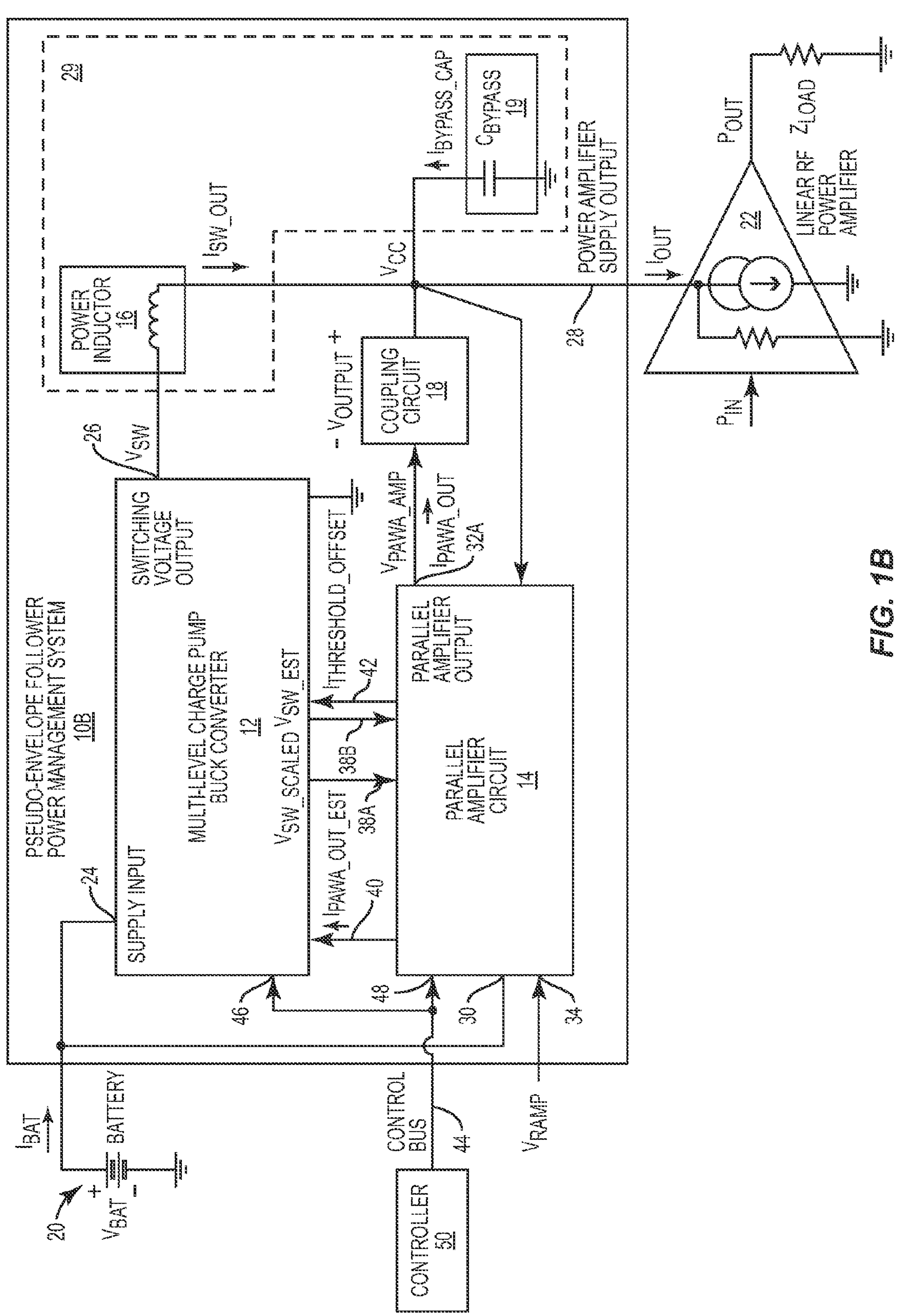
FIG. 1B depicts an embodiment of a pseudo-envelope follower power management system for managing power supplied to a linear RF power amplifier.

In some embodiments of the pseudo-envelope follower power management system 10A, depicted in FIG. 1A, and the pseudo-envelope follower power management system 10B, depicted in FIG. 1B, the coupling circuit 18 may be an offset capacitor, $C_{OFFSET}$. An offset voltage, $V_{OFFSET}$, may be developed across the coupling circuit 18. In other alternative embodiments, the coupling circuit may be a wire trace such that the offset voltage, $V_{OFFSET}$, between the parallel amplifier output voltage, $V_{PARA\_AMP}$, and the power amplifier supply voltage output, $V_{CC}$, is zero volts. In still other embodiments, the coupling circuit may be a transformer.

Figure 2B:
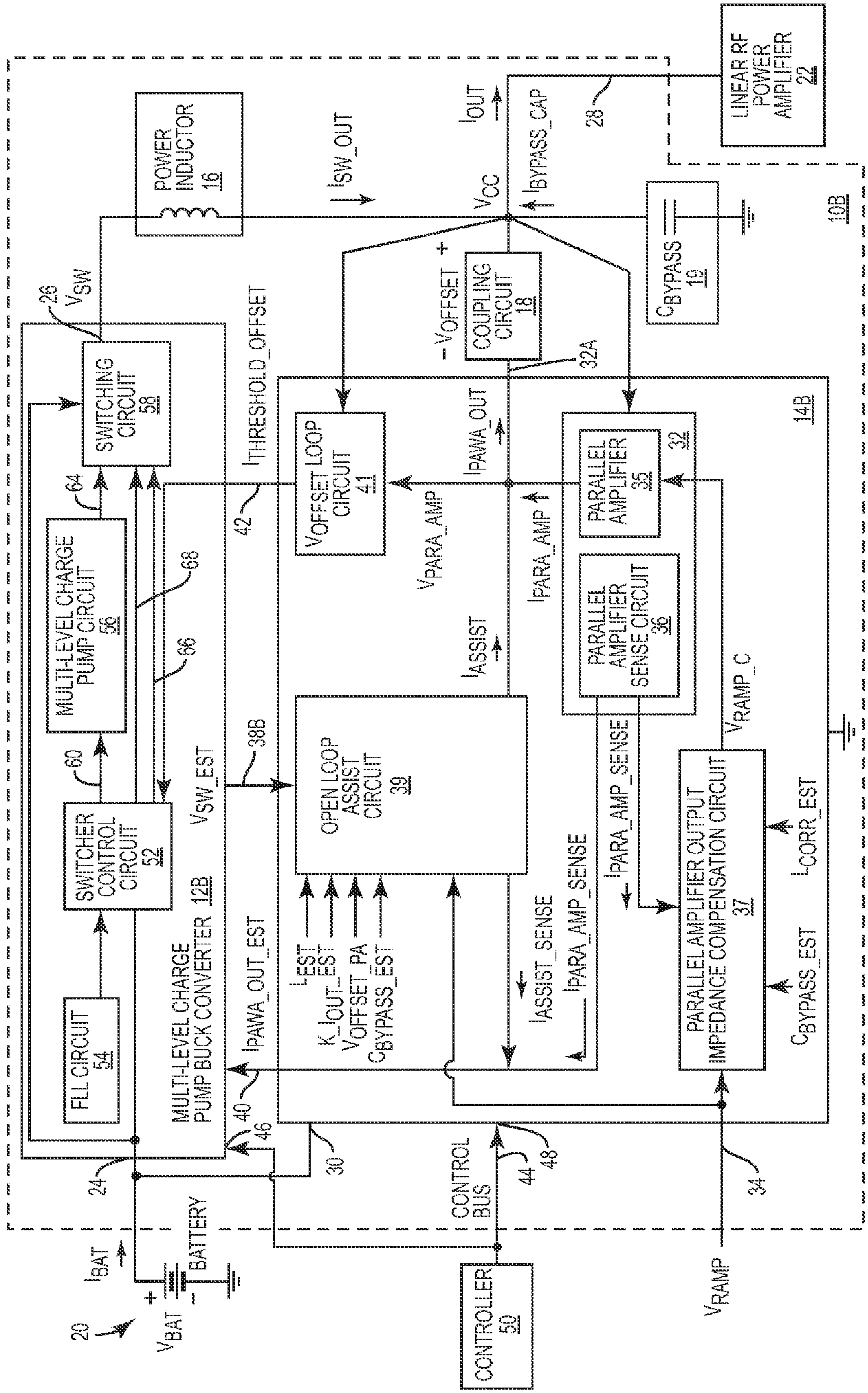
FIG. 2B depicts an embodiment of the pseudo-envelope follower power management system of FIG. 1B in further detail.
Figure 8:
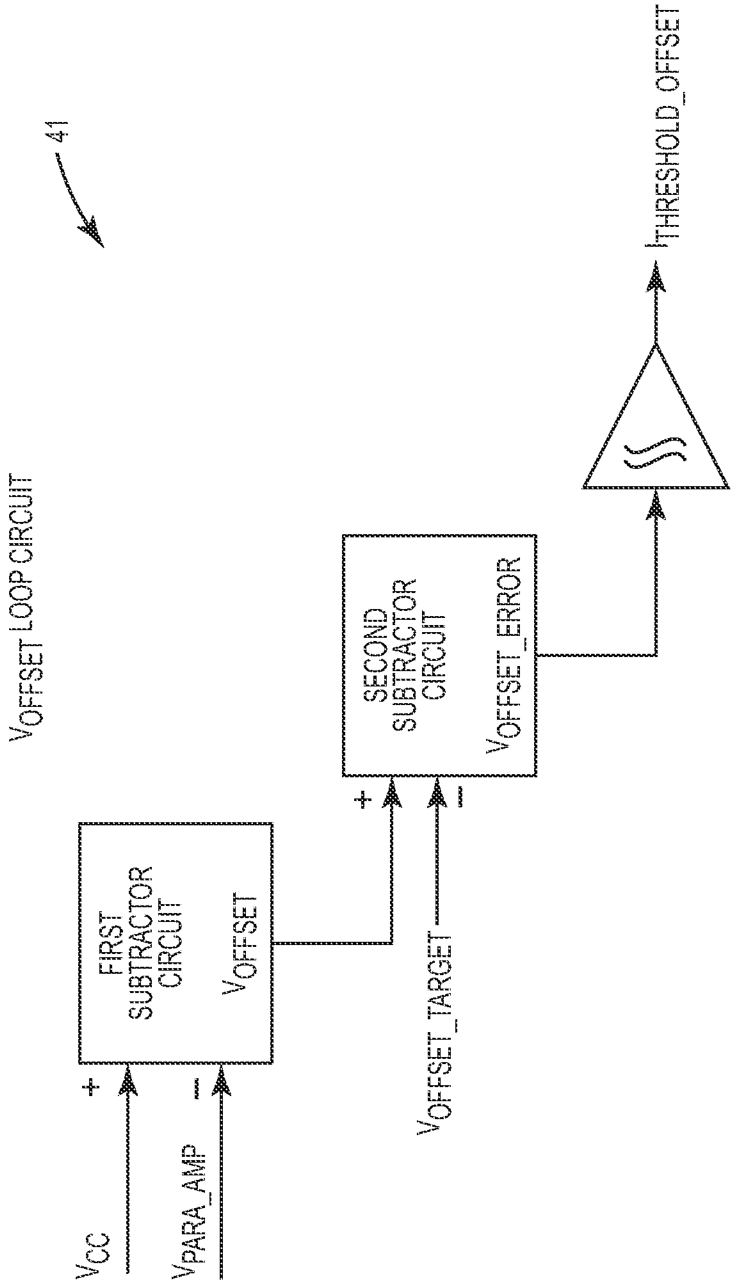
FIG. 8 depicts one embodiment of a $V_{OFFSET}$ loop circuitry of a parallel amplifier circuit of a pseudo-envelope follower power management system.
Figure 18A:
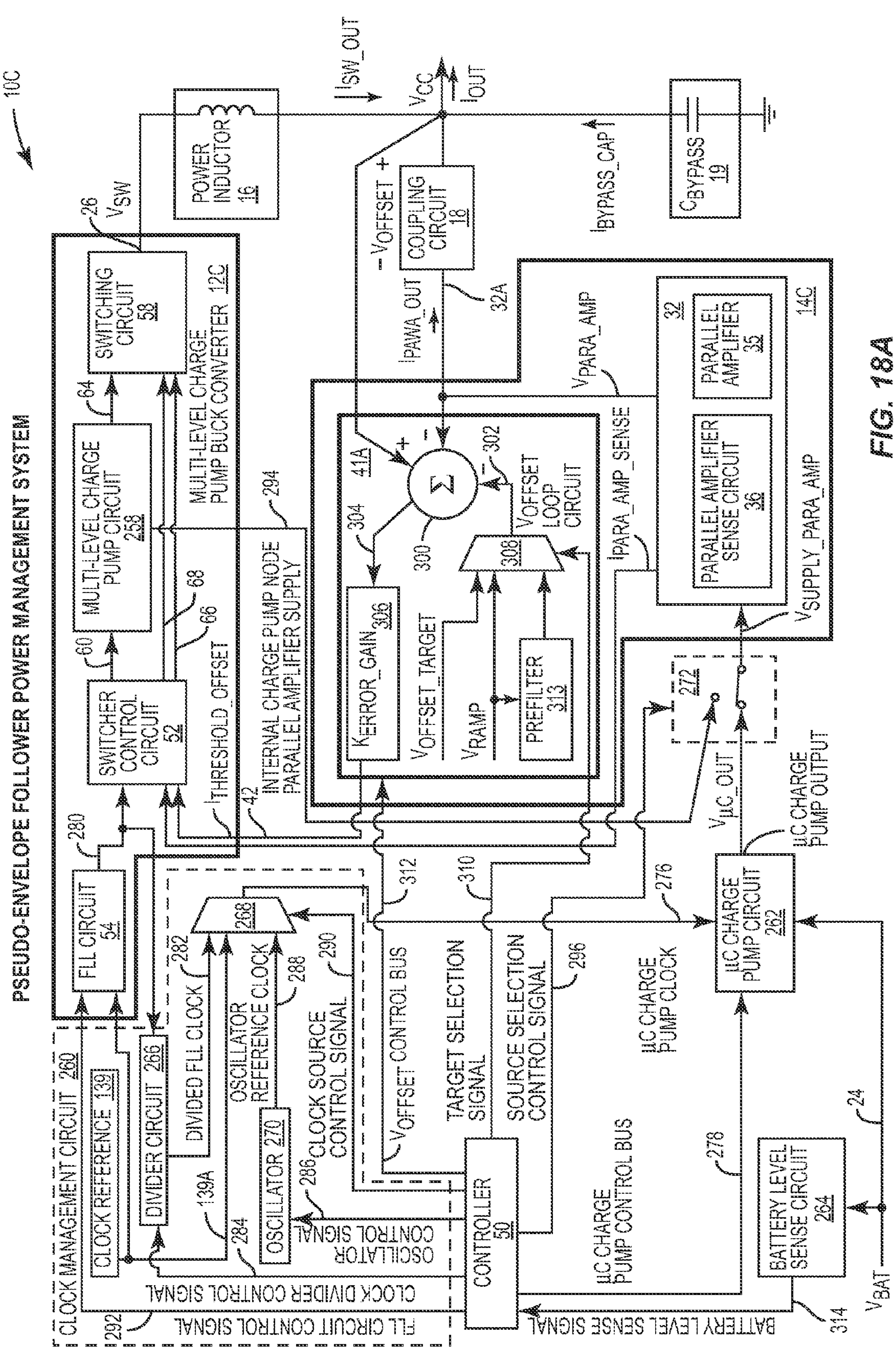
FIG. 18A depicts an embodiment of a pseudo-envelope follower power management system having a multi-level charge pump buck converter and a μC charge pump circuit configured to provide a parallel amplifier power supply to a parallel amplifier circuit.
Figure 18B:
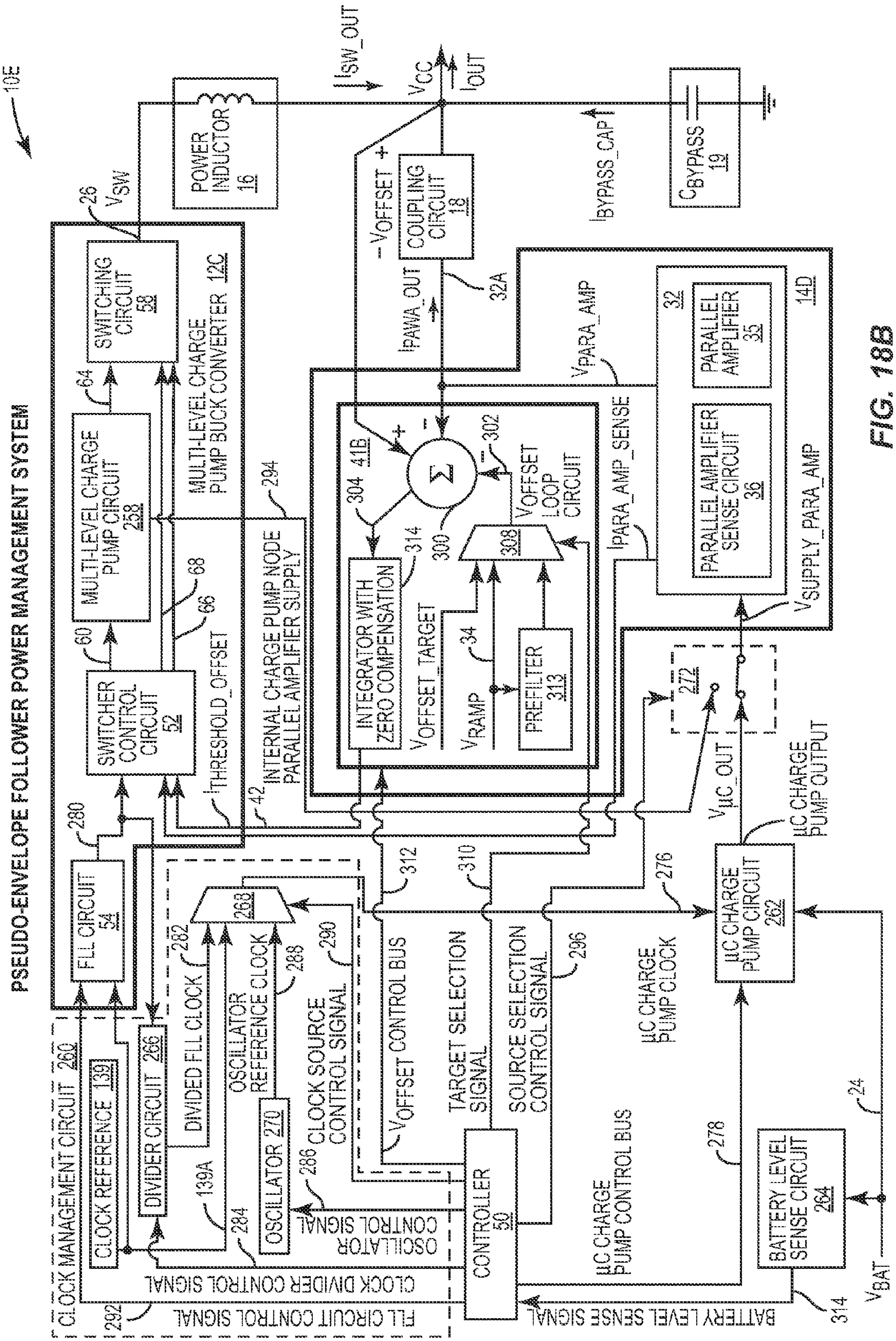
FIG. 18B depicts another embodiment of a pseudo-envelope follower power management system having a multi-level charge pump buck converter and a μC charge pump circuit configured to provide a parallel amplifier power supply to a parallel amplifier circuit.
Figure 18C:
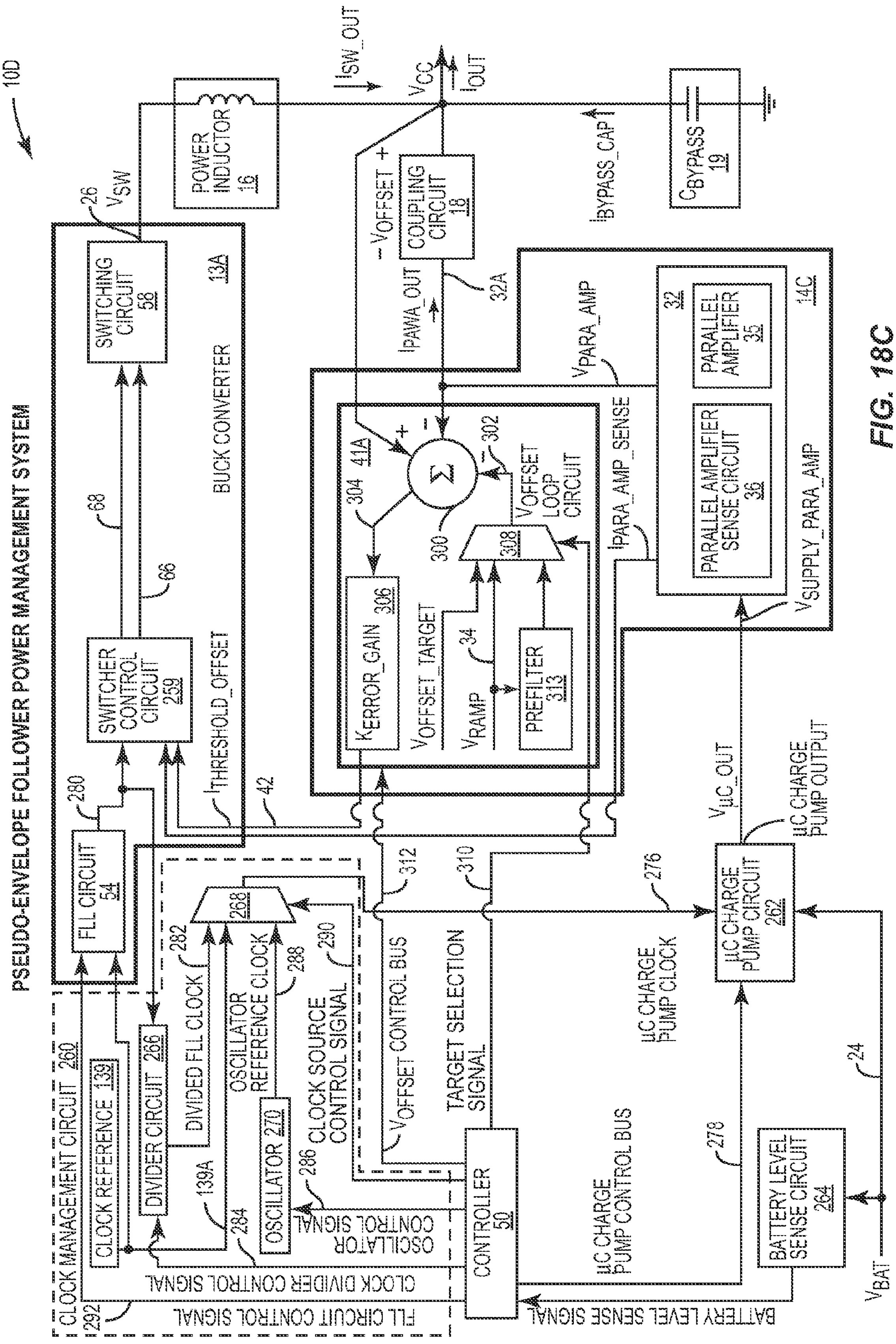
FIG. 18C depicts an embodiment of a pseudo-envelope follower power management system having a buck converter and a μC charge pump circuit configured to provide a parallel amplifier power supply to a parallel amplifier circuit.
Figure 18D:
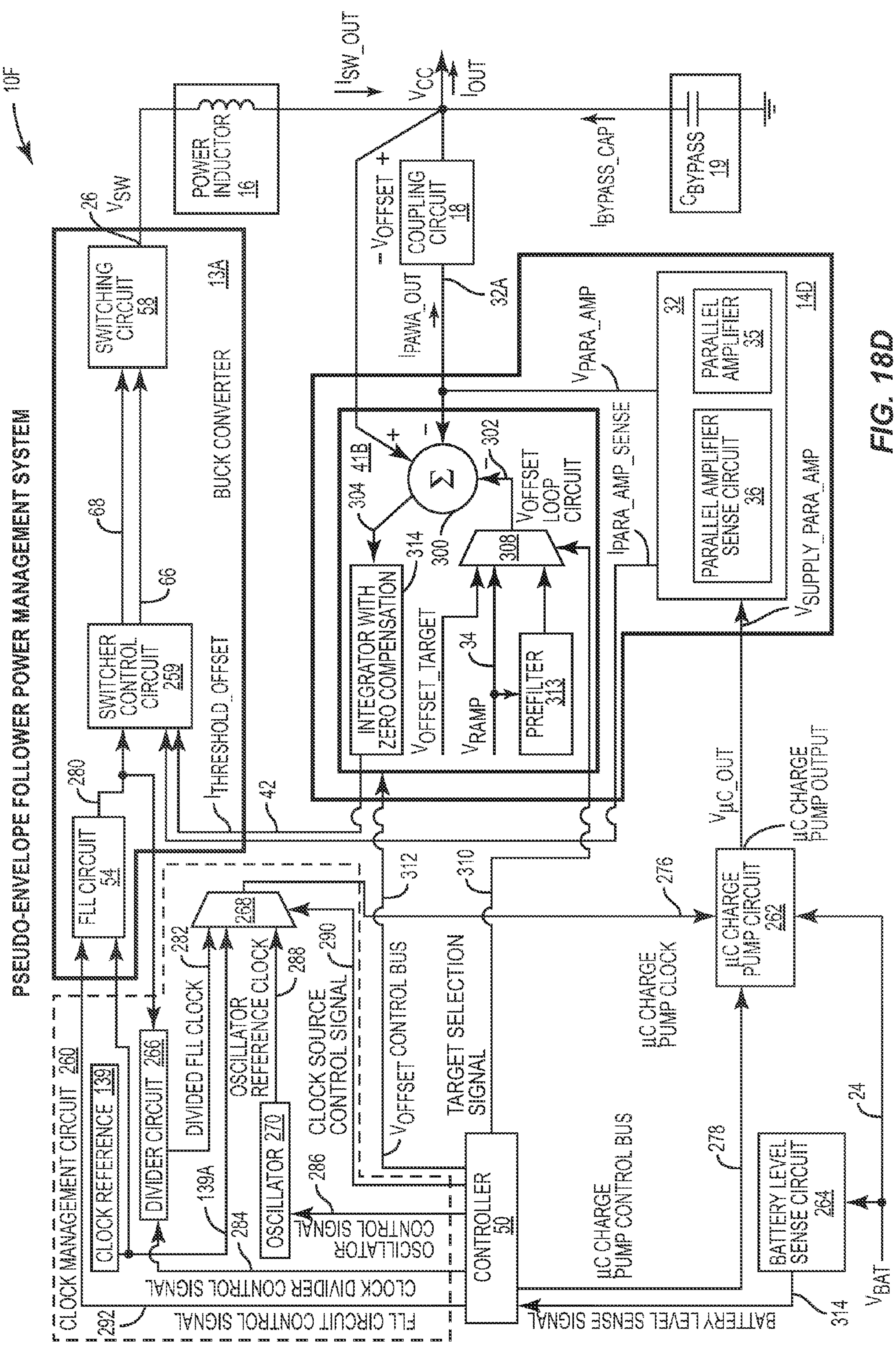
FIG. 18D depicts another embodiment of a pseudo-envelope follower power management system having a buck converter and a μC charge pump circuit configured to provide a parallel amplifier power supply to a parallel amplifier circuit.

As an example, a pseudo-envelope follower power management system 10A, depicted in FIG. 2A, is an example embodiment of the pseudo-envelope follower power management systems 10, depicted in FIG. 1A. Unlike the pseudo-envelope follower power management systems 10, depicted in FIG. 1A, the pseudo-envelope follower power management system 10A depicted in FIG. 2A includes an embodiment of the multi-level charge pump buck converter 12A and a parallel amplifier circuit 14A having parallel amplifier circuitry 32. The parallel amplifier circuitry 32 includes a parallel amplifier 35 and a parallel amplifier sense circuit 36. The parallel amplifier circuit 14A further includes a parallel amplifier output impedance compensation circuit 37 configured to receive a $V_{RAMP}$: signal and provide a compensated $V_{RAMP}$ signal, $V_{RAMP\_C}$, as an input to the parallel amplifier 35. The parallel amplifier circuit 14A further includes a parallel amplifier output impedance compensation circuit 37 configured to receive the $V_{RAMP}$ signal and generate a compensated $V_{RAMP}$ signal, $V_{RAMP\_C}$, as a function of the $V_{RAMP}$ signal. The parallel amplifier 35 generates a parallel amplifier output current, $I_{PARA\_AMP}$, to produce a parallel amplifier output voltage, $V_{PARA\_AMP}$, at the parallel amplifier output 32A based on the difference between the compensated $V_{RAMP}$ signal, $V_{RAMP\_C}$ and the power amplifier supply voltage, $V_{CC}$, generated at power amplifier supply output 28. The parallel amplifier sense circuit 36 generates a scaled parallel amplifier output current estimate, $I_{PARA\_AMP\_SENSE}$, which is a fractional representation of the parallel amplifier output current, $I_{PARA\_AMP}$, generated by the parallel amplifier 35. Alternatively, in those embodiments of the parallel amplifier circuit 14 that do not include the parallel amplifier output impedance compensation circuit 37, the parallel amplifier 35 generates the parallel amplifier output current, $I_{PARA\_AMP}$, to product the parallel amplifier output voltage, $V_{PARA\_AMP}$, based on the difference between the $V_{RAMP}$ signal and the power amplifier supply voltage, $V_{CC}$. The parallel amplifier circuit 14A may further include an open loop assist circuit 39 configured to receive the feed forward control signal 38, $V_{SWITCHER}$, the scaled parallel amplifier output current estimate, $I_{PARA\_AMP\_SENSE}$, and the $V_{RAMP}$ signal. In response to the feed forward control signal 38, $V_{SWITCHER}$, scaled parallel amplifier output current estimate, $I_{PARA\_AMP\_SENSE}$, and the $V_{RAMP}$ signal, the open loop assist circuit 39 may be configured to generate an open loop assist current, $I_{ASSIST}$. The open loop assist current, $I_{ASSIST}$, may be provided to the parallel amplifier output 32A. The parallel amplifier output current, $I_{PARA\_AMP}$, generated by the parallel amplifier 35 and the open loop assist circuit current, $I_{ASSIST}$, generated by the open loop assist circuit 39 may be combined to form the parallel amplifier circuit output current, $I_{PAWA\_OUT}$, of the parallel amplifier circuit 14A. The parallel amplifier circuit 14A may further include a $V_{OFFSET}$ loop circuit 41, configured to generate a threshold offset current 42, $I_{THRESHOLD\_OFFSET}$. The threshold offset current 42, $I_{THRESHOLD\_OFFSET}$, may be provided from the parallel amplifier circuit 14A as a feedback signal to the multi-level charge pump buck converter 12A. The $V_{OFFSET}$ loop circuit 41 may be configured to provide a threshold offset current 42, $I_{THRESHOLD\_OFFSET}$, as an estimate of the magnitude of the offset voltage, $V_{OFFSET}$, appearing across the coupling circuit 18. In those cases where the coupling circuit is a wire trace such that the offset voltage, $V_{OFFSET}$, is always zero volts, the parallel amplifier circuit 14A may not provide the threshold offset current 42, $I_{THRESHOLD\_OFFSET}$, to the multi-level charge pump buck converter 12A. An embodiment of the $V_{OFFSET}$ loop circuit 41 is depicted in FIG. 8. In addition, another embodiment of the $V_{OFFSET}$ loop circuit 41A, depicted in FIG. 18A and FIG. 18C, represents an alternative embodiment the $V_{OFFSET}$ loop circuit 41 depicted in FIGS. 2A, 2B, 8, 18A, and 18C. Moreover, as also described below, an alternative embodiment of a $V_{OFFSET}$ loop circuit 41B, depicted FIG. 18B and FIG. 18D, represents an alternative embodiment of the $V_{OFFSET}$ loop circuit 41 depicted in FIGS. 2A, 2B, 8, 18B, and 18D. In addition, another example is the pseudo-envelope follower power management system 10B, depicted in FIG. 2B, which is similar to the embodiment of the pseudo-envelope follower power management system 10B, depicted in FIG. 1B. The pseudo-envelope follower power management system 10B operationally and functionally similar in form and function to the pseudo-envelope follower power management system 10A, depicted in FIG. 2A. However, unlike the pseudo-envelope follower power management system 10A depicted in FIG. 2A, the pseudo-envelope follower power management system 10B includes a multi-level charge pump buck converter 12B configured to generate an estimated switching voltage output 38B, $V_{SW\_EST}$, and a parallel amplifier circuit 14B configured to receive the estimated switching voltage output 38B, $V_{SW\_EST}$, instead of the feed forward control signal 38, $V_{SWITCHER}$. Consequentially, as depicted in FIG. 2B, the open loop assist circuit 39 of the parallel amplifier circuit 14B in configured to use only the estimated switching voltage output 38B, $V_{SW\_EST}$, instead of the feed forward control signal 38, $V_{SWITCHER}$.

Figure 3A:
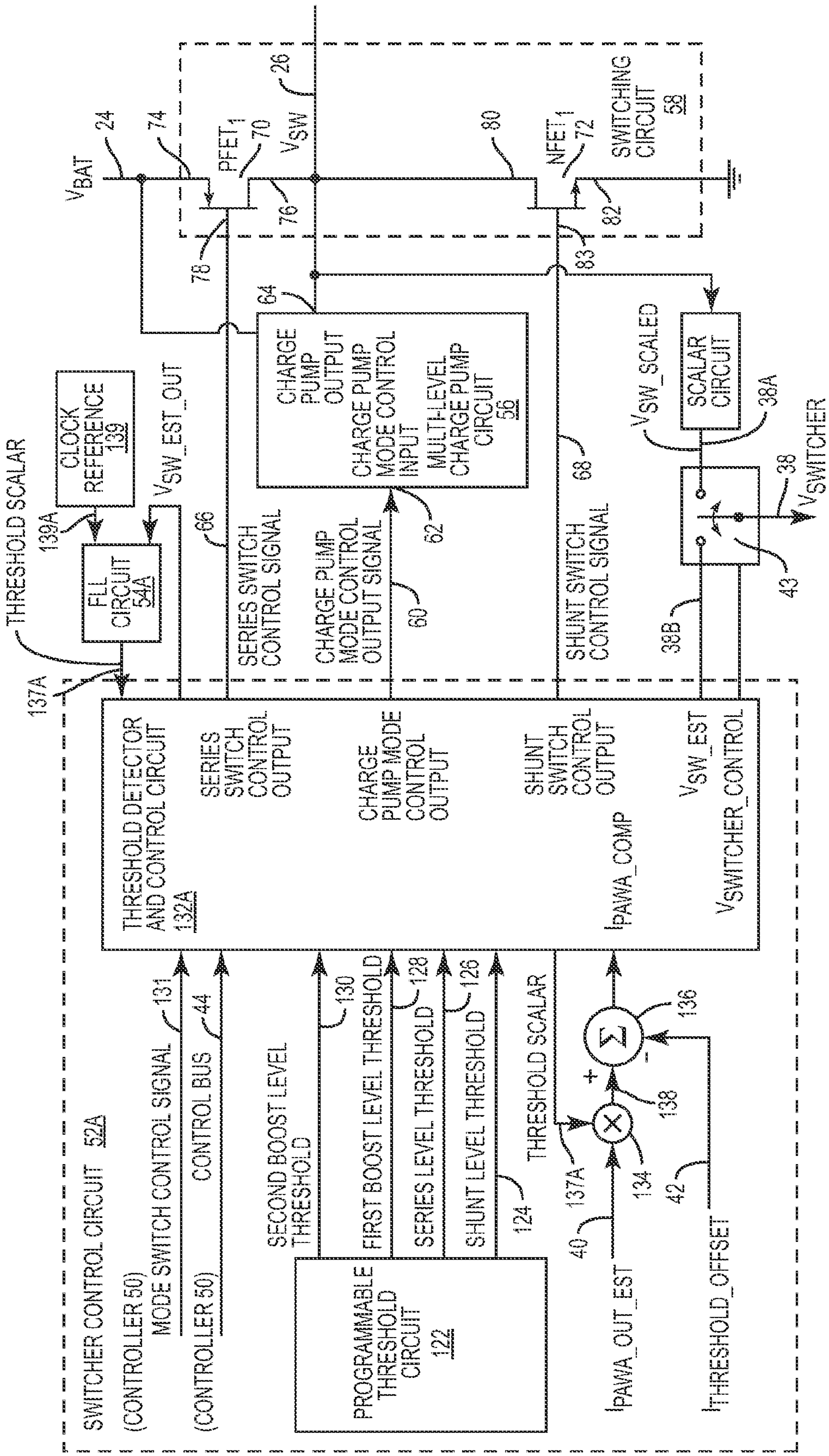
FIG. 3A depicts an embodiment of a portion of a multi-level charge pump buck converter.

The generation of the feed forward control signal 38, $V_{SWITCHER}$, depicted in FIGS. 1A and 2A, will now be explained with reference to FIG. 3A. As an example, the multi-level charge pump buck converters 12 and 12A may each be configured to generate a feed forward control signal 38, $V_{SWITCHER}$, to provide an indication of the output state of the switching voltage output 26 to the parallel amplifier circuit 14. As an example, FIG. 3A depicts an embodiment of the switcher control circuit 52, depicted in FIG. 2A, as a switcher control circuit 52A. In FIG. 3A, the feed forward control signal 38, $V_{SWITCHER}$, is provided by a switch 43. The switch 43 may be configured by the $V_{SWITCHER\_CONTROL}$ signal to provide either an indication of the switching voltage output, $V_{SW}$, from the threshold detector and control circuit 132A or a scaled version of the switching voltage output, $V_{SW}$, from the scalar circuit as the feed forward control signal 38, $V_{SWITCHER}$. The threshold detector and control circuit 132A may generate an estimated switching voltage output 38B, $V_{SW\_EST}$, based on the state of the switcher control circuit 52A, where the estimated switching voltage output 38B, $V_{SW\_EST}$, provides an indication of the switching voltage output, $V_{SW}$, based on the state of the switcher control circuit 52A. Due to propagation delay within the switcher control circuit 52A, the multilevel-charge pump circuit 56 and the switching circuit 58 of the multi-level charge pump buck converter 12A, the indication of the switching voltage output, $V_{SW}$, based on the state of the switcher control circuit 52A is a feed forward signal that indicates what the voltage level of the switching voltage output, $V_{SW}$, at the switching voltage output 26 will be based on the state of the switcher control circuit 52A instead of the current voltage level of the switching voltage output, $V_{SW}$, at the switching voltage output 26. Thus, the estimated switching voltage output 38B, $V_{SW\_EST}$, may provide an early indication what the voltage level of the switching voltage output, $V_{SW}$, will be in the future instead of the present voltage level of the switching voltage output, $V_{SW}$, at the switching voltage output 26. In contrast, the scalar circuit may generate a scaled switching voltage output 38A, $V_{SW\_SCALED}$, by scaling the switching voltage output 26, $V_{SW}$, where the scaled switching voltage output 38A, $V_{SW\_SCALED}$, provides a scaled version of the switching voltage output, $V_{SW}$. Thus, the scaled switching voltage output 38A, $V_{SW\_SCALED}$, is a scaled version of the voltage level currently at the switching voltage output 26 instead of a future voltage level. Accordingly, the switch 43 may be configured such that the feed forward control signal 38, $V_{SWITCHER}$, provides either the estimated switching voltage output 38B, $V_{SW\_EST}$, or the scaled switching voltage output 38A, $V_{SW\_SCALED}$, as the feed forward control signal 38, $V_{SWITCHER}$.

Another embodiment of the pseudo-envelope follower power management system 10B, as depicted in FIG. 1B, is described with reference to FIG. 3B. As depicted in FIG. 1B, the multi-level charge pump buck converter 12B may be configured to provide both a scaled switching voltage output 38A, $V_{SW\_SCALED}$, and an estimated switching voltage output 38B, $V_{SW\_EST}$, to the parallel amplifier circuit 14B. As still another example, the pseudo-envelope follower power management system 10B depicted in FIG. 2B may be configured to only provide the estimated switching voltage output 38B, $V_{SW\_EST}$, as a feed forward signal to the parallel amplifier circuit 14B.

The generation of the parallel amplifier circuit output current estimate 40, $I_{PAWA\_OUT\_EST}$, depicted in FIGS. 1A and 1B will now be described with continuing reference to the embodiment of the parallel amplifier circuit 14A, depicted in FIG. 2A, and the embodiment of the parallel amplifier circuit 14B depicted in FIG. 2B. Embodiments of the parallel amplifier circuit 14A and the parallel amplifier circuit 14B, depicted in FIGS. 2A and 2B, may provide the parallel amplifier circuit output current estimate 40, $I_{PAWA\_OUT\_EST}$, where the parallel amplifier circuit output current estimate 40, $I_{PAWA\_OUT\_EST}$, includes a scaled parallel amplifier output current estimate, $I_{PARA\_AMP\_SENSE}$, and a scaled open loop assist circuit output current estimate, $I_{ASSIST\_SENSE}$. The scaled parallel amplifier output current estimate, $I_{PARA\_AMP\_SENSE}$, is a scaled estimate of the parallel amplifier output current, $I_{PARA\_AMP}$, generated by the parallel amplifier sense circuit 36 of the parallel amplifier circuitry 32. In some alternative embodiments, the parallel amplifier 35 may generate the scaled estimate of the parallel amplifier output current, $I_{PARA\_AMP\_SENSE}$, directly. The scaled open loop assist circuit current estimate, $I_{ASSIST\_SENSE}$, is a scaled estimate of the open loop assist circuit current, $I_{ASSIST}$, generated by the open loop assist circuit 39. In other alternative embodiments of the parallel amplifier circuit 14 depicted in FIG. 1A and FIG. 1B, the parallel amplifier circuit 14 does not include the open loop assist circuit 39. In those embodiments of the parallel amplifier circuit 14 depicted in FIG. 1A and FIG. 1B that do not include the open loop assist circuit 39, the parallel amplifier circuit output current estimate 40, $I_{PAWA\_OUT\_EST}$, may only be based on the scaled parallel amplifier output current estimate, $I_{PARA\_AMP\_SENSE}$.

Returning to FIGS. 1A and 1B, the pseudo-envelope follower power management systems 10A and 10B may further include a control bus 44 coupled to a controller 50. The control bus 44 may be coupled to a control bus interface 46 of the multi-level charge pump buck converter 12 and the control bus interface 48 of the parallel amplifier circuit 14. The controller 50 may include various logical blocks, modules, and circuits. The controller 50 may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices. As an example, a combination of computing devices may include a combination of a DSP and a microprocessor, a plurality of microprocessors, one or more microprocessors in conjunction with a DSP core, or any other such configuration. The controller may further include or be embodied in hardware and in computer executable instructions that are stored in memory, and may reside, for example, in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of computer readable medium known in the art. An exemplary storage medium may be coupled to the processor such that a processor can read information from, and write information to, the storage medium. In the alternative, the storage medium or a portion of the storage medium may be integral to the processor. The processor and the storage medium may reside in an ASIC.

FIGS. 2A and 2B depict a pseudo-envelope follower power management system 10A and a pseudo-envelope follower power management system 10B, respectively, that include embodiments of the multi-level charge pump buck converter 12A and the multi-level charge pump buck converter 12B. As depicted in FIGS. 2A and 2B, some embodiments of the multi-level charge pump buck converter 12 of FIGS. 1A and 1B may include an FLL circuit 54 configured to interoperate with a switcher control circuit 52, as depicted in FIGS. 2A and 2B. Alternatively, some embodiments of the multi-level charge pump buck converter 12A and the multi-level charge pump buck converter 12B may not include an FLL circuit 54 or be configured to operate with the FLL circuit 54 being disabled.

As further depicted in FIGS. 2A and 2B, some embodiments of the switcher control circuit 52 may be configured to control the operation of the multi-level charge pump circuit 56 and the switching circuit 58 to generate the switching voltage, $V_{SW}$, on the switching voltage output 26 of the multi-level charge pump buck converter 12A or the multi-level charge pump buck converter 12B, respectively. For example, the switcher control circuit 52 may use a charge pump mode control signal 60 to configure the operation of the multi-level charge pump circuit 56 to provide a charge pump output 64 to the switching circuit 58. Alternatively, the switcher control circuit 52 may generate a series switch control signal 66 to configure the switching circuit 58 to provide the switching voltage, $V_{SW}$, substantially equal to the DC voltage, $V_{BAT}$, from the battery 20 via a first switching element coupled between the supply input 24 and the switching voltage output 26. As another example, the switcher control circuit 52 may configure the switching circuit 58 to provide the switching voltage, $V_{SW}$, through a second switching element coupled to ground such that the switching voltage, $V_{SW}$, is substantially equal to ground.

In addition, the parallel amplifier circuit 14A, depicted in FIG. 2A, and the parallel amplifier circuit 14B, depicted in FIG. 2B, may be configured to provide the parallel amplifier circuit output current estimate 40, $I_{PAWA\_OUT\_EST}$, and the threshold offset current 42, $I_{THRESHOLD\_OFFSET}$, to the switcher control circuit 52 in order to control the operation of the switcher control circuit 52. As discussed in detail below, some embodiments of the switcher control circuit 52 may be configured to receive and use the parallel amplifier circuit output current estimate 40, $I_{PAWA\_OUT\_EST}$, the threshold offset current 42, $I_{THRESHOLD\_OFFSET}$, and/or a combination thereof to control the operation of the switcher control circuit 52.

For example, the switcher control circuit 52 may use the parallel amplifier circuit output current estimate 40, $I_{PAWA\_OUT\_EST}$, the threshold offset current 42, $I_{THRESHOLD\_OFFSET}$, and/or a combination thereof to determine the magnitude of the voltage provided the switching voltage, $V_{SW}$, from the multi-level charge pump circuit 56.

Some embodiments of the switcher control circuit 52, depicted in FIG. 2A and FIG. 2B, may be configured to interoperate with an FLL circuit 54. As an example, FIG. 3A depicts an example embodiment of a switcher control circuit 52A configured to interoperate with an example embodiment of the FLL circuit 54, which is depicted as FLL circuit 54A. For the sake of clarity, and not by limitation, the description of the operation of the switcher control circuit 52A and the FLL circuit 54A will be done with continuing reference to the multi-level charge pump buck converter 12A, depicted in FIG. 2A.

As depicted in FIG. 3A, some embodiments of the multi-level charge pump buck converter 12A may include switcher control circuit 52A, an embodiment of the frequency lock loop frequency lock loop (FLL) circuit 54A, a multi-level charge pump circuit 56, and the switching circuit 58. The switcher control circuit 52A may be in communication with the frequency lock loop (FLL) circuit 54A. The frequency lock loop (FLL) circuit 54A may be in communication with a clock reference 139. The multi-level charge pump circuit 56 and the switching circuit 58 may be configured to receive the DC voltage, $V_{BAT}$, from the supply input 24 of the multi-level charge pump buck converter 12.

The clock reference 139 may provide a clock reference signal 139A to the frequency lock loop (FLL) circuit 54A. In addition, the switcher control circuit 52A may provide a logic level indication of the switching voltage output, $V_{SW\_EST\_OUT}$, to the frequency lock loop (FLL) circuit 54A. The logic level indication of the switching voltage output, $V_{SW\_EST\_OUT}$, is discussed relative to the logic circuit 148A of FIG. 4A. In some embodiments of the multi-level charge pump buck converter 12 of FIGS. 1A and 1B, the multi-level charge pump buck converter 12 may not include the frequency lock loop (FLL) circuit 54 and a clock reference 139, as depicted in FIGS. 3C and 3D.

The switcher control circuit 52A may be configured to receive the parallel amplifier circuit output current estimate 40, $I_{PAWA\_OUT\_EST}$, and the threshold offset current 42, $I_{THRESHOLD\_OFFSET}$, from the parallel amplifier circuit 14A. The switcher control circuit 52A may provide a charge pump mode control signal 60 to the charge pump mode control input 62 of the multi-level charge pump circuit 56. Based upon the charge pump mode control signal 60, the multi-level charge pump circuit 56 may generate one of a plurality of output voltages or present an open circuit at the charge pump output 64. The switcher control circuit 52A may further provide a series switch control signal 66 and a shunt switch control signal 68 to the switching circuit 58.

The switching circuit 58 may include a series switch 70 and a shunt switch 72. The series switch 70 and the shunt switch 72 may be a solid state based switch such as a field effect transistor, an insulator-on-semiconductor based transistor, or a bipolar based transistor. The series switch 70 may include a first switch terminal 74, a second switch terminal 76, and a series switch control terminal 78 coupled to the series switch control signal 66. The shunt switch 72 may include a first switch terminal 80, a second switch terminal 82, and a shunt switch control terminal 83 coupled to the shunt switch control signal 68. The first switch terminal 74 of the series switch 70 may be coupled to the supply input 24, ($V_{BAT}$), of the multi-level charge pump buck converters 12 and 12A, as depicted in FIGS. 1A and 2A. The second switch terminal 76 of the series switch 70 may be coupled to the first switch terminal 80 of the shunt switch 72 and the charge pump output 64 to form the switching voltage output 26. The second switch terminal 82 of the shunt switch 72 may be coupled to ground.

Figure 7A:
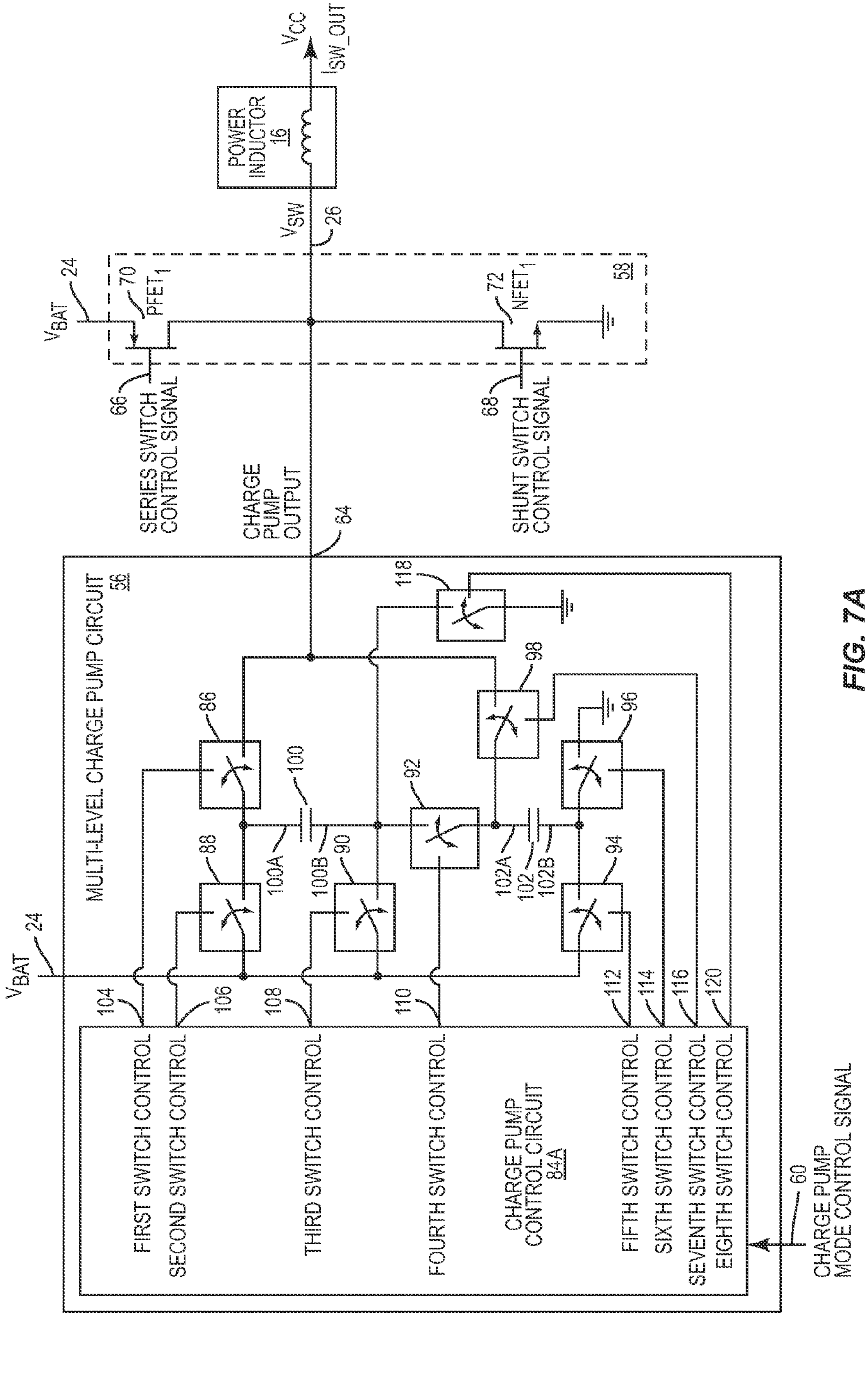
FIG. 7A depicts one embodiment of a multi-level charge pump circuit of a pseudo-envelope follower power management system.

As depicted in FIG. 7A, with continuing reference to FIGS. 1A, 2A and 3A, the multi-level charge pump circuit 56 may include a charge pump control circuit 84A, a plurality of switches including a first switch 86, a second switch 88, a third switch 90, a fourth switch 92, a fifth switch 94, a sixth switch 96 and a seventh switch 98, a first flying capacitor 100 having a first terminal 100A and a second terminal 100B, and a second flying capacitor 102 having a first terminal 102A and a second terminal 102B. As depicted in FIG. 7A, some alternative embodiments of the multi-level charge pump circuit 56 may further include an eighth switch 118 to advantageously provide an additional functional feature, described below. Each of the first switch 86, the second switch 88, the third switch 90, the fourth switch 92, the fifth switch 94, the sixth switch 96, the seventh switch 98, and the alternatively included eighth switch 118 may be a solid state based switch implemented with field effect transistors, insulator-on-semiconductor based transistors, or bipolar based transistors, or a combination thereof. Each of the first switch 86, the second switch 88, the third switch 90, the fourth switch 92, the fifth switch 94, the sixth switch 96, the seventh switch 98, and the alternatively included eighth switch 118 may be a solid state transmission gate. As another example, each of the first switch 86, the second switch 88, the third switch 90, the fourth switch 92, the fifth switch 94, the sixth switch 96, the seventh switch 98, and the alternatively included eighth switch 118 may be based on a GaN process. Alternatively, each of the first switch 86, the second switch 88, the third switch 90, the fourth switch 92, the fifth switch 94, the sixth switch 96, the seventh switch 98, and the alternatively included eighth switch 118 may be micro-electromechanical systems (MEMS) contact type switches.

The first switch 86 may be coupled between the first terminal 100A of the first flying capacitor 100 and the charge pump output 64. The first switch 86 may include a first switch control input configured to receive a first switch control signal 104 from the charge pump control circuit 84A, where the first switch control signal 104 operably opens and closes the first switch 86 based upon the charge pump mode control signal 60. The second switch 88 may be coupled between the first terminal 100A of the first flying capacitor 100 and the supply input 24, ($V_{BAT}$), of the multi-level charge pump buck converter 12. The second switch 88 may include a second switch control input configured to receive a second switch control signal 106 from the charge pump control circuit 84A, where the second switch control signal 106 operably opens and closes the second switch 88 based upon the charge pump mode control signal 60. The third switch 90 may be coupled between the second terminal 100B of the first flying capacitor 100 and the supply input 24, ($V_{BAT}$), of the multi-level charge pump buck converter 12. The third switch 90 may include a third switch control input configured to receive a third switch control signal 108 from the charge pump control circuit 84A, where the third switch control signal 108 operably opens and closes the third switch 90 based upon the charge pump mode control signal 60. The fourth switch 92 may be coupled between the second terminal 100B of the first flying capacitor 100 and the first terminal 102A of the second flying capacitor 102. The fourth switch 92 may include a fourth switch control input configured to receive a fourth switch control signal 110 from the charge pump control circuit 84A, where the fourth switch control signal 110 operably opens and closes the fourth switch 92 based upon the charge pump mode control signal 60. The fifth switch 94 may be coupled between the supply input 24, ($V_{BAT}$), of the multi-level charge pump buck converter 12 and the second terminal 102B of the second flying capacitor 102. The fifth switch 94 may include a fifth switch control input configured to receive a fifth switch control signal 112 from the charge pump control circuit 84A, where the fifth switch control signal 112 operably opens and closes the fifth switch 94 based upon the charge pump mode control signal 60. The sixth switch 96 may be coupled between the second terminal 102B of the second flying capacitor 102 and ground. The sixth switch 96 may include a sixth switch control input configured to receive a sixth switch control signal 114 from the charge pump control circuit 84A, where the sixth switch control signal 114 operably opens and closes the sixth switch 96 based upon the charge pump mode control signal 60. The seventh switch 98 may be coupled between the first terminal 102A of the second flying capacitor 102 and the charge pump output 64. The seventh switch 98 includes a seventh switch control input configured to receive a seventh switch control signal 116 from the charge pump control circuit 84A, where the seventh switch control signal 116 operably opens and closes the seventh switch 98 based upon the charge pump mode control signal 60.

Based upon the charge pump mode control signal 60 received at the charge pump control circuit 84A, the charge pump control circuit 84A may configure each of the first switch 86, the second switch 88, the third switch 90, the fourth switch 92, the fifth switch 94, the sixth switch 96, the seventh switch 98, and the alternatively included eighth switch 118 to place the first flying capacitor 100 and the second flying capacitor 102 in various arrangements in order to place the multi-level charge pump circuit 56 in various modes of operation. As an example, the multi-level charge pump circuit 56 may have a charging mode to charge the first flying capacitor 100 and the second flying capacitor 102, a first boost mode to provide $1.5\times V_{BAT}$ at the charge pump output 64, and a second boost mode to provide $2\times V_{BAT}$ at the charge pump output 64. Some alternative embodiments of the multi-level charge pump circuit 56 may further include an eighth switch 118, the operation of which is discussed below with respect to providing a first output mode of operation.

As an example, in response to receipt of the charge pump mode control signal 60 that indicates the multi-level charge pump circuit 56 should be in the charging mode of operation, the charge pump control circuit 84A configures the first flying capacitor 100 and the second flying capacitor 102 to be coupled in series between the supply input 24, ($V_{BAT}$), of the multi-level charge pump buck converter 12 and ground, where the first flying capacitor and the second flying capacitor may be switchably disconnected from the charge pump output 64. Assuming that the capacitance of the first flying capacitor 100 and the second flying capacitor 102 are equal, the first flying capacitor 100 and the second flying capacitor 102 each charge to a charged voltage of $\frac{1}{2}\times V_{BAT}$. The charge pump control circuit 84A configures the first switch 86 to be open, the second switch 88 to be closed, the third switch 90 to be open, the fourth switch 92 to be closed, the fifth switch 94 to be open, the sixth switch 96 to be closed, and the seventh switch 98 to be open. In those embodiments of the multi-level charge pump circuit 56 that further include the eighth switch 118, the eighth switch 118 may be configured to be open.

In response to receipt of the charge pump mode control signal 60 that indicates the multi-level charge pump circuit 56 should be in the first boost mode of operation, the charge pump control circuit 84A configures the first flying capacitor 100 and the second flying capacitor 102 to be arranged in parallel between the charge pump output 64 and the supply input 24, ($V_{BAT}$), to generate $1.5\times V_{BAT}$ at the charge pump output. The charge pump control circuit 84A configures the first switch 86 to be closed, the second switch 88 to be open, the third switch 90 to be closed, the fourth switch 92 to be open, the fifth switch 94 to be closed, the sixth switch 96 to be open, and the seventh switch 98 to be closed. In those embodiments of the multi-level charge pump circuit 56 that further include the eighth switch 118, the eighth switch 118 may be configured to be open.

In response to receipt of the charge pump mode control signal 60 that indicates the multi-level charge pump circuit 56 should be in the second boost mode of operation, the charge pump control circuit 84A configures the first flying capacitor 100 and the second flying capacitor 102 to be arranged in series between the charge pump output 64 and the supply input 24, ($V_{BAT}$), to generate $2\times V_{BAT}$ at the charge pump output 64. The charge pump control circuit 84A configures the first switch 86 to be closed, the second switch 88 to be open, the third switch 90 to be open, the fourth switch 92 to be closed, the fifth switch 94 to be closed, the sixth switch 96 to be open, and the seventh switch 98 to be open. In those embodiments of the multi-level charge pump circuit 56 that further include the eighth switch 118, the eighth switch 118 may be configured to be open.

As discussed above, some embodiments of the multi-level charge pump circuit 56 may further include an eighth switch 118 coupled between the second terminal 100B of the first flying capacitor 100 and ground in order to provide for a first output mode of operation. The eighth switch 118 may include an eighth switch control input configured to receive an eighth switch control signal 120 from the charge pump control circuit 84A, where the eighth switch control signal 120 operably opens and closes the eighth switch 118 based upon the charge pump mode control signal 60.

In the first output mode of operation, the multi-level charge pump circuit 56 may provide ½×$V_{BAT}$ at the charge pump output 64. In response to receipt of the charge pump mode control signal 60 that indicates the multi-level charge pump circuit 56 should be in the first output mode of operation, the charge pump control circuit 84A configures the first flying capacitor 100 and the second flying capacitor 102 to be coupled in parallel between the charge pump output 64 and ground. The charge pump control circuit 84A configures the first switch 86 to be closed, the second switch 88 to be open, the third switch 90 to be open, the fourth switch 92 to be open, the fifth switch 94 to be open, the sixth switch 96 to be closed, the seventh switch 98 to be closed and the eighth switch 118 to be closed.

Otherwise, the charge pump control circuit 84A configures the eighth switch 118 to be open when the multi-level charge pump circuit 56 is in the charging mode of operation, the first boost mode of operation, or the second boost mode of operation.

Figure 7B:
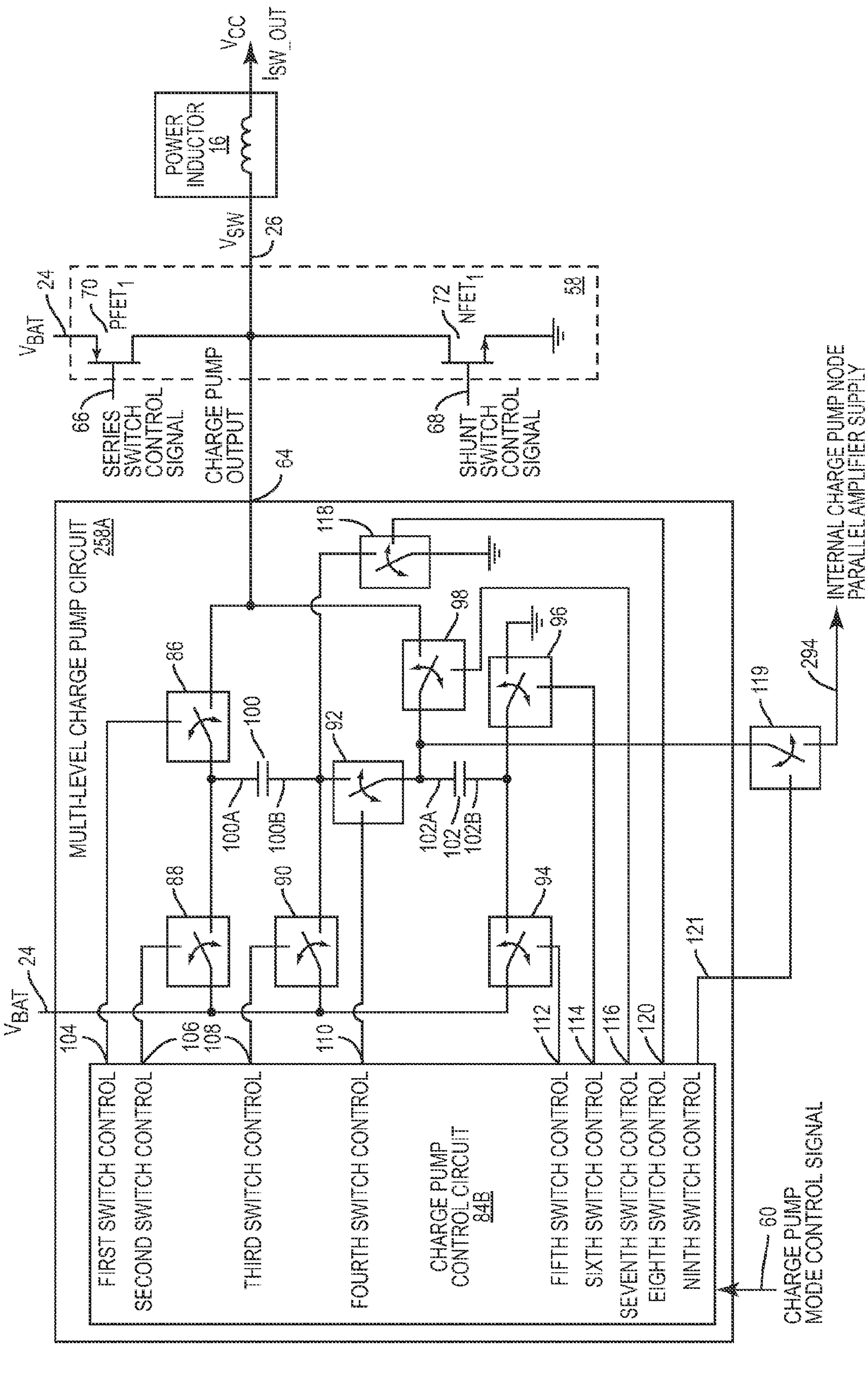
FIG. 7B depicts another embodiment of a multi-level charge pump circuit of a pseudo-envelope follower power management system.

FIG. 7B depicts an embodiment of a multi-level charge pump circuit 258, depicted in FIGS. 18A and 18B, as multi-level charge pump circuit 258A. The multi-level charge pump circuit 258A is similar to the multi-level charge pump circuit 56 except the multi-level charge pump circuit 258A further includes a ninth switch 119 configured to provide an internal charge pump node parallel amplifier supply 294 as an additional output. The ninth switch 119 may be similar to the plurality of switches including the first switch 86, the second switch 88, the third switch 90, the fourth switch 92, the fifth switch 94, the sixth 96, the seventh switch 98, and eighth switch 118 of FIG. 7A. In addition, the multi-level charge pump circuit 258A is similar to the multi-level charge pump circuit 56 except that the charge pump control circuit 84A is replaced by a charge pump control circuit 84B. Unlike the charge pump control circuit 84A, the charge pump control circuit 84B further includes a ninth switch control signal 121 configured to control the ninth switch 119.

The ninth switch 119 may include a ninth switch control input configured to receive a ninth switch control signal 121 from the charge pump control circuit 84B, where the ninth switch control signal 121 operably opens and closes the ninth switch 119 based upon the charge pump mode control signal 60. The ninth switch may be operably coupled between the first terminal 102A of the second flying capacitor 102 and the internal charge pump node parallel amplifier supply 294.

Operationally, the charge pump control circuit 84B functions similar to the operation of the charge pump control circuit 84A. As an example, the multi-level charge pump circuit 258A may have a charging mode to charge the first flying capacitor 100 and the second flying capacitor 102, a first boost mode to provide 1.5×$V_{BAT}$ at the charge pump output 64, and a second boost mode to provide 2×$V_{BAT}$ at the charge pump output 64. However, unlike the charge pump control circuit 84A, the charge pump control circuit 84B is configured to operably close the ninth switch 119 when the multi-level charge pump circuit 258A is configured to operate in either the first boost mode to provide 1.5×$V_{BAT}$ at the charge pump output 64 or the second boost mode to provide 2×$V_{BAT}$ at the charge pump output 64. Thus, when the ninth switch 119 is in a closed state during either the first boost mode of operation or the second boost mode of operation, the voltage appearing on the first terminal 102A of the second flying capacitor 102, is substantially equal to 1.5×$V_{BAT}$. Advantageously, the configuration of the multi-level charge pump circuit 258A provides the same voltage output level to the internal charge pump node parallel amplifier supply 294, which may improve the ripple noise on the power amplifier supply voltage $V_{CC}$.

Figure 7C:
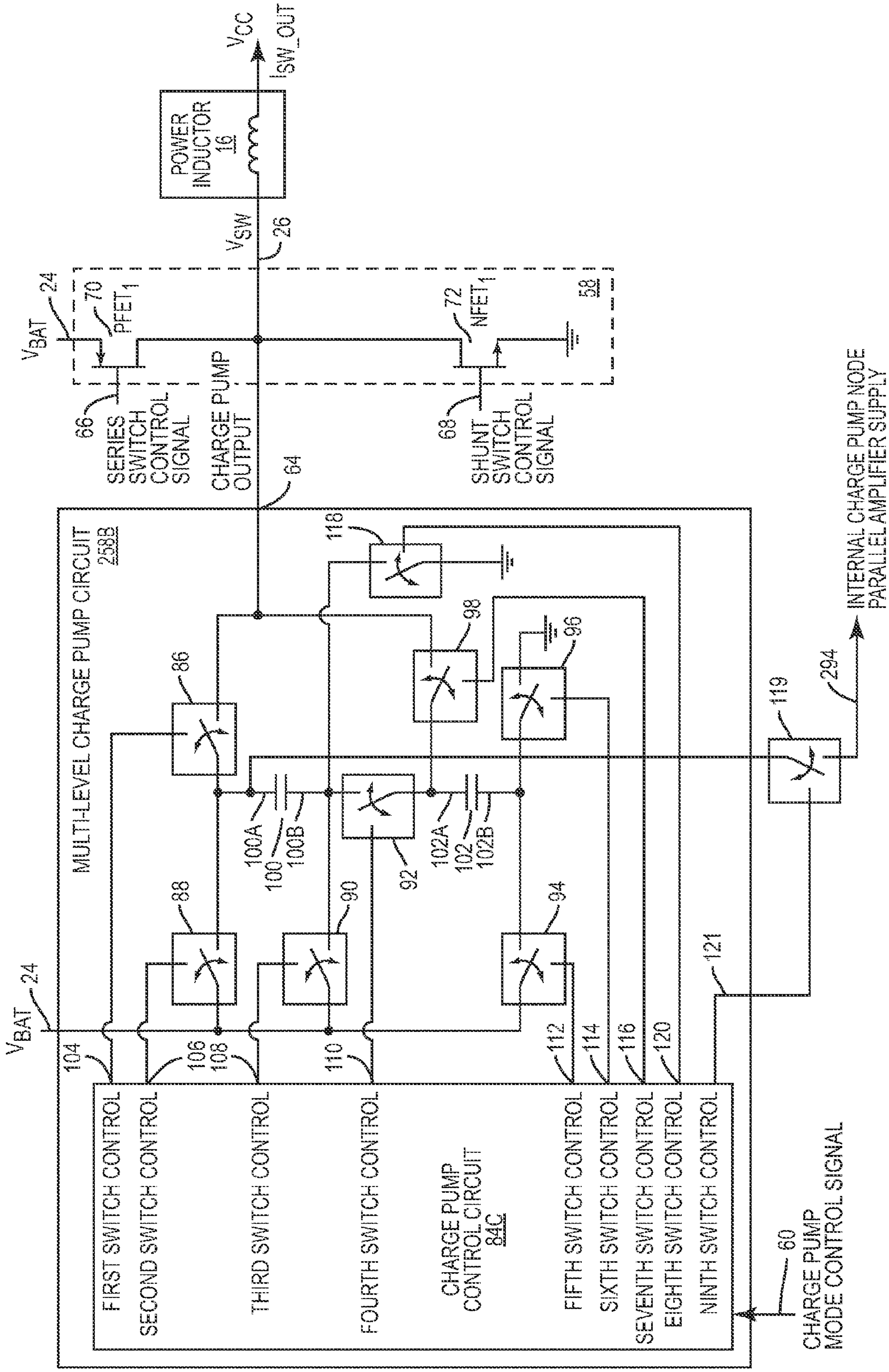
FIG. 7C depicts still another embodiment of a multi-level charge pump circuit of a pseudo-envelope follower power management system.

FIG. 7C depicts another embodiment of a multi-level charge pump circuit 258, depicted in FIGS. 18A and 18B, as multi-level charge pump circuit 258B. The multi-level charge pump circuit 258B is similar to the multi-level charge pump circuit 258A of FIG. 7B except the ninth switch may be operably coupled between the first terminal 100A of the first flying capacitor 100 and the internal charge pump node parallel amplifier supply 294.

Operationally, the charge pump control circuit 84C functions similar to the operation of the charge pump control circuit 84B. As an example, like the multi-level charge pump circuit 258A, the multi-level charge pump circuit 258B may have a charging mode to charge the first flying capacitor 100 and the second flying capacitor 102, a first boost mode to provide 1.5×$V_{BAT}$ at the charge pump output 64, and a second boost mode to provide 2×$V_{BAT}$ at the charge pump output 64. In addition, like the charge pump control circuit 84B, the charge pump control circuit 84C is configured to operably close the ninth switch 119 when the multi-level charge pump circuit 258B is configured to operate in either the first boost mode to provide 1.5×$V_{BAT}$ at the charge pump output 64 or the second boost mode to provide 2×$V_{BAT}$ at the charge pump output 64. Thus, when the ninth switch 119 is in a closed state during either the first boost mode of operation or the second boost mode of operation, the voltage appearing on the first terminal 100A of the first flying capacitor 100 may depend upon whether the multi-level charge pump circuit 258B is configured to operate in the first boost mode or the second boost mode. For example, due to the topological location of the first flying capacitor, the voltage output level provided to the internal charge pump node parallel amplifier supply 294 may be 1.5×$V_{BAT}$ when the multi-level charge pump circuit 258B is configured to operate in the first boost mode and 2.0×$V_{BAT}$ when the multi-level charge pump circuit 258B is configured to operate in the second boost mode. As a result, advantageously, the multi-level charge pump circuit 258B may provide a higher power supply rail for the parallel amplifier 35 of FIGS. 18A and 18B. In particular, in the case where the parallel amplifier 35 of FIGS. 18A and 18B is a rechargeable parallel amplifier, similar to the rechargeable parallel amplifier 35E of FIG. 12E and the rechargeable parallel amplifier 35F of FIG. 12F, the saved charge voltage, $V_{AB}$ on the charge conservation capacitor, $C_{AB}$, may be increased and result in a larger range of operation of the second output stage, as depicted in FIGS. 12E and 12F.

In those embodiments that further provide a first output threshold parameter (not shown), the first output threshold parameter may correspond to a first output mode of operation of the multi-level charge pump buck converter 12. In the first output mode of operation, both the series switch 70 and the shunt switch 72 are open and the multi-level charge pump circuit 56 is in the first output mode of operation to generate a ½×$V_{BAT}$ at the switching voltage output 26.

Returning to FIG. 3A, for the sake of clarity and not by way of limitation, the following discussion of the operation of the circuits depicted in FIG. 3A will be done with continuing reference to the multi-level charge pump buck converter 12A depicted in FIG. 2A. As depicted in FIG. 3A, the switcher control circuit 52A may include a programmable threshold circuit 122 configured to receive a plurality of programmable threshold levels and one embodiment of a threshold detector and control circuit 132A. The programmable threshold levels may be received from a controller 50 via the control bus 44. As an example, in some embodiments, the controller 50 may provide a shunt level threshold parameter, a series level threshold parameter, a first boost level threshold parameter, and a second boost level threshold parameter. In another embodiment, the controller 50 may further provide a first output threshold parameter.

As an example, each of the threshold levels may correspond to one of a plurality of output modes of the multi-level charge pump buck converter 12A. As an example, the shunt level threshold parameter may correspond to a shunt output mode of operation. In a shunt output mode of operation of the multi-level charge pump buck converter 12A, the series switch 70 is open (not conducting), the multi-level charge pump circuit 56 is in the charging mode of operation, and the shunt switch 72 is closed (conducting) to generate zero volts at the switching voltage output 26. The shunt output mode of operation provides a conduct path for current to continue flowing through the power inductor 16 when the multi-level charge pump circuit 56 is in the charging mode of operation and the series switch 70 is open (not conducting). The series level threshold parameter may correspond to a shunt output mode of operation of the multi-level charge pump buck converter 12A. In a series output mode of operation, the series switch 70 is closed (conducting), the multi-level charge pump circuit 56 is in the charging mode of operation, and the shunt switch 72 is open to generate $V_{BAT}$ at the switching voltage output 26. The first boost level threshold parameter may correspond to a first boost output mode of operation of the multi-level charge pump buck converter 12A. In the first boost output mode of operation, both the series switch 70 and the shunt switch 72 are open and the multi-level charge pump circuit 56 is in the first boost mode of operation to generate $1.5\times V_{BAT}$ at the switching voltage output 26. The second boost level threshold parameter may correspond to a second boost output mode of operation of the multi-level charge pump buck converter 12A. In a second boost output mode of operation, both the series switch 70 and the shunt switch 72 are open and the multi-level charge pump circuit 56 is in the second boost mode of operation to generate a $2\times V_{BAT}$ at the switching voltage output 26.

Based upon the shunt level threshold parameter, the series level threshold parameter, the first boost level threshold parameter, and the second boost level threshold parameter, the programmable threshold circuit 122 generates a shunt level threshold 124, a series level threshold 126, a first boost level threshold 128, and a second boost level threshold 130, respectively, which are provided to the threshold detector and control circuit 132A. In those embodiments that provide for a first output threshold parameter and a first output mode of operation of the multi-level charge pump circuit 56, the programmable threshold circuit 122 may further generate a first output threshold (not shown), which is provided to the threshold detector and control circuit 132A. As depicted in FIG. 3A, the shunt level threshold 124, the series level threshold 126, the first boost level threshold 128, the second boost level threshold 130 and the first output threshold may be represented by a current level for use with a current comparator. In alternative embodiments, programmable threshold circuit 122 may be configured to generate the shunt level threshold 124, the series level threshold 126, the first boost level threshold 128, the second boost level threshold 130 and the first output threshold as voltage levels to be used in conjunction with voltage comparator circuits.

The switcher control circuit 52A may also receive a mode switch control signal 131 from the controller 50. The mode switch control signal 131 may configure the threshold detector and control circuit 132A to operate the multi-level charge pump buck converter 12A in different modes of operation. As an example, the mode switch control signal 131 may configure operation of a state machine within the threshold detector and control circuit 132A that governs how the switching voltage output 26 transitions the switching voltage output 26 to provide different output levels. As a first example embodiment of a state machine within the threshold detector and control circuit 132A, the mode switch control signal 131 may configure the multi-level charge pump buck converter 12A to operate in a first mode of operation, depicted in FIG. 5A. As another example embodiment of a state machine within the threshold detector and control circuit 132A, the mode switch control signal 131 may configure the multi-level charge pump buck converter 12A to operate in a second mode of operation, depicted in FIG. 6A.

Continuing with FIG. 3A, the switcher control circuit 52A may further include a multiplier circuit 134 and a summing circuit 136. The multiplier circuit may be configured to receive the parallel amplifier circuit output current estimate 40, $I_{PAWA\_OUT\_EST}$, and a threshold scalar 137A from the threshold detector and control circuit 132A. The threshold scalar 137A may be provided by FLL circuit 54A, which is one embodiment of the frequency lock loop (FLL) circuit 54 depicted in FIG. 2A.

The FLL circuit 54A receives a clock reference signal 139A from a clock reference 139 and a logic level indication of the switching voltage output, $V_{SW\_EST\_OUT}$. The FLL circuit 54A extracts the operating frequency of the multi-level charge pump buck converter 12A based upon the logic level indication of the switching voltage output, $V_{SW\_EST\_OUT}$. Thereafter, the FLL circuit 54A compares the extracted operating frequency of the multi-level charge pump buck converter 12A to the clock reference signal 139A to generate the threshold scalar 137A. The magnitude of the threshold scalar 137A may be used to adjust the operating frequency of the multi-level charge pump buck converter 12A. In some embodiments (not shown), the FLL circuit 54A may provide the threshold scalar 137A directly to the multiplier circuit 134.

The multiplier circuit 134 may multiply the parallel amplifier circuit output current estimate 40, $I_{PAWA\_OUT\_EST}$, by the threshold scalar 137A to generate a scaled parallel amplifier output current estimate 138. The scaled parallel amplifier output current estimate 138 is provided to the summing circuit 136. The summing circuit 136 subtracts the threshold offset current 42, $I_{THRESHOLD\_OFFSET}$, from the scaled parallel amplifier output current estimate 138 to generate a compensated parallel amplifier circuit output current estimate, $I_{PAWA\_COMP}$, which may be used as a composite feedback signal for the first comparator 140, the second comparator 142, the third comparator 144, and the fourth comparator 146 as depicted, for example, in FIG. 4A. In those embodiments of the parallel amplifier circuit 14 that do not include the $V_{OFFSET}$ loop circuit 41, the threshold offset current 42, $I_{THRESHOLD\_OFFSET}$, and summing circuit 136 are omitted.

The scaled parallel amplifier output current estimate 138 may be used to control the operating frequency of the multi-level charge pump buck converter 12A by increasing or decreasing the magnitude of the parallel amplifier circuit output current estimate 40, $I_{PAWA\_OUT\_EST}$. As an example, the FLL circuit 54A may be configured to increase the magnitude of the threshold scalar 137A to increase the magnitude of the scaled parallel amplifier output current estimate 138. As the magnitude of the scaled parallel amplifier output current estimate 138 increases, the operating frequency of the multi-level charge pump buck converter 12A will tend to also increase, which will tend to increase the power inductor current, $I_{SW\_OUT}$, delivered by the power inductor 16. The FLL circuit 54A may be further be configured to decrease the magnitude of the threshold scalar 137A to decrease the magnitude of the scaled parallel amplifier output current estimate 138. As the magnitude of the scaled parallel amplifier output current estimate 138 decreases, the magnitude of the scaled parallel amplifier output current estimate 138, will tend to decrease the operating frequency of the multi-level charge pump buck converter 12A. As the operating frequency of the multi-level charge pump buck converter 12A decreases, the power inductor current, $I_{SW\_OUT}$, delivered by the power inductor 16, tends to decrease. The threshold offset current 42, $I_{THRESHOLD\_OFFSET}$, may be used to control the offset voltage, $V_{OFFSET}$, which appears across the coupling circuit 18, depicted in FIG. 2A.

FIG. 8 depicts the $V_{OFFSET}$ loop circuit 41 that generates the threshold offset current, $I_{THRESHOLD\_OFFSET}$. Returning to FIG. 3A, as the threshold offset current, $I_{THRESHOLD\_OFFSET}$, increases above zero current, the value magnitude of the compensated parallel amplifier circuit output current estimate, $I_{PAWA\_COMP\_EST}$, is reduced, which tends to lower the output frequency of the multi-level charge pump buck converter 12A. As the output frequency of the multi-level charge pump buck converter 12A is decreased, the power inductor current, $I_{SW\_OUT}$, delivered by the power inductor 16 will also decrease. As the power inductor current, $I_{SW\_OUT}$, delivered by the power inductor 16 decreases, the offset voltage, $V_{OFFSET}$, also decreases because the parallel amplifier circuit output current, $I_{PAWA\_OUT}$, tends to become positive to compensate for the reduction of the power inductor current, $I_{SW\_OUT}$. As the threshold offset current, $I_{THRESHOLD\_OFFSET}$, decreases below zero current, the value magnitude of the compensated parallel amplifier circuit output current estimate, $I_{PAWA\_COMP}$, is increased, and as a result, the output frequency, also referred to as switching frequency, of the multi-level charge pump buck converter 12A tends to increase. As the output frequency of the multi-level charge pump buck converter 12A is increased, the power inductor current, $I_{SW\_OUT}$, delivered by the power inductor 16 increases. As the power inductor current, $I_{SW\_OUT}$, increases, the offset voltage, $V_{OFFSET}$, also tends to increase because the parallel amplifier circuit output current, $I_{PAWA\_OUT}$, tends to become negative to absorb the increase of the power inductor current, $I_{SW\_OUT}$.

Figure 4A:
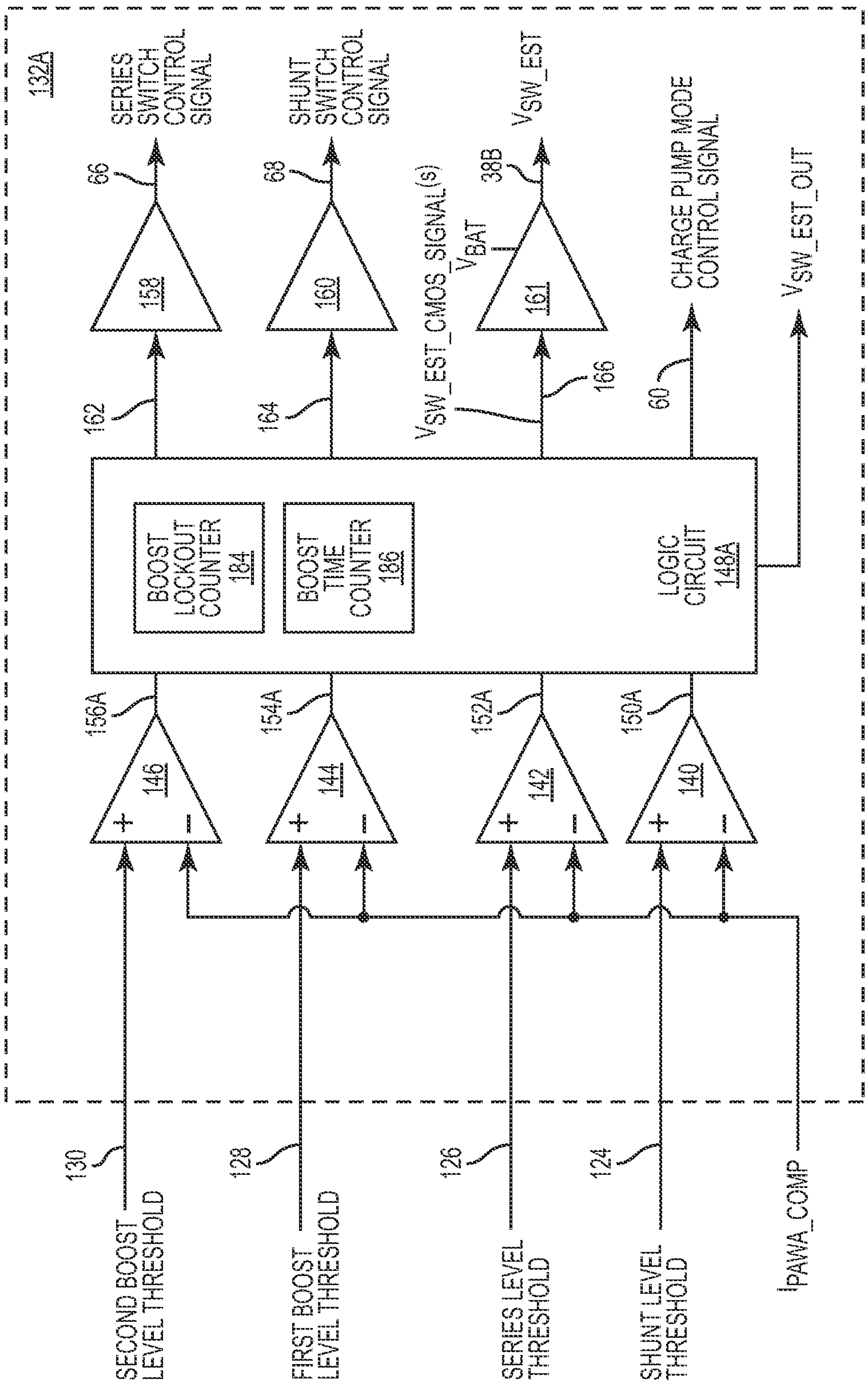
FIG. 4A depicts an embodiment of a threshold detector and control circuit of a switcher control circuit of a multi-level charge pump buck converter.

As depicted in FIG. 4A, with continuing reference to FIGS. 2A and 3A, the threshold detector and control circuit 132A of the switcher control circuit 52A includes a first comparator 140, a second comparator 142, a third comparator 144, a fourth comparator 146, and a logic circuit 148A. The example embodiment of the logic circuit 148A may include a Field Programmable Gate Array (FPGA) or other programmable logic device, discrete gates or transistor logic, discrete hardware components, or any combination thereof. Some embodiments of the logic circuit 148A may be implemented in either a digital or analog processor. As depicted in FIG. 4A, the first comparator 140, the second comparator 142, the third comparator 144, and the fourth comparator 146 may be configured as current comparators. However, in some alternative embodiments, the first comparator 140, the second comparator 142, the third comparator 144, and the fourth comparator 146 may be configured as voltage comparator circuits, where the input currents provided as inputs to the positive terminal and the negative terminal of each respective one of the first comparator 140, the second comparator 142, the third comparator 144, and the fourth comparator 146 is first converted to a voltage level.

The first comparator 140 includes a positive terminal coupled to the shunt level threshold 124, a negative terminal coupled to the compensated parallel amplifier circuit output current estimate, $I_{PAWA\_COMP}$, and a first comparator output configured to generate a shunt level indication 150A, which is provided to the logic circuit 148A. When the compensated parallel amplifier circuit output current estimate, $I_{PAWA\_COMP}$, is greater than or equal to the shunt level threshold 124, the shunt level indication 150A is asserted by setting output of the first comparator 140 to a digital logic low state. When the compensated parallel amplifier circuit output current estimate, $I_{PAWA\_COMP}$, is less than the shunt level threshold 124, the shunt level indication 150A is de-asserted by setting output of the first comparator 140 to a digital logic high state. The second comparator 142 includes a positive terminal coupled to the series level threshold 126, a negative terminal coupled to the compensated parallel amplifier circuit output current estimate, $I_{PAWA\_COMP}$, and a second comparator output configured to generate a series level indication 152A, which is provided to the logic circuit 148A. When the compensated parallel amplifier circuit output current estimate, $I_{PAWA\_COMP}$, is greater than or equal to the series level threshold 126, the series level indication 152A is asserted by setting output of the second comparator 142 to a digital logic low state. When the compensated parallel amplifier circuit output current estimate, $I_{PAWA\_COMP}$, is less than the series level threshold 126, the series level indication 152A is de-asserted by setting output of the second comparator 150 to a digital logic high state. The third comparator 144 includes a positive terminal coupled to the first boost level threshold 128, a negative terminal coupled to the compensated parallel amplifier circuit output current estimate, $I_{PAWA\_COMP}$, and a third comparator output configured to generate a first boost level indication 154A, which is provided to the logic circuit 148A. When the compensated parallel amplifier circuit output current estimate, $I_{PAWA\_COMP}$, is greater than the first boost level threshold 128, the first boost level indication 154A is asserted by setting output of the third comparator 144 to a digital logic low state. When the compensated parallel amplifier circuit output current estimate, $I_{PAWA\_COMP}$, is less than the first boost level threshold 128, the first boost level indication 154A is de-asserted by setting output of the third comparator 144 to a digital logic high state. The fourth comparator 146 includes a positive terminal coupled to the second boost level threshold 130, a negative terminal coupled to the compensated parallel amplifier circuit output current estimate, $I_{PAWA\_COMP}$, and a fourth comparator output configured to generate a second boost level indication 156A, which is provided to the logic circuit 148A. When the compensated parallel amplifier circuit output current estimate, $I_{PAWA\_COMP}$, is greater than the second boost level threshold 130, the second boost level indication 156A is asserted by setting output of the fourth comparator 146 to a digital logic low state. When the compensated parallel amplifier circuit output current estimate, $I_{PAWA\_COMP}$, is less than the second boost level threshold 130, the second boost level indication 156A is de-asserted by setting output of the first comparator 146 to a digital logic high state.

The threshold detector and control circuit 132A may further include a first output buffer 158, a second output buffer 160, and a third output buffer 161. The logic circuit 148A may provide a charge pump mode control signal 60, a series switch control output 162, a provides a shunt switch control output 164, and a one or more switching voltage output cmos signal(s) 166, $V_{SW\_EST\_CMOS\_SIGNAL}$(s). The logic circuit 148A generates the series switch control output 162 to drive the first output buffer 158, which provides the series switch control signal 66 to the series switch 70. The logic circuit 148A generates a shunt switch control output 164 to drive the second output buffer 160, which provides the shunt switch control signal 68 to the shunt switch 72. In addition, logic circuit 148A generates the one or more switching voltage output cmos signal(s) 166, $V_{SW\_EST\_CMOS\_SIGNAL}$(s), to drive the third output buffer 161, which provide the estimated switching voltage output 38B, $V_{SW\_EST}$. Each of the one or more switching voltage output cmos signal(s) 166, $V_{SW\_EST\_CMOS\_SIGNAL}$(s), indicates a future output mode of the multi-level charge pump buck converter 12A. In other words, the one or more switching voltage output cmos signal(s) 166, $V_{SW\_EST\_CMOS\_SIGNAL}$(s) are a feed forward signal that represents a state of the switcher control circuit 52A that will be used to configure the multi-level charge pump buck converter 12A to provide a future voltage level of the switching voltage, $V_{SW}$, at the switching voltage output 26. In other words, due to delays in the switcher control circuit 52A, the multi-level charge pump circuit 56, and the switching circuit 58, the one or more switching voltage output cmos signal(s) 166, $V_{SW\_EST\_CMOS\_SIGNAL}$(s), may provide an early indication of what the switching voltage, $V_{SW}$, at the switching voltage output 26 will become before the voltage level at the switching voltage output 26 transitions to reflect the switching voltage, $V_{SW}$, indicated by the one or more switching voltage output cmos signal(s) 166, $V_{SW\_EST\_CMOS\_SIGNAL}$(s). Based upon one or more switching voltage output cmos signal(s) 166, $V_{SW\_EST\_CMOS\_SIGNAL}$(s), the third output buffer 161 generates the estimated switching voltage output 38B, $V_{SW\_EST}$. The third output buffer 161 is supplied by the DC voltage, $V_{BAT}$, such that the output of the third output buffer 161 does not exceed the DC voltage, $V_{BAT}$.

Figure 11A:
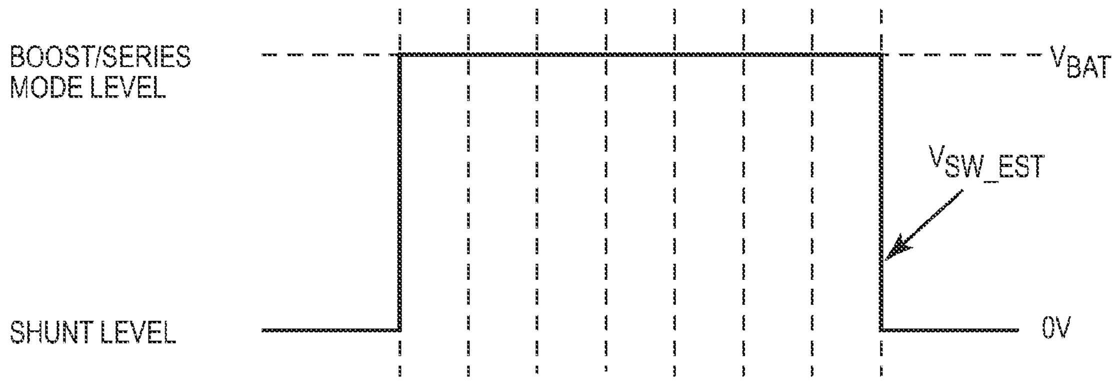
FIG. 11A depicts one embodiment of the indication of the switching voltage output generated by a multi-level charge pump buck converter in a pseudo-envelope follower power management system.

FIG. 11A through FIG. 11F depict various waveforms that may be used to represent the estimated switching voltage output 38B, $V_{SW\_EST}$. FIG. 11A depicts one embodiment of the estimated switching voltage output 38B, $V_{SW\_EST}$. When the multi-level charge pump buck converter 12A is in either the series output mode, the first boost output mode, or the second boost output mode, the third output buffer 161 outputs a boost/series mode level. Alternatively, when the multi-level charge pump buck converter 12A is in the shunt output mode, the third output buffer 161 outputs a shunt mode level.

Figure 11B:
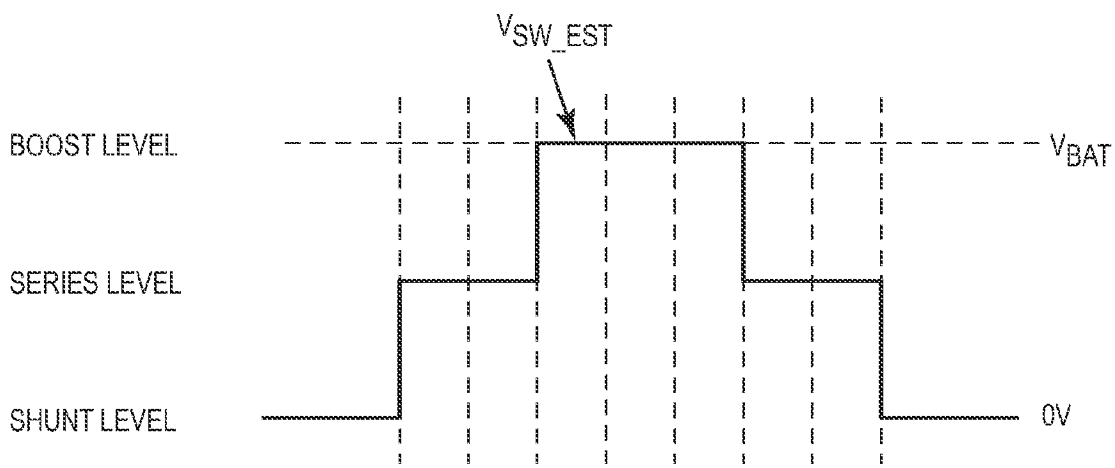
FIG. 11B depicts another embodiment of the indication of the switching voltage output generated by a multi-level charge pump buck converter in a pseudo-envelope follower power management system.

FIG. 11B depicts another embodiment of the estimated switching voltage output 38B, $V_{SW\_EST}$. When the multi-level charge pump buck converter 12A is in the series output mode, the third output buffer 161 generates a series level. When the multi-level charge pump buck converter 12A is in either the first boost output mode or the second boost output mode, the third output buffer 161 outputs a boost mode level. Alternatively, when the multi-level charge pump buck converter 12A is in the shunt output mode, the third output buffer 161 outputs a shunt mode level.

Figure 11C:
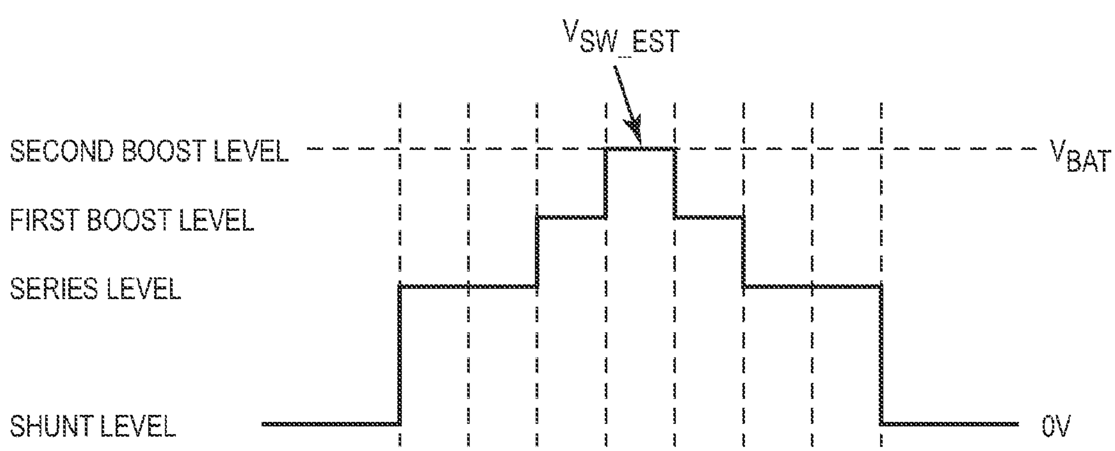
FIG. 11C depicts another embodiment of the indication of the switching voltage output generated by a multi-level charge pump buck converter in a pseudo-envelope follower power management system.

FIG. 11C depicts another embodiment of the estimated switching voltage output 38B, $V_{SW\_EST}$. When the multi-level charge pump buck converter 12A is in the series output mode, the third output buffer 161 generates a series level. When the multi-level charge pump buck converter 12A is in the first boost output mode the third output buffer 161 generates a first boost level. When the multi-level charge pump buck converter 12A is in the second boost output mode, the third output buffer 161 outputs a second boost mode level. Alternatively, when the multi-level charge pump buck converter 12A is in the shunt output mode, the third output buffer 161 outputs a shunt mode level.

Figure 11D:
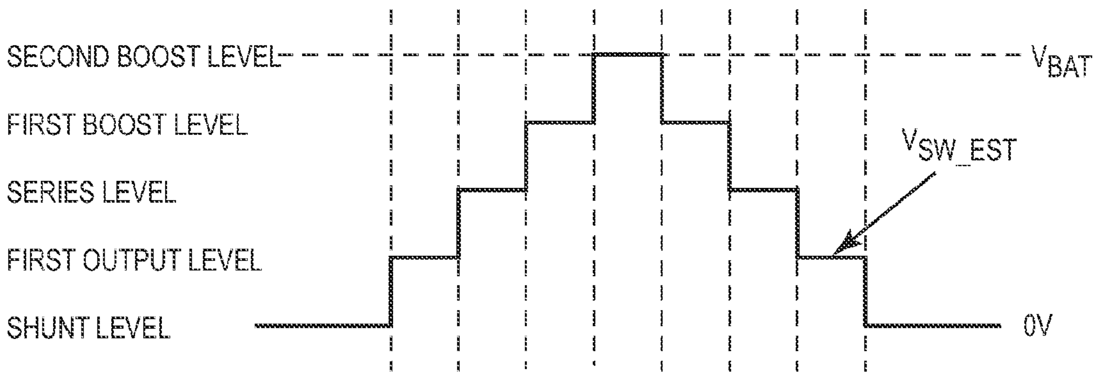
FIG. 11D depicts another embodiment of the indication of the switching voltage output generated by a multi-level charge pump buck converter in a pseudo-envelope follower power management system.

FIG. 11D depicts another embodiment of the estimated switching voltage output 38B, $V_{SW\_EST}$, for the case where the multi-level charge pump circuit 56 includes a first output mode of operation. When the multi-level charge pump buck converter 12A is in the first output mode of operation, the third output buffer 161 generates a first output level. When the multi-level charge pump buck converter 12A is in the series output mode, the third output buffer 161 generates a series level. When the multi-level charge pump buck converter 12A is in the first boost output mode, the third output buffer 161 generates a first boost level. When the multi-level charge pump buck converter 12A is in the second boost output mode, the third output buffer 161 outputs a second boost mode level. Alternatively, when the multi-level charge pump buck converter 12A is in the shunt output mode, the third output buffer 161 outputs a shunt level.

Figure 11E:
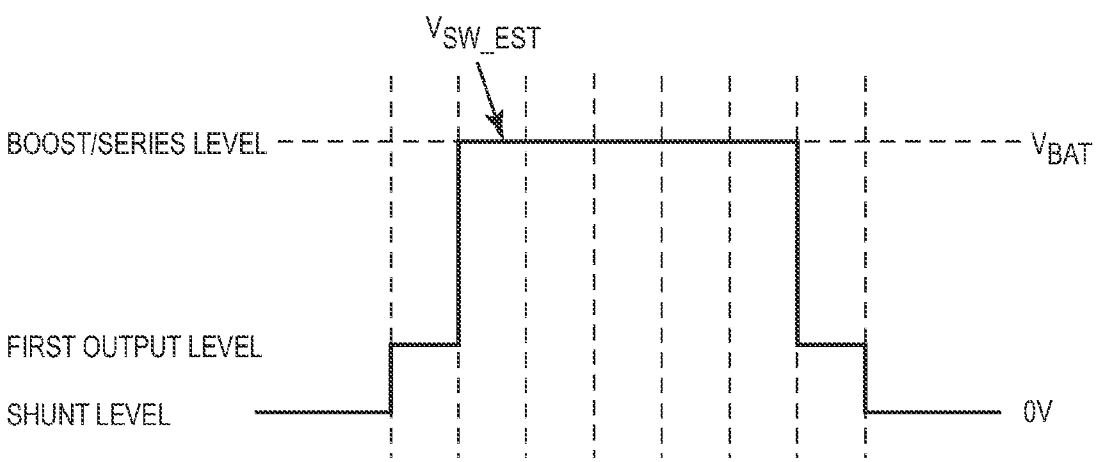
FIG. 11E depicts another embodiment of the indication of the switching voltage output generated by a multi-level charge pump buck converter in a pseudo-envelope follower power management system.

FIG. 11E depicts another embodiment of the estimated switching voltage output 38B, $V_{SW\_EST}$, for the case where the multi-level charge pump circuit 56 includes a first output mode of operation. When the multi-level charge pump buck converter 12A is in the first output mode of operation, the third output buffer 161 generates a first output level. However, when the multi-level charge pump buck converter 12A is in either the series output mode, the first boost output mode, or the second boost output mode, the third output buffer 161 generates a boost/series level. Alternatively, when the multi-level charge pump buck converter 12A is in the shunt output mode, the third output buffer 161 outputs a shunt mode level.

Figure 11F:
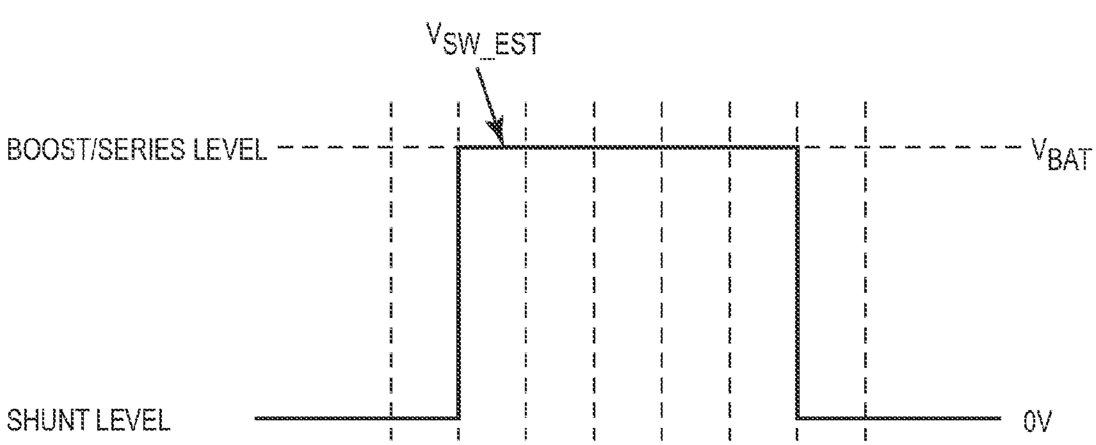
FIG. 11F depicts another embodiment of the indication of the switching voltage output generated by a multi-level charge pump buck converter in a pseudo-envelope follower power management system

FIG. 11F depicts another embodiment of the estimated switching voltage output 38B, $V_{SW\_EST}$, for the case where the multi-level charge pump circuit 56 includes a first output mode of operation. When the multi-level charge pump buck converter 12A is in either the series output mode, the first boost mode, or the second boost mode, the third output buffer 161 generates a boost/series level. Alternatively, when the multi-level charge pump buck converter 12A is in either the first output mode of operation or the shunt output mode, the third output buffer 161 outputs a shunt level.

FIG. 8 depicts an embodiment of the $V_{OFFSET}$ loop circuit 41, depicted in FIGS. 2A and 2B. The embodiment of the $V_{OFFSET}$ loop circuit 41, depicted in FIG. 8, generates the threshold offset current 42, $I_{THRESHOLD\_OFFSET}$, based upon a calculated value of the offset voltage, $V_{OFFSET}$, and a target offset voltage, $V_{OFFSET\_TARGET}$. For the sake of simplicity, and without limitation, the operation of the $V_{OFFSET}$ loop circuit 41, depicted in FIG. 8, will be done with continuing reference to FIG. 2A.

The target offset voltage, $V_{OFFSET\_TARGET}$, may be based upon a parameter provided by the controller 50 to the parallel amplifier circuit 14.

The $V_{OFFSET}$ loop circuit 41 includes a first subtractor circuit, a second subtractor circuit, and an integrator circuit. The first subtractor circuit may be configured to receive the power amplifier supply voltage, $V_{CC}$, and the parallel amplifier output voltage, $V_{PARA\_AMP}$. The first subtractor circuit subtracts the parallel amplifier output voltage, $V_{PARA\_AMP}$ from the power amplifier supply voltage, $V_{CC}$, to generate the offset voltage, $V_{OFFSET}$, which appears across the coupling circuit 18, depicted in FIG. 2A. The second subtractor circuit receives the offset voltage, $V_{OFFSET}$, and the target offset voltage, $V_{OFFSET\_TARGET}$. The second subtractor circuit subtracts the target offset voltage, $V_{OFFSET\_TARGET}$, from the offset voltage, $V_{OFFSET}$, to generate an offset error voltage, $V_{OFFSET\_ERROR}$, which is provided to the integrator circuit. The integrator circuit integrates the offset error voltage, $V_{OFFSET\_ERROR}$, to generate the threshold offset current 42, $I_{THRESHOLD\_OFFSET}$, which is provided to the multi-level charge pump buck converter 12A, depicted in FIG. 2A.

The operation of the logic circuit 148A of FIG. 4A will now be discussed with continuing reference to FIGS. 2A, 3A, 5A, 6A, and 7A. The logic circuit 148A may be digital or analog based logic configured for one or more state machines of the threshold detector and control circuit 132A. As an example embodiment, the logic circuit 148A (FIG. 4A) may have a first state machine corresponding to a first mode of operation of the multi-level charge pump buck converter 12A, depicted in FIG. 5A, and a second state machine corresponding to a second mode of operation of the multi-level charge pump buck converter 12A, depicted in FIG. 6A. Based on the mode switch control signal 131 received by the threshold detector and control circuit 132A, the threshold detector and control circuit 132A may configure the logic circuit 148A to use the first state machine to govern operation of the multi-level charge pump buck converter 12A using the first state machine of the logic circuit 148A, depicted in FIG. 5A. Alternatively, the threshold detector and control circuit 132A may configure the logic circuit 148A to use the second state machine to govern operation of the multi-level charge pump buck converter 12A using the second state machine of the logic circuit 148A, depicted in FIG. 6A.

As depicted in FIG. 4A, the logic circuit 148A may include a boost lockout counter 184 and a boost time counter 186. The boost time counter 186 may be used to keep track of the time that the multi-level charge pump buck converter 12A of FIG. 2A is in either the first boost output mode or the second output boost mode. When the multi-level charge pump buck converter 12A is in either the first boost output mode or the second boost output mode, the multi-level charge pump circuit 56 (FIG. 3A) is configured to be in either the first boost mode of operation or the second boost mode of operation, respectively. In one embodiment of the logic circuit 148A, when the logic circuit 148A determines that the multi-level charge pump buck converter 12A is in either the first boost output mode or the second output boost mode, the logic circuit 148A resets the counter output of the boost time counter 186 and enables the boost time counter 186 to begin counting up. The logic circuit 148A compares the counter output of the boost time counter 186 to a maximum boost time parameter, which may be provided by the controller 50. If the counter output of the boost time counter 186 is equal to or exceeds the maximum boost time parameter before the multi-level charge pump buck converter 12A is configured to return to either the shunt output mode of operation or the series output mode of operation, the logic circuit 148A asserts a minimum charge time indicator. However, if the multi-level charge pump buck converter 12A returns to either the series output mode of operation or the shunt output mode of operation while the counter output of the boost time counter 186 is less than the maximum boost time parameter, the logic circuit 148A de-asserts the minimum charge time indicator.

The boost lockout counter 184 may be a count-down timer that is used to ensure that the multi-level charge pump circuit 56 of FIGS. 2A and 3A remains in a charging mode of operation for a minimum charge time period after the multi-level charge pump circuit 56 has been in either the first boost mode of operation or the second boost mode of operation. This permits the first flying capacitor 100 and the second flying capacitor 102, of FIG. 7A, a sufficient amount of time to charge before the multi-level charge pump circuit 56 transitions again into either the first boost mode of operation or the second boost mode of operation. The minimum charge time period may be a parameter provided by the controller 50 via the control bus 44, as depicted in FIG. 1A. Operationally, after the multi-level charge pump buck converter 12A transitions from either the first boost output mode or the second boost output mode to either the shunt output mode of operation or the series output mode of operation, the logic circuit 148A determines whether the minimum charge time indicator is asserted. If the minimum charge time indicator is asserted, the logic circuit 148A sets the count value of the boost lockout counter 184 to an equal minimum charge time period and enables the boost lockout counter 184 to begin counting down. Once the boost lockout counter 184 counts down to zero, the logic circuit 148A is configured to de-assert the minimum charge time indicator.

Figure 5A:
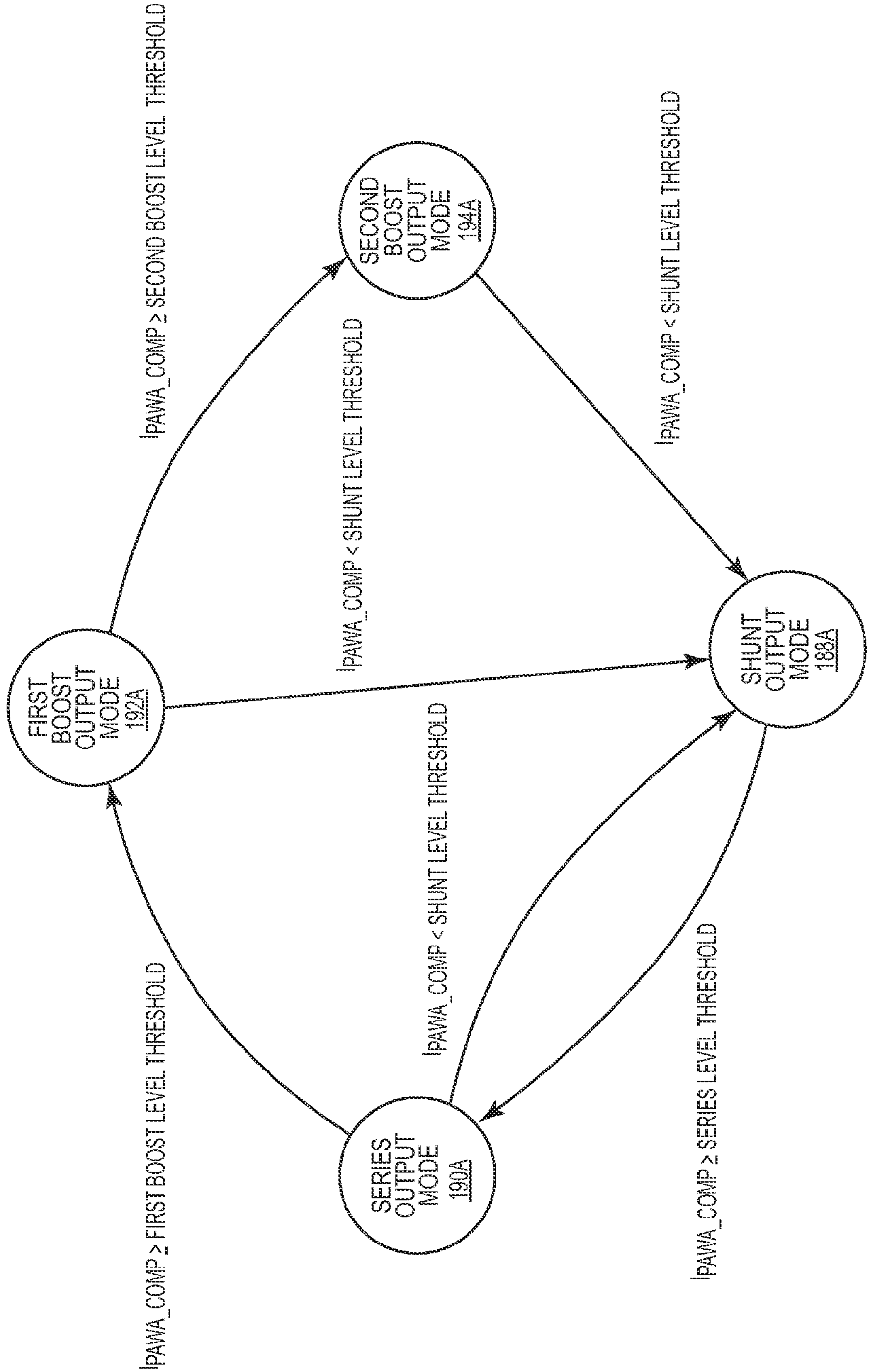
FIG. 5A depicts an embodiment of a first state machine of the threshold detector and control circuit of FIG. 4A.

Operation of the first state machine implemented in the logic circuit 148A, which is depicted in FIG. 5A, will now be described. The first state machine includes a shunt output mode 188A, a series output mode 190A, a first boost output mode 192A, and a second boost output mode 194A.

In the shunt output mode 188A, the logic circuit 148A (FIG. 4A) configures the series switch control output 162 such that the series switch 70 (FIG. 3A) is in an open state (not conducting). The logic circuit 148A also configures the shunt switch control output 164 such that the shunt switch 72 is in a closed state (conducting). In addition, the logic circuit 148A configures the charge pump mode control signal 60 to instruct the multi-level charge pump circuit 56 (FIG. 2A) to be in a charging mode of operation. As a result, the switching voltage output 26 of FIG. 3A is configured to provide a switching voltage, $V_{SW}$, substantially equal to ground. In response to assertion of the series level indication 152A, which indicates that the compensated parallel amplifier circuit output current estimate, $I_{PAWA\_COMP}$, is greater than or equal to the series level threshold 126, the logic circuit 148A configures the first state machine to transition to the series output mode 190A. Otherwise the state machine remains in the shunt output mode 188A.

In the series output mode 190A, the logic circuit 148A configures the series switch control output 162 such that the series switch 70 is in a closed state (conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a charging mode of operation. As a result, the switching voltage output 26 of FIG. 3A is configured to provide a switching voltage, $V_{SW}$, substantially equal to the direct current (DC) voltage, $V_{BAT}$.

In response to de-assertion of the shunt level indication 150A (FIG. 4A), which indicates that the compensated parallel amplifier circuit output current estimate, $I_{PAWA\_COMP}$, is less than the shunt level threshold 124, the logic circuit 148A configures the first state machine to transition to the shunt output mode 188A (FIG. 5A). However, in response to assertion of the first boost level indication 154A, which indicates that the compensated parallel amplifier circuit output current estimate, $I_{PAWA\_COMP}$, is greater than or equal to the first boost level threshold 128, the logic circuit 148A configures the first state machine to transition to the desired voltage level of the power amplifier supply voltage $V_{CC}$, that correspond to the first boost output mode 192A. Otherwise, the first state machine remains in the series output mode 190A.

In the first boost output mode 192A, the logic circuit 148A (FIG. 4A) configures the series switch control output 162 such that the series switch 70 (FIG. 3A) is in an open state (not conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a first boost mode of operation to provide 1.5×$V_{BAT}$ at the charge pump output 64. As a result, the switching voltage output 26 of FIG. 3A is configured to provide a switching voltage, $V_{SW}$, substantially equal to 1.5×$V_{BAT}$. In response to de-assertion of the shunt level indication 150A (FIG. 4A), which indicates that the compensated parallel amplifier circuit output current estimate, $I_{PAWA\_COMP}$, is less than the shunt level threshold 124, the logic circuit 148A configures the first state machine to transition to the shunt output mode 188A (FIG. 5A). However, in response to assertion of the second boost level indication 156A, which indicates that the compensated parallel amplifier circuit output current estimate, $I_{PAWA\_COMP}$, is greater than or equal to the second boost level threshold 130, the logic circuit 148A configures the first state machine to transition to the second boost output mode 194A. Otherwise, the first state machine remains in the first boost output mode 192A.

In the second boost output mode 194A, the logic circuit 148A (FIG. 4A) configures the series switch control output 162 such that the series switch 70 (FIG. 3A) is in an open state (not conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a second boost mode of operation to provide 2×$V_{BAT}$ at the charge pump output 64. As a result, the switching voltage output 26 of FIG. 3A is configured to provide a switching voltage, $V_{SW}$, substantially equal to 2×$V_{BAT}$. In response to de-assertion of the shunt level indication 150A, which indicates that the compensated parallel amplifier circuit output current estimate, $I_{PAWA\_COMP}$, is less than the shunt level threshold 124, the first state machine transitions to the shunt output mode 188A. Otherwise, the state machine remains in the second boost output mode 194A.

Figure 6A:
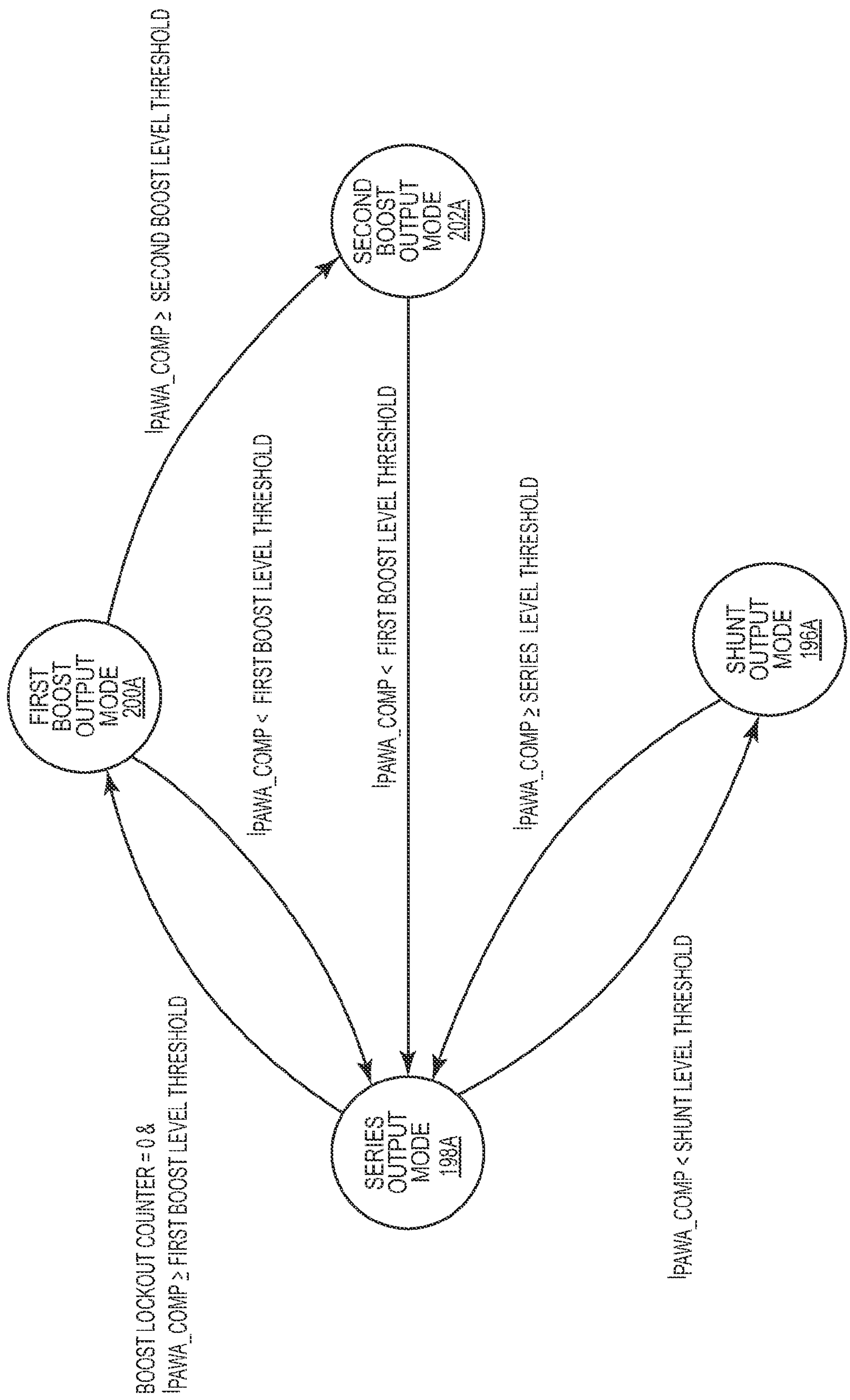
FIG. 6A depicts an embodiment of a second state machine of the threshold detector and control circuit of FIG. 4A.

Operation of the second state machine of the logic circuit 148A, which is depicted in FIG. 6A, will now be described. The second state machine includes a shunt output mode 196A, a series output mode 198A, a first boost output mode 200A, and a second boost output mode 202A. In addition, the second state machine uses the above-described boost lockout counter 184 and boost time counter 186 of the logic circuit 148A.

In the shunt output mode 196A, the logic circuit 148A (FIG. 4A) configures the series switch control output 162 such that the series switch 70 is in an open state (not conducting). The logic circuit 148A also configures the shunt switch control output 164 such that the shunt switch 72 is in a closed state (conducting). In addition, the logic circuit 148A configures the charge pump mode control signal 60 to instruct the multi-level charge pump circuit 56 (FIG. 3A) to be in a charging mode of operation. As a result, the switching voltage output 26 of FIG. 3A is configured to provide a switching voltage, $V_{SW}$, substantially equal to ground. If the boost lockout counter 184 is enabled, the boost lockout counter 184 continues to count down. In response to assertion of the series level indication 152A, which indicates that the compensated parallel amplifier circuit output current estimate, $I_{PAWA\_COMP}$, is greater than or equal to the series level threshold 126, the second state machine transitions to the series output mode 198A. Otherwise the second state machine remains in the shunt output mode 196A.

In the series output mode 198A, the logic circuit 148A (FIG. 4A) configures the series switch control output 162 such that the series switch 70 is in a closed state (conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a charging mode of operation. As a result, the switching voltage output 26 of FIG. 3A is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150A, which indicates that the compensated parallel amplifier circuit output current estimate, $I_{PAWA\_COMP}$, is less than the shunt level threshold 124, the logic circuit 148A configures the second state machine to transition to the shunt output mode 196A. However, in response to assertion of the first boost level indication 154D, which indicates that the compensated power amplifier circuit output current estimate, $I_{PAWA\_COMP}$, is greater than or equal to the first boost level threshold 128, the logic circuit 148A determines whether both the minimum charge time indicator is de-asserted and the first boost level indication 154A is asserted. If the minimum charge time indicator is de-asserted and the first boost level indication 154A is asserted, the logic circuit 148A configures the second machine to transition to the first boost output mode 200A. Otherwise, the logic circuit 148A prevents the second state machine from transitioning to the first boost output mode 200A until the minimum time indicator is de-asserted. Once both the minimum charge time indicator is de-asserted and the first boost level indication 154A is asserted, the logic circuit 148A configures the second state machine to transition to the first boost output mode 200A, resets the counter output of the boost time counter 186, and enables the boost time counter 186 to begin counting up. Otherwise, the second state machine remains in the series output mode 198A.

In the first boost output mode 200A, the logic circuit 148A configures the series switch control output 162 such that the series switch 70 is in an open state (not conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 to be in a first boost mode of operation to provide 1.5×$V_{BAT}$ at the charge pump output 64. As a result, the switching voltage output 26 of FIG. 3A is configured to provide a switching voltage, $V_{SW}$, substantially equal to 1.5×$V_{BAT}$. In response to de-assertion of the first boost level indication 154A, which indicates that the compensated parallel amplifier circuit output current estimate, $I_{PAWA\_COMP}$, is less than the first boost level threshold 128, the logic circuit 148A configures the second state machine to transition to the series output mode 198A. If the count output of the boost time counter 186 exceeds the maximum boost time parameter, the logic circuit 148A asserts a minimum charge time indicator. In response to the minimum charge time indicator being asserted, the logic circuit 148A sets the count value of the boost lockout counter 184 and enables the boost lockout counter 184 to begin counting down. However, in response to assertion of the second boost level indication 156A, which indicates that the compensated parallel amplifier circuit output current estimate, $I_{PAWA\_COMP}$, is greater than or equal to the second boost level threshold 130, the logic circuit 148A configures the second state machine to transition to the second boost output mode 202A. Otherwise, the second state machine remains in the first boost output mode 200A.

In the second boost output mode 202A, the logic circuit 148A configures the series switch control output 162 such that the series switch 70 is in an open state (not conducting). The logic circuit 148A also configures the shunt switch control output 164 such that the shunt switch 72 is in an open state (not conducting). In addition, the logic circuit 148A configures the charge pump mode control signal 60 to instruct the multi-level charge pump circuit 56 (FIG. 3A) to be in a second boost mode of operation to provide $2\times V_{BAT}$ at the charge pump output 64. As a result, the switching voltage output 26 of FIG. 3A is configured to provide a switching voltage, $V_{SW}$, substantially equal to $2\times V_{BAT}$.

In response to de-assertion of the first boost level indication 154A, which indicates that the compensated power amplifier circuit output current estimate, $I_{PAWA\_COMP}$, is less than the first boost level threshold 128, the logic circuit 148A configures the second state machine to transition to the series output mode 198A. If the count output of the boost time counter 186 exceeds the maximum boost time parameter, the logic circuit 148A asserts a minimum charge time indicator. In response to the minimum charge time indicator being asserted, the logic circuit 148A sets the count value of the boost lockout counter 184 and enables the boost lockout counter 184 to begin counting down. Otherwise, the second state machine remains in the second boost output mode 202A.

The threshold and control circuit 132A further provides a logic level indication of the switching voltage output, $V_{SW\_EST\_OUT}$, which is a logic level representation of the switching voltage output, $V_{SW}$. The switching voltage output, $V_{SW\_EST\_OUT}$, may be based upon the $V_{SW\_EST\_CMOS\_SIGNAL}$(s). In some embodiments of the threshold and control circuit 132A, the logic level indication of the switching voltage output, $V_{SW\_EST\_OUT}$, may be asserted when the multi-level charge pump buck converter 12A is in either the series output mode, the first boost output mode, or the second boost output mode. The logic level indication of the switching voltage output, $V_{SW\_EST\_OUT}$, is de-asserted when the multi-level charge pump buck converter 12A is in the shunt output mode.

Figure 3B:
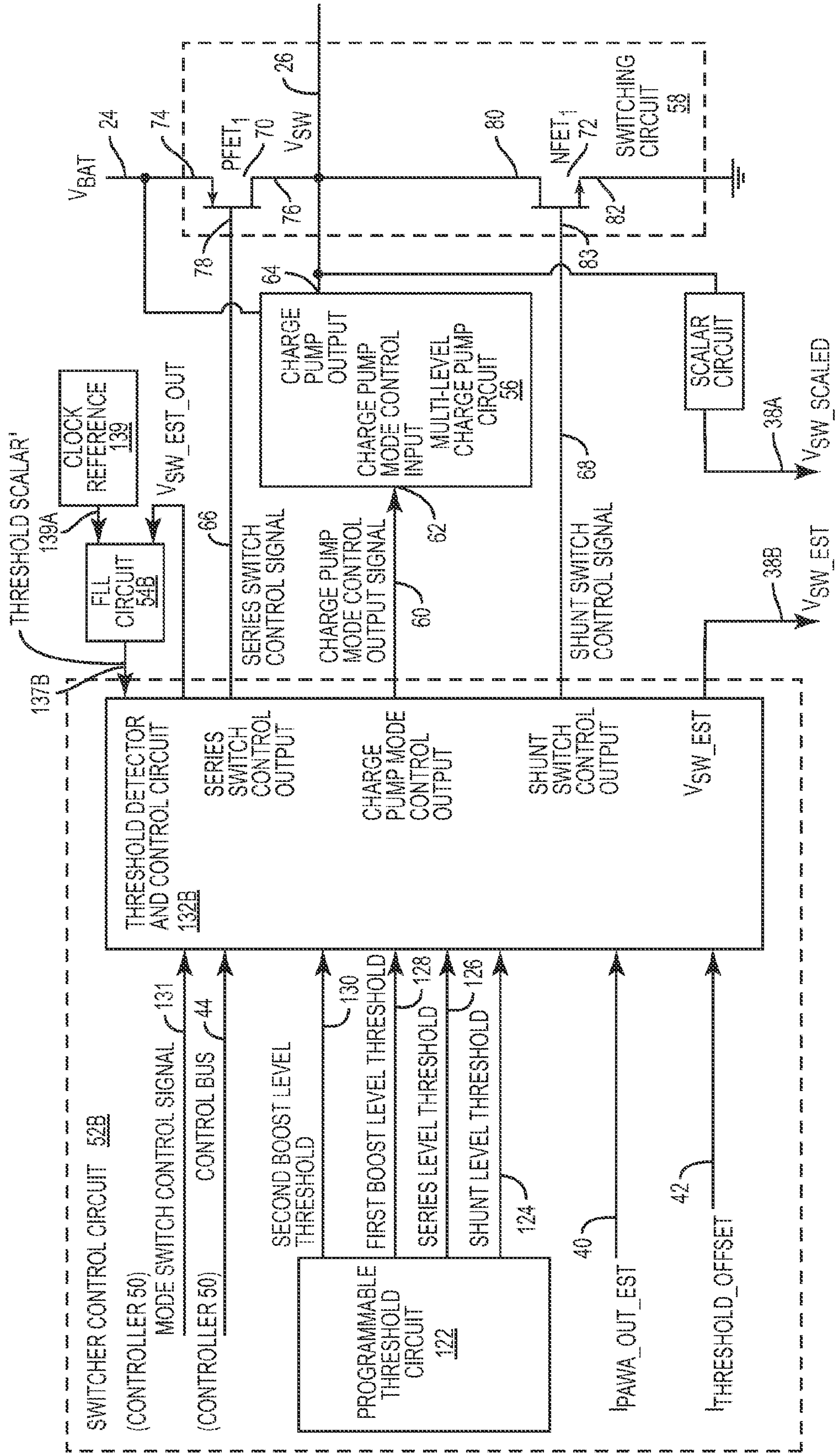
FIG. 3B depicts another embodiment of a portion of a multi-level charge pump buck converter.
Figure 3C:
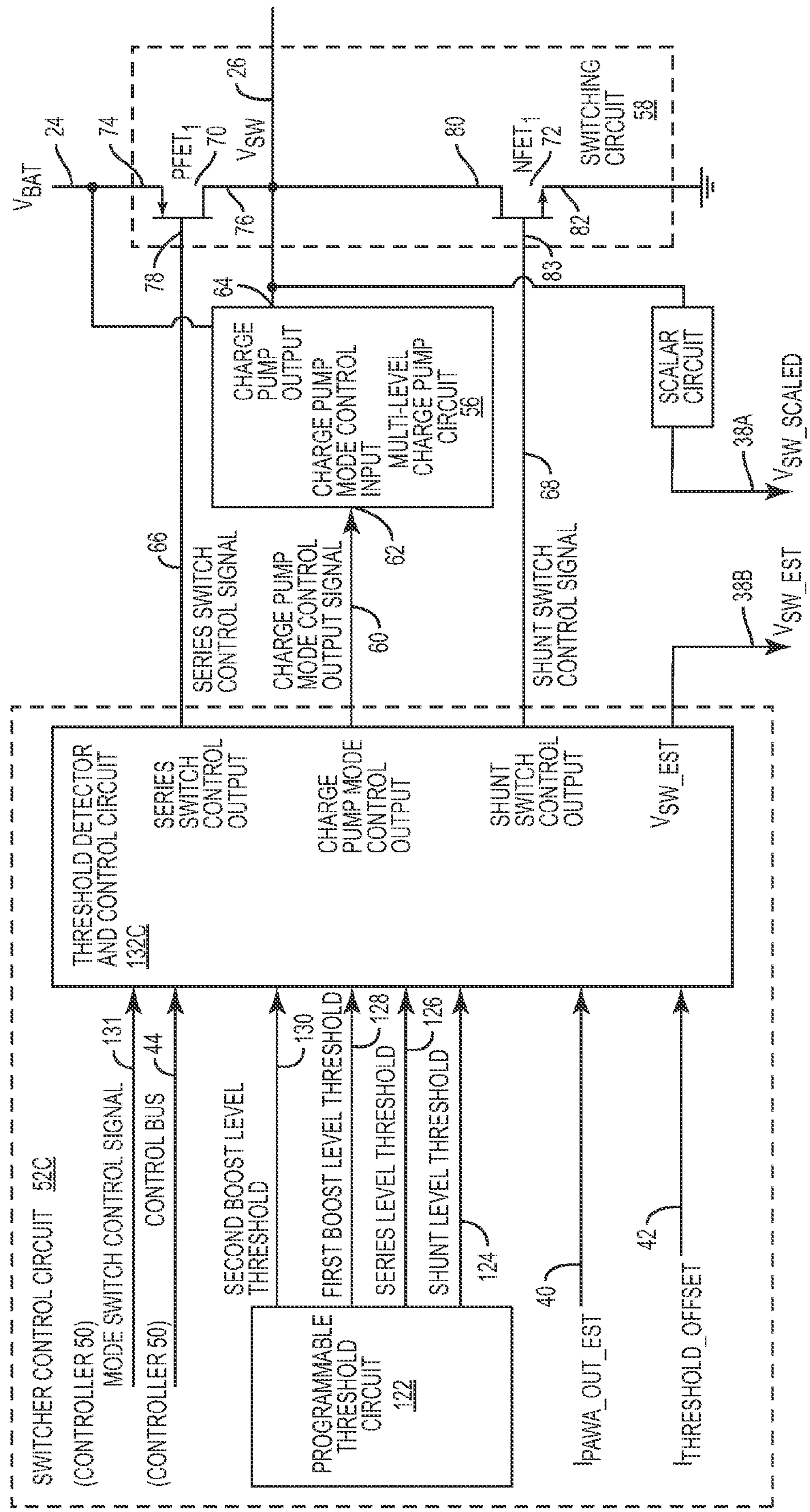
FIG. 3C depicts another embodiment of a portion of a multi-level charge pump buck converter.
Figure 3D:
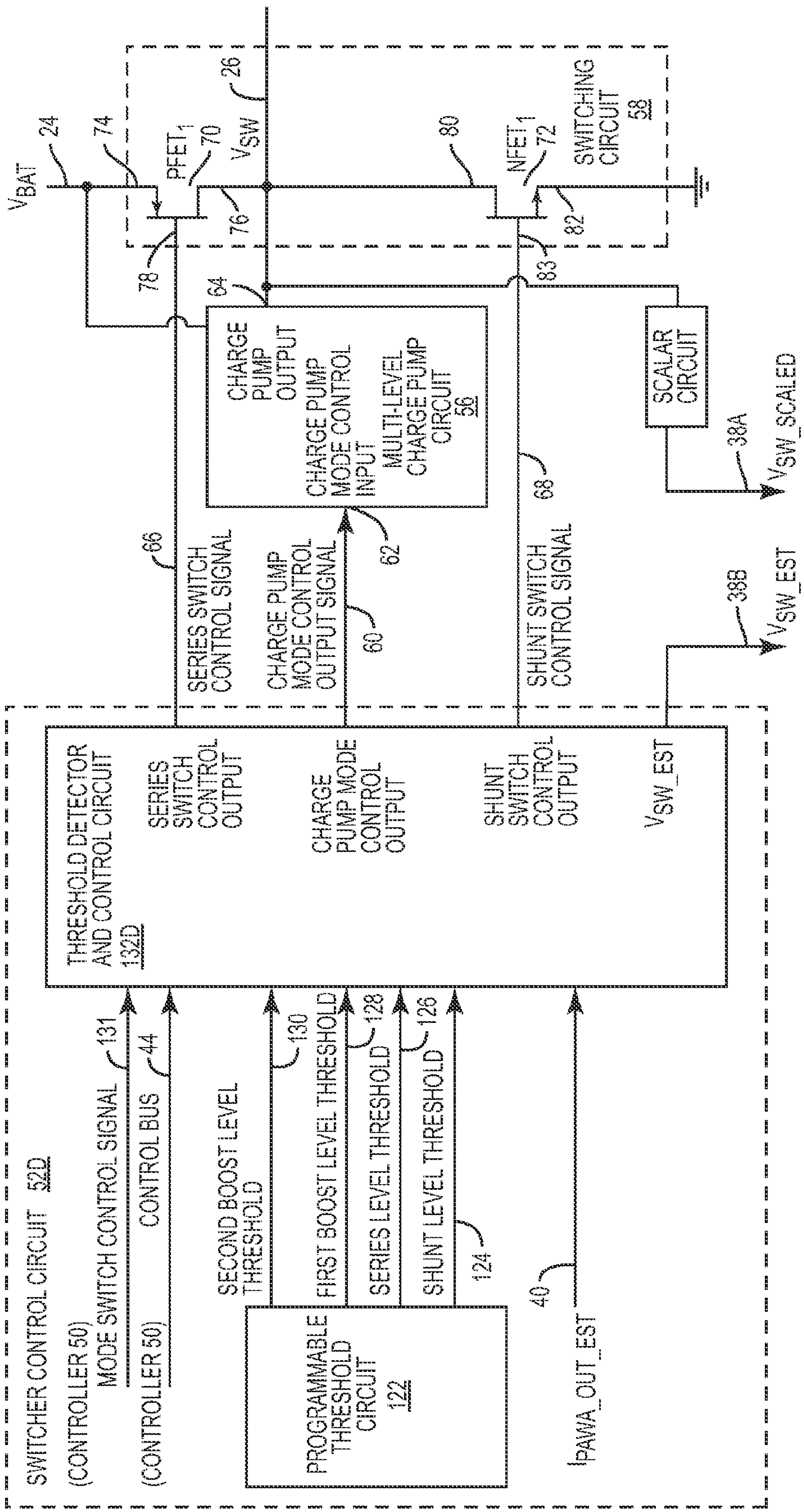
FIG. 3D depicts another embodiment of a portion of a multi-level charge pump buck converter.

FIG. 3B depicts another embodiment of switcher control circuit 52, the switcher control circuit 52B, and another embodiment of the FLL circuit 54 of the multi-level charge pump buck converter 12, FLL circuit 54B. The operation of the switcher control circuit 52B and the FLL circuit 54B will now be described.

Unlike the FLL circuit 54A depicted in FIG. 3A, the FLL circuit 54B outputs a threshold scalar' 137B. Similar to the FLL circuit 54A, the FLL circuit 54B receives a clock reference signal 139A from a clock reference 139 and a logic level indication of the switching voltage output, $V_{SW\_EST\_OUT}$. The FLL circuit 54B extracts the operating frequency of the multi-level charge pump buck converter 12 based upon the logic level indication of the switching voltage output, $V_{SW\_EST\_OUT}$. Thereafter, the FLL circuit 54B compares the extracted operating frequency of the multi-level charge pump buck converter 12 to the clock reference signal 139A to generate the threshold scalar' 137B. The magnitude of the threshold scalar' 137B may be used to adjust the operating frequency of the multi-level charge pump buck converter 12. As will be discussed relative to the threshold detector and control circuit 132B of FIG. 4B, the FLL circuit 54B provides the threshold scalar' 137B directly to a plurality of multiplier circuits, where the plurality of multiplier circuits includes a first multiplier circuit 168, a second multiplier circuit 170, a third multiplier circuit 172, and a fourth multiplier circuit 174. The first multiplier circuit 168, the second multiplier circuit 170, the third multiplier circuit 172, and the fourth multiplier circuit 174 may be used to scale the shunt level threshold 124, the series level threshold 126, the first boost level threshold 128, and the second boost level threshold 130, respectively to generate a scaled shunt level threshold 176, a scaled series level threshold 178, a scaled first boost level threshold 180, and a scaled second boost level threshold 182, of FIG. 4B. The scaled shunt level threshold 176, the scaled series level threshold 178, the scaled first boost level threshold 180, and the scaled second boost level threshold 182 may be used to control the operating frequency of the multi-level charge pump buck converter 12.

As an example, the FLL circuit 54B may be configured to decrease the magnitude of the threshold scalar' 137B to decrease the magnitude of the scaled shunt level threshold 176, the scaled series level threshold 178, the scaled first boost level threshold 180, and the scaled second boost level threshold 182. As the magnitudes of the scaled shunt level threshold 176, the scaled series level threshold 178, the scaled first boost level threshold 180, and the scaled second boost level threshold 182 decrease, the operating frequency of the multi-level charge pump buck converter 12 will tend to increase, which will tend to increase the power inductor current, $I_{SW\_OUT}$, delivered by the power inductor 16.

The FLL circuit 54B may be configured to increase the magnitude of the threshold scalar' 137B to increase the magnitude of the scaled shunt level threshold 176, the scaled series level threshold 178, the scaled first boost level threshold 180, and the scaled second boost level threshold 182. As the scaled shunt level threshold 176, the scaled series level threshold 178, the scaled first boost level threshold 180, and the scaled second boost level threshold 182 are increased, the operating frequency of the multi-level charge pump buck converter 12 will tend to decrease, which will tend to decrease the power inductor current, $I_{SW\_OUT}$, delivered by the power inductor 16.

Returning to FIG. 3B, unlike the switcher control circuit 52A of FIG. 3A, the switcher control circuit 52B includes a threshold detector and control circuit 132B. The switcher control circuit 52B omits the multiplier circuit 134. As will be discussed below relative to the threshold detector and control circuit 132B of FIG. 4B, the summing circuit 136, is placed in the threshold detector and control circuit 132B.

Also, similar to the switcher control circuit 52A, the switcher control circuit 52B may also receive a mode switch control signal 131 from the controller 50. The mode switch control signal 131 may configure the threshold detector and control circuit 132B to operate the multi-level charge pump buck converter in different modes of operation. As an example, the mode switch control signal 131 may configure operation of a state machine within the threshold detector and control circuit 132B that governs how the switching voltage output 26 transitions the switching voltage output 26 to provide different output levels. As a first example embodiment of a state machine within the threshold detector and control circuit 132B, the mode switch control signal 131 may configure the multi-level charge pump buck converter 12 to operate in a first mode of operation, depicted in FIG. 5B. As another example embodiment of a state machine within the threshold detector and control circuit 132A, the mode switch control signal 131 may configure the multi-level charge pump buck converter 12 to operate in a second mode of operation, depicted in FIG. 6B.

Figure 4B:
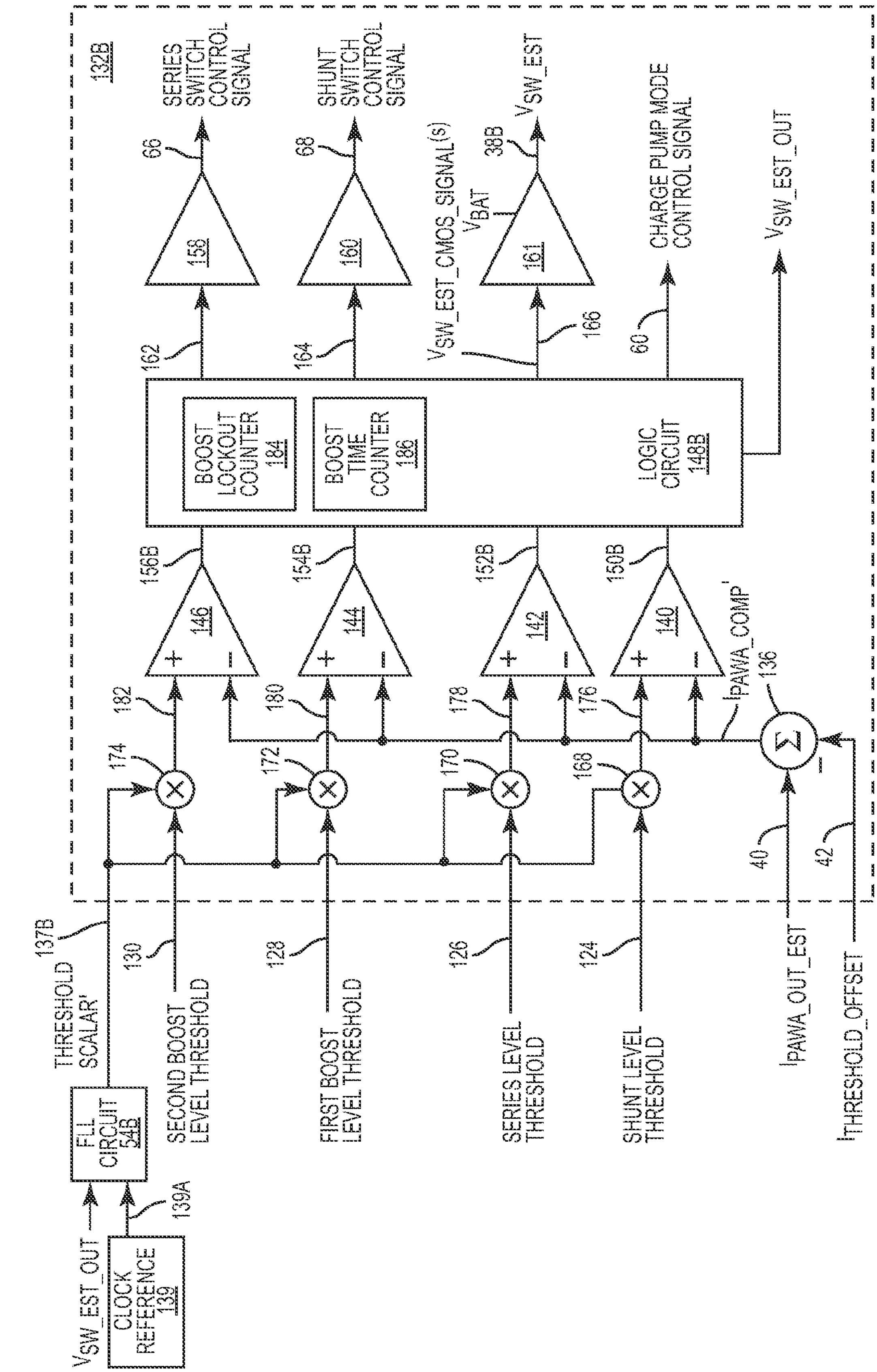
FIG. 4B depicts another embodiment of a threshold detector and control circuit of a switcher control circuit of a multi-level charge pump buck converter.

Referring to FIG. 4B, the FLL circuit 54B will now be discussed. Similar to FLL Circuit 54A of FIG. 3A, the FLL circuit 54B may be configured to receive a clock reference signal 139A from the clock reference 139 and a logic level indication of the switching voltage output, $V_{SW\_EST\_OUT}$, from the switcher control circuit 52B. The logic level indication of the switching voltage output, $V_{SW\_EST\_OUT}$, may be provided by the logic circuit 148B of the threshold detector and control circuit 132B. As discussed above, the logic level indication of the switching voltage output, $V_{SW\_EST\_OUT}$, is a logic level representation of the switching voltage output, $V_{SW}$.

The one embodiment of the threshold detector and control circuit 132B includes a first multiplier circuit 168, a second multiplier circuit 170, a third multiplier circuit 172, and a fourth multiplier circuit 174. The first multiplier circuit 168 may be configured to receive the shunt level threshold 124 and the receive threshold scalar' 137B. The first multiplier circuit 168 multiplies the shunt level threshold 124 by the received threshold scalar' 137B to generate a scaled shunt level threshold 176. The second multiplier circuit 170 may be configured to receive the series level threshold 126 and the threshold scalar' 137B. The second multiplier circuit 170 multiplies the series level threshold 126 by the threshold scalar' 137B to generate a scaled series level threshold 178. The third multiplier circuit 172 may be configured to receive the first boost level threshold 128 and the threshold scalar' 137B. The third multiplier circuit 172 may multiplies the first boost level threshold 128 by the threshold scalar' 137B to generate a scaled first boost level threshold 180. The fourth multiplier circuit 174 may be configured to receive the second boost level threshold 130 and the threshold scalar' 137B. The fourth multiplier circuit 174 multiplies the second boost level threshold 130 by the threshold scalar' 137B to generate the scaled second boost level threshold 182. The summing circuit 136 subtracts the threshold offset current 42, $I_{THRESHOLD\_OFFSET}$, from the parallel amplifier circuit output current estimate 40, $I_{PAWA\_OUT\_EST}$, to generate a compensated parallel amplifier circuit output current estimate, $I_{PAWA\_COMP}'$, which may be used as a composite feedback signal for the first comparator 140, the second comparator 142, the third comparator 144, and the fourth comparator 146. As discussed before, the threshold offset current 42, $I_{THRESHOLD\_OFFSET}$, may be used to control the offset voltage, $V_{OFFSET}$, that is generated across the coupling circuit 18, as depicted in FIG. 2A. In the case where the coupling circuit 18 is a wire, such that the parallel amplifier output 32A is directly coupled to the power amplifier supply output 28, the $V_{OFFSET}$ loop circuit 41 and the threshold offset current, $I_{THRESHOLD\_OFFSET}$, are omitted such that $I_{PAWA\_COMP}'$ is the same as parallel amplifier circuit output current estimate 40, $I_{PAWA\_OUT\_EST}$.

The first comparator 140 includes a positive terminal coupled to the scaled shunt level threshold 176, a negative terminal coupled to the compensated parallel amplifier circuit output current estimate, $I_{PAWA\_COMP}'$, and a first comparator output configured to generate a shunt level indication 150B, which is provided to the logic circuit 148B. When the compensated parallel amplifier circuit output current estimate, $I_{PAWA\_COMP}'$, is greater than or equal to the scaled shunt level threshold 176, the shunt level indication 150B is asserted by setting output of the first comparator 140 to a digital logic low state. When the compensated parallel amplifier circuit output current estimate, $I_{PAWA\_COMP}'$, is less than the scaled shunt level threshold 176, the shunt level indication 150B is de-asserted by setting output of the first comparator 140 to a digital logic high state. The second comparator 142 includes a positive terminal coupled to the scaled series level threshold 178, a negative terminal coupled to the compensated parallel amplifier circuit output current estimate, $I_{PAWA\_COMP}'$, and a second comparator output configured to generate a series level indication 152B, which is provided to the logic circuit 148B. When the compensated parallel amplifier circuit output current estimate, $I_{PAWA\_COMP}'$, is greater than or equal to the scaled series level threshold 178, the series level indication 152B is asserted by setting output of the second comparator 142 to a digital logic low state. When the compensated parallel amplifier circuit output current estimate, $I_{PAWA\_COMP}'$, is less than the scaled series level threshold 178, the series level indication 152B is de-asserted by setting output of the second comparator 142 to a digital logic high state. The third comparator 144 includes a positive terminal coupled to the scaled first boost level threshold 180, a negative terminal coupled to the compensated parallel amplifier circuit output current estimate, $I_{PAWA\_COMP}'$, and a third comparator output configured to generate a first boost level indication 154B, which is provided to the logic circuit 148B. When the compensated parallel amplifier circuit output current estimate, $I_{PAWA\_COMP}'$, is greater than the scaled first boost level threshold 180, the first boost level indication 154B is asserted by setting output of the third comparator 144 to a digital logic low state. When the compensated parallel amplifier circuit output current estimate, $I_{PAWA\_COMP}'$, is less than the scaled first boost level threshold 180, the first boost level indication 154B is de-asserted by setting output of the third comparator 144 to a digital logic high state. The fourth comparator 146 includes a positive terminal coupled to the scaled second boost level threshold 182, a negative terminal coupled to the compensated parallel amplifier circuit output current estimate, $I_{PAWA\_COMP}'$, and a fourth comparator output configured to generate a second boost level indication 156B, which is provided to the logic circuit 148B. When the compensated parallel amplifier circuit output current estimate, $I_{PAWA\_COMP}'$, is greater than the scaled second boost level threshold 182, the second boost level indication 156B is asserted by setting output of the fourth comparator 146 to a digital logic low state. When the compensated parallel amplifier circuit output current estimate, $I_{PAWA\_COMP}'$, is less than the scaled second boost level threshold 182, the second boost level indication 156B is de-asserted by setting output of the fourth comparator 146 to a digital logic high state.

The logic circuit 148B will now be discussed. The logic circuit 148B is similar to the logic circuit 148A of FIG. 4A. The example embodiment of the logic circuit 148B may include a Field Programmable Gate Array (FPGA) or other programmable logic device, discrete gates or transistor logic, discrete hardware components, or any combination thereof designed to perform. Some embodiments of the logic circuit 148B may be implemented in either a digital or analog processor. The logic circuit 148B generates the series switch control output 162, the shunt switch control output 164, the one or more switching voltage output cmos signal(s) 166, $V_{SW\_EST\_CMOS\_SIGNAL}$(s), the charge pump mode control signal 60, and the logic level indication of the switching voltage output, $V_{SW\_EST\_OUT}$ in a similar fashion as the logic circuit 148A, which has been previously discussed.

The operation of the logic circuit 148B will now be discussed with continuing reference to FIGS. 2A, 3B, 4B, 5B, 6B, and 7A. Similar to the logic circuit 148A of FIG. 4A, the logic circuit 148B may be digital or analog based logic configured for one or more state machines of the threshold detector and control circuit 132B. As an example embodiment, the logic circuit 148B (FIG. 4B) may have a first state machine corresponding to a first mode of operation, depicted in FIG. 5B and a second state machine corresponding to a second mode of operation, depicted in FIG. 6B. Based on the mode switch control signal 131, depicted in FIG. 3B, received by the threshold detector and control circuit 132B, the threshold detector and control circuit 132B may configure the logic circuit 148B to use the first state machine to govern operation of the multi-level charge pump buck converter using the first state machine of the logic circuit 148B, depicted in FIG. 5B. Alternatively, the threshold detector and control circuit 132B may configure the logic circuit 148B to use the second state machine to govern operation of the multi-level charge pump buck converter using the second state machine of the logic circuit 148B, depicted in FIG. 6B Also similar to the logic circuit 148A, the logic circuit 148B may include a boost lockout counter 184 and a boost time counter 186. The boost time counter 186 may be used to keep track of the time that the multi-level charge pump buck converter 12A is in either the first boost output mode or the second boost output mode. When the multi-level charge pump buck converter 12A is in either the first boost output mode or the second boost output mode, the multi-level charge pump circuit 56 (FIG. 3B) is configured to be in either the first boost mode of operation or the second boost mode of operation, respectively. In one embodiment of the logic circuit 148B, when the logic circuit 148B determines that the multi-level charge pump buck converter 12A is in either the first boost output mode or the second boost output mode, the logic circuit 148B resets the counter output of the boost time counter 186 and enables the boost time counter 186 to begin counting up. The logic circuit 148B compares the counter output of the boost timer counter 186 to a maximum boost time parameter, which may be provided by the controller 50. If the counter output of the boost time counter 186 is equal to or exceeds the maximum boost time parameter before the multi-level charge pump buck converter 12A is configured to return to either the shunt output mode of operation or the series output mode of operation, the logic circuit 148B asserts a minimum charge time indicator. However, if the multi-level charge pump buck converter 12A returns to either the series output mode of operation or the shunt output mode of operation while the counter output of the boost time counter 186 is less than the maximum boost time parameter, the logic circuit 148B de-asserts the minimum charge time indicator.

Similar to the boost lockout counter 184 of the logic circuit 148A, the boost lockout counter 184 of the logic circuit 148B may be a count-down timer that is used to ensure that the multi-level charge pump circuit 56, depicted in FIG. 3B, remains in a charging mode of operation for a minimum charge time period after the multi-level charge pump circuit 56 has been in either the first boost mode of operation or the second boost mode of operation. This permits the first flying capacitor 100 and the second flying capacitor 102 of FIG. 7A a sufficient amount of time to charge before the multi-level charge pump circuit 56 transitions again into either the first boost mode of operation or the second boost mode of operation. Similar to the logic circuit 148A, the minimum charge time period may be a parameter provided by the controller 50 via the control bus 44 to the logic circuit 148B. Operationally, after the multi-level charge pump buck converter 12A transitions from either the first boost output mode or the second boost output mode to either the shunt output mode of operation or the series output mode of operation, the logic circuit 148B determines whether the minimum charge time indicator is asserted. If the minimum charge time indicator is asserted, the logic circuit 148B sets the count value of the boost lockout counter 184 to equal the minimum charge time period and enables the boost lockout counter 184 to begin counting down. Once the boost lockout counter 184 counts down to zero, the logic circuit 148B is configured to de-assert the minimum charge time indicator.

Operation of the first state machine implemented in the logic circuit 148B, depicted in FIG. 5B, will now be described. The first state machine includes a shunt output mode 188B, a series output mode 190B, a first boost output mode 192B, and a second boost output mode 194B.

In the shunt output mode 188B, the logic circuit 148B (FIG. 4B) configures the series switch control output 162 such that the series switch 70 (FIG. 3B) is in an open state (not conducting). The logic circuit 148B also configures the shunt switch control output 164 such that the shunt switch 72 is in a closed state (conducting). In addition, the logic circuit 148B configures the charge pump mode control signal 60 to instruct the multi-level charge pump circuit 56 (FIG. 3B) to be in a charging mode of operation. As a result, the switching voltage output 26 of FIG. 3B is configured to provide a switching voltage, $V_{SW}$, substantially equal to ground. In response to assertion of the series level indication 152B, which indicates that the compensated parallel amplifier circuit output current estimate, $I_{PAWA\_COMP}'$, is greater than or equal to the scaled series level threshold 178, the logic circuit 148B configures the first state machine to transition to the series output mode 190B. Otherwise the first state machine remains in the shunt output mode 188B.

In the series output mode 190B, the logic circuit 148B configures the series switch control output 162 such that the series switch 70 is in a closed state (conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a charging mode of operation. As a result, the switching voltage output 26 of FIG. 3B is configured to provide a switching voltage, $V_{SW}$, substantially equal to the direct current (DC) voltage, $V_{BAT}$.

Figure 5B:
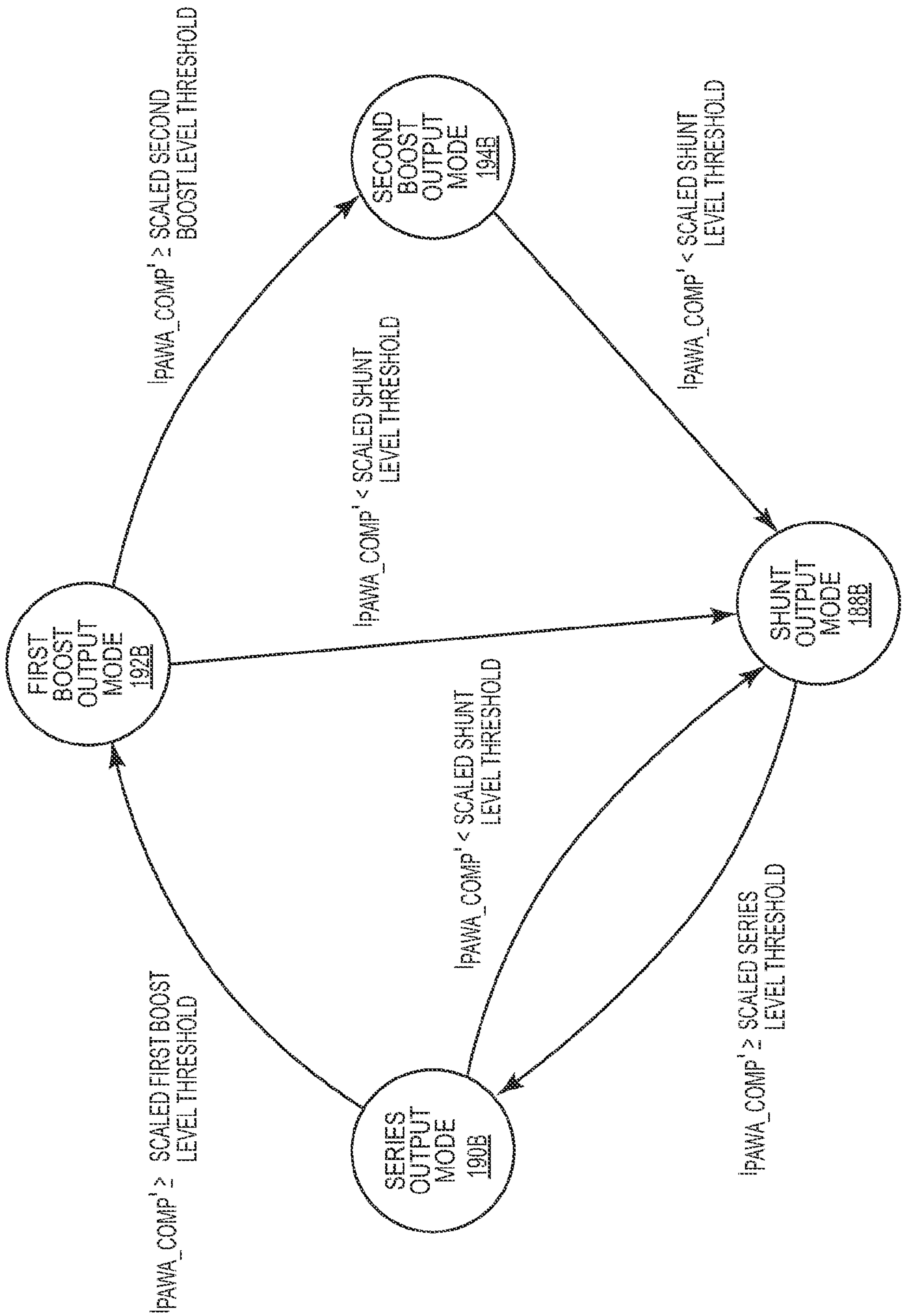
FIG. 5B depicts an embodiment of a first state machine of the threshold detector and control circuit of FIG. 4B.

In response to de-assertion of the shunt level indication 150B (FIG. 4B), which indicates that the compensated parallel amplifier circuit output current estimate, $I_{PAWA\_COMP}'$, is less than the scaled shunt level threshold 176, the logic circuit 148B configures the first state machine to transition to the shunt output mode 188B (FIG. 5B). However, in response to assertion of the first boost level indication 154B which indicates that the compensated parallel amplifier circuit output current estimate, $I_{PAWA\_COMP}'$, is greater than or equal to the scaled first boost level threshold 180, the logic circuit 148B configures the first state machine to transition to the first boost output mode 192B. Otherwise, the first state machine remains in the series output mode 190B.

In the first boost output mode 192B, the logic circuit 148B (FIG. 4B) configures the series switch control output 162 such that the series switch 70 (FIG. 3B) is in an open state (not conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a first boost mode of operation to provide $1.5\times V_{BAT}$ at the charge pump output 64. As a result, the switching voltage output 26 of FIG. 3B is configured to provide a switching voltage, $V_{SW}$, substantially equal to $1.5\times V_{BAT}$. In response to de-assertion of the shunt level indication 150B (FIG. 4B), which indicates that the compensated parallel amplifier circuit output current estimate, $I_{PAWA\_COMP}'$, is less than the scaled shunt level threshold 176, the logic circuit 148B configures the first state machine to transition to the shunt output mode 188B (FIG. 5B). However, in response to assertion of the second boost level indication 156B, which indicates that the compensated parallel amplifier circuit output current estimate, $I_{PAWA\_COMP}'$, is greater than or equal to the scaled second boost level threshold 182, the logic circuit 148B configures the first state machine to transition to the second boost output mode 194B. Otherwise, the first state machine remains in the first boost output mode 192B.

In the second boost output mode 194B, the logic circuit 148B (FIG. 4B) configures the series switch control output 162 such that the series switch 70 (FIG. 3B) is in an open state (not conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a second boost mode of operation to provide $2\times V_{BAT}$ at the charge pump output 64. As a result, the switching voltage output 26 of FIG. 3B is configured to provide a switching voltage, $V_{SW}$, substantially equal to $2\times V_{BAT}$. In response to de-assertion of the shunt level indication 150B, which indicates that the compensated parallel amplifier circuit output current estimate, $I_{PAWA\_COMP}'$, is less than the scaled shunt level threshold 176, the first state machine transitions to the shunt output mode 188B. Otherwise, the first state machine remains in the second boost output mode 194B.

Figure 6B:
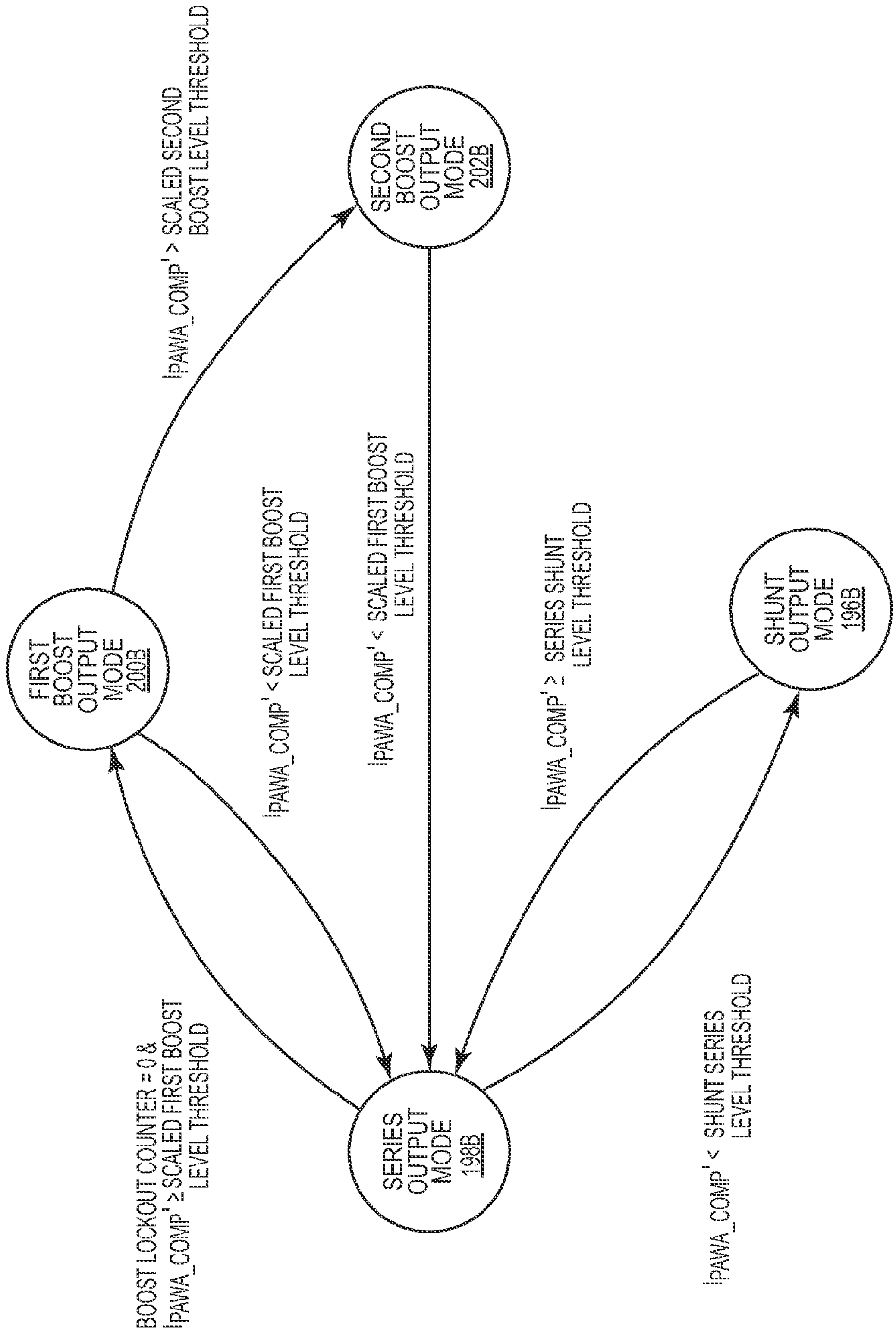
FIG. 6B depicts an embodiment of a second state machine of the threshold detector and control circuit of FIG. 4B.

Operation of the second state machine of the logic circuit 148B (FIG. 3B), which is depicted in FIG. 6B, will now be described. The second state machine includes a shunt output mode 196B, a series output mode 198B, a first boost output mode 200B, and a second boost output mode 202B. In addition, the second state machine uses the above-described boost lockout counter 184 and boost time counter 186 of the logic circuit 148B.

In the shunt output mode 196B, the logic circuit 148B, depicted in FIG. 4B, configures the series switch control output 162 such that the series switch 70 is in an open state (not conducting). The logic circuit 148B also configures the shunt switch control output 164 such that the shunt switch 72 is in a closed state (conducting). In addition, the logic circuit 148B configures the charge pump mode control signal 60 to instruct the multi-level charge pump circuit 56, depicted in FIG. 2A, to be in a charging mode of operation. As a result, the switching voltage output 26 of FIG. 3B is configured to provide a switching voltage, $V_{SW}$, substantially equal to ground. If the boost lockout counter 184 is enabled, the boost lockout counter 184 continues to count down. In response to assertion of the series level indication 152B, which indicates that the compensated parallel amplifier circuit output current estimate, $I_{PAWA\_COMP}'$, is greater than or equal to the scaled series level threshold 178, the second state machine transitions to the series output mode 198B. Otherwise the second state machine remains in the shunt output mode 196B.

In the series output mode 198B, the logic circuit 148B (FIG. 4B) configures the series switch control output 162 such that the series switch 70 is in a closed state (conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a charging mode of operation. As a result, the switching voltage output 26 of FIG. 3B is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150B, which indicates that the compensated parallel amplifier circuit output current estimate, $I_{PAWA\_COMP}'$, is less than the scaled shunt level threshold 176, the logic circuit 148B configures the second state machine to transition to the shunt output mode 196B. However, in response to assertion of the first boost level indication 154B which indicates that the compensated parallel amplifier circuit output current estimate, $I_{PAWA\_COMP}'$, is greater than or equal to the scaled first boost level threshold 180, the logic circuit 148B determines whether both the minimum charge time indicator is de-asserted and the first boost level indication 154B is asserted. If the minimum charge time indicator is de-asserted and the first boost level indication 154B is asserted, the logic circuit 148B configures the second machine to transition to the first boost output mode 200B. Otherwise, the logic circuit 148B prevents the second state machine from transitioning to the first boost output mode 200B until the minimum time indicator is de-asserted. Once both the minimum charge time indicator is de-asserted and the first boost level indication 154B is asserted, the logic circuit 148B configures the second state machine to transition to the first boost output mode 200B, resets the counter output of the boost time counter 186, and enables the boost time counter 186 to begin counting up. Otherwise, the second state machine remains in the series output mode 198B.

In the first boost output mode 200B, the logic circuit 148B configures the series switch control output 162 such that the series switch 70 is in an open state (not conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a first boost mode of operation to provide $1.5\times V_{BAT}$ at the charge pump output 64. As a result, the switching voltage output 26 of FIG. 3B is configured to provide a switching voltage, $V_{SW}$, substantially equal to $1.5\times V_{BAT}$. In response to de-assertion of the first boost level indication 154B, which indicates that the compensated parallel amplifier circuit output current estimate, $I_{PAWA\_COMP}'$, is less than the scaled first boost level threshold 180, the logic circuit 148B configures the second state machine to transition to the series output mode 198B. If the count output of the boost time counter 186 exceeds the maximum boost time parameter, the logic circuit 148B asserts a minimum charge time indicator. In response to the minimum charge time indicator being asserted, the logic circuit 148B sets the count value of the boost lockout counter 184 and enables the boost lockout counter 184 to begin counting down. However, in response to assertion of the second boost level indication 156B which indicates that the compensated parallel amplifier circuit output current estimate, $I_{PAWA\_COMP}'$, is greater than or equal to the scaled second boost level threshold 182, the logic circuit 148B configures the second state machine to transition to the second boost output mode 202B. Otherwise, the second state machine remains in the first boost output mode 200B.

In the second boost output mode 202B, the logic circuit 148B configures the series switch control output 162 such that the series switch 70 is in an open state (not conducting). The logic circuit 148B also configures the shunt switch control output 164 such that the shunt switch 72 is in an open state (not conducting). In addition, the logic circuit 148B configures the charge pump mode control signal 60 to instruct the multi-level charge pump circuit 56 to be in a second boost mode of operation to provide $2\times V_{BAT}$ at the charge pump output 64. As a result, the switching voltage output 26 of FIG. 3B is configured to provide a switching voltage, $V_{SW}$, substantially equal to $2\times V_{BAT}$.

In response to de-assertion of the first boost level indication 154B which indicates that the compensated parallel amplifier circuit output current estimate, $I_{PAWA\_COMP}'$, is less than the scaled first boost level threshold 180, the logic circuit 148B configures the second state machine to transition to the series output mode 198B. If the count output of the boost time counter 186 exceeds the maximum boost time parameter, the logic circuit 148B asserts a minimum charge time indicator. In response to the minimum charge time indicator being asserted, the logic circuit 148B sets the count value of the boost lockout counter 184 and enables the boost lockout counter 184 to begin counting down. Otherwise, the second state machine remains in the second boost output mode 202B.

FIG. 3C depicts an embodiment of the pseudo-envelope follower power management system 10B of FIG. 1B that does not include a frequency lock loop (FLL) circuit. The embodiment of the pseudo-envelope follower power management system 10B that does not include a frequency lock loop (FLL) circuit may include a switcher control circuit 52C. The switcher controller circuit 52C may include a threshold detector and control circuit 132C, which is similar to the threshold detector and control circuit 132B of FIG. 3B. However, unlike threshold detector and control circuit 132B, the threshold detector and control circuit 132C may not be configured to provide the logic level indication of the switching voltage output, $V_{SW\_EST\_OUT}$, to an FLL circuit. Likewise, unlike threshold detector and control circuit 132B, the threshold detector and control circuit 132C may not be configured to receive a threshold scalar from an FLL circuit.

Figure 4C:
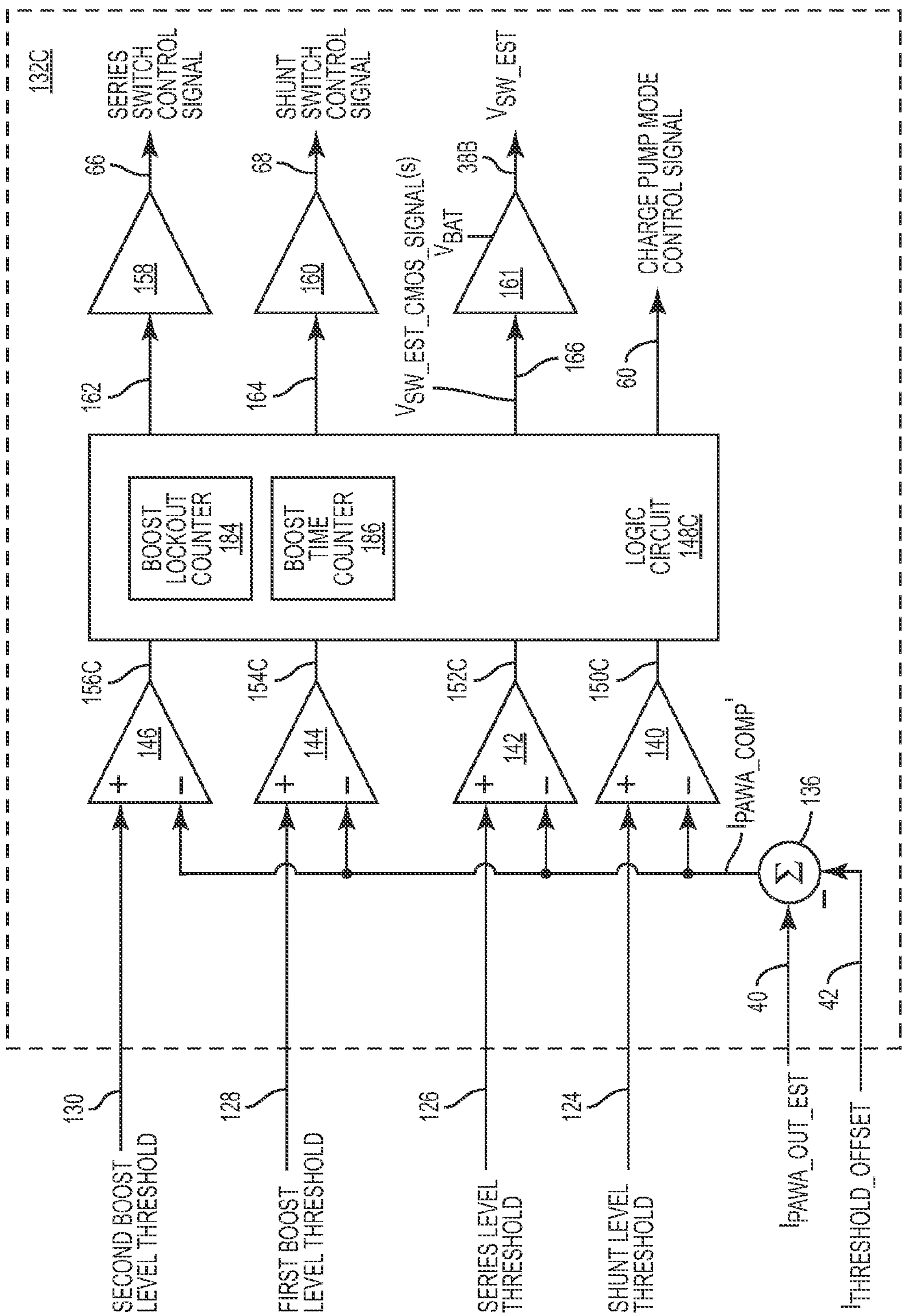
FIG. 4C depicts another embodiment of a threshold detector and control circuit of a switcher control circuit of a multi-level charge pump buck converter.

FIG. 4C depicts an embodiment of the threshold detector and control circuit 132C. Similar to the threshold detector and control circuit 132B of FIG. 4B, the threshold detector and control circuit 132C includes a summing circuit 136 configured to receive the threshold offset current 42, $I_{THRESHOLD\_OFFSET}$, and the parallel amplifier circuit output current estimate 40, $I_{PAWA\_OUT\_EST}$, generated by the parallel amplifier circuit. The summing circuit 136 subtracts the threshold offset current 42, $I_{THRESHOLD\_OFFSET}$, from the parallel amplifier circuit output current estimate 40, $I_{PAWA\_OUT\_EST}$, to generate a compensated parallel amplifier circuit output current estimate, $I_{PAWA\_COMP}'$, which may be used as a composite feedback signal for the first comparator 140, the second comparator 142, the third comparator 144, and the fourth comparator 146. As discussed before, the threshold offset current 42, $I_{THRESHOLD\_OFFSET}$, may be used to control the offset voltage, $V_{OFFSET}$, which is generated across the coupling circuit 18, as depicted in FIG. 1A. In the case where the coupling circuit 18 is a wire, such that the parallel amplifier output 32A is directly coupled to the power amplifier supply output 28, the $V_{OFFSET}$ loop circuit 41 and the threshold offset current 42, $I_{THRESHOLD\_OFFSET}$, are omitted such that $I_{PAWA\_COMP}'$ is the same as the parallel amplifier circuit output current estimate 40, $I_{PAWA\_OUT\_EST}$.

As depicted in FIG. 4C, with continuing reference to FIGS. 1A and 3C, the threshold detector and control circuit 132C may include a first comparator 140, a second comparator 142, a third comparator 144, a fourth comparator 146, and a logic circuit 148C. The example embodiment of the logic circuit 148C may include a Field Programmable Gate Array (FPGA) or other programmable logic device, discrete gates or transistor logic, discrete hardware components, or any combination thereof designed to perform. Some embodiments of the logic circuit 148C may be implemented in either a digital or analog processor.

The first comparator 140 includes a positive terminal coupled to the shunt level threshold 124, a negative terminal coupled to the compensated parallel amplifier circuit output current estimate, $I_{PAWA\_COMP}'$, and a first comparator output configured to generate a shunt level indication 150C, which is provided to the logic circuit 148C. When the compensated parallel amplifier circuit output current estimate, $I_{PAWA\_COMP}'$, is greater than or equal to the shunt level threshold 124, the shunt level indication 150C is asserted by setting output of the first comparator 140 to a digital logic low state. When the compensated parallel amplifier circuit output current estimate, $I_{PAWA\_COMP}'$, is less than the shunt level threshold 124, the shunt level indication 150C is de-asserted by setting output of the first comparator 140 to a digital logic high state. The second comparator 142 includes a positive terminal coupled to the series level threshold 126, a negative terminal coupled to the compensated parallel amplifier circuit output current estimate, $I_{PAWA\_COMP}$,' and a second comparator output configured to generate a series level indication 152C, which is provided to the logic circuit 148C. When the compensated parallel amplifier circuit output current estimate, $I_{PAWA\_COMP}$,' is greater than or equal to the series level threshold 126, the series level indication 152C is asserted by setting output of the second comparator 142 to a digital logic low state. When the compensated parallel amplifier circuit output current estimate, $I_{PAWA\_COMP}$,' is less than the series level threshold 126, the series level indication 152C is de-asserted by setting output of the second comparator 142 to a digital logic high state. The third comparator 144 includes a positive terminal coupled to the first boost level threshold 128, a negative terminal coupled to the compensated parallel amplifier circuit output current estimate, $I_{PAWA\_COMP}'$, and a third comparator output configured to generate a first boost level indication 154C which is provided to the logic circuit 148C. When the compensated parallel amplifier circuit output current estimate, $I_{PAWA\_COMP}'$, is greater than the first boost level threshold 128, the first boost level indication 154C is asserted by setting output of the third comparator 144 to a digital logic low state. When the compensated parallel amplifier circuit output current estimate, $I_{PAWA\_COMP}$,' is less than the first boost level threshold 128, the first boost level indication 154C is de-asserted by setting output of the third comparator 144 to a digital logic high state. The fourth comparator 146 includes a positive terminal coupled to the second boost level threshold 130, a negative terminal coupled to the compensated parallel amplifier circuit output current estimate, $I_{PAWA\_COMP}$,' and a fourth comparator output configured to generate a second boost level indication 156C, which is provided to the logic circuit 148C. When the compensated parallel amplifier circuit output current estimate, $I_{PAWA\_COMP}$,' is greater than the second boost level threshold 130, the second boost level indication 156C is asserted by setting output of the fourth comparator 146 to a digital logic low state. When the compensated parallel amplifier circuit output current estimate, $I_{PAWA\_COMP}$,' is less than the second boost level threshold 130, the second boost level indication 156C is de-asserted by setting output of the fourth comparator 146 to a digital logic high state.

Similar to the logic circuit 148A of FIG. 4A and the logic circuit 148B of FIG. 4B, the logic circuit 148C of FIG. 4C may be configured to generate a charge pump mode control signal 60, a series switch control output 162 provided to the first output buffer 158, a shunt switch control output 164 provided to the second output buffer 160, one or more switching voltage output cmos signal(s) 166, $V_{SW\_EST\_CMOS\_SIGNAL}$(s), provided to the third output buffer 161, and an estimated switching voltage output 38B, $V_{SW\_EST}$. As previously described, the series switch control output 162, a shunt switch control output 164, and the one or more switching voltage output cmos signal(s) 166, $V_{SW\_EST\_CMOS\_SIGNAL}$(s), may be configured to operate with the first output buffer 158, the second output buffer 160, and the third output buffer 161 to generate the series switch control signal 66, the shunt switch control signal 68, and the estimated switching voltage output 38B, $V_{SW\_EST}$, respectively. Similar to the logic circuit 148A of FIG. 4A and the logic circuit 148B of FIG. 4B, the logic circuit 148C may include a boost lockout counter 184 and a boost time counter 186. The operation of the boost lockout counter 184 and a boost time counter 186 of the logic circuit 148C is substantially similar to the operation of the boost lockout counter 184 and a boost time counter 186 of the logic circuit 148A and 148B of FIGS. 4A and 4B, respectively.

Similar to the threshold detector and control circuit 132A of FIG. 4A and the threshold detector and control circuit 132B of FIG. 4B, the threshold detector and control circuit 132C may be configured to receive a mode switch control signal 131 from the controller 50, as depicted in FIG. 3C, in order to configure the logic circuit 148C to operate the multi-level charge pump buck converter in different modes of operation. As an example, the mode switch control signal 131 may configure operation of a state machine within the threshold detector and control circuit 132C that governs how the switching voltage output 26 transitions the switching voltage output 26 to provide different output levels. As a first example embodiment of a state machine within the threshold detector and control circuit 132C, the mode switch control signal 131 may configure the multi-level charge pump buck converter 12 to operate in a first mode of operation, depicted in FIG. 5C. As another example embodiment of a state machine within the threshold detector and control circuit 132C, the mode switch control signal 131 may configure the multi-level charge pump buck converter 12 to operate in a second mode of operation, depicted in FIG. 6C.

The operation of the logic circuit 148C will now be discussed with continuing reference to FIGS. 2A, 3C, 4C, 5C, 6C, and 7A. Similar to the logic circuit 148A of FIG. 4A and the logic circuit 148B of FIG. 4B, the logic circuit 148C may be digital or analog based logic configured for one or more state machines of the threshold detector and control circuit 132C.

Operation of the first state machine implemented in the logic circuit 148C, depicted in FIG. 5C, will now be described. The first state machine includes a shunt output mode 188C, a series output mode 190C, a first boost output mode 192C, and a second boost output mode 194C.

In the shunt output mode 188C, the logic circuit 148C (FIG. 4C) configures the series switch control output 162 such that the series switch 70 (FIG. 3C) is in an open state (not conducting). The logic circuit 148C also configures the shunt switch control output 164 such that the shunt switch 72 is in a closed state (conducting). In addition, the logic circuit 148C configures the charge pump mode control signal 60 to instruct the multi-level charge pump circuit 56 (FIG. 3C) to be in a charging mode of operation. As a result, the switching voltage output 26 of FIG. 3C is configured to provide a switching voltage, $V_{SW}$, substantially equal to ground. In response to assertion of the series level indication 152C, which indicates that the compensated parallel amplifier circuit output current estimate, $I_{PAWA\_COMP}'$, is greater than or equal to the series level threshold 126, the logic circuit 148C configures the first state machine to transition to the series output mode 190C. Otherwise the state machine remains in the shunt output mode 188C.

In the series output mode 190C, the logic circuit 148C configures the series switch control output 162 such that the series switch 70 is in a closed state (conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 to be in a charging mode of operation. As a result, the switching voltage output 26 of FIG. 3C is configured to provide a switching voltage, $V_{SW}$, substantially equal to the direct current (DC) voltage, $V_{BAT}$.

Figure 5C:
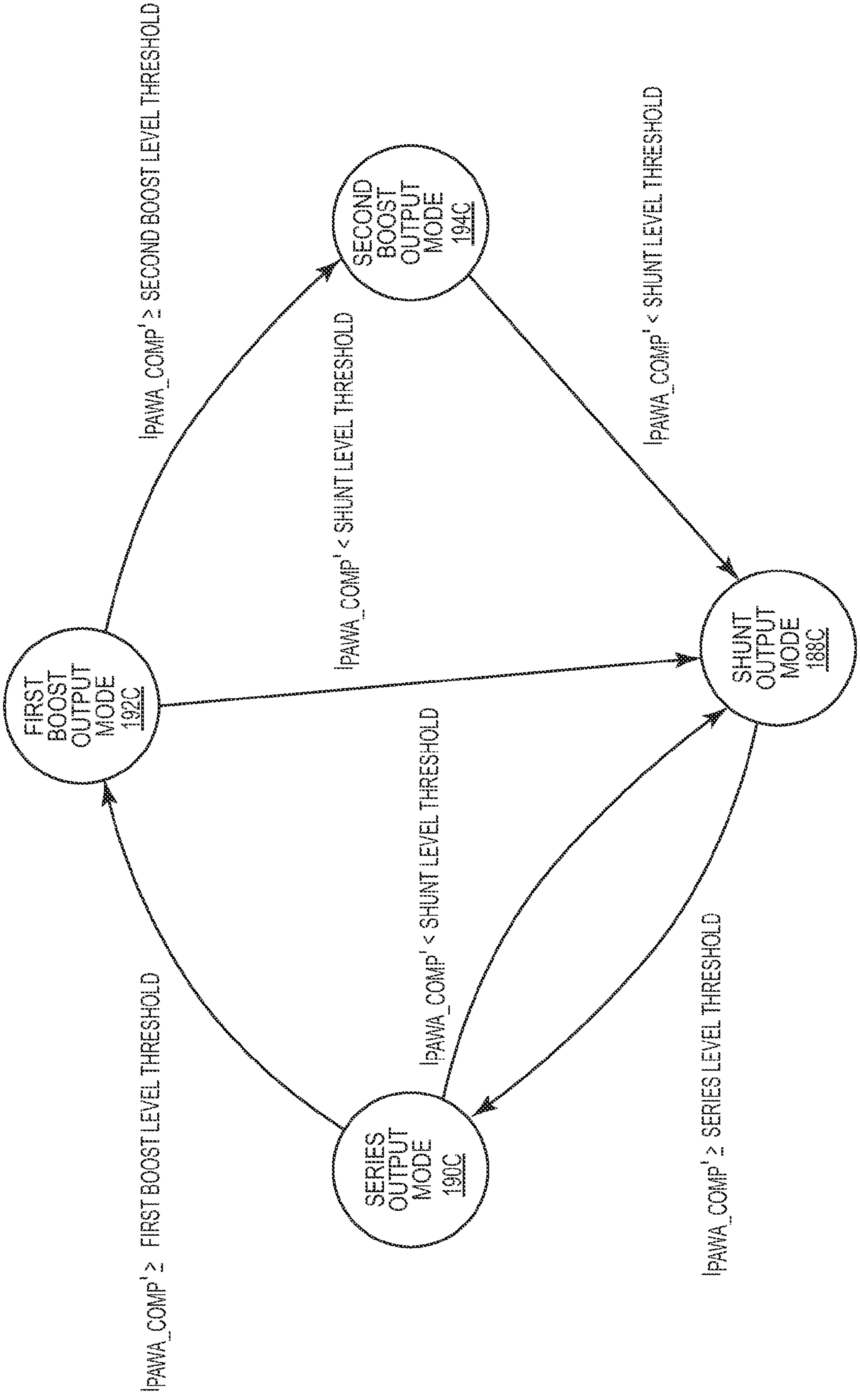
FIG. 5C depicts an embodiment of a first state machine of the threshold detector and control circuit of FIG. 4C.

In response to de-assertion of the shunt level indication 150C (FIG. 4C), which indicates that the compensated parallel amplifier circuit output current estimate, $I_{PAWA\_COMP}'$, is less than the shunt level threshold 124, the logic circuit 148C configures the first state machine to transition to the shunt output mode 188C (FIG. 5C). However, in response to assertion of the first boost level indication 154C, which indicates that the compensated parallel amplifier circuit output current estimate, $I_{PAWA\_COMP}'$, is greater than or equal to the first boost level threshold 128, the logic circuit 148C configures the first state machine to transition to the first boost output mode 192C. Otherwise, the first state machine remains in the series output mode 190C.

In the first boost output mode 192C, the logic circuit 148C (FIG. 4C) configures the series switch control output 162 such that the series switch 70 (FIG. 3C) is in an open state (not conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 to be in a first boost mode of operation to provide $1.5\times V_{BAT}$ at the charge pump output 64. As a result, the switching voltage output 26 of FIG. 3C is configured to provide a switching voltage, $V_{SW}$, substantially equal to $1.5\times V_{BAT}$. In response to de-assertion of the shunt level indication 150C (FIG. 4C), which indicates that the compensated parallel amplifier circuit output current estimate, $I_{PAWA\_COMP}'$, is less than the shunt level threshold 124, the logic circuit 148C configures the first state machine to transition to the shunt output mode 188C (FIG. 5C). However, in response to assertion of the second boost level indication 156C, which indicates that the compensated parallel amplifier circuit output current estimate, $I_{PAWA\_COMP}'$, is greater than or equal to the second boost level threshold 130, the logic circuit 148C configures the first state machine to transition to the second boost output mode 194C. Otherwise, the first state machine remains in the first boost output mode 192C.

In the second boost output mode 194C, the logic circuit 148C (FIG. 4C) configures the series switch control output 162 such that the series switch 70 (FIG. 3C) is in an open state (not conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 to be in a second boost mode of operation to provide $2\times V_{BAT}$ at the charge pump output 64. As a result, the switching voltage output 26 of FIG. 3C is configured to provide a switching voltage, $V_{SW}$, substantially equal to $2\times V_{BAT}$. In response to de-assertion of the shunt level indication 150C, which indicates that the compensated parallel amplifier circuit output current estimate, $I_{PAWA\_COMP}'$, is less than the shunt level threshold 124, the first state machine transitions to the shunt output mode 188C. Otherwise, the state machine remains in the second boost output mode 194C.

Operation of the second state machine of the logic circuit 148C, depicted in FIG. 6C, will now be described. The second state machine includes a shunt output mode 196C, a series output mode 198C, a first boost output mode 200C, and a second boost output mode 202C. In addition, the second state machine uses the above-described boost lockout counter 184 and boost time counter 186 of the logic circuit 148C.

In the shunt output mode 196C, the logic circuit 148C (FIG. 4C) configures the series switch control output 162 such that the series switch 70 is in an open state (not conducting). The logic circuit 148C also configures the shunt switch control output 164 such that the shunt switch 72 is in a closed state (conducting). In addition, the logic circuit 148C configures the charge pump mode control signal 60 to instruct the multi-level charge pump circuit 56 (FIG. 3C) to be in a charging mode of operation. As a result, the switching voltage output 26 of FIG. 3C is configured to provide a switching voltage, $V_{SW}$, substantially equal to ground. If the boost lockout counter 184 is enabled, the boost lockout counter 184 continues to count down. In response to assertion of the series level indication 152C, which indicates that the compensated parallel amplifier circuit output current estimate, $I_{PAWA\_COMP}'$, is greater than or equal to the series level threshold 126, the second state machine transitions to the series output mode 198C. Otherwise the second state machine remains in the shunt output mode 196C.

In the series output mode 198C, the logic circuit 148C (FIG. 4C) configures the series switch control output 162 such that the series switch 70 is in a closed state (conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 to be in a charging mode of operation. As a result, the switching voltage output 26 of FIG. 3C is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150C, which indicates that the compensated parallel amplifier circuit output current estimate, $I_{PAWA\_COMP}'$, is less than the shunt level threshold 124, the logic circuit 148C configures the second state machine to transition to the shunt output mode 196C. However, in response to assertion of the first boost level indication 154C, which indicates that the compensated parallel amplifier circuit output current estimate, $I_{PAWA\_COMP}'$, is greater than or equal to the first boost level threshold 128, the logic circuit 148C determines whether both the minimum charge time indicator is de-asserted and the first boost level indication 154C is asserted. If the minimum charge time indicator is de-asserted and the first boost level indication 154C is asserted, the logic circuit 148C configures the second machine to transition to the first boost output mode 200C. Otherwise, the logic circuit 148C prevents the second state machine from transitioning to the first boost output mode 200C until the minimum time indicator is de-asserted. Once both the minimum charge time indicator is de-asserted and the first boost level indication 154C is asserted, the logic circuit 148C configures the second state machine to transition to the first boost output mode 200C, resets the counter output of the boost time counter 186, and enables the boost time counter 186 to begin counting up. Otherwise, the second state machine remains in the series output mode 198C.

In the first boost output mode 200C, the logic circuit 148C configures the series switch control output 162 such that the series switch 70 is in an open state (not conducting). The logic circuit 148C also configures the shunt switch control output 164 such that the shunt switch 72 is in an open state (not conducting). In addition, the logic circuit 148C configures the charge pump mode control signal 60 to instruct the multi-level charge pump circuit 56 (FIG. 3C) to be in a first boost mode of operation to provide $1.5\times V_{BAT}$ at the charge pump output 64. As a result, the switching voltage output 26 of FIG. 3C is configured to provide a switching voltage, $V_{SW}$, substantially equal to $1.5\times V_{BAT}$. In response to de-assertion of the first boost level indication 154C, which indicates that the compensated parallel amplifier circuit output current estimate, $I_{PAWA\_COMP}'$, is less than the first boost level threshold 128, the logic circuit 148C configures the second state machine to transition to the series output mode 198C. If the count output of the boost time counter 186 exceeds the maximum boost time parameter, the logic circuit 148C asserts a minimum charge time indicator. In response to the minimum charge time indicator being asserted, the logic circuit 148C sets the count value of the boost lockout counter 184 and enables the boost lockout counter 184 to begin counting down. However, in response to assertion of the second boost level indication 156C, which indicates that the compensated parallel amplifier circuit output current estimate, $I_{PAWA\_COMP}'$, is greater than or equal to the second boost level threshold 130, the logic circuit 148C configures the second state machine to transition to the second boost output mode 202C. Otherwise, the second state machine remains in the first boost output mode 200C.

In the second boost output mode 202C, the logic circuit 148C configures the series switch control output 162 such that the series switch 70 (FIG. 3C) is in an open state (not conducting). The logic circuit 148C also configures the shunt switch control output 164 such that the shunt switch 72 (FIG. 3C) is in an open state (not conducting). In addition, the logic circuit 148C configures the charge pump mode control signal 60 to instruct the multi-level charge pump circuit 56 (FIG. 3C) to be in a second boost mode of operation to provide $2\times V_{BAT}$ at the charge pump output 64. As a result, the switching voltage output 26 of FIG. 3C is configured to provide a switching voltage, $V_{SW}$, substantially equal to $2\times V_{BAT}$.

In response to de-assertion of the first boost level indication 154C, which indicates that the compensated parallel amplifier circuit output current estimate, $I_{PAWA\_COMP}'$, is less than the first boost level threshold 128, the logic circuit 148C configures the second state machine to transition to the series output mode 198C. If the count output of the boost time counter 186 exceeds the maximum boost time parameter, the logic circuit 148C asserts a minimum charge time indicator. In response to the minimum charge time indicator being asserted, the logic circuit 148C sets the count value of the boost lockout counter 184 and enables the boost lockout counter 184 to begin counting down. Otherwise, the second state machine remains in the second boost output mode 202C.

The threshold and control circuit 132C further provides a logic level indication of the switching voltage output, $V_{SW\_EST\_OUT}$, which is a logic level representation of the switching voltage output, $V_{SW}$. The switching voltage output, $V_{SW\_EST\_OUT}$, may be based upon the $V_{SW\_EST\_CMOS\_SIGNAL}$(s). In some embodiments of the threshold and control circuit 132C, the logic level indication of the switching voltage output, $V_{SW\_EST\_OUT}$, may be asserted when the multi-level charge pump buck converter 12A is in either the series output mode, the first boost output mode, or the second boost output mode. The logic level indication of the switching voltage output, $V_{SW\_EST\_OUT}$, is de-asserted when the multi-level charge pump buck converter 12A is in the shunt output mode of operation.

By way of example, and not by limitation, FIG. 3D depicts an embodiment of the pseudo-envelope follower power management system 10B of FIG. 1B that includes neither a frequency lock loop (FLL) circuit nor a $V_{OFFSET}$ loop circuit 41. In addition, FIG. 3D depicts another embodiment of the pseudo-envelope follower power management system 10B of FIG. 1B where the coupling circuit 18 is a wire and the parallel amplifier output 32A of the parallel amplifier circuit 14 is directly coupled to the power amplifier supply output 28. Other embodiments of the pseudo-envelope follower power management system 10B of FIG. 1B that include the circuitry depicted in FIG. 3D may include a coupling circuit 18 that does not directly couple the output of the parallel amplifier output 32A to the power amplifier supply output 28, $V_{CC}$. In those cases, the circuitry depicted in FIG. 3D may be included in a parallel amplifier circuit 14, of FIG. 1A, that includes a $V_{OFFSET}$ loop circuit 41.

FIG. 3D depicts an embodiment of the multi-level charge pump buck converter having a switcher control circuit 52D, which is similar to the switcher control circuit 52C depicted in FIG. 3C. However, unlike the switcher control circuit 52C, the switcher control circuit 52D includes a threshold detector and control circuit 132D that is not configured to receive the threshold offset current 42, $I_{THRESHOLD\_OFFSET}$, from the parallel amplifier circuit 14.

Figure 4D:
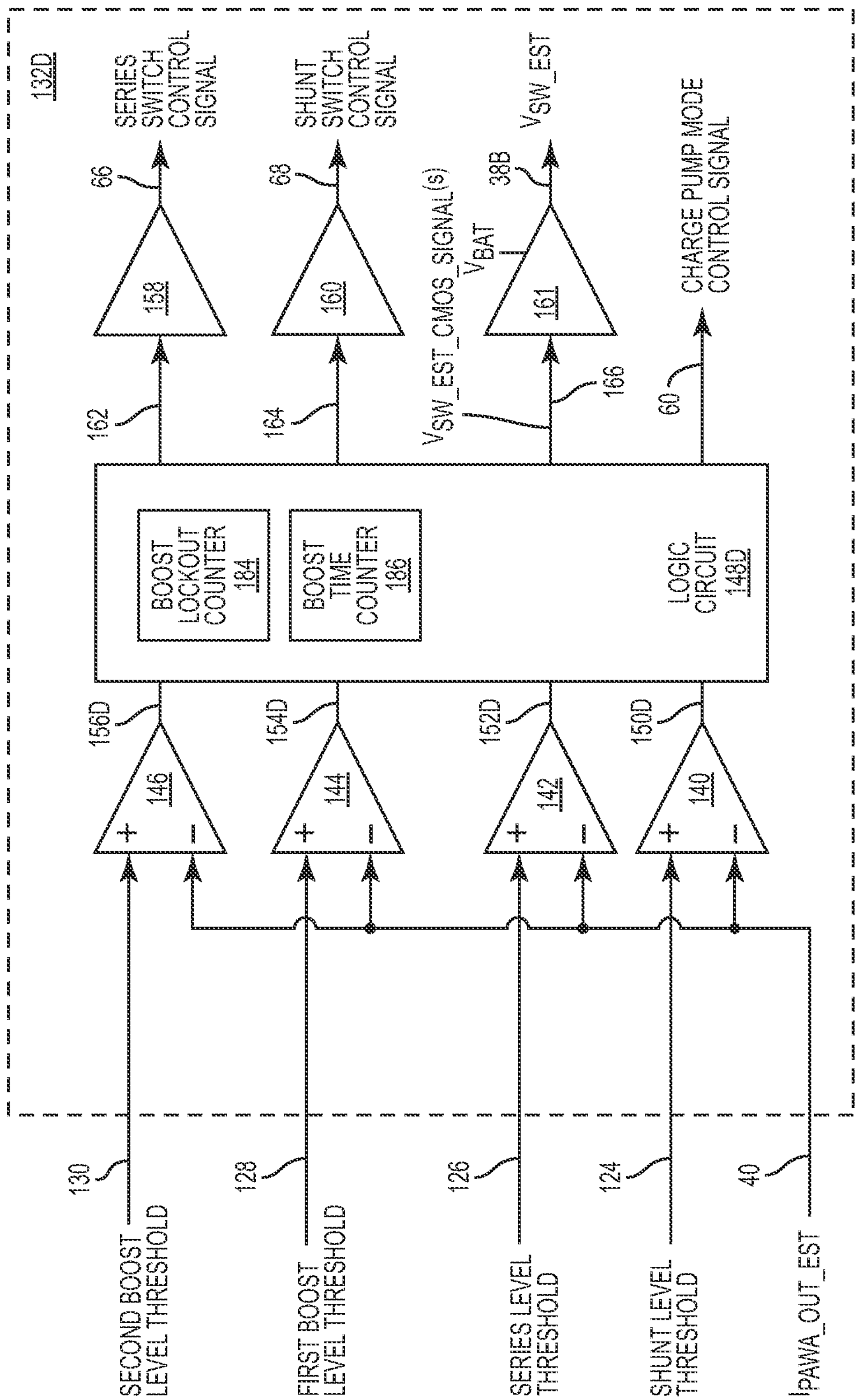
FIG. 4D depicts another embodiment of a threshold detector and control circuit of a switcher control circuit of a multi-level charge pump buck converter.

Similar to the threshold detector and control circuit 132A of FIG. 4A, the threshold detector and control circuit 132B of FIG. 4B, and the threshold detector and control circuit 132C of FIG. 4C, the threshold detector and control circuit 132D of FIG. 4D may be configured to receive mode switch control signal 131, depicted in FIG. 3D, from the controller 50 in order to configure the logic circuit 148D to operate the multi-level charge pump buck converter in different modes of operation. As an example, the mode switch control signal 131 may configure operation of a state machine within the threshold detector and control circuit 132D that governs how the switching voltage output 26 transitions the switching voltage output 26 to provide different output levels. As a first example embodiment of a first state machine within the threshold detector and control circuit 132D, the mode switch control signal 131 may configure the multi-level charge pump buck converter 12 to operate in a first mode of operation, depicted in FIG. 5D. As another example embodiment a second state machine within the threshold detector and control circuit 132D, the mode switch control signal 131 may configure the multi-level charge pump buck converter 12 to operate in a second mode of operation, depicted in FIG. 6D.

One embodiment of the threshold detector and control circuit 132D is depicted in FIG. 4D. The threshold detector and control circuit 132D is similar to the threshold detector and control circuit 132A, depicted in FIG. 4A, except the logic circuit 148A is replace by a logic circuit 148D and the parallel amplifier circuit output current estimate, $I_{PAWA\_COMP}$, is replaced by the parallel amplifier circuit output current estimate 40, $I_{PAWA\_OUT\_EST}$. As discussed above, the parallel amplifier circuit output current estimate 40, $I_{PAWA\_OUT\_EST}$, may include the scaled parallel amplifier output current estimate, $I_{PARA\_AMP\_SENSE}$, and the scaled open loop assist circuit output current estimate, $I_{ASSIST\_SENSE}$. However, in some embodiments of the parallel amplifier circuit that do not include the open loop assist circuit 39, the parallel amplifier circuit output current estimate 40, $I_{PAWA\_OUT\_EST}$, only includes the scaled parallel amplifier output current estimate, $I_{PARA\_AMP\_SENSE}$, generated by the parallel amplifier sense circuit 36 of the parallel amplifier circuitry 32, as above described.

The threshold detector and control circuit 132D of FIG. 4D will be described with continuing reference to FIG. 3D. The threshold detector and control circuit 132D may include a first comparator 140, a second comparator 142, a third comparator 144, a fourth comparator 146, and a logic circuit 148D. The example embodiment of the logic circuit 148D may include a Field Programmable Gate Array (FPGA) or other programmable logic device, discrete gates or transistor logic, discrete hardware components, or any combination thereof designed to perform. Some embodiments of the logic circuit 148D may be implemented in either a digital or analog processor.

The first comparator 140 includes a positive terminal coupled to the shunt level threshold 124, a negative terminal coupled to the parallel amplifier circuit output current estimate 40, $I_{PAWA\_OUT\_EST}$, and a first comparator output is configured to generate a shunt level indication 150D, which is provided to the logic circuit 148D. When the parallel amplifier circuit output current estimate 40, $I_{PAWA\_OUT\_EST}$, is greater than or equal to the shunt level threshold 124, the shunt level indication 150D is asserted by setting output of the first comparator 140 to a digital logic low state. When the parallel amplifier circuit output current estimate 40, $I_{PAWA\_OUT\_EST}$, is less than the shunt level threshold 124, the shunt level indication 150D is de-asserted by setting output of the first comparator 140 to a digital logic high state. The second comparator 142 includes a positive terminal coupled to the series level threshold 126, a negative terminal coupled to the parallel amplifier circuit output current estimate 40, $I_{PAWA\_OUT\_EST}$, and a second comparator output is configured to generate a series level indication 152D, which is provided to the logic circuit 148D. When the parallel amplifier circuit output current estimate 40, $I_{PAWA\_OUT\_EST}$, is greater than or equal to the series level threshold 126, the series level indication 152D is asserted by setting output of the second comparator 142 to a digital logic low state. When the parallel amplifier circuit output current estimate 40, $I_{PAWA\_OUT\_EST}$, is less than the series level threshold 126, the series level indication 152D is de-asserted by setting output of the second comparator 142 to a digital logic high state. The third comparator 144 includes a positive terminal coupled to the first boost level threshold 128, a negative terminal coupled to the parallel amplifier circuit output current estimate 40, $I_{PAWA\_OUT\_EST}$, and a third comparator output is configured to generate a first boost level indication 154D, which is provided to the logic circuit 148D. When the parallel amplifier circuit output current estimate 40, $I_{PAWA\_OUT\_EST}$, is greater than the first boost level threshold 128, the first boost level indication 154D is asserted by setting output of the third comparator 144 to a digital logic low state. When the parallel amplifier circuit output current estimate 40, $I_{PAWA\_OUT\_EST}$, is less than the first boost level threshold 128, the first boost level indication 154D is de-asserted by setting output of the third comparator 144 to a digital logic high state. The fourth comparator 146 includes a positive terminal coupled to the second boost level threshold 130, a negative terminal coupled to the parallel amplifier circuit output current estimate 40, $I_{PAWA\_OUT\_EST}$, and a fourth comparator output is configured to generate a second boost level indication 156D, which is provided to the logic circuit 148D. When the parallel amplifier circuit output current estimate 40, $I_{PAWA\_OUT\_EST}$, is greater than the second boost level threshold 130, the second boost level indication 156D is asserted by setting output of the fourth comparator 146 to a digital logic low state. When the parallel amplifier circuit output current estimate 40, $I_{PAWA\_OUT\_EST}$, is less than the second boost level threshold 130, the second boost level indication 156D is de-asserted by setting output of the fourth comparator 146 to a digital logic high state.

Similar to the logic circuit 148A of FIG. 4A, the logic circuit 148B of FIG. 4B, and the logic circuit 148C of FIG. 4C, the logic circuit 148D may also be configured to generate charge pump mode control signal, a series switch control output 162 provided to the first output buffer 158, a shunt switch control output 164 provided to the second output buffer 160, one or more switching voltage output cmos signal(s) 166, $V_{SW\_EST\_CMOS\_SIGNAL}$(s), provided to the third output buffer 161, and an estimated switching voltage output 38B, $V_{SW\_EST}$. As previously described, the series switch control output 162, the shunt switch control output 164, and the one or more switching voltage output cmos signal(s) 166, $V_{SW\_EST\_CMOS\_SIGNAL}$(s), may be configured to operate with the first output buffer 158, the second output buffer 160, and the third output buffer 161 to generate the series switch control signal 66, the shunt switch control signal 68, and the estimated switching voltage output 38B, $V_{SW\_EST}$, respectively. Also similar to the logic circuit 148A of FIG. 4A, the logic circuit 148B of FIG. 4B, and the logic circuit 148C of FIG. 4C, the logic circuit 148D may include a boost lockout counter 184 and a boost time counter 186. The operation of the boost lockout counter 184 and the boost time counter 186 of the logic circuit 148D is substantially similar to the operation of the boost lockout counter 184 and the boost time counter 186 of the logic circuits 148A, 148B, and 148C of FIGS. 4A, 4B, and 4C, respectively.

The example embodiment of the logic circuit 148D may include a Field Programmable Gate Array (FPGA) or other programmable logic device, discrete gates or transistor logic, discrete hardware components, or any combination thereof designed to perform. Some embodiments of the logic circuit 148D may be implemented in either a digital or analog processor. In addition, the logic circuit 148D may include an embodiment of the first state machine and the second state machine of the threshold detector and control circuit 132D.

Operation of the first state machine implemented in the logic circuit 148D, depicted in FIG. 5D, will now be described. The first state machine includes a shunt output mode 188D, a series output mode 190D, a first boost output mode 192D, and a second boost output mode 194D.

In the shunt output mode 188D, the logic circuit 148D (FIG. 4D) configures the series switch control output 162 such that the series switch 70 (FIG. 3D) is in an open state (not conducting). The logic circuit 148D also configures the shunt switch control output 164 such that the shunt switch 72 (FIG. 3D) is in a closed state (conducting). In addition, the logic circuit 148D configures the charge pump mode control signal 60 to instruct the multi-level charge pump circuit 56 (FIG. 3D) to be in a charging mode of operation. As a result, the switching voltage output 26 of FIG. 3D is configured to provide a switching voltage, $V_{SW}$, substantially equal to ground. In response to assertion of the series level indication 152D, which indicates that the parallel amplifier circuit output current estimate 40, $I_{PAWA\_OUT\_EST}$, is greater than or equal to the series level threshold 126, the logic circuit 148D configures the first state machine to transition to the series output mode 190D. Otherwise the state machine remains in the shunt output mode 188D.

In the series output mode 190D, the logic circuit 148D configures the series switch control output 162 such that the series switch 70 (FIG. 3D) is in a closed state (conducting). The logic circuit 148D also configures the shunt switch control output 164 such that the shunt switch 72 (FIG. 3D) is in an open state (not conducting). In addition, the logic circuit 148D configures the charge pump mode control signal 60 to instruct the multi-level charge pump circuit 56 to be in a charging mode of operation. As a result, the switching voltage output 26 of FIG. 3D is configured to provide a switching voltage, $V_{SW}$, substantially equal to the direct current (DC) voltage, $V_{BAT}$.

Figure 5D:
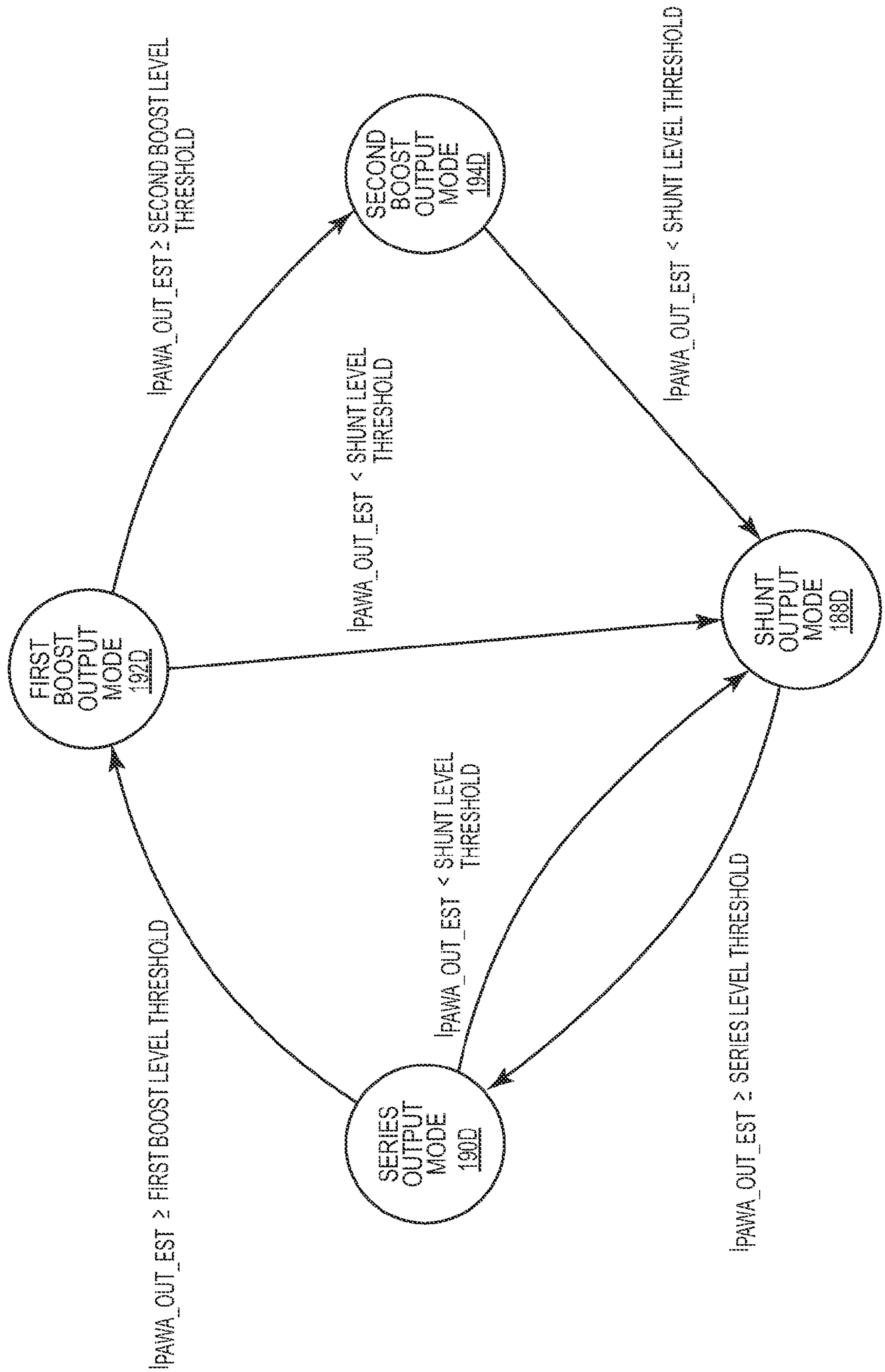
FIG. 5D depicts an embodiment of a first state machine of the threshold detector and control circuit of FIG. 4D.

In response to de-assertion of the shunt level indication 150D (FIG. 4D), which indicates that the power amplifier circuit output current estimate, $I_{PAWA\_OUT\_EST}$, is less than the shunt level threshold 124, the logic circuit 148D configures the first state machine to transition to the shunt output mode 188D (FIG. 5D). However, in response to assertion of the first boost level indication 154D, which indicates that the parallel amplifier circuit output current estimate 40, $I_{PAWA\_OUT\_EST}$, is greater than or equal to the first boost level threshold 128, the logic circuit 148D configures the first state machine to transition to the first boost output mode 192D. Otherwise, the first state machine remains in the series output mode 190D.

In the first boost output mode 192D, the logic circuit 148D (FIG. 4D) configures the series switch control output 162 such that the series switch 70 (FIG. 3D) is in an open state (not conducting). The logic circuit 148D also configures the shunt switch control output 164 such that the shunt switch 72 (FIG. 3D) is in an open state (not conducting). In addition, the logic circuit 148D configures the charge pump mode control signal 60 to instruct the multi-level charge pump circuit 56 to be in a first boost mode of operation to provide $1.5\times V_{BAT}$ at the charge pump output 64. As a result, the switching voltage output 26 of FIG. 3D is configured to provide a switching voltage, $V_{SW}$, substantially equal to $1.5\times V_{BAT}$. In response to de-assertion of the shunt level indication 150D (FIG. 4D), which indicates that the parallel amplifier circuit output current estimate 40, $I_{PAWA\_OUT\_EST}$, is less than the shunt level threshold 124, the logic circuit 148D configures the first state machine to transition to the shunt output mode 188D (FIG. 5D). However, in response to assertion of the second boost level indication 156D, which indicates that the parallel amplifier circuit output current estimate 40, $I_{PAWA\_OUT\_EST}$, is greater than or equal to the second boost level threshold 130, the logic circuit 148D configures the first state machine to transition to the second boost output mode 194D. Otherwise, the first state machine remains in the first boost output mode 192D.

In the second boost output mode 194D, the logic circuit 148D (FIG. 4D) configures the series switch control output 162 such that the series switch 70 (FIG. 3D) is in an open state (not conducting). The logic circuit 148D also configures the shunt switch control output 164 such that the shunt switch 72 (FIG. 3D) is in an open state (not conducting). In addition, the logic circuit 148D configures the charge pump mode control signal 60 to instruct the multi-level charge pump circuit 56 to be in a second boost mode of operation to provide $2\times V_{BAT}$ at the charge pump output 64. As a result, the switching voltage output 26 of FIG. 3D is configured to provide a switching voltage, $V_{SW}$, substantially equal to $2\times V_{BAT}$. In response to de-assertion of the shunt level indication 150D, which indicates that the parallel amplifier circuit output current estimate 40, $I_{PAWA\_OUT\_EST}$, is less than the shunt level threshold 124, the first state machine transitions to the shunt output mode 188D. Otherwise, the state machine remains in the second boost output mode 194D.

Operation of the second state machine of the logic circuit 148D, depicted in FIG. 6D, will now be described. The second state machine includes a shunt output mode 196D, a series output mode 198D, a first boost output mode 200D, and a second boost output mode 202D. In addition, the second state machine uses the above-described boost lockout counter 184 and boost time counter 186 of the logic circuit 148D.

In the shunt output mode 196D, the logic circuit 148D (FIG. 4D) configures the series switch control output 162 such that the series switch 70 (FIG. 3D) is in an open state (not conducting). The logic circuit 148D also configures the shunt switch control output 164 such that the shunt switch 72 (FIG. 3D) is in a closed state (conducting). In addition, the logic circuit 148D configures the charge pump mode control signal 60 to instruct the multi-level charge pump circuit 56 (FIG. 3D) to be in a charging mode of operation. As a result, the switching voltage output 26 of FIG. 3D is configured to provide a switching voltage, $V_{SW}$, substantially equal to ground. If the boost lockout counter 184 is enabled, the boost lockout counter 184 continues to count down. In response to assertion of the series level indication 152D, which indicates that the parallel amplifier circuit output current estimate 40, $I_{PAWA\_OUT\_EST}$, is greater than or equal to the series level threshold 126, the second state machine transitions to the series output mode 198D. Otherwise the second state machine remains in the shunt output mode 196D.

In the series output mode 198D, the logic circuit 148D (FIG. 4D) configures the series switch control output 162 such that the series switch 70 (FIG. 3D) is in a closed state (conducting). The logic circuit 148D also configures the shunt switch control output 164 such that the shunt switch 72 (FIG. 3D) is in an open state (not conducting). In addition, the logic circuit 148D configures the charge pump mode control signal 60 to instruct the multi-level charge pump circuit 56 to be in a charging mode of operation. As a result, the switching voltage output 26 of FIG. 3D is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150D, which indicates that the parallel amplifier circuit output current estimate 40, $I_{PAWA\_OUT\_EST}$, is less than the shunt level threshold 124, the logic circuit 148D configures the second state machine to transition to the shunt output mode 196D. However, in response to assertion of the first boost level indication 154D, which indicates that parallel amplifier circuit output current estimate 40, $I_{PAWA\_OUT\_EST}$, is greater than or equal to the first boost level threshold 128, the logic circuit 148D determines whether both the minimum charge time indicator is de-asserted and the first boost level indication 154D is asserted. If the minimum charge time indicator is de-asserted and the first boost level indication 154D is asserted, the logic circuit 148D configures the second machine to transition to the first boost output mode 200D. Otherwise, the logic circuit 148D prevents the second state machine from transitioning to the first boost output mode 200D until the minimum time indicator is de-asserted. Once both the minimum charge time indicator is de-asserted and the first boost level indication 154D is asserted, the logic circuit 148D configures the second state machine to transition to the first boost output mode 200D, resets the counter output of the boost time counter 186, and enables the boost time counter 186 to begin counting up. Otherwise, the second state machine remains in the series output mode 198D.

In the first boost output mode 200D, the logic circuit 148D configures the series switch control output 162 such that the series switch 70 (FIG. 3D) is in an open state (not conducting). The logic circuit 148D also configures the shunt switch control output 164 such that the shunt switch 72 (FIG. 3D) is in an open state (not conducting). In addition, the logic circuit 148D configures the charge pump mode control signal 60 to instruct the multi-level charge pump circuit 56 to be in a first boost mode of operation to provide $1.5 \times V_{BAT}$ at the charge pump output 64. As a result, the switching voltage output 26 of FIG. 3D is configured to provide a switching voltage, $V_{SW}$, substantially equal to $1.5 \times V_{BAT}$. In response to de-assertion of the first boost level indication 154D, which indicates that the parallel amplifier circuit output current estimate 40, $I_{PAWA\_OUT\_EST}$, is less than the first boost level threshold 128, the logic circuit 148D configures the second state machine to transition to the series output mode 198D. If the count output of the boost time counter 186 exceeds the maximum boost time parameter, the logic circuit 148D asserts a minimum charge time indicator. In response to the minimum charge time indicator being asserted, the logic circuit 148D sets the count value of the boost lockout counter 184 and enables the boost lockout counter 184 to begin counting down. However, in response to assertion of the second boost level indication 156D, which indicates that the parallel amplifier circuit output current estimate 40, $I_{PAWA\_OUT\_EST}$, is greater than or equal to the second boost level threshold 130, the logic circuit 148D configures the second state machine to transition to the second boost output mode 202D. Otherwise, the second state machine remains in the first boost output mode 200D.

In the second boost output mode 202D, the logic circuit 148D configures the series switch control output 162 such that the series switch 70 (FIG. 3D) is in an open state (not conducting). The logic circuit 148D also configures the shunt switch control output 164 such that the shunt switch 72 (FIG. 3D) is in an open state (not conducting). In addition, the logic circuit 148D configures the charge pump mode control signal 60 to instruct the multi-level charge pump circuit 56 (FIG. 3D) to be in a second boost mode of operation to provide $2 \times V_{BAT}$ at the charge pump output 64. As a result, the switching voltage output 26 of FIG. 3D is configured to provide a switching voltage, $V_{SW}$, substantially equal to $2 \times V_{BAT}$.

In response to de-assertion of the first boost level indication 154D, which indicates that the parallel amplifier circuit output current estimate 40, $I_{PAWA\_OUT\_EST}$, is less than the first boost level threshold 128, the logic circuit 148D configures the second state machine to transition to the series output mode 198D. If the count output of the boost time counter 186 exceeds the maximum boost time parameter, the logic circuit 148D asserts a minimum charge time indicator. In response to the minimum charge time indicator being asserted, the logic circuit 148D sets the count value of the boost lockout counter 184 and enables the boost lockout counter 184 to begin counting down. Otherwise, the second state machine remains in the second boost output mode 202D.

With respect to the cases where the first state machine or the second state machine of the logic circuit 148A, the logic circuit 148B, the logic circuit 148C, and the logic circuit 148D depicted in the respective FIGS. 4A, 4B, 4C, and 4D, are configured to be in either the first boost output mode 192A, the first boost output mode 192B, the first boost output mode 192C, and the first boost output mode 192D, or the first boost output mode 200A, the first boost output mode 200B, the first boost output mode 200C, or the first boost output mode 200D, respectively, when the multi-level charge pump circuit 56 is configured to be in a first boost mode of operation, the first switch 86, the third switch 90, the fifth switch 94 and the seventh switch 98 of the multi-level charge pump circuit 56 are configured to be closed such that charge from the supply input 24, ($V_{BAT}$), the first flying capacitor 100 and the second flying capacitor 102, arranged in parallel, is provided directly to the switching voltage output 26 via the charge pump output 64 in order to provide substantially $1.5 \times V_{BAT}$ at the switching voltage output 26. The second switch 88, the fourth switch 92, and the sixth switch 96, and the eighth switch 118 of the multi-level charge pump are configured to be open.

Similarly, with respect to the cases where the first state machine or the second state machine of the logic circuit 148A, the logic circuit 148B, the logic circuit 148C, and logic circuit 148D depicted in the respective FIGS. 4A, 4B, 4C, and 4D, are configured to be in either the second boost output mode 194A, the second boost output mode 194B, the second boost output mode 194C, and the second boost output mode 194D, or the second boost output mode 202A, the second boost output mode 202B, the second boost output mode 202C, and the second boost output mode 202D, when the multi-level charge pump circuit 56 is configured to be in a second boost mode of operation, the first switch 86, the fourth switch 92, and the fifth switch 94 are configured to be closed such that charge from the supply input 24, ($V_{BAT}$), the first flying capacitor 100 and the second flying capacitor 102, arranged in series, is provided directly to the switching voltage output 26 via the charge pump output 64 in order to provide substantially $2\times V_{BAT}$ at the switching voltage output 26. The second switch 88, the third switch 90, the sixth switch 96, and the seventh switch 98 of the multi-level charge pump circuit 56 are configured to be open. In those embodiments of the multi-level charge pump circuit 56 that further include the eighth switch 118, the eighth switch 118 may also be configured to be open.

Advantageously, this permits the multi-level charge pump circuit 56 to provide either substantially $1.5\times V_{BAT}$ or substantially $2\times V_{BAT}$ at the switching voltage output 26 without the need for a charge pump output capacitor. Moreover, while some embodiments of the multi-level charge pump circuit 56 may include more than two flying capacitors or inductive components to provide boost voltage levels, some embodiments of the multi-level charge pump circuit 56 only include the first flying capacitor 100 and the second flying capacitor 102. Even more advantageously, some embodiments of the multi-level charge pump circuit 56 that further include an eighth switch 118, may provide an additional first output mode of operation to provide substantially $\frac{1}{2}\times V_{BAT}$ at the switching voltage output 26 using only the first flying capacitor 100 and the second flying capacitor 102.

Returning to FIG. 2A, an example embodiment of the parallel amplifier circuit 14A includes the parallel amplifier circuitry 32. The parallel amplifier circuitry 32 includes a parallel amplifier 35 and a parallel amplifier sense circuit 36. The parallel amplifier 35 generates the parallel amplifier output voltage, $V_{PARA\_AMP}$, at the parallel amplifier output 32A based on the difference between the compensated $V_{RAMP}$ signal, $V_{RAMP\_C}$, and the power amplifier supply voltage, $V_{CC}$. In addition, the parallel amplifier 35 outputs a parallel amplifier output current, $I_{PARA\_AMP}$. The parallel amplifier sense circuit 36 may include one or more current mirror circuits that are in communication with the parallel amplifier 35 depending upon the operational blocks included in the example embodiment of the parallel amplifier circuit 14A. Based upon the parallel amplifier output current, $I_{PARA\_AMP}$, the parallel amplifier sense circuit 36 generates a scaled parallel amplifier output current estimate, $I_{PARA\_AMP\_SENSE}$, which provides an indication of the parallel amplifier output current, $I_{PARA\_AMP}$. In those embodiments of the parallel amplifier circuit 14A that include an open loop assist circuit 39, the scaled parallel amplifier output current estimate, $I_{PARA\_AMP\_SENSE}$, is combined with the scaled open loop assist circuit output current estimate, $I_{ASSIST\_SENSE}$, from the open loop assist circuit 39 to generate the parallel amplifier circuit output current estimate 40, $I_{PAWA\_OUT\_EST}$, which is provided to the multi-level charge pump buck converter 12A. However, in those embodiments of the parallel amplifier circuit 14A that do not include an open loop assist circuit 39, only the scaled parallel amplifier output current estimate, $I_{PARA\_AMP\_SENSE}$, may be provided as a contribution to form the parallel amplifier circuit output current estimate 40, $I_{PAWA\_OUT\_EST}$, provided to the multi-level charge pump buck converter 12A. In addition, as depicted in FIG. 2A, in those embodiments of the parallel amplifier circuit 14A that include a parallel amplifier output impedance compensation circuit 37, a copy of the scaled parallel amplifier output current estimate, $I_{PARA\_AMP\_SENSE}$, is provided to the parallel amplifier output impedance compensation circuit 37. However, in those embodiments of the parallel amplifier circuit 14A that do not include a parallel amplifier output impedance compensation circuit 37, the parallel amplifier sense circuit 36 is configured to only provide the scaled parallel amplifier output current estimate, $I_{PARA\_AMP\_SENSE}$, as a contribution to the formation of the parallel amplifier circuit output current estimate 40, $I_{PAWA\_OUT\_EST}$, provided to the multi-level charge pump buck converter 12A.

Figure 12A:
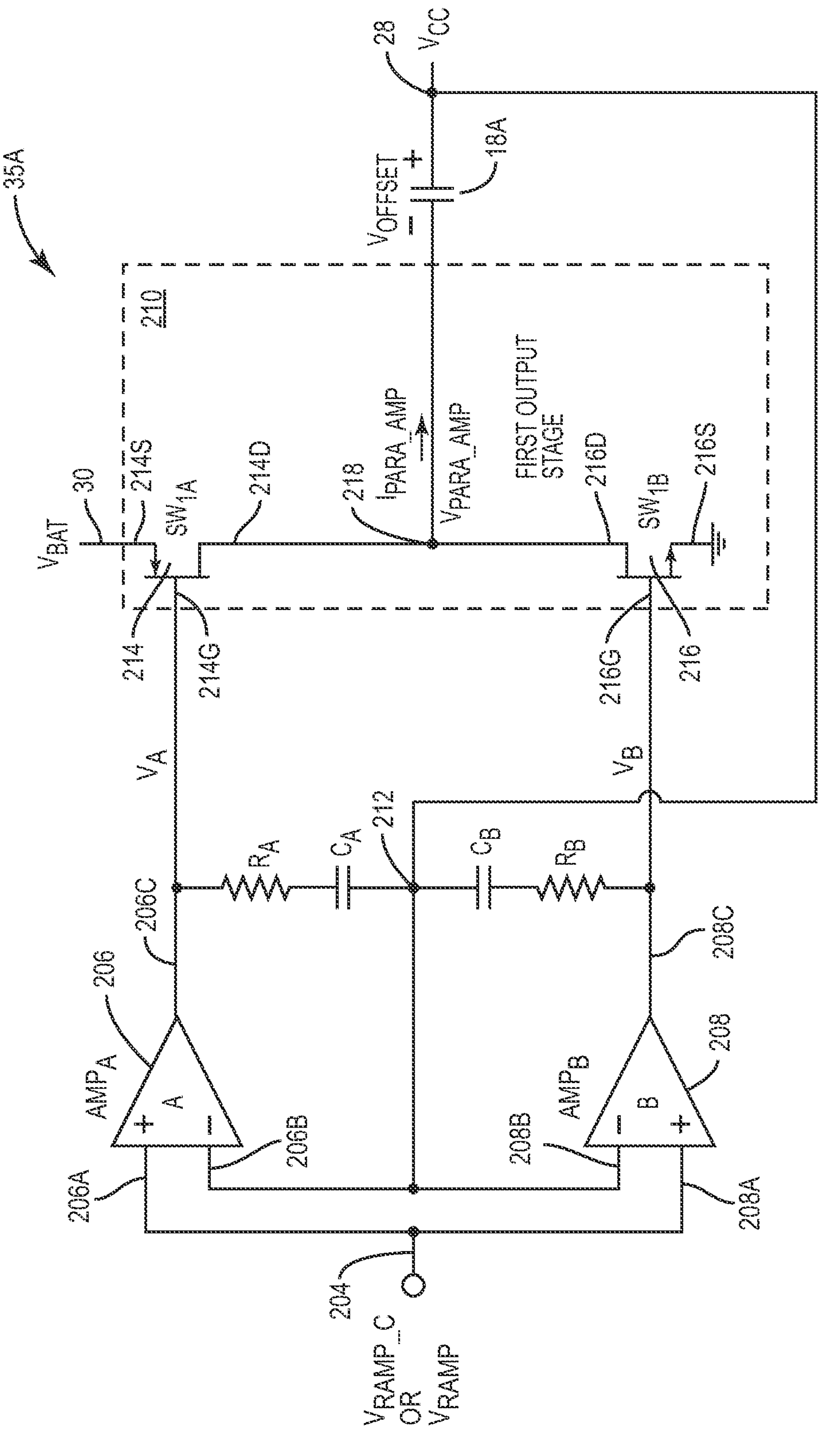
FIG. 12A depicts one embodiment of a parallel amplifier used in a pseudo-envelope follower power management system.

FIG. 12A depicts one embodiment of the parallel amplifier 35 as the parallel amplifier 35A. The parallel amplifier 35A depicts one embodiment of an AB class amplifier. The parallel amplifier 35A includes a parallel amplifier input voltage 204, a first amplifier, $AMP_A$, 206, the second amplifier 208, $AMP_B$, a first output stage 210, and an amplifier feedback node 212. The parallel amplifier input voltage 204 may be configured to receive either the $V_{RAMP}$ signal or the compensated $V_{RAMP}$ signal, $V_{RAMP\_C}$.

The first amplifier 206, $AMP_A$, includes a positive input terminal 206A, a negative input terminal 206B, and an output terminal 206C. Regarding the first amplifier 206, $AMP_A$, the positive input terminal 206A may be coupled to the parallel amplifier input voltage 204. The negative input terminal 206B may be coupled to the amplifier feedback node 212, which is coupled to the power amplifier supply voltage, $V_{CC}$. A first resistor, $R_A$, and a first capacitor, $C_A$, are arranged in series between the output terminal 206C and the amplifier feedback node 212. The first resistor, $R_A$, and the first capacitor, $C_A$, are a feedback network used to extend the operating bandwidth by compensating for the dominant pole introduced by the bypass capacitor capacitance, $C_{BYPASS}$, of the bypass capacitor 19. The feedback network may be configured to extend the modulation bandwidth of the first amplifier 206, $AMP_A$, out to approximately 30 MHz. The first amplifier 206, $AMP_A$, generates a first amplifier output voltage, $V_A$, at the output terminal 206C based upon the difference between the parallel amplifier input voltage 204 appearing at the positive input terminal 206A and the power amplifier supply voltage, $V_{CC}$, appearing at the negative input terminal 206B.

Regarding the second amplifier 208, $AMP_B$, the positive input terminal 208A may be coupled to the parallel amplifier input voltage 204. The negative input terminal 208B may be coupled to the amplifier feedback node 212, which is coupled to the power amplifier supply voltage, $V_{CC}$. A second resistor, $R_B$, and a second capacitor, $C_B$, are arranged in series between the output terminal 208C and the amplifier feedback node 212. The second resistor, $R_B$, and the second capacitor, $C_B$, are a feedback network used to extend the operating bandwidth by compensating for the dominant pole introduced by the bypass capacitor capacitance, $C_{BYPASS}$, of the bypass capacitor 19. The feedback network may be configured to extend the modulation bandwidth of the second amplifier 208, $AMP_B$, out to approximately 30 MHz. The second amplifier 208, $AMP_B$, generates a second amplifier output voltage, $V_B$, at the output terminal 208C based upon the difference between the parallel amplifier input voltage 204 appearing at the positive input terminal 208A and the power amplifier supply voltage, $V_{CC}$, appearing at the negative input terminal 208B.

The first output stage 210 includes a first switching element, $SW_{1A}$, 214 and a second switching element, $SW_{1B}$, 216. As a non limiting example, some embodiments of the first switching element, $SW_{1A}$, 214 and the second switching element, $SW_{1B}$, 216, may be a solid state based switch such as a field effect transistor, an insulator-on-semiconductor based transistor, or a bipolar based transistor. These transistors may operate mainly in Class-AB mode, thus near to linear operation, even though the transistors are referred to as switches. In one example embodiment, the first switching element 214, $SW_{1A}$, may be a PFET device having a drain 214D, a gate 214G, and a source 214S. Likewise, the second switching element 216, $SW_{1B}$, may be an NFET device having a drain 216D, a gate 216G, and a source 216S.

The source 214S of the first switching element 214, $SW_{1A}$, may be coupled to the parallel amplifier supply input 30, ($V_{BAT}$), of the multi-level charge pump buck converter 12. The drain 214D of the first switching element 214, $SW_{1A}$, may be coupled to the drain 216D of the second switching element 216, $SW_{1B}$, to form a parallel amplifier output node 218 that provides the parallel amplifier output voltage, $V_{PARA\_AMP}$, of the parallel amplifier 35A. The source 216S of the second switching element 216, $SW_{1B}$, may be coupled to ground.

The gate 214G of the first switching element 214, $SW_{1A}$, may be coupled to the output terminal 206C of the first amplifier 206, $AMP_A$, in order to receive the first amplifier output voltage, $V_A$. Similarly, the gate 216G of the second switching element 216, $SW_{1B}$, may be coupled to the output terminal 208C of the second amplifier 208, $AMP_B$, in order to receive the second amplifier output voltage, $V_B$.

The parallel amplifier 35A may be configured to source from the parallel amplifier output node 218 and sink current to the parallel amplifier output node 218 based upon the difference between the parallel amplifier input voltage 204 (either $V_{RAMP}$ or $V_{RAMP\_C}$) and the power amplifier supply voltage, $V_{CC}$. For example, when the power inductor current, $I_{SW\_OUT}$, delivered by the power inductor 16 and the bypass capacitor current, $I_{BYPASS\_CAP}$, delivered by the bypass capacitor capacitance, $C_{BYPASS}$, of the bypass capacitor 19 are insufficient to supply the output current, $I_{OUT}$, to the linear RF power amplifier 22, the parallel amplifier 35A turns on the first switching element 214, $SW_{1A}$, to provide additional current through the coupling capacitor 18A to the power amplifier supply output 28. However, when the power inductor current, $I_{SW\_OUT}$, delivered by the power inductor 16, and the bypass capacitor current, $I_{BYPASS\_CAP}$, from the bypass capacitor capacitance, $C_{BYPASS}$, of the bypass capacitor 19 exceed the desired level of output current, $I_{OUT}$, to be delivered to the linear RF power amplifier 22, the parallel amplifier 35A turns on the second switching element 216, $SW_{1B}$, to shunt the excess current provided to the power amplifier supply output 28 to ground.

In the case, as depicted in FIGS. 2A and 2B, where the parallel amplifier circuit 14A includes an open loop assist circuit 39 providing an open loop assist circuit current, $I_{ASSIST}$, the parallel amplifier 35A compensates for either an excess of current or the lack of current supplied to the power amplifier supply output 28. As an example, when the power inductor current, $I_{SW\_OUT}$, the open loop assist current, $I_{ASSIST}$, and the bypass capacitor current, $I_{BYPASS\_CAP}$, deliver less than the desired level of output current, $I_{OUT}$, to the linear RF power amplifier 22, the parallel amplifier 35 turns on the first switching element 214, $SW_{1A}$, to provide the additional current desired by the linear RF power amplifier 22. As another example, when the power inductor current, $I_{SW\_OUT}$, the open loop assist current, $I_{ASSIST}$, and the bypass capacitor current, $I_{BYPASS\_CAP}$, deliver excess current to the power amplifier supply output 28, the parallel amplifier 35A turns on the second switching element 216, $SW_{1B}$, such that the excess current is shunted to ground.

Figure 12B:
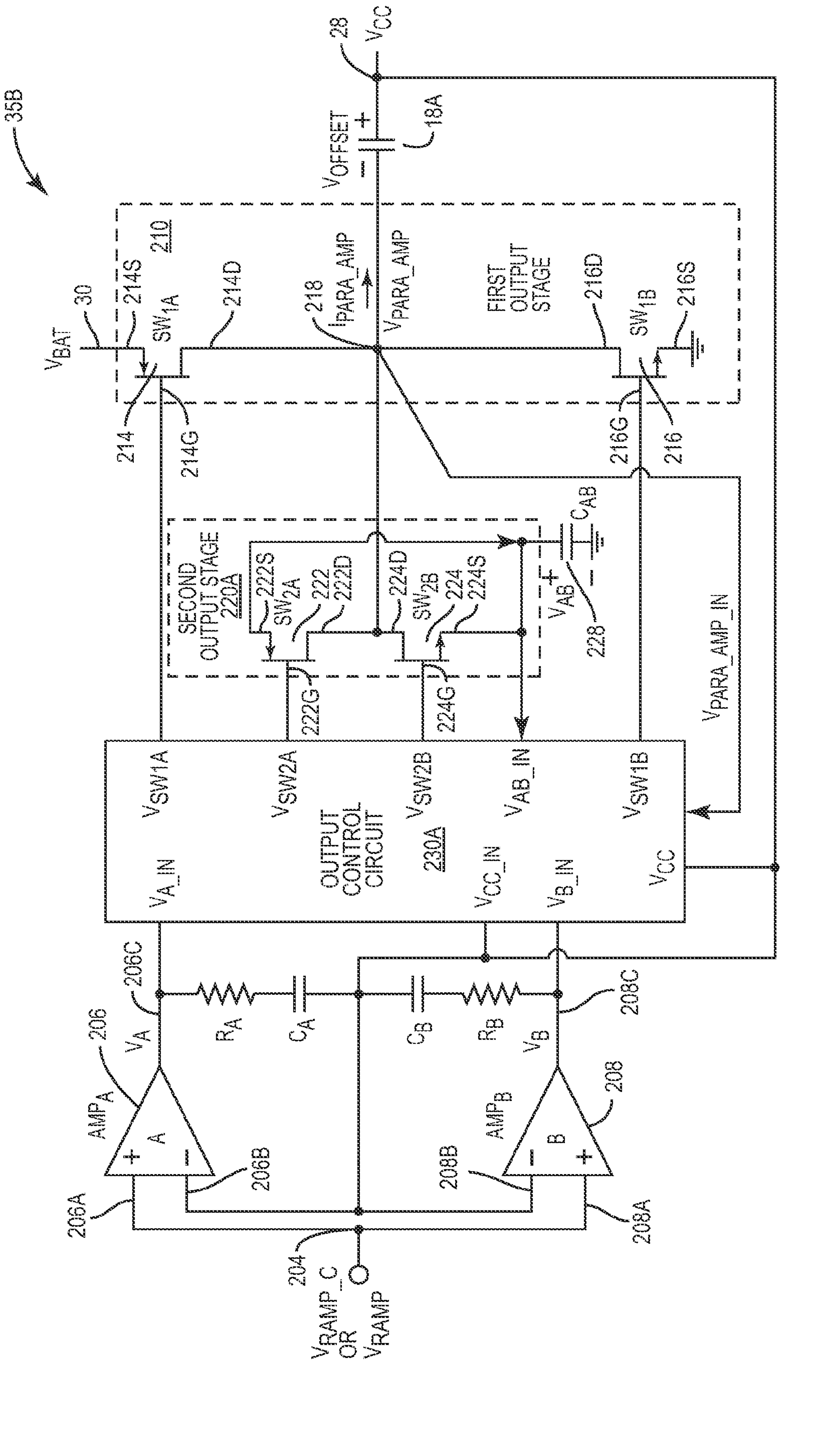
FIG. 12B depicts one embodiment of a rechargeable parallel amplifier used in a pseudo-envelope follower power management system.

FIG. 12B depicts another embodiment of the parallel amplifier 35 as the rechargeable parallel amplifier 35B. Unlike the parallel amplifier 35A of FIG. 12A, the rechargeable parallel amplifier 35B includes a second output stage 220A, a charge conservation capacitor, $C_{AB}$, and an output control circuit 230A.

The second output stage 220A includes a first switching element 222, $SW_{2A}$, and a second switching element 224, $SW_{2B}$. As a non limiting example, some embodiments of the first switching element 222, $SW_{2A}$, and the second switching element 224, $SW_{2B}$, may be a solid state based switch such as a field effect transistor, an insulator-on-semiconductor transistor, or a bipolar based transistor. These transistors operate mainly in Class-AB mode, thus near to linear operation, even though the transistors are referred to as switches. In one example embodiment, the first switching element 222, $SW_{2A}$, may be a PFET device having a drain 222D, a gate 222G, and a source 222S. Likewise, the second switching element 224, $SW_{2B}$, may be an NFET device having a drain 224D, a gate 224G, and a source 224S.

The source 222S of the first switching element 222, $SW_{2A}$, may be coupled to the charge conservation capacitor, $C_{AB}$. The drain 222D of the first switching element 222, $SW_{2A}$, and the drain 224D of the second switching element 224, $SW_{2B}$, may be coupled to the parallel amplifier output node 218 to provide the parallel amplifier output voltage, $V_{PARA\_AMP}$, of the rechargeable parallel amplifier 35B. The source 224S of the second switching element 224, $SW_{2B}$, may be coupled to the charge conservation capacitor, $C_{AB}$. As will be explained in further detail below, when the second switching element 224, $SW_{2B}$, of the second output stage 220A may be turned on to sink excess current provided to the power amplifier supply output 28, charge is stored on the charge conservation capacitor, $C_{AB}$, to generate a saved charge voltage, $V_{AB}$. Similarly, when insufficient current is provided to the power amplifier supply output 28, the first switching element 222, $SW_{2A}$, may be turned on to provide additional current to the power amplifier supply output 28 from the charge conservation capacitor, $C_{AB}$.

In order to operate in the linear mode of operation, the range of operation of the first switching element 222, $SW_{2A}$, and the second switching element 224, $SW_{2B}$, must take into consideration a minimum headroom voltage, $V_{HEADROOM}$, of each device. As an example, the first switching element 222, $SW_{2A}$, may operate in the linear mode provided the parallel amplifier output node 218 that provides the parallel amplifier output voltage, $V_{PARA\_AMP}$, is less than the saved charge voltage, $V_{AB}$, minus the minimum headroom voltage, $V_{HEADROOM}$. Similarly, the second switching element 224, $SW_{2B}$, may operate in the linear mode provided the parallel amplifier output node 218 that provides the parallel amplifier output voltage, $V_{PARA\_AMP}$, is greater than the saved charge voltage, $V_{AB}$, plus the minimum headroom voltage, $V_{HEADROOM}$.

The output control circuit 230A includes a $V_A$ input, $V_{A\_IN}$, a $V_B$ input, $V_{B\_IN}$, a $V_{AB}$ input, $V_{AB\_IN}$, and a $V_{PARA\_AMP}$ input, $V_{PARA\_AMP\_IN}$. The $V_A$ input, $V_{A\_IN}$, may be coupled to the output terminal 206C of the first amplifier 206, $AMP_A$, to receive the first amplifier output voltage, $V_A$. The $V_B$ input, $V_{B\_IN}$, may be coupled to the output terminal 208C of the second amplifier 208, $AMP_B$, to receive the second amplifier output voltage, $V_B$. The $V_{PARA\_AMP}$ input, $V_{PARA\_AMP\_IN}$, may be coupled to the parallel amplifier output node 218 to receive the parallel amplifier output voltage, $V_{PARA\_AMP}$. The $V_{AB}$ input, $V_{AB\_IN}$, may be coupled to the saved charge voltage, $V_{AB}$.

The output control circuit 230A may include a first switch control output, $V_{SW1A}$, a second switch control output, $V_{SW2A}$, a third switch control output, $V_{SW2B}$, and a fourth switch control output, $V_{SW1B}$. The first switch control output, $V_{SW1A}$, may be coupled to the gate 214G of the first switching element 214, $SW_{1A}$. The second switch control output, $V_{SW2A}$, may be coupled to the gate 222G of the first switching element 222, $SW_{2A}$. The third switch control output, $V_{SW2B}$, may be coupled to the gate 224G of the second switching element 224, $SW_{2B}$. The fourth switch control output, $V_{SW1B}$, may be coupled to the gate 216G of the second switching element 216, $SW_{1B}$.

The output control circuit 230A selectively couples the $V_A$ input, $V_{A\_IN}$, to either the first switch control output, $V_{SW1A}$, or the second switch control output, $V_{SW2A}$, based upon the minimum headroom voltage, $V_{HEADROOM}$, the saved charge voltage, $V_{AB}$, and the parallel amplifier output voltage, $V_{PARA\_AMP}$. For example, when the parallel amplifier output voltage, $V_{PARA\_AMP}$, is greater than the saved charge voltage, $V_{AB}$, minus the minimum headroom voltage, $V_{HEADROOM}$, the output control circuit 230A couples the $V_A$ input, $V_{A\_IN}$, to the first switch control output, $V_{SW1A}$, of the first output stage 210 and sets the second switch control output, $V_{SW2A}$, to disable the second switching element 224, $SW_{2A}$, of the second output stage 220A. As an example, the output control circuit 230A may pull up the second switch control output, $V_{SW2A}$, to the saved charge voltage, $V_{AB}$. As a result, the first amplifier output voltage, $V_A$, is coupled to the gate 214G of the first switching element 214, $SW_{1A}$, of the first output stage 210.

However, when the parallel amplifier output voltage, $V_{PARA\_AMP}$, is less than or equal to the saved charge voltage, $V_{AB}$, minus the minimum headroom voltage, $V_{HEADROOM}$, the output control circuit 230A couples the $V_A$ input, $V_{A\_IN}$, to the second switch control output, $V_{SW2A}$, and sets the first switch control output, $V_{SW\,1A}$, to disable the first switching element 214, $SW_{1A}$, of the first output stage 210. As an example, the output control circuit 230A may pull up the first switch control output, $V_{SW1A}$, to the parallel amplifier supply input 30, ($V_{BAT}$). As a result, the first amplifier output voltage, $V_A$, is coupled to the gate 222G of the first switching element 222, $SW_{2A}$, of the second output stage 220A.

The output control circuit 230A also selectively couples the $V_B$ input, $V_{B\_IN}$, to either the third switch control output, $V_{SW2B}$, or the fourth switch control output, $V_{SW1B}$, based upon the minimum headroom voltage, $V_{HEADROOM}$, the saved charge voltage, $V_{AB}$, and the parallel amplifier output voltage, $V_{PARA\_AMP}$. For example, when the parallel amplifier output voltage, $V_{PARA\_AMP}$, is greater than the saved charge voltage, $V_{AB}$, plus the minimum headroom voltage, $V_{HEADROOM}$, the output control circuit 230A couples the $V_B$ input, $V_{B\_IN}$, to the third switch control output, $V_{SW2B}$, and sets the fourth switch control output, $V_{SW1B}$, to disable the second switching element 216, $SW_{1B}$. As an example, the output control circuit 230A may pull down the fourth switch control output, $V_{SW1B}$, to ground. As a result, the second amplifier output voltage, $V_B$, is coupled to the gate 224G of the second switching element 224, $SW_{2B}$, of the second output stage 220A.

However, when the parallel amplifier output voltage, $V_{PARA\_AMP}$, is less than or equal to the saved charge voltage, $V_{AB}$, plus the minimum headroom voltage, $V_{HEADROOM}$, the output control circuit 230A couples the fourth switch control output, $V_{SW1B}$, to the $V_B$ input, $V_{B\_IN}$, and sets the third switch control output, $V_{SW2B}$, to disable the second switching element 224, $SW_{2B}$. As an example, the output control circuit 230A may pull down the third switch control output, $V_{SW2B}$, to ground.

Figure 12C:
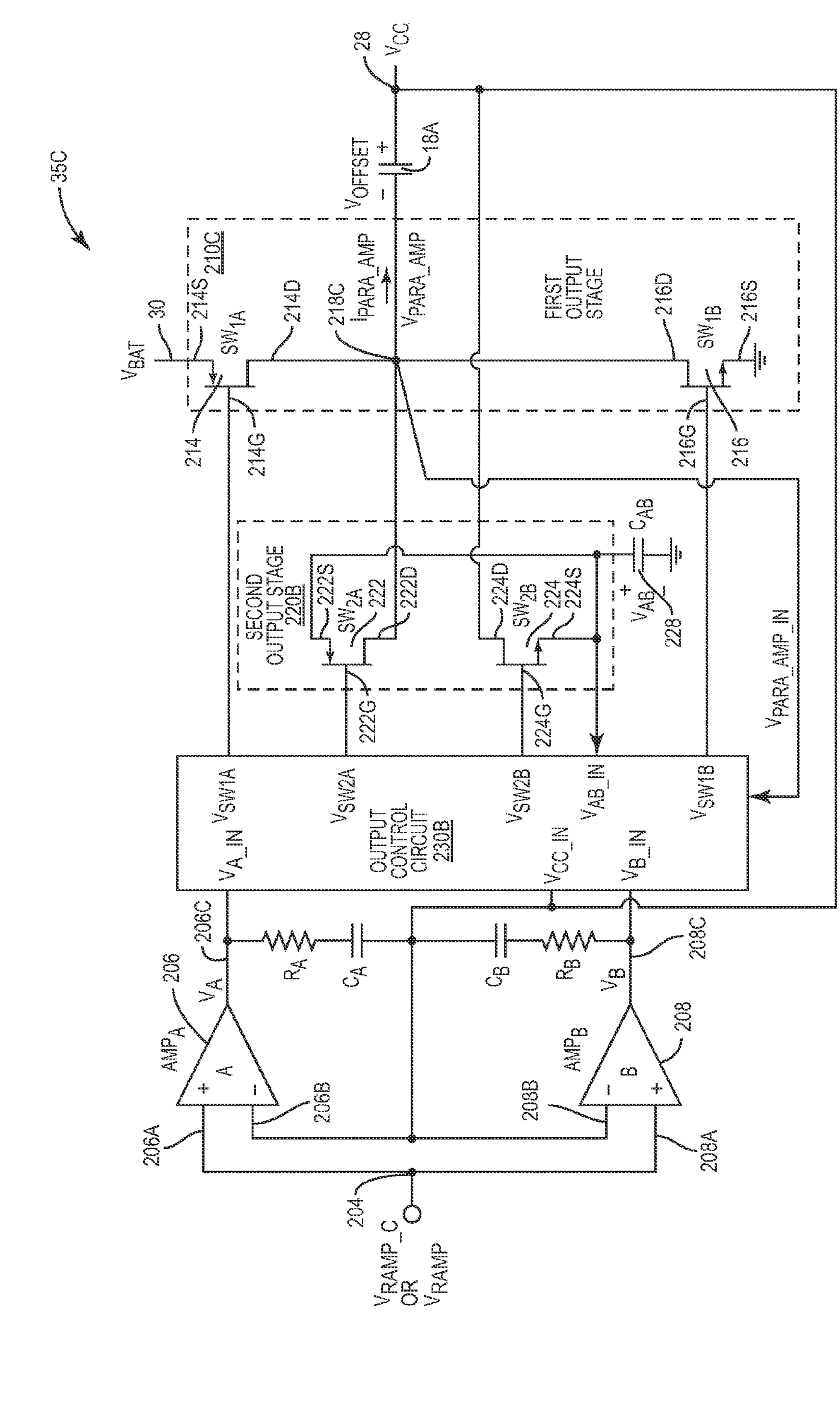
FIG. 12C depicts another embodiment of a rechargeable parallel amplifier used in a pseudo-envelope follower power management system.

FIG. 12C depicts another embodiment of the parallel amplifier 35 as the rechargeable parallel amplifier 35C. The rechargeable parallel amplifier 35C of FIG. 12C is similar to the rechargeable parallel amplifier 35B of FIG. 12B. However, unlike rechargeable parallel amplifier 35B, rechargeable parallel amplifier 35C includes an output control circuit 230B instead of the output control circuit 230A and a second output stage 220B instead of the second output stage 220A. The output control circuit 230B further includes a $V_{CC}$ input, $V_{CC\_IN}$, that is coupled to the power amplifier supply output 28 in order to receive the power amplifier supply voltage, $V_{CC}$. In addition, unlike rechargeable parallel amplifier 35B, in the rechargeable parallel amplifier 35C, the drain 224D of the second switching element 224, $SW_{2B}$, is coupled to the power amplifier supply output 28 instead of being coupled to the parallel amplifier output node 218, which is now labeled as the parallel amplifier output node 218C. Furthermore, as will be explained, the operation of the output control circuit 230B is different from the operation of output control circuit 230A in order to accommodate the coupling of the drain 224D of the second switching element, $SW_{2B}$, 224 to the power amplifier supply output 28.

Similar to the rechargeable parallel amplifier 35B, the rechargeable parallel amplifier 35C must also take into consideration the minimum headroom voltage, $V_{HEADROOM}$, of the first switching element 222, $SW_{2A}$, and the second switching element 224, $SW_{2B}$, in order to assure the first switching element 222, $SW_{2A}$, and the second switching element 224, $SW_{2B}$, operate in the linear mode. However, because the drain 224D of the second switching element 224, $SW_{2B}$ is coupled to the power amplifier supply output 28, the power amplifier supply voltage, $V_{CC}$, must also be considered.

Similar to the rechargeable parallel amplifier 35B, the first switching element 222, $SW_{2A}$, of the rechargeable parallel amplifier 35C may operate in the linear mode provided the parallel amplifier output node 218C that provides the parallel amplifier output voltage, $V_{PARA\_AMP}$, is less than the saved charge voltage, $V_{AB}$, minus the minimum headroom voltage, $V_{HEADROOM}$. However, unlike the rechargeable parallel amplifier 35B, the second switching element 224, $SW_{2B}$, of the rechargeable parallel amplifier 35C may operate in the linear mode provided the power amplifier supply voltage, $V_{CC}$, is greater than the saved charge voltage, $V_{AB}$, plus the minimum headroom voltage, $V_{HEADROOM}$. Because the power amplifier supply voltage, $V_{CC}$, tends to be higher than the parallel amplifier output voltage, $V_{PARA\_AMP}$, the rechargeable parallel amplifier 35C may store additional charge on the charge conservation capacitor, $C_{AB}$, which increases the charge voltage, $V_{AB}$. As a result, the operating range of the first switching element 222, $SW_{2A}$, is also increased.

Similar to the output control circuit 230A of FIG. 12B, the output control circuit 230B of FIG. 12C selectively couples the $V_A$ input, $V_{A\_IN}$, to either the first switch control output, $V_{SW1A}$, or the second switch control output, $V_{SW2A}$, based upon the minimum headroom voltage, $V_{HEADROOM}$, the saved charge voltage, $V_{AB}$, and the parallel amplifier output voltage, $V_{PARA\_AMP}$. For example, when parallel amplifier output voltage, $V_{PARA\_AMP}$, is greater than the saved charge voltage, $V_{AB}$, minus the minimum headroom voltage, $V_{HEADROOM}$, the output control circuit 230B couples the $V_A$ input, $V_{A\_IN}$, to the first switch control output, $V_{SW1A}$, and sets the second switch control output, $V_{SW2A}$, to disable the first switching element 222, $SW_{2A}$, of the second output stage 220B. As an example, the output control circuit 230B may pull up the second switch control output, $V_{SW2A}$, to the saved charge voltage, $V_{AB}$. As a result, the first amplifier output voltage, $V_A$, is coupled to the gate 214G of the first switching element 214, $SW_{1A}$, of the first output stage 210C.

However, when the parallel amplifier output voltage, $V_{PARA\_AMP}$, is less than or equal to the saved charge voltage, $V_{AB}$, minus the minimum headroom voltage, $V_{HEADROOM}$, the output control circuit 230B couples the $V_A$ input, $V_{A\_IN}$, to the second switch control output, $V_{SW2A}$, of the second output stage 220B and sets the first switch control output, $V_{SW1A}$, to disable the first switching element 214, $SW_{1A}$, of the first output stage 210C. As an example, the output control circuit 230B may pull up the first switch control output, $V_{SW1A}$, to the parallel amplifier supply input 30, ($V_{BAT}$). As a result, the first amplifier output voltage, $V_A$, is coupled to the gate 222G of the first switching element 222, $SW_{2A}$, of the second output stage 220B.

However, different from the output control circuit 230A, the output control circuit 230B also selectively couples the $V_B$ input, $V_{B\_IN}$, to either the third switch control output, $V_{SW2B}$, or the fourth switch control output, $V_{SW1B}$, based upon the minimum headroom voltage, $V_{HEADROOM}$, the saved charge voltage, $V_{AB}$, and the power amplifier supply voltage, $V_{CC}$. For example, when the power amplifier supply voltage, $V_{CC}$, is greater than the saved charge voltage, $V_{AB}$, plus the minimum headroom voltage, $V_{HEADROOM}$, the output control circuit 230B couples the $V_B$ input, $V_{B\_IN}$, to the third switch control output, $V_{SW2B}$, and sets the fourth switch control output, $V_{SW1B}$, to disable the second switching element 216, $SW_{1B}$. As an example, the output control circuit 230B may pull down the fourth switch control output, $V_{SW1B}$, to ground. As a result, the second amplifier output voltage, $V_B$, is coupled to the gate 224G of the second switching element 224, $SW_{2B}$, of the second output stage 220B.

However, when the power amplifier supply voltage, $V_{CC}$, is less than or equal to the saved charge voltage, $V_{AB}$, plus the minimum headroom voltage, $V_{HEADROOM}$, the output control circuit 230B couples the fourth switch control output, $V_{SW1B}$, to the $V_B$ input, $V_{B\_IN}$, and sets the third switch control output, $V_{SW2B}$, to disable the second switching element 224, $SW_{2B}$. As an example, the output control circuit 230B may pull down the third switch control output, $V_{SW2B}$, to ground. As a result, the second amplifier output voltage, $V_B$, is coupled to the gate 216G of the second switching element 216, $SW_{1B}$, of the first output stage 210C.

While the embodiments of the parallel amplifier 35A, the rechargeable parallel amplifier 35B, and the rechargeable parallel amplifier 35C of FIGS. 12A, FIG. 12B, and FIG. 12C, respectively, depict that the source 214S of the first switching element 214, $SW_{1A}$, of the first output stages 210 and 210C are coupled to parallel amplifier supply input 30, ($V_{BAT}$), this is by way of illustration and non-limiting. In some embodiments, the supply voltage provided to the parallel amplifier 35A, rechargeable parallel amplifier 35B, and the rechargeable parallel amplifier 35C of FIGS. 12A, FIG. 12B, and FIG. 12C, may be provided by a separate power supply not depicted herein. The separate power supply may provide other voltage levels to power or bias the respective parallel amplifier 35A, rechargeable parallel amplifier 35B, and the rechargeable parallel amplifier 35C. As a non-limiting example, the separate power supply may provide a parallel amplifier supply voltage substantially equal to $2\times V_{BAT}$. Accordingly, in these example embodiments of the parallel amplifier 35A, the rechargeable parallel amplifier 35B, and the rechargeable parallel amplifier 35C, source 214S of the first switching element 214, $SW_{1A}$, of the first output stage 210 may be coupled to the parallel amplifier supply voltage substantially equal to $2\times V_{BAT}$.

As an example, discussed relative to FIGS. 18A-D, FIG. 12D depicts one embodiment of a parallel amplifier 35D, similar to the parallel amplifier 35A, that is configured to use a parallel amplifier supply voltage, $V_{SUPPLY\_PARA\_AMP}$. In some embodiments, the parallel amplifier supply voltage, $V_{SUPPLY\_PARA\_AMP}$, may be configured to come from various power supply voltage generation circuits depending upon the needs of the linear RF power amplifier 22. As depicted in FIGS. 18A-D, the parallel amplifier supply voltage, $V_{SUPPLY\_PARA\_AMP}$, may be provided by a μC charge pump circuit 262 or by the multi-level charge pump circuit 258 of multi-level charge pump buck converter 12C. In addition, as discussed below, in some embodiments of the μC charge pump circuit 262, the μC charge pump circuit 262 generates a μC charge pump output voltage, $V_{\mu C\_OUT}$, that may be configured to provide various voltage levels dependent upon the mode of operation of the μC charge pump circuit 262.

Figure 12D:
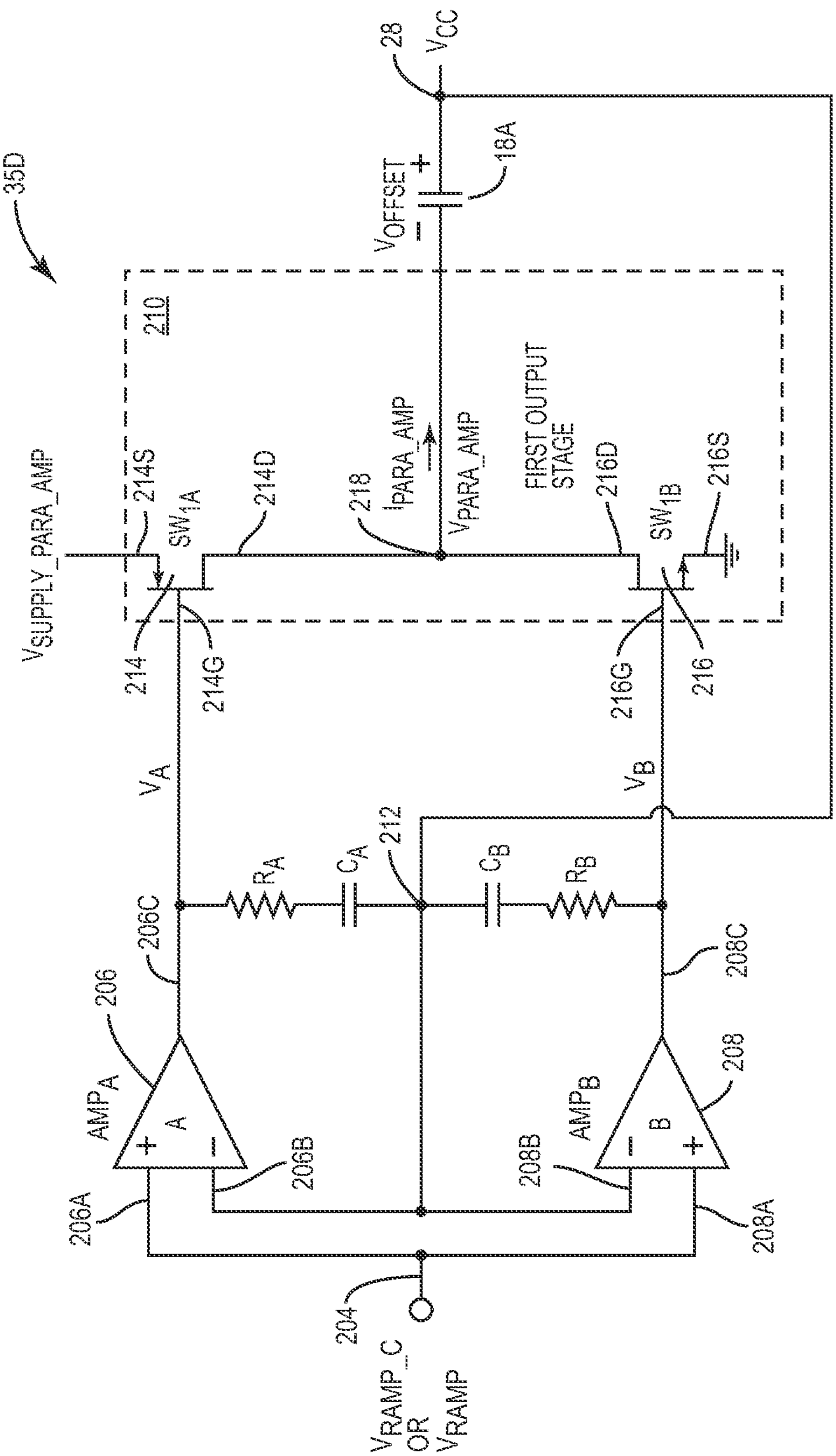
FIG. 12D depicts one embodiment of a parallel amplifier used in a pseudo-envelope follower power management system.
Figure 12E:
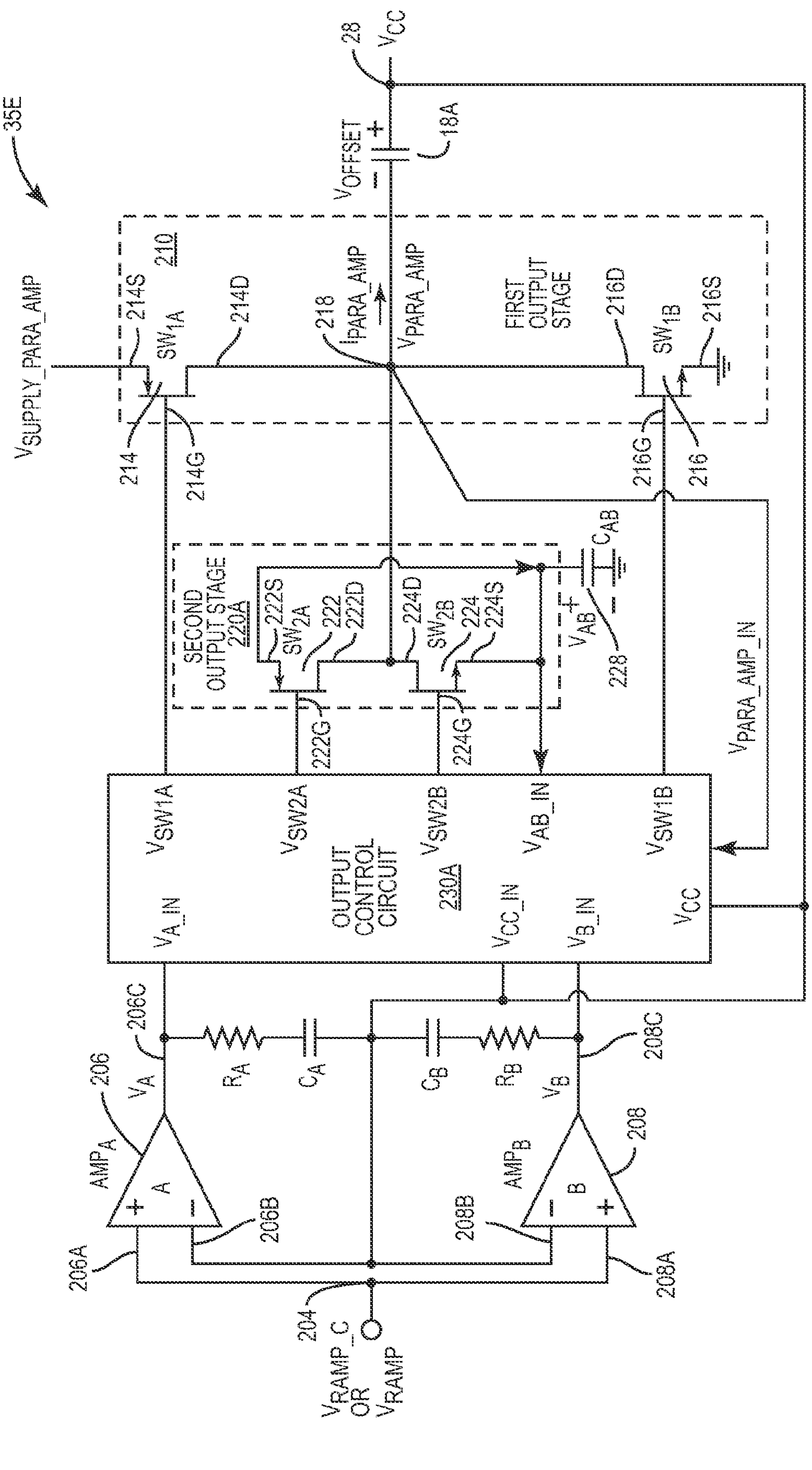
FIG. 12E depicts another embodiment of a rechargeable parallel amplifier used in a pseudo-envelope follower power management system.
Figure 12F:
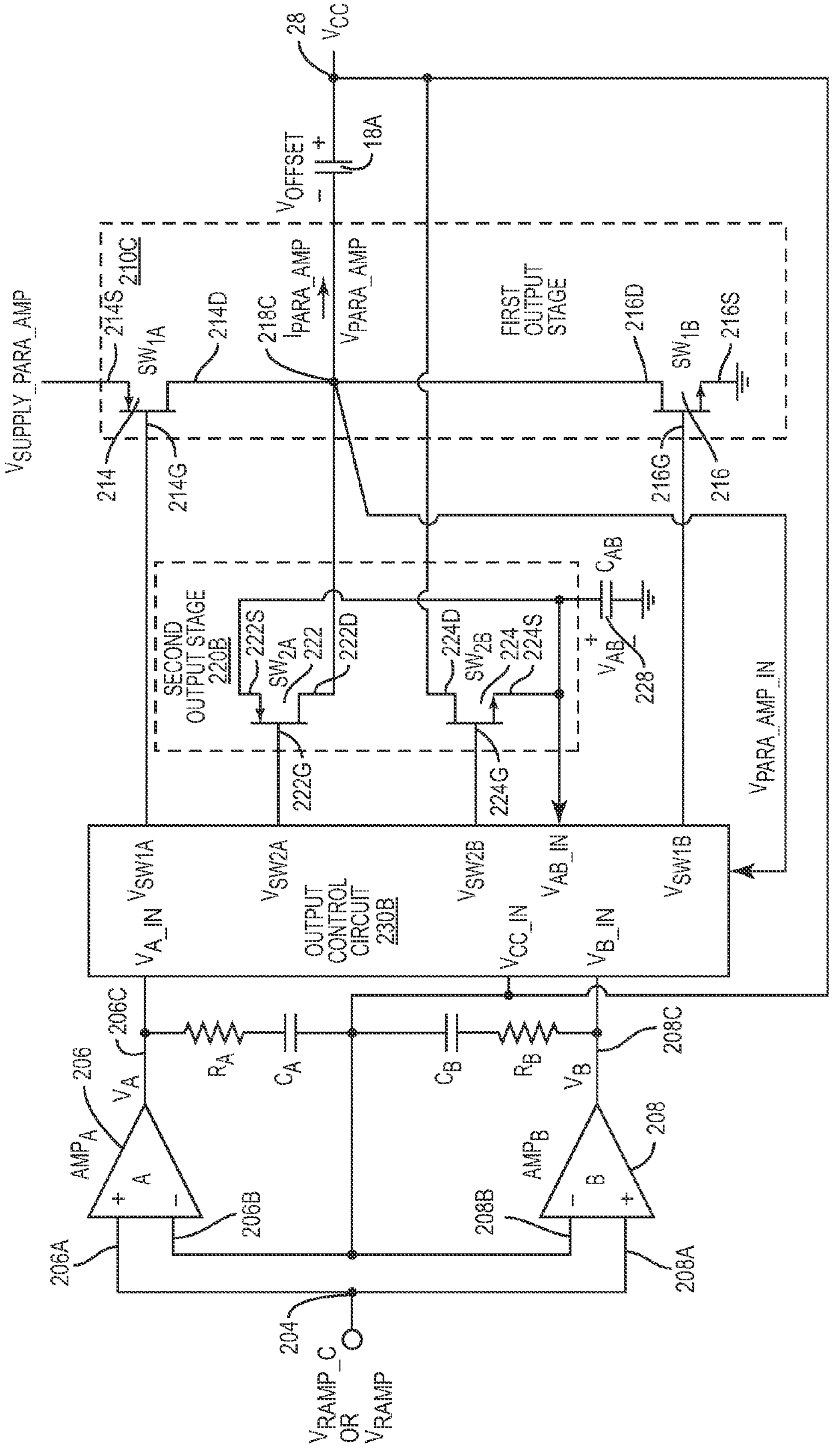
FIG. 12F depicts another embodiment of a rechargeable parallel amplifier used in a pseudo-envelope follower power management system.

As depicted in FIG. 12D, unlike the parallel amplifier 35A of FIG. 12A, the parallel amplifier 35D may be configured to use the parallel amplifier supply voltage, $V_{SUPPLY\_PARA\_AMP}$, instead of the parallel amplifier supply input 30, ($V_{BAT}$), provided by the battery 20. The parallel amplifier supply voltage, $V_{SUPPLY\_PARA\_AMP}$, may be a discrete ratio of the parallel amplifier supply input 30, ($V_{BAT}$), provided by the battery 20. In other embodiments, however, the voltage level provided by the parallel amplifier supply voltage, $V_{SUPPLY\_PARA\_AMP}$, may be programmatically selected depending upon the operational conditions of the mobile device or pseudo-envelope follower power management system.

For example, as depicted in FIG. 12D, the source 214S of the first switching element 214, $SW_{1A}$, may be coupled to the parallel amplifier supply voltage, $V_{SUPPLY\_PARA\_AMP}$. Although not depicted in FIG. 12D, the circuitry associated with the first amplifier 206, $AMP_A$, and the second amplifier 208, $AMP_B$, may also be supplied by the parallel amplifier supply voltage, $V_{SUPPLY\_PARA\_AMP}$.

As another example, FIG. 12E depicts an embodiment of the rechargeable parallel amplifier 35E that is similar to the rechargeable parallel amplifier 35B depicted in FIG. 12B. Unlike the rechargeable parallel amplifier 35B, the rechargeable parallel amplifier 35E is configured to use the parallel amplifier supply voltage, $V_{SUPPLY\_PARA\_AMP}$, instead of the parallel amplifier supply input 30, ($V_{BAT}$), provided by the battery 20.

Accordingly, unlike the rechargeable parallel amplifier 35B, the rechargeable parallel amplifier 35E is configured such that the source 214S of the first switching element 214, $SW_{1A}$, is coupled to the parallel amplifier supply voltage, $V_{SUPPLY\_PARA\_AMP}$. Similar to the parallel amplifier 35D of FIG. 12D, the rechargeable parallel amplifier 35E may also be reconfigured to use the parallel amplifier supply voltage, $V_{SUPPLY\_PARA\_AMP}$, as the supply voltage of the first amplifier 206, $AMP_A$, the second amplifier 208, $AMP_B$, and the output control circuit 230A.

FIG. 12F depicts another embodiment of the rechargeable parallel amplifier 35C, of FIG. 12C, as a rechargeable parallel amplifier 35F. Similar to the parallel amplifier 35D, depicted in FIG. 12D, and the rechargeable parallel amplifier 35E, depicted in FIG. 12E, the rechargeable parallel amplifier 35F is configured to use the parallel amplifier supply voltage, $V_{SUPPLY\_PARA\_AMP}$, instead of the parallel amplifier supply input 30, ($V_{BAT}$), supplied by the battery 20. Also similar to the parallel amplifier 35D and the rechargeable parallel amplifier 35E, rechargeable parallel amplifier 35F may be configured such that the source 214S of the first switching element 214, $SW_{1A}$, may be coupled to the parallel amplifier supply voltage, $V_{SUPPLY\_PARA\_AMP}$, instead of the parallel amplifier supply input 30, ($V_{BAT}$). Also similar to the rechargeable parallel amplifier 35E, depicted in FIG. 12E, the first amplifier 206, $AMP_A$, the second amplifier 208, $AMP_B$, and the output control circuit 230B may also be further configured to use the parallel supply voltage, $V_{SUPPLY\_PARA\_AMP}$, as a supply source instead of the parallel amplifier supply input 30, ($V_{BAT}$).

Returning to FIG. 2A, the open loop assist circuit 39 will now be discussed. As discussed above, the parallel amplifier circuit output current, $I_{PAWA\_OUT}$, may be a combination of the parallel amplifier output current $I_{PARA\_AMP}$, and the open loop assist circuit, $I_{ASSIST}$. The open loop assist circuit 39 may be used to reduce the amount of current that the parallel amplifier 35 of the parallel amplifier circuitry 32 may need to source and sink in order to regulate the power amplifier supply voltage, $V_{CC}$. In particular, the parallel amplifier 35 may sink excess power inductor current, $I_{SW\_OUT}$, which may generate a large voltage ripple on the power amplifier supply voltage, $V_{CC}$. The large voltage ripple on the power amplifier supply voltage, $V_{CC}$, can be due to the interaction of the power inductor current, $I_{SW\_OUT}$, with the non-zero impedance of parallel amplifier 35 over frequency in the pass band of the pseudo-envelope follower power management system. The open loop assist current, $I_{ASSIST}$, provided by the open loop assist circuit 39 can be configured to reduce the parallel amplifier output current, $I_{PARA\_AMP}$, sourced or sunk by the parallel amplifier 35, which may reduce the ripple voltage on the power amplifier supply voltage, $V_{CC}$, because the non-zero output impedance of the parallel amplifier 35 is convoluted with less current.

One embodiment of the open loop assist circuit 39 may be configured to receive an estimated power inductor inductance parameter, $L_{EST}$, and a minimum power amplifier turn on a voltage parameter, $V_{OFFSET\_PA}$, an estimated bypass capacitor capacitance parameter, $C_{BYPASS\_EST}$, and an estimated power amplifier transconductance parameter, $K\_I_{OUT\_EST}$.

The estimated power inductor inductance parameter, $L_{EST}$, may be either the measured or estimated inductance of the power inductor 16 between a specific range of frequencies. For example, the estimated power inductor inductance parameter, $L_{EST}$, may be either the measured or estimated inductance of the power inductor 16 between approximately 10 MHz and 30 MHz. The minimum power amplifier turn on voltage parameter, $V_{OFFSET\_PA}$, may be either the measured or estimated value of the minimum supply voltage at which the linear RF power amplifier 22 will begin to operate. The estimated bypass capacitor capacitance parameter, $C_{BYPASS\_EST}$, may be either the measured or estimate capacitance of the bypass capacitor capacitance, $C_{BYPASS}$, of the bypass capacitor 19 measured between a specific range of frequencies. For example, the estimated bypass capacitor capacitance parameter, $C_{BYPASS\_EST}$, may be either the measured or estimated capacitance of the bypass capacitor capacitance, $C_{BYPASS}$, of the bypass capacitor 19 between approximately 10 MHz and 30 MHz. The estimated power amplifier transconductance parameter, $K\_I_{OUT\_EST}$, may be either the measured or estimated transconductance of the linear RF power amplifier 22. Transconductance of the linear RF power amplifier 22 may be $1/R_{LOAD}$, where $R_{LOAD}$, is the estimated resistive load of the linear RF power amplifier 22. The estimated power amplifier transconductance parameter, $K\_I_{OUT\_EST}$, may be either the measured or estimated transconductance of the linear RF power amplifier 22 between a specific range of frequencies. For example, the estimated power amplifier transconductance parameter, $K\_I_{OUT\_EST}$, may be either the measured or estimated transconductance of the linear RF power amplifier 22 between approximately 10 MHz and 30 MHz.

The estimated power inductor inductance parameter, $L_{EST}$, the minimum power amplifier turn on voltage parameter, $V_{OFFSET\_PA}$, the estimated bypass capacitor capacitance parameter, $C_{BYPASS\_EST}$, and the estimated power amplifier transconductance parameter, $K\_I_{OUT\_EST}$ may be provided by the controller 50 through the control bus 44, as depicted in FIGS. 1A and 1B. Typically, values of the estimated power inductor inductance parameter, $L_{EST}$, the minimum power amplifier turn on the voltage parameter, $V_{OFFSET\_PA}$, the estimated bypass capacitor capacitance parameter, $C_{BYPASS\_EST}$, and the estimated power amplifier transconductance parameter, $K\_I_{OUT\_EST}$, are obtained at calibration time of the pseudo-envelope follower system.

In addition, the open loop assist circuit 39 may be configured to receive the feed forward control signal 38, $V_{SWITCHER}$, from the multi-level charge pump buck converter 12. As discussed above, the feed forward control signal 38, $V_{SWITCHER}$, may be configured to provide either the scaled switching voltage output 38A, $V_{SW\_SCALED}$, or the estimated switching voltage output 38B, $V_{SW\_EST}$. The open loop assist circuit 39 may also be configured to receive the $V_{RAMP}$ signal, from the first control input 34.

Figure 9A:
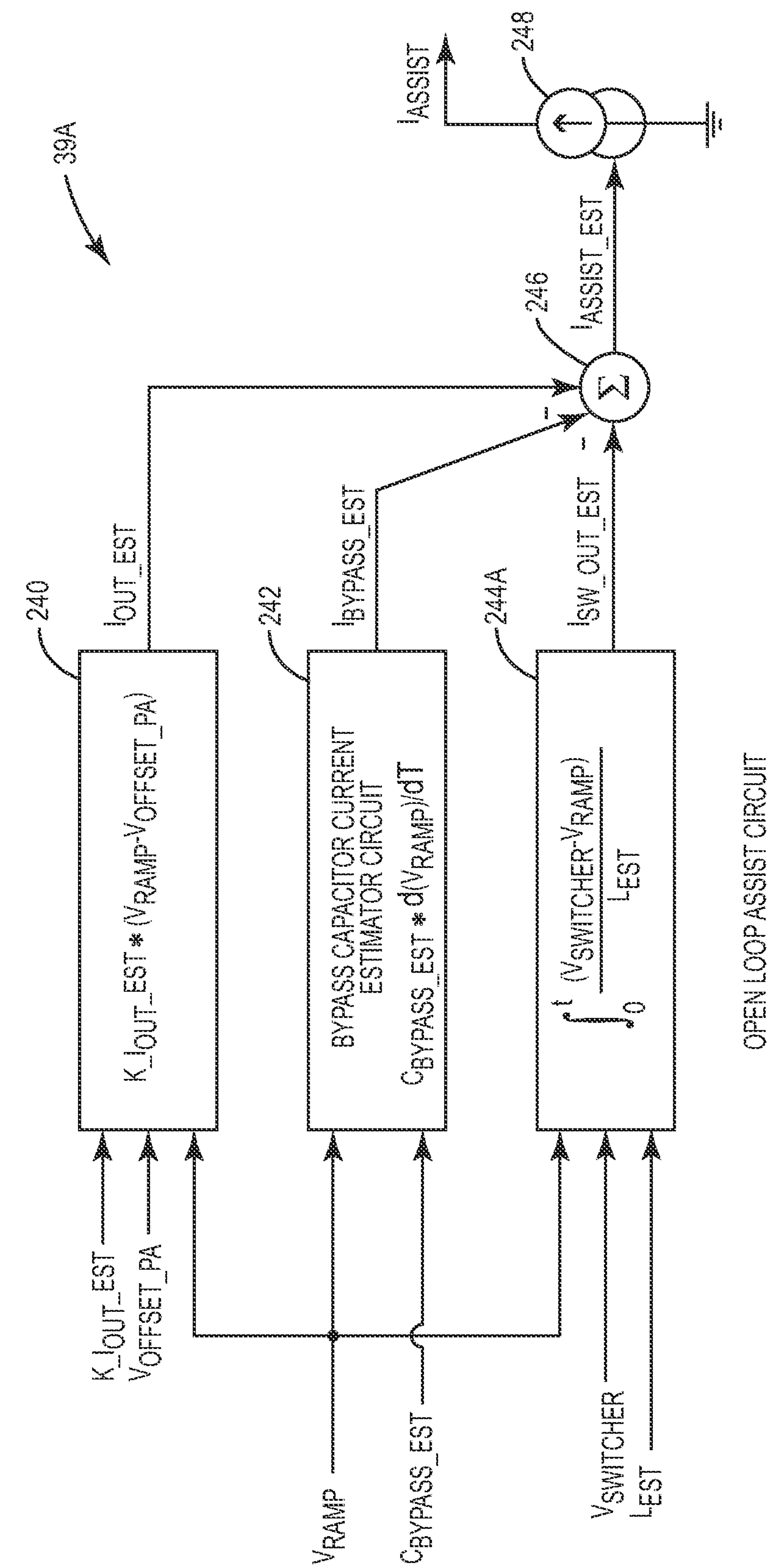
FIG. 9A depicts an embodiment of the open loop assist circuit of a parallel amplifier circuit of a pseudo-envelope follower power management system.

FIG. 9A depicts a more detailed block diagram of an embodiment of the open loop assist circuit 39 of FIG. 2A, which is depicted as an open loop assist circuit 39A. The open loop assist circuit 39A will be described with continuing reference to FIGS. 1A and 2A. The open loop assist circuit 39A includes an output current estimator 240, a bypass capacitor current estimator 242, a power inductor current estimator 244A, a summing circuit 246, and a controlled current source 248. The output current estimator 240 receives the $V_{RAMP}$ signal, the estimated power amplifier transconductance parameter, $K\_I_{OUT\_EST}$, and the minimum power amplifier turn on voltage parameter, $V_{OFFSET\_PA}$. The output current estimator 240 generates an output current estimate, $I_{OUT\_EST}$, based upon the $V_{RAMP}$ signal, the estimated power amplifier transconductance parameter, $K\_I_{OUT\_EST}$, and the minimum power amplifier turn on voltage parameter, $V_{OFFSET\_PA}$. The output current estimate, $I_{OUT\_EST}$, is an estimate of the output current, $I_{OUT}$, provided to the linear RF power amplifier 22.

In one embodiment, the output current estimator 240 calculates the difference between the $V_{RAMP}$ signal and the minimum power amplifier turn on voltage parameter, $V_{OFFSET\_PA}$, by subtracting the minimum power amplifier turn on voltage parameter, $V_{OFFSET\_PA}$, from the $V_{RAMP}$ signal, ($V_{RAMP}-V_{OFFSET\_PA}$). Thereafter, the difference between the $V_{RAMP}$ signal and the minimum power amplifier turn on voltage parameter, $V_{OFFSET\_PA}$, is scaled by the estimated power amplifier transconductance parameter, $K\_I_{OUT\_EST}$, to generate the output current estimate, $I_{OUT\_EST}$, where $I_{OUT\_EST}=K\_I_{OUT\_EST}*(V_{RAMP}-V_{OFFSET\_PA})$. Typical circuitry may include an operational amplifier to perform ($V_{RAMP}-V_{OFFSET\_PA}$) and the voltage difference is applied to a transconductance amplifier, which the transconductance amplifier gain, Gm, is programmable and equal to $K\_I_{OUT\_EST}$.

The bypass capacitor current estimator 242 receives the $V_{RAMP}$ signal and the estimated bypass capacitor capacitance parameter, $C_{BYPASS\_EST}$. The bypass capacitor current estimator 242 generates a bypass capacitor current estimate, $I_{BYPASS\_EST}$, based upon the $V_{RAMP}$ signal and the estimated bypass capacitor capacitance parameter, $C_{BYPASS\_EST}$. The bypass capacitor current estimate, $I_{BYPASS\_EST}$, is an estimate of the bypass capacitor current, $I_{BYPASS\_CAP}$, delivered by the bypass capacitor capacitance, $C_{BYPASS}$, of the bypass capacitor 19.

In one embodiment, the $V_{RAMP}$ signal is differentiated to provide a $V_{RAMP}$ rate of change signal, $d(V_{RAMP})/dT$, which serves as an estimate of the rate of change of the voltage across the bypass capacitor 19. The $V_{RAMP}$ rate of change signal, $d(V_{RAMP})/dT$, may be an estimate of the rate of change of the $V_{RAMP}$ signal over time. In some embodiments, the $V_{RAMP}$ rate of change signal, $d(V_{RAMP})/dT$, is generated by a high pass filter having a desired time constant. A simple high-pass filter followed by a gain circuit provides a frequency response below its corner frequency that have a +6 dB/octave slope thus equivalent to "s laplace transform" and thus creating a differentiator function below the corner frequency. The high-pass filter is typically made of a series capacitor and a shunt resistor. In some embodiments, the time constant of the high pass filter may be between the range of 8 nanoseconds and 16 nanoseconds.

The power inductor current estimator 244A receives the $V_{RAMP}$ signal, the feed forward control signal 38, $V_{SWITCHER}$, and the estimated power inductor inductance parameter, $L_{EST}$. The power inductor current estimator 244A generates a power inductor current estimate, $I_{SW\_OUT\_EST}$, based upon the $V_{RAMP}$ signal, the feed forward control signal 38, $V_{SWITCHER}$, and the estimated power inductor inductance parameter, $L_{EST}$. The power inductor current estimate, $I_{SW\_OUT\_EST}$, is an estimate of the power inductor current, $I_{SW\_OUT}$, delivered by the power inductor 16.

In one embodiment of the power inductor current estimator 244A, the power inductor current estimator 244A subtracts the $V_{RAMP}$ signal from the feed forward control signal 38, $V_{SWITCHER}$, to generate a difference voltage $V_{DIFFERENCE}$. The power inductor current estimator 244A may include an integrator circuit (not shown) that integrates the difference voltage $V_{DIFFERENCE}$ to generate an accumulated difference signal. The power inductor current estimator 244A then scales an accumulated difference signal with a factor of $1/L_{EST}$, to generate the power inductor current estimate, $I_{SW\_OUT\_EST}$. The bandwidth of the integrator circuit used to integrate the difference voltage $V_{DIFFERENCE}$ may be between 5 MHz and 45 MHz. In some embodiments, the integrator slope may be programmable. For example, the controller 50 may adjust the gain of the transistors of the integrator circuit (not shown) of the power inductor current estimator 244A in order to adjust the integrator slope. Also, it is possible to use a low-pass filter followed by a gain which above the corner frequency the slope versus frequency is −6 dB/octave similar to "1/s Laplace transform" thus acting as an integrator in the frequencies above the corner frequency. The corner frequency can be set below 5 MHz and is made programmable.

In another embodiment of the power inductor current estimator 244A the power inductor current estimator 244A divides the accumulated difference signal by the estimated power inductor inductance parameter, $L_{EST}$, to generate the power inductor current estimate, $I_{SW\_OUT\_EST}$.

In still another embodiment of the power inductor current estimator 244A, the difference voltage, $V_{DIFFERENCE}$, is scaled by the factor of $1/L_{EST}$, or divided by the estimated power inductor inductance parameter, $L_{EST}$, to generate a scaled difference signal, $S_{DIFFERENCE\_SCALED}$, (not shown) prior to integration. The power inductor current estimator 244A then integrates a scaled difference signal, $S_{DIFFERENCE\_SCALED}$, (not shown) to generate the power inductor current estimate, $I_{SW\_OUT\_EST}$. In yet another embodiment of the power inductor current estimator 244A, the power inductor current estimator 244A scales the $V_{RAMP}$ signal and the feed forward control signal 38, $V_{SWITCHER}$, by the factor of $1/L_{EST}$, or divides the $V_{RAMP}$ signal and the feed forward control signal 38, $V_{SWITCHER}$, by the estimated power inductor inductance parameter, $L_{EST}$, prior to calculating the scaled difference signal, $S_{DIFFERENCE\_SCALED}$, (not shown). Thereafter, the scaled difference signal, $S_{DIFFERENCE\_SCALED}$, is integrated to generate the power inductor current estimate, $I_{SW\_OUT\_EST}$.

When the feed forward control signal 38, $V_{SWITCHER}$, is configured to provide the estimated switching voltage output 38B, $V_{SW\_EST}$, to the open loop assist circuit 39, the power inductor current estimate, $I_{SW\_OUT\_EST}$, is generated based upon the estimated switching voltage output 38B, $V_{SW\_EST}$. When the feed forward control signal 38, $V_{SWITCHER}$, is configured to provide the scaled switching voltage output 38A, $V_{SW\_SCALED}$, to the open loop assist circuit 39, the power inductor current estimate, $I_{SW\_OUT\_EST}$, is generated based upon the switching voltage output, $V_{SW\_SCALED}$, 38A.

The summing circuit 246 is configured to receive the output current estimate, $I_{OUT\_EST}$, the bypass capacitor current estimate, $I_{BYPASS\_EST}$, and power inductor current estimate, $I_{SW\_OUT\_EST}$. The summing circuit 246 subtracts the bypass capacitor current estimate, $I_{BYPASS\_EST}$, and the power inductor current estimate, $I_{SW\_OUT\_EST}$, from the output current estimate, $I_{OUT\_EST}$, to generate an estimate of the open loop assist current, $I_{ASSIST\_EST}$. The open loop assist current, $I_{ASSIST\_EST}$, is an estimate of the open loop assist current, $I_{ASSIST}$, provided by the open loop assist circuit 39A to the parallel amplifier output 32A in order to generate the parallel amplifier circuit output current, $I_{PAWA\_OUT}$, from the parallel amplifier circuit 14.

The controlled current source 248 is a controlled current source that generates the open loop assist current, $I_{ASSIST}$, based upon the open loop assist current, $I_{ASSIST\_EST}$. The open loop assist current can be activated when reduced voltage ripple reduction is required and can be disabled when voltage ripple reduction is not required such as when operating at lower power amplifier output power. The open loop assist current can be made of three separate controlled current sources, where each controlled current source is controlled by the power inductor current estimate, $I_{SW\_OUT\_EST}$, the bypass capacitor current estimate, $I_{BYPASS\_EST}$, and the output current estimate, $I_{OUT\_EST}$, respectively. Also, the open loop assist current, $I_{ASSIST}$, in phase may be time aligned with the parallel amplifier output current, $I_{PARA\_AMP}$. For example, when the open loop assist current, $I_{ASSIST}$, is positive, parallel amplifier output current, $I_{PARA\_AMP}$, may be positive and when the open loop assist current, $I_{ASSIST}$, is negative, the parallel amplifier output current, $I_{PARA\_AMP}$, may also be negative as such there is no wasted currents, where the parallel amplifier output current, $I_{PARA\_AMP}$, that is sourced is not sunk by the open loop assist circuit 39A.

Figure 9B:
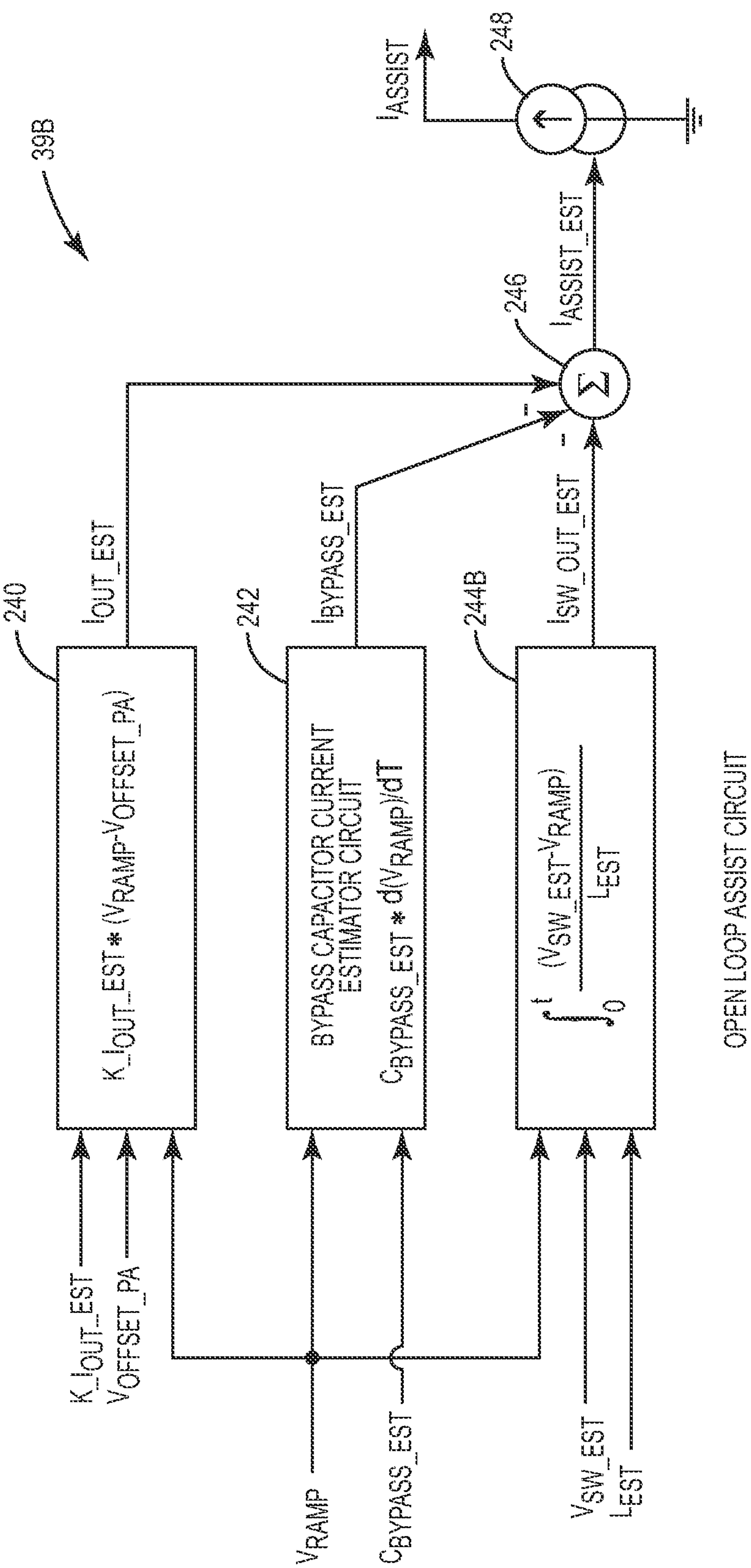
FIG. 9B depicts an embodiment of the open loop assist circuit of a parallel amplifier circuit of a pseudo-envelope follower power management system.

FIG. 9B depicts another embodiment of the open loop assist circuit 39B. As depicted in FIG. 9B, the open loop assist circuit 39B is similar to the open loop assist circuit 39A except that the open loop assist circuit 39B receives the estimated switching voltage output 38B, $V_{SW\_EST}$, as the feed forward control signal instead of the feed forward control signal 38, $V_{SWITCHER}$. Accordingly, the estimated switching voltage output 38B, $V_{SW\_EST}$, includes a power inductor current estimator 244B instead of the power inductor current estimator 244A. The power inductor current estimator 244B is similar to the power inductor current estimator 244A except the power inductor current estimator 244B only receives estimated switching voltage output 38B, $V_{SW\_EST}$, instead of the feed forward control signal 38, $V_{SWITCHER}$.

As a result, the power inductor current estimate, $I_{SW\_OUT\_EST}$, generated by the power inductor current estimator 244B is based upon the estimated switching voltage output 38B, $V_{SW\_EST}$. As a result, the power inductor current estimator 244B is functionally like the power inductor current estimator 244A when the feed forward control signal 38, $V_{SWITCHER}$, provides the estimated switching voltage output 38B, $V_{SW\_EST}$, as an output. Accordingly, the open loop assist circuit 39B operates in a manner that is similar to the operation of the open loop assist circuit 39A when the feed forward control signal 38, $V_{SWITCHER}$, provides the estimated switching voltage output 38B, $V_{SW\_EST}$, to the open loop assist circuit 39A.

Returning to FIG. 2A, the parallel amplifier output impedance compensation circuit 37 will now be discussed. The combination of the multi-level charge pump buck converter 12 and the parallel amplifier 35 of the parallel amplifier circuitry 32 may not have a flat frequency response across the modulation bandwidth of the power amplifier supply voltage, $V_{CC}$, provided to the linear RF power amplifier 22. In particular, the desired modulation bandwidth of the power amplifier supply voltage, $V_{CC}$, is between 1.5 to 2.5 times the RF modulation bandwidth of the linear RF power amplifier 22. As an example, the Long Term Evolution LTE 3GPP standard of the RF modulation bandwidth may be up to 20 MHz. As a result, the desired modulation bandwidth of power amplifier supply voltage, $V_{CC}$, generated by the pseudo-envelope follower power management system 10A may be between 30 MHz to 40 MHz. In some embodiments of the pseudo-envelope follower power management system 10A, the desired modulation bandwidth of the power amplifier supply voltage, $V_{CC}$, may be approximately 35 MHz. However, at higher frequencies, the output impedance of the parallel amplifier 35 that regulates the power amplifier supply voltage, $V_{CC}$, may become inductive. The output impedance of the parallel amplifier 35 combines with the bypass capacitor capacitance, $C_{BYPASS}$, of the bypass capacitor 19 to roll off the modulation frequency response of the parallel amplifier 35. The roll off of the modulation frequency response of the parallel amplifier 35 may result in increased ripple voltage in the power amplifier supply voltage, $V_{CC}$, due to the inductor current, $I_{SW\_OUT}$, provided by the power inductor 16. The parallel amplifier output impedance compensation circuit 37 may be configured to pre-compensate the $V_{RAMP}$ signal in order to provide a compensated $V_{RAMP}$ signal, $V_{RAMP\_C}$, to the parallel amplifier 35 in order to flatten the modulation frequency response of the parallel amplifier 35.

The parallel amplifier output impedance compensation circuit 37 depicted in FIG. 2A is configured to receive the $V_{RAMP}$ signal, an estimated bypass capacitor capacitance parameter, $C_{BYPASS\_EST}$, and a parallel amplifier inductance estimate parameter, $L_{CORR\_EST}$. The parallel amplifier inductance estimate parameter, $L_{CORR\_EST}$, may be an estimated inductance of the parallel amplifier 35 between the frequencies 10 MHz and 30 MHz, which is measured during calibration. The parallel amplifier inductance estimate parameter, $L_{CORR\_EST}$, may be provided by the controller 50 via the control bus 44 at configuration time.

Figure 10:
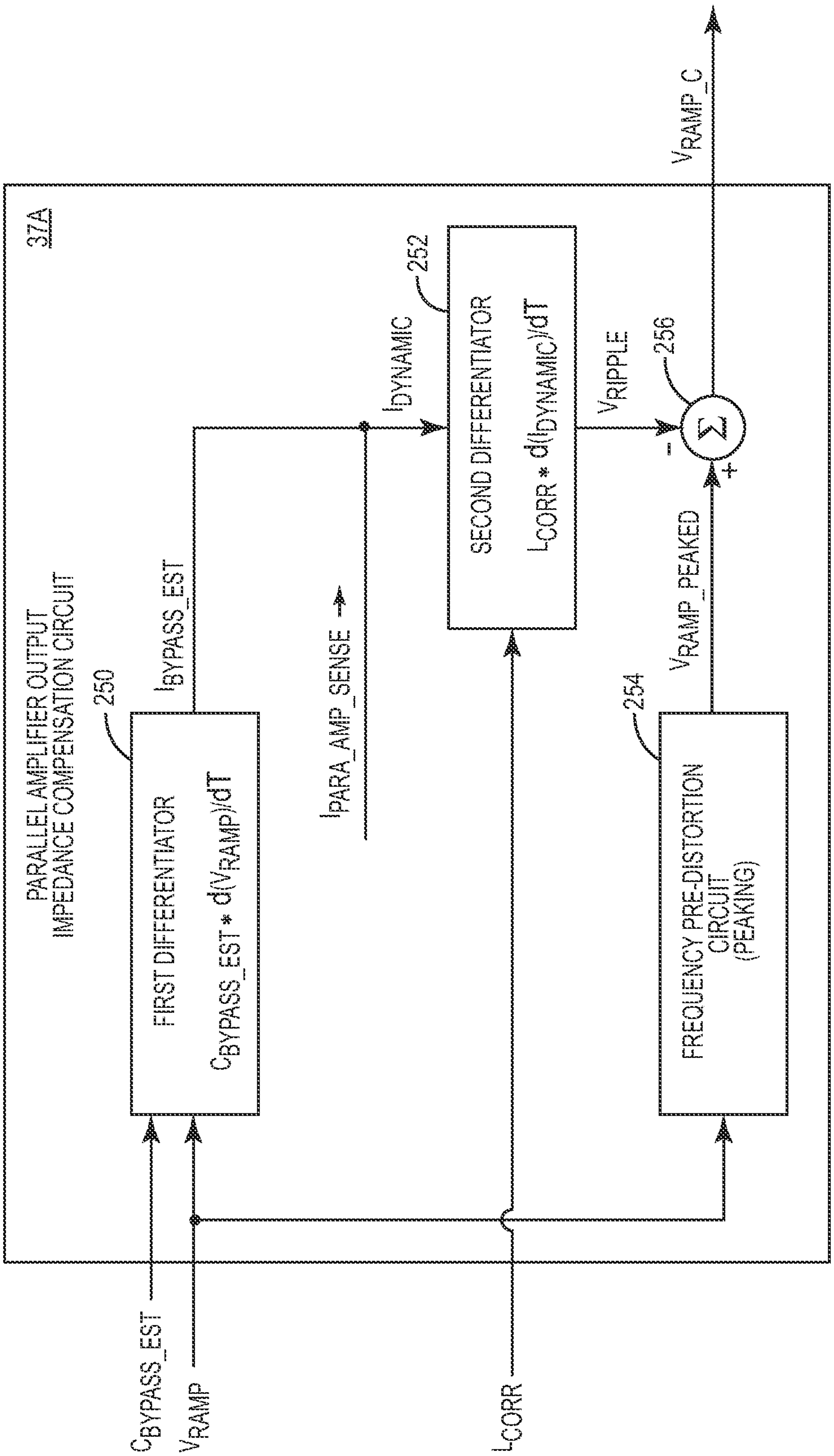
FIG. 10 depicts an embodiment of a parallel amplifier output impedance compensation circuit of a parallel amplifier circuit of a pseudo-envelope follower power management system.

FIG. 10 depicts an example embodiment of the parallel amplifier output impedance compensation circuit 37, depicted in FIG. 2A, as a parallel amplifier output impedance compensation circuit 37A. The parallel amplifier output impedance compensation circuit 37A may include a first differentiator circuit 250, a second differentiator 252, a frequency pre-distortion circuit 254, and a summing circuit 256.

The first differentiator circuit 250 receives the $V_{RAMP}$ signal and the estimated bypass capacitor capacitance parameter, $C_{BYPASS\_EST}$. Similar to the bypass capacitor current estimator 242 of FIGS. 9A and 9B, the first differentiator circuit 250 generates a bypass capacitor current estimate, $I_{BYPASS\_EST}$, based upon the $V_{RAMP}$ signal and the bypass capacitor capacitance parameter, $C_{BYPASS\_EST}$. The bypass capacitor current estimate, $I_{BYPASS\_EST}$, is an estimate of the bypass capacitor current, $I_{BYPASS\_CAP}$, delivered by the bypass capacitor capacitance, $C_{BYPASS}$, of the bypass capacitor 19. In some embodiments of the parallel amplifier output impedance compensation circuit 37A, the parallel amplifier output impedance compensation circuit 37A uses the bypass capacitor current estimate, $I_{BYPASS\_EST}$, provided by the bypass capacitor current estimator 242 and the first differentiator circuit 250 is omitted. In other embodiments of the parallel amplifier output impedance compensation circuit 37A, the time constant of the first differentiator circuit 250 may be different than the time constant of bypass capacitor current estimator 242 of the open loop assist circuit 39.

Similar to the bypass capacitor current estimator 242, in one embodiment of the first differentiator circuit 250, the $V_{RAMP}$ signal is differentiated to provide a $V_{RAMP}$ rate of change signal, $d(V_{RAMP})/dT$, which serves as an estimate of the rate of change of the voltage across the bypass capacitor 19. The $V_{RAMP}$ rate of change signal, $d(V_{RAMP})/dT$, may be an estimate of the rate of change of the $V_{RAMP}$ signal over time. In some embodiments, the $V_{RAMP}$ rate of change signal, $d(V_{RAMP})/dT$, is generated by a high pass filter (not shown) having a desired time constant. As an example, a simple high-pass filter followed by a gain stage may provide a frequency response below its corner frequency that has a +6 dB/octave slope, thus equivalent to the "s Laplace transform" and thus creating a differentiator function below the corner frequency. The high-pass filter (not shown) is typically made of a series capacitor and a shunt resistor. In some embodiments, the time constant of the high pass filter may be between the range of 8 nanoseconds and 16 nanoseconds.

The bypass capacitor current estimate, $I_{BYPASS\_EST}$, and the scaled parallel amplifier output current estimate, $I_{PARA\_AMP\_SENSE}$, are combined to create a dynamic current, $I_{DYNAMIC}$, which is provided to the second differentiator circuit 252. The dynamic current, $I_{DYNAMIC}$, represents the dynamic portion of the power inductor current, $I_{SW\_OUT}$, delivered by the power inductor 16. The second differentiator circuit 252 is to replicate the parallel amplifier output impedance frequency response, which exhibits an output impedance that increases at +6 dB/octave, like an inductor, at the frequency range where the switcher current is operating, up to a resonance frequency equal to $1/(2*pi*sqrt(L_{CORR}*C_{BYPASS}))$.

The second differentiator circuit 252 is configured to receive the dynamic current, $I_{DYNAMIC}$, and the parallel amplifier inductance estimate parameter, $L_{CORR}$.

The second differentiator circuit 252 differentiates the dynamic current, $I_{DYNAMIC}$, to provide a dynamic current rate of change signal, $d/(I_{DYNAMIC})/dT$. The dynamic current rate of change signal, $d/(I_{DYNAMIC})/dT$, estimates change of the dynamic current, $I_{DYNAMIC}$, with respect to time. In some embodiments, the dynamic current rate of change signal, $d(I_{DYNAMIC})/dT$, is generated by a low pass filter (not shown) having a desired time constant. The time constants of the second differentiator circuit 252 may be configured to optimize the modulation bandwidth of the parallel amplifier 35. The second differentiator can be made from a high-pass filter (not shown) followed by a gain to provide a frequency response below its corner frequency that has a +6 dB/octave slope thus equivalent to "s Laplace transform" and thus creating a differentiator function below the corner frequency. The high-pass filter is typically made of a series capacitor and a shunt resistor. The time constant of the high-pass filter may be between 8 nanoseconds and 16 nanoseconds. The second differentiator circuit 252 scales the dynamic current rate of change signal, $d(I_{DYNAMIC})/dT$, by the parallel amplifier inductance estimate parameter, $L_{CORR}$, to generate a power amplifier supply ripple voltage estimate, $V_{RIPPLE}$, at the negative input of the summing circuit 256. The power amplifier supply ripple voltage estimate is an estimate of the ripple voltage component of the power amplifier supply voltage, $V_{CC}$, at the power amplifier supply output 28.

The frequency pre-distortion circuit 254 may be configured to receive the $V_{RAMP}$ signal and output a peaked $V_{RAMP}$ signal, $V_{RAMP\_PEAKED}$. The frequency pre-distortion circuit 254 may be a programmable peaking filter that may be configured to compensate for the roll off of the modulation frequency response of the parallel amplifier 35. The frequency pre-distortion circuit 254 may include a frequency equalizer circuit that includes a programmable pole time constant, Tau_Pole, and a programmable zero time constant, Tau_Zero. The frequency pre-distortion circuit Laplace transfer function, $V_{RAMP\_C}/V_{RAMP}$, may be approximately equal to [1+Tau_Zero*s]/[1+Tau_Pole*s]. The programmable pole time constant, Tau_Pole, and the programmable zero time constant, Tau_Zero, may be adjusted to increase the frequency response of the frequency pre-distortion circuit 254, $V_{RAMP\_C}/V_{RAMP}$, in order to flatten the overall modulation frequency response of the pseudo-envelope follower power management system 10A. In some embodiments of the frequency pre-distortion circuit 254, the programmable pole time constant, Tau_Pole, is configured to about 0.4 microseconds, (1/2.5 MHz). The programmable zero time constant, Tau_Zero, may be configured to be about 0.192 microseconds, (1/5.8 MHz). As a result, the pseudo-envelope follower power management system transfer function, $V_{CC}/V_{RAMPS}$, may be flattened up to about 35 MHz.

Figure 13:
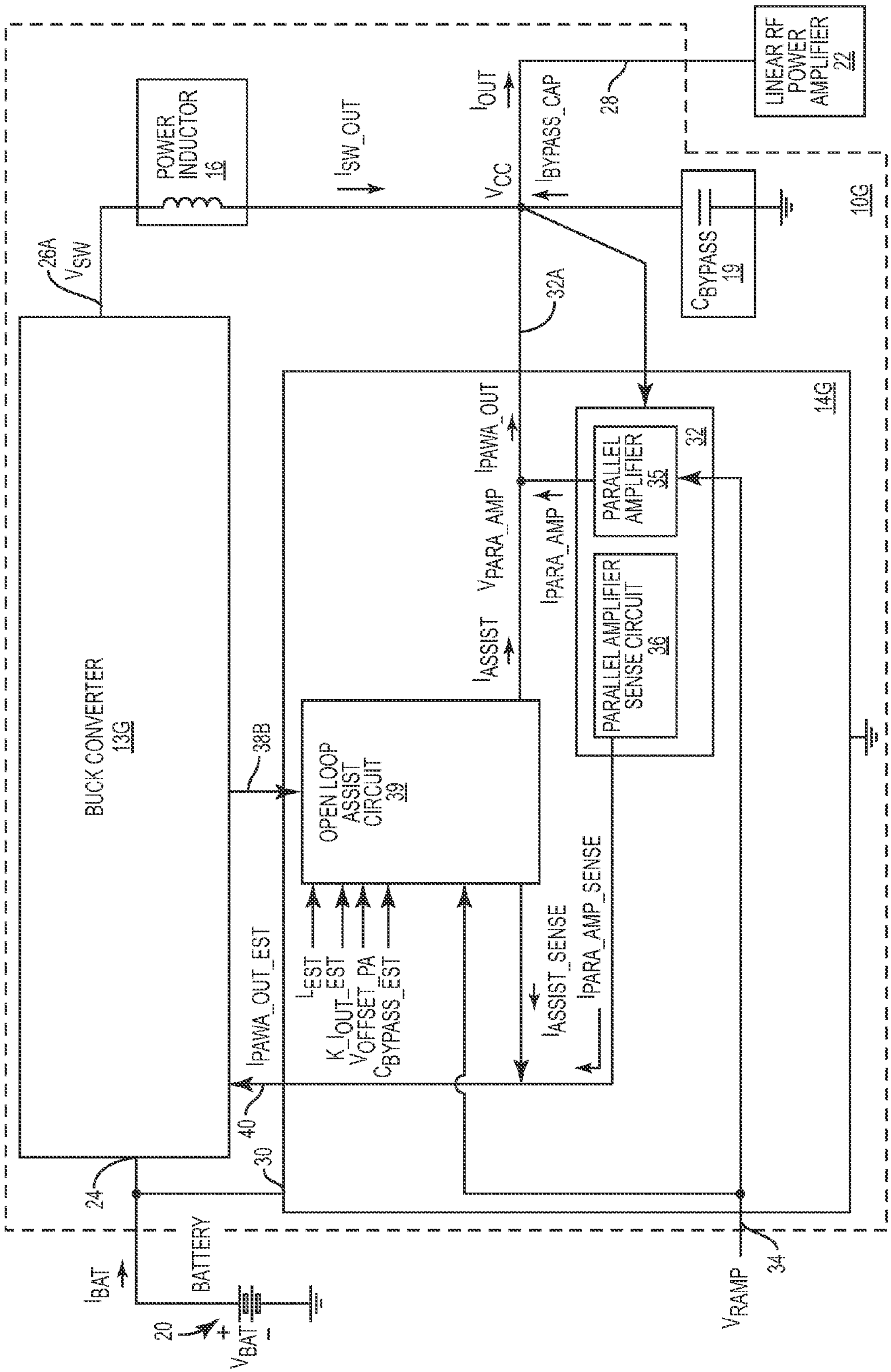
FIG. 13 depicts an embodiment of a pseudo-envelope follower power management system including a buck converter and a parallel amplifier circuit having an open loop assist circuit and a parallel amplifier circuit.

FIG. 13 depicts an embodiment of a pseudo-envelope follower power management system 10G including a buck converter 13G and a parallel amplifier circuit 14G having an open loop assist circuit 39 and parallel amplifier circuitry 32. In some alternative embodiments of the pseudo-envelope follower power management system of FIG. 13, the parallel amplifier 35 may be a rechargeable parallel amplifier. As an example, the parallel amplifier 35 may be a rechargeable parallel amplifier similar to the embodiments of the rechargeable parallel amplifier depicted in FIGS. 12B-C and FIGS. 12E-F.

Figure 14:
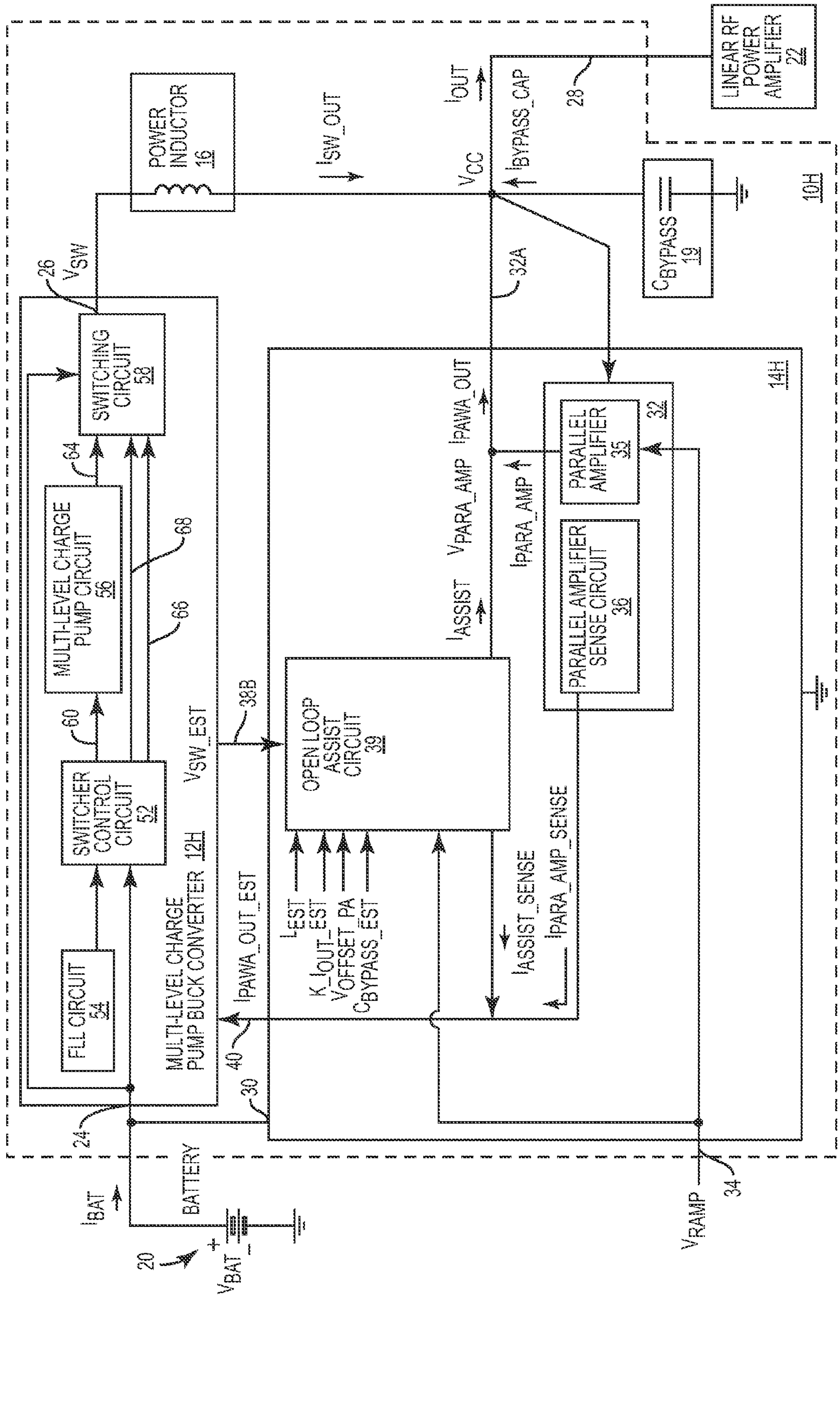
FIG. 14 depicts another embodiment of a pseudo-envelope follower power management system including a multi-level charge pump buck converter and a parallel amplifier circuit having both an open loop assist circuit and a parallel amplifier circuit.

FIG. 14 depicts another embodiment of a pseudo-envelope follower power management system 10H including a multi-level charge pump buck converter 12H and a parallel amplifier circuit 14H having an open loop assist circuit 39 and parallel amplifier circuitry 32. In some alternative embodiments of the pseudo-envelope follower power management system of FIG. 14, the parallel amplifier 35 may be a rechargeable parallel amplifier similar to the embodiments of the rechargeable parallel amplifier depicted in FIGS. 12B-C and FIGS. 12E-F.

Figure 15:
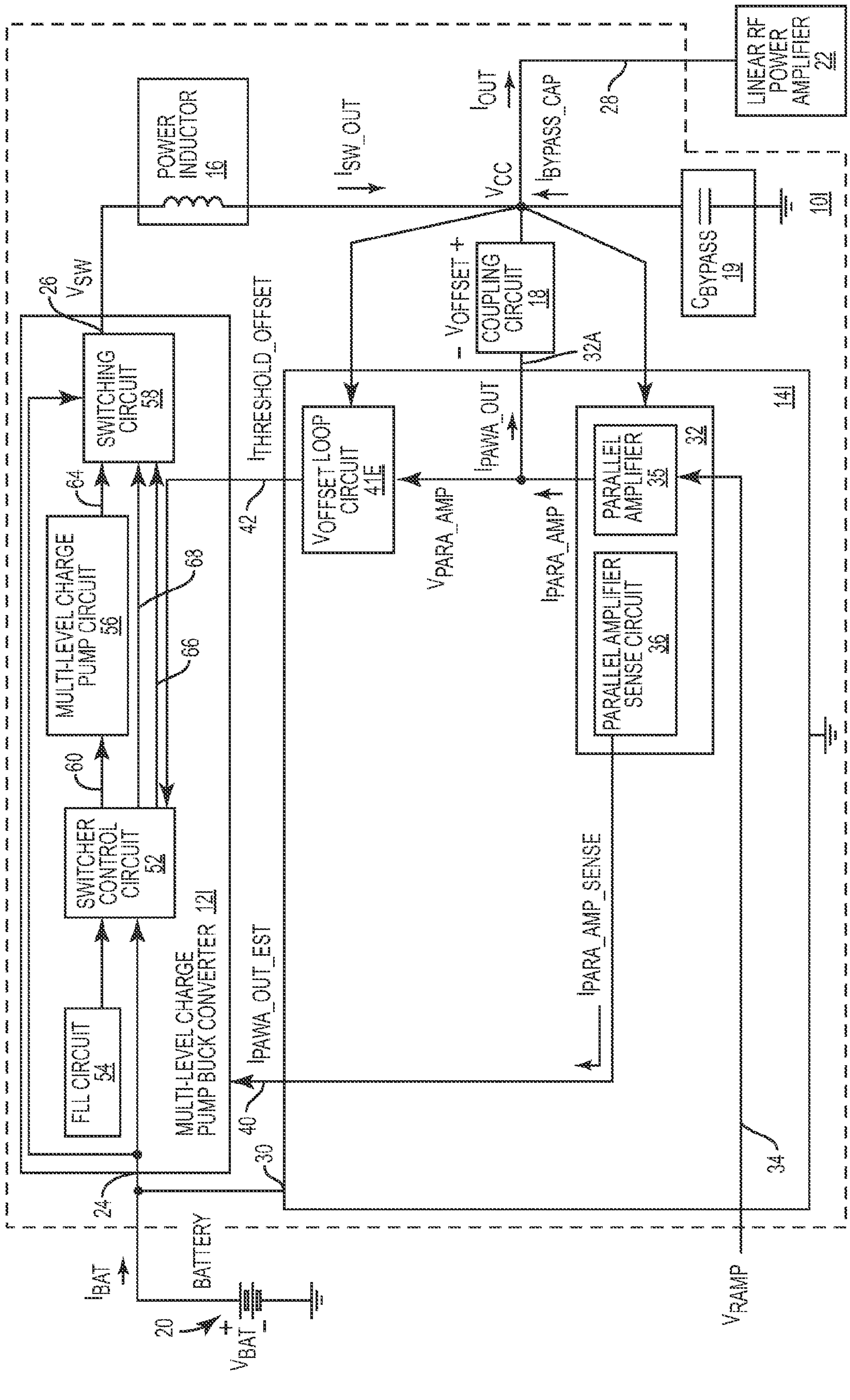
FIG. 15 depicts another embodiment of a pseudo-envelope follower power management system including a multi-level charge pump buck converter and a parallel amplifier circuit having a parallel amplifier circuit and a $V_{OFFSET}$ loop circuit.

FIG. 15 depicts another embodiment of a pseudo-envelope follower power management system 10I including a multi-level charge pump buck converter 12I and a parallel amplifier circuit 14I having a parallel amplifier circuitry 32 and a $V_{OFFSET}$ loop circuit 41E. In some embodiments, the $V_{OFFSET}$ loop circuit 41E may be similar to the $V_{OFFSET}$ loop circuit 41A, depicted in FIG. 18A, the $V_{OFFSET}$ loop circuit 41B, depicted in FIG. 18B, or the $V_{OFFSET}$ loop circuit 41, depicted in FIG. 8. Accordingly, although not shown in FIG. 15, in some example embodiments, the $V_{OFFSET}$ loop circuit 41E may be coupled to a controller 50, in a fashion similar to that depicted in FIGS. 18A-B. In those embodiments that include the controller 50 coupled to the $V_{OFFSET}$ loop circuit 41E, the controller 50 may be used to configure the $V_{OFFSET}$ loop circuit 41E. In addition, in some alternative embodiments of the pseudo-envelope follower power management system 10I, depicted in FIG. 15, the parallel amplifier 35 may be a rechargeable parallel amplifier similar to the embodiments of the rechargeable parallel amplifier that are depicted in FIGS. 12B-C and FIGS. 12E-F.

Figure 16:
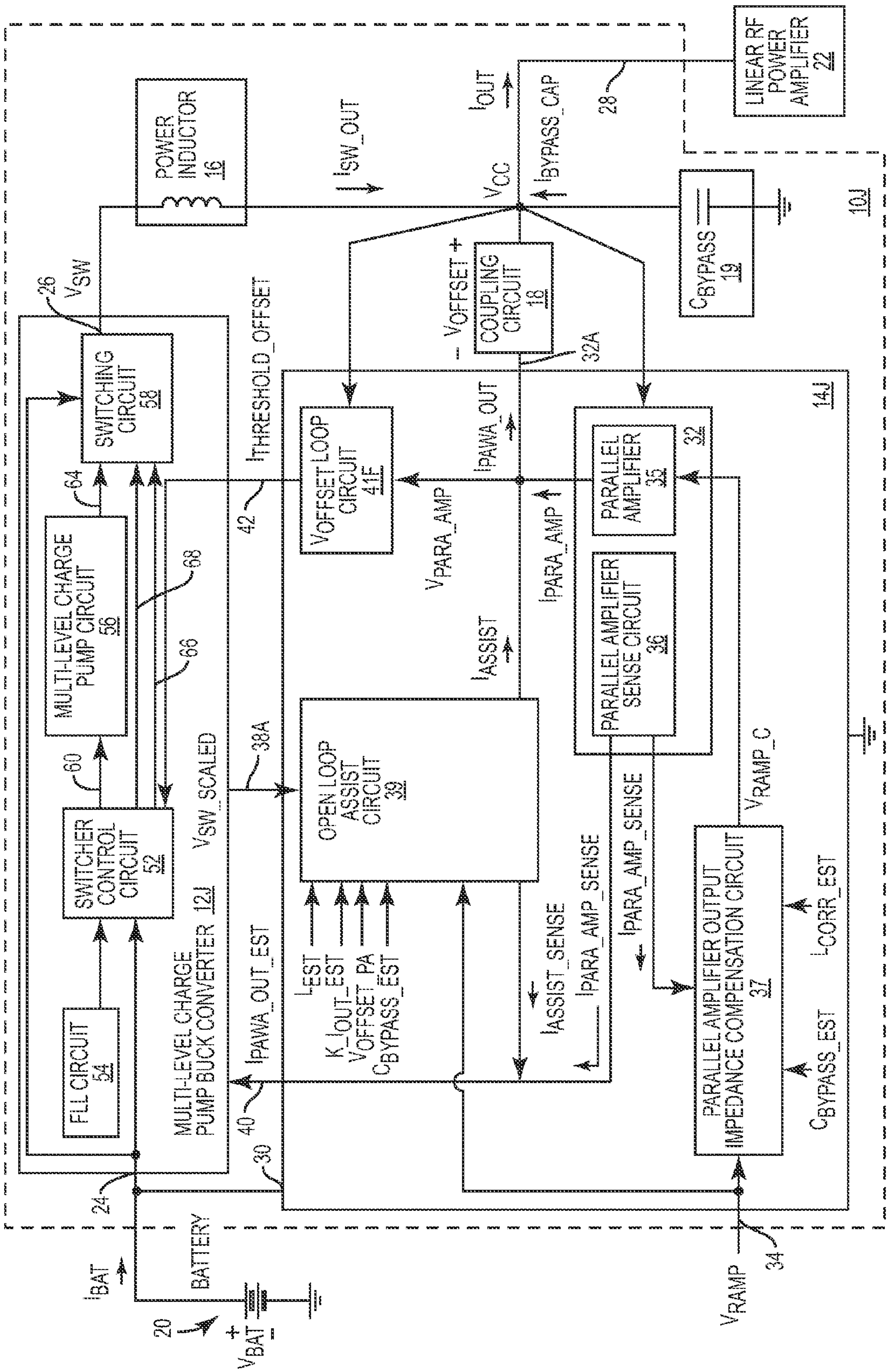
FIG. 16 depicts another embodiment of a pseudo-envelope follower power management system including a multi-level charge pump buck converter and a parallel amplifier circuit having a parallel amplifier, a $V_{OFFSET}$ loop circuit, an open loop assist circuit and a parallel amplifier output impedance compensation circuit.

FIG. 16 depicts another embodiment of a pseudo-envelope follower power management system 10J including a multi-level charge pump buck converter 12J and parallel amplifier circuitry 32 having a parallel amplifier circuitry 32, a $V_{OFFSET}$ loop circuit 41F, an open loop assist circuit 39 and a parallel amplifier output impedance compensation circuit 37. In some embodiments, the $V_{OFFSET}$ loop circuit 41F may be similar to the $V_{OFFSET}$ loop circuit 41A, depicted in FIG. 18A, the $V_{OFFSET}$ loop circuit 41B, depicted in FIG. 18B, or the $V_{OFFSET}$ loop circuit 41, depicted in FIG. 8. Accordingly, although not shown in FIG. 16, the $V_{OFFSET}$ loop circuit 41F may be coupled to a controller 50, (as depicted in FIGS. 18A-B), which may be used to configure the $V_{OFFSET}$ loop circuit 41F. In addition, in some alternative embodiments of the pseudo-envelope follower power management system 10J, depicted in FIG. 16, the parallel amplifier 35 may be a rechargeable parallel amplifier similar to the embodiments of the rechargeable parallel amplifier depicted in FIGS. 12B-C and FIGS. 12E-F.

Figure 17A:
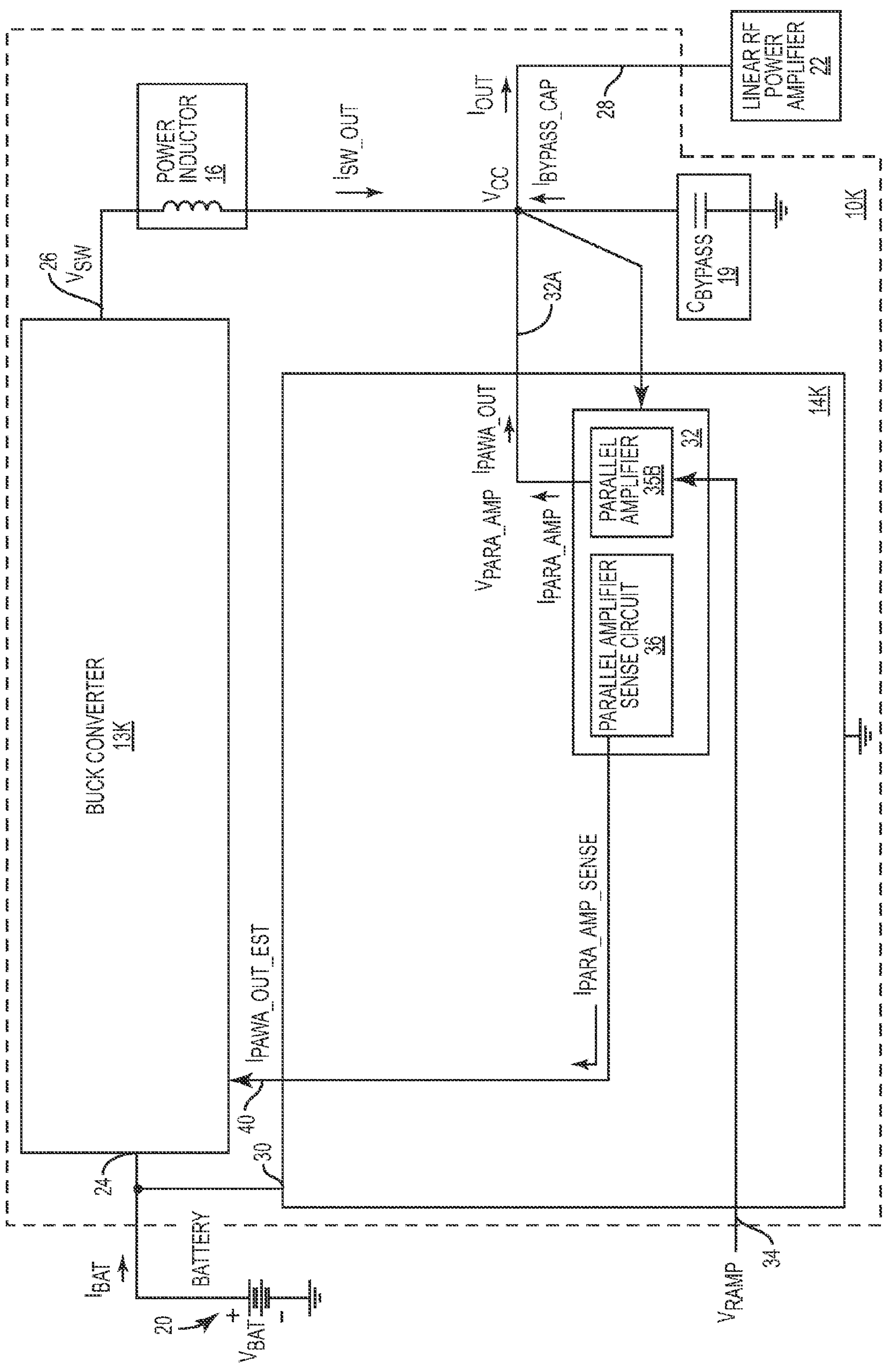
FIG. 17A depicts another embodiment of pseudo-envelope follower power management system including a buck converter and a parallel amplifier circuit having a rechargeable parallel amplifier circuit.

FIG. 17A depicts another embodiment of a pseudo-envelope follower power management system 10K including a buck converter 13K and parallel amplifier circuitry 32 having a rechargeable parallel amplifier 35B. The parallel amplifier output current, $I_{PARA\_AMP}$, may be the sole contributor to the parallel amplifier circuit output current $I_{PAWA\_OUT}$, of the parallel amplifier circuit 14K. In addition, because the parallel amplifier circuit 14K does not have an open loop assist circuit, the parallel amplifier circuit output current estimate 40, $I_{PAWA\_OUT\_EST}$, is equal to the scaled parallel amplifier output current estimate, $I_{PARA\_AMP\_SENSE}$, current provided by the parallel amplifier sense circuit 36. Also, in some alternative embodiments of the pseudo-envelope follower power management system 10K, depicted in FIG. 17A, the rechargeable parallel amplifier 35B may be a rechargeable parallel amplifier similar to the embodiments of the rechargeable parallel amplifier depicted in FIG. 12E.

Figure 17B:
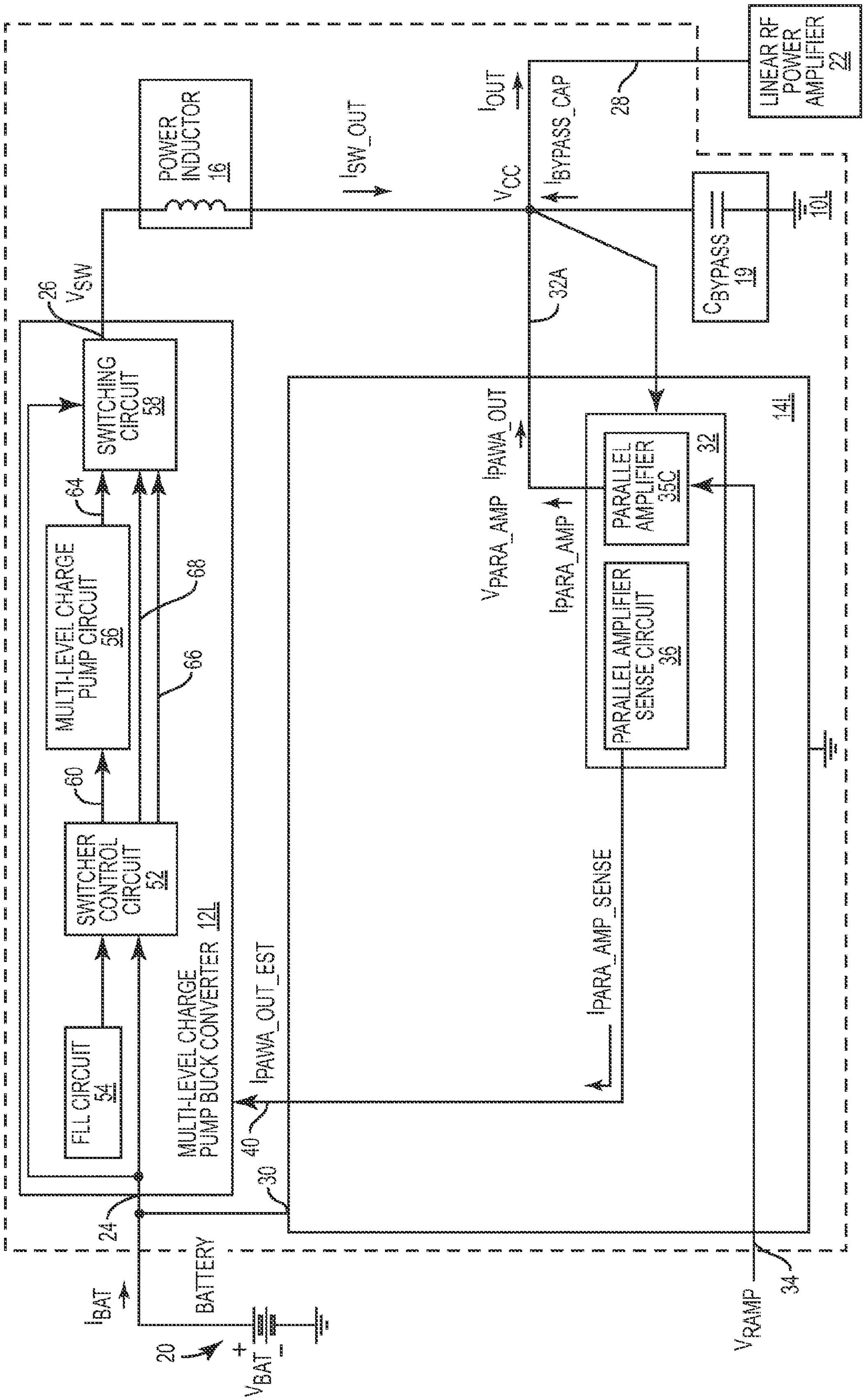
FIG. 17B depicts another embodiment of a pseudo-envelope follower power management system including a buck converter and a parallel amplifier circuit having a parallel amplifier circuit.

FIG. 17B depicts another embodiment of a pseudo-envelope follower power management system 10L including a multi-level charge pump buck converter 12L and a parallel amplifier circuitry 32 having a parallel amplifier circuitry 32. The parallel amplifier output current, $I_{PARA\_AMP}$, may be the sole contributor to the parallel amplifier circuit output current $I_{PAWA\_OUT}$, of the parallel amplifier circuit 14L. In addition, because the parallel amplifier circuit 14L does not have an open loop assist circuit, the parallel amplifier circuit output current estimate 40, $I_{PAWA\_OUT\_EST}$, may be equal to the scaled parallel amplifier output current estimate, $I_{PARA\_AMP\_SENSE}$, current provided by the parallel amplifier sense circuit 36. In addition, in some alternative embodiments of the pseudo-envelope follower power management system 10L, depicted in FIG. 17B, the rechargeable parallel amplifier 35C may be a rechargeable parallel amplifier similar to the embodiments of the rechargeable parallel amplifier depicted in FIG. 12E-F.

FIG. 18B depicts another embodiment of the pseudo-envelope follower power management system 10E, which is similar to the pseudo-envelope follower power management systems 10A and 10B, as depicted in FIGS. 1A-B and 2A-B. The pseudo-envelope follower power management system 10E includes a multi-level charge pump buck converter 12C, a parallel amplifier circuit 14D, a controller 50, a clock management circuit 260, a μC charge pump circuit 262, a battery level sense circuit 264, and a parallel amplifier power source selection circuit 272 operably configured to generate a parallel amplifier supply voltage, $V_{CC}$, on the bypass capacitor 19. The bypass capacitor 19 has a bypass capacitance, $C_{BYPASS}$.

Similar to the embodiments of the pseudo-envelope follower power management system 10A-10B of FIGS. 2A-2B, the pseudo-envelope follower power management system 10E may include a multi-level charge pump buck converter 12C that is similar to the multi-level charge pump buck converters 12A-B, depicted in FIGS. 2A-B. Like the multi-level charge pump buck converters 12A-B, the multi-level charge pump buck converter 12C may include a switcher control circuit 52. However, unlike the multi-level charge pump buck converters 12A-B, the multi-level charge pump buck converter 12C further includes a multi-level charge pump circuit 258 configured to generate an internal charge pump node parallel amplifier supply 294. In some embodiments of the multi-level charge pump buck converter 12C, the multi-level charge pump circuit 258 may provide $1.5\times V_{BAT}$ as the internal charge pump node parallel amplifier supply 294. In other embodiments of the multi-level charge pump buck converter 12C, the multi-level charge pump circuit 258, the output voltage level of the internal charge pump node parallel amplifier supply 294 may vary between $1.5\times V_{BAT}$ and $2\times V_{BAT}$ depending upon the operational mode of the multi-level charge pump circuit 258. Example embodiments of the multi-level charge pump circuit 258 may include the multi-level charge pump circuit 258A and the multi-level charge pump circuit 258B, depicted in the respective FIGS. 7A-B. Also similar to the multi-level charge pump buck converters 12A-B, depicted in FIGS. 2A-B, the multi-level charge pump buck converter 12C may include a switching voltage output 26.

In addition, similar to the embodiments of the pseudo-envelope follower power management system 10A-10B, depicted in FIGS. 2A-2B, the switching voltage output 26 of the multi-level charge pump buck converter 12C may be coupled to a power inductor 16. The power inductor 16 is coupled to the bypass capacitor 19, which has a bypass capacitance, $C_{BYPASS}$, to form a low pass filter for the multi-level charge pump buck converter 12C. In addition, similar to the parallel amplifier circuit 14A and the parallel amplifier circuit 14B of FIGS. 2A-2B, the parallel amplifier circuit 14D may include a parallel amplifier output 32A that is coupled to the power amplifier supply voltage, $V_{CC}$, via the coupling circuit 18. In the case where the coupling circuit 18 provides AC (alternating current) coupling between the parallel amplifier output 32A of the parallel amplifier circuit 14D and the power amplifier supply voltage, $V_{CC}$, an offset voltage, $V_{OFFSET}$, may be developed across the coupling circuit 18. Also, the parallel amplifier circuit 14D may include the parallel amplifier circuitry 32 operably coupled to the parallel amplifier output 32A.

However, unlike the parallel amplifier circuit 14A, depicted in FIG. 2A, and the parallel amplifier circuit 14B, depicted in FIG. 2B, the parallel amplifier circuit 14D may be configured to power the parallel amplifier circuitry 32 with a parallel amplifier supply voltage, $V_{SUPPLY\_PARA\_AMP}$, instead of the supply input 24, ($V_{BAT}$). The parallel amplifier supply voltage, $V_{SUPPLY\_PARA\_AMP}$, may be provided by the parallel amplifier power source selection circuit 272. In one example embodiment of the parallel amplifier circuit 14D, the parallel amplifier 35 may be configured similar to the parallel amplifier 35D, depicted in FIG. 12D. Alternatively, in other embodiments, the parallel amplifier 35 may be a rechargeable parallel amplifier similar to the rechargeable parallel amplifiers 35E-F, respectively depicted in FIGS. 12E-F.

The parallel amplifier power source selection circuit 272 may include a first input coupled to the μC charge pump output of the μC charge pump circuit 262 and a second input coupled to the internal charge pump node parallel amplifier supply 294 of the multi-level charge pump circuit 258. The parallel amplifier power source selection circuit 272 may also be coupled to the controller 50 via a source selection control signal 296. The parallel amplifier power source selection circuit 272 may include an output configured to provide the parallel amplifier supply voltage, $V_{SUPPLY\_PARA\_AMP}$, to the parallel amplifier circuit 14D based upon the state of the source selection control signal 296. In addition, the parallel amplifier power source selection circuit 272 may be coupled to the controller 50 via the source selection control signal 296. Via the source selection control signal 296, the controller 50 may configure the parallel amplifier power source selection circuit 272 to select either the internal charge pump node parallel amplifier supply 294 or the μC charge pump output in order to provide the parallel amplifier supply voltage, $V_{SUPPLY\_PARA\_AMP}$, to the parallel amplifier circuit 14D. In some alternative embodiments of the pseudo-envelope follower power management system 10E, the parallel amplifier power source selection circuit 272 may be eliminated. In this case, either the internal charge pump node parallel amplifier supply 294 or the μC charge pump output of the μC charge pump circuit 262 may be directly coupled to the parallel amplifier circuit 14D in order to provide the parallel amplifier supply voltage, $V_{SUPPLY\_PARA\_AMP}$. For example, some embodiments of the multi-level charge pump buck converter 12C may not provide an internal charge pump node parallel amplifier supply 294 as an output. In this case, the μC charge pump output of the μC charge pump circuit 262 is directly coupled to the parallel amplifier circuit 14D to provide the parallel amplifier supply voltage $V_{SUPPLY\_PARA\_AMP}$, as the operational voltage for the parallel amplifier 35 and associated circuitry.

In still another alternative arrangement (not shown), some embodiments of the pseudo-envelope follower power management system 10E may eliminate the parallel amplifier power source selection circuit 272. In this case, the μC charge pump output of the μC charge pump circuit 262 and the internal charge pump node parallel amplifier supply 294 are coupled together to form a parallel amplifier supply node that provides the parallel amplifier supply voltage, $V_{SUPPLY\_PARA\_AMP}$. As an example, in the case where the multi-level charge pump circuit 258 is similar to either the multi-level charge pump circuit 258A, depicted in FIG. 7B, or the multi-level charge pump circuit 258B, depicted in FIG. 7C, the desired source for providing the parallel amplifier supply voltage, $V_{SUPPLY\_PARA\_AMP}$, may be managed by enabling and disabling the μC charge pump circuit 262 and controlling the switch state of the ninth switch 119 of either the multi-level charge pump circuit 258A or the multi-level charge pump circuit 258B. As an example, when the μC charge pump circuit 262 is disabled by setting the μC charge pump, $\mu BB_{RATIO}$, to OFF, the μC charge pump output floats. In a similar fashion, setting the switch state of the ninth switch 119 to be open, for either the multi-level charge pump circuit 258A or the multi-level charge pump circuit 258B, depicted in the respective FIGS. 7B-C, operably disconnects the internal circuitry of the multi-level charge pump circuit 258A and the multi-level charge pump circuit 258B from the parallel amplifier supply node.

The μC charge pump circuit 262 includes a supply input coupled to supply input 24, ($V_{BAT}$), provided by the battery and a μC charge pump output configured to provide a μC charge pump output voltage, $V_{\mu C\_OUT}$. In addition, the μC charge pump circuit 262 may be configured to receive a μC charge pump clock 276 from the clock management circuit 260. The μC charge pump clock 276 may be used to govern the operation of the μC charge pump circuit 262. The μC charge pump circuit 262 is also coupled via a μC charge pump control bus 278 to the controller 50. As described below relative to FIGS. 19A-B, some embodiments of the μC charge pump circuit 262 may be configured to boost the supply input 24, ($V_{BAT}$), provided by the battery to generate a μC charge pump output voltage, $V_{\mu C\_OUT}$, that is greater than the supply input 24, ($V_{BAT}$). Other embodiments of the μC charge pump circuit 262 be may be configured to buck the supply input 24, ($V_{BAT}$) to generate a μC charge pump output voltage, $V_{\mu C\_OUT}$, that is less than the supply input 24, ($V_{BAT}$). The controller 50 may use the μC charge pump control bus 278 to configure the μC charge pump circuit 262 to operate in various operational modes in order to generate specific voltage levels at the μC charge pump output. For example, the μC charge pump circuit 262 may be configured to generate a μC charge pump output voltage, $V_{\mu C\_OUT}$, that provides various voltage levels dependent upon the mode of operation of the μC charge pump circuit 262. This permits the multi-level charge pump buck converter 12C to provide a desired voltage level as the μC charge pump output voltage, $V_{\mu C\_OUT}$, and dependent upon the need of the parallel amplifier 35 on the parallel amplifier circuit 14D with different voltage output levels dependent upon the needs of the pseudo-envelope follower power management system 10E, depicted in FIG. 18B.

The clock management circuit 260, depicted in FIG. 18B, may include a clock reference 139, a divider circuit 266, a clock selection circuit 268, and an oscillator 270. The clock management circuit 260 may be coupled to controller 50 via various control signals and/or buses. Based upon control inputs received from the controller 50, the clock management circuit 260 may be configured to generate a μC charge pump clock 276, which is provided to the μC charge pump circuit 262. The controller 50 may configure the clock management circuit 260 to generate the μC charge pump clock 276 based upon a variety of clock sources.

The clock reference 139 may be operably configured to provide a clock reference signal 139A to the FLL circuit 54 of the multi-level charge pump buck converter 12C. The FLL circuit 54 may be configured to operate with the clock reference 139 similar to the operational description of the FLL circuit 54A of FIG. 3A or the FLL circuit 54B of FIG. 3B. In each case, as depicted in FIGS. 3A and 3B, the clock reference 139 may be configured to provide a clock reference signal 139A to the FLL circuit 54A or the FLL circuit 54B. In addition to governing various timing aspects regarding operation of the multi-level charge pump buck converter 12C, similar to the FLL circuit 54A of FIG. 3A, some embodiments of the FLL circuit 54 may be configured to provide a threshold scalar 137A signal, as depicted in FIG. 3A, to adjust the operating frequency of the multi-level charge pump buck converter 12C. Alternatively, in other embodiments of the FLL circuit 54, similar to the FLL circuit 54B, depicted in FIG. 3B, the FLL circuit 54 may be configured to provide a threshold scalar' 137B signal, as depicted in FIG. 3B, to adjust the operating frequency of the multi-level charge pump buck converter 12C.

In addition, as depicted in FIG. 18B, the FLL circuit 54 may be further configured to provide an FLL system clock 280 to the switcher control circuit 52 and the divider circuit 266. The FLL system clock 280 may be synchronized or based upon the operating frequency of the multi-level charge pump buck converter 12C, as previously described. As a result, in some embodiments of the pseudo-envelope follower power management system 10E, the FLL circuit 54 provides an FLL system clock 280 that is synchronized to the switching of the multi-level charge pump buck converter 12C.

The divider circuit 266 may be configured to receive a clock divider control signal 284 from the controller 50. Based upon the clock divider control signal 284 received from the controller 50, the divider circuit 266 may divide the FLL generated clock to provide a divided FLL clock 282 to the clock selection circuit 268. In addition, the clock selection circuit 268 may be configured to receive the clock reference signal 139A from the clock reference 139 and an oscillator reference clock 288 from the oscillator 270. Alternative embodiments of the multi-level charge pump buck converter 12C may not include an FLL circuit 54 or the FLL circuit 54 may not be configured to provide a FLL system clock 280 to the clock management circuit 260.

The oscillator 270 may be operably coupled to the controller 50 via an oscillator control signal 286. The controller 50 may be configured to modify the output frequency of the oscillator 270 via the oscillator control signal 286. The controller 50 may be further configured to disable or enable the oscillator 270 in order to reduce noise generated by the clock management circuit 260. In other embodiments of the clock management circuit 260, the oscillator 270 may be a fixed oscillator.

Accordingly, the controller 50 may configure the clock selection circuit 268 to provide one of the divided FLL clock 282, the clock reference signal 139A, or the oscillator reference clock 288 to the μC charge pump clock 276. As discussed below relative to FIGS. 19A-B, example embodiments of the μC charge pump circuit 262 may use the μC charge pump clock 276 to govern the timing between phases of operation of the μC charge pump circuit 262.

In some embodiments of the pseudo-envelope follower power management system 10E, depicted in FIG. 18B, the controller 50 may advantageously configure the clock selection circuit 268 to provide the divided FLL Clock 282 as the μC charge pump clock 276. As a result, the switching operations of the μC charge pump circuit 262 may be substantially synchronous to the switching operations of the multi-level charge pump buck converter 12C. In some embodiments of the pseudo-envelope follower power management system 10E, the synchronicity of operations between the μC charge pump circuit 262 and the multi-level charge pump buck converter 12C may improve or reduce the noise performance provided at the power amplifier supply voltage, $V_{CC}$. Alternatively, the controller 50 may configure the clock selection circuit 268 to provide the clock reference signal 139A as the μC charge pump clock 276 to the μC charge pump circuit 262. In this mode of operation, the switching between various phases of operation in the μC charge pump circuit 262 may be relatively stable. Alternatively, in still other embodiments of the pseudo-envelope follower power management system 10E, the clock selection circuit 268 is configured to provide the fixed frequency reference clock as the μC charge pump clock 276.

In addition, the controller 50 may further provide an FLL circuit control signal 292 to govern the operation of the FLL circuit 54 of the multi-level charge pump buck converter 12C. The FLL circuit control signal 292 may include one or more control signals used to configure the FLL circuit 54. Via the FLL circuit control signal 292, the controller 50 may configure various time constants and control parameters resident in the FLL circuit 54 (not shown) to optimally extract the operating frequency of the multi-level charge pump buck converter 12C so as to reduce the overall voltage ripple that occurs at the power amplifier supply voltage $V_{CC}$. The configuration of the FLL circuit 54 may depend upon various factors, including, but not limited to the maximum expected parallel amplifier supply voltage $V_{CC\_MAX}$, the minimum expected parallel amplifier supply voltage $V_{CC\_MIN}$, the expected waveform generated by the power amplifier, the envelope and signal transmission characteristics of the signal to be transmitted, the peak-to-average ratio of the envelope of the signal to be transmitted, the data rate, the bandwidth of the channel and/or the type of modulation used to the desired waveform. Moreover, controller 50 may configure the FLL circuit 54 to minimize the overall noise or output ripple.

The parallel amplifier power source selection circuit 272 is configured to receive the internal charge pump node parallel amplifier supply 294 from the multi-level charge pump circuit 258, of the multi-level charge pump buck converter 12C, or the μC charge pump circuit output voltage, $V_{\mu C\_OUT}$, which is generated at the μC charge pump output. The parallel amplifier power source selection circuit 272 may be configured to be operably coupled to the controller 50 via a source selection control signal. Via the source selection control signal 296, the controller 50 may configure the parallel amplifier power source selection circuit 272 to select a desired input supply from either the internal charge pump node parallel amplifier supply or the μC charge pump output, to be provided as the parallel amplifier supply voltage $V_{SUPPLY\_PARA\_AMP}$ to the parallel amplifier circuitry 32.

In an alternative embodiment of the pseudo-envelope follower power management system 10E, the parallel amplifier power source selection circuit 272 may be eliminated in the case where the internal charge pump node parallel amplifier supply or the μC charge pump output are directly coupled to the parallel amplifier supply, $V_{SUPPLY\_PARA\_AMP}$. For example, some embodiments of the multi-level charge pump buck converter 12C may include a multi-level charge pump that does not provide an internal charge pump node parallel amplifier supply as an output. In this case, the μC charge pump output of the μC charge pump circuit 262 is directly coupled to the parallel amplifier circuit 14C to provide the parallel amplifier supply voltage $V_{SUPPLY\_PARA\_AMP}$, as the operational voltage for the parallel amplifier 35 and associated circuitry.

In addition, similar to the parallel amplifier circuit 14A and the parallel amplifier circuit 14B, depicted in FIGS. 2A-2B, the parallel amplifier circuit 14D may also include an embodiment of the $V_{OFFSET}$ loop circuit 41 as $V_{OFFSET}$ load circuit 41B. The $V_{OFFSET}$ load circuit 41B may be configured to regulate the offset voltage, $V_{OFFSET}$, that is developed across the coupling circuit 18. Similar to the $V_{OFFSET}$ loop circuit 41 of FIGS. 2A-2B, the $V_{OFFSET}$ loop circuit 41B may provide a threshold offset current 42, $I_{THRESHOLD\_OFFSET}$, to the switcher control circuit 52 of the multi-level charge pump buck converter 12C, where the threshold offset current 42, $I_{THRESHOLD\_OFFSET}$, provides an estimate of the magnitude of the offset voltage, $V_{OFFSET}$, appearing across the coupling circuit 18.

The $V_{OFFSET}$ loop circuit 41B may include a summing circuit 300, a $V_{OFFSET}$ target signal section circuit 308, a pre-filter 313, and an integrator with zero compensation 314 operably configured to generate the threshold offset current 42, $I_{THRESHOLD\_OFFSET}$, based upon the power amplifier supply voltage, $V_{CC}$, the parallel amplifier output 32A, and a $V_{OFFSET}$ target signal 302. The $V_{OFFSET}$ target signal section circuit 308 may include a first input configured to receive a target offset voltage parameter, $V_{OFFSET\_TARGET}$, a second input configured to receive the $V_{RAMP}$ signal, and a third input configured to receive a filtered $V_{RAMP}$ signal from the pre-filter 313. The $V_{OFFSET}$ target signal section circuit 308 may be configured to receive a target selection signal 310 from the controller 50. Based upon the target selection signal 310 received from the controller 50, the $V_{OFFSET}$ target signal section circuit 308 provides one of the target offset voltage parameter, $V_{OFFSET\_TARGET}$, the $V_{RAMP}$ signal, or the filtered $V_{RAMP}$ signal as a $V_{OFFSET}$ target signal 302 to the summing circuit 300. In some alternative embodiments, the $V_{OFFSET}$ target signal section circuit 308 may be controlled via a $V_{OFFSET}$ control bus 312 that is coupled to the $V_{OFFSET}$ loop circuit 41B.

The pre-filter 313 may be similar to the frequency pre-distortion circuit 254, depicted in FIG. 10. Similar to the frequency pre-distortion circuit 254, the pre-filter 313 may include a frequency equalizer circuit that includes programmable time constants. Illustratively, the programmable time constants may include a programmable pole time constant, $Tau_P$, and a programmable zero time constant, $Tau_Z$. The controller 50 may adjust the values of the programmable pole time constant, $Tau_P$, and a programmable zero time constant, $Tau_Z$, to adjust the frequency response of the pre-filter 313. In some embodiments of the parallel amplifier circuit 14D, the output of the frequency pre-distortion circuit 254 may be used as the third input to the $V_{OFFSET}$ target signal section circuit 308 instead of providing a dedicated pre-filter 313.

The summing circuit 300 may include a positive terminal operably coupled to the power amplifier supply voltage, $V_{CC}$, a first negative terminal coupled to the parallel amplifier output 32A, and a second negative terminal configured to receive the $V_{OFFSET}$ target signal 302. The summing circuit 300 subtracts the parallel amplifier output 32A and the $V_{OFFSET}$ target signal from the power amplifier supply voltage, $V_{CC}$, to generate a $V_{OFFSET}$ error signal 304. The $V_{OFFSET}$ error signal 304 may be provided to the integrator with zero compensation 314, which filters the $V_{OFFSET}$ error signal 304 to generate a threshold offset current 42, $I_{THRESHOLD\_OFFSET}$.

The $V_{OFFSET}$ loop circuit 41B may be configured to create an almost constant DC voltage across the coupling circuit 18 in order to shift the power amplifier supply voltage, $V_{CC}$, down by a fixed amount in order to minimize the peak voltage present at the parallel amplifier output 32A.

Figure 6C:
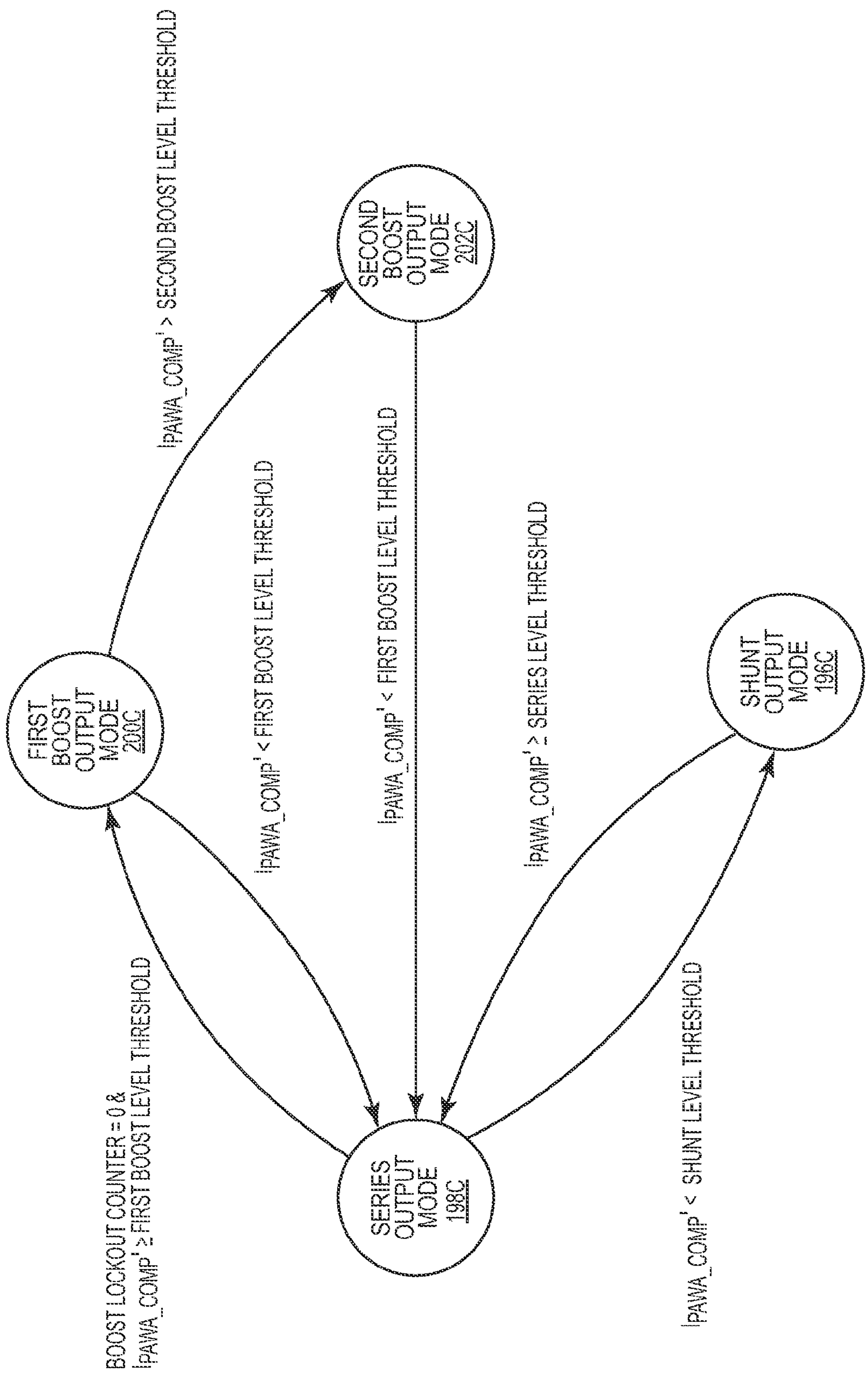
FIG. 6C depicts an embodiment of a second state machine of the threshold detector and control circuit of FIG. 4C.
Figure 6D:
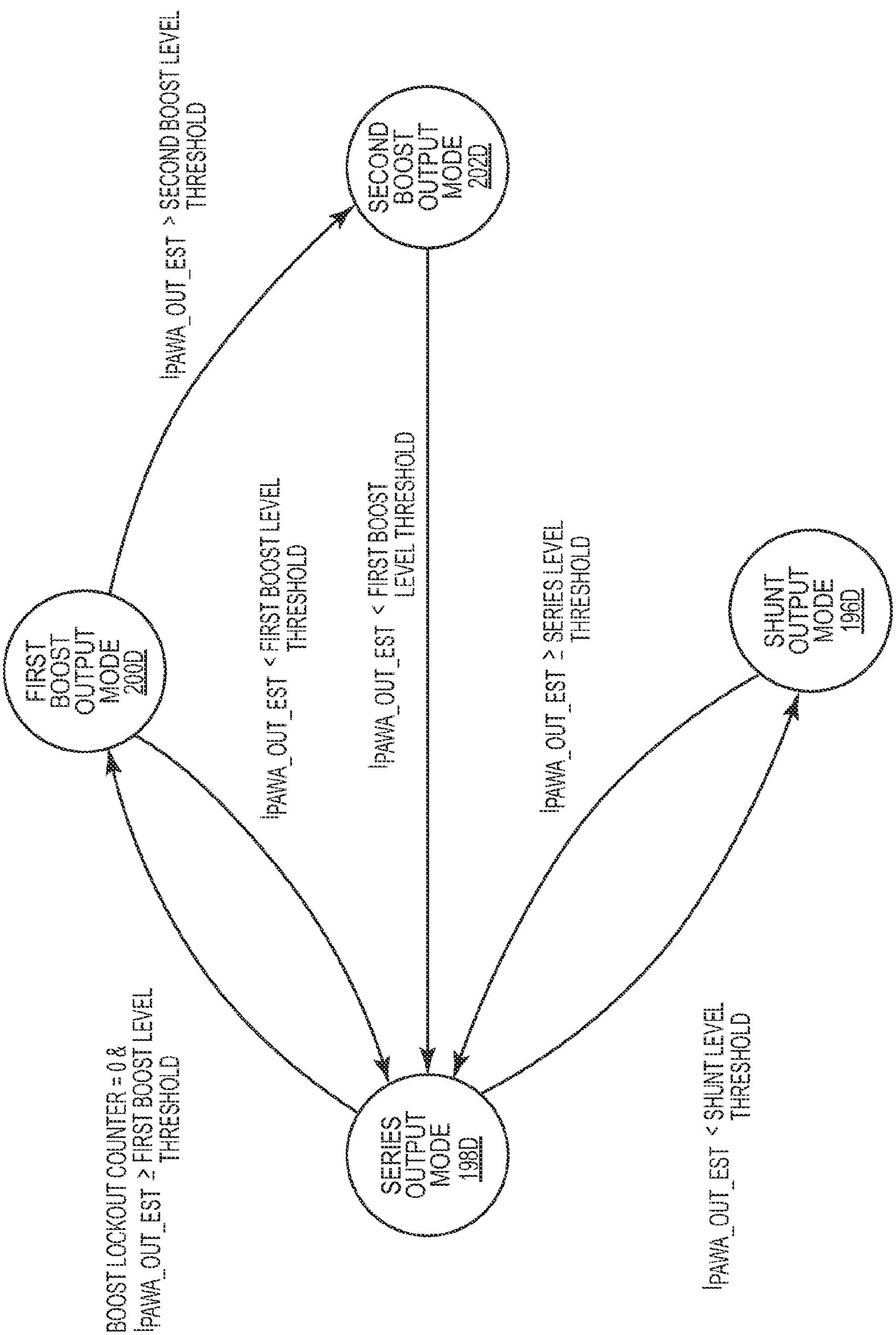
FIG. 6D depicts an embodiment of a second state machine of the threshold detector and control circuit of FIG. 4D.

As discussed with respect to the various embodiments of the switcher control circuits 52A-C and 52E-G, depicted in FIGS. 3A-C and E-G, FIGS. 4A-C and E-G, FIGS. 5A-C and E-G, and FIGS. 6A-C, the shunt level threshold 124, the series level threshold 126, the first boost level threshold 128, and a second boost level threshold 130 may be offset by the threshold offset current 42, $I_{THRESHOLD\_OFFSET}$, which is generated by the $V_{OFFSET}$ loop circuit 41B to control the offset voltage, $V_{OFFSET}$, across the coupling circuit 18, as depicted in FIGS. 18A-D.

The integrator with zero compensation 314 may include a filter having a first time constant, $Tau_0$, and a second time constant, $Tau_1$. The integrator with zero compensation 314 may have a filter response that is equivalent to a Laplace transfer function equal to $[(1+Tau_0*s)/(Tau_1*s)]$. The values of the first time constant, $Tau_0$, and a second time constant, $Tau_1$, may be programmed by the controller 50 via the $V_{OFFSET}$ control bus 312. The values of the first time constant, $Tau_0$, and a second time constant, $Tau_1$. may be selected to optimize the bandwidth of the $V_{OFFSET}$ loop circuit to provide loop stability and a desired response time depending upon the capacitance of the coupling circuit 18 across which the offset voltage, $V_{OFFSET}$, is developed.

In addition, the $V_{OFFSET}$ loop circuit 41B may further be configured to permit selection of the value of the first time constant, $Tau_0$, and a second time constant, $Tau_1$, dependent upon whether the coupling circuit 18 requires pre-charging before initiation of a data burst to be sent by the linear RF power amplifier 22, as depicted, for example, in FIGS. 1A-B and 2A-B. For example, if the data burst to be sent is a first data burst of the transmission, the controller 50 may determine that the coupling circuit 18 requires pre-charging prior to transmission of the first data burst.

In some embodiments of the $V_{OFFSET}$ loop circuit 41B, the controller 50 may store a first startup time constant, $Tau_0$_startup, and a second startup time constant, $Tau_1$_startup, as local parameters. The $V_{OFFSET}$ loop circuit 41B may be configured to use the first startup time constant, $Tau_0$_startup, and the second startup time constant, $Tau_1$_startup, during a pre-charging phase of operation of the $V_{OFFSET}$ loop circuit 41B. When the $V_{OFFSET}$ loop circuit 41B is configured to operate using the first startup time constant, $Tau_0$_startup, as the first time constant, $Tau_0$, and the second startup time constant, $Tau_1$_startup, as the second time constant, $Tau_1$, the operational bandwidth of the $V_{OFFSET}$ loop circuit 41B is increased to permit faster pre-charging of the coupling circuit 18.

In addition, in some embodiments of the $V_{OFFSET}$ loop circuit 41B, the controller 50 may store a first normal time constant, $Tau_0$_normal, and a second normal time constant, $Tau_1$_normal, as local parameters in the $V_{OFFSET}$ loop circuit 41B. When the $V_{OFFSET}$ loop circuit 41B is configured to operate using the first normal constant, $Tau_0$_normal, as the first time constant, $Tau_0$, and the second normal time constant, $Tau_1$_normal, as the second time constant, $Tau_1$, the operational bandwidth of the $V_{OFFSET}$ loop circuit 41B is decreased to operate in a normal mode of operation.

Some embodiments of the $V_{OFFSET}$ loop circuit 41B may include a pre-charge mode of operation that permits the controller to place the $V_{OFFSET}$ loop circuit 41B into a pre-charge mode of operation for a predetermined period of time. For example, the $V_{OFFSET}$ loop circuit 41B may include a pre-charge timer (not shown) that may be programmed by the controller 50 to generate a timer event after a predetermined time period. When in the pre-charge mode of operation, the $V_{OFFSET}$ loop circuit 41B uses the first startup time constant, $Tau_0$_startup, as the first time constant, $Tau_0$, and the second startup time constant, $Tau_1$_startup, as the second time constant, $Tau_1$, which increases the operational bandwidth of the $V_{OFFSET}$ loop circuit 41B. As an example, when starting from power-off mode to active mode, the time constant of the $V_{OFFSET}$ loop circuit 41B may be programmatically reduced by the controller 50 by up to a factor of five to allow a quick initial pre-charging of the coupling circuit 18. For example, pre-charging may be done prior to the beginning of a transmission-slot in order to reduce the time to have the voltage completely settled to the target value for the first power-up. As an example, the transmission-slot may be a burst transmission-slot in which data is transmitted by the linear RF power amplifier. The controller 50 may configure the $V_{OFFSET}$ loop circuit 41B to operate in a higher bandwidth during the initial pre-charging of reactive components of the coupling circuit 18.

In some cases, the loop bandwidth of the $V_{OFFSET}$ loop circuit 41B may be set to provide up to five times the bandwidth used at the beginning of a burst transmission time-slot. The controller 50 operably re-configures the $V_{OFFSET}$ loop circuit 41B back to a lower or operational bandwidth at the beginning of the burst transmission-slot. In other alternative embodiments of the pseudo-envelope follower power management system, the controller 50 operably re-configures the $V_{OFFSET}$ loop circuit 41B to have a bandwidth between 3 and 7 times the bandwidth used at the beginning of a burst transmission time-slot. Advantageously, configuring the $V_{OFFSET}$ loop circuit 41B to operate with a higher loop bandwidth during initial pre-charging of the reactive components of the coupling circuit 18 decreases the startup delay of the pseudo-envelope follower power management system, which provided an improvement in overall power efficiency.

The $V_{OFFSET}$ loop circuit 41B may be monitored and modified in a dynamic fashion. For example, the timing/filter parameters associated with the integrator with zero compensation circuit and desired $V_{OFFSET}$ voltage, set by the $V_{OFFSET\_TARGET}$ parameter, may be monitored and modified by the controller 50 on a burst time-slot basis.

The $V_{OFFSET}$ loop circuit 41B may be configured to operate in a higher loop band width mode of operation when no modulation is present on the $V_{RAMP}$ signal. For example, at either the beginning of the slot or between inter-slots, when the $V_{RAMP}$ signal is inactive, the controller 50 may configure the $V_{OFFSET}$ loop circuit 41B to operate in a higher bandwidth mode of operation to improve initial startup regulation of the offset voltage, $V_{OFFSET}$. Alternatively, or in addition, the $V_{OFFSET}$ loop circuit 41B may be configured to switch from the $V_{OFFSET}$ loop lower loop bandwidth mode of operation to $V_{OFFSET}$ loop higher loop band width mode of operation when no modulation is present on the $V_{RAMP}$ signal.

As another example, the controller 50 may program the pre-charge timer (not shown) to trigger an event after a predetermined pre-charge time period. Upon the trigger event, the $V_{OFFSET}$ loop circuit 41B may be automatically re-configured to set the first normal time constant, $Tau_0$, to be equal to $Tau_0$_normal and the second time constant, $Tau_1$, to be equal to $Tau_1$_normal. As a result, after the predetermined pre-charge time period, the $V_{OFFSET}$ loop circuit 41B is re-configured to operate with a normal bandwidth to ensure loop stability. This has the advantage of permitting the $V_{OFFSET}$ loop circuit 41B to operate in a higher bandwidth mode during pre-charging and in a lower bandwidth mode during normal operation without requiring the controller 50 to reconfigure the $V_{OFFSET}$ loop circuit 41B after a predetermined pre-charge period of time to operate in a mode having a bandwidth that is appropriate for normal operation of the pseudo-envelope follower power management system.

In the various embodiments of the switcher control circuit depicted in FIGS. 3A-C and E-G, FIGS. 4A-C and E-G, FIGS. 5A-C and E-G, and FIGS. 6A-C, the threshold offset current 42, $I_{THRESHOLD\_OFFSET}$, generated by the $V_{OFFSET}$ loop circuit 41 is generally used to raise and lower the point at which the first comparator 140, the second comparator 142, the third comparator 144, and the fourth comparator 146 trigger. However, in some alternative embodiment of the threshold detector and control circuits 132A-C and E-G, the threshold offset current 42, $I_{THRESHOLD\_OFFSET}$, may be used to only shift the triggering threshold of less than all of the first comparator 140, the second comparator 142, the third comparator 144, and the fourth comparator 146. For example, referring to FIG. 4C, the threshold detector and control circuit 132C may be reconfigured such that the threshold offset current 42, $I_{THRESHOLD\_OFFSET}$, only shifts the triggering threshold of the second comparator 142. The effect is to only shift the triggering threshold of the comparator associated with the series level threshold 126 based upon the threshold offset current 42, $I_{THRESHOLD\_OFFSET}$. Similarly, as another example of an alternative embodiment, the threshold detector and control circuit 132G, depicted in FIG. 4G, may be reconfigured such that the threshold offset current 42, $I_{THRESHOLD\_OFFSET}$, only shifts the triggering threshold of the first comparator 140. The effect is to only shift the triggering threshold of the comparator associated with the shunt level threshold 124 based upon the threshold offset current 42, $I_{THRESHOLD\_OFFSET}$.

The shunt level threshold 124, the series level threshold 126, the first boost level threshold 128, and the second boost level threshold 130 may be offset by threshold offset current 42, $I_{THRESHOLD\_OFFSET}$, which is generated by the $V_{OFFSET}$ loop circuit 41B to control the offset voltage, $V_{OFFSET}$, across the coupling circuit 18, as depicted in FIGS. 18A-D.

The battery level sense circuit 264 may be coupled to the controller 50 via the battery level sense signal. The battery level sense circuit 264 may be operably configured to measure or determine the voltage level of the battery, ($V_{BAT}$). The voltage measured or determined voltage level of the battery may be provided to or obtained by the controller 50 via the battery level sense circuit. In alternative embodiments, not shown, the battery level sense circuit 264 may be configured to interface with the controller 50 via a control bus. Accordingly, the controller may use the voltage level of the battery, ($V_{BAT}$), to configure the various operational components of the pseudo-envelope follower power management system 10E.

FIG. 18A further depicts another embodiment of a pseudo-envelope follower power management system 10C that is similar to the embodiment of the pseudo-envelope follower power management system 10E, depicted in FIG. 18B, except that the parallel amplifier circuit 14D is replaced by the parallel amplifier circuit 14C. The parallel amplifier circuit 14C is similar to the parallel amplifier circuit 14D, depicted in FIG. 18B, except that the $V_{OFFSET}$ loop circuit 41B is replaced by the $V_{OFFSET}$ loop circuit 41A. The $V_{OFFSET}$ loop circuit 41A is operably configured to operate in a similar fashion as the $V_{OFFSET}$ loop circuit 41B except that the integrator with zero compensation circuit is replaced with a $K_{ERROR\_GAIN}$ circuit 306 configured to receive the $V_{OFFSET}$ error signal 304 from the summing circuit 300. The $K_{ERROR\_GAIN}$ circuit 306 may be configured to multiply the $V_{OFFSET}$ error signal 304 by a $K_{ERROR\_GAIN}$ parameter to generate the threshold offset current 42, $I_{THRESHOLD\_OFFSET}$. The controller 50 may be configured to modify the $K_{ERROR\_GAIN}$ parameter dependent upon the operational needs of the linear RF power amplifier.

Illustratively, unlike the operation of the $V_{OFFSET}$ loop circuit 41B described above, where the filter having a first time constant, $Tau_0$, and the second time constant, $Tau_1$, may be modified to optimize the bandwidth of the $V_{OFFSET}$ loop circuit 41B during pre-charging of the coupling circuit 18, prior to initiation of a data burst to be sent by the linear RF power amplifier 22, as depicted, for example, in FIGS. 1A-B and 2A-B, the controller 50 may selectively modify the $K_{ERROR\_GAIN}$ value to provide a pre-charge mode of operation for a pre-determined period of time. During the pre-charge mode of operation, the controller 50 may increase the value of the $K_{ERROR\_GAIN}$ to effectively provide higher loop bandwidth. After a predetermined period of time, the controller may decrease the $K_{ERROR\_GAIN}$ value to provide a lower loop bandwidth to ensure stable operation of the $V_{OFFSET}$ loop circuit 41A.

While the pseudo-envelope follower power management system 10C, depicted in FIG. 18A, and the pseudo-envelope follower power management system 10E, depicted in FIG. 18B, only depict the respective parallel amplifier circuit 14C and parallel amplifier circuit 14D providing the scaled parallel amplifier output current estimate, $I_{PARA\_AMP\_SENSE}$, as a feedback signal to the switcher control circuit 52 of the multi-level charge pump buck converter 12C, this is by example and not limitation. Accordingly, some embodiments of the pseudo-envelope follower power management system 10C and the pseudo-envelope follower power management system 10E may further include an open loop assist circuit similar to the open loop assist circuit 39, as depicted in FIG. 2A with respect to the pseudo-envelope follower power management system 10A and depicted in FIG. 10B with respect to the pseudo-envelope follower power management system 10B, and/or the example embodiments of the open loop assist circuit 39, the open loop assist circuit 39A, depicted in FIG. 9A, and the open loop assist circuit 39B, depicted in FIG. 9B. In this case, as shown in FIGS. 2A-B, the scaled parallel amplifier output current estimate, $I_{PARA\_AMP\_SENSE}$, is combined with the open loop assist circuit output current estimate, $I_{ASSIST\_SENSE}$, as depicted in FIGS. 2A-B, to form the parallel amplifier circuit output current estimate 40, $I_{PAWA\_OUT\_EST}$, which is used as a feedback signal to the switcher control circuit 52. Accordingly, the switcher control circuit 52 and operation of the multi-level charge pump buck converter 12C depicted in FIGS. 18A-B may also incorporate various combinations of the operational features and functions of the embodiments of the switcher control circuits 52A-D, depicted in FIGS. 3A-D, the threshold detector and control circuits 132A-D, depicted in FIGS. 4A-D, and the circuitry and state machines associated with the logic circuits 148A-D, depicted in FIGS. 4A-D.

FIG. 18C depicts an embodiment of a pseudo-envelope follower power management system 10D that is similar to the pseudo-envelope follower power management system 10C, depicted in FIG. 18A and discussed below. However, unlike the pseudo-envelope follower power management system 10C, depicted in FIG. 18A, the multi-level charge pump buck converter 12C is replaced by a buck converter 13A. As depicted in FIG. 18C, the buck converter 13A, depicted in FIG. 18C, does not include a multi-level charge pump circuit 258.

Also similar to the pseudo-envelope follower power management system 10C, depicted in FIG. 18A, the pseudo-envelope follower power management system 10D, depicted in FIG. 18C, further includes an embodiment of a $V_{OFFSET}$ loop circuit 41A configured to provide a threshold offset current 42, $I_{THRESHOLD\_OFFSET}$. However, unlike the pseudo-envelope follower power management system 10D, depicted in FIG. 18C, the threshold offset current 42, $I_{THRESHOLD\_OFFSET}$, is provided to the switcher control circuit 259 of the buck converter 13A.

In addition, because the buck converter 13A does not include the multi-level charge pump circuit 258, the parallel amplifier power source selection circuit 272 is eliminated and the μC charge pump output of the μC charge pump circuit 262 is directly coupled to the parallel amplifier circuit 14C in order to provide the parallel amplifier supply voltage, $V_{SUPPLY\_PARA\_AMP}$ to the parallel amplifier 35 of the parallel amplifier circuitry 32.

As further depicted in FIG. 18C, unlike the multi-level charge pump buck converter 12C, depicted in FIG. 18A, the buck converter 13A also replaces the switcher control circuit 52 with a switcher control circuit 259. Like the switcher control circuit 52, the switcher control circuit 259 provides a series switch control signal 66 and a shunt switch control signal 68 to the switching circuit 58. Like the switcher control circuit 52 depicted in FIG. 18A, the switcher control circuit 259, depicted in FIG. 18C, may be further configured to receive the threshold offset current 42, $I_{THRESHOLD\_OFFSET}$, from the $V_{OFFSET}$ loop circuit 41A.

Although the embodiment of the pseudo-envelope follower power management system 10D, depicted in FIG. 18C, only depicts that the switcher control circuit 259 is configured to receive the scaled parallel amplifier output current estimate, $I_{PARA\_AMP\_SENSE}$, as discussed above with respect to the embodiment of the pseudo-envelope follower power management system 10E, depicted in FIG. 18B, and discussed below, with respect to the pseudo-envelope follower power management system 10C, depicted in FIG. 18A, this is by example and not by limitation. Some embodiments of the parallel amplifier circuit 14C of FIG. 18C may further include an open loop assist circuit 39 similar to the open loop assist circuit 39 depicted in FIGS. 2A-B, and/or the example embodiments of the open loop assist circuit 39, the open loop assist circuit 39A, depicted in FIG. 9A, and the open loop assist circuit 39B, depicted in FIG. 9B. Accordingly, in those cases where an open loop assist circuit is included in the parallel amplifier circuit 14C, as depicted in FIGS. 2A-B, the scaled parallel amplifier output current estimate, $I_{PARA\_AMP\_SENSE}$, is combined with the open loop assist circuit output current estimate, $I_{ASSIST\_SENSE}$, depicted in FIGS. 2A-B, to form the parallel amplifier circuit output current estimate 40, $I_{PAWA\_OUT\_EST}$, that may be provided as a feedback signal to the switcher control circuit 259.

Figure 3E:
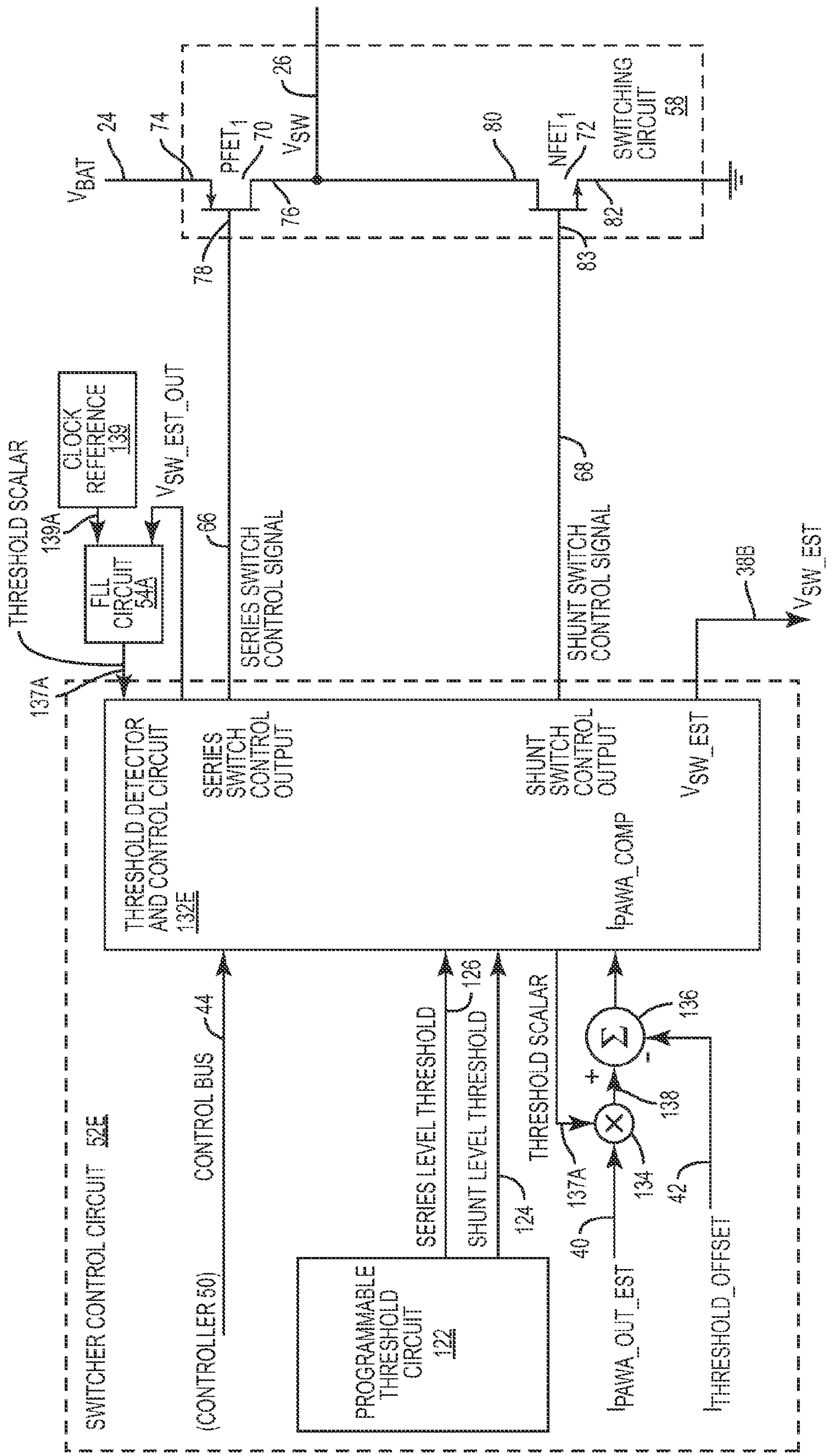
FIG. 3E depicts another embodiment of a portion of a buck converter.

Accordingly, example embodiments of the switcher control circuit 259 of the buck converter 13A will now be described, as further depicted in FIGS. 3E-H. One example embodiment of the switcher control circuit 259 of the buck converter 13A is depicted in FIG. 3E as switcher control circuit 52E. The switcher control circuit 52E is functionally similar to the switcher control circuit 52A, depicted in FIG. 3A, except the circuitry associated with the multi-level charge pump circuit 56 is eliminated. As a result, for example, the threshold detector and control circuit 132E, of FIG. 3E, does not include a first boost level threshold 128, a second boost level threshold 130, the third comparator 144, or the fourth comparator 146. Also, as discussed above, the parallel amplifier circuit output current estimate 40, $I_{PAWA\_OUT\_EST}$, depicted in FIG. 3E, may be provided by the scaled parallel amplifier output current estimate, $I_{PARA\_AMP\_SENSE}$, or, in the case where an open loop assist circuit is included in the parallel amplifier circuit 14C of FIG. 18C, the sum of the scaled parallel amplifier output current estimate, $I_{PARA\_AMP\_SENSE}$, and the open loop assist circuit output current estimate, $I_{ASSIST\_SENSE}$.

Figure 4E:
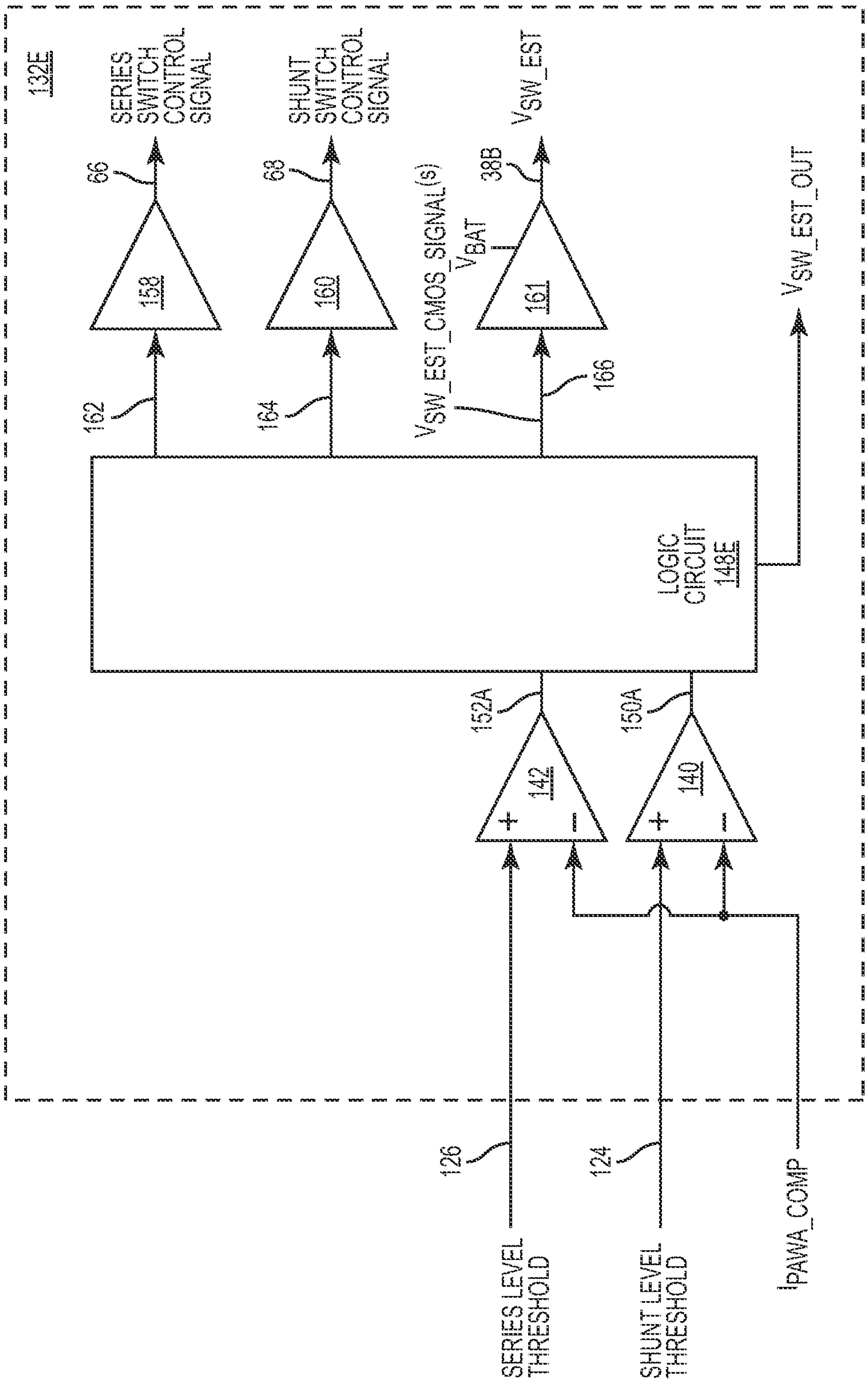
FIG. 4E depicts an embodiment of a threshold detector and control circuit of a buck converter.
Figure 5E:
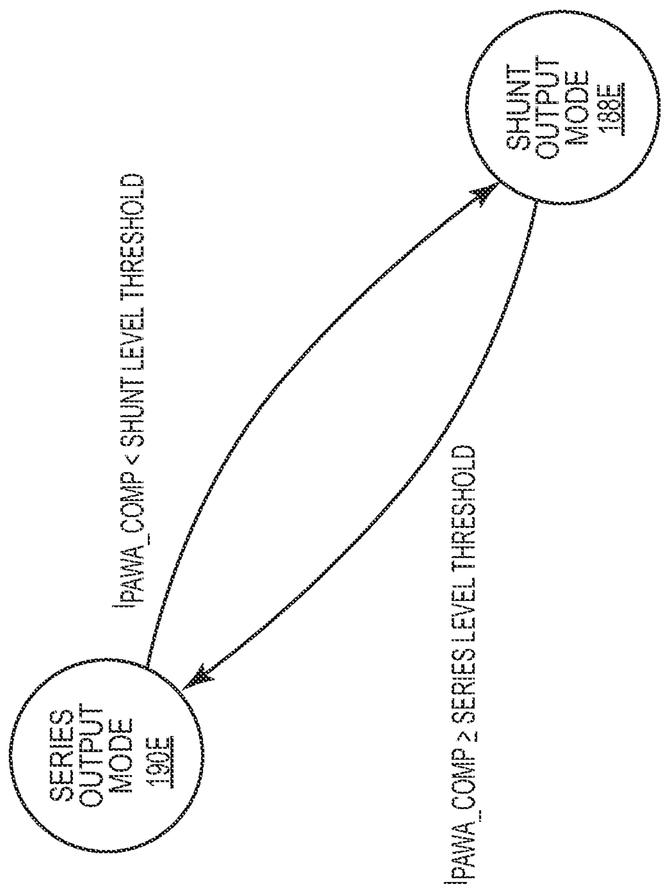
FIG. 5E depicts an embodiment of a first state machine of the threshold detector and control circuit of FIG. 4E.

One embodiment of the threshold detector and control circuit 132E is depicted in FIG. 4E, which is described with continuing reference to FIG. 3E and FIG. 5E. The threshold detector and control circuit 132E may be functionally similar to the threshold detector and control circuit 132A, depicted in FIG. 4A, except the circuitry associated with the multi-level charge pump circuit 56 is eliminated. As a result, the logic circuit 148E is configured to operate as a buck converter based upon the magnitude of the compensated parallel amplifier circuit output current estimate, $I_{PAWA\_COMP}$, relative to the shunt level threshold 124 and the series level threshold 126. In addition, unlike the threshold detector and control circuit 132A depicted in FIG. 4A, the first state machine used to control the logic circuit 148E may be simplified. Illustratively, FIG. 5E depicts an example embodiment of a first state machine of the logic circuit 148E that may include a shunt output mode 188E and a series output mode 190E, and which is described with continuing reference to FIGS. 3E and 4E.

In the shunt output mode 188E, the logic circuit 148E configures the series switch control output 162 to drive the first output buffer 158 to generate a series switch control signal 66 such that the series switch 70, depicted in FIG. 3E, is in an open state (not conducting). The logic circuit 148E also configures the shunt switch control output 164 to drive the second output buffer 160 such that the shunt switch 72, depicted in FIG. 3E, is in a closed state (conducting). As a result, the switching voltage output 26 of FIG. 3E is configured to provide a switching voltage, $V_{SW}$, substantially equal to ground. As depicted in FIG. 5E, in response to assertion of the series level indication 152A, which indicates that the compensated parallel amplifier circuit output current estimate, $I_{PAWA\_COMP}$, is greater than or equal to the series level threshold 126, the logic circuit 148E configures the first state machine to transition to the series output mode 190E. Otherwise the first state machine remains in the shunt output mode 188E.

In the series output mode 190E, the logic circuit 148E configures the series switch control output 162 to drive the first output buffer 158 to generate a series switch control signal 66 such that the series switch 70, depicted in FIG. 3E, is in a closed state (conducting). The logic circuit 148E also configures the shunt switch control output 164 to drive the second output buffer 160 such that the shunt switch 72, depicted in FIG. 3E, is in an open state (not conducting). As a result, the switching voltage output 26, depicted in FIG. 3E, is configured to provide a switching voltage, $V_{SW}$, substantially equal to the direct current (DC) voltage, $V_{BAT}$, provided by the battery 20. In response to de-assertion of the shunt level indication 150A, depicted in FIG. 4E, which indicates that the compensated parallel amplifier circuit output current estimate, $I_{PAWA\_COMP}$, is less than the shunt level threshold 124, the logic circuit 148E configures the first state machine to transition to the shunt output mode 188E, as depicted in FIG. 5E. Otherwise, the logic circuit 148E configures the first state machine to remain in the series output mode 190E.

Figure 3F:
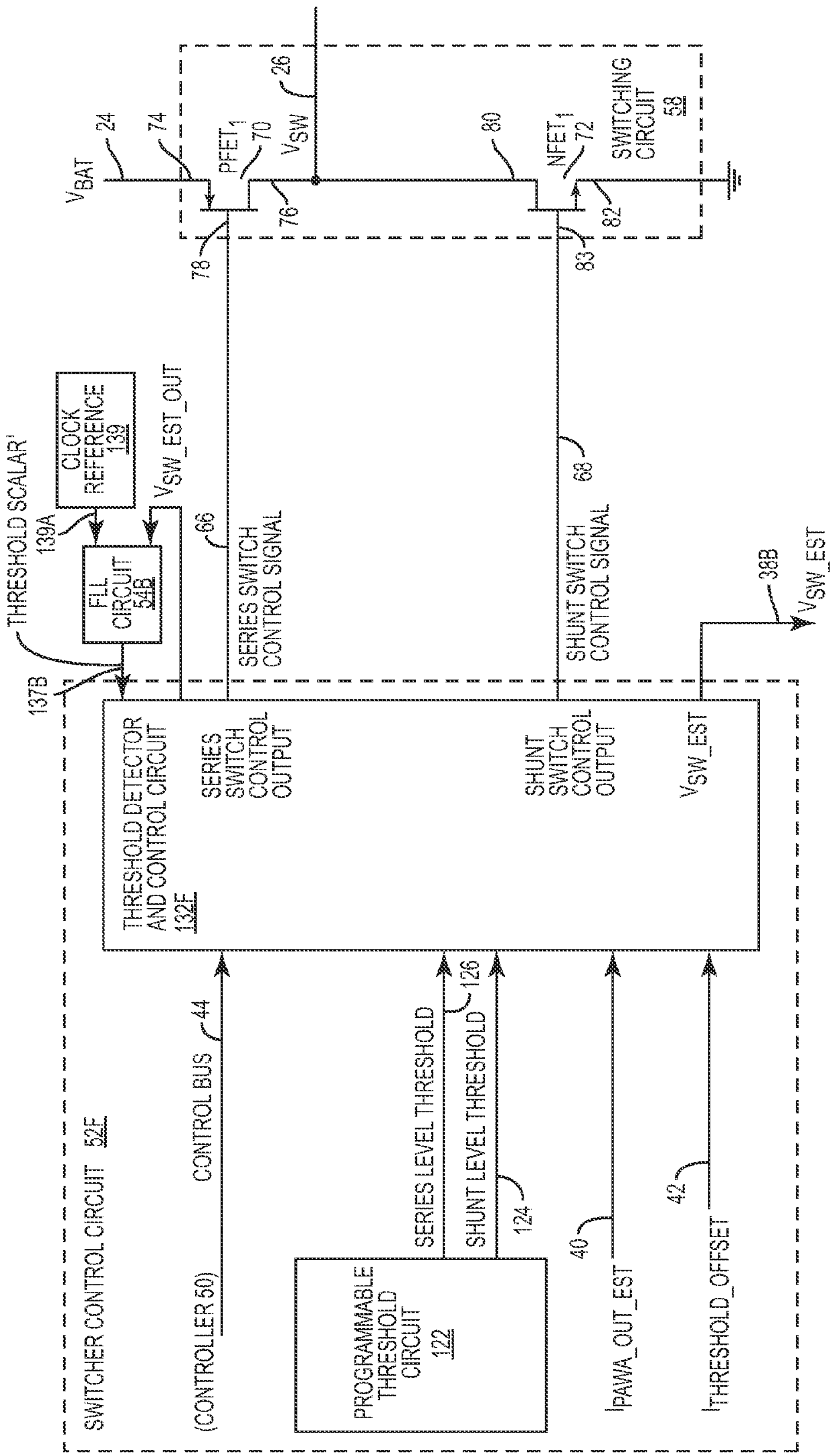
FIG. 3F depicts another embodiment of a portion of a buck converter.

Another embodiment of the switcher control circuit 259 of the buck converter 13A is depicted in FIG. 3F as switcher control circuit 52F. The switcher control circuit 52F may be functionally similar to the switcher control circuit 52B, depicted in FIG. 3B, except the circuitry associated with the multi-level charge pump circuit 56 is eliminated. As a result, for example, the threshold detector and control circuit 132F, of FIG. 3F, does not include the first boost level threshold 128, the second boost level threshold 130, the third comparator 144, or the fourth comparator 146. Also, as discussed above, the parallel amplifier circuit output current estimate 40, $I_{PAWA\_OUT\_EST}$, depicted in FIG. 3F, may be provided by the scaled parallel amplifier output current estimate, $I_{PARA\_AMP\_SENSE}$, or, in the case where an open loop assist circuit is included in the parallel amplifier circuit 14C of FIG. 18C, the sum of the scaled parallel amplifier output current estimate, $I_{PARA\_AMP\_SENSE}$, and the open loop assist circuit output current estimate, $I_{ASSIST\_SENSE}$.

Figure 4F:
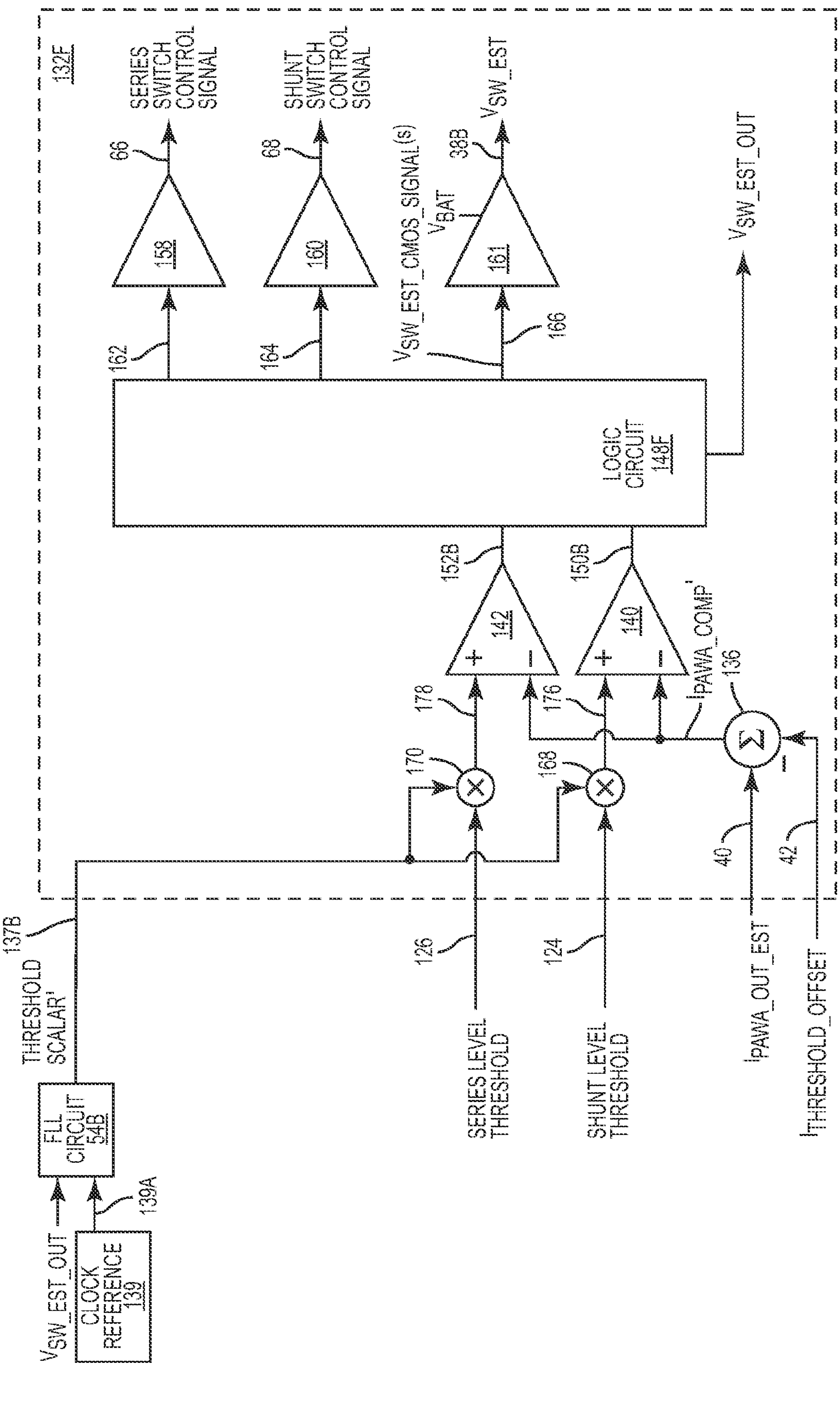
FIG. 4F depicts another embodiment of a threshold detector and control circuit of a buck converter.
Figure 5F:
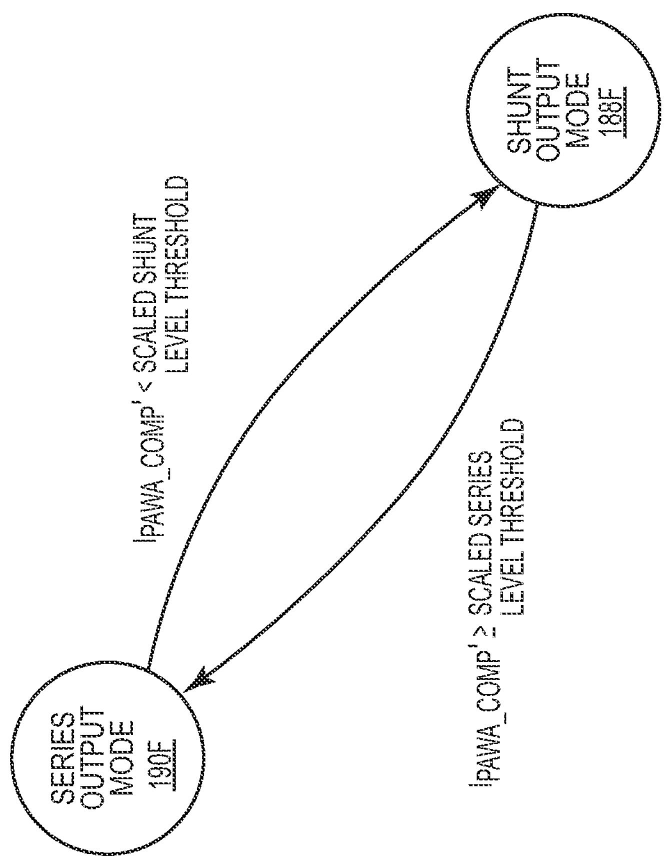
FIG. 5F depicts an embodiment of a first state machine of the threshold detector and control circuit of FIG. 4F.

One embodiment of the threshold detector and control circuit 132F of FIG. 3F is further depicted in FIG. 4F. The threshold detector and control circuit 132F may be functionally similar to the threshold detector and control circuit 132B, depicted in FIG. 4B, except the circuitry associated with the multi-level charge pump circuit 56 is eliminated. As a result, for example, the logic circuit 148F is configured to operate as a buck converter based upon the magnitude of the compensated parallel amplifier circuit output current estimate, $I_{PAWA\_COMP}'$, relative to the scaled shunt level threshold 176 and the scaled series level threshold 178. In addition, unlike the threshold detector and control circuit 132B, depicted in FIG. 4B, the first state machine used to control the logic circuit 148F may be simplified. As an example, FIG. 5F depicts an example embodiment of a first state machine of the logic circuit 148F that includes a shunt output mode 188F and a series output mode 190F, which is described with continuing reference to FIGS. 3F and 4F.

In the shunt output mode 188F, the logic circuit 148F, depicted in FIG. 4F, configures the series switch control output 162 to drive the first output buffer 158 to generate a series switch control signal 66 such that the series switch 70, depicted in FIG. 3F, is in an open state (not conducting). The logic circuit 148F also configures the shunt switch control output 164 to drive the second output buffer 160 such that the shunt switch 72, depicted in FIG. 3F, is in a closed state (conducting). As a result, the switching voltage output 26 of FIG. 3F is configured to provide a switching voltage, $V_{SW}$, substantially equal to ground. As depicted in FIG. 4F, in response to assertion of the series level indication 152B, which indicates that the compensated parallel amplifier circuit output current estimate, $I_{PAWA\_COMP}'$, is greater than or equal to the scaled series level threshold 178, the logic circuit 148F configures the first state machine to transition to the series output mode 190F. Otherwise the first state machine remains in the shunt output mode 188F.

In the series output mode 190F, the logic circuit 148F configures the series switch control output 162 to drive the first output buffer 158 to generate a series switch control signal 66 such that the series switch 70, depicted in FIG. 3F, is in a closed state (conducting). The logic circuit 148F also configures the shunt switch control output 164 to drive the second output buffer 160 such that the shunt switch 72, depicted in FIG. 3F, is in an open state (not conducting). As a result, the switching voltage output 26, depicted in FIG. 3F, is configured to provide a switching voltage, $V_{SW}$, substantially equal to the direct current (DC) voltage, $V_{BAT}$. In response to de-assertion of the shunt level indication 150B, depicted in FIG. 4F, which indicates that the compensated parallel amplifier circuit output current estimate, $I_{PAWA\_COMP}'$, is less than scaled shunt level threshold 176, the logic circuit 148F configures the first state machine to transition to the shunt output mode 188F, as depicted in FIG. 5F. Otherwise, the logic circuit 148F configures the first state machine to remain in the series output mode 190F.

Figure 3G:
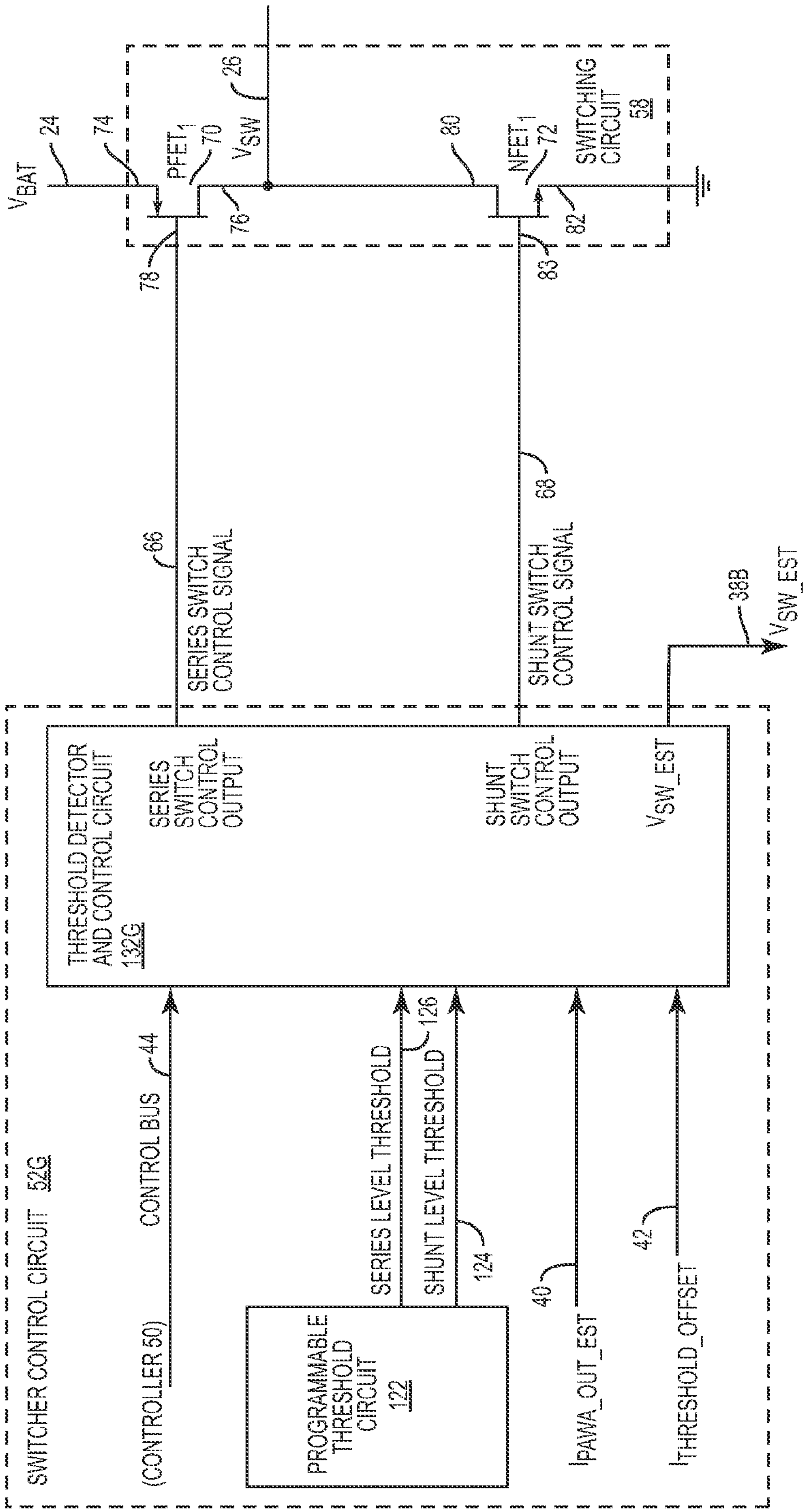
FIG. 3G depicts another embodiment of a portion of a buck converter.

Another example embodiment of the switcher control circuit 259 of the buck converter 13A is depicted in FIG. 3G as switcher control circuit 52G. The switcher control circuit 52G may be functionally similar to the switcher control circuit 52C, depicted in FIG. 3C, except the circuitry associated with the multi-level charge pump circuit 56 is eliminated. As a result, for example, the threshold detector and control circuit 132G, of FIG. 3G, does not include a first boost level threshold 128, a second boost level threshold 130, the third comparator 144, or the fourth comparator 146. Also, as discussed above, the parallel amplifier circuit output current estimate 40, $I_{PAWA\_OUT\_EST}$, depicted in FIG. 3G, may be provided by the scaled parallel amplifier output current estimate, $I_{PARA\_AMP\_SENSE}$, or, in the case where an open loop assist circuit is included in the parallel amplifier circuit 14C of FIG. 18C, the sum of the scaled parallel amplifier output current estimate, $I_{PARA\_AMP\_SENSE}$, and the open loop assist circuit output current estimate, $I_{ASSIST\_SENSE}$.

Figure 4G:
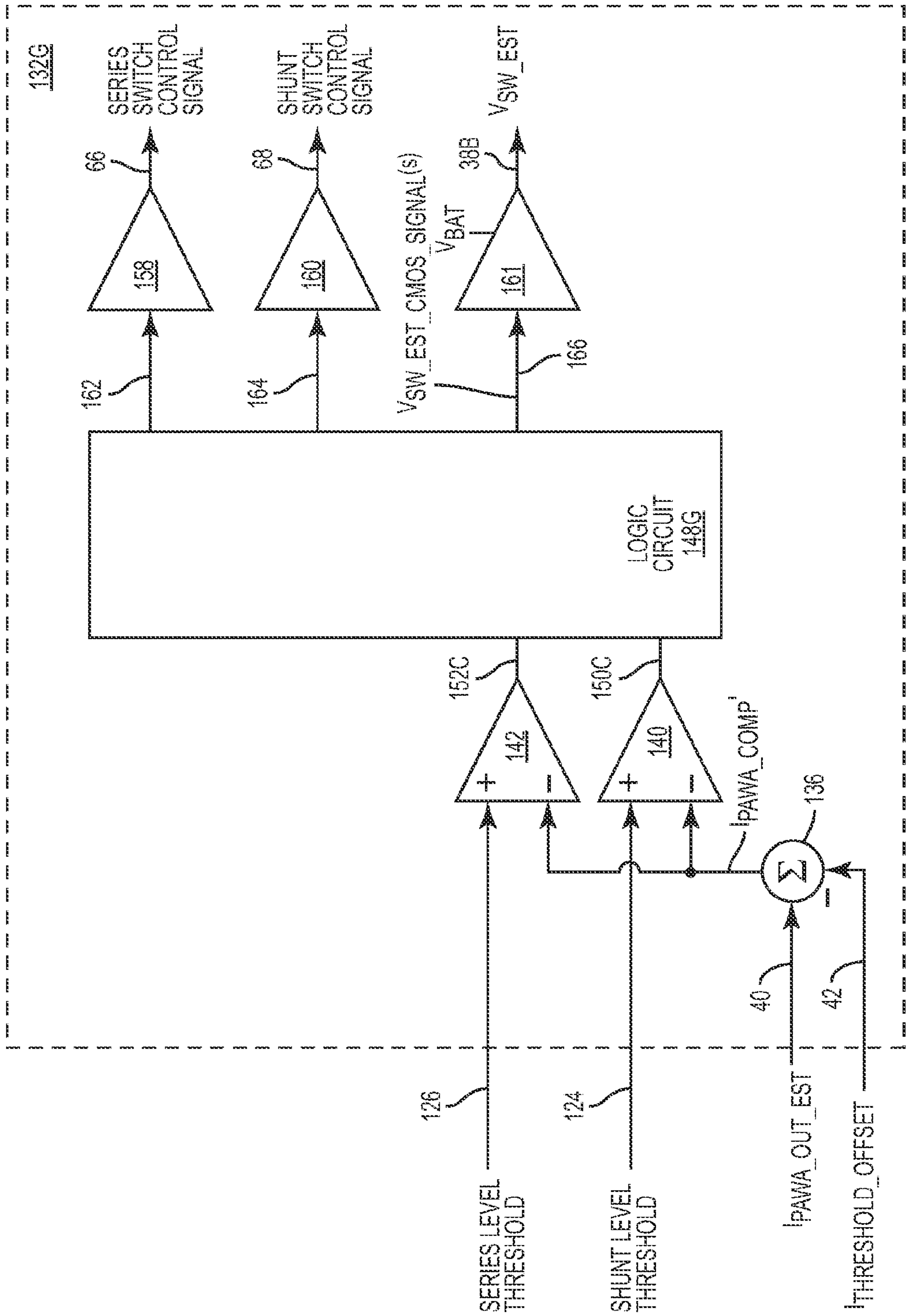
FIG. 4G depicts another embodiment of a threshold detector and control circuit of a buck converter.
Figure 5G:
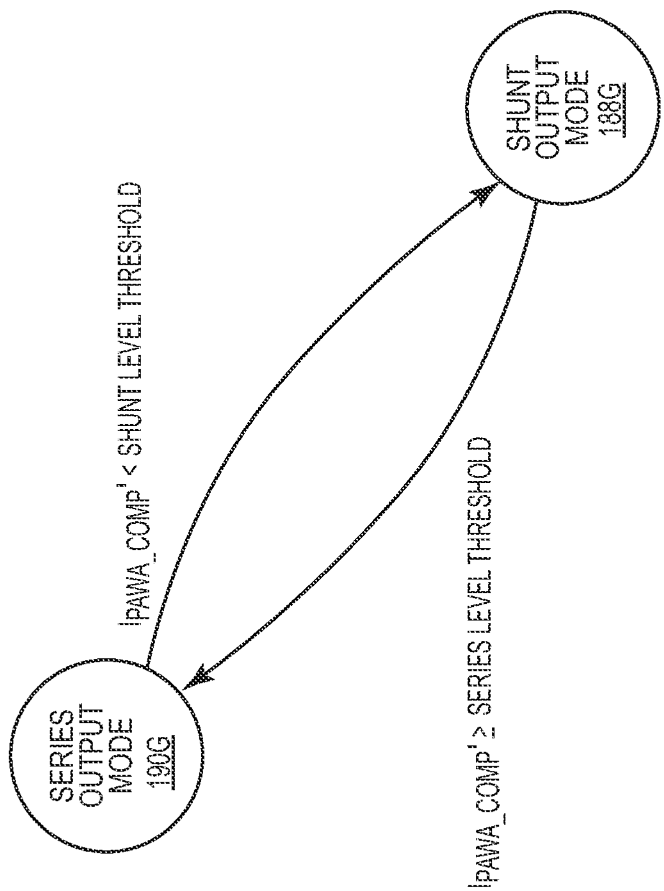
FIG. 5G depicts an embodiment of a first state machine of the threshold detector and control circuit of FIG. 4G.

One embodiment of the threshold detector and control circuit 132G of FIG. 3G is further depicted in FIG. 4G. The threshold detector and control circuit 132G may be functionally similar to the threshold detector and control circuit 132C, depicted in FIG. 4C, except the circuitry associated with the multi-level charge pump circuit 56 is eliminated. As a result, the logic circuit 148G is configured to operate as a buck converter based upon the magnitude of the compensated parallel amplifier circuit output current estimate, $I_{PAWA\_COMP}'$, relative to the shunt level threshold 124 and the series level threshold 126. In addition, unlike the threshold detector and control circuit 132C, depicted in FIG. 4C, the first state machine used to control the logic circuit 148G may be simplified. As an example, FIG. 5G depicts an example embodiment of a first state machine of the logic circuit 148G that includes a shunt output mode 188G and a series output mode 190G, and which is described with continuing reference to FIGS. 3G and 4G.

In the shunt output mode 188G, the logic circuit 148G, depicted in FIG. 4G, configures the series switch control output 162 to drive the first output buffer 158 to generate a series switch control signal 66 such that the series switch 70, depicted in FIG. 3G, is in an open state (not conducting). The logic circuit 148G also configures the shunt switch control output 164 to drive the second output buffer 160 such that the shunt switch 72 is in a closed state (conducting). As a result, the switching voltage output 26 of FIG. 3G is configured to provide a switching voltage, $V_{SW}$, substantially equal to ground. In response to assertion of the series level indication 152C, which indicates that the compensated parallel amplifier circuit output current estimate, $I_{PAWA\_COMP}'$, is greater than or equal to the series level threshold 126, the logic circuit 148G configures the first state machine to transition to the series output mode 190G. Otherwise the first state machine remains in the shunt output mode 188G.

In the series output mode 190G, the logic circuit 148G configures the series switch control output 162 to drive the first output buffer 158 to generate a series switch control signal 66 such that the series switch 70, depicted in FIG. 3G, is in a closed state (conducting). The logic circuit 148G also configures the shunt switch control output 164 to drive the second output buffer 160 such that the shunt switch 72, depicted in FIG. 3G, is in an open state (not conducting). As a result, the switching voltage output 26, depicted in FIG. 3G, is configured to provide a switching voltage, $V_{SW}$, substantially equal to the direct current (DC) voltage, $V_{BAT}$. In response to de-assertion of the shunt level indication 150C, depicted in FIG. 4G, which indicates that the compensated parallel amplifier circuit output current estimate, $I_{PAWA\_COMP}'$, is less than the shunt level threshold 124, the logic circuit 148G configures the first state machine to transition to the shunt output mode 188G, as depicted in FIG. 5G. Otherwise, the logic circuit 148G configures the first state machine to remain in the series output mode 190G.

While FIGS. 3G and 4G do not depict the presence of an FLL circuit being used in combination with the switcher control circuit 52G, an embodiment of the FLL circuit may be provided for use in the buck converter in order to provide an FLL system clock 280 to either the switcher control circuit 52G or the clock management system of the pseudo-envelope follower power management system.

Figure 3H:
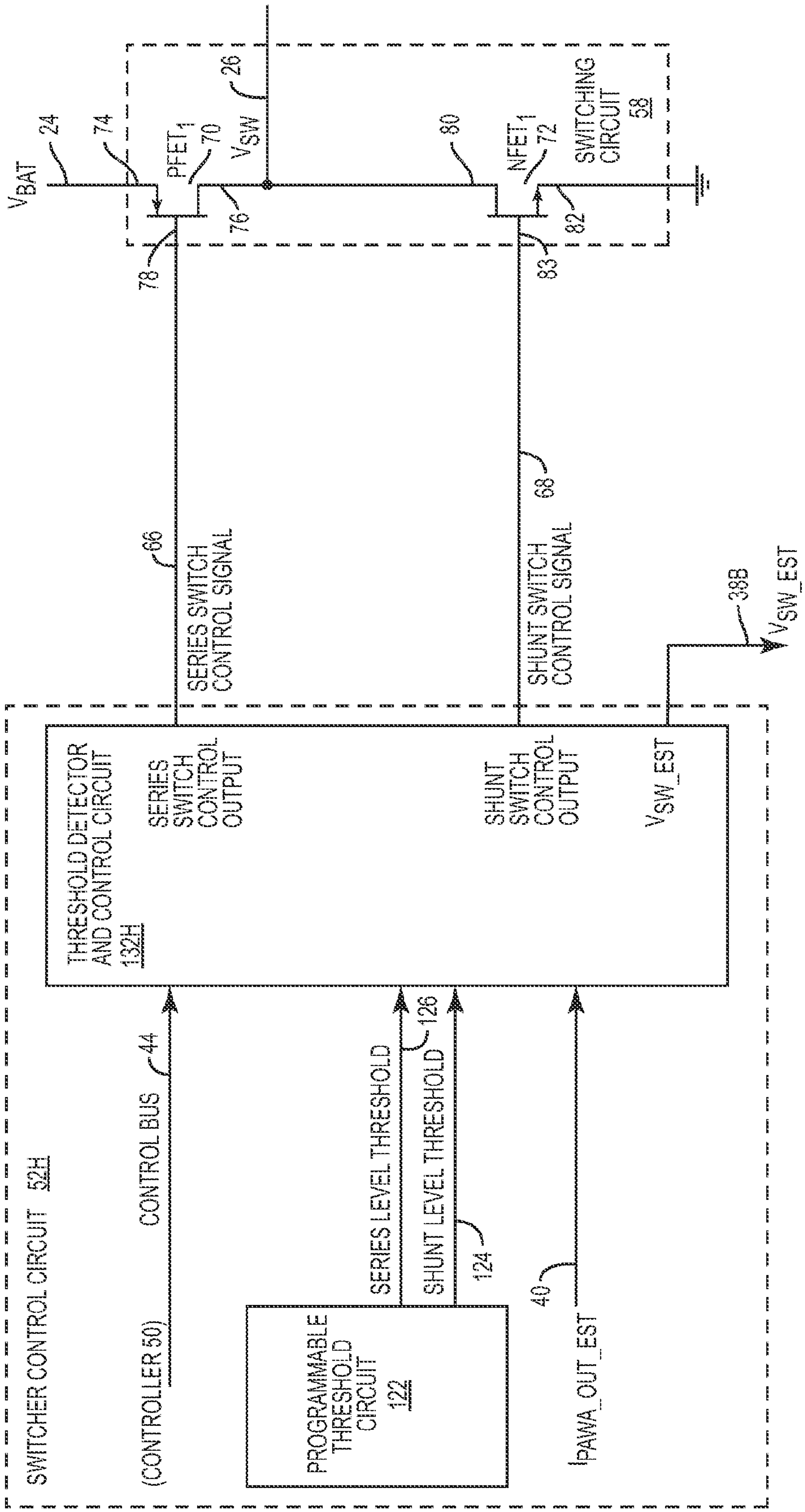
FIG. 3H depicts another embodiment of a portion of a buck converter.

For the sake of completeness, another example embodiment of the switcher control circuit 259 of the buck converter 13A is depicted in FIG. 3H as switcher control circuit 52H. The switcher control circuit 52H may be functionally similar to the switcher control circuit 52D, depicted in FIG. 3D, except the circuitry associated with the multi-level charge pump circuit 56 is eliminated. Like the switcher control circuit 52D of FIG. 3D, the switcher control circuit 52H depicts the an embodiment of the switcher control circuit 259 that may be used when either the buck converter 13A does not use the threshold offset current 42, $I_{THRESHOLD\_OFFSET}$, to control the operation of the switcher control circuit 259 or, for the sake of completeness, the corresponding parallel amplifier circuit does not provide the threshold offset current 42, $I_{THRESHOLD\_OFFSET}$, to the buck converter 13A.

Like the switcher control circuit 52D of FIG. 3D, the switcher control circuit 52H provides a series switch control signal 66 and a shunt switch control signal 68 to the switching circuit 58. As a result, the threshold detector and control circuit 132H, of FIG. 3H, include a first boost level threshold 128, a second boost level threshold 130, the third comparator 144 or the fourth comparator 146. Also, as discussed above, the parallel amplifier circuit output current estimate 40, $I_{PAWA\_OUT\_EST}$, depicted in FIG. 3H, may be provided by the scaled parallel amplifier output current estimate, $I_{PARA\_AMP\_SENSE}$, or, in the case where an open loop assist circuit is included in the parallel amplifier circuit 14C of FIG. 18C, the sum of the scaled parallel amplifier output current estimate, $I_{PARA\_AMP\_SENSE}$, and the open loop assist circuit output current estimate, $I_{ASSIST\_SENSE}$.

Figure 4H:
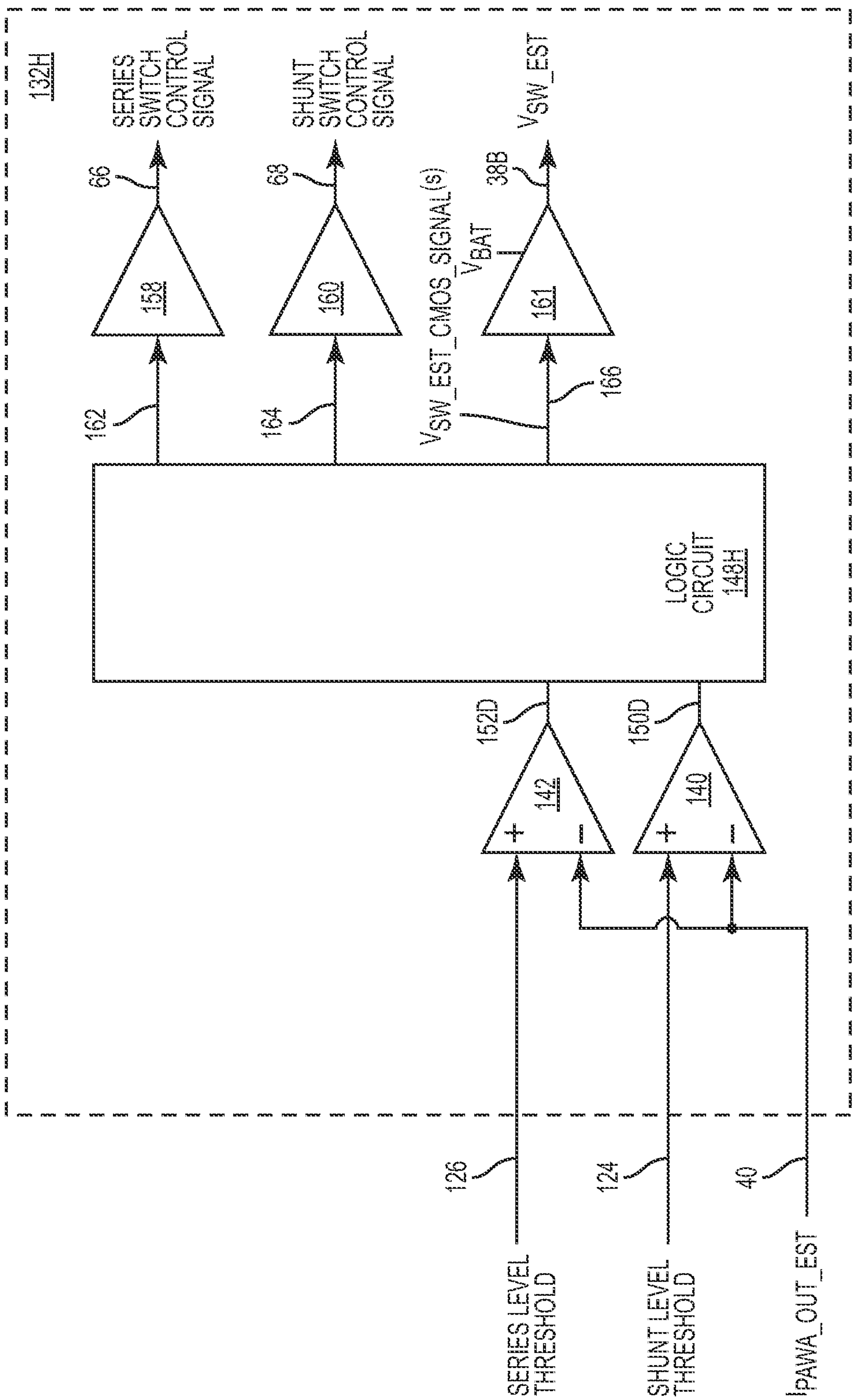
FIG. 4H depicts another embodiment of a threshold detector and control circuit of a buck converter.
Figure 5H:
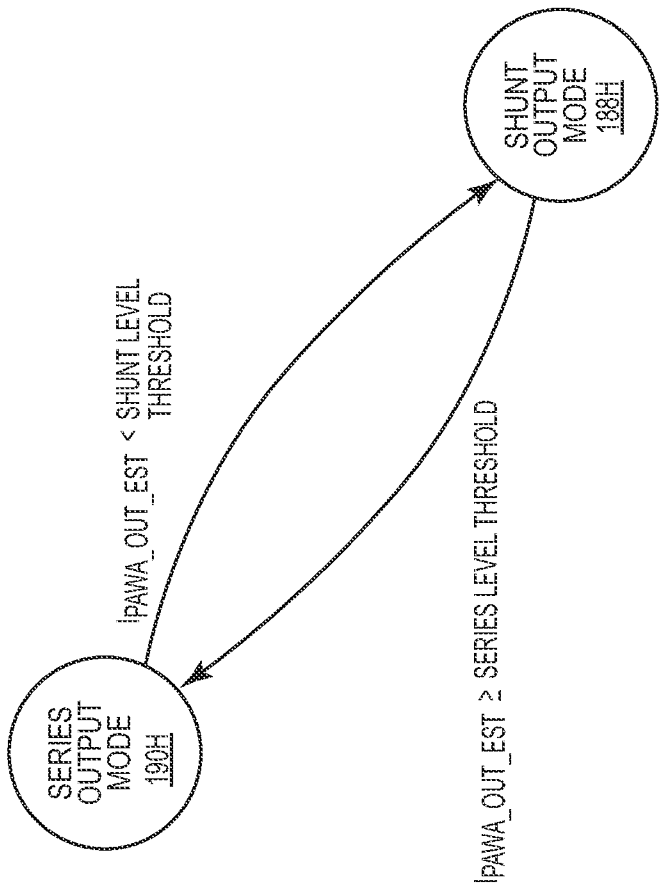
FIG. 5H depicts an embodiment of a first state machine of the threshold detector and control circuit of FIG. 4H.

One embodiment of the threshold detector and control circuit 132H of FIG. 3H is further depicted in FIG. 4H. The threshold detector and control circuit 132H may be functionally similar to the threshold detector and control circuit 132D, depicted in FIG. 4D, except the circuitry associated with the multi-level charge pump circuit 56 is eliminated. For example, the threshold detector and control circuit 132D does not include a first boost level threshold 128, a second boost level threshold 130, the third comparator 144, or the fourth comparator 146. As a result, the logic circuit 148H is configured to operate as a buck converter based upon the magnitude of the parallel amplifier circuit output current estimate 40, $I_{PAWA\_OUT\_EST}$, relative to the shunt level threshold 124 and the series level threshold 126. In addition, unlike the threshold detector and control circuit 132D, depicted in FIG. 4D, the first state machine used to control the logic circuit 148H may be simplified. As an example, FIG. 5H depicts an example embodiment of a first state machine of the logic circuit 148H that includes a shunt output mode 188H and a series output mode 190H, and which is described with continuing reference to FIGS. 3H and 4H.

In the shunt output mode 188H, the logic circuit 148H, depicted in FIG. 4H, configures the series switch control output 162 to drive the first output buffer 158 to generate a series switch control signal 66 such that the series switch 70, depicted in FIG. 3H, is in an open state (not conducting). The logic circuit 148H also configures the shunt switch control output 164 to drive the second output buffer 160 such that the shunt switch 72, depicted in FIG. 3H, is in a closed state (conducting). As a result, the switching voltage output 26 of FIG. 3H is configured to provide a switching voltage, $V_{SW}$, substantially equal to ground. In response to assertion of the series level indication 152A, which indicates that the parallel amplifier circuit output current estimate 40, $I_{PAWA\_OUT\_EST}$, is greater than or equal to the series level threshold 126, the logic circuit 148H configures the first state machine to transition to the series output mode 190H. Otherwise the first state machine remains in the shunt output mode 188H.

In the series output mode 190H, the logic circuit 148H configures the series switch control output 162 to drive the first output buffer 158 to generate a series switch control signal 66 such that the series switch 70 is in a closed state (conducting). The logic circuit 148H also configures the shunt switch control output 164 to drive the second output buffer 160 such that the shunt switch 72 is in an open state (not conducting). As a result, the switching voltage output 26, depicted in FIG. 3H, is configured to provide a switching voltage, $V_{SW}$, substantially equal to the direct current (DC) voltage, $V_{BAT}$. In response to de-assertion of the shunt level indication 150D, depicted in FIG. 4H, which indicates that the parallel amplifier circuit output current estimate 40, $I_{PAWA\_OUT\_EST}$, is less than the shunt level threshold 124, the logic circuit 148H configures the first state machine to transition to the shunt output mode 188H, as depicted in FIG. 5H. Otherwise, the logic circuit 148H configures the first state machine to remain in the series output mode 190H.

While FIGS. 3H and 4H do not depict the presence of an FLL circuit being used in combination with the switcher control circuit 52H, an embodiment of the FLL circuit may be provided for use in the buck converter in order to provide an FLL system clock 280 to either the switcher control circuit 52H or the clock management system of the pseudo-envelope follower power management system.

In addition, like the pseudo-envelope follower power management system 10C, depicted in FIG. 18A, the pseudo-envelope follower power management system 10D, depicted in FIG. 18C, includes the $V_{OFFSET}$ loop circuit 41A, the operation of which is described below with respect to the $V_{OFFSET}$ loop circuit 41B, depicted in FIG. 18B.

Illustratively, unlike the operation of the $V_{OFFSET}$ loop circuit 41B described above with respect FIG. 18B, where the filter having a first time constant, $Tau_0$, and the second time constant, $Tau_1$, may be modified to optimize the bandwidth of the $V_{OFFSET}$ loop circuit 41B during pre-charging of the coupling circuit 18, prior to initiation of a data burst to be sent by the linear RF power amplifier 22, as depicted, for example, in FIGS. 1A-B and 2A-B, the controller 50, depicted in FIG. 18C, may selectively modify the $K_{ERROR\_GAIN}$ value of the $V_{OFFSET}$ loop circuit 41A to provide a pre-charge mode of operation for a pre-determined period of time. During the pre-charge mode of operation, the controller 50 may increase the value of the $K_{ERROR\_GAIN}$ to effectively provide higher loop bandwidth. After a predetermined period of time, the controller 50 may decrease the $K_{ERROR\_GAIN}$ value to provide a lower loop bandwidth to ensure stable operation of the $V_{OFFSET}$ loop circuit 41A.

FIG. 18D depicts a pseudo-envelope follower power management system 10F that is similar to the pseudo-envelope follower power management system 10E, depicted in FIG. 18B. Similar to the pseudo-envelope follower power management system 10E, depicted in FIG. 18B, the pseudo-envelope follower power management system 10F includes the parallel amplifier circuit 14D having the $V_{OFFSET}$ loop circuit 41B. The various embodiments of the parallel amplifier circuit 14D, the associated parallel amplifier 35, and the $V_{OFFSET}$ loop circuit 41B are described in detail relative to the pseudo-envelope follower power management system 10E of FIG. 18B, and are therefore not repeated here.

However, unlike the pseudo-envelope follower power management system 10E, depicted in FIG. 18B, the pseudo-envelope follower power management system 10F replaces the multi-level charge pump buck converter 12C with the buck converter 13A, depicted in FIG. 18C.

As discussed before, because the buck converter 13A does not include the multi-level charge pump buck converter 12C, the parallel amplifier power source selection circuit 272 is eliminated and the μC charge pump output of the μC charge pump circuit 262 is directly coupled to the parallel amplifier circuit 14D in order to provide the parallel amplifier supply voltage, $V_{SUPPLY\_PARA\_AMP}$, to the parallel amplifier 35.

In addition, like some embodiments of the pseudo-envelope follower power management system 10E, depicted in FIG. 18B, some embodiments of the parallel amplifier circuit 14D of the pseudo-envelope follower power management system 10F, depicted in FIG. 18D, may further include an open loop assist circuit 39 similar to the open loop assist circuit 39 depicted in FIGS. 2A-B, and/or the example embodiments of the open loop assist circuit 39, the open loop assist circuit 39A, depicted in FIG. 9A, and the open loop assist circuit 39B, depicted in FIG. 9B. Accordingly, in those cases where an open loop assist circuit is included in the parallel amplifier circuit 14D, as depicted in FIGS. 2A-B, the scaled parallel amplifier output current estimate, $I_{PARA\_AMP\_SENSE}$, is combined with the open loop assist circuit output current estimate, $I_{ASSIST\_SENSE}$, to form the parallel amplifier circuit output current estimate 40, $I_{PAWA\_OUT\_EST}$, that may be provided as a feedback signal to the switcher control circuit 259 of the buck converter 13A.

Also, as discussed relative to the pseudo-envelope follower power management system 10D of FIG. 18C, although the embodiment of the pseudo-envelope follower power management system 10F, depicted in FIG. 18D, only depicts the switcher control circuit 259 receiving the scaled parallel amplifier output current estimate, $I_{PARA\_AMP\_SENSE}$, this is by example and not by limitation. Some embodiments of the parallel amplifier circuit 14D, of FIG. 18D, may further include an open loop assist circuit 39 similar to the open loop assist circuit 39, depicted in FIGS. 2A-B, the example embodiment of the open loop assist circuit 39A, depicted in FIG. 9A, and the example embodiment of the open loop assist circuit 39B, depicted in FIG. 9B. Accordingly, in those cases where an open loop assist circuit is included in the parallel amplifier circuit 14D, the scaled parallel amplifier output current estimate, $I_{PARA\_AMP\_SENSE}$, is combined with the open loop assist circuit output current estimate, $I_{ASSIST\_SENSE}$, (depicted in FIGS. 2A-B), to form the parallel amplifier circuit output current estimate 40, $I_{PAWA\_OUT\_EST}$, that may be provided as a feedback signal to the switcher control circuit 259.

The operation of the buck converter 13A and the switcher control circuit 259 are described relative to the pseudo-envelope follower power management system 10D, depicted in FIG. 18C. Accordingly, a detailed description of the operation of the buck converter 13A is omitted from the description of the pseudo-envelope follower power management system 10F, depicted in FIG. 18D.

Figure 19A:
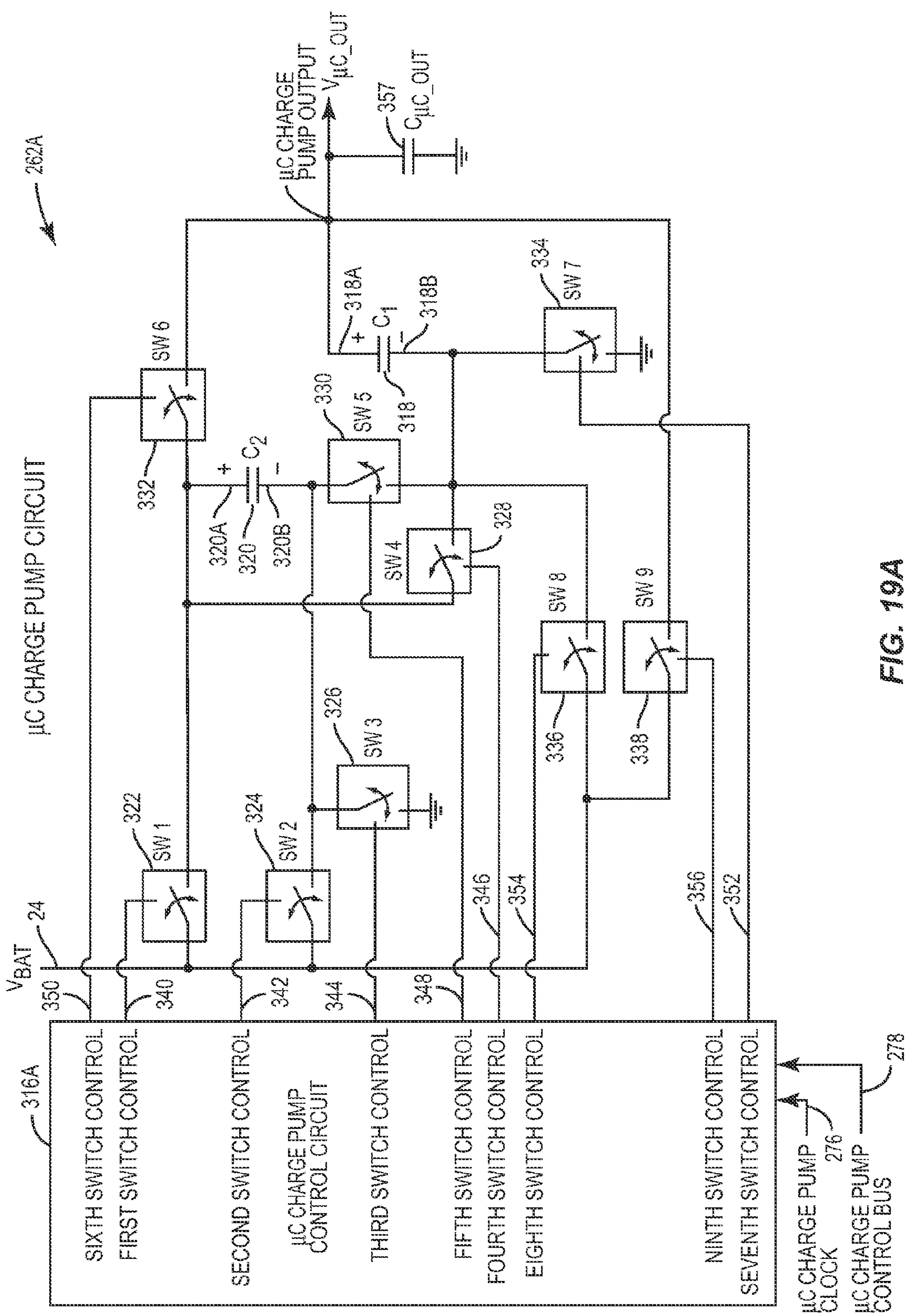
FIG. 19A depicts an embodiment of a μC charge pump circuit configured to provide a parallel amplifier power supply to a parallel amplifier circuit of a pseudo-envelope follower power management system.

The μC charge pump circuit 262, depicted in FIGS. 18A-D, will now be discussed. FIG. 19A depicts an embodiment of the μC charge pump circuit 262 of FIGS. 18A-D as a μC charge pump circuit 262A. The μC charge pump circuit 262A may be configured to generate a μC charge pump output voltage, $V_{\mu C\_OUT}$, at the μC charge pump output based upon an operational mode of the μC charge pump circuit 262A. The μC charge pump circuit 262A may include four operational modes. The μC charge pump output voltage, $V_{\mu C\_OUT}$, generated at the μC charge pump output may be based on an operational ratio of the μC charge pump, $\mu BB_{RATIO}$. As an example, the μC charge pump circuit 262A may include four operational modes: OFF mode, $1\times V_{BAT}$ mode, $4/3\times V_{BAT}$ mode, and $3/2\times V_{BAT}$ mode, where each operational mode corresponds to a particular operational ratio of the μC charge pump, $\mu BB_{RATIO}$. Table 1 shows, in tabulated form, the relationships between the operational modes of the μC charge pump circuit 262A, the operational ratio of the μC charge pump, $\mu BB_{RATIO}$, and the μC charge pump output voltage, $V_{\mu C\_OUT}$, substantially generated at the μC charge pump output.

TABLE 1

| MODE OF OPERATION OF μC CHARGE PUMP | OPERATIONAL RATIO OF μC CHARGE PUMP, ($\mu BB_{RATIO}$) | μC CHARGE PUMP OUTPUT VOLTAGE, ($V_{\mu C\_OUT}$), GENERATED AT μC CHARGE PUMP OUTPUT |
|---|---|---|
| OFF Mode | OFF | FLOATING |
| 1 X $V_{BAT}$ Mode | 1 | 1 X $V_{BAT}$ |
| 4/3 X $V_{BAT}$ Mode | 4/3 | 4/3 X $V_{BAT}$ |
| 3/2 X $V_{BAT}$ Mode | 3/2 | 3/2 X $V_{BAT}$ |

When the μC charge pump circuit 262A is configured to operate in the OFF mode, the μC charge pump circuit 262A is disabled and the μC charge pump output floats. When the μC charge pump circuit 262A is configured to operate in the $1\times V_{BAT}$ mode, the μC charge pump circuit 262A is configured to generate a μC charge pump output voltage, $V_{\mu C\_OUT}$, substantially equal to the supply input 24, ($V_{BAT}$). When the μC charge pump circuit 262A is configured to operate in the $4/3\times V_{BAT}$ mode, the μC charge pump circuit 262A is configured to generate a μC charge pump output voltage, $V_{\mu C\_OUT}$, substantially equal to the $4/3\times V_{BAT}$. When the μC charge pump circuit 262A is configured to operate in the $3/2\times V_{BAT}$ mode, the μC charge pump circuit 262A is configured to generate a μC charge pump output voltage, $V_{\mu C\_OUT}$, substantially equal to $3/2\times V_{BAT}$.

The μC charge pump circuit 262A may include a μC charge pump control circuit 316A, a first flying capacitor 318 having a first terminal 318A and a second terminal 318B, a second flying capacitor 320 having a first terminal 320A, a second terminal, 320B and a plurality of switches including a first switch 322, (SW 1), a second switch 324, (SW 2), a third switch 326, (SW 3), a fourth switch 328, (SW 4), a fifth switch 330, (SW 5), a sixth switch 332, (SW 6), a seventh switch 334, (SW 7), an eighth switch 336, (SW 8), and a ninth switch 338, (SW 9). Each of the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9) may be a solid state based switch implemented with field effect transistors, insulator-on-semiconductor based transistors, or bipolar based transistors, or a combination thereof. Each of the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9) may be a solid state transmission gate. As another example, each of the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9) may be based on a GaN process. Alternatively, each of the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9) may be micro-electromechanical systems (MEMS) contact type switches.

The first switch 322 may be coupled between the first terminal 320A of the second flying capacitor 320 and the supply input 24, ($V_{BAT}$). The first switch 322, (SW 1), may include a first switch control input configured to receive a first switch control signal 340 from the μC charge pump control circuit 316A, where the first switch control signal 340 operably opens and closes the first switch 322, (SW 1), based upon the operational mode of the μC charge pump circuit 262A.

The second switch 324, (SW 2), may include a second switch control input configured to receive a second switch control signal 342 from the μC charge pump control circuit 316A, where the second switch control signal 342 operably opens and closes the second switch 324, (SW 2), based upon the operational mode of the μC charge pump circuit 262A. The second switch 324, (SW 2), may be coupled between the supply input 24, ($V_{BAT}$), and the second terminal 320B of the second flying capacitor 320. The third switch 326, (SW 3), may include a third switch control input configured to receive a third switch control signal 344 from the μC charge pump control circuit 316A, where the third switch control signal 344 operably opens and closes the third switch 326, (SW 3), based upon the operational mode of the μC charge pump circuit 262A. The third switch 326, (SW 3), may be coupled between the second terminal 320B of the second flying capacitor 320 and ground. The fourth switch 328, (SW 4), may include a fourth switch control input configured to receive a fourth switch control signal 346 from the μC charge pump control circuit 316A, where the fourth switch control signal 346 operably opens and closes the fourth switch 328, (SW 4), based upon the operational mode of the μC charge pump circuit 262A. The fourth switch 328, (SW 4), may be coupled between the first terminal 320A of the second flying capacitor 320 and second terminal 318B of the first flying capacitor 318. The fifth switch 330, (SW 5), may include a fifth switch control input configured to receive a fifth switch control signal 348 from the μC charge pump control circuit 316A, where the fifth switch control signal 348 operably opens and closes the fifth switch 330, (SW 5), based upon the operational mode of the μC charge pump circuit 262A. The fifth switch 330, (SW 5), may be coupled between the second terminal 318B of the first flying capacitor 318 and second terminal 320B of the second flying capacitor 320. The sixth switch 332, (SW 6), may include a sixth switch control input configured to receive a sixth switch control signal 350 from the μC charge pump control circuit 316A, where the sixth switch control signal 350 operably opens and closes the sixth switch 332, (SW 6), based upon the operational mode of the μC charge pump circuit 262A. The sixth switch 332, (SW 6), may be coupled between the first terminal 318A of the first flying capacitor 318 and first terminal 320A of the second flying capacitor 320. The seventh switch 334, (SW 7), may include a seventh switch control input configured to receive a seventh switch control signal 352 from the μC charge pump control circuit 316A, where the seventh switch control signal 352 operably opens and closes the seventh switch 334 based upon the operational mode of the μC charge pump circuit 262A. The seventh switch 334, (SW 7), may be coupled between the second terminal 318B of the first flying capacitor 318 and ground. The eighth switch 336, (SW 8), may include an eighth switch control input configured to receive an eighth switch control signal 354 from the μC charge pump control circuit 316A, where the eighth switch control signal 354 operably opens and closes the eighth switch 336, (SW 8), based upon the operational mode of the μC charge pump circuit 262A. The eighth switch 336, (SW 8), may be coupled between the second terminal 318B of the first flying capacitor 318 and the supply input 24, ($V_{BAT}$). The ninth switch 338, (SW 9), may include a ninth switch control input configured to receive a ninth switch control signal 356 from the μC charge pump control circuit 316A, where the ninth switch control signal 356 operably opens and closes the ninth switch 338, (SW 9), based upon the operational mode of the μC charge pump circuit 262A. The ninth switch 338, (SW 9), may be coupled between the first terminal 318A of the first flying capacitor 318 and the supply input 24, ($V_{BAT}$).

The μC charge pump control circuit 316A may be configured to couple to a μC charge pump clock 276 and a μC charge pump control bus 278. The μC charge pump control bus 278 may be used to configure the μC charge pump circuit 262A to operate in one of the four operational modes by setting an operational ratio of the μC charge pump, $\mu BB_{RATIO}$, of the μC charge pump circuit 262A, where the parameter corresponding to a selection of the operational ratio of the μC charge pump, $\mu BB_{RATIO}$, may be stored locally in the μC charge pump control circuit 316A. In addition, the μC charge pump control circuit 316A may use the μC charge pump clock 276 to operably switch between phases of operation of the μC charge pump circuit 262A. The switch state (open or closed) of each of the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9), may be changed depending upon the phase of operation of the μC charge pump circuit 262A. The relationship between the operational ratio of the μC charge pump, $\mu BB_{RATIO}$, the phase of operation of the μC charge pump circuit 262A, and the switch state of the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9), is shown in TABLE 2.

TABLE 2

| | OPERATIONAL RATIO OF μC CHARGE PUMP, ($\mu BB_{RATIO}$) | | | |
|---|---|---|---|---|
| SWITCHES | OFF | 1 | 4/3 | 3/2 |
| SW 1 | OPEN | OPEN | PHASE 1 | OPEN |
| SW 2 | OPEN | OPEN | PHASE 2 | PHASE 1 |
| SW 3 | OPEN | OPEN | PHASE 3 | PHASE 2 |
| SW 4 | OPEN | OPEN | PHASE 3 | PHASE 2 |
| SW 5 | OPEN | OPEN | PHASE 1 | PHASE 1 |
| SW 6 | OPEN | OPEN | PHASE 2 | OPEN |
| SW 7 | OPEN | OPEN | OPEN | OPEN |
| SW 8 | OPEN | OPEN | OPEN | PHASE 1 |
| SW 9 | OPEN | PHASE 1 | OPEN | OPEN |

As used in TABLE 2, "PHASE 1" indicates the switch state (open or closed) of the identified switch is closed during a first phase of operation of the μC charge pump circuit 262A. "PHASE 2" indicates that the switch state (open or closed) of the identified switch is closed during a second phase of operation of the μC charge pump circuit 262A. "PHASE 3" indicates the switch state (open or closed) of the identified switch is closed during a third phase of operation of the μC charge pump circuit 262A. "OPEN" indicates the switch state (open or closed) of the identified switch is open during all the phases of operation of the μC charge pump circuit 262A.

As an example, the μC charge pump circuit 262A may be configured to operate in the OFF mode by setting the operational ratio of the μC charge pump, $\mu BB_{RATIO}$, to OFF. When the operational ratio of the μC charge pump, $\mu BB_{RATIO}$, is set to OFF, the first switch 322, (SW 1), is configured to be open, the second switch 324, (SW 2), is configured to be open, the third switch 326, (SW 3), is configured to be open, the fourth switch 328, (SW 4), is configured to be open, the fifth switch 330, (SW 5), is configured to be open, the sixth switch 332, (SW 6), is configured to be open, the seventh switch 334, (SW 7), is configured to be open, the eighth switch 336, (SW 8), is configured to be open, and the ninth switch 338, (SW 9), is configured to be open at all times. Accordingly, the μC charge pump output voltage, $V_{\mu C\_OUT}$, at the μC charge pump output floats with respect to ground when the μC charge pump circuit 262A is configured to operate in the OFF mode.

Figure 20A:
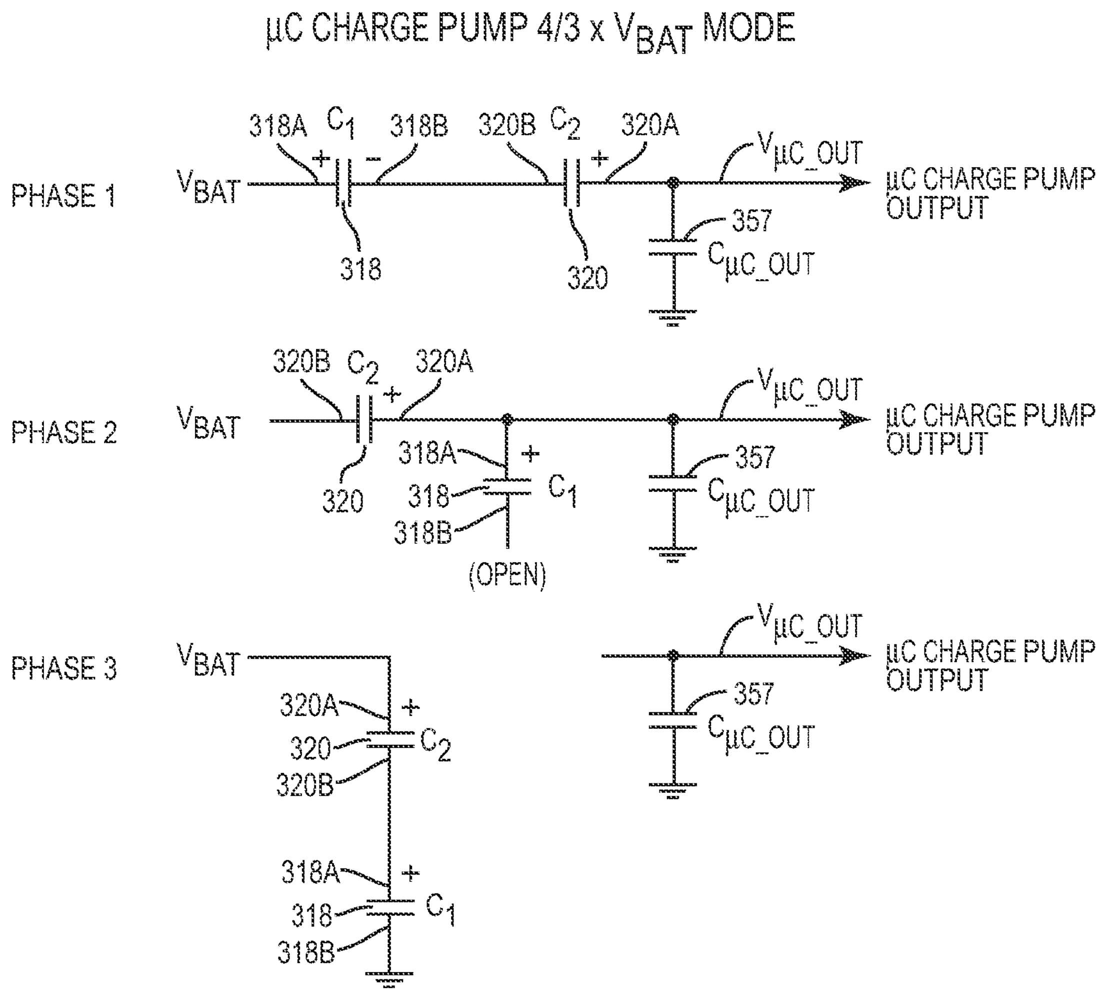
FIGS. 20A-C depict functionally equivalent circuit topologies of the μC charge pump circuit of FIG. 19A for different modes of operation of the μC charge pump circuit.

The μC charge pump circuit 262A may be configured to operate in the $4/3\times V_{BAT}$ mode by setting the operational ratio of the μC charge pump, $\mu BB_{RATIO}$, to 4/3. When the operational ratio of the μC charge pump, $\mu BB_{RATIO}$, is set to 4/3, the μC charge pump circuit 262A may operate in a first phase, (PHASE 1), a second phase, (PHASE 2), and a third phase, (PHASE 3), dependent upon the μC charge pump clock 276. FIG. 20A depicts an example of the "effective" operation of the μC charge pump circuit 262A when the μC charge pump circuit 262A is configured to operate in either the first phase, (PHASE 1), the second phase, (PHASE 2), or the third phase, (PHASE 3). As depicted in FIG. 20A, some embodiments of the μC charge pump circuit 262A may include a μC charge pump output capacitor 357, $C_{\mu C\_OUT}$, coupled to the μC charge pump output. In some phases of operation, the μC charge pump output capacitor 357, $C_{\mu C\_OUT}$, may store charge transferred from supply input 24, ($V_{BAT}$), to the μC charge pump output. In other phases of operation, the μC charge pump output capacitor 357, $C_{\mu C\_OUT}$, may source previously transferred charge to the μC charge pump output.

As depicted in FIG. 20A, during the first phase of operation, (PHASE 1), of the μC charge pump circuit 262A, when the μC charge pump circuit 262A is configured to operate in the $4/3\times V_{BAT}$ mode, the switches of the μC charge pump circuit 262A are configured to couple the first terminal 318A of the first flying capacitor 318 to the supply input 24, ($V_{BAT}$), the second terminal 318B of the first flying capacitor 318 to the second terminal 320B of the second flying capacitor 320, and the first terminal 320A of the second flying capacitor 320 to the μC charge pump output. As a result, during the first phase of operation, (PHASE 1), of the μC charge pump circuit 262A, the μC charge pump circuit 262A delivers charge to the μC charge pump output capacitor 357, $C_{\mu C\_OUT}$.

As further depicted in FIG. 20A, during the second phase of operation, (PHASE 2), of the μC charge pump circuit 262A, when the μC charge pump circuit 262A is configured to operate in the $4/3\times V_{BAT}$ mode, the switches of the μC charge pump circuit 262A are configured to couple the second terminal 320B of the second flying capacitor 320 to the supply input 24, ($V_{BAT}$), the first terminal 320A of the second flying capacitor 320 to the first terminal 318A of the first flying capacitor 318 and the μC charge pump output, and decouple the second terminal 318B of the first flying capacitor 318 such that to the second terminal 318B of the first flying capacitor 318 floats relative to ground. As a result, during the second phase of operation, (PHASE 2), of the μC charge pump circuit 262A, the μC charge pump circuit 262A delivers charge to the μC charge pump output capacitor 357, $C_{\mu C\_OUT}$.

As further depicted in FIG. 20A, during the third phase of operation, (PHASE 3), of the μC charge pump circuit 262A, when the μC charge pump circuit 262A is configured to operate in the $4/3\times V_{BAT}$ mode, the switches of the μC charge pump circuit 262A are configured to couple the first terminal 320A of the second flying capacitor 320 to the supply input 24, ($V_{BAT}$), the second terminal 320B of the second flying capacitor 320 to the first terminal 318A of the first flying capacitor 318, and the second terminal 318B of the first flying capacitor 318 to ground. In addition, during the third phase of operation, (PHASE 3), of the μC charge pump circuit 262A, the μC charge pump output is decoupled from the first flying capacitor 318, the second flying capacitor, and the supply input 24, ($V_{BAT}$), such that the charge previously stored in the μC charge pump output capacitor 357, $C_{\mu C\_OUT}$, sources current to the μC charge pump output.

Accordingly, returning to TABLE 2, when the μC charge pump circuit 262A is configured to operate in the $4/3\times V_{BAT}$ mode, the first switch 322, (SW 1), is configured to be closed during the first phase of operation, (PHASE 1), the second switch 324, (SW 2), is configured to be closed during the second phase of operation, (PHASE 2), the third switch 326, (SW 3), is configured to be closed during the third phase of operation, (PHASE 3), the fourth switch 328, (SW 4), is configured to be closed during the third phase of operation, (PHASE 3), the fifth switch 330, (SW 5), is configured to be closed during the first phase of operation, (PHASE 1), and the sixth switch 332, (SW 6), is configured to be closed during the second phase of operation, (PHASE 2) of the μC charge pump circuit 262A. Otherwise, the μC charge pump control circuit 316A configures the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9), to be open. As a result, the μC charge pump output provides a μC charge pump output voltage, $V_{\mu C\_OUT}$, substantially equal to $4/3\times V_{BAT}$.

Figure 20B:
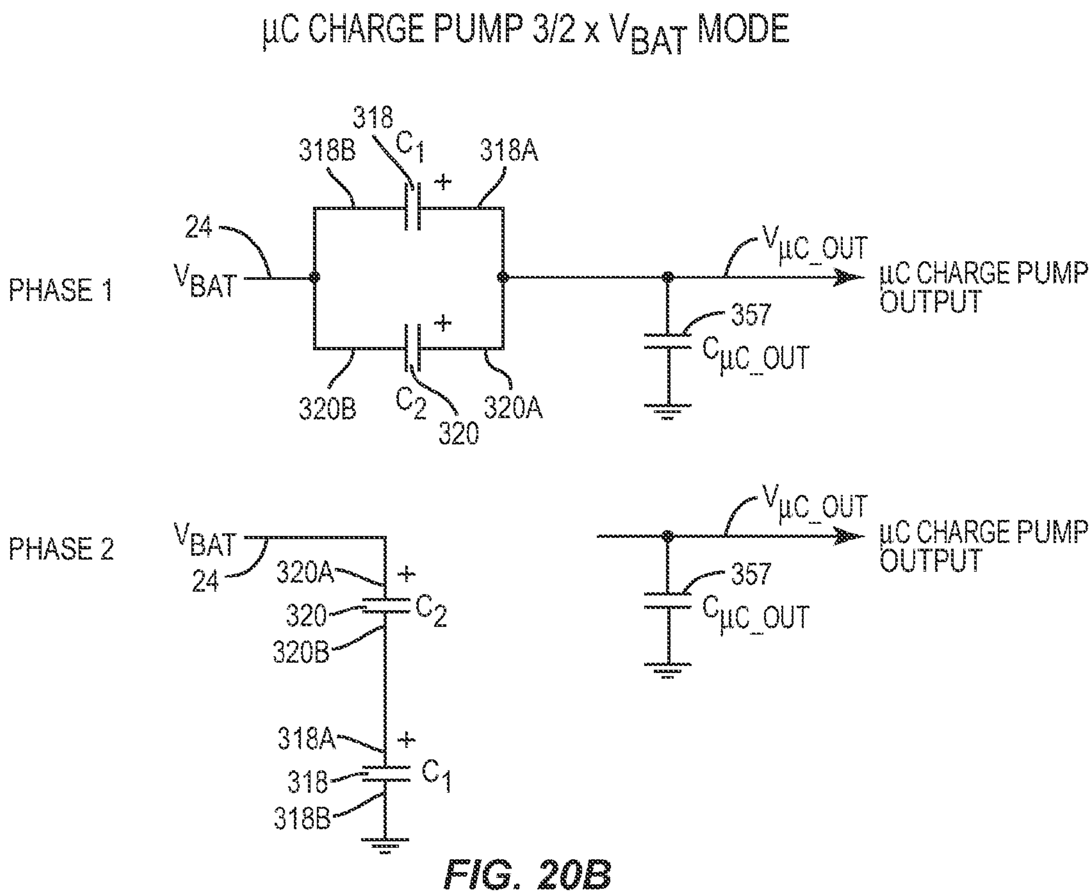

As another example of the operation of the μC charge pump circuit 262A depicted in FIG. 19A, the μC charge pump circuit 262A may be configured to operate in the $3/2\times V_{BAT}$ mode by setting the operational ratio of the μC charge pump, $\mu BB_{RATIO}$, to 3/2. When the operational ratio of the μC charge pump, $\mu BB_{RATIO}$, is set to 3/2, the μC charge pump circuit 262A may operate in a first phase of operation, (PHASE 1) and a second phase of operation, (PHASE 2) dependent upon the μC charge pump clock 276. FIG. 20B depicts the "effective" circuit topology of the μC charge pump circuit 262A during the first phase of operation, (PHASE 1) and a second phase of operation, (PHASE 2).

Illustratively, as depicted in FIG. 20B, during the first phase of operation, (PHASE 1), of the μC charge pump circuit 262A, when the μC charge pump circuit 262A is configured to operate in the $3/2\times V_{BAT}$ mode, the switches of the μC charge pump circuit 262A are configured to couple the second terminal 318B of the first flying capacitor 318 and the second terminal 320B of the second flying capacitor 320 to the supply input 24, ($V_{BAT}$), the first terminal 318A of the first flying capacitor 318 and the first terminal 320A of the second flying capacitor 320 to the μC charge pump output. As a result, during the first phase of operation, (PHASE 1), of the μC charge pump circuit 262A, the μC charge pump circuit 262A delivers charge to the μC charge pump output capacitor 357, $C_{\mu C\_OUT}$, from the supply input 24, ($V_{BAT}$), the first flying capacitor 318 and the second flying capacitor 320.

As further depicted in FIG. 20B, during the second phase of operation, (PHASE 2), of the μC charge pump circuit 262A, when the μC charge pump circuit 262A is configured to operate in the $3/2\times V_{BAT}$ mode, the switches of the μC charge pump circuit 262A are configured to couple the first terminal 320A of the second flying capacitor 320 to the supply input 24, ($V_{BAT}$), the second terminal 320B of the second flying capacitor 320 to the first terminal 318A of the first flying capacitor 318, and the second terminal 318B of the first flying capacitor 318 to ground in order to charge the first flying capacitor 318 and the second flying capacitor 320 from the supply input 24, ($V_{BAT}$).

Accordingly, during the second phase of operation, (PHASE 2), of the μC charge pump circuit 262A, depicted in FIG. 20 B, the μC charge pump output is decoupled from the first flying capacitor 318, the second flying capacitor, and the supply input 24, ($V_{BAT}$), such that the charge previously stored in the μC charge pump output capacitor 357, $C_{\mu C\_OUT}$, sources current to the μC charge pump output.

Accordingly, returning to TABLE 2, when the μC charge pump circuit 262A is configured to operate in the 3/2×$V_{BAT}$ mode, the second switch 324, (SW 2), is configured to be closed during the first phase of operation, (PHASE 1), the third switch 326, (SW 3), is configured to be closed during the second phase of operation, (PHASE 3), the fourth switch 328, (SW 4), is configured to be closed during the second phase of operation, (PHASE 2), the fifth switch 330, (SW 5), is configured to be closed during the first phase of operation, (PHASE 1), and the eighth switch 336, (SW 8), is configured to be closed during the first phase of operation, (PHASE 1) of the μC charge pump circuit 262A. Otherwise, the μC charge pump control circuit 316B configures the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9), to be open. As a result, the μC charge pump output provides a μC charge pump output voltage, $V_{\mu C\_OUT}$, substantially equal to 3/2×$V_{BAT}$.

Figure 20C:
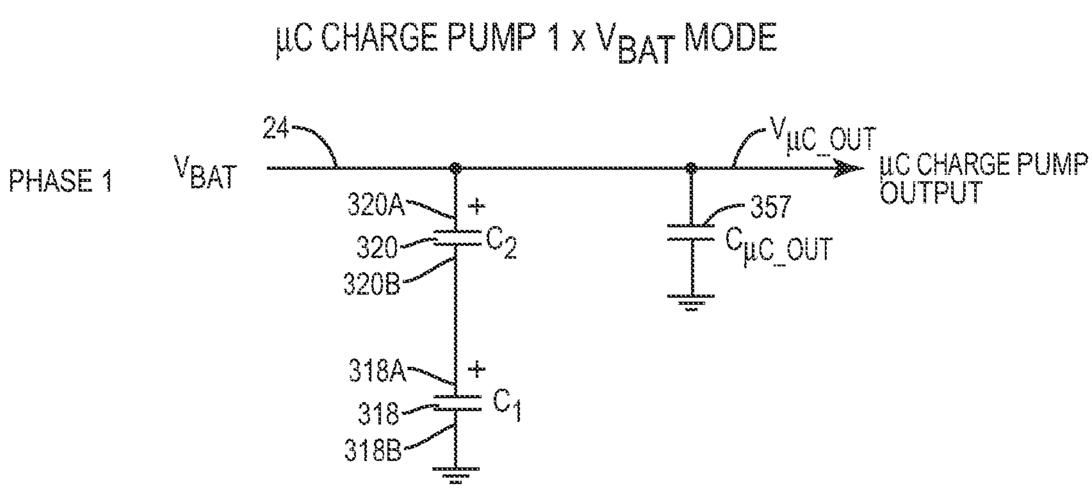

The μC charge pump circuit 262A may also be configured to operate in the 1×$V_{BAT}$ mode by setting the operational ratio of the μC charge pump, $\mu BB_{RATIO}$, to 1. When the operational ratio of the μC charge pump, $\mu BB_{RATIO}$, is set to 1, the μC charge pump circuit 262A has one phase of operation, PHASE 1. FIG. 20C depicts the "effective" circuit topology of the μC charge pump circuit 262A during the first phase of operation, (PHASE 1) when the μC charge pump circuit 262A is configured to operate in the 1×$V_{BAT}$ mode.

As depicted in FIG. 20C, during the first phase of operation, (PHASE 1), of the μC charge pump circuit 262A, when the μC charge pump circuit 262A is configured to operate in the 1×$V_{BAT}$ mode, the switches of the μC charge pump circuit 262A are configured to couple the first terminal 320A of the second flying capacitor 320 to the supply input 24, ($V_{BAT}$), the second terminal 320B of the second flying capacitor 320 to the first terminal 318A of the first flying capacitor 318, and the second terminal 318B of the first flying capacitor 318 to ground in order to charge the first flying capacitor 318 and the second flying capacitor 320 from the supply input 24, ($V_{BAT}$). In addition, the supply input 24, ($V_{BAT}$), is coupled to the μC charge pump output such that charge is delivered directly from the supply input 24, ($V_{BAT}$), to the μC charge pump output capacitor 357, $C_{\mu C\_OUT}$.

As a result, shown in TABLE 2, the switch state of the first switch 322, (SW 1), the second switch 324, (SW 2), the third switch 326, (SW 3), the fourth switch 328, (SW 4), the fifth switch 330, (SW 5), the sixth switch 332, (SW 6), the seventh switch 334, (SW 7), the eighth switch 336, (SW 8), and the ninth switch 338, (SW 9), do not change over time. Accordingly, when the μC charge pump circuit 262A is configured to operate in the 1×$V_{BAT}$ mode, the first switch 322, (SW 1), is configured to be open, the second switch 324, (SW 2), is configured to be open, the third switch 326, (SW 3), is configured to be open, the fourth switch 328, (SW 4), is configured to be open, the fifth switch 330, (SW 5), is configured to be open, the sixth switch 332, (SW 6), is configured to be open, the seventh switch 334, (SW 7), is configured to be open, the eighth switch 336, (SW 8), is configured to be open, and the ninth switch 338, (SW 9), is configured to be closed at all times. As a result, the μC charge pump output generates a μC charge pump output voltage, $V_{\mu C\_OUT}$, substantially equal to 1×$V_{BAT}$ because closing the ninth switch 338, (SW 9), couples the supply input 24, ($V_{BAT}$), to the μC charge pump output.

Figure 19B:
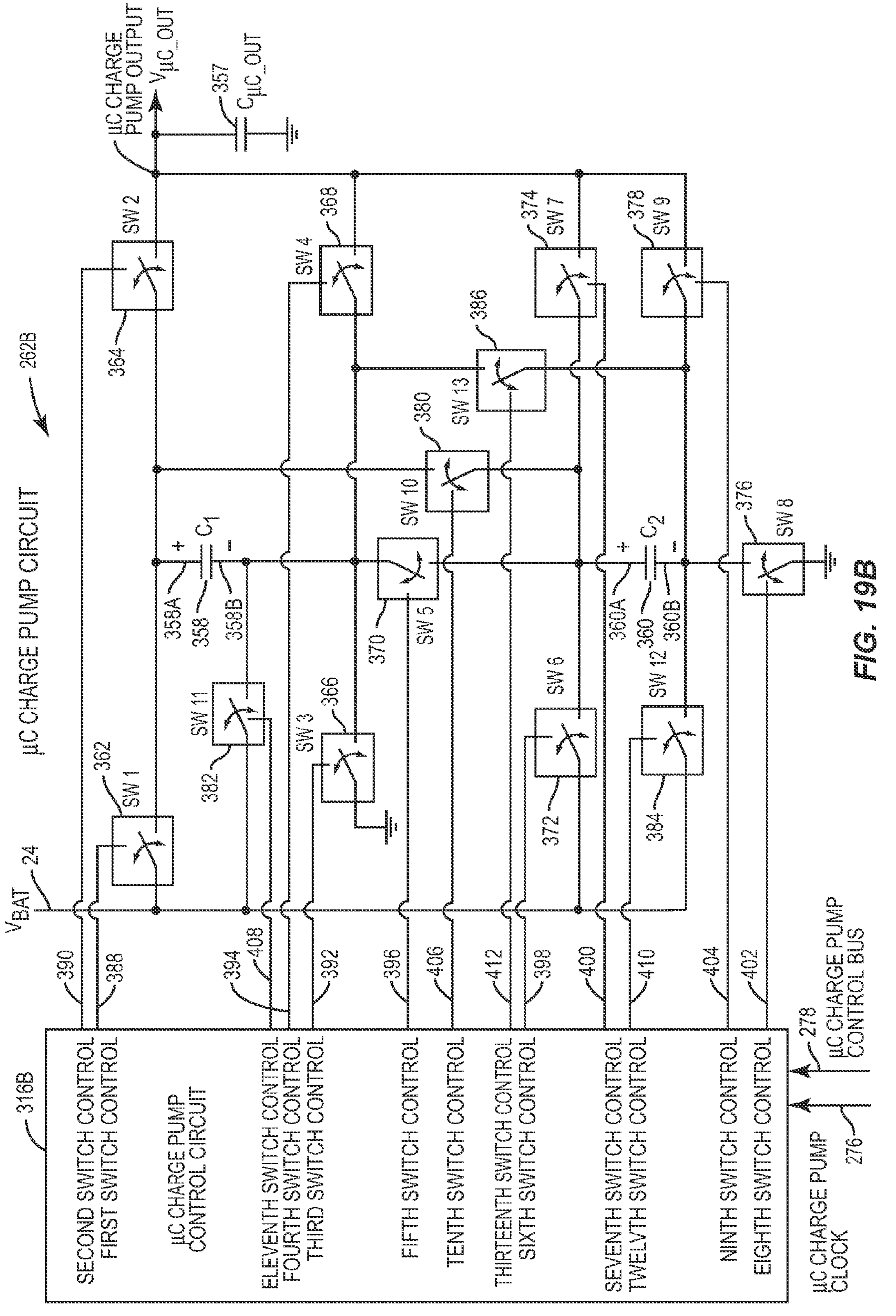
FIG. 19B depicts another embodiment of a μC charge pump circuit configured to provide a parallel amplifier power supply to a parallel amplifier circuit of a pseudo-envelope follower power management system, where the μC charge pump circuit includes both buck and boost modes of operation.

FIG. 19B depicts another example embodiment of the μC charge pump circuit 262 of FIGS. 18A-D as a μC charge pump circuit 262B. Similar to the μC charge pump circuit 262A of FIG. 19A, the μC charge pump circuit 262B may be configured to generate a μC charge pump output voltage, $V_{\mu C\_OUT}$, at the μC charge pump output based upon an operational mode of the μC charge pump circuit 262B. However, unlike the μC charge pump circuit 262A, the μC charge pump circuit 262B may be configured to either "boost" or "buck" the supply input 24, ($V_{BAT}$), to generate the μC charge pump output voltage, $V_{\mu C\_OUT}$, at the μC charge pump output. As an example, the operational modes of the μC charge pump circuit 262B may include an OFF mode, a 1/4×$V_{BAT}$ mode, 1/3×$V_{BAT}$ mode, a 1/2×$V_{BAT}$ mode, a 2/3×$V_{BAT}$ mode, 1×$V_{BAT}$ mode, a 4/3×$V_{BAT}$ mode, and a 3/2×$V_{BAT}$ mode, where each of the operational modes of the μC charge pump circuit 262B corresponds to a particular operational ratio of the μC charge pump, $\mu BB_{RATIO}$. Table 3 shows, in tabulated form, the relationships between the operational modes of the μC charge pump circuit 262B, the operational ratio of the μC charge pump, $\mu BB_{RATIO}$, and the μC charge pump output voltage, $V_{\mu C\_OUT}$, substantially generated at the μC charge pump output.

TABLE 3

| OPERATIONAL MODES OF μC CHARGE PUMP | OPERATIONAL RATIO OF μC CHARGE PUMP, ($\mu BB_{RATIO}$) | μC CHARGE PUMP OUTPUT VOLTAGE, ($V_{\mu C\_OUT}$), GENERATED AT μC CHARGE PUMP OUTPUT |
|---|---|---|
| OFF Mode | OFF | FLOATING |
| 1/4 X $V_{BAT}$ Mode | 1/4 | 1/4 X $V_{BAT}$ |
| 1/3 X $V_{BAT}$ Mode | 1/3 | 1/3 X $V_{BAT}$ |
| 1/2 X $V_{BAT}$ Mode | 1/2 | 1/2 X $V_{BAT}$ |
| 2/3 X $V_{BAT}$ Mode | 2/3 | 2/3 X $V_{BAT}$ |
| 1 X $V_{BAT}$ Mode | 1 | 1 X $V_{BAT}$ |
| 4/3 X $V_{BAT}$ Mode | 4/3 | 4/3 X $V_{BAT}$ |
| 3/2 X $V_{BAT}$ Mode | 3/2 | 3/2 X $V_{BAT}$ |

The operational modes of the μC charge pump circuit 262B are now described. As an example, when the μC charge pump circuit 262B is configured to operate in the OFF mode, the μC charge pump circuit 262B is disabled and the μC charge pump output floats. When the μC charge pump circuit 262B is configured to operate in the 1/4×$V_{BAT}$ mode, the μC charge pump circuit 262B is configured to generate a μC charge pump output voltage, $V_{\mu C\_OUT}$, substantially equal to 1/4×the supply input 24, ($V_{BAT}$). When the μC charge pump circuit 262B is configured to operate in the 1/3×$V_{BAT}$ mode, the μC charge pump circuit 262B is configured to generate a μC charge pump output voltage, $V_{\mu C\_OUT}$, substantially equal to 1/3×$V_{BAT}$. When the μC charge pump circuit 262B is configured to operate in the 1/2×$V_{BAT}$ mode, the μC charge pump circuit 262B is configured to generate a μC charge pump output voltage, $V_{\mu C\_OUT}$, substantially equal to 1/2×$V_{BAT}$. When the μC charge pump circuit 262B is configured to operate in the 2/3×$V_{BAT}$ mode, the μC charge pump circuit 262B is configured to generate the μC charge pump output voltage, $V_{\mu C\_OUT}$, substantially equal to 2/3×$V_{BAT}$. When the μC charge pump circuit 262B is configured to operate in the 1×$V_{BAT}$ mode, the μC charge pump circuit 262B is configured to generate the μC charge pump output voltage, $V_{\mu C\_OUT}$, substantially equal to 1×$V_{BAT}$. When the μC charge pump circuit 262B is configured to operate in the 4/3×$V_{BAT}$ mode, the μC charge pump circuit 262B is configured to generate the μC charge pump output voltage, $V_{\mu C\_OUT}$, substantially equal to 4/3×$V_{BAT}$. And, when the μC charge pump circuit 262B is configured to operate in the 3/2×$V_{BAT}$ mode, the μC charge pump circuit 262B is configured to generate a μC charge pump output voltage, $V_{\mu C\_OUT}$, substantially equal to 3/2×$V_{BAT}$.

The μC charge pump circuit 262B may include a μC charge pump control circuit 316B, a first flying capacitor 358 having a first terminal 358A and a second terminal 358B, a second flying capacitor 360 having a first terminal 360A and a second terminal 360B, a first switch 362, (SW 1), a second switch 364, (SW 2), a third switch 366, (SW 3), a fourth switch 368, (SW 4), a fifth switch 370, (SW 5), a sixth switch 372, (SW 6), a seventh switch 374, (SW 7), an eighth switch 376, (SW 8), a ninth switch 378, (SW 9), a tenth switch 380, (SW 10), an eleventh switch 382, (SW 11), a twelfth switch 384, (SW 12), and a thirteenth switch 386, (SW 13). Each of the plurality of switches of the μC charge pump circuit 262B may be a solid state based switch implemented with field effect transistors, insulator-on-semiconductor based transistors, or bipolar based transistors, or a combination thereof. Each of the plurality of switches of the μC charge pump circuit 262B may be a solid state transmission gate. As another example, each of the plurality of switches of the μC charge pump circuit 262B may be based on a GaN process. Alternatively, each of the plurality of switches of the μC charge pump circuit 262B may be micro-electromechanical systems (MEMS) contact type switches.

As depicted in FIG. 19B, the first switch 362, (SW 1), may be coupled between the first terminal 358A of the first flying capacitor 358 and the supply input 24, ($V_{BAT}$). The first switch 362, (SW 1), may include a first switch control input configured to receive a first switch control signal 388 from the μC charge pump control circuit 316B, where the first switch control signal 388 operably opens and closes the first switch 362, (SW 1), based upon the operational mode of the μC charge pump circuit 262B. The second switch 364, (SW 2), may include a second switch control input configured to receive a second switch control signal 390 from the μC charge pump control circuit 316B, where the second switch control signal 390 operably opens and closes the second switch 364, (SW 2), based upon the operational mode of the μC charge pump circuit 262B. The second switch 364, (SW 2), may be coupled between the first terminal 358A of the first flying capacitor 358 and the μC charge pump output. The third switch 366, (SW 3), may include a third switch control input configured to receive a third switch control signal 392 from the μC charge pump control circuit 316B, where the third switch control signal 392 operably opens and closes the third switch 366, (SW 3), based upon the operational mode of the μC charge pump circuit 262B. The third switch 366, (SW 3), may be coupled between the second terminal 358B of the first flying capacitor 358 and ground. The fourth switch 368, (SW 4), may include a fourth switch control input configured to receive a fourth switch control signal 394 from the μC charge pump control circuit 316B, where the fourth switch control signal 394 operably opens and closes the fourth switch 368, (SW 4), based upon the operational mode of the μC charge pump circuit 262B. The fourth switch 368, (SW 4), may be coupled between the second terminal 358B of the first flying capacitor 358 and the μC charge pump output. The fifth switch 370, (SW 5), may include a fifth switch control input configured to receive a fifth switch control signal 396 from the μC charge pump control circuit 316B, where the fifth switch control signal 396 operably opens and closes the fifth switch 370, (SW 5), based upon the operational mode of the μC charge pump circuit 262B. The fifth switch 370, (SW 5), may be coupled between the second terminal 358B of the first flying capacitor 358 and first terminal 360A of the second flying capacitor 360. The sixth switch 372, (SW 6), may include a sixth switch control input configured to receive a sixth switch control signal 398 from the μC charge pump control circuit 316B, where the sixth switch control signal 398 operably opens and closes the sixth switch 372, (SW 6), based upon the operational mode of the μC charge pump circuit 262B. The sixth switch 372, (SW 6), may be coupled between the first terminal 360A of the second flying capacitor 360 and the supply input 24, ($V_{BAT}$). The seventh switch 374, (SW 7), may include a seventh switch control input configured to receive a seventh switch control signal 400 from the μC charge pump control circuit 316B, where the seventh switch control signal 400 operably opens and closes the seventh switch 374, (SW 7), based upon the operational mode of the μC charge pump circuit 262B. The seventh switch 374, (SW 7), may be coupled between the first terminal 360A of the second flying capacitor 360 and the μC charge pump output. The eighth switch 376, (SW 8), may include an eighth switch control input configured to receive an eighth switch control signal 402 from the μC charge pump control circuit 316B, where the eighth switch control signal 402 operably opens and closes the eighth switch 376, (SW 8), based upon the operational mode of the μC charge pump circuit 262B. The eighth switch 376, (SW 8), may be coupled between the second terminal 360B of the second flying capacitor 360 and ground. The ninth switch 378, (SW 9), may include a ninth switch control input configured to receive a ninth switch control signal 404 from the μC charge pump control circuit 316B, where the ninth switch control signal 404 operably opens and closes the ninth switch 378, (SW 9), based upon the operational mode of the μC charge pump circuit 262B. The ninth switch 378, (SW 9), may be coupled between the second terminal 360B of the second flying capacitor 360 and the μC charge pump output. The tenth switch 380, (SW 10), may include a tenth switch control input configured to receive a tenth switch control signal 406 from the μC charge pump control circuit 316B, where the tenth switch control signal 406 operably opens and closes the tenth switch 380, (SW 10), based upon the operational mode of the μC charge pump circuit 262B. The tenth switch 380, (SW 10), may be coupled between the first terminal 358A of the first flying capacitor 358 and the first terminal 360A of the second flying capacitor 360. The eleventh switch 382, (SW 11), may include an eleventh switch control input configured to receive an eleventh switch control signal 408 from the μC charge pump control circuit 316B, where the eleventh switch control signal 408 operably opens and closes the eleventh switch 382, (SW 11), based upon the operational mode of the μC charge pump circuit 262B. The eleventh switch 382, (SW 11), may be coupled between the second terminal 358B of the first flying capacitor 358 and the supply input 24, ($V_{BAT}$). The twelfth switch 384, (SW 12), may include a twelfth switch control input configured to receive a twelfth switch control signal 410 from the μC charge pump control circuit 316B, where the twelfth switch control signal 410 operably opens and closes the twelfth switch 384, (SW 12), based upon the operational mode of the μC charge pump circuit 262B. The twelfth switch 384, (SW 12), may be coupled between the second terminal 360B of the second flying capacitor 360 and the supply input 24, ($V_{BAT}$). The thirteenth switch 386, (SW 13), may include a thirteenth switch control input configured to receive a thirteenth switch control signal 412 from the μC charge pump control circuit 316B, where the thirteenth switch control signal 412 operably opens and closes the thirteenth switch 386, (SW 13), based upon the operational mode of the μC charge pump circuit 262B. The thirteenth switch 386, (SW 13), may be coupled between the second terminal 358B of the first flying capacitor 358 and the second terminal 360B of the second flying capacitor 360. Although not depicted in FIG. 19B, some embodiments of the μC charge pump circuit 262B may further include a μC charge pump output capacitor 357, $C_{\mu C\_OUT}$, coupled to the μC charge pump output in order to either store charge transferred from the supply input 24, ($V_{BAT}$), to the μC charge pump output or may source previously transferred charge to the μC charge pump output, as previously described relative to the operation of the μC charge pump circuit 262A.

Similar to the μC charge pump circuit 262A, the μC charge pump circuit 262B may be configured to operate in a respective operational mode based upon selection of an operational ratio of the μC charge pump, $\mu BB_{RATIO}$, that corresponds to the respective operational mode. Also, similar to TABLE 2, TABLE 4 provides the relationship between the operational ratio of the μC charge pump, $\mu BB_{RATIO}$, the phase of operation, and the switch state (open or closed) of the first switch 362, (SW 1), the second switch 364, (SW 2), the third switch 366, (SW 3), the fourth switch 368, (SW 4), the fifth switch 370, (SW 5), the sixth switch 372, (SW 6), the seventh switch 374, (SW 7), the eighth switch 376, (SW 8), the ninth switch 378, (SW 9), the tenth switch 380, (SW 10), the eleventh switch 382, (SW 11), the twelfth switch 384, (SW 12), and the thirteenth switch 386, (SW 13).

charge pump control circuit 316B via the μC charge pump control bus 278 to operate in one of the operational modes, as shown in TABLE 3, by setting an operational ratio of the μC charge pump, $\mu BB_{RATIO}$, of the μC charge pump circuit 262B. Also similar to the μC charge pump control circuit 316A, the μC charge pump control circuit 316B may store one or more parameters corresponding to a selection of the operational ratio of the μC charge pump, $\mu BB_{RATIO}$, locally in the μC charge pump control circuit 316B.

As an example, similar to the μC charge pump circuit 262A, the μC charge pump circuit 262B may be configured to operate in the OFF mode by setting the operational ratio of the μC charge pump, $\mu BB_{RATIO}$, to OFF. When the operational ratio of the μC charge pump, $\mu BB_{RATIO}$, is set to OFF, the first switch 362, (SW 1), is configured to be open, the second switch 364, (SW 2), is configured to be open, the third switch 366, (SW 3), is configured to be open, the fourth switch 368, (SW 4), is configured to be open, the fifth switch 370, (SW 5), is configured to be open, the sixth switch 372, (SW 6), is configured to be open, the seventh switch 374, (SW 7), is configured to be open, the eighth switch 376, (SW 8), is configured to be open, the ninth switch 378, (SW 9), is configured to be open, the tenth switch 380, (SW 10), is configured to be open, the eleventh switch 382, (SW 11), is configured to be open, the twelfth switch 384, (SW 12), is configured to be open, and the thirteenth switch 386, (SW 13), is configured to be open at all times. Accordingly, the μC charge pump output voltage, $V_{\mu C\_OUT}$, at the μC charge pump output floats with respect to ground when the μC charge pump circuit 262A is configured to operate in the OFF mode.

TABLE 4

| | OPERATIONAL RATIO OF μC CHARGE PUMP, ($\mu BB_{RATIO}$) | | | | | | | |
|---|---|---|---|---|---|---|---|---|
| SWITCHES | OFF | ¼ | ⅓ | ½ | ⅔ | 1 | 4/3 | 3/2 |
| SW 1 | OPEN | PHASE 1 | PHASE 1 | PHASE 1 | PHASE 1 | PHASE 1 (CLOSED) | PHASE 1 | PHASE 1 |
| SW 2 | OPEN | OPEN | PHASE 2 | PHASE 2 | PHASE 2 | PHASE 1 (CLOSED) | PHASE 2 | PHASE 2 |
| SW 3 | OPEN | PHASE 3 | PHASE 2 | PHASE 2 | OPEN | OPEN | OPEN | OPEN |
| SW 4 | OPEN | OPEN | OPEN | PHASE 1 | PHASE 1 | PHASE 1 (CLOSED) | OPEN | OPEN |
| SW 5 | OPEN | PHASE 1 | PHASE 1 | OPEN | PHASE 2 | OPEN | PHASE 1 | PHASE 1 |
| SW 6 | OPEN | OPEN | OPEN | PHASE 1 | PHASE 1 | PHASE 1 (CLOSED) | PHASE 2 | OPEN |
| SW 7 | OPEN | PHASE 2 | PHASE 2 | PHASE 2 | OPEN | PHASE 1 (CLOSED) | PHASE 3 | PHASE 2 |
| SW 8 | OPEN | PHASE 2 | PHASE 2 | PHASE 2 | PHASE 2 | OPEN) | PHASE 1 | PHASE 1 |
| SW 9 | OPEN | PHASE 1 & PHASE 3 | PHASE 1 | PHASE 1 | PHASE 1 | PHASE 1 (CLOSED) | OPEN | OPEN |
| SW 10 | OPEN | PHASE 3 | OPEN | OPEN | OPEN | OPEN | OPEN | OPEN |
| SW 11 | OPEN | OPEN | OPEN | OPEN | OPEN | PHASE 1 (CLOSED) | OPEN | PHASE 2 |
| SW 12 | OPEN | OPEN | OPEN | OPEN | OPEN | PHASE 1 (CLOSED) | PHASE 3 | PHASE 2 |
| SW 13 | OPEN | OPEN | OPEN | OPEN | OPEN | OPEN | PHASE 2 | OPEN |

Similar to TABLE 2, in TABLE 4, "PHASE 1" indicates the switch state (open or closed) of the identified switch is closed during a first phase of operation of the μC charge pump circuit 262B. "PHASE 2" indicates the switch state (open or closed) of the identified switch is closed during a second phase of operation of the μC charge pump circuit 262B. "PHASE 3" indicates the switch state (open or closed) of the identified switch is closed during a third phase of operation of the μC charge pump circuit 262B. "OPEN" indicates the switch state (open or closed) of the identified switch is open during all the phases of operation of the μC charge pump circuit 262B.

Similar to the μC charge pump control circuit 316A, the controller 50, depicted in FIGS. 18A-D, may configure the μC Also similar to the μC charge pump circuit 262A, the μC charge pump circuit 262B may be configured to operate in the $3/2 \times V_{BAT}$ mode by setting the operational ratio of the μC charge pump, $\mu BB_{RATIO}$, to 3/2. As indicated in Table 4, similar to the operation of the μC charge pump circuit 262A, when the operational ratio of the μC charge pump, $\mu BB_{RATIO}$, is set to 3/2, the μC charge pump circuit 262B may operate in a first phase of operation, (PHASE 1) and a second phase of operation, (PHASE 2) dependent upon the μC charge pump clock 276.

Accordingly, as indicated by TABLE 4, when the μC charge pump circuit 262B is configured to operate in the $3/2\times V_{BAT}$ mode, the first switch 362, (SW 1), the fifth switch 370, (SW 5), and the eighth switch 376, (SW 8), are configured to be closed when the μC charge pump circuit 262B operates in a first phase of operation, (PHASE 1). In addition, the second switch 364, (SW 2), the seventh switch 374, (SW 7), the eleventh switch 382, (SW 11) and the twelfth switch 384, (SW 12), are configured to be closed when the μC charge pump circuit 262B operates in a second phase of operation, (PHASE 2). Otherwise, the first switch 362, (SW 1), the second switch 364, (SW 2), the third switch 366, (SW 3), the fourth switch 368, (SW 4), the fifth switch 370, (SW 5), the sixth switch 372, (SW 6), the seventh switch 374, (SW 7), the eighth switch 376, (SW 8), the ninth switch 378, (SW 9), the tenth switch 380, (SW 10), the eleventh switch 382, (SW 11), the twelfth switch 384, (SW 12), and the thirteenth switch 386, (SW 13), are configured to be open. As a result, the μC charge pump output provides a μC charge pump output voltage, $V_{\mu C\_OUT}$, substantially equal to $3/2\times V_{BAT}$ when the μC charge pump circuit 262B is configured to operate in the $3/2\times V_{BAT}$ mode.

Also similar to the μC charge pump circuit 262A, the μC charge pump circuit 262B may be configured to operate in the $4/3\times V_{BAT}$ mode by setting the operational ratio of the μC charge pump, $\mu BB_{RATIO}$, to 4/3. As indicated in TABLE 4, similar to the operation of the μC charge pump circuit 262A, when the operational ratio of the μC charge pump, $\mu BB_{RATIO}$, is set to 4/3, the μC charge pump circuit 262B may operate in a first phase of operation, (PHASE 1), a second phase of operation, (PHASE 2), and third phase of operation, (PHASE 3), dependent upon the μC charge pump clock 276.

Accordingly, as indicated by TABLE 4, when the μC charge pump circuit 262B is configured to operate in the $4/3\times V_{BAT}$ mode, the first switch 362, (SW 1), the fifth switch 370 (SW 5), and the eighth switch 376, (SW 8), are configured to be closed when the μC charge pump circuit 262B operates in a first phase of operation, (PHASE 1). In addition, the second switch 364 (SW 2), the sixth switch 372, (SW 6), and the thirteenth switch 386, (SW 13), are configured to be closed when the μC charge pump circuit 262B operates in a second phase of operation, (PHASE 2). Likewise, the seventh switch 374, (SW 7), and the twelfth switch 384, (SW 12), are configured to be closed when the μC charge pump circuit 262B operates in a third phase of operation, (PHASE 3). Otherwise, the first switch 362, (SW 1), the second switch 364, (SW 2), the third switch 366, (SW 3), the fourth switch 368, (SW 4), the fifth switch 370, (SW 5), the sixth switch 372, (SW 6), the seventh switch 374, (SW 7), the eighth switch 376, (SW 8), the ninth switch 378, (SW 9), the tenth switch 380, (SW 10), the eleventh switch 382, (SW 11), the twelfth switch 384, (SW 12), and the thirteenth switch 386, (SW 13), are configured to be open. As a result, the μC charge pump output provides a μC charge pump output voltage, $V_{\mu C\_OUT}$, substantially equal to $4/3\times V_{BAT}$ when the μC charge pump circuit 262B is configured to operate in the $4/3\times V_{BAT}$ mode.

Also similar the μC charge pump circuit 262A, the μC charge pump circuit 262B may be configured to operate in the $1\times V_{BAT}$ mode by setting the operational ratio of the μC charge pump, $\mu BB_{RATIO}$, to 1. As indicated in TABLE 4, similar to the operation of the μC charge pump circuit 262A, when the operational ratio of the μC charge pump, $\mu BB_{RATIO}$, is set to 1, the μC charge pump circuit 262B only operates in a first phase of operation, (PHASE 1) because the switches are statically switched into a configuration that provides a minimum impedance between the supply input 24, ($V_{BAT}$), and the μC charge pump output. In other words, when the μC charge pump circuit 262B is configured to operate in the $1\times V_{BAT}$ mode, the switch states of the indicated switches remain in either an open state or a closed state and do not change over time. The minimum impedance is provided by selectively turning on various switches to form parallel paths between the supply input 24, ($V_{BAT}$), and the μC charge pump output. Advantageously, the parallel paths lower the drop in voltage seen across the switches of the μC charge pump circuit 262B and reduce power consumption from the battery 20. However, for the sake of consistency with the other operational modes of the μC charge pump circuit 262B, the operation of the μC charge pump circuit 262B, when configured to operate in the $1\times V_{BAT}$ mode, is described as operating only in a first phase of operation (PHASE 1).

Accordingly, as indicated by TABLE 4, when the μC charge pump circuit 262B is configured to operate in the $1\times V_{BAT}$ mode, the first switch 362, (SW 1), the second switch 364, (SW 2), the fourth switch 368, (SW 4), the sixth switch 372, (SW 6), the seventh switch 374, (SW 7), the ninth switch 378, (SW 9), the eleventh switch 382, (SW 11), and the twelfth switch 384, (SW 12), are configured to be closed. In addition, the third switch 366, (SW 3), the fifth switch 370, (SW 5), the eighth switch 376, (SW 8), the tenth switch 380, (SW 10), and the thirteenth switch 386, (SW 13), are configured to be open. As a result, the μC charge pump output provides a μC charge pump output voltage, $V_{\mu C\_OUT}$, substantially equal to $1\times V_{BAT}$ when the μC charge pump circuit 262B is configured to operate in the $1\times V_{BAT}$ mode.

Also similar the μC charge pump circuit 262A, the μC charge pump circuit 262B may be configured to operate in the OFF mode by setting the operational ratio of the μC charge pump, $\mu BB_{RATIO}$, to OFF. When the μC charge pump circuit 262B is configured to operate in the OFF mode, the μC charge pump circuit 262B is disabled and the μC charge pump output floats. As indicated by TABLE 4, when the μC charge pump circuit 262B is configured to operate in the OFF mode, the first switch 362, (SW 1), the second switch 364, (SW 2), the third switch 366, (SW 3), the fourth switch 368, (SW 4), the fifth switch 370, (SW 5), the sixth switch 372, (SW 6), the seventh switch 374, (SW 7), the eighth switch 376, (SW 8), the ninth switch 378, (SW 9), the tenth switch 380, (SW 10), the eleventh switch 382, (SW 11), the twelfth switch 384, (SW 12), and the thirteenth switch 386, (SW 13), are configured to be open by the μC charge pump control circuit 316B. Accordingly, the μC charge pump output voltage, $V_{\mu C\_OUT}$, at the μC charge pump output floats with respect to ground when the μC charge pump circuit 262B is configured to operate in the OFF mode.

Unlike the μC charge pump circuit 262A, the μC charge pump circuit 262B may be configured to operate in a $1/4\times V_{BAT}$ mode, $1/3\times V_{BAT}$ mode, a $1/2\times V_{BAT}$ mode, and a $2/3\times V_{BAT}$ mode, The μC charge pump circuit 262B may be configured to operate in the $2/3\times V_{BAT}$ mode by setting the operational ratio of the μC charge pump, $\mu BB_{RATIO}$, to 2/3. As indicated by TABLE 4, when the μC charge pump circuit 262B is configured to operate in the $2/3\times V_{BAT}$ mode, the first switch 362, (SW 1), the fourth switch 368, (SW 4), the sixth switch 372, (SW 6), and the ninth switch 378, (SW 9), are configured by the μC charge pump control circuit 316B to be closed when the μC charge pump circuit 262B operates in a first phase of operation, (PHASE 1). In addition, the μC charge pump control circuit 316B configures the second switch 364, (SW 2), the fifth switch 370, (SW 5), and the eighth switch 376, (SW 8), to be closed when the μC charge pump circuit 262B operates in a second phase of operation, (PHASE 2). Otherwise, the μC charge pump control circuit 316B configures the first switch 362, (SW 1), the second switch 364, (SW 2), the third switch 366, (SW 3), the fourth switch 368, (SW 4), the fifth switch 370, (SW 5), the sixth switch 372, (SW 6), the seventh switch 374, (SW 7), the eighth switch 376, (SW 8), the ninth switch 378, (SW 9), the tenth switch 380, (SW 10), the eleventh switch 382, (SW 11), the twelfth switch 384, (SW 12), and the thirteenth switch 386, (SW 13), to be open. As a result, the μC charge pump output provides a μC charge pump output voltage, $V_{\mu C\_OUT}$, substantially equal to 2/3×$V_{BAT}$ when the μC charge pump circuit 262B is configured to operate in the 2/3×$V_{BAT}$ mode.

The μC charge pump circuit 262B may be configured to operate in the 1/2×$V_{BAT}$ mode by setting the operational ratio of the μC charge pump, $\mu BB_{RATIO}$, to 1/2. As indicated by TABLE 4, when the μC charge pump circuit 262B is configured to operate in the 1/2×$V_{BAT}$ mode, the μC charge pump control circuit 316B configures the first switch 362, (SW 1), the fourth switch 368, (SW 4), the sixth switch 372, (SW 6), and the ninth switch 378, (SW 9), to be closed when the μC charge pump circuit 262B operates in a first phase of operation, (PHASE 1). In addition, the μC charge pump control circuit 316B configures the second switch 364, (SW 2), the third switch 366, (SW 3), the seventh switch 374, (SW 7), and the eighth switch 376, (SW 8), to be closed when the μC charge pump circuit 262B operates in a second phase of operation, (PHASE 2). Otherwise, the μC charge pump control circuit 316B configures the first switch 362, (SW 1), the second switch 364, (SW 2), the third switch 366, (SW 3), the fourth switch 368, (SW 4), the fifth switch 370, (SW 5), the sixth switch 372, (SW 6), the seventh switch 374, (SW 7), the eighth switch 376, (SW 8), the ninth switch 378, (SW 9), the tenth switch 380, (SW 10), the eleventh switch 382, (SW 11), the twelfth switch 384, (SW 12), and the thirteenth switch 386, (SW 13), to be open. As a result, the μC charge pump output provides a μC charge pump output voltage, $V_{\mu C\_OUT}$, substantially equal to 1/2×$V_{BAT}$ when the μC charge pump circuit 262B is configured to operate in the 1/2×$V_{BAT}$ mode.

The μC charge pump circuit 262B may be configured to operate in the 1/3×$V_{BAT}$ mode by setting the operational ratio of the μC charge pump, $\mu BB_{RATIO}$, to 1/3. As indicated by TABLE 4, when the μC charge pump circuit 262B is configured to operate in the 1/3×$V_{BAT}$ mode, the μC charge pump control circuit 316B configures the first switch 362, (SW 1), the fifth switch 370, (SW 5), and the ninth switch 378, (SW 9), to be closed when the μC charge pump circuit 262B operates in a first phase of operation, (PHASE 1). In addition, the μC charge pump control circuit 316B configures the second switch 364, (SW 2), the third switch 366, (SW 3), the seventh switch 374, (SW 7), and the eighth switch 376, (SW 8), to be closed when the μC charge pump circuit 262B operates in a second phase of operation, (PHASE 2). Otherwise, the μC charge pump control circuit 316B configures the first switch 362, (SW 1), the second switch 364, (SW 2), the third switch 366, (SW 3), the fourth switch 368, (SW 4), the fifth switch 370, (SW 5), the sixth switch 372, (SW 6), the seventh switch 374, (SW 7), the eighth switch 376, (SW 8), the ninth switch 378, (SW 9), the tenth switch 380, (SW 10), the eleventh switch 382, (SW 11), the twelfth switch 384, (SW 12), and the thirteenth switch 386, (SW 13), to be open. As a result, the μC charge pump output provides a μC charge pump output voltage, $V_{\mu C\_OUT}$, substantially equal to 1/3×$V_{BAT}$ when the μC charge pump circuit 262B is configured to operate in the 1/3×$V_{BAT}$ mode.

The μC charge pump circuit 262B may be configured to operate in the 1/4×$V_{BAT}$ mode by setting the operational ratio of the μC charge pump, $\mu BB_{RATIO}$, to 1/4. Similar to the operation of the μC charge pump circuit 262A, when the μC charge pump circuit 262A is configured to operate in the 1/4×$V_{BAT}$ mode, the μC charge pump circuit 262B may include a first phase of operation, (PHASE 1), a second phase of operation, (PHASE 2), and a third phase of operation, (PHASE 3). As indicated by TABLE 4, when the μC charge pump circuit 262B is configured to operate in the 1/4×$V_{BAT}$ mode, the μC charge pump control circuit 316B configures the first switch 362, (SW 1), the fifth switch 370, (SW 5), and the ninth switch 378, (SW 9), to be closed when the μC charge pump circuit 262B operates in a first phase of operation, (PHASE 1). The μC charge pump control circuit 316B configures the seventh switch 374, (SW 7), and the eighth switch 376, (SW 8), to be closed when the μC charge pump circuit 262B operates in a second phase of operation, (PHASE 2). The μC charge pump control circuit 316B configures the third switch 366, (SW 3), and the ninth switch 378, (SW 9), to be closed when the μC charge pump circuit 262B operates in a third phase of operation, (PHASE 3). Otherwise, the μC charge pump control circuit 316B configures the first switch 362, (SW 1), the second switch 364, (SW 2), the third switch 366, (SW 3), the fourth switch 368, (SW 4), the fifth switch 370, (SW 5), the sixth switch 372, (SW 6), the seventh switch 374, (SW 7), the eighth switch 376, (SW 8), the ninth switch 378, (SW 9), the tenth switch 380, (SW 10), the eleventh switch 382, (SW 11), the twelfth switch 384, (SW 12), and the thirteenth switch 386, (SW 13), to be open. As a result, the μC charge pump output provides a μC charge pump output voltage, $V_{\mu C\_OUT}$, substantially equal to 1/4×$V_{BAT}$ when the μC charge pump circuit 262B is configured to operate in the 1/4×$V_{BAT}$ mode.

Figure 21:
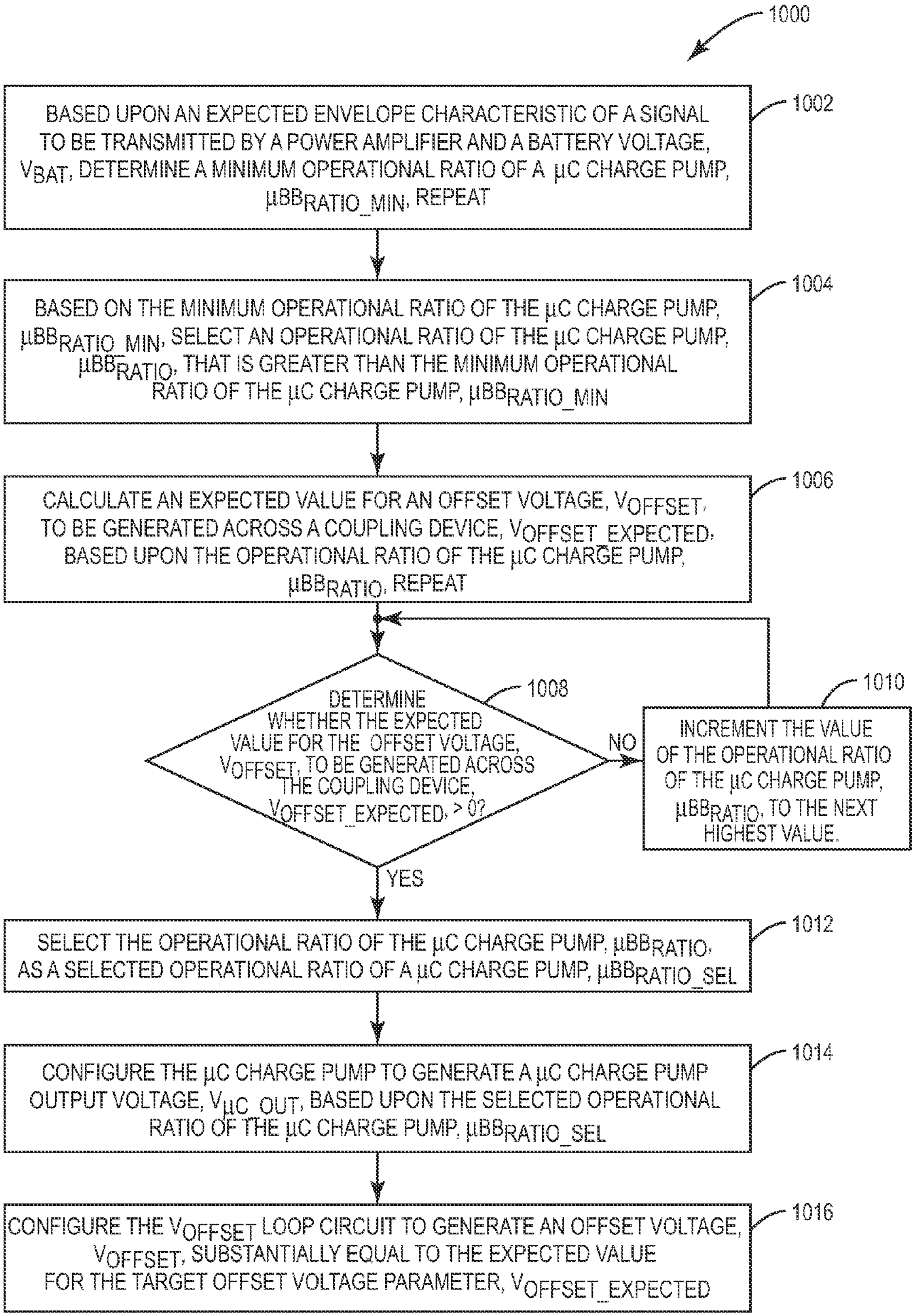
FIG. 21 depicts a method for configuring a μC charge pump circuit to provide a supply voltage to a parallel amplifier prior to commencement of a data transmission by a linear RF power amplifier.

FIG. 21 depicts a method 1000 to permit the controller 50, depicted in FIGS. 18A-D, to selectively configure the μC charge pump prior to transmission of a data burst by a linear RF power amplifier. Accordingly, the description of method 1000 will be done with continuing reference to FIGS. 18A-D.

Prior to transmission of the data burst, the pseudo-envelope follower power management systems 10C-F may configure the μC charge pump circuit 262 and the $V_{OFFSET}$ loop circuit 41A-B in order to provide a power amplifier supply voltage, $V_{CC}$, that is sufficient to power the linear RF power amplifier during the transmission of the data burst. Accordingly, prior to initiation of a transmission of data by the linear RF power amplifier, the controller 50 may determine the expected envelope characteristics of the signal to be transmitted. An example transmission of data may occur in a burst transmission time-slot. To determine the expected envelope characteristics of the signal to be transmitted, the controller 50 may consider the impact of data rate, the bandwidth of the channel and/or the type of modulation. Example types of modulation may include, but are not limited to quadrature phase shift keys (QPSK), or quadrature amplitude modulation (QAM). Alternatively, or in addition, the controller 50 may determine and consider the peak-to-average ratio characteristic of the waveform to be generated by the power amplifier.

Based upon an expected envelope characteristic of a signal to be transmitted by a power amplifier and a battery voltage, $V_{BAT}$, the controller 50 may be configured to determine a minimum operational ratio of a μC charge pump, $uBB_{RATIO\_MIN}$. (Step 1002). In order to determine the minimum operational ratio of a μC charge pump, $uBB_{RATIO\_MIN}$, the controller uses the expected envelope characteristics of the signal to be transmitted to determine the expected peak to peak swing of the power amplifier supply voltage, $V_{CC\_PKPK}$, and obtains the voltage level of the battery, as present on the supply input 24, ($V_{BAT}$). The expected peak to peak swing of the power amplifier supply voltage, $V_{CC\_PKPK}$, represents the dynamic range of voltages that the controller 50 expects to be generated on the power amplifier supply voltage, $V_{CC}$, during the transmission of data. Effectively, the expected peak to peak swing of the power amplifier supply voltage, $V_{CC\_PKPK}$, equals the difference between maximum expected power amplifier supply voltage, $V_{CC\_MAX}$ and the minimum expected power amplifier supply voltage, $V_{CC\_MIN}$, that the controller 50 expects to be generated on the power amplifier supply voltage, $V_{CC}$, during the data transmission.

In addition to the expected peak to peak swing of the power amplifier supply voltage, $V_{CC\_PKPK}$, the controller may also take into consideration the minimum headroom voltage, $V_{HEADROOM}$, of the switching elements of the parallel amplifier 35. As an example, referring to FIGS. 12E-F, the controller 50 may consider the minimum headroom voltage, $V_{HEADROOM}$, for the first switching element, $SW_{1A}$, 214, and a second switching element, $SW_{1B}$, 216. In addition, in some embodiments, the controller 50 may consider the minimum headroom for each of the switching devices ($SW_{1A}$, 214 and $SW_{1B}$, 216) individually. As an example, for the case where the first switching element, $SW_{1A}$, 214 is a PFET device, the controller 50 may use the minimum PFET headroom voltage, $V_{HEADROOM\_P}$, to determine the operational ratio of a μC charge pump, $uBB_{RATIO}$. In the case where the second switching element, $SW_{1B}$, 216 is an NFET device, the controller 50 may use the minimum NFET headroom voltage, $V_{HEADROOM\_N}$ to determine the operational ratio of a μC charge pump, $uBB_{RATIO}$.

Accordingly, in the general case, the controller 50 may determine the minimum operational ratio of a μC charge pump, $uBB_{RATIO\_MIN}$, as shown in equation (1) as follows:

$$uBB_{RATIO\_MIN}=[V_{CC\_PKPK}+V_{HEADROOM\_N}+V_{HEADROOM\_P})/V_{BAT} \quad (1)$$

Based on the minimum operational ratio of the μC charge pump, $uBB_{RATIO\_MIN}$, the controller 50 may be configured to select an operational ratio of the μC charge pump, $uBB_{RATIO}$, that is greater than the minimum operational ratio of the μC charge pump, $uBB_{RATIO\_MIN}$. (Step 1004). As indicated by TABLES 1 and 3, the available values of operational ratios of the μC charge pump, $uBB_{RATIO}$, depend upon the embodiment of the μC charge pump circuit 262. As an example, the embodiment of the μC charge pump circuit 262A, depicted in FIG. 19A, provides several modes of operation where each mode of operation is associated with an operational ratio of the μC charge pump, $uBB_{RATIO}$, as shown in TABLE 1. Likewise, the example embodiment of the μC charge pump circuit 262B, depicted in FIG. 19B, provides a number of modes of operation where each mode of operation is associated with an operational ratio of the μC charge pump, $uBB_{RATIO}$, as shown in TABLE 3. Depending upon the calculated value of the minimum operational ratio of a μC charge pump, $uBB_{RATIO\_MIN}$, the controller 50 initially selects the smallest available operational ratio of the μC charge pump, $uBB_{RATIO}$, of the μC charge pump circuit 262 that is greater than the minimum operational ratio of a μC charge pump, $uBB_{RATIO\_MIN}$. As an example, in the case where the μC charge pump circuit 262 is similar to the μC charge pump circuit 262B of FIG. 19B (TABLE 3), if the minimum operational ratio of a μC charge pump, $uBB_{RATIO\_MIN}$, is greater than 1/4 but less than 1/3, the controller initially selects the operational ratio of the μC charge pump, $uBB_{RATIO}$, to be 1/3.

Thereafter, the controller 50 may be configured to calculate an expected value for an offset voltage, $V_{OFFSET}$, to be generated across a coupling device, $V_{OFFSET\_EXPECTED}$, based upon the operational ratio of the μC charge pump, $uBB_{RATIO}$, of the μC charge pump, selected by the controller 50 (Step 1006). The expected value for an offset voltage, $V_{OFFSET\_EXPECTED}$, may be calculated as shown in equation (2) as follows:

$$V_{OFFSET\_EXPECTED}=V_{CC\_PKPK}-V_{BAT}\times uBB_{RATIO}+V_{HEADROOM\_P} \quad (2)$$

Thereafter, the controller 50 may be configured to determine whether the expected value for the offset voltage, $V_{OFFSET\_EXPECTED}$, to be generated across the coupling device is greater than zero, $V_{OFFSET\_EXPECTED}$, >0. (Step 1008). In some alternative embodiments of method 1000, the controller 50 may determine whether the expected value for the offset voltage, $V_{OFFSET\_EXPECTED}$, to be generated across the coupling device is greater than a minimum offset voltage, $V_{OFFSET\_MIN}$, where the minimum offset voltage, $V_{OFFSET\_MIN}$, is a configurable parameter. In this example embodiment of method 1000, it will be understood that the minimum offset voltage, $V_{OFFSET\_MIN}$, is zero.

If the expected value for the offset voltage, $V_{OFFSET}$, to be generated across the coupling device is less than zero, $V_{OFFSET\_EXPECTED}$, <0, the controller 50 increments the value of the operational ratio of the μC charge pump, $uBB_{RATIO}$, to the next highest value of the operational ratio of the μC charge pump, $uBB_{RATIO}$, available for the μC charge pump circuit 262. (Step 1010). For example, in the case where the μC charge pump circuit 262 is similar to the μC charge pump circuit 262B of FIG. 19B, if the initially determined value of the operational ratio of the μC charge pump, $uBB_{RATIO}$, of the μC charge pump circuit 262B is 1/3, the controller 50 will increment the value of the operational ratio of the μC charge pump, $uBB_{RATIO}$, to 1/2. Thereafter, method 1000 returns to Step 1008 to recalculate the expected value for an offset voltage, $V_{OFFSET\_EXPECTED}$, using the new value of the operational ratio of the μC charge pump, $uBB_{RATIO}$. This process continues until the controller 50 identifies the minimum value of the operational ratio of the μC charge pump, $uBB_{RATIO}$, of the μC charge pump circuit 262 for which $V_{OFFSET\_EXPECTED}>0$.

After identifying the minimum value of the operational ratio of the μC charge pump, $uBB_{RATIO}$, of the μC charge pump circuit 262 for which $V_{OFFSET\_EXPECTED}>0$, the controller selects the operational ratio of the μC charge pump, $uBB_{RATIO}$, as a selected operational ratio of a μC charge pump, $uBB_{RATIO\_SEL}$, to be used during the transmission of data by the linear RF power amplifier. (Step 1012). Via the μC charge pump control bus 278, the controller 50 configures the μC charge pump circuit 262 to generate a μC charge pump output voltage, $V_{\mu C\_OUT}$, on the μC charge pump output based upon the selected operational ratio of a μC charge pump, $uBB_{RATIO\_SEL}$. (Step 1014).

Thereafter, in some embodiments of method 1000, the controller 50 configures the $V_{OFFSET}$ loop circuit 41A-B to generate an offset voltage, $V_{OFFSET}$, substantially equal to an expected value for the target offset voltage, $V_{OFFSET\_EXPECTED}$, when the μC charge pump circuit 262 uses the selected operational ratio of a μC charge pump, $uBB_{RATIO\_SEL}$. (Step 1016). Accordingly, the controller 50 may be configured to calculate the value of an expected target offset voltage, $V_{OFFSET\_TARGET\_EXPECTED}$, when the μC charge pump circuit 262 is configured to operate using the selected operational ratio of a μC charge pump, $uBB_{RATIO\_SEL}$. The value of the target offset voltage, $V_{OFFSET\_TARGET\_EXPECTED}$, may be calculated as shown in equation (3) as follows:

$$V_{OFFSET\_TARGET\_EXPECTED}=V_{CC\_PKPK}-V_{BAT}\times uBB_{RATIO\_SEL}+V_{HEADROOM\_P} \quad (3)$$

Thereafter, the controller 50 may be configured to use the value of the expected target offset voltage, $V_{OFFSET\_TARGET\_EXPECTED}$, to determine the parameter value of $V_{OFFSET\_TARGET}$ to be provided to the $V_{OFFSET}$ loop circuit 41A-B. Via the μC charge pump control bus 278, the controller 50 provides the $V_{OFFSET\_TARGET}$ parameter to the $V_{OFFSET}$ loop circuit 41A-B.

Figure 22:
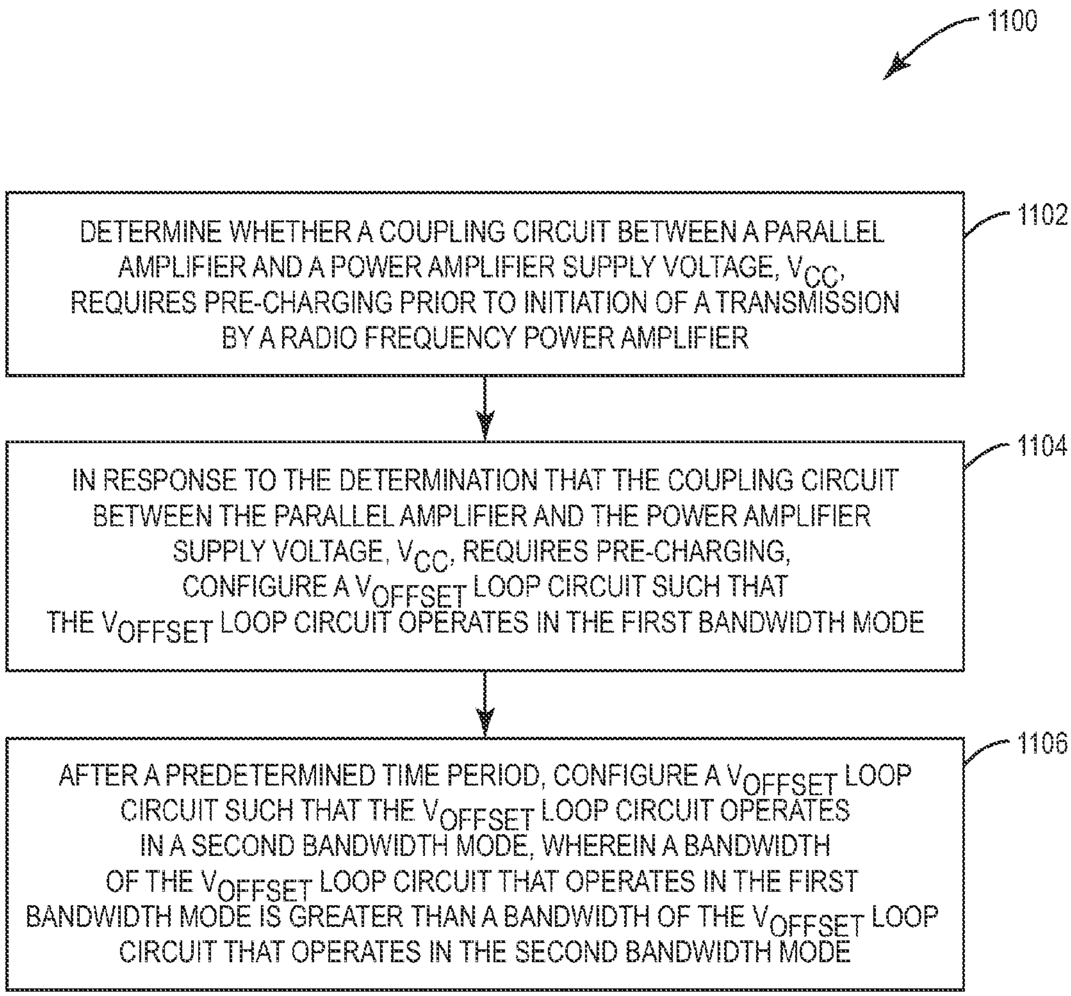
FIG. 22 depicts a method for pre-charging a $V_{OFFSET}$ Loop Circuit prior to commencement of a data transmission by a linear RF power amplifier.

A method 1100, depicted in FIG. 22, is described with continuing reference to FIGS. 18B and 18D. The method 1100 provides for the configuration of a $V_{OFFSET}$ loop circuit 41B, depicted in FIGS. 18B and 18D, to minimize a pre-charging time period of the coupling circuit 18 to a desired offset voltage, $V_{OFFSET}$, prior to commencing a transmission, by the linear RF power amplifier 22 (FIG. 1A-B) of a data burst in a transmission-slot. As an example, prior to commencing the transmission of the data burst, the controller 50 may determine whether a coupling circuit 18 coupled between a parallel amplifier output 32A and a power amplifier supply voltage, $V_{CC}$, requires pre-charging prior to initiation of the transmission by a radio frequency power amplifier, (Step 1102). Illustratively, the controller 50 may determine whether a data burst to be transmitted is a first data burst of a transmission of data by the linear RF power amplifier 22. If the data burst to be transmitted is a first data burst of the transmission, the controller 50 may determine that the coupling circuit 18 requires pre-charging prior to transmission of the first data burst.

Alternatively, the controller 50 may determine whether the coupling circuit 18 requires pre-charging based upon the $V_{OFFSET}$ error signal 304 generated by the summing circuit 300. As an example, the controller 50 may set the value of the $V_{OFFSET\_TARGET}$ parameter for the $V_{OFFSET}$ loop circuit 41B. Thereafter, the controller 50 may obtain the $V_{OFFSET}$ error signal 304 from the $V_{OFFSET}$ loop circuit 41B via the $V_{OFFSET}$ control bus 312. If the $V_{OFFSET}$ error signal 304 is greater than a maximum $V_{OFFSET}$ error threshold parameter, the controller 50 determines that the power amplifier supply voltage, $V_{CC}$, requires pre-charging prior to initiation of transmission of the first burst.

In response to the determination that the coupling circuit between the parallel amplifier and the power amplifier supply voltage, $V_{CC}$, requires pre-charging, the controller 50 may configure the $V_{OFFSET}$ loop circuit 41B such that the $V_{OFFSET}$ loop circuit 41B operates in a first bandwidth mode, where the first bandwidth mode increases the operable bandwidth of the $V_{OFFSET}$ loop circuit 41B. (Step 1104).

As discussed relative to the description of FIGS. 18B and 18D, the integrator with zero compensation 314 may include a first time constant, $Tau_0$, and a second time constant, $Tau_1$. During normal operation of the $V_{OFFSET}$ loop circuit 41B, the values of the first time constant, $Tau_0$, and a second time constant, $Tau_1$, may be configured to optimize regulation of the offset voltage, $V_{OFFSET}$, that is developed across the coupling circuit 18. For example, the controller 50 may configure the $V_{OFFSET}$ loop circuit 41B to operate with a normal frequency bandwidth. Illustratively, to configure the $V_{OFFSET}$ loop circuit 41B to operate with a normal frequency bandwidth, the controller 50 may configure the first time constant, $Tau_0$, to be equal to $Tau_0$_normal and the second time constant, $Tau_1$, to be equal to $Tau_1$_normal. In some embodiments of the $V_{OFFSET}$ loop circuit 41B, the values of time constants $Tau_0$_normal and $Tau_1$_normal, may be stored locally with the $V_{OFFSET}$ loop circuit 41B.

To decrease the time for pre-charging the coupling circuit 18, the controller may configure the first time constant, $Tau_0$, to be equal to a first startup time constant, $Tau_0$_startup, and the second time constant, $Tau_1$, to be equal to a second startup time constant, $Tau_1$_startup. Alternatively, some embodiments of the $V_{OFFSET}$ loop circuit 41B may be configured to automatically set the first time constant, $Tau_0$, equal to the first startup time constant, $Tau_0$_startup, and the second time constant, $Tau_1$, when the $V_{OFFSET}$ loop circuit 41B is placed in a pre-charge mode of operation.

In some embodiments of method 1100, the controller 50 may configure the $V_{OFFSET}$ loop circuit 41B to initially operate using the first startup time constant, $Tau_0$_startup, and the second startup time constant, $Tau_1$_startup, by configuring the $V_{OFFSET}$ loop circuit 41B operate in the pre-charge mode of operation for a period of time. As an example, in some embodiments of the $V_{OFFSET}$ loop circuit 41B, the period of time in which the $V_{OFFSET}$ loop circuit 41B operates in a pre-charge mode of operation may be configured by the controller 50 via the $V_{OFFSET}$ control bus 312. In some embodiments of the $V_{OFFSET}$ loop circuit 41B, the period of time in which the $V_{OFFSET}$ loop circuit 41B operates in a pre-charge mode of operation is a predetermined time period that may be configured by the controller 50 via $V_{OFFSET}$ control bus 312. As an example, the $V_{OFFSET}$ loop circuit 41B may include a pre-charge timer (not shown) that may be set to trigger a timer event after the predetermined time period.

Once the coupling circuit 18 is pre-charged, the $V_{OFFSET}$ loop circuit 41B may be placed into a normal mode of operation. As an example, after a predetermined time period, the $V_{OFFSET}$ loop circuit 41B may be re-configured such that the $V_{OFFSET}$ loop circuit operates 41B in a second bandwidth mode, where the second bandwidth mode decreases the operable bandwidth of the $V_{OFFSET}$ loop circuit 41B. (Step 1106). Accordingly, the bandwidth of the $V_{OFFSET}$ loop circuit 41B that operates in the first bandwidth mode is greater than the bandwidth of the $V_{OFFSET}$ loop circuit 41B that operates in the second bandwidth mode.

As an example, in order to place the $V_{OFFSET}$ loop circuit 41B into the second bandwidth mode for normal operation during transmission of data by the linear RF power amplifier 22, the controller 50 may configure the first time constant, $Tau_0$, to be equal to $Tau_0$_normal and the second time constant, $Tau_1$, to be equal to $Tau_1$_normal via the $V_{OFFSET}$ control bus 312. Alternatively, as an example, $V_{OFFSET}$ loop circuit 41B may automatically switch from the pre-charge mode of operation to a normal mode of operation upon triggering of the timer event by the pre-charge timer.

Embodiments of an open loop ripple compensation assist circuit 414, depicted in FIGS. 23A-23D, will now be described. In order to provide context and not by way of limitation, the open loop ripple compensation assist circuit 414 will be described in the context of the example embodiments of a pseudo-envelope follower power management system 10MA, depicted in FIG. 23A and FIG. 23C, and a pseudo-envelope follower power management system 10MB, depicted in FIG. 23B and FIG. 23D.

FIGS. 23A-D depict the pseudo-envelope follower power management system 10MA and pseudo-envelope follower power management system 10MB, employ a switch mode power supply converter in combination with either an embodiment of the parallel amplifier circuit 14MA or an embodiment of the parallel amplifier circuit 14MB to provide techniques for modulating the power amplifier supply voltage, $V_{CC}$, generated at the power amplifier supply output 28 for use by the linear RF power amplifier 22.

Figure 23A:
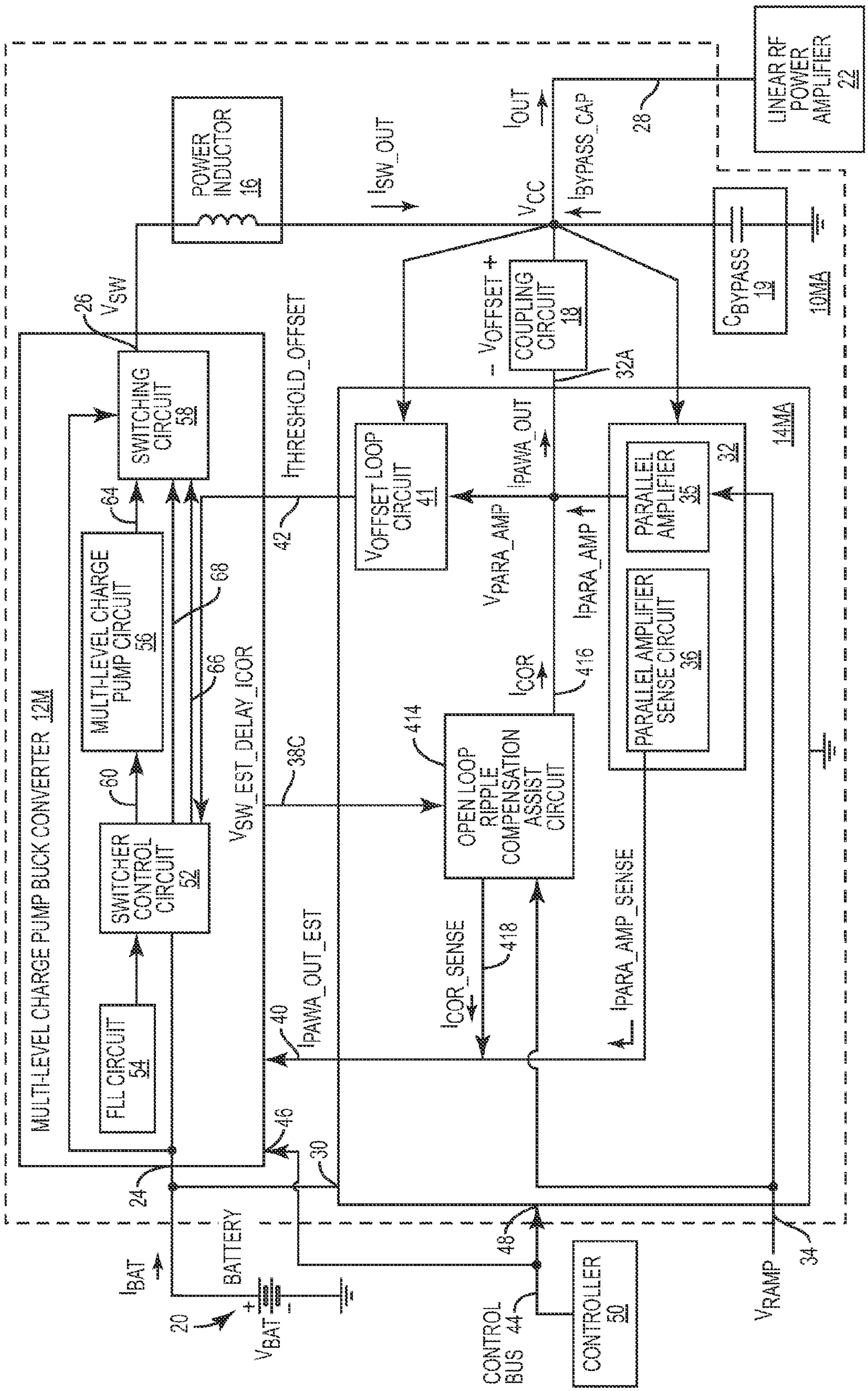
FIG. 23A depicts an embodiment of a pseudo-envelope follower power management system including a multi-level charge pump buck converter and an embodiment of a parallel amplifier circuit that includes an open loop ripple compensation assist circuit.

As an example of a switch mode power supply converter, as depicted in FIG. 23A, the pseudo-envelope follower power management system 10MA may include an embodiment of a multi-level charge pump buck converter 12M configured to interface with the parallel amplifier circuit 14MA. As another example of a configuration that includes a switch mode power supply converter, as depicted in FIG. 23C, an alternative embodiment of the pseudo-envelope follower power management system 10MA may include an embodiment of a multi-level charge pump buck converter 12M configured to interface with the parallel amplifier circuit 14MB. As depicted in both FIG. 23A and FIG. 23C, the interface between the multi-level charge pump buck converter 12M and either the parallel amplifier circuit 14MA or the parallel amplifier circuit 14MB may be configured to provide a parallel amplifier circuit output current estimate 40, $I_{PAWA\_OUT\_EST}$, the threshold offset current 42, $I_{THRESHOLD\_OFFSET}$, or a combination thereof, to the multi-level charge pump buck converter 12M.

As depicted in FIG. 23A and FIG. 23C, and not by way of limitation, some embodiments of the multi-level charge pump buck converter 12M may include an FLL circuit 54 similar to the FLL circuit 54 of the multi-level charge pump buck converter 12B, depicted in FIG. 2B. For example, some embodiments of the multi-level charge pump buck converter 12M may include a switcher control circuit 52 similar to the switcher control circuit 52A, depicted in FIG. 3A, or the switcher control circuit 52B, depicted in FIG. 3B. However, alternative embodiments of the multi-level charge pump buck converter 12M, similar to the embodiments of the multi-level charge pump buck converter 12B that include an embodiment of the switcher control circuit 52 similar to the switcher control circuit 52C, depicted in FIG. 3C, and/or the switcher control circuit 52D, depicted in FIG. 3D, may not include an FLL circuit 54. Accordingly, operation of the multi-level charge pump buck converter 12M and the switcher control circuit 52, depicted in FIG. 23A and FIG. 23C, may also incorporate various combinations of the operational features and functions of the embodiments of the switcher control circuits 52A-D, depicted in FIGS. 3A-D, the threshold detector and control circuits 132A-D, depicted in FIGS. 4A-D, and the circuitry and state machines depicted in FIGS. 5A-D and FIG. 6A-D that are associated with the logic circuits 148A-D, depicted in FIGS. 4A-D.

Figure 23B:
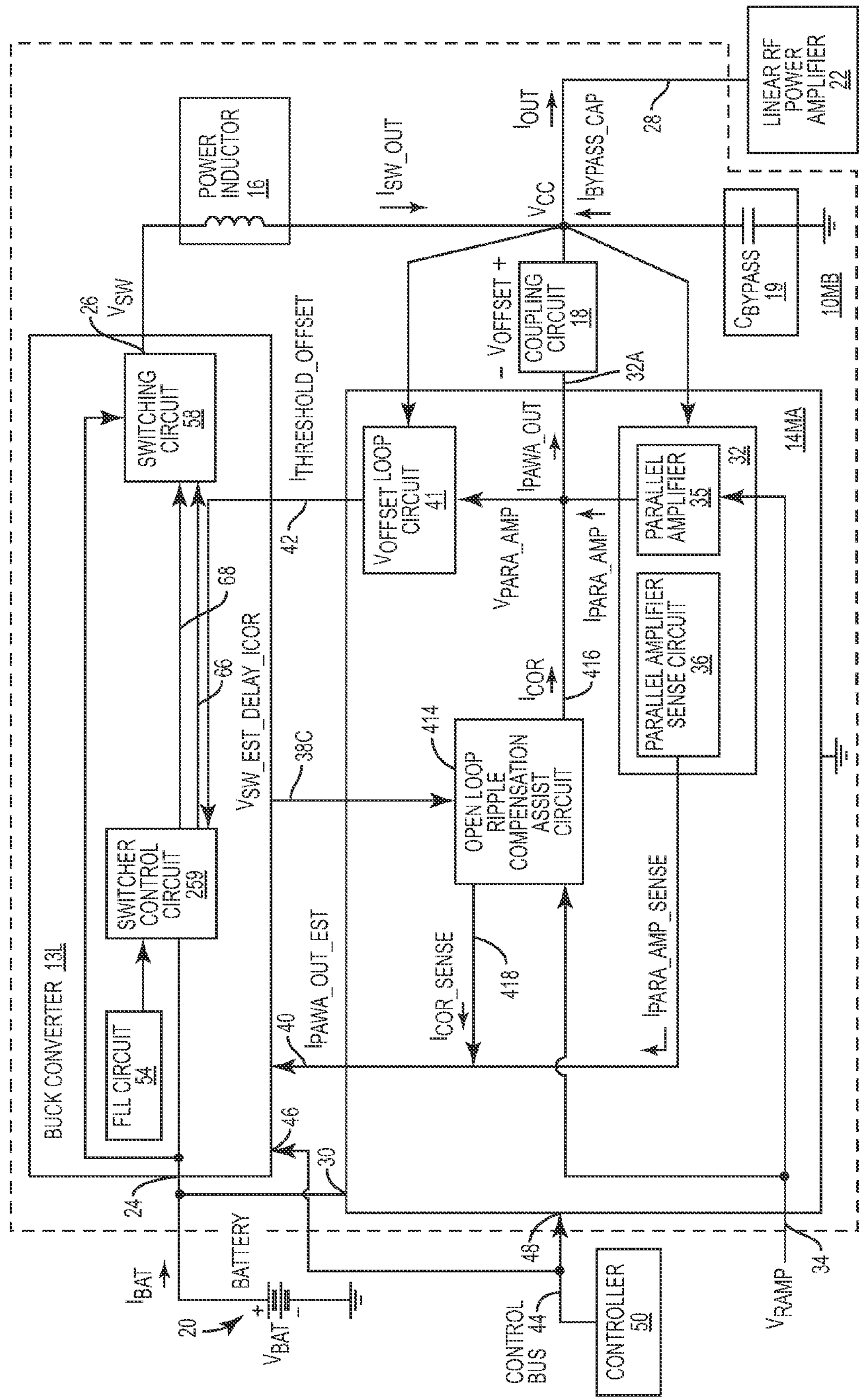
FIG. 23B depicts an embodiment of a pseudo-envelope follower power management system including a buck converter and an embodiment of a parallel amplifier circuit that includes an open loop ripple compensation assist circuit.
Figure 23C:
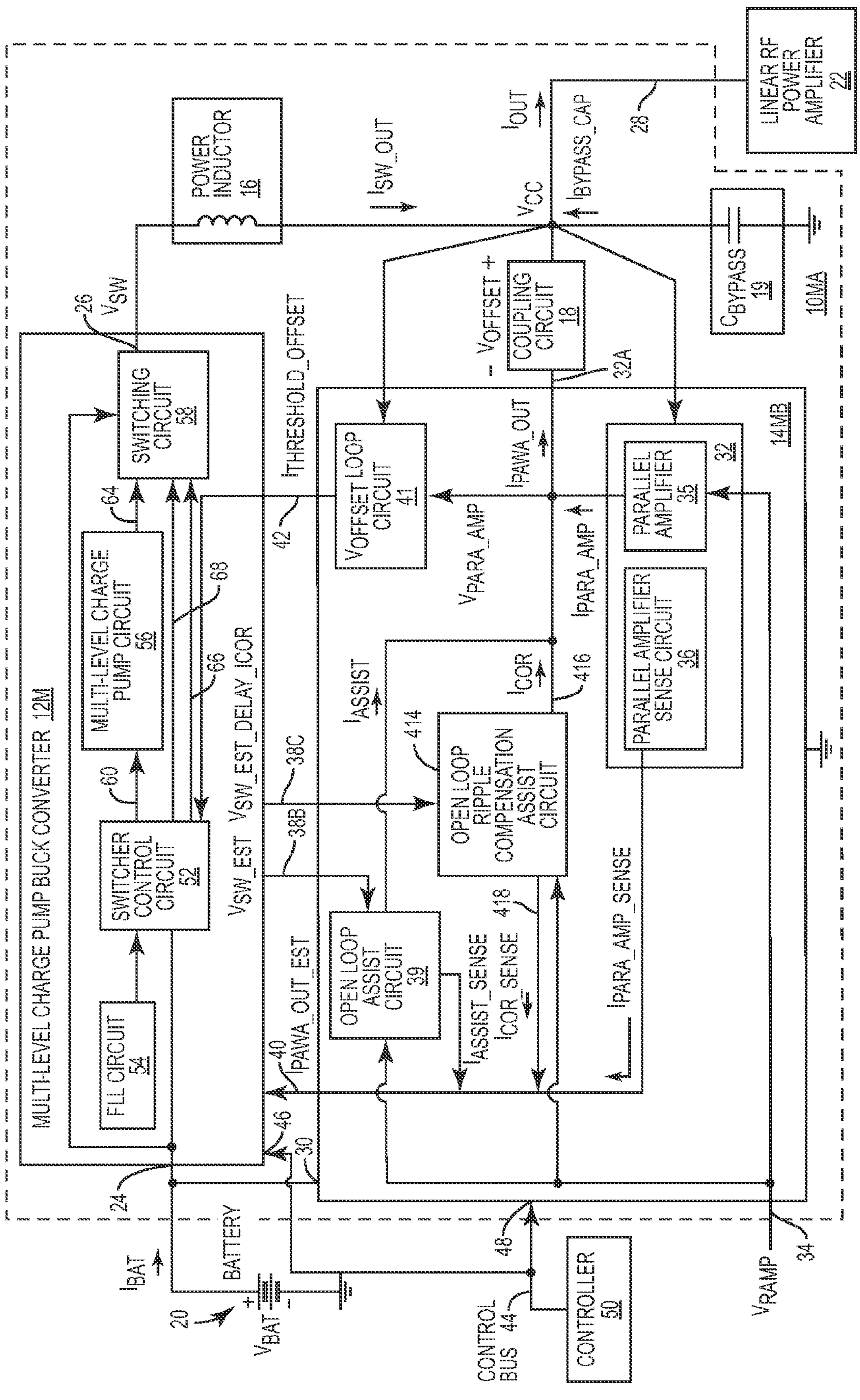
FIG. 23C depicts an embodiment of a pseudo-envelope follower power management system including a multi-level charge pump buck converter and an embodiment of a parallel amplifier circuit that includes an open loop ripple compensation assist circuit in combination with an open loop assist circuit.
Figure 23D:
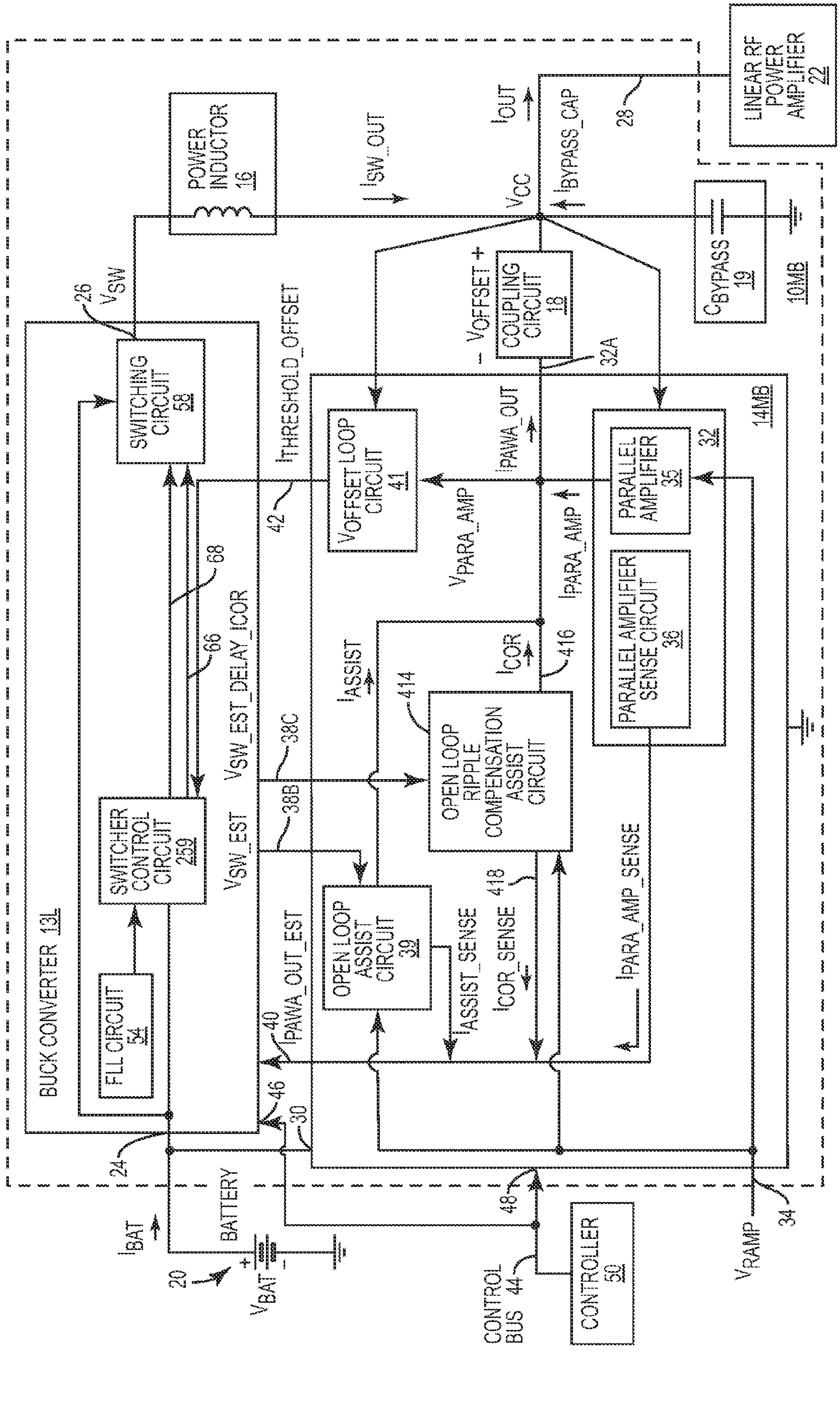
FIG. 23D depicts an embodiment of a pseudo-envelope follower power management system including a buck converter and an embodiment of a parallel amplifier circuit that includes an open loop ripple compensation assist circuit in combination with an open loop assist circuit.

As another example of a switch mode power supply converter, as depicted in FIG. 23B, an embodiment of the pseudo-envelope follower power management system 10MB may include an embodiment of a buck converter 13L configured to interface with the parallel amplifier circuit 14MA. As another example of a configuration that includes a switch mode power supply converter, as depicted in FIG. 23D, an alternative embodiment of the pseudo-envelope follower power management system 10MB may include an embodiment of the buck converter 13L configured to interface with the parallel amplifier circuit 14MB. As depicted in both FIG. 23B and FIG. 23D, the interface between the buck converter 13L and either the parallel amplifier circuit 14MA or the parallel amplifier circuit 14MB may be configured to provide a parallel amplifier circuit output current estimate 40, $I_{PAWA\_OUT\_EST}$, the threshold offset current 42, $I_{THRESHOLD\_OFFSET}$, or a combination thereof, to the buck converter 13L. Likewise, similar to the buck converter 13A depicted in FIG. 18C and FIG. 18D, and not by way of limitation, some embodiments of the buck converter 13L may also include the FLL circuit 54, as depicted in FIG. 23B and FIG. 23D. For example, some embodiments of the buck converter 13L may include a switcher control circuit 259 similar to the switcher control circuit 52E, depicted in FIG. 3E, or the switcher control circuit 52F, depicted in FIG. 3F. Alternatively, some embodiments of the buck converter 13L similar to the embodiments of the buck converter 13A, depicted in FIG. 18C and FIG. 18D that include an embodiment of the switcher control circuit 259 similar to the switcher control circuit 52G, depicted in FIG. 3G, or the switcher control circuit 52H, depicted in FIG. 3H, may not include the FLL circuit 54. Accordingly, operation of the buck converter 13L and the switcher control circuit 259, depicted in FIG. 23B and FIG. 23D, may also incorporate various combinations of the operational features and functions of the embodiments of the switcher control circuits 52E-H, depicted in FIGS. 3E-H, the threshold detector and control circuits 132E-H, depicted in FIGS. 4E-H, and the circuitry and state machine depicted in FIGS. 5E-H that are associated with the logic circuits 148E-H, depicted in FIGS. 4E-H.

Similar to the various example pseudo-envelope follower power management systems described above, the embodiments of the pseudo-envelope follower power management system 10MA and the pseudo-envelope follower power management system 10MB, depicted respectively in FIG. 23A, FIG. 23C, FIG. 23B, and FIG. 23D, may be configured to use modulated supply techniques to control the power amplifier supply voltage, $V_{CC}$, generated on the power amplifier supply output 28 in order to meet various communication system standards implemented in various communication devices. Example communication devices may include mobile terminals and mobile phones. Some of the communication system standards may include the use of wide-band modulation to send and receive information and data over a communication network.

As an example, the Long Term Evolution (LTE) communication standard may use wide-bandwidth modulation in specified transmission frequency bands and receive frequency bands to communicate information and data via the linear RF power amplifier 22. In addition, the width of each band allocated for wide-band modulation may vary depending upon the transmission frequency band and the receive frequency band that an example communication device is assigned to use in the communication network. For example, the Long Term Evolution (LTE) standard may specify LTE band numbers, where each of the LTE band number corresponds to a specific transmit channel frequency band and a specific receive channel frequency band. As a non-limiting example, the LTE band number corresponds to a band of operation in which a communication device is assigned to operate in a mobile communication network. Thus, in some cases, the band of operation may include a transmit channel and a receive channel. The transmit channel may have a transmit channel frequency band. The receive channel may have a receive channel frequency band. In addition, each band of operation may be assigned a specified duplex spacing, also referred to as a duplex offset, between the specific transmit channel frequency band and the specific receive channel frequency associated the band of operation. For example, the transmit channel and the receive channel for a band of operation may be spaced apart by a duplex offset. The transmit channel may have a transmit channel frequency band. The receive channel may have a receive channel frequency band. For example, each respective LTE band number may be assigned a specific duplex offset. As used herein, the term transmit to receive duplex offset is defined as a frequency having a magnitude substantially equal to the duplex offset between a transmit channel frequency band and a receive channel frequency band for a band of operation within a frequency spectrum. For example, an example band of operation assigned to a communication device may include a transmit channel and corresponding receive channel. The transmit channel may have a transmit channel frequency band between 1920 MHz and 1980 MHz. The corresponding receive channel may have a receive channel frequency band between 2110 MHz and 2170 MHz. As a result, the width of band for the transmit channel frequency band is 60 MHz and the width of band for the receive channel frequency band is 60 MHz. The duplex offset between the transmit channel and the receive channel is 190 MHz. As a result, the transmit to receive duplex offset is 190 MHz.

However, due to the non-ideal, (non-zero), output impedance of the parallel amplifier 35 and the large ripple currents associated with the power inductor currents, the modulated supply techniques implemented by the different embodiments of the pseudo-envelope follower power management system 10MA and the pseudo-envelope follower power management system 10MB, depicted in FIGS. 23A-D, may result in generation of ripple voltages in the power amplifier supply voltage, $V_{CC}$, at the power amplifier supply output 28 supplied to the linear RF power amplifier 22. Some of the generated ripple voltages may include high frequency ripple voltages that are located near a frequency substantially equal to the transmit to receive duplex offset of a communication device. The high frequency ripple voltages may be spread out over a frequency band that is near the transmit to receive duplex offset associated for the band of operation of a communication device. For example, the high frequency ripple voltages may be within a frequency band centered about the frequency substantially equal to the transmit to receive duplex offset for the band of operation of the communication device. As a result, the high frequency ripple voltages that are within a band of frequencies substantially equal to at least the bandwidth of the receive channel frequency band, where the band of frequencies are is centered at the transmit to receive duplex offset associated with the band of operation of a communication device may be modulated into the RF signal being generated for transmission by the linear RF power amplifier 22.

To compensate for the ripple voltages in the power supply voltage, $V_{CC}$, the parallel amplifier will attempt to source or sink current to cancel out the ripple voltage on the power amplifier supply voltage, $V_{CC}$. However, because the parallel amplifier 35, depicted in FIGS. 23A-D, may exhibit a non-ideal output impedance in the operating frequency range of the linear RF power amplifier 22. In addition, the non-ideal output impedance of the parallel amplifier 35 may also be non-linear. As a result, the parallel amplifier 35 may generate high frequency ripple voltages at the parallel amplifier output 32A. The generated high frequency ripple voltages generated by the parallel amplifier 35 may give rise to the generation of high frequency ripple voltages in the power amplifier supply voltage, $V_{CC}$, supplied to the linear RF power amplifier 22. The frequencies of the high frequency ripple voltages may include frequencies that are near or within a band of frequencies substantially equal to at least the bandwidth of the receive channel frequency band that is centered at the transmit to receive duplex offset associated with the band of operation of a communication device. Thus, the high frequency ripple voltages may be near or in the operational bandwidth of the linear RF power amplifier 22. FIGS. 23A-23D depict that the open loop ripple compensation assist circuit 414 is in communication with the power amplifier supply output 28 via the coupling circuit 18. As will be described below, embodiments of the open loop ripple compensation assist circuit 414, depicted in FIGS. 23A-23D, may be configured by the controller 50 to generate or provide a high frequency ripple compensation current 416, $I_{COR}$, at the parallel amplifier output 32A to reduce or cancel out the high frequency ripple currents at the power amplifier supply output 28 to minimize the high frequency ripple voltages generated by the parallel amplifier 35 in response to high frequency ripple currents at the power amplifier supply output 28, where the high frequency ripple currents are at frequencies that are near or within a band of frequencies centered near or at the transmit to receive duplex offset associated with the band of operation of a communication device and having a bandwidth substantially equal to at least the bandwidth of the receive channel frequency band for a mode operation. The high frequency ripple compensation current 416, $I_{COR}$, may be injected into the parallel amplifier output 32A to cancel out high frequency ripple currents at the power amplifier supply output 28 that are induced by the switching action of the switching voltage output 26. A ripple rejection response is a measure of the ability of the pseudo-envelope follower power management system to attenuate ripple voltages at the power amplifier power supply 28 that are due to the switching action at the switching voltage output 26. In other words, the ripple rejection response of the pseudo-envelope follower power management system is a measurement of the peak-to-peak ripple voltage on the power amplifier supply voltage, $V_{CC}$, with respect to the peak-to-peak switching voltage, $V_{SW}$. The high frequency ripple compensation current 416, $I_{COR}$, injected into the parallel amplifier output 32A cancels out high frequency ripple currents such that a ripple rejection response of the pseudo-envelope follower power management system includes a notch located in a frequency band within an operational bandwidth of a linear RF power amplifier. For example, the notch of the ripple rejection response may be located at or near the transmit to receive duplex offset for a band of operation in which the linear radio frequency power amplifier is configured to be used. In addition, as will be described, some embodiments of the open loop ripple compensation assist circuit 414, depicted in FIGS. 23A-23D, may be configured to generate the high frequency ripple compensation current 416, $I_{COR}$, independent of the non-ideal output impedance of the parallel amplifier 35.

Operationally, the open loop ripple compensation assist circuit 414 effectively develops an estimate of the high frequency current components in the inductor current, $I_{SW\_OUT}$, to be cancelled out. The open loop ripple compensation assist circuit 414 is in communication with the power amplifier supply output 28 via the coupling circuit 18. The high frequency ripple compensation current 416, $I_{COR}$, is injected into the parallel amplifier output 32A to substantially cancel out the high frequency current ripple currents in the inductor current, $I_{SW\_OUT}$, that correspond to a $V_{RAMP}$ signal, where the high frequency current ripple currents are at frequencies that are near or within a band of frequencies centered near or at the transmit to receive duplex offset associated with the band of operation of a communication device, and where the band of frequencies has a bandwidth substantially equal to at least the bandwidth of the receive channel frequency band for a mode operation of the communication device. As a result, the high frequency ripple compensation current 416, $I_{COR}$, cancel out the high frequency ripple currents that would create noise on the transmit signal generated by the linear RF power amplifier 22. To limit the frequency band of the portion of the inductor current, $I_{SW}$, to be cancelled out by the injection of the high frequency ripple compensation current 416, $I_{COR}$, the open loop ripple compensation assist circuit 414 high pass filters an estimate of the inductor current, $I_{SW\_OUT}$, based on the transmit to receive duplex offset and the bandwidth of the receive channel frequency band for the band of operation the communication device is configured to used.

In contrast, as described above, FIG. 10 depicts an embodiment of the parallel amplifier output impedance compensation circuit 37A that uses an estimated inductance of the parallel amplifier 35 at the frequencies near or within operational bandwidth of the linear RF power amplifier 22 to generate a compensated $V_{RAMP}$ signal, $V_{RAMP\_C}$. For example, the parallel amplifier output impedance compensation circuit 37A may use a programmable value of the parallel amplifier inductance estimate parameter, $L_{CORR\_EST}$, as the estimated inductance of the parallel amplifier 35 at the frequencies near or within operational bandwidth of the linear RF power amplifier 22. Accordingly, as described above with respect to the operation of the parallel amplifier output impedance compensation circuit 37A, the compensated $V_{RAMP}$ signal, $V_{RAMP\_C}$, is used by the parallel amplifier 35 instead of the $V_{RAMP}$ signal in order to reduce the high frequency ripple voltages present in the parallel amplifier output voltage, $V\text{-}_{PARA\_AMP}$, generated by the parallel amplifier 35 in the parallel amplifier output 32A due to the non-ideal output impedance characteristics of the parallel amplifier. Thus, the effectiveness of the cancellation or reduction of the high frequency ripple voltages generated by the parallel amplifier 35 by the parallel amplifier output impedance compensation circuit 37A may be dependent on the frequency dependent output impedance characteristics of the parallel amplifier 35 measure at the time of calibration of the communication device.

FIG. 23A depicts an embodiment of a pseudo-envelope follower power management system 10MA that that is similar to the pseudo-envelope follower power management system 10B, depicted in FIG. 2B. However, unlike the pseudo-envelope follower power management system 10B, depicted in FIG. 2B, the pseudo-envelope follower power management system 10MA, depicted in FIG. 23A includes an embodiment of a multi-level charge pump buck converter 12M instead of multi-level charge pump buck converter 12B. Also, unlike the pseudo-envelope follower power management system 10B, depicted in FIG. 2B, the pseudo-envelope follower power management system 10MA, depicted in FIG. 23A includes an embodiment of a parallel amplifier circuit 14MA.

However, similar to the embodiment of the parallel amplifier circuit 14B, depicted in FIG. 2B, the embodiment of the parallel amplifier circuit 14MA, depicted in FIG. 23A, includes parallel amplifier circuitry 32 and a $V_{OFFSET}$ loop circuit 41. The embodiment of the parallel amplifier circuitry 32, depicted in FIG. 23A, may include an embodiment of the parallel amplifier 35 and an embodiment of the parallel amplifier sense circuit 36, similar to the parallel amplifier 35 and the parallel amplifier sense circuit 36 depicted in FIG. 2B. In addition, some embodiments of the parallel amplifier 35, depicted in FIG. 23A, may be similar to one of the embodiments of the parallel amplifier 35. Example embodiments of the parallel amplifier 35 may include the parallel amplifier 35A, the rechargeable parallel amplifier 35B, the rechargeable parallel amplifier 35C, the parallel amplifier 35D, the rechargeable parallel amplifier 35E, and the rechargeable parallel amplifier 35F, as depicted in the respective FIGS. 12A-F.

Accordingly, although not depicted in FIG. 23A for the sake of convenience, and not by way of limitation, some embodiments of the parallel amplifier circuit 14MA may be advantageously similar to the parallel amplifier circuit 14C, depicted in FIG. 18A, and the parallel amplifier circuit 14D, depicted in FIG. 18B, where a parallel amplifier supply voltage, $V_{SUPPLY\_PARA\_AMP}$, is provided to provide a supply voltage to the parallel amplifier, parallel amplifier sense circuit 36, some portions of the parallel amplifier circuitry 32, and/or a combination thereof.

Thus, although not depicted in FIG. 23A for the sake of simplicity and not by way of limitation, similar to the embodiments of the pseudo-envelope follower power management system 10C, depicted in FIG. 18A, and the pseudo-envelope follower power management system 10E, depicted in FIG. 18B, some embodiments of the pseudo-envelope follower power management system 10MA may be configured to provide the parallel amplifier supply voltage, $V_{SUPPLY\_PARA\_AMP}$. For example, some embodiments of the pseudo-envelope follower power management system 10MA may further include an embodiment of the μC charge pump circuit 262, depicted in FIGS. 18A-D, the μC charge pump circuit 262A, depicted in FIG. 19A, or the μC charge pump circuit 262B, depicted in FIG. 19B. Furthermore, although not depicted in FIG. 23A for the sake of simplicity, and not by way of limitation, some embodiments of the multi-level charge pump buck converter 12M may replace the multi-level charge pump circuit 56 with an embodiment of the multi-level charge pump circuit 258 of the multi-level charge pump buck converter 12C, depicted in FIG. 18A and FIG. 18B. In those embodiments of the multi-level charge pump buck converter 12M that are adapted to include an embodiment of the multi-level charge pump circuit 258, the multi-level charge pump buck converter 12M may be similar to either the example embodiment of the multi-level charge pump circuit 258A, depicted in FIG. 7B, or the example embodiment of the multi-level charge pump circuit 258B, depicted in FIG. 7C. Accordingly, the alternative embodiments of the multi-level charge pump buck converter 12M that include an embodiment of the multi-level charge pump circuit 258, (not depicted in FIG. 23A), may generate an internal charge pump node parallel amplifier supply 294 (FIGS. 18A-D) to provide the parallel amplifier supply voltage, $V_{SUPPLY\_PARA\_AMP}$, to an embodiment of the parallel amplifier 35 similar to the parallel amplifier 35D, the rechargeable parallel amplifier 35E, or the rechargeable parallel amplifier 35F, respectively depicted in FIGS. 12D-F.

In the embodiments of the pseudo-envelope follower power management system 10MA, depicted in FIG. 23A, the parallel amplifier circuit 14MA may include an embodiment of the $V_{OFFSET}$ loop circuit 41 similar to the $V_{OFFSET}$ loop circuit 41A, depicted in FIG. 18A, the $V_{OFFSET}$ loop circuit 41B, depicted in FIG. 18B, or the $V_{OFFSET}$ loop circuit 41, depicted in FIG. 8. Accordingly, the parallel amplifier circuit 14MA may be configured to provide the threshold offset current 42, $I_{THRESHOLD\_OFFSET}$, to the switcher control circuit 52 of the multi-level charge pump buck converter 12M. Accordingly, similar to the embodiment of the multi-level charge pump buck converter 12B, depicted in FIG. 2B, the multi-level charge pump buck converter 12M may use the threshold offset current 42, $I_{THRESHOLD\_OFFSET}$, to adjust the switching operation of the multi-level charge pump buck converter 12M.

Continuing with the description of FIG. 23A, as discussed above, the parallel amplifier circuit 14MA may further include an embodiment of the open loop ripple compensation assist circuit 414. The open loop ripple compensation assist circuit 414 may be configured by the controller 50 via the control bus 44. The open loop ripple compensation assist circuit 414 may include or be associated with programmable filter parameter(s), programmable gain parameter(s), and programmable delay parameter(s). In some embodiments, some of the programmable filter parameter(s), the programmable gain parameter(s), and the programmable delay parameter(s) are determined at calibration. However, in some embodiments of the open loop ripple compensation assist circuit 414, at least some of the programmable filter parameter(s), the programmable gain parameter(s), and the programmable delay parameter(s) may be optimized by the controller 50 based on the operational mode of the pseudo-envelope follower power management system 10MA.

The open loop ripple compensation assist circuit 414 may be configured to inject the high frequency ripple compensation current 416, $I_{COR}$, at or into the parallel amplifier output 32A to provide the high frequency ripple compensation current 416, $I_{COR}$, to the power amplifier supply output 28. As will be discussed in further detail below, the open loop ripple compensation assist circuit 414 generates the high frequency ripple compensation current 416, $I_{COR}$, to minimize the high frequency ripple voltages on the power amplifier supply voltage, $V_{CC}$, supplied to the linear RF power amplifier 22.

In some embodiments, the open loop ripple compensation assist circuit 414 may use the $V_{RAMP}$ signal and an estimate of the switching voltage, $V_{SW}$, provided at the switching voltage output 26 of the multi-level charge pump buck converter 12M, to determine or generate an estimate of the ripple currents present at the power amplifier supply output 28. The open loop ripple compensation assist circuit 414 may be configured to high pass filter the estimate of the ripple currents present at the power amplifier supply output 28 to obtain an estimate of the high-frequency ripple currents located near or within a band of frequencies centered near or at the transmit to receive duplex offset associated with the band of operation in which the linear RF power amplifier 22 is being used, where the band of frequencies has a bandwidth substantially equal to at least the bandwidth of the receive channel frequency band for a band of operation at the power amplifier supply output 28. For example, some embodiments of the open loop ripple compensation assist circuit 414 may include programmable filters or filtering circuits, where the filter characteristics of the programmable filters may be adjusted based on the programmable filter parameter(s). For example, the programmable filters may provide a first high pass filter response and a second high pass filter response, where the first high pass filter response is associated with a first corner frequency, $f_{C1}$, and the second high pass filter response is associated with a second corner frequency, $f_{c2}$. The controller 50 may be configured to adjust the programmable filter parameter(s) associated with each of the first high pass filter response and a second high pass filter response. In addition, the magnitude of the high frequency ripple compensation current 416, $I_{COR}$, may be adjusted based on the programmable gain parameter(s). In some embodiments, the programmable gain parameter(s) may be parameters used to set a programmable transconductance related parameter.

Based on the estimate of the high-frequency ripple currents that include frequencies near or within a band of frequencies centered near or at the transmit to receive duplex offset associated with the band of operation in which the linear RF power amplifier 22 is being used, where the band of frequencies has a bandwidth substantially equal to at least the bandwidth of the receive channel frequency band for the band of operation, the open loop ripple compensation assist circuit 414 may generate the high frequency ripple compensation current 416, $I_{COR}$. In addition, as will be discussed, the open loop ripple compensation assist circuit 414 may adjust the magnitude of the high frequency ripple compensation current 416, $I_{COR}$, and time align the generation of the high frequency ripple compensation current 416, $I_{COR}$, such that the high frequency ripple compensation current 416, $I_{COR}$, maximally cancels out the high-frequency ripple currents, present at the power amplifier supply output 28, that are near or within operational bandwidth of the linear RF power amplifier 22. In other words, the controller 50 may configure the open loop ripple compensation assist circuit 414 to inject the high frequency ripple compensation current 416, $I_{COR}$, at the parallel amplifier output 32A to create a notch in the ripple rejection response, measured at the power amplifier supply output 28, that is located near a transmit to receive duplex offset for a band of operation in which the linear radio frequency power amplifier is configured to be used. As an example, the controller 50 may adjust the programmable delay parameter(s) to move the location of the notch in the ripple rejection response a function of the transmit to receive duplex offset for the band of operation for which the linear RF power amplifier 22 is configured to be used. For example, the controller 50 may be configured to adjust the programmable delay parameter(s) to temporally align the injection of the high frequency ripple compensation current 416, $I_{COR}$, at parallel amplifier output 32A to create a notch in a ripple rejection response of the power amplifier supply output that is located near a transmit to receive duplex offset for a band of operation in which the linear radio frequency power amplifier is configured to be used.

In addition, in some embodiments, the controller 50 may be configured to adjust the programmable filter parameter(s) to adjust the width, depth, shape, and/or a combination thereof such that the high frequency ripple compensation current 416 maximally cancels out the high-frequency ripple currents generated by the parallel amplifier 35 in frequencies near or within the operational bandwidth of the linear RF power amplifier 22.

In addition, the open loop ripple compensation assist circuit 414 may be further configured to generate a scaled high frequency ripple compensation current estimate 418, $I_{COR\_SENSE}$. The scaled high frequency ripple compensation current estimate 418, $I_{COR\_SENSE}$, may be a fractional representation of the high frequency ripple compensation current 416, $I_{COR}$, provided to the output of the parallel amplifier output 32A. For example, the scaled high frequency ripple compensation current estimate 418, $I_{COR\_SENSE}$, may be linearly related to the high frequency ripple compensation current 416, $I_{COR}$, by the sense scaling factor, $C_{SENSE\_SCALING}$. As depicted in FIG. 23A, the scaled high frequency ripple compensation current estimate 418, $I_{COR\_SENSE}$, may be combined with the scaled parallel amplifier output current estimate, $I_{PARA\_AMP\_SENSE}$, generated by the parallel amplifier sense circuit 36 to form the parallel amplifier circuit output current estimate 40, $I_{PAWA\_OUT\_EST}$. The parallel amplifier circuit output current estimate 40, $I_{PAWA\_OUT\_EST}$, including the scaled high frequency ripple compensation current estimate 418, $I_{COR\_SENSE}$, and the scaled parallel amplifier output current estimate, $I_{PARA\_AMP\_SENSE}$, may be provided to the multi-level charge pump buck converter 12M. Accordingly, similar to the embodiment of the multi-level charge pump buck converter 12B, depicted in FIG. 2B, the multi-level charge pump buck converter 12M may use the parallel amplifier circuit output current estimate 40, $I_{PAWA\_OUT\_EST}$, to adjust the switching operation of the multi-level charge pump buck converter 12M.

For the sake of simplicity of description, and not by way of limitation, FIG. 23A depicts the embodiment of the parallel amplifier circuit 14MA, as not including an open loop assist circuit 39, which is included as part of the parallel amplifier circuit 14B depicted in FIG. 2B. Also, unlike the multi-level charge pump buck converter 12B depicted in FIG. 2B, for the sake of simplicity of description, and not by way of limitation, the embodiment of the multi-level charge pump buck converter 12M depicted in FIG. 23A does not depict the multi-level charge pump buck converter 12M providing an estimated switching voltage output 38B, $V_{SW\_EST}$, as an output to the parallel amplifier circuit 14MA.

However, FIG. 23C depicts an example embodiment of the pseudo-envelope follower power management system 10MA that includes a multi-level charge pump buck converter 12M and an embodiment of a parallel amplifier circuit 14MB that includes an open loop ripple compensation assist circuit 414 in combination with an open loop assist circuit 39, where the open loop assist circuit 39 may be similar to the embodiment of the open loop assist circuit 39 depicted in FIG. 2B. Accordingly, as depicted in FIG. 23C, embodiments of the pseudo-envelope follower power management system 10MA that include the parallel amplifier circuit 14MB, may provide a parallel amplifier circuit output current estimate 40, $I_{PAWA\_OUT\_EST}$, to adjust the switching operation of the multi-level charge pump buck converter 12M, where the parallel amplifier circuit output current estimate 40, $I_{PAWA\_OUT\_EST}$, is generated by combining the scaled parallel amplifier output current estimate, $I_{PARA\_AMP\_SENSE}$, the scaled high frequency ripple compensation current estimate 418, $I_{COR\_SENSE}$, and the scaled open loop assist circuit output current estimate, $I_{ASSIST\_SENSE}$.

As further depicted in FIG. 23A, the multi-level charge pump buck converter 12M is further configured to provide a delayed $I_{COR}$ estimated switching voltage output 38C, $V_{SW\_EST\_DELAY\_ICOR}$, to a programmable delayed switching voltage input (not shown) of the parallel amplifier circuit 14MA. The programmably delayed switching voltage input is in communication with the open loop ripple compensation assist circuit 414 of the parallel amplifier circuit 14MA and configured to receive the delayed $I_{COR}$ estimated switching voltage output 38C, $V_{SW\_EST\_DELAY\_ICOR}$. Similar to the estimated switching voltage output 38B, $V_{SW\_EST}$, generated by the multi-level charge pump buck converter 12B, depicted in FIG. 2B, the delayed $I_{COR}$ estimated switching voltage output 38C, $V_{SW\_EST\_DELAY\_ICOR}$, is a feed forward signal generated based on the state of the switcher control circuit 52, where the delayed $I_{COR}$ estimated switching voltage output 38C, $V_{SW\_EST\_DELAY\_ICOR}$, provides an early indication of what the switching voltage output, $V_{SW}$, will become based on the state of the switcher control circuit 52. Thus, the delayed $I_{COR}$ estimated switching voltage output 38C, $V_{SW\_EST\_DELAY\_ICOR}$, may be a feed forward signal that indicates a future voltage level of the switching voltage output, $V_{SW}$, at the switching voltage output 26 based on the state of the switcher control circuit 52 before the switching voltage output 26 is configured to provide a switching voltage output, $V_{SW}$, substantially equal to the future voltage level. In other words, delayed $I_{COR}$ estimated switching voltage output 38C, $V_{SW\_EST\_DELAY\_ICOR}$, provides a switching output voltage estimate that that may be programmably delayed by the programmable delay circuitry 432. In this way, the delayed $I_{COR}$ estimated switching voltage output 38C, $V_{SW\_EST\_DELAY\_ICOR}$, may be considered a version of the estimated switching voltage output 38B, $V_{SW\_EST}$, that may be programmably delayed by the programmable delay circuitry 432 to time align generation of the high frequency ripple compensation current 416, $I_{COR}$. For example, the programmable delay circuitry 432 may be configured to have a programmable delay period such that the delayed $I_{COR}$ estimated switching voltage output 38C, $V_{SW\_EST\_DELAY\_ICOR}$, is delayed in time by substantially the programmable delay period relative to the estimated switching voltage output 38B, $V_{SW\_EST}$. The controller 50 may programmatically configure programmable delay circuitry in the multi-level charge pump buck converter 12M to provide a programmable delay period between generation of the delayed $I_{COR}$ estimated switching voltage output 38C, $V_{SW\_EST\_DELAY\_ICOR}$, relative to generation of the estimated switching voltage output 38B, $V_{SW\_EST}$. The controller 50 may adjust the programmable delay period to align the generation of the high frequency ripple compensation current 416, $I_{COR}$, to cancel out the high frequency ripple currents generated by the parallel amplifier 35 in response to the $V_{RAMP}$ signal. Illustratively, the controller 50 may be configured to adjust the programmable delay period to temporally align the injection of the high frequency ripple compensation current 416, $I_{COR}$, at parallel amplifier output 32A, to create a notch in a ripple rejection response of the power amplifier supply output that is located near a transmit to receive duplex offset for a band of operation in which the linear radio frequency power amplifier is configured to be used.

Figure 25:
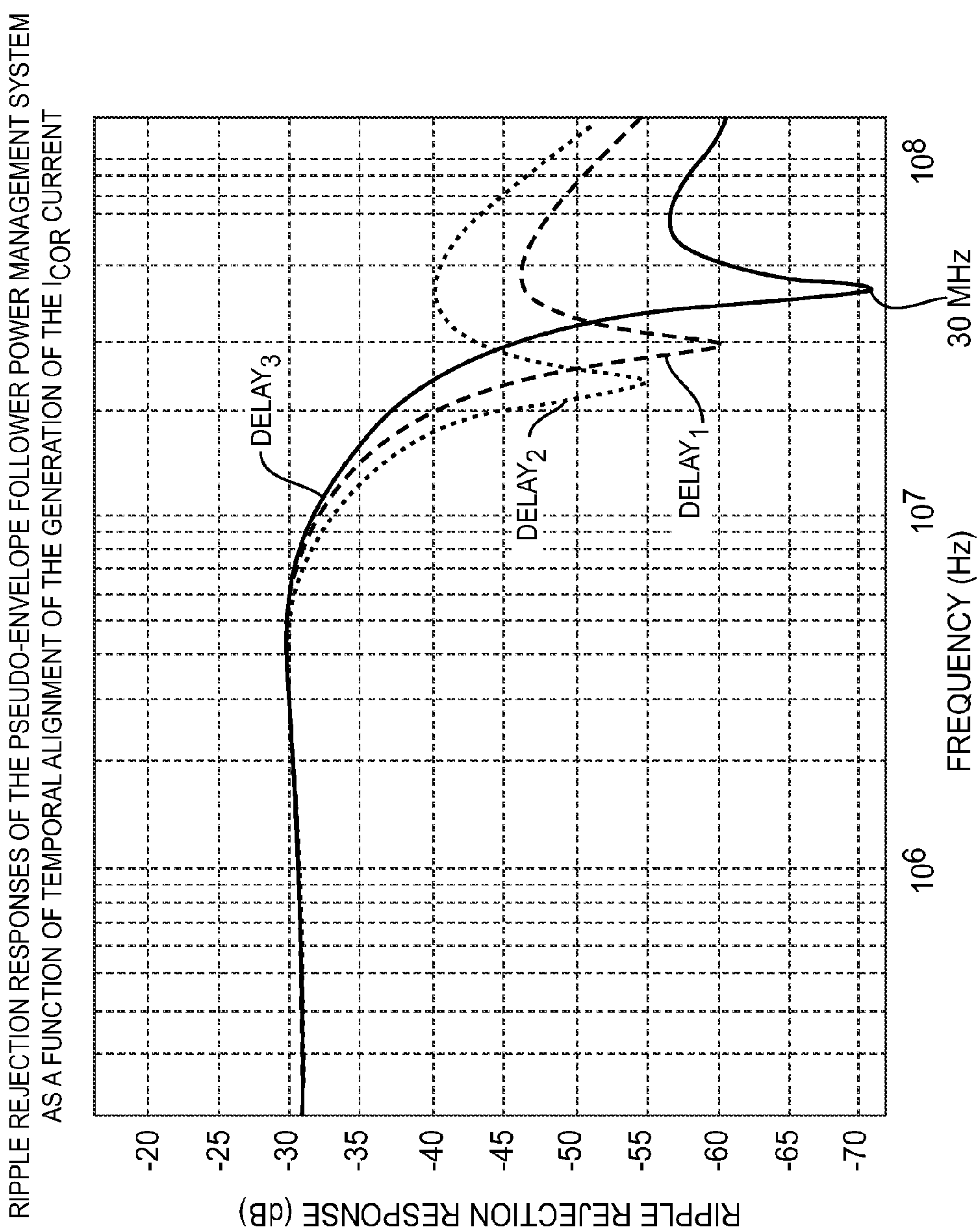
FIG. 25 depicts three example ripple rejection response curves for an embodiment of the pseudo-envelope follower power management system, where each example ripple rejection response curve corresponds to a different programmable delay.

As will be discussed below, the controller 50 may be further configured to programmatically change the values of the programmable filter parameter(s), programmable gain parameter(s), and programmable delay parameter(s) to obtain an optimized overall system response of the pseudo-envelope follower power management system 10MA to place a notch in the ripple rejection response at the power amplifier supply output 28 as a function of the duplex offset for each band of operation. Thus, depending on the band of operation in which the linear RF power amplifier 22 is configured to be used, the controller 50 may configure the notch in the ripple rejection response to be located near or at the transmit to receive duplex offset associated with the selected band of operation. In addition, the bandwidth of the receiver channel frequency band for the band of operation is used to configure the ripple rejection response to substantially cancel output the high frequency ripple currents that could be modulated onto the transmit signal generated by the linear RF power amplifier. For example, FIG. 25 depicts the notch response of example pseudo-envelope follower power management system 10MA and 10MB, as depicted in FIGS. 23A-D, as a function of the programmable delay period.

As previously discussed, FIG. 23B depicts an embodiment of a pseudo-envelope follower power management system 10MB that includes a buck converter 13L and an embodiment of the parallel amplifier circuit 14MA. As discussed above, the buck converter 13L interfaces with the parallel amplifier circuit 14MA. The operation of the parallel amplifier circuit 14MA in conjunction with the buck converter 13L is substantially similar to the operation of the embodiments of the parallel amplifier circuit 14MA with the multi-level charge pump buck converter 12M. Likewise, the pseudo-envelope follower power management system 10MB may include the features and functions of the various embodiments and alternative embodiments of the pseudo-envelope follower power management system 10MA, as described above, except, similar to the pseudo-envelope follower power management system 10D, depicted in FIG. 18C, and the pseudo-envelope follower power management system 10F, depicted in FIG. 18D, the buck converter 13L may not generate an internal charge pump node parallel amplifier supply 294 because the buck converter 13L does not include an embodiment of the multi-level charge pump circuit 56 that is included in the multi-level charge pump buck converter 12M of the pseudo-envelope follower power management system 10MA, depicted in FIG. 23A. Even so, although not depicted in FIG. 23B, some alternative embodiments of the pseudo-envelope follower power management system 10MB may include an embodiment of the μC charge pump circuit 262 and associated circuitry similar to the pseudo-envelope follower power management system 10D, depicted in FIG. 18C, and the pseudo-envelope follower power management system 10F, depicted in FIG. 18D, in order to provide a parallel amplifier supply voltage, $V_{SUPPLY\_PARA\_AMP}$, to an embodiment of the parallel amplifier 35 similar to the parallel amplifier 35D, the rechargeable parallel amplifier 35E, or the rechargeable parallel amplifier 35F, respectively depicted in FIGS. 12D-F.

FIG. 23C depicts an alternative embodiment of the pseudo-envelope follower power management system 10MA that is similar in form and function to the embodiments of the pseudo-envelope follower power management system 10MA discussed with reference to FIG. 23A. However, unlike the alternative embodiment of the pseudo-envelope follower power management system 10MA depicted in FIG. 23A, the pseudo-envelope follower power management system 10MA depicted in FIG. 23C includes the parallel amplifier circuit 14MB instead of the parallel amplifier circuit 14MA. As previously discussed, the parallel amplifier circuit 14MB is similar in form and function to the parallel amplifier circuit 14MA, described previously, except that the parallel amplifier circuit 14MB include an embodiment of the open loop assist circuit 39. Accordingly, the alternative embodiment of the pseudo-envelope follower power management system 10MA depicted in FIG. 23C is functionally similar to the embodiment of the pseudo-envelope follower power management system 10MA depicted in FIG. 23A except the parallel amplifier circuit output current estimate 40, $I_{PAWA\_OUT\_EST}$, further includes the scaled open loop assist circuit output current estimate, $I_{ASSIST\_SENSE}$, and the open loop assist circuit 39 provides the open loop assist circuit current, $I_{ASSIST}$, at the parallel amplifier output 32A.

FIG. 23D depicts an alternative embodiment of the pseudo-envelope follower power management system 10MB that is substantially similar in form and function to the embodiment of the pseudo-envelope follower power management system 10MB depicted in FIG. 23B except the alternative embodiment of the pseudo-envelope follower power management system 10MB depicted in FIG. 23D includes the parallel amplifier circuit 14MB instead of the parallel amplifier circuit 14MA. Accordingly, the alternative embodiment of the pseudo-envelope follower power management system 10MB depicted in FIG. 23D is functionally similar to the pseudo-envelope follower power management system 10MB, depicted in FIG. 23B, except the parallel amplifier circuit output current estimate 40, $I_{PAWA\_OUT\_EST}$, further includes the scaled open loop assist circuit output current estimate, $I_{ASSIST\_SENSE}$, and the open loop assist circuit 39 provides the open loop assist circuit current, $I_{ASSIST}$, at the parallel amplifier output 32A.

Figure 24:
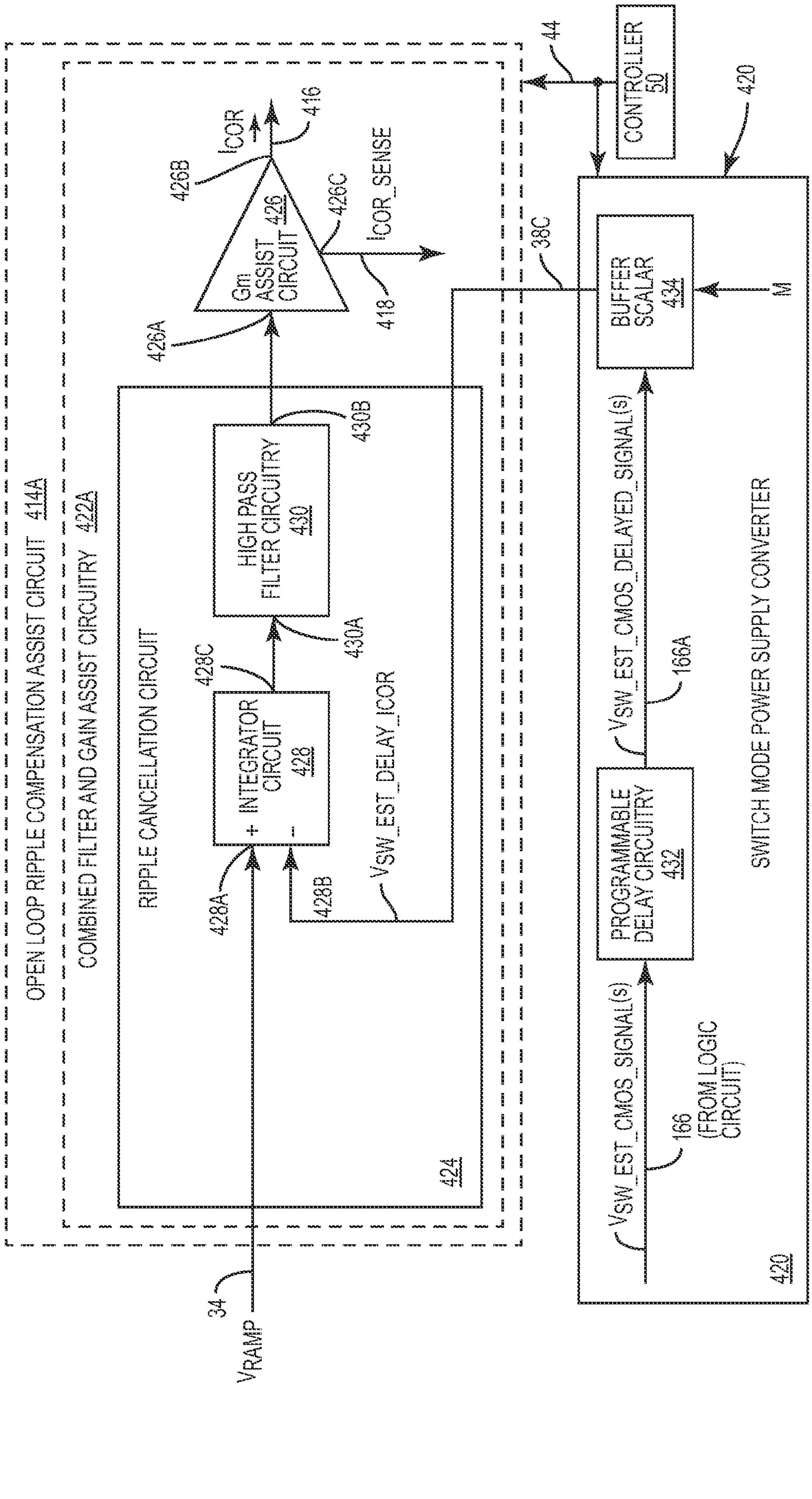
FIG. 24 depicts an embodiment of the open loop ripple compensation assist circuit and corresponding programmable delay circuitry of the pseudo-envelope follower power management systems depicted in FIGS. 23A-23D.

FIG. 24 depicts an embodiment of the open loop ripple compensation assist circuit 414A and a portion of a switch mode power supply converter 420. The switch mode power supply converter 420 may be similar in form and function to the embodiment of the multi-level charge pump buck converter 12M, depicted in FIG. 23A and FIG. 23C, or the buck converter 13L, depicted in FIG. 23B and FIG. 23D. The switcher control circuit (not shown) of the switch mode power supply converter 420 may be configured as one of the embodiments of the switcher controller 52 when the switch mode power supply converter 420 is configured as one of the embodiments of a multi-level charge pump buck converter as described herein. Alternatively, the switcher control circuit (not shown) of the switch mode power supply converter 420 may be configured as one of the embodiments of the switcher controller 52 when the switch mode power supply converter 420 is configured as one of the embodiments of a buck converter as described herein. Accordingly, similar to the previously described embodiments of the multi-level charge pump buck converter 12M and the buck converter 13L, the switch mode power supply converter 420 may be configured to provide a delayed $I_{COR}$ estimated switching voltage output 38C, $V_{SW\_EST\_DELAY\_ICOR}$, to the open loop ripple compensation assist circuit 414A. Although not depicted in FIG. 24, it will be understood that controller 50, depicted in FIGS. 23A-D, may be configured to control or configure the elements of the open loop ripple compensation assist circuit 414A.

The open loop ripple compensation assist circuit 414A may include an embodiment of a combined filter and gain assist circuitry 422A. The combined filter and gain assist circuitry 422A may include a ripple cancellation circuit 424 and a Gm assist circuit 426. The Gm assist circuit 426 may include an input port 426A, a Gm assist $I_{COR}$ output 426B, and a Gm assist $I_{COR\_SENSE}$ output 426C. The controller 50 may be configured to adjust the transconductance of the Gm assist circuit 426.

The combined filter and gain assist circuitry 422A may include an integrator circuit 428 and high pass filter circuitry 430. The high pass filter circuitry 430 may include a high pass filter circuitry input 430A and a high pass filter circuitry output 430B. The controller 50 may configure the high pass filter circuitry 430 to provide a desired high pass frequency response by adjusting the time constants associated with the high pass filter circuitry 430. The integrator circuit 428 may include a non-inverting input 428A configured to receive the $V_{RAMP}$ signal and an inverting input 428B configured to receive the delayed $I_{COR}$ estimated switching voltage output 38C, $V_{SW\_EST\_DELAY\_ICOR}$. Although not depicted in FIG. 24, in some embodiments of the open loop ripple compensation assist circuit 414A, the $V_{RAMP}$ signal may be scaled by a scaling factor, $K_{VRAMP\_SCALE}$, such that the non-inverting input 428A of the integrator circuit 428 receives a scaled $V_{RAMP}$ signal, $V_{RAMP\_SCALED}$, where $V_{RAMP\_SCALED}=K\times V_{RAMP}$. The integrator output 428C is coupled to the high pass filter circuitry input 430A of the high pass filter circuitry 430. The high pass filter circuitry output 430B of the high pass filter circuitry 430 is coupled to the input port 426A of the Gm assist circuit 426. Based on the integrated and high pass filtered signal generated by the ripple cancellation circuit 424, the Gm assist circuit 426 generates the high frequency ripple compensation current 416, $I_{COR}$, at the Gm assist $I_{COR}$ output 426B and the scaled high frequency ripple compensation current estimate 418, $I_{COR\_SENSE}$, at the Gm assist $I_{COR\_SENSE}$ output 426C.

In order to place a notch in the ripple rejection response of the power amplifier supply output 28 as a function of the transmit to receive duplex offset for each band of operation, the open loop ripple compensation assist circuit 414A may be configured to generate a predicted estimated inductor current, $I_{SW\_OUT\_EST}$, for the inductor current, $I_{SW\_OUT}$, that is provided by the power inductor 16, as depicted in FIG. 23A, based on a difference between the $V_{RAMP}$ signal and the delayed $I_{COR}$ estimated switching voltage output 38C, $V_{SW\_EST\_DELAY\_ICOR}$, and the inductance value of the power inductor 16, depicted in FIGS. 23A-D. The predicted estimated inductor current, $I_{SW\_OUT\_EST}$, is an estimate of the inductor current, $I_{SW\_OUT}$, in the power inductor 16 corresponding temporally to when the switching voltage, $V_{SW}$, to be generated at the switching voltage output 26 which is represented by the value of the delayed $I_{COR}$ estimated switching voltage output 38C, $V_{SW\_EST\_DELAY\_ICOR}$, and the $V_{RAMP}$ signal reflects the voltage level of the power amplifier supply voltage, $V_{CC}$. However, in order to simplify circuitry, and because the high frequency ripple compensation current 416, $I_{COR}$, is injected at or into the parallel amplifier output 32A to cancel out the high frequency ripple components of the inductor current, $I_{SW\_OUT}$, near or within a band of frequencies substantially equal to at least the bandwidth of the receive channel frequency band that is centered at the transmit to receive duplex offset associated with the band of operation in which the of the linear RF power amplifier 22 is being used, the ripple cancellation circuit generates the negative of the predicted estimated inductor current, $I_{SW\_OUT\_EST}$. As an example, the integrator circuit 428 may be configured to integrate the difference between the $V_{RAMP}$ signal and the delayed $I_{COR}$ estimated switching voltage output 38C, $V_{SW\_EST\_DELAY\_ICOR}$, to generate the negative of the predicted estimated inductor current, $I_{SW\_OUT\_EST}$. The negative of the predicted estimated inductor current, $I_{SW\_OUT\_EST}$, may be represented by the Laplace transfer function of the integrator circuit 428, shown in equation (4) as follows:

$$-I_{SW\_OUT\_EST}(s) = \frac{(V_{RAMP} - V_{SW\_OUT\_EST})}{L_{POWER\_INDUCTOR}s} \quad (4)$$

where $L_{POWER\_INDUCTOR}$ represents the inductance of the power inductor 16 depicted in FIGS. 23A-D.

Thus, referring to FIGS. 23A-D, the predicted estimated inductor current, $I_{SW\_OUT\_EST}$, provides an estimate of the current through the power inductor 16 corresponding to the time when the delayed $I_{COR}$ estimated switching voltage output 38C, $V_{SW\_EST\_DELAY\_ICOR}$, reflects the voltage level of the switching voltage, $V_{SW}$, provided at the switching voltage output 26 and the $V_{RAMP}$ signal reflects the voltage level of the power amplifier supply voltage, $V_{CC}$. The negative of the predicted estimated inductor current, $I_{SW\_OUT\_EST}$, is provided to the high pass filter circuitry 430, which high pass filters the negative of the predicted estimated inductor current, $I_{SW\_OUT\_EST}$, to generate an estimate of the predicted high frequency ripple currents, $I_{HIGH\_FREQUENCY\_RIPPLE}$, to be cancelled out, at the power amplifier supply output 28 when the switching voltage, $V_{SW}$, to be generated at the switching voltage output 26 is represented by the value of the delayed $I_{COR}$ estimated switching voltage output 38C, $V_{SW\_EST\_DELAY\_ICOR}$, and the $V_{RAMP}$ signal represents the power amplifier supply voltage, $V_{CC}$. The pass band characteristics of the high pass filter circuitry 430 may be adjusted by the controller 50 based on the programmable filter parameter(s) such that the frequency content of the predicted high frequency ripple currents $I_{HIGH\_FREQUENCY\_RIPPLE}$, to be cancelled out, at the power amplifier supply output 28, includes frequencies that are near or within a band of frequencies substantially equal to at least the bandwidth of the receive channel frequency band that is centered at the transmit to receive duplex offset associated with the band of operation for which the linear RF power amplifier 22 is being used.

As an example, the high pass filter circuitry 430 may provide a first high pass filter response and a second high pass filter response, where the first high pass filter response corresponds to a first corner frequency, $f_{C1}$, and the second high pass filter response corresponds to a second corner frequency, $f_{C2}$. In some embodiments, the first corner frequency, $f_{C1}$, and the second corner frequency, $f_{C2}$, may be configured by the controller 50 (not shown). The first corner frequency, $f_{C1}$, and the second corner frequency, $f_{C2}$, may be adjusted based on the bandwidth of the receive channel frequency band associated with each band of operation of the linear RF power amplifier 22.

The high pass filter circuitry 430 provides the predicted high frequency ripple currents to be cancelled out, $I_{HIGH\_FREQUENCY\_RIPPLE}$, to the Gm assist circuit 426. The Gm assist circuit 426 gain scales the predicted high frequency ripple currents to be cancelled out, $I_{HIGH\_FREQUENCY\_RIPPLE}$, to generate the high frequency ripple compensation current 416, $I_{COR}$, based on the predicted high frequency ripple currents, $I_{HIGH\_FREQUENCY\_RIPPLE}$, to be cancelled out, and the programmable gain parameter(s) provided by the controller 50. In addition, the Gm assist circuit 426 also generates the scaled high frequency ripple compensation current estimate 418, $I_{COR\_SENSE}$, which is a fractional representation of the high frequency ripple compensation current 416, $I_{COR}$, used to generate the parallel amplifier circuit output current estimate 40, $I_{PAWA\_OUT\_EST}$. Because the predicted estimated inductor current, $I_{SW\_OUT\_EST}$, is high pass filtered, the predicted high frequency ripple currents, $I_{HIGH\_FREQUENCY\_RIPPLE}$, to be cancelled out, do not reflect the low-frequency modulation of the power amplifier supply output 28. As a result, the high frequency ripple compensation current 416, $I_{COR}$, does not conflict with the efforts of the parallel amplifier 35 to compensate for the low-frequency modulation of the power amplifier supply voltage, $V_{CC}$, due to the change in the switching voltage, $V_{SW}$, at the switching voltage output 26, depicted in FIGS. 23A-D.

As further depicted in FIG. 24, the switch mode power supply converter 420 includes programmable delay circuitry 432 and a buffer scalar 434. For the sake of simplicity, and not by way of limitation, the generation of the delayed $I_{COR}$ estimated switching voltage output 38C, $V_{SW\_EST\_DELAY\_ICOR}$, by the switch mode power supply converter 420 will now be discussed with reference to the embodiment of the threshold detector and control circuit 132A, depicted in FIG. 4A. As depicted in FIG. 4A, the threshold detector and control circuit 132A may generate one or more switching voltage output cmos signal(s) 166, $V_{SW\_EST\_CMOS\_SIGNAL}$(s). The one or more switching voltage output cmos signal(s) 166, $V_{SW\_EST\_CMOS\_SIGNAL}$(s), indicate the state of the switch control circuit (not shown) of the switch mode power supply converter 420 before the switch mode power supply converter 420 transitions to provide the switching voltage output, $V_{SW}$, represented by the switching voltage output cmos signal(s) 166, $V_{SW\_EST\_CMOS\_SIGNAL}$(s). For example, in the case where the switch mode power supply converter 420 is similar to the embodiment of the multi-level charge pump buck converter 12B, depicted in FIG. 2B, the one or more switching voltage output cmos signal(s) 166, $V_{SW\_EST\_CMOS\_SIGNAL}$(s), may be used by the third output buffer 161 to generate one of the various embodiments of the estimated switching voltage output 38B, $V_{SW\_EST}$, depicted in FIGS. 11A-11F. As depicted in FIG. 11A, in the simplest form, the one or more switching voltage output cmos signal(s) 166, $V_{SW\_EST\_CMOS\_SIGNAL}$(s), may be a single digital signal that represents the future state of the switching voltage output 26 as being in either the shunt level or providing a voltage greater than ground to the power inductor 16, as depicted in FIG. 2B. Similarly, in the case where the switch mode power supply converter 420 is similar to the buck converter 13L depicted in FIG. 23B, the one or more switching voltage output cmos signal(s) 166, $V_{SW\_EST\_CMOS\_SIGNAL}$(s), may be a single digital signal that represents the future state of the switching voltage output 26 as being in either the shunt level or the series level.

Figure 29A:
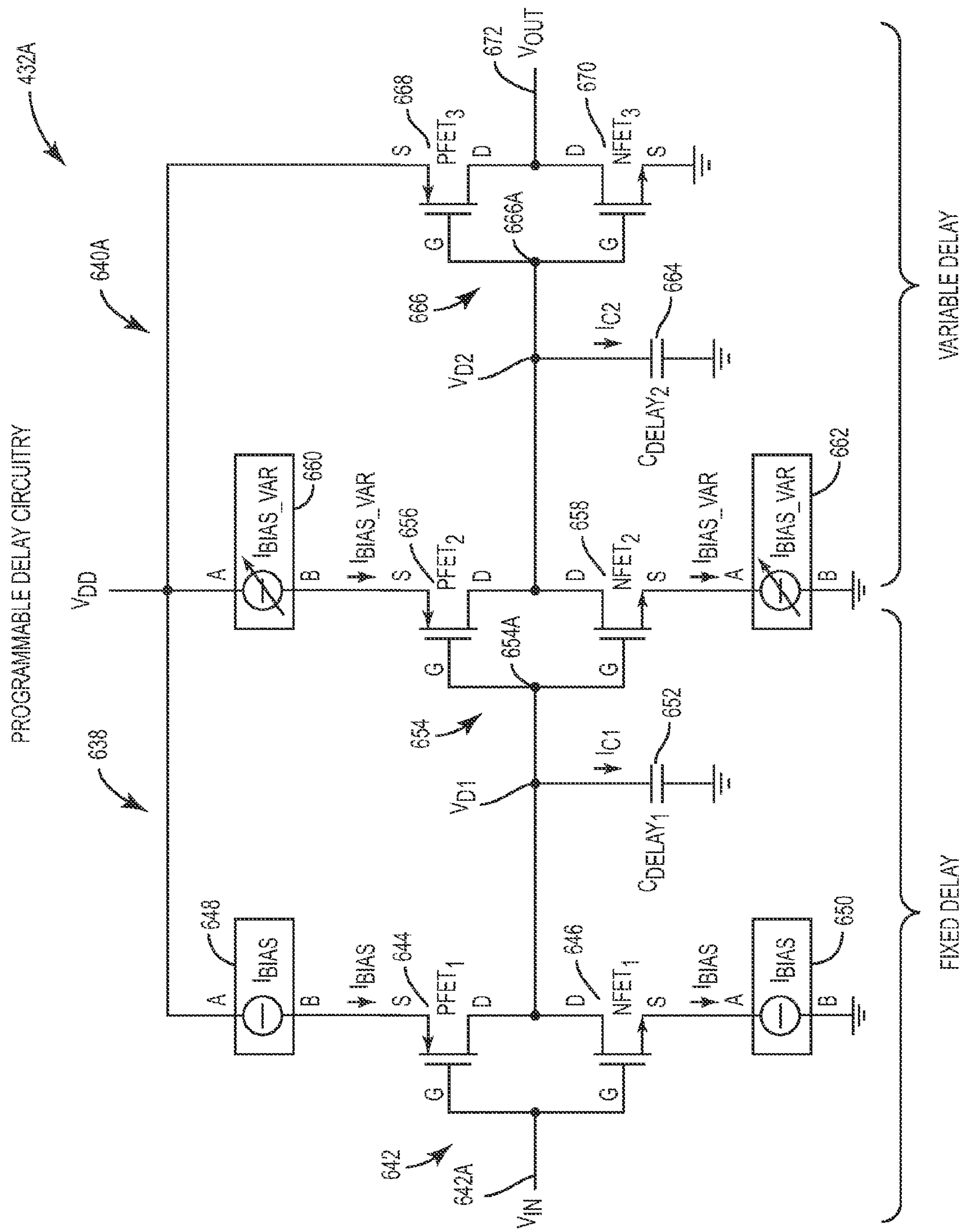
FIG. 29A depicts an embodiment of the programmable delay circuitry depicted in FIG. 24.
Figure 29B:
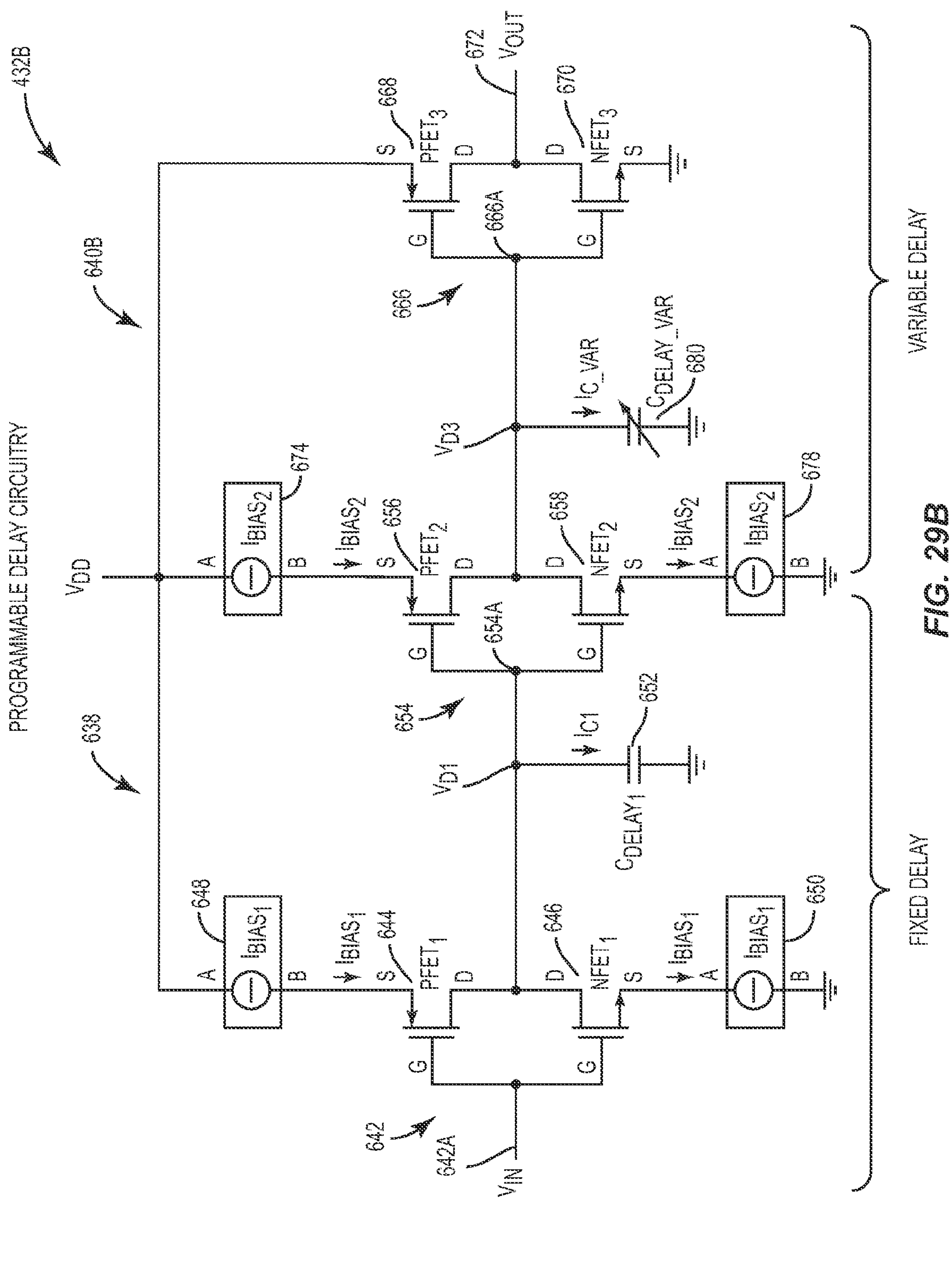
FIG. 29B depicts another example embodiment of the programmable delay circuitry depicted in FIG. 24.
Figure 30:
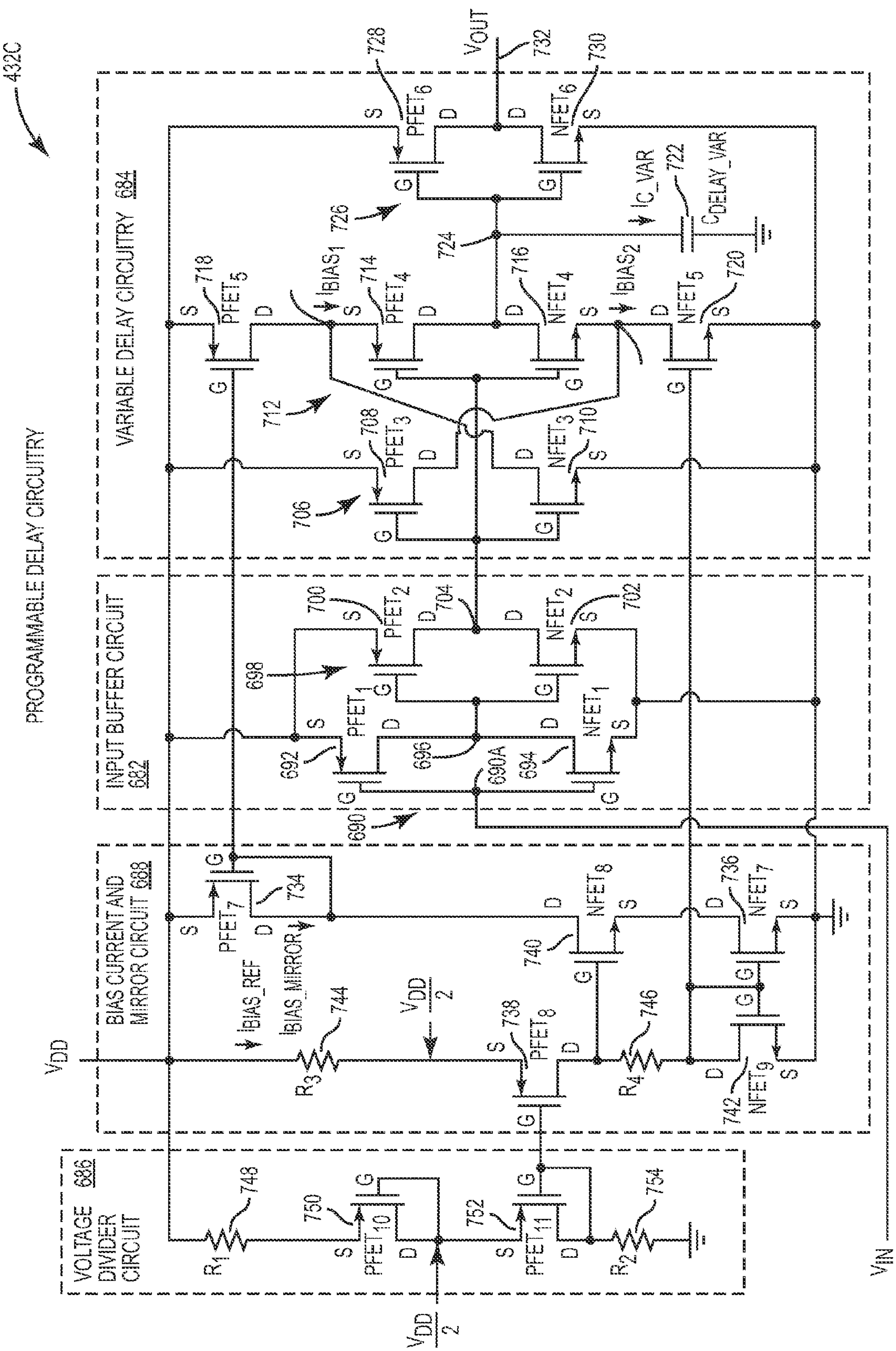
FIG. 30 depicts another example embodiment of the programmable delay circuitry depicted in FIG. 24.

Returning to FIG. 24, the programmable delay circuitry 432 is configured to receive the one or more switching voltage output cmos signal(s) 166, $V_{SW\_EST\_CMOS\_SIGNAL}$(s). The controller 50 may use the programmable delay parameter(s) to delay the propagation of the one or more switching voltage output cmos signal(s) 166, $V_{SW\_EST\_CMOS\_SIGNAL}$(s), through the programmable delay circuitry 432 by a programmable delay period to generate the one or more programmably delayed switching voltage output cmos signal(s) 166A, $V_{SW\_EST\_CMOS\_DELAYED\_SIGNAL}$(s). The one or more programmably delayed switching voltage output cmos signal(s) 166A, $V_{SW\_EST\_CMOS\_DELAYED\_SIGNAL}$(s) are provided to the buffer scalar 434. The controller 50 (not shown) may provide a scaling factor, M, based on a scaling factor parameter stored in association with the controller 50, the parallel amplifier circuit, or the switch mode power supply converter 420. Accordingly, based on the scaling factor parameter, the controller 50 may set the value of the scaling factor, M, received by the buffer scalar 434. Similar to the third output buffer 161, depicted in FIG. 4A, the buffer scalar 434 generates the delayed $I_{COR}$ estimated switching voltage output 38C, $V_{SW\_EST\_DELAY\_ICOR}$, based on the one or more programmably delayed switching voltage output cmos signal(s) 166A, $V_{SW\_EST\_CMOS\_DELAYED\_SIGNAL}$(s), and the scaling factor, M, provided by the controller 50. The controller 50 (not shown) may adjust the value of the scaling factor, M, to account for variations in the magnitude of the $V_{RAMP}$ signal and to ensure proper performance of the ripple cancellation circuit 424. In other embodiments, the controller 50 (not shown) may adjust the scaling factor, M, to compensate for changes in the direct current (DC) voltage, $V_{BAT}$, from the battery 20. Example embodiments of the programmable delay circuitry 432 are depicted in FIGS. 29A-B and FIG. 30.

To time align the generation of the high frequency ripple compensation current 416, $I_{COR}$, the controller 50 programmatically adjusts the delay provided by the programmable delay circuitry 432 based on the programmable delay parameter(s). The controller 50 may configure the delay time through the programmable delay circuitry 432 to move the placement of the notch in the ripple rejection response of the pseudo-envelope follower power management system 10MA. As an example, the controller 50 may adjust the delay to place the notch in the ripple rejection response of the pseudo-envelope follower power management system 10MA as function of the transmit to receive duplex offset for each band of operation in which the linear RF power amplifier 22 is configured to be used. Accordingly, as discussed above, the controller 50 may be configured to programmatically change the values of the programmable filter parameter(s), programmable gain parameter(s), and programmable delay parameter(s) to obtain an optimized notch depth, a notch width, and a notch frequency of the notch in the ripple rejection response of the embodiments of the pseudo-envelope follower power management system 10MA, depicted in FIG. 23A and FIG. 23C, and the pseudo-envelope follower power management system 10MB, depicted in FIG. 23B and FIG. 23D, as a function of the transmit to receive duplex offset for each band of operation for which the linear RF power amplifier 22 is configured to be used.

FIG. 25 depicts three example ripple rejection responses of an embodiment of the pseudo-envelope follower power management system similar to the pseudo-envelope follower power management system 10MA and the pseudo-envelope follower power management system 10MB, depicted in FIGS. 23A-D, where the desired maximum ripple rejection response is near 30 MHz.

The first ripple rejection response depicted in FIG. 25 may be obtained by the controller 50 configuring the programmable delay circuitry 432 to provide a first programmable delay period substantially equal to $DELAY_1$ in order to temporally align the delayed $I_{COR}$ estimated switching voltage output 38C, $V_{SW\_EST\_DELAY\_ICOR}$, to provide a maximum ripple rejection response near 30 MHz. The second ripple rejection response depicted in FIG. 25 may be obtained by the controller 50 configuring the programmable delay circuitry 432 to provide a second programmable delay period substantially equal to $DELAY_2$, where $DELAY_2 > DELAY_1$. This results in the second ripple rejection response having a maximum ripple rejection response at a frequency less than the desired 30 MHz and the depth of the notch in the ripple rejection response is reduced. The third ripple rejection response depicted in FIG. 25 may be obtained by the controller 50 configuring the programmable delay circuitry 432 to provide a third programmable delay period substantially equal to $DELAY_3$, where $DELAY_1 > DELAY_3$. This results in the third ripple rejection response having a maximum ripple rejection response at a frequency greater than the desired 30 MHz and locates the notch in the ripple rejection response at a frequency that is higher than the desired 30 MHZ. As depicted in FIG. 25, the controller 50 may configure the programmable delay provided by the programmable delay circuitry 432 to locate the notch in the ripple rejection response of the pseudo-envelope follower power management systems 10MA and 10MB at or near the receive duplex offset for each band of operation for which the linear RF power amplifier 22 is configured to be used.

Figure 26:
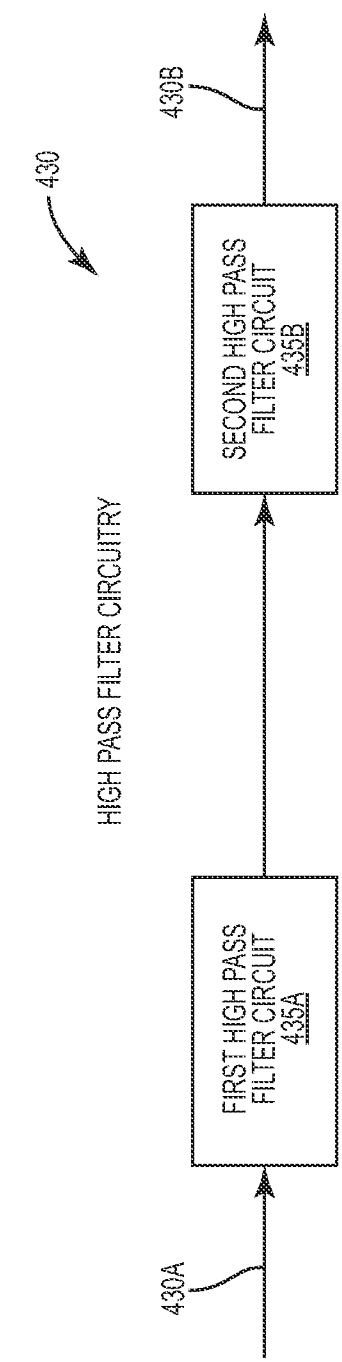
FIG. 26 further depicts an embodiment of the high pass circuitry depicted in FIG. 25.

FIG. 26 depicts an embodiment of the high pass filter circuitry 430 that may include a first high pass filter circuit 435A and a second high pass filter circuit 435B. The first high pass filter circuit 435A may have a first corner frequency, $f_{C1}$, which is determined by the first high pass filter time constant, $\tau_{C1}$. The second high pass filter circuit 435B may have a second corner frequency, $f\text{-}_{C2}$, which is determined by the second high pass filter time constant, $\tau_{C2}$. Accordingly, the combined transfer function of the first high pass filter circuit 435A and the second high pass filter circuit 435B may provide a first high pass filter response and a second high pass filter response, where the first high pass filter response corresponds to a first corner frequency, $f_{C1}$, and the second high pass filter response corresponds to a second corner frequency, $f_{C2}$. The combined transfer function of the first high pass filter circuit 435A and the second high pass filter circuit 435B, $H_{HP}(s)$, may be represented by the Laplace transfer function shown in equation (5) as follows:

$$H_{HP}(s) = \left[\frac{\tau_{C1}s}{1+\tau_{C1}s}\right]\left[\frac{\tau_{C2}s}{1+\tau_{C2}s}\right]. \quad (5)$$

The first high pass filter time constant, $\tau_{C1}$ and the second high pass filter time constant, $\tau_{C2}$, may be independently set such that the first corner frequency, $f_{C1}$, does not equal the second corner frequency, $f_{C2}$. For example, the first high pass filter time constant, $\tau_{C1}$, may be configured by the controller 50 (not shown) such that the first corner frequency, $f_{C1}$, has a range between 3M Hz and 11.5 MHz. In some embodiments, the first corner frequency, $f_{C1}$, may have a range between 3 MHz and 3 MHz. Similarly, the controller may configure the second high pass filter time constant, $\tau_{C2}$, such that the second corner frequency, $f_{C2}$, has a range between 3 MHz and 11.5 MHz. In some embodiments, the second corner frequency, $f_{C2}$, may have a range between 3 MHz and 8 MHz.

In some embodiments of the high pass filter circuitry 430, the first corner frequency, $f_{C1}$, of the first high pass filter circuit 435A and the second corner frequency, $f_{C2}$, of the second high pass filter circuit 435B are each set to be approximately 6 MHz. In some embodiments, the controller 50 (not shown) may configure the first high pass filter time constant, $\tau_{C1}$, and the second high pass filter time constant, $\tau_{C2}$. For example, the first high pass filter time constant, $\tau_{C1}$, may be configured by the controller 50 (not shown) such that the first corner frequency, $f_{C1}$, has a range between 3 MHz and 11.5 MHz. In some embodiments, the first corner frequency, $f_{C1}$, may have a range between 3 MHz and 11.5 MHz. In still other embodiments the first corner frequency, $f_{C1}$, and the second corner frequency, $f_{C2}$, may be configured to be substantially the same. For example, the first corner frequency, $f_{C1}$, may be configured to be around 6 MHz, and the second corner frequency, $f_{C2}$, may be configured to be around 6 MHz. In some embodiments, the first corner frequency, $f_{C1}$, and the second corner frequency, $f_{C2}$, are configured by the controller 50 as a function of the bandwidth of the receive channel frequency band associated with each band of operation.

Returning to FIG. 24, assuming that the high pass filter circuitry 430 includes both the first high pass filter circuit 435A and the second high pass filter circuit 435B, the desired Laplace transfer function for the high frequency ripple compensation current 416, $I_{COR}$, provided at the Gm assist $I_{COR}$ output 426B of the Gm assist circuit 426 is shown in equation (6) as follows:

$$I_{COR}(s) = \frac{(V_{RAMP} - V_{SW\_OUT\_EST})}{L_{POWER\_INDUCTOR}s} \frac{\tau_{C1}s}{1+\tau_{C1}s} \frac{\tau_{C2}s}{1+\tau_{C2}s} \tag{6}$$

where $V_{RAMP}$ represents the future value of the power amplifier supply voltage, $V_{CC}$, the delayed $I_{COR}$ estimated switching voltage output 38C, $V_{SW\_EST\_DELAY\_ICOR}$, represents the future value of the switching voltage, $V_{SW}$, at the switching voltage output 26 based on the operational state of the switcher control circuit (not shown) of the switch mode power supply converter 420, and $L_{POWER\_INDUCTOR}$ represents the inductance of the power inductor 16. In some embodiments of the open loop ripple compensation assist circuit 414A, the inductance of the power inductor 16 may be represented by the estimated power inductor inductance parameter, $L_{EST}$, discussed above with reference to the open loop assist circuit 39, depicted in FIG. 2A and FIG. 2B, where the estimated power inductor inductance parameter, $L_{EST}$, may be either the measured or estimated inductance of the power inductor 16 between a specific range of frequencies. For example, the estimated power inductor inductance parameter, $L_{EST}$, may be either the measured or estimated inductance of the power inductor 16 between approximately 10 MHz and 30 MHz. As another example, the estimated power inductor inductance parameter, $L_{EST}$, may be either the measured or estimated inductance of the power inductor 16 within a band of frequencies near or within operational bandwidth of the linear RF power amplifier 22. In this case, the Laplace transfer function for the high frequency ripple compensation current 416, $I_{COR}$, provided by the Gm assist circuit 426 may be given by equation (7) as follows:

$$I_{COR}(s) = \frac{(V_{RAMP} - V_{SW\_OUT\_EST})}{L_{EST}} \frac{\tau_{C1}}{1+\tau_{C1}s} \frac{\tau_{C2}s}{1+\tau_{C2}s} \tag{7}$$

As shown in equation (7), the Laplace transfer function for the high frequency ripple compensation current 416 includes a low pass filter having a low pass time constant, $\tau_{C1}$, and a high pass filter having a high pass time, $\tau_{C2}$.

Figure 27A:
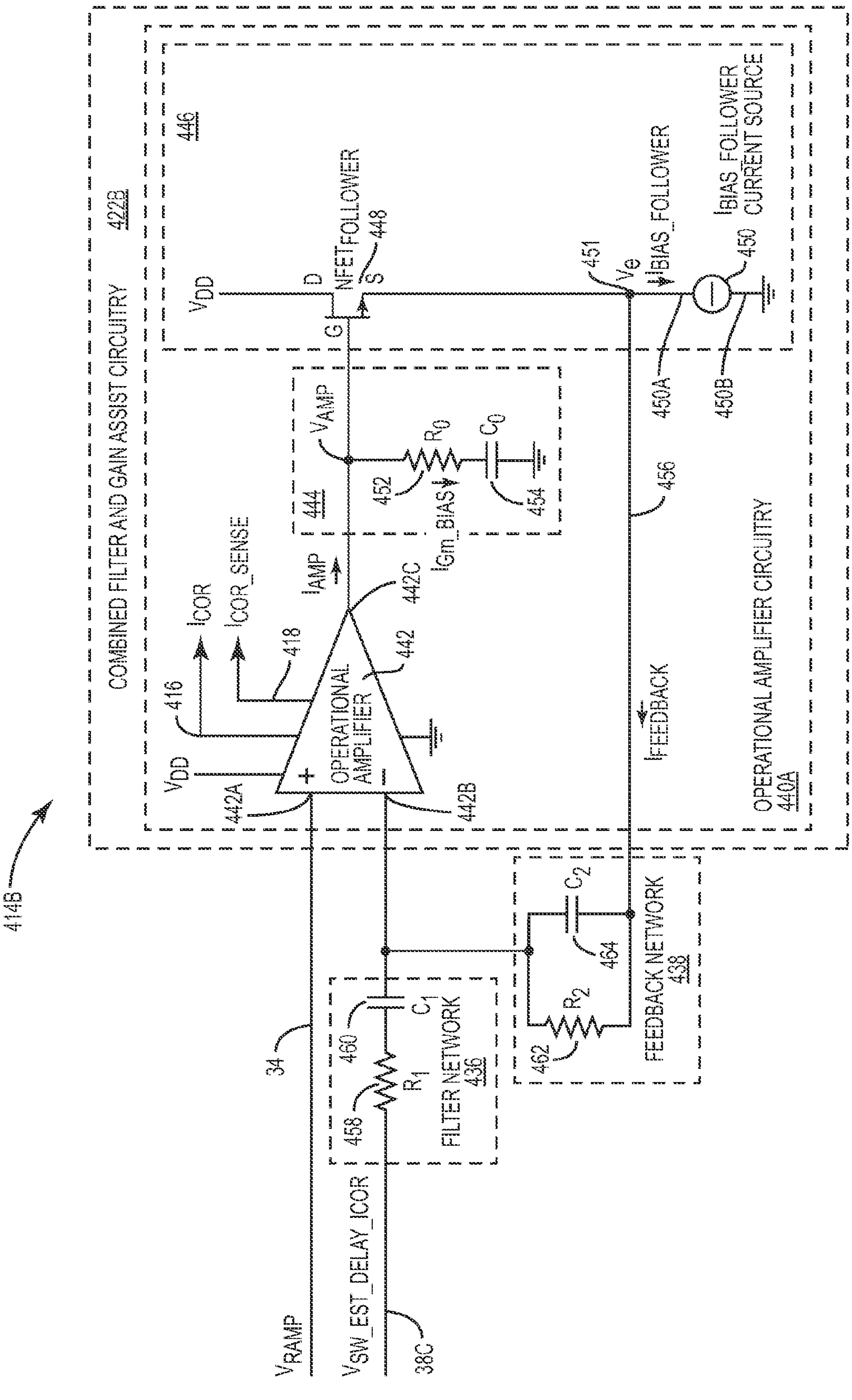
FIG. 27A depicts an embodiment of the open loop ripple compensation assist circuit of FIGS. 23A-23D.

FIG. 27A depicts another embodiment of the open loop ripple compensation assist circuit 414B which is similar to the open loop ripple compensation assist circuit 414 depicted in FIGS. 23A-D. For the sake of brevity, and not by way of limitation, the switch mode power supply converter 420 and circuitry associated with generation of the delayed $I_{COR}$ estimated switching voltage output 38C, $V_{SW\_EST\_DELAY\_ICOR}$, depicted in FIG. 24, are not depicted in FIG. 27A. Also, while controller 50 is not depicted in FIG. 27A, it will be understood that as depicted in FIGS. 23A-D, controller 50 (not shown) may configure the various elements of the open loop ripple compensation assist circuit 414B depicted in FIG. 27A.

The open loop ripple compensation assist circuit 414B includes combined filter and gain assist circuitry 422B, a filter network 436, and a feedback network 438. The combined filter and gain assist circuitry 422B includes operational amplifier circuitry 440A having an operational amplifier 442, a Gm bias circuit 444, and an operational amplifier output isolation circuit 446.

The operational amplifier 442 includes a non-inverting input 442A, an inverting input 442B, and an operational amplifier output 442C. The operational amplifier 442 may include a first operational amplifier push-pull output stage circuit (not shown) that generates the operational amplifier output 442C. The non-inverting input 442A of the operational amplifier 442 is configured to receive the $V_{RAMP}$ signal. The operational amplifier output 442C may be configured to source an operational amplifier output current, $I_{AMP}$, to produce an operational amplifier output voltage, $V_{AMP}$, across the Gm bias circuit 444.

In addition, the operational amplifier 442 may be further configured to generate or provide the high frequency ripple compensation current 416, $I_{COR}$, and the scaled high frequency ripple compensation current estimate 418, $I_{COR\_SENSE}$. As an example, the operational amplifier 442 may further include a second operational amplifier push-pull output stage circuit (not shown) configured to generate the high frequency ripple compensation current 416, $I_{COR}$. In addition, as another example, the operational amplifier 442 may further include a third operational amplifier push-pull output stage circuit (not shown) configured to generate the scaled high frequency ripple compensation current estimate 418, $I_{COR\_SENSE}$.

In some embodiments of the operational amplifier 442, the high frequency ripple compensation current 416, $I_{COR}$, generated by the second operational amplifier output state circuit may be substantially a mirrored current of the operational amplifier output current, $I_{AMP}$, provided by the first operational amplifier push-pull output stage circuit (not shown). Similarly, in some embodiments of the operational amplifier 442, the scaled high frequency ripple compensation current estimate 418, $I_{COR\_SENSE}$, may be a mirrored current of the operational amplifier output current, $I_{AMP}$, provided by the first operational amplifier push-pull output stage circuit (not shown).

In the cases where the high frequency ripple compensation current 416, $I_{COR}$, and the scaled high frequency ripple compensation current estimate 418, $I_{COR\_SENSE}$, are related to the operational amplifier output current, $I_{AMP}$, by a current mirroring arrangement, the relative dimensional relationships of the channel widths of the respective transistor elements may be used to implement the first operational amplifier push-pull output stage circuit (not shown), the second operational amplifier push-pull output stage circuit (not shown), and the third operational amplifier push-pull output stage circuit (not shown), may be configured to relate the magnitudes of the operational amplifier output current, $I_{AMP}$, to the magnitudes of the high frequency ripple compensation current 416, $I_{COR}$, and the scaled high frequency ripple compensation current estimate 418, $I_{COR\_SENSE}$.

The operational amplifier output isolation circuit 446 includes a follower NFET 448, $NFET_{FOLLOWER}$, and an $I_{BIAS\_FOLLOWER}$ current source 450. The drain of the follower NFET 448, $NFET_{FOLLOWER}$, is coupled to a circuit supply voltage, $V_{DD}$. The gate of the follower NFET 448, $NFET_{FOLLOWER}$, provides a high impedance input of the operational amplifier output isolation circuit 446, and is coupled to the operational amplifier output 442C. As a result, the gate voltage at the gate of the follower NFET 448, $NFET_{FOLLOWER}$ is equal to the operational amplifier output voltage, $V_{AMP}$. The follower NFET 448, $NFET_{FOLLOWER}$, may be configured such that the input gate impedance of the follower NFET 448, $NFET_{FOLLOWER}$, is very high relative to other impedances coupled to the operational amplifier output 442C in the operational frequency range of the open loop ripple compensation assist circuit 414B. As a result, the gate current, $I_{GATE}$, flowing into the gate of the follower NFET 448, $NFET_{FOLLOWER}$, approaches zero. The source of the follower NFET 448, $NFET_{FOLLOWER}$, is coupled to the first node 450A of the $I_{BIAS\_FOLLOWER}$ current source 450. The second node 450B of the $I_{BIAS\_FOLLOWER}$ current source 450 is coupled to ground. The $I_{BIAS\_FOLLOWER}$ current source 450 may be configured to sink an $NFET_{FOLLOWER}$ bias current, $I_{BIAS\_FOLLOWER}$, to provide a bias current for the follower NFET 448, $NFET_{FOLLOWER}$. The gate-to-source voltage of the follower NFET 448, $NFET_{FOLLOWER}$, is $V_{GS\_NFET\_FOLLOWER}$. The source voltage on the source of the follower NFET 448, $NFET_{FOLLOWER}$, is the feedback voltage, $V_e$, where $V_e = V_{AMP} - V_{GS\_NFET\_FOLLOWER}$. Thus, from a small signal modeling perspective, the follower NFET 448, $NFET_{FOLLOWER}$, effectively isolates the feedback voltage, $V_e$, from the operational amplifier output 442C. As a result, the operational amplifier circuitry 440A includes an isolated feedback node 451 at the node created at the connection of the source of the follower NFET 448, $NFET_{FOLLOWER}$, and the first node 450A of the $I_{BIAS\_FOLLOWER}$ current source 450. The isolated feedback node 451 provides the feedback voltage, $V_e$, to the feedback network 438.

The feedback network 438 may be coupled between the inverting input 442B of the operational amplifier 442 and the isolated feedback node 451 to provide the feedback path for the feedback current 456, $I_{FEEDBACK}$. The inverting input 442B of the operational amplifier 442 is also coupled to the delayed $I_{COR}$ estimated switching voltage output 38C, $V_{SW\_EST\_DELAY\_ICOR}$, via the filter network 436, as depicted in FIG. 27A. The filter network 436 includes a filter resistor 458 coupled in series with a filter capacitor 460. The filter resistor 458 may have a filter resistance substantially equal to $R_1$. The filter capacitor 460 may have a filter capacitance substantially equal to $C_1$. The feedback network 438 may include a feedback resistor 462 coupled in parallel with a feedback capacitor 464. The feedback resistor 462 may have a feedback resistance substantially equal to $R_2$. The feedback capacitor 464 may have a feedback capacitance substantially equal to $C_2$. In some embodiments, the filter resistor 458 and/or the feedback resistor 462 may be configured to be programmable by the controller 50 (not shown). For example, the filter resistor 458 and/or the feedback resistor 462 may be a binary weighted resistor array configured to be controlled by the controller 50. As an example, the filter resistor 458 and/or the feedback resistor 462 may each be implemented as a resistor array including switches that may be programmed to be open or closed by the controller 50 (not shown). As a result, the controller 50 may selectively set the resistance value of the filter resistance, $R_1$ of the filter resistor 458, and the resistance value of the feedback resistance, $R_2$, of the feedback resistor 462, to change the frequency response of the open loop ripple compensation assist circuit 414B. In a similar fashion, or in addition to, in some embodiments, the filter capacitor 460 and/or the feedback capacitor 464 may each be implemented as a capacitor array that may be configured by the controller 50. For example, the filter capacitor 460 and/or the feedback capacitor 464 may be a binary weighted capacitor array configured to be controlled by the controller 50. The effective capacitance of the capacitor array may be configured by the controller 50 by selectively switching in and out different capacitors in each respective capacitor array. As a result, in some embodiments, the controller 50 may be configured to selectively set the capacitance value of the filter capacitance, $C_1$, of the filter capacitor 460 and the capacitance value of the feedback capacitance, $C_2$, of the feedback capacitor 464, to change the frequency response of the open loop ripple compensation assist circuit 414B.

In addition, in some embodiments of the open loop ripple compensation assist circuit 414B, the filter resistance, $R_1$, of the filter resistor 458, the feedback resistance, $R_2$, of the feedback resistor 462, the filter capacitance, $C_1$, of the filter capacitor 460, and the feedback capacitance, $C_2$, of the feedback capacitor 464, are independently programmable by the controller 50.

Alternatively, in some embodiments, the capacitance value of the filter capacitance, $C_1$, of the filter capacitor 460 may be a fixed value. Similarly, in some embodiments, the feedback capacitance, $C_2$, of the feedback capacitor 464 may be a fixed value. Likewise, in other embodiments, the resistance value of the filter resistance, $R_1$, of the filter resistor 458 may be a fixed value and/or the resistance value of the feedback resistance, $R_2$, of the feedback resistor 462 may be a fixed value. Moreover, in some embodiments, different combinations of the filter resistance, $R_1$ the feedback resistance, $R_2$, the filter capacitance, $C_1$, and the feedback capacitance, $C_2$, of the respective filter resistor 458, the filter capacitor 460, the feedback resistor 462, and the feedback capacitor 464 may have either fixed values or programmable values of resistances and capacitances.

Similar to the open loop ripple compensation assist circuit 414A, depicted in FIG. 24, the open loop ripple compensation assist circuit 414B, depicted in FIG. 27A, may be configured to provide substantially the same Laplace transfer function as the open loop ripple compensation assist circuit 414A without an integrator circuit 428 and a high pass filter 430, where the high pass filter 430 includes a first high filter circuit 435A and a second high pass filter circuit 435B, as depicted in FIGS. 24 and 26 respective. Instead, the open loop ripple compensation assist circuit 414B, depicted in FIG. 27A, may be described as having a low pass filter followed by a high pass filter. Similar to the open loop ripple compensation assist circuit 414A, depicted in FIG. 24, the open loop ripple compensation assist circuit 414B, depicted in FIG. 27, has a first time constant $T_1$ and a second time constant $T_2$, which may be configured by the controller 50. The first time constant $T_1$ is associated with the filter network 436. The second time constant $T_2$ is associated with the feedback network 438. The first time constant $T_1$ is substantially equal to the product of the resistance, $R_1$, of the filter resistor 458 and the filter capacitance, $C_1$, of the filter capacitor 460, and corresponds to the first corner frequency, $f_{C1}$. The second time constant $\tau_2$ is substantially equal to the product of the feedback resistance, $R_2$, of the feedback resistor 462 and the feedback capacitance, $C_2$, of the feedback capacitor 464, and corresponds to the second corner frequency, $f_{C2}$.

In some embodiments, the filter resistance, $R_1$, of the filter resistor 458 and the filter capacitance, $C_1$, of the filter capacitor 460 may be configured such that the first corner frequency, $f_{C1}$, may have a range between 3 MHz and 11.5 MHz. In other embodiments, the filter resistance, $R_1$, of the filter resistor 458 and the filter capacitance, $C_1$, of the filter capacitor 460 may be configured such that the first corner frequency, $f_{C1}$, may have a range between 3 MHz and 8 MHz. Similarly, the feedback resistance, $R_2$, of the feedback resistor 462 and the feedback capacitance, $C_2$, of the feedback capacitor 464 may be configured such that the second corner frequency, $f_{C2}$, may have a range between 4 MHz and 11.5 MHz. In other embodiments, the feedback resistance, $R_2$, of the feedback resistor 462 and the feedback capacitance, $C_2$, of the feedback capacitor 464 may be configured such that the second corner frequency, $f_{C2}$, may have a range between 4 MHz and 8 MHz. As another example, the controller 50 may configure the filter resistance, $R_1$, the filter capacitance, $C_1$, feedback resistance, $R_2$, and the feedback capacitance, $C_2$, as a function of the bandwidth of the receive channel frequency band associated with each band of operation.

The Gm bias circuit 444 may include a bias resistor 452 coupled in series with a bias capacitor 454 between the operational amplifier output 442C and ground. The bias resistor 452 may have a bias resistance, $R_0$. As an example, in some embodiments, the bias resistor 452 may be a resistor array that is configurable by the controller 50. The value of the bias resistance, $R_0$, may be set by the controller 50 by selecting one or a combination of the resistors to obtain a desired effective resistance of the resistor array. In other embodiments, the value of the bias resistance, $R_0$, may be fixed. The bias capacitor 454 may have a bias capacitance $C_0$. In some embodiments, the bias capacitance, $C_0$, of the bias capacitor 454 may also be programmable by the controller 50. As an example, the bias capacitor 454 may be a capacitor array. As a result, the controller 50 may configure the value of the bias capacitance, $C_0$, of the bias capacitor 454 by selectively switching in and out various combinations of the capacitors in the capacitor array. However, in some embodiments, the value of the bias capacitance, $C_0$, may be fixed.

As an example configuration of the series arrangement of the bias resistor 452 and the bias capacitor 454 of the Gm bias circuit 444, the bias resistor 452 may include a first terminal and a second terminal. The bias capacitor 454 may include a first terminal coupled to the second terminal of the bias resistor 452 and a second terminal coupled to ground. The first terminal of the bias resistor 452 may be coupled to the operational amplifier output 442C.

The operational amplifier output voltage, $V_{AMP}$, generated at the operational amplifier output 442C may induce a Gm bias current, $I_{Gm\_BIAS}$, through the Gm bias circuit 444. The impedance of the Gm bias circuit 444 is configured to set the transconductance of the operational amplifier 442 within the operational bandwidth of the operational amplifier 442. Because the bias capacitor 454 blocks direct currents, the impedance of the Gm bias circuit 444 may be used to set the small signal transconductance of the operational amplifier 442. The bias capacitance, $C_0$, of the bias capacitor 454 may be selected such that the impedance of the Gm bias circuit 444 is dominated by the bias resistance, $R_0$, of the bias resistance 452 within the frequency band of operation of the open loop ripple compensation assist circuit 414B. For example, because the open loop ripple compensation assist circuit 414B is configured to generate the high frequency ripple compensation current 416, $I_{COR}$, to cancel out high frequency ripple currents at the power amplifier supply output 28, the bias capacitance, $C_0$, may be selected such that the impedance of the bias capacitor 454 is dominated by the impedance of the bias resistance 452 within the frequency band of operation of the open loop ripple compensation assist circuit 414B. Advantageously, the bias capacitor 454 is included in the Gm bias circuit 444 to reduce the current drawn by the operational amplifier 442. Accordingly, as will be described, the operational amplifier transconductance, $Gm_{OP\_AMP}$, of the operational amplifier 442 within the frequency band of operation of the open loop ripple compensation assist circuit 414B may be set based on the value of the bias resistance, $R_0$, of the bias resistor 452, where the operational amplifier transconductance, $Gm_{OP\_AMP}$, refers to the small signal transconductance of the operational amplifier 442. If the bias capacitor 454 is removed such that the bias resistor 542 is coupled between the operational amplifier output 442C and ground, the impedance of the Gm bias circuit 444 would set both the direct current transconductance and small signal transconductance of the operational amplifier 442.

Because the input gate impedance of the follower NFET 448, $NFET_{FOLLOWER}$, may be configured to be several orders of magnitude greater than the impedance of the Gm bias circuit 444, the operational amplifier transconductance, $Gm_{OP\_AMP}$, of the operational amplifier 442 may be set based on the value of the bias resistance, $R_0$, of the bias resistor 452. In particular, assuming that the gate current, $I_{GATE}$, into the gate of the follower NFET 448, $NFET_{FOLLOWER}$, is near zero, the operational amplifier output current, $I_{AMP}$, is equal to an operational amplifier output voltage, $V_{AMP}$, divided by the impedance of the Gm bias circuit 444. By selecting a value of the bias capacitance, $C_0$, of the bias capacitor 454 such that the impedance of the bias capacitor 454 is dominated by the bias resistance, $R_0$, of the bias resistor 452 within the frequency band of operation of the open loop ripple compensation assist circuit 414B, the impedance of the Gm bias circuit 444 is approximately equal to the bias resistance, $R_0$, of the bias resistor 452. As a result, the operational amplifier 442 may have an operational amplifier transconductance, $Gm_{OP\_AMP}$, within the frequency band of operation of the open loop ripple compensation assist circuit 414B that is approximately $1/R_0$. In some embodiments, because the bias resistance, $R_0$, may be configured by the controller 50, the controller 50 may set the operational amplifier transconductance, $Gm_{OP\_AMP}$, of the operational amplifier 442 by setting the resistance level of the bias resistance, $R_0$, of the bias resistor 452. However, if the bias capacitor 454 is removed such that the bias resistor 542 is coupled between the operational amplifier output 442C and ground, the impedance of the Gm bias circuit 444 would set both the direct current transconductance and small signal transconductance of the operational amplifier 442. The Laplace transfer function for the operational amplifier output current, $I_{AMP}$, when the Gm bias circuit 444 does not include the bias capacitor 454 is shown in equation (8) as follows:

$$I_{AMP}(s) = \frac{1}{R_0}\frac{R_2C_1s(V_{RAMP} - V_{SW\_EST\_DELAY\_ICOR})}{(1+R_1C_1s)(1+R_2C_2s)} + I_{DC} \tag{8}$$

where $I_{DC}$ represents the direct current flowing through the bias resistor 452 as if the bias capacitor 454 is not present and the bias resistor 452 is coupled between the operational amplifier output 442C and ground, and the $V_{RAMP}$ signal represents the future value of the power amplifier supply voltage, $V_{CC}$ and the delayed $I_{COR}$ estimated switching voltage output 38C, $V_{SW\_EST\_DELAY\_ICOR}$, represents the future value of the switching voltage, $V_{SW}$, at the switching voltage output 26. If the Gm bias circuit 444 includes the bias capacitor 454, where the bias capacitance, $C_0$, of the bias capacitor 454 is selected such the impedance of the Gm bias circuit 444 within the frequency band of operation of the operational amplifier 442 is dominated by the bias resistance, $R_0$, of the bias resistor 452I, the Laplace transfer function for the operational amplifier output current, $I_{AMP}$, is given by equation (9) as follows:

$$I_{AMP}(s) = \frac{1}{R_0}\frac{R_2C_1s(V_{RAMP} - V_{SW\_EST\_DELAY\_ICOR})}{(1 + R_1C_1s)(1 + R_2C_2s)} \quad (9)$$

where, for the purposes of small single gain, the direct current, $I_{DC}$, is blocked by the bias capacitor 454.

As non-limiting example, mapping the elements of equation (7) to the elements of equation (9), shows the that open loop ripple compensation assist circuit 414B may provide the same Laplace transfer function as the open loop ripple compensation assist circuit 414A, depicted in FIG. 24. For example, setting $\tau_{C1}=\tau_1=R_1C_1$, $\tau_{C2}=\tau_2=R_2C_2$ and $R_2C_1/R_0=\tau_{C2}/L_{EST}$, the transfer function of $I_{COR}(s)=I_{AMP}(s)$. Thus, for the transfer function of the open loop ripple compensation assist circuit 414B depicted in FIG. 27, the first corner frequency, $f_{C1}$, $=1/(2\pi R_1C_1)$ and the second corner frequency, $f_{C2}$, $=1/(2\pi R_2C_2)$. Because the controller 50 may configure the filter resistance, $R_1$, of the filter resistor 458, the feedback resistance, $R_2$, of the feedback resistor 462, the filter capacitance, $C_1$, of the filter capacitor 460, and the feedback capacitance, $C_2$, of the feedback capacitor 464, the first high pass filter response having a first corner frequency, $f_{C1}$, and a second high pass filter response having a first corner frequency, $f_{C2}$, are also independently programmable.

If, for the sake of simplicity, and not by way of limitation, the filter capacitance, $C_1$, and the feedback capacitance, $C_2$, are selected such that $C_1=C_2=C$, mapping of the elements of equation (7) to the elements of equation (9) yields the relationships of $\tau_{C1}=R_1C$, $\tau_{C2}=R_2C$, and $$R_0 = \frac{L_{EST}}{\tau_{C1}} = \frac{L_{EST}}{R_1C}.$$

Based on the non-limiting example mapping described above, the transfer function for the operational amplifier output current, $I_{AMP}$, described in equation (9) would be substantially equal to the desired transfer function for the high frequency ripple compensation current 416, $I_{COR}$, described in equation (7). However, as will be described below, in some embodiments of the open loop ripple compensation assist circuit 414B, the operational amplifier output current, $I_{AMP}$, is proportional to the high frequency ripple compensation current 416, $I_{COR}$, generated by the operational amplifier 442. In other words, the magnitude of the bias resistance, $R_0$, of the bias resistor 452, may be selected such that $R_0$ is proportional to $$\frac{L_{EST}}{\tau_{C1}},$$

where the relative ratios of the channel widths of the transistor elements used to implement the first operational amplifier push-pull output stage circuit of the operational amplifier 442 (not shown) and the transistor elements used to implement the second operational amplifier push-pull output stage circuit of the operational amplifier 442 (not shown) are configured such that the high frequency ripple compensation current 416, $I_{COR}$, generated by the operational amplifier 442 is consistent with the desired transfer function for the high frequency ripple compensation current 416, $I_{COR}$, described by equation (7), with respect to the open loop ripple compensation assist circuit 414A depicted in FIG. 24.

As shown by the non-limiting example mapping of equation (7) to equation (9), the open loop ripple compensation assist circuit 414B, depicted in FIG. 27A may be configured to provide a similar function as the open loop ripple compensation assist circuit 414A depicted in FIG. 24. In other words, the embodiment of the open loop ripple compensation assist circuit 414B that includes the operational amplifier 442, the operational amplifier output isolation circuit 446, the feedback network 438, and the filter network 436, as depicted in FIG. 27A, may be configured to provide a substantially similar transfer function as the open loop ripple compensation assist circuit 414A depicted in FIG. 24.

Generation of the high frequency ripple compensation current 416, $I_{COR}$, and the scaled high frequency ripple compensation current estimate 418, $I_{COR\_SENSE}$, as a function of the operational amplifier output current, $I_{AMP}$, will now be discussed with reference to FIG. 31A and FIGS. 32A-32C.

Figure 31A:
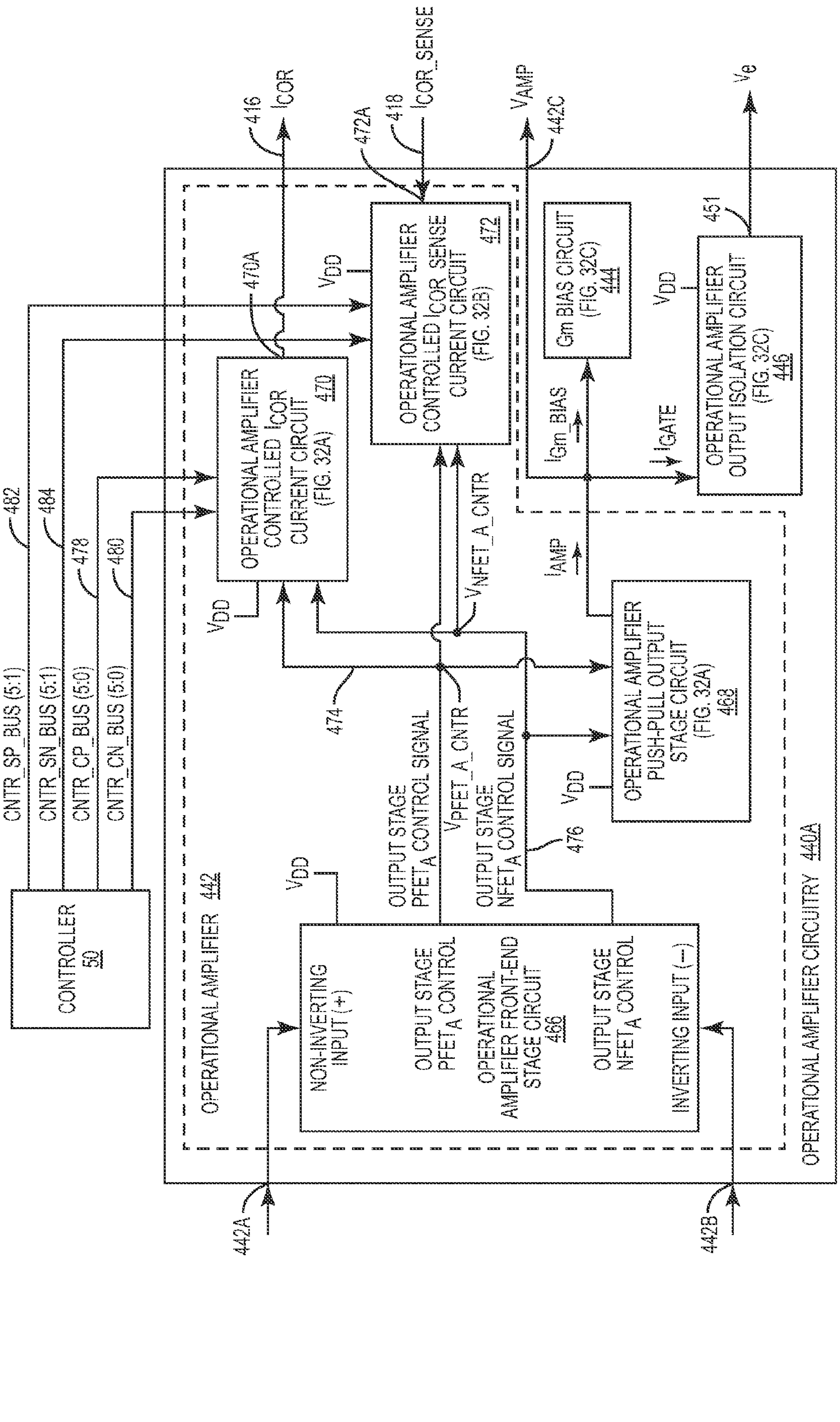
FIG. 31A depicts an example embodiment of the operational amplifier of the embodiment of an operational amplifier circuitry depicted in FIG. 27A.

FIG. 31A depicts an embodiment of the operational amplifier circuitry 440A having the operational amplifier 442, where the operational amplifier circuitry 440A includes the operational amplifier 442 in combination with both an embodiment of the Gm bias circuit 444 and an embodiment of the operational amplifier output isolation circuit 446. The embodiment of the operational amplifier circuitry 440A depicted in FIG. 31A will be described with continuing reference to the operational amplifier circuitry 440A depicted in FIG. 27, with reference to FIG. 32A and FIG. 32B, and the embodiments of the Gm Bias Circuit 444 and the operational amplifier output isolation circuit 446 depicted in FIG. 32C.

The embodiment of the operational amplifier 442, depicted in FIG. 31A, may include an embodiment of the operational amplifier front-end stage circuit 466, an embodiment of the operational amplifier push-pull output stage circuit 468, an embodiment of the operational amplifier controlled $I_{COR}$ current circuit 470, and an embodiment of the operational amplifier controlled $I_{COR\_SENSE}$ current circuit 472. The embodiments of the operational amplifier front-end stage circuit 466, the operational amplifier push-pull output stage circuit 468, the operational amplifier controlled $I_{COR}$ current circuit 470, and the operational amplifier controlled $I_{COR\_SENSE}$ current circuit 472, depicted in FIG. 31A, are each configured receive the circuit supply voltage, $V_{DD}$. The embodiment of the operational amplifier output isolation circuit 446 depicted in FIG. 32C is configured receive the circuit supply voltage, $V_{DD}$.

The operational amplifier push-pull output stage circuit 468 may be a push-pull output stage operably coupled to the operational amplifier output 442C. The operational amplifier push-pull output stage circuit 468 may be configured to provide an operational amplifier output current, $I_{AMP}$, and to generate a operational amplifier output voltage, $V_{AMP}$, at the operational amplifier output 442C.

The operational amplifier controlled $I_{COR}$ current circuit 470 includes an operational amplifier controlled $I_{COR}$ current output 470A configured to provide the high frequency ripple compensation current 416, $I_{COR}$. In addition, the operational amplifier controlled $I_{COR}$ current circuit 470 may be configured as a push-pull output stage having a programmable transconductance, $Gm_{ICOR}$, where the magnitude of the high frequency ripple compensation current 416, $I_{COR}$, is proportionally related to the amplifier output current, $I_{AMP}$, based on the relative dimensional relationships of the channel widths of the transistor elements used to implement the operational amplifier push-pull output stage circuit 468 and the operational amplifier controlled $I_{COR}$ current circuit 470. Similarly, the operational amplifier controlled $I_{COR\_SENSE}$ current circuit 472 includes an operational amplifier controlled $I_{COR\_SENSE}$ current output 472A configured to provide the scaled high frequency ripple compensation current estimate 418, $I_{COR\_SENSE}$, where the relative dimensional relationships of the channel widths of the transistor elements used to implement the operational amplifier controlled $I_{COR}$ current circuit 470 and the operational amplifier controlled $I_{COR\_SENSE}$ current circuit 472 may be configured to determine a relationship between the magnitude of the high frequency ripple compensation current 416, $I_{COR}$, and the magnitude of the scaled high frequency ripple compensation current estimate 418, $I_{COR\_SENSE}$. For example, the relative dimensional relationships of the channel widths of the transistor elements used to implement the operational amplifier controlled $I_{COR}$ current circuit 470 and the operational amplifier controlled $I_{COR\_SENSE}$ current circuit 472 may be configured such that the operational amplifier controlled $I_{COR\_SENSE}$ current circuit 472 may be configured to provide a scaled high frequency ripple compensation current estimate 418, $I_{COR\_SENSE}$, that is fractionally proportional to the high frequency ripple compensation current 416, $I_{COR}$. For example, the scaled high frequency ripple compensation current estimate 418, $I_{COR\_SENSE}$, may be fractionally related to the high frequency ripple compensation current 416, $I_{COR}$, by a sense scaling factor, $C_{SENSE\_SCALING}$.

The operational amplifier front-end stage circuit 466 includes a non-inverting input (+) that corresponds to the non-inverting input 442A of the operational amplifier 442 depicted in FIG. 27A. In addition, the operational amplifier front-end stage circuit 466 includes an inverting input (−) that corresponds to the inverting input 442B of the operational amplifier 442 depicted in FIG. 27A. Based on the voltage difference between the non-inverting input 442A and the inverting input 442B of the operational amplifier 442, the operational amplifier front-end stage circuit 466 generates an output stage $PFET_A$ control signal 474 and an output stage $NFET_A$ control signal 476 that are used to control the operation of the operational amplifier push-pull output stage circuit 468, the operational amplifier controlled $I_{COR}$ current circuit 470, and the operational amplifier controlled $I_{COR\_SENSE}$ current circuit 472.

The controller 50 may be configured to provide an $I_{COR}$ source current weight control bus 478, CNTR_CP_BUS (5:0) and an $I_{COR}$ sink current weight control bus 480, CNTR_CN_BUS (5:0) to the operational amplifier controlled $I_{COR}$ current circuit 470. As will be described, the controller 50 may programmatically control the magnitude of the high frequency ripple compensation current 416, $I_{COR}$, via the $I_{COR}$ source current weight control bus 478, CNTR_CP_BUS (5:0) and the $I_{COR}$ sink current weight control bus 480, CNTR_CN_BUS (5:0). Similarly, the controller 50 may be configured to provide an $I_{COR\_SENSE}$ source current weight control bus 482, CNTR_SP_BUS (5:1), and an $I_{COR\_SENSE}$ sink current weight control bus 484, CNTR_SN_BUS (5:1), to the operational amplifier controlled $I_{COR\_SENSE}$ current circuit 472. As will also be described, the controller 50 may programmatically control the magnitude of a scaled high frequency ripple compensation current estimate 418, $I_{COR\_SENSE}$, via the $I_{COR\_SENSE}$ source current weight control bus 482, CNTR_SP_BUS (5:1), and the $I_{COR\_SENSE}$ sink current weight control bus 484, CNTR_SN_BUS (5:1).

The operational amplifier push-pull output stage circuit 468 is configured to receive the output stage $PFET_A$ control signal 474 and the output stage $NFET_A$ control signal 476. Based on the output stage $PFET_A$ control signal 474 and the output stage $NFET_A$ control signal 476, the operational amplifier push-pull output stage circuit 468 is configured to generate the operational amplifier output current, $I_{AMP}$, at the operational amplifier output 442C.

Figure 32A:
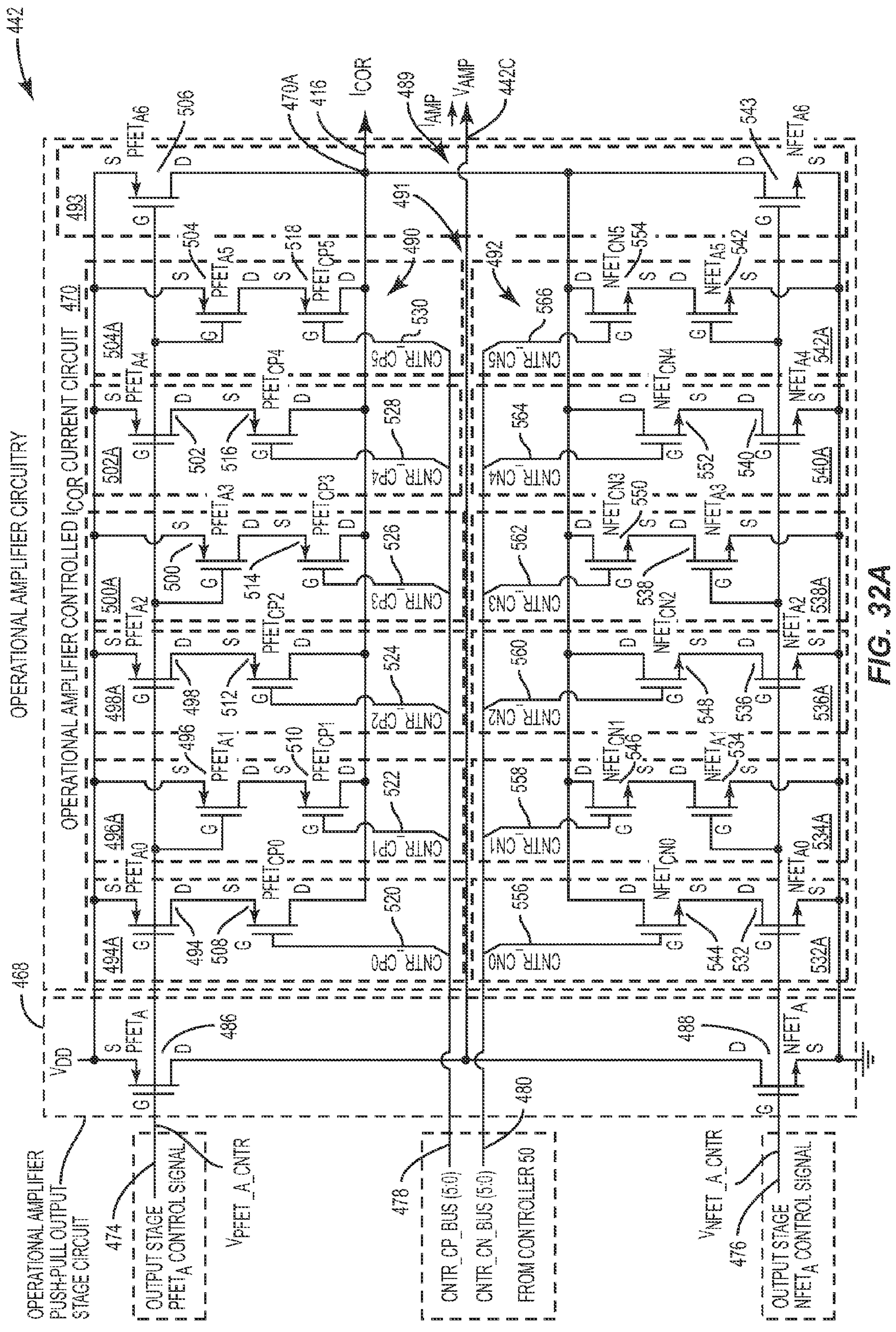
FIG. 32A depicts example embodiments of the operational amplifier push-pull output state circuit and the operational amplifier controlled $I_{COR}$ current circuit of an operational amplifier.

As further depicted in FIG. 32A, the operational amplifier push-pull output stage circuit 468 includes a first push-pull output PFET 486, $PFET_A$, and a first push-pull output NFET 488, $NFET_A$. The drain of the first push-pull output PFET 486, $PFET_A$, and the drain of the first push-pull output NFET 488, $NFET_A$, are coupled to form a substantially symmetrical push-pull output arrangement that forms the operational amplifier output 442C. The source of the first push-pull output PFET 486, $PFET_A$, is coupled to the circuit supply voltage, $V_{DD}$. The source of the first push-pull output NFET 488, $NFET_A$, is coupled to ground. The gate of the first push-pull output PFET 486, $PFET_A$, is configured to receive the output stage $PFET_A$ control signal 474, which sets the voltage on the gate of the first push-pull output PFET 486, $PFET_A$, to a $PFET_A$ control voltage, $V_{PFET\_A\_CNTR}$. The gate of the first push-pull output NFET 488, $NFET_A$, is configured to receive the output stage $NFET_A$ control signal 476, which sets the voltage on the gate of the first push-pull output NFET 488, $NFET_A$, to an $NFET_A$ control voltage, $V_{NFET\_A\_CNTR}$.

The operational amplifier front-end stage circuit 466 controls the $PFET_A$ control voltage, $V_{PFET\_A\_CNTR}$ and the $NFET_A$ control voltage, $V_{NFET\_A\_CNTR}$ such that when the voltage difference between the non-inverting input 442A and the inverting-input 442B of the operational amplifier 442 is substantially equal to zero, the current passing through the first push-pull output PFET 486, $PFET_A$, is substantially equal to the current passing through the first push-pull output NFET 488, $NFET_A$, such that the operational amplifier output current, $I_{AMP}$, generated by the operational amplifier push-pull output stage circuit 468, at the operational amplifier output 442C, is substantially equal to zero. As a result, the operational amplifier output voltage, $V_{AMP}$, generated at the connection of the drain of the first push-pull output PFET 486, $PFET_A$, and the drain of the first push-pull output NFET 488, $NFET_A$, is also substantially equal to zero.

Otherwise, depending upon the voltage difference developed between the non-inverting input 442A and the inverting-input 442B of the operational amplifier 442, the operational amplifier front-end stage circuit 466 controls the $PFET_A$ control voltage, $V_{PFET\_A\_CNTR}$ and the $NFET_A$ control voltage, $V_{NFET\_A\_CNTR}$, such that the operational amplifier output current, $I_{AMP}$, generated by the operational amplifier push-pull output stage circuit 468 either sources or sinks current. When the operational amplifier push-pull output stage circuit 468 sources current, in other words, the operational amplifier output current, $I_{AMP}$, is greater than zero, the current flowing through the drain of the first push-pull output PFET 486, $PFET_A$, is greater than the current flowing through the first push-pull output NFET 488, $NFET_A$. Correspondingly, when the operational amplifier push-pull output stage circuit 468 sinks current, in other words the operational amplifier output current, $I_{AMP}$, is less than zero, the current flowing through the drain of the first push-pull output PFET 486, $PFET_A$, is less than the current flowing through the first push-pull output NFET 488, $NFET_A$.

The operational amplifier controlled $I_{COR}$ current circuit 470 may be configured as an array of mirrored transistor elements arranged to form a substantially symmetric push-pull output stage 489 for providing the high frequency ripple compensation current 416, $I_{COR}$. The substantially symmetric push-pull output stage 489 may include a programmable array of mirrored source current elements 490 and a programmable array of mirrored sink current elements 492 coupled to form a substantially symmetric programmable push-pull output stage 491. Each of the mirrored transistor elements in the programmable array of mirrored source current elements 490 is associated with a corresponding transistor element of the mirrored transistor elements in the programmable array of mirrored sink current elements 492.

The substantially symmetric push-pull output stage 489 may further include mirrored transistor elements configured to form a substantially symmetric $I_{COR}$ current push-pull output stage 493. The substantially symmetric $I_{COR}$ current push-pull output stage 493 may be configured to provide an $I_{COR}$ offset current carrying capacity in the case where the programmable array of mirrored source current elements 490 and the programmable array of mirrored sink current elements 492 are disabled or turned off.

The mirrored source transistor elements of the substantially symmetric push-pull output stage 489 may include a first push-pull output PFET 486, $PFET_A$, a second mirrored PFET 496, $PFET_{A1}$, a third mirrored PFET 498, $PFET_{A2}$, a fourth mirrored PFET 500, $PFET_{A3}$, a fifth mirrored PFET 502, $PFET_{A4}$, a sixth mirrored PFET 504, $PFET_{A5}$, and a seventh mirrored PFET 506, $PFET_{A6}$.

The channel width of each of the first mirrored PFET 494, $PFET_{A0}$, the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, and the sixth mirrored PFET 504, $PFET_{A5}$ are configured such that the current carrying capacity of the first mirrored PFET 494, $PFET_{A0}$, the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, and the sixth mirrored PFET 504, $PFET_{A5}$, are binary weighted. As a result, the current carrying capacity of the second mirrored PFET 496, $PFET_{A1}$, is substantially twice the current carrying capacity of the first mirrored PFET 494, $PFET_{A0}$, the current carrying capacity of the third mirrored PFET 498, $PFET_{A2}$ is substantially twice the current carrying capacity of the second mirrored PFET 496, $PFET_{A1}$, the current carrying capacity of the fourth mirrored PFET 500, $PFET_{A3}$ is substantially twice the current carrying capacity of the third mirrored PFET 498, $PFET_{A2}$, the current carrying capacity of the fifth mirrored PFET 502, $PFET_{A4}$, is substantially twice the current carrying capacity of the fourth mirrored PFET 500, $PFET_{A3}$, and the current carrying capacity of the sixth mirrored PFET 504, $PFET_{A5}$ is substantially twice the current carrying capacity of the fifth mirrored PFET 502, $PFET_{A4}$. The channel width of the seventh mirrored PFET 506, $PFET_{A6}$ is configured relative to the channel width of the first push-pull output PFET 486, $PFET_A$, to provide an $I_{COR}$ offset source current carrying capacity for the substantially symmetric $I_{COR}$ current push-pull output stage 493 of the operational amplifier controlled $I_{COR}$ current circuit 470.

The programmable array of mirrored source current elements 490 may further include a first control mirrored PFET 508, $PFET_{CP0}$, a second control mirrored PFET 510, $PFET_{CP1}$, a third control mirrored PFET 512, $PFET_{CP2}$, a fourth control mirrored PFET 514, $PFET_{CP3}$, a fifth control mirrored PFET 516, $PFET_{CP4}$, and a sixth control mirrored PFET 518, $PFET_{CP5}$. As further depicted in FIG. 32A, the programmable array of mirrored source current elements 490 may be coupled to or further include the $I_{COR}$ source current weight control bus 478, CNTR_CP_BUS (5:0). The $I_{COR}$ source current weight control bus 478, CNTR_CP_BUS (5:0) includes a first control mirrored PFET signal 520, CNTR_CP0, a second control mirrored PFET signal 522, CNTR_CP1, a third control mirrored PFET signal 524, CNTR_CP2, a fourth control mirrored PFET signal 526, CNTR_CP3, a fifth control mirrored PFET signal 528, CNTR_CP4, and a sixth control mirrored PFET signal 530, CNTR_CP5.

The first control mirrored PFET signal 520, CNTR_CP0, the second control mirrored PFET signal 522, CNTR_CP1, the third control mirrored PFET signal 524, CNTR_CP2, the fourth control mirrored PFET signal 526, CNTR_CP3, the fifth control mirrored PFET signal 528, CNTR_CP4, and the sixth control mirrored PFET signal 530, CNTR_CP5 are respectively coupled to and configured so as to control the gate of each of the first control mirrored PFET 508, $PFET_{CP0}$, the second control mirrored PFET 510, $PFET_{CP1}$, the third control mirrored PFET 512, $PFET_{CP2}$, the fourth control mirrored PFET 514, $PFET_{CP3}$, the fifth control mirrored PFET 516, $PFET_{CP4}$, and the sixth control mirrored PFET 518, $PFET_{CP5}$.

Accordingly, as will be described in further detail below, the programmable array of mirrored source current elements 490 includes the first control mirrored PFET 508, $PFET_{CP0}$, the second control mirrored PFET 510, $PFET_{CP1}$, the third control mirrored PFET 512, $PFET_{CP2}$, the fourth control mirrored PFET 514, $PFET_{CP3}$, the fifth control mirrored PFET 516, $PFET_{CP4}$, and the sixth control mirrored PFET 518, $PFET_{CP5}$, that are respectively combined with the first mirrored PFET 494, $PFET_{A0}$, the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, and the sixth mirrored PFET 504, $PFET_{A5}$ in order to form a first programmable mirrored source current element 494A, a second programmable mirrored source current element 496A, a third programmable mirrored source current element 498A, a fourth programmable mirrored source current element 500A, a fifth programmable source current element 502A, and a sixth programmable mirrored source current element 504A.

The programmable array of mirrored source current elements 490 of the substantially symmetric push-pull output stage 489 will now be described. The gate of each of the first mirrored PFET 494, $PFET_{A0}$, the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, the sixth mirrored PFET 504, $PFET_{A5}$, and the seventh mirrored PFET 506, $PFET_{A6}$ are each coupled to the output stage $PFET_A$ control signal 474 such that the each of the first mirrored PFET 494, $PFET_{A0}$, the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, and the sixth mirrored PFET 504, $PFET_{A5}$, and the seventh mirrored PFET 506, $PFET_{A6}$ is current mirrored to the first push-pull output PFET 486, $PFET_A$ of the operational amplifier push-pull output stage circuit 468. As a result, the gate voltage for each of the first mirrored PFET 494, $PFET_{A0}$, the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, and the sixth mirrored PFET 504, $PFET_{A5}$, and the seventh mirrored PFET 506, $PFET_{A6}$ is substantially set equal to the $PFET_A$ control voltage, $V_{PFET\_A\_CNTR}$.

The programmable array of mirrored source current elements 490 includes the first programmable mirrored source current element 494A, the second programmable mirrored source current element 496A, the third programmable mirrored source current element 498A, the fourth programmable mirrored source current element 500A, the fifth programmable mirrored source current element 502A, and the sixth programmable mirrored source current element 504A, where the current carrying capacity of the first programmable mirrored source current element 494A, the second programmable mirrored source current element 496A, the third programmable mirrored source current element 498A, the fourth programmable mirrored source current element 500A, the fifth programmable mirrored source current element 502A, and the sixth programmable mirrored source current element 504A, are substantially binary weighted. The current contribution of each of the first programmable mirrored source current element 494A, the second programmable mirrored source current element 496A, the third programmable mirrored source current element 498A, the fourth programmable mirrored source current element 500A, the fifth programmable mirrored source current element 502A, and the sixth programmable mirrored source current element 504A, to form the high frequency ripple compensation current 416, $I_{COR}$, is governed by the controller 50 via the $I_{COR}$ source current weight control bus 478, CNTR_CP_BUS (5:0).

The first programmable mirrored source current element 494A includes the first mirrored PFET 494, $PFET_{A0}$, and is formed by coupling the source of the first mirrored PFET 494, $PFET_{A0}$, to circuit supply voltage, $V_{DD}$, and the drain of the first mirrored PFET 494, $PFET_{A0}$, to the source of the first control mirrored PFET 508, $PFET_{CP0}$. The drain of the first control mirrored PFET 508, $PFET_{CP0}$, is coupled to the operational amplifier controlled $I_{COR}$ current output 470A. The gate of the first control mirrored PFET 508, $PFET_{CP0}$, is coupled to the first control mirrored PFET signal 520, CNTR_CP0, such that the controller 50 may control the operation state (on/off) of the first programmable mirrored source current element 494A. The second programmable mirrored source current element 496A includes the second mirrored PFET 496, $PFET_{A1}$, and is formed by coupling the source of the second mirrored PFET 496, $PFET_{A1}$, to circuit supply voltage, $V_{DD}$, and the drain of the second mirrored PFET 496, $PFET_{A1}$, to the source of the second control mirrored PFET 510, $PFET_{CP1}$. The drain of the second control mirrored PFET 510, $PFET_{CP1}$, is coupled to the operational amplifier controlled $I_{COR}$ current output 470A. The gate of the second control mirrored PFET 510, $PFET_{CP1}$, is coupled to the second control mirrored PFET signal 522, CNTR_CP1, such that the controller 50 may control the operation state (on/off) of the second programmable mirrored source current element 496A. The third programmable mirrored source current element 498A includes the third mirrored PFET 498, $PFET_{A2}$, and is formed by coupling the source of the third mirrored PFET 498, $PFET_{A2}$, to circuit supply voltage, $V_{DD}$, and the drain of the third mirrored PFET 498, $PFET_{A2}$, to the source of the third control mirrored PFET 512, $PFET_{CP2}$. The drain of the third control mirrored PFET 512, $PFET_{CP2}$, is coupled to the operational amplifier controlled $I_{COR}$ current output 470A. The gate of the third control mirrored PFET 512, $PFET_{CP2}$, is coupled to the third control mirrored PFET signal 524, CNTR_CP2, such that the controller 50 may control the operation state (on/off) of the third programmable mirrored source current element 498A. The fourth programmable mirrored source current element 500A includes the fourth mirrored PFET 500, $PFET_{A3}$, and is formed by coupling the source of the fourth mirrored PFET 500, $PFET_{A3}$, to circuit supply voltage, $V_{DD}$, and the drain of the fourth mirrored PFET 500, $PFET_{A3}$, to the source of the fourth control mirrored PFET 514, $PFET_{CP3}$. The drain of the fourth control mirrored PFET 514, $PFET_{CP3}$, is coupled to the operational amplifier controlled $I_{COR}$ current output 470A. The gate of the fourth control mirrored PFET 514, $PFET_{CP3}$, is coupled to the fourth control mirrored PFET signal 526, CNTR_CP3, such that the controller 50 may control the operation state (on/off) of the fourth programmable mirrored source current element 500A. The fifth programmable mirrored source current element 502A includes the fifth mirrored PFET 502, $PFET_{A4}$, and is formed by coupling the source of the fifth mirrored PFET 502, $PFET_{A4}$, to circuit supply voltage, $V_{DD}$, and the drain of the fifth mirrored PFET 502, $PFET_{A4}$, to the source of the fifth control mirrored PFET 516, $PFET_{CP4}$. The drain of the fifth control mirrored PFET 516, $PFET_{CP4}$, is coupled to the operational amplifier controlled $I_{COR}$ current output 470A. The gate of the fifth control mirrored PFET 516, $PFET_{CP4}$, is coupled to the fifth control mirrored PFET signal 528, CNTR_CP4, such that the controller 50 may control the operation state (on/off) of the fifth programmable mirrored source current element 502A. The sixth programmable mirrored source current element 504A includes the sixth mirrored PFET 504, $PFET_{A5}$, and is formed by coupling the source of the sixth mirrored PFET 504, $PFET_{A5}$, to circuit supply voltage, $V_{DD}$, and the drain of the sixth mirrored PFET 504, $PFET_{A5}$, to the source of the sixth control mirrored PFET 518, $PFET_{CP5}$. The drain of the sixth control mirrored PFET 518, $PFET_{CP5}$, is coupled to the operational amplifier controlled $I_{COR}$ current output 470A. The gate of the sixth control mirrored PFET 518, $PFET_{CP5}$, is coupled to the sixth control mirrored PFET signal 530, CNTR_CP5, such that the controller 50 may control the operation state (on/off) of the sixth programmable mirrored source current element 504A.

Similar to the programmable array of mirrored source current elements 490, the programmable array of mirrored sink current elements 492 of the mirrored sink transistor elements of the substantially symmetric push-pull output stage 489 may include a first mirrored NFET 532, $NFET_{A0}$, a second mirrored NFET 534, $NFET_{A1}$, a third mirrored NFET 536, $NFET_{A2}$, a fourth mirrored NFET 538, $NFET_{A3}$, a fifth mirrored NFET 540, $NFET_{A4}$, a sixth mirrored NFET 542, $NFET_{A5}$, and a seventh mirrored NFET 543, $NFET_{A6}$.

The channel width of each of the first mirrored NFET 532, $NFET_{A0}$, the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, and the sixth mirrored NFET 542, $NFET_{A5}$ are binary weighted or configured such that current carrying capacity of the second mirrored NFET 534, $NFET_{A1}$, is substantially twice the current carrying capacity of the first mirrored NFET 532, $NFET_{A0}$, the current carrying capacity of the third mirrored NFET 536, $NFET_{A2}$ is substantially twice the current carrying capacity of the second mirrored NFET 534, $NFET_{A1}$, the current carrying capacity of the fourth mirrored NFET 538, $NFET_{A3}$ is substantially twice the current carrying capacity of the third mirrored NFET 536, $NFET_{A2}$, the current carrying capacity of the fifth mirrored NFET 540, $NFET_{A4}$, is substantially twice the current carrying capacity of the fourth mirrored NFET 538, $NFET_{A3}$, and the current carrying capacity of the sixth mirrored NFET 542, $NFET_{A5}$ is substantially twice the current carrying capacity of the fifth mirrored NFET 540, $NFET_{A4}$. The channel width of the seventh mirrored NFET 543, $NFET_{A6}$ is configured relative to the channel width of the first push-pull output NFET 488, $NFET_{A}$, to provide an $I_{COR}$ offset sink current carrying capacity for the substantially symmetric $I_{COR}$ current push-pull output stage 493 of the operational amplifier controlled $I_{COR}$ current circuit 470.

Furthermore, the channel width of each of the first mirrored NFET 532, $NFET_{A0}$, the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, the sixth mirrored NFET 542, $NFET_{A5}$, and the seventh mirrored NFET 543, $NFET_{A6}$, is configured such that the current carrying capacity of each of the first mirrored NFET 532, $NFET_{A0}$, the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, the sixth mirrored NFET 542, $NFET_{A5}$, and the seventh mirrored NFET 543, $NFET_{A6}$, substantially matches the respective current carrying capacity of the first mirrored PFET 494, $PFET_{A0}$, the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, the sixth mirrored PFET 504, $PFET_{A5}$ and the seventh mirrored PFET 506, $PFET_{A6}$.

Accordingly, the respective channel widths of the first mirrored PFET 494, $PFET_{A0}$, and the first mirrored NFET 532, $NFET_{A0}$, are configured such that the current sourcing capacity of the first mirrored PFET 494, $PFET_{A0}$, is substantially matched to the current sinking capacity of the first mirrored NFET 532, $NFET_{A0}$. The respective channel widths of the second mirrored PFET 496, $PFET_{A1}$, and the second mirrored NFET 534, $NFET_{A1}$, are configured such that the current sourcing capacity of the second mirrored PFET 496, $PFET_{A1}$, is substantially matched to the current sinking capacity of the second mirrored NFET 534, $NFET_{A1}$. The respective channel widths of the third mirrored PFET 498, $PFET_{A2}$, and the third mirrored NFET 536, $NFET_{A2}$, are configured such that the current sourcing capacity of the third mirrored PFET 498, $PFET_{A2}$, is substantially matched to the current sinking capacity of the third mirrored NFET 536, $NFET_{A2}$. The respective channel widths of the fourth mirrored PFET 500, $PFET_{A3}$, and the fourth mirrored NFET 538, $NFET_{A3}$, are configured such that the current sourcing capacity of the fourth mirrored PFET 500, $PFET_{A3}$, is substantially matched to the current sinking capacity of the fourth mirrored NFET 538, $NFET_{A3}$. The respective channel widths of the fifth mirrored PFET 502, $PFET_{A4}$, and the fifth mirrored NFET 540, $NFET_{A4}$, are configured such that the current sourcing capacity of the fifth mirrored PFET 502, $PFET_{A4}$, is substantially matched to the current sinking capacity of the fifth mirrored NFET 540, $NFET_{A4}$. The respective channel widths of the sixth mirrored PFET 504, $PFET_{A5}$, and the sixth mirrored NFET 542, $NFET_{A5}$, are configured such that the current sourcing capacity of the sixth mirrored PFET 504, $PFET_{A5}$, is substantially matched to the current sinking capacity of the sixth mirrored NFET 542, $NFET_{A5}$. And, the respective channel widths of the seventh mirrored PFET 506, $PFET_{A6}$, and the seventh mirrored NFET 543, $NFET_{A6}$, are configured such that the current sourcing capacity of the seventh mirrored PFET 506, $PFET_{A6}$, is substantially matched to the current sinking capacity of the seventh mirrored NFET 543, $NFET_{A6}$.

The programmable array of mirrored sink current elements 492 may further include a first control mirrored NFET 544, $NFET_{CN0}$, a second control mirrored NFET 546, $NFET_{CN1}$, a third control mirrored NFET 548, $NFET_{CN2}$, a fourth control mirrored NFET 550, $NFET_{CN3}$, a fifth control mirrored NFET 552, $NFET_{CN4}$, and a sixth control mirrored NFET 554, $NFET_{CN5}$. As further depicted in FIG. 32A, the programmable array of mirrored sink current elements 492 may further include or be coupled to the $I_{COR}$ sink current weight control bus 480, CNTR_CN_BUS (5:0). The $I_{COR}$ sink current weight control bus 480, CNTR_CN_BUS (5:0) includes a first control mirrored NFET signal 556, CNTR_CN0, a second control mirrored NFET signal 558, CNTR_CN1, a third control mirrored NFET signal 560, CNTR_CN2, a fourth control mirrored NFET signal 562, CNTR_CN3, a fifth control mirrored NFET signal 564, CNTR_CN4, and a sixth control mirrored NFET signal 566, CNTR_CN5.

The first control mirrored NFET signal 556, CNTR_CN0, the second control mirrored NFET signal 558, CNTR_CN1, the third control mirrored NFET signal 560, CNTR_CN2, the fourth control mirrored NFET signal 562, CNTR_CN3, the fifth control mirrored NFET signal 564, CNTR_CN4, and the sixth control mirrored NFET signal 566, CNTR_CN5 are respectively coupled to and configured so as to control the gate of each of the first control mirrored NFET 544, $NFET_{CN0}$, the second control mirrored NFET 546, $NFET_{CN1}$, the third control mirrored NFET 548, $NFET_{CN2}$, the fourth control mirrored NFET 550, $NFET_{CN3}$, the fifth control mirrored NFET 552, $NFET_{CN4}$, and the sixth control mirrored NFET 554, $NFET_{CN5}$.

Accordingly, as will be described in further detail below, the programmable array of mirrored sink current elements 492 includes the first control mirrored NFET 544, $NFET_{CN0}$, a second control mirrored NFET 546, $NFET_{CN1}$, a third control mirrored NFET 548, $NFET_{CN2}$, a fourth control mirrored NFET 550, $NFET_{CN3}$, a fifth control mirrored NFET 552, $NFET_{CN4}$, and a sixth control mirrored NFET 554, $NFET_{CN5}$, that are respectively combined with the first mirrored NFET 532, $NFET_{A0}$, the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, and the sixth mirrored NFET 542, $NFET_{A5}$ in order to form a first programmable mirrored sink current element 532A, a second programmable mirrored sink current element 534A, a third programmable mirrored sink current element 536A, a fourth programmable mirrored sink current element 538A, a fifth programmable mirrored sink current element 540A, and a sixth programmable mirrored sink current element 542A.

The programmable array of mirrored sink current elements 492 of the substantially symmetric push-pull output stage 489 will now be described. The gate of each of the first mirrored NFET 532, $NFET_{A0}$, the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, the sixth mirrored NFET 542, $NFET_{A5}$, and the seventh mirrored NFET 543, $NFET_{A6}$ are each coupled to the output stage $NFET_A$ control signal 476 such that the each of the first mirrored NFET 532, $NFET_{A0}$, the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, the sixth mirrored NFET 542, $NFET_{A5}$, and the seventh mirrored NFET 543, $NFET_{A6}$ is current mirrored to the first push-pull output NFET 488, $NFET_A$, of the operational amplifier push-pull output stage circuit 468. As a result, the gate voltage for each of the first mirrored NFET 532, $NFET_{A0}$, the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, the sixth mirrored NFET 542, $NFET_{A5}$, and the seventh mirrored NFET 543, $NFET_{A6}$ is substantially set equal to the $NFET_A$ control voltage, $V_{NFET\_A\_CNTR}$.

The programmable array of mirrored sink current elements 492 includes the first programmable mirrored sink current element 532A, the second programmable mirrored sink current element 534A, the third programmable mirrored sink current element 536A, the fourth programmable mirrored sink current element 538A, the fifth programmable mirrored sink current element 540A, and the sixth programmable mirrored sink current element 542A, where the current carrying capacity of the first programmable mirrored sink current element 532A, the second programmable mirrored sink current element 534A, the third programmable mirrored sink current element 536A, the fourth programmable mirrored sink current element 538A, the fifth programmable mirrored sink current element 540A, and the sixth programmable mirrored sink current element 542A are substantially binary weighted.

The current contribution of each of the first programmable mirrored sink current element 532A, the second programmable mirrored sink current element 534A, the third programmable mirrored sink current element 536A, the fourth programmable mirrored sink current element 538A, the fifth programmable mirrored sink current element 540A, and the sixth programmable mirrored sink current element 542A to form the high frequency ripple compensation current 416, $I_{COR}$, is governed by the controller 50 via the $I_{COR}$ sink current weight control bus 480, CNTR_CN_BUS (5:0).

The first programmable mirrored sink current element 532A includes the first mirrored NFET 532, $NFET_{A0}$, and is formed by coupling the source of the first mirrored NFET 532, $NFET_{A0}$, to ground and the drain of the first mirrored NFET 532, $NFET_{A0}$, to the source of the first control mirrored NFET 544, NFET-$_{CN0}$. The drain of the first control mirrored NFET 544, $NFET_{CN0}$, is coupled to the operational amplifier controlled $I_{COR}$ current output 470A. The gate of the first control mirrored NFET 544, $NFET_{CN0}$, is coupled to the first control mirrored NFET signal 556, CNTR_CN0, such that the controller 50 may control the operation state (on/off) of the first programmable mirrored sink current element 532A. The second programmable mirrored sink current element 534A includes the second mirrored NFET 534, $NFET_{A1}$, and is formed by coupling the source of the second mirrored NFET 534, $NFET_{A1}$, to ground, and the drain of the second mirrored NFET 534, $NFET_{A1}$, to the source of the second control mirrored NFET 546, $NFET_{CN1}$. The drain of the second control mirrored NFET 546, $NFET_{CN1}$, is coupled to the operational amplifier controlled $I_{COR}$ current output 470A. The gate of the second control mirrored NFET 546, $NFET_{CN1}$, is coupled to the second control mirrored NFET signal 558, CNTR_CN1, such that the controller 50 may control the operation state (on/off) of the second programmable mirrored sink current element 534A. The third programmable mirrored sink current element 536A includes the third mirrored NFET 536, $NFET_{A2}$, and is formed by coupling the source of the third mirrored NFET 536, $NFET_{A2}$, to ground, and the drain of the third mirrored NFET 536, $NFET_{A2}$, to the source of the third control mirrored NFET 548, $NFET_{CN2}$. The drain of the third control mirrored NFET 548, $NFET_{CN2}$, is coupled to the operational amplifier controlled $I_{COR}$ current output 470A. The gate of the third control mirrored NFET 548, $NFET_{CN2}$, is coupled to the third control mirrored NFET signal 560, CNTR_CN2, such that the controller 50 may control the operation state (on/off) of the third programmable mirrored sink current element 536A. The fourth programmable mirrored sink current element 538A includes the fourth mirrored NFET 538, $NFET_{A3}$, and is formed by coupling the source of the fourth mirrored NFET 538, $NFET_{A3}$, to ground, and the drain of the fourth mirrored NFET 538, $NFET_{A3}$, to the source of the fourth control mirrored NFET 550, $NFET_{CN3}$. The drain of the fourth control mirrored NFET 550, $NFET_{CN3}$ is coupled to the operational amplifier controlled $I_{COR}$ current output 470A. The gate of the fourth control mirrored NFET 550, $NFET_{CN3}$, is coupled to the fourth control mirrored NFET signal 562, CNTR_CN3, such that the controller 50 may control the operation state (on/off) of the fourth programmable mirrored sink current element 538A. The fifth programmable mirrored sink current element 540A includes the fifth mirrored NFET 540, $NFET_{A4}$, and is formed by coupling the source of the fifth mirrored NFET 540, $NFET_{A4}$, to ground, and the drain of the first mirrored NFET 540, $NFET_{A4}$, to the source of the fifth control mirrored NFET 552, $NFET_{CN4}$. The drain of the fifth control mirrored NFET 552, $NFET_{CN4}$ is coupled to the operational amplifier controlled $I_{COR}$ current output 470A. The gate of the first control mirrored NFET 552, $NFET_{CN4}$, is coupled to the fifth control mirrored NFET signal 564, CNTR_CN4, such that the controller 50 may control the operation state (on/off) of the first programmable mirrored sink current element 540A. The sixth programmable mirrored sink current element 542A includes the sixth mirrored NFET 542, $NFET_{A5}$, and is formed by coupling the source of the sixth mirrored NFET 542, $NFET_{A5}$, to ground, and the drain of the sixth mirrored NFET 542, $NFET_{A5}$, to the source of the sixth control mirrored NFET 554, $NFET_{CN5}$. The drain of the sixth control mirrored NFET 554, $NFET_{CN5}$ is coupled to the operational amplifier controlled $I_{COR}$ current output 470A. The gate of the sixth control mirrored NFET 554, $NFET_{CN5}$, is coupled to the sixth control mirrored NFET signal 566, CNTR_CN5, such that the controller 50 may control the operation state (on/off) of the sixth programmable mirrored sink current element 542A.

The substantially symmetric $I_{COR}$ current push-pull output stage 493 may include the seventh mirrored PFET 506, $PFET_{A6}$, and the seventh mirrored NFET 543, $NFET_{A6}$. As described above, the respective channel widths of the seventh mirrored PFET 506, $PFET_{A6}$, and the seventh mirrored NFET 543, $NFET_{A6}$, are configured such that the current sourcing capacity of the seventh mirrored PFET 506, $PFET_{A6}$, is substantially matched to the current sinking capacity of the seventh mirrored NFET 543, $NFET_{A6}$. As a result, the substantially symmetric $I_{COR}$ current push-pull output stage 493 may provide an $I_{COR}$ offset current carrying capacity when the programmable array of mirrored source current elements 490 and the programmable array of mirrored sink current elements 492 are disabled or turned off. Because the channel widths of the seventh mirrored PFET 506, $PFET_{A6}$ and the seventh mirrored NFET 543, $NFET_{A6}$, are configured such that the current carry capacity of the seventh mirrored PFET 506, $PFET_{A6}$, matches the seventh mirrored NFET 543, $NFET_{A6}$, the $I_{COR}$ offset current carrying capacity is governed by the ratio of the channel width of the seventh mirrored PFET 506, $PFET_{A6}$, to the first push-pull output PFET 486, $PFET_{A}$, and the ratio of the channel width of the seventh mirrored NFET 543, $NFET_{A6}$, to the first push-pull output NFET 488, $NFET_{A}$, To maintain symmetric operation of the substantially symmetric $I_{COR}$ current push-pull output stage 493, the controller 50 controls the $I_{COR}$ source current weight control bus 478, CNTR_CP_BUS (5:0), and the $I_{COR}$ sink current weight control bus 480, CNTR_CN_BUS (5:0), such that the operational state of the first programmable mirrored source current element 494A follows the operational state of the corresponding first programmable mirrored sink current element 532A, the operational state of the second programmable mirrored source current element 496A follows the operational state of the corresponding second programmable mirrored sink current element 534A, the operational state of the third programmable mirrored source current element 498A follows the operational state of the corresponding third programmable mirrored sink current element 536A, the operational state of the fourth programmable mirrored source current element 500A follows the operational state of the corresponding fourth programmable mirrored sink current element 538A, the operational state of the fifth programmable mirrored source current element 502A follows the operational state of the corresponding fifth programmable mirrored sink current element 540A, and the operational state of the sixth programmable mirrored source current element 504A follows the operational state of the corresponding sixth programmable mirrored sink current element 542A.

In the case where the controller 50 configures the $I_{COR}$ source current weight control bus 478, CNTR_CP_BUS (5:0), and the $I_{COR}$ sink current weight control bus 480, CNTR_CN_BUS (5:0), to turn off the first programmable mirrored source current element 494A, the second programmable mirrored source current element 496A, the third programmable mirrored source current element 498A, the fourth programmable mirrored source current element 500A, the fifth programmable mirrored source current element 502A, the sixth programmable mirrored source current element 504A, the first programmable mirrored sink current element 532A, the second programmable mirrored sink current element 534A, the third programmable mirrored sink current element 536A, the fourth programmable mirrored sink current element 538A, the fifth programmable mirrored sink current element 540A, and the sixth programmable mirrored sink current element 542A. The substantially symmetric $I_{COR}$ current push-pull output stage 493 provides the $I_{COR}$ offset current capacity as the output of the substantially symmetric push-pull output stage 489 of the operational amplifier controlled $I_{COR}$ current circuit 470.

The programmable $I_{COR}$ transconductance, $Gm_{ICOR}$, of the operational amplifier controlled $I_{COR}$ current circuit 470 may now be described. For the sake of simplicity of the description, and not by way of limitation, the first push-pull output PFET 486, $PFET_A$, and the first push-pull output NFET 488, $NFET_A$, of the operational amplifier push-pull output stage circuit 468 are used as a reference transistor such that the characteristics of the first mirrored PFET 494, $PFET_{A0}$, are similar to the characteristics of the first push-pull output PFET 486, $PFET_A$, and the characteristics of the first mirrored NFET 532, $NFET_{A0}$, are similar to the characteristics of the first push-pull output NFET 488, $NFET_A$. As previously discussed, the relative channel widths of the first push-pull output PFET 486, $PFET_A$, and the first push-pull output NFET 488, $NFET_A$, to the channel widths of the first mirrored PFET 494, $PFET_{A0}$, and the first mirrored NFET 532, $NFET_{A0}$, may be configured to obtain a desired proportionality between the high frequency ripple compensation current 416, $I_{COR}$, to the operational amplifier output current, $I_{AMP}$.

Figure 32C:
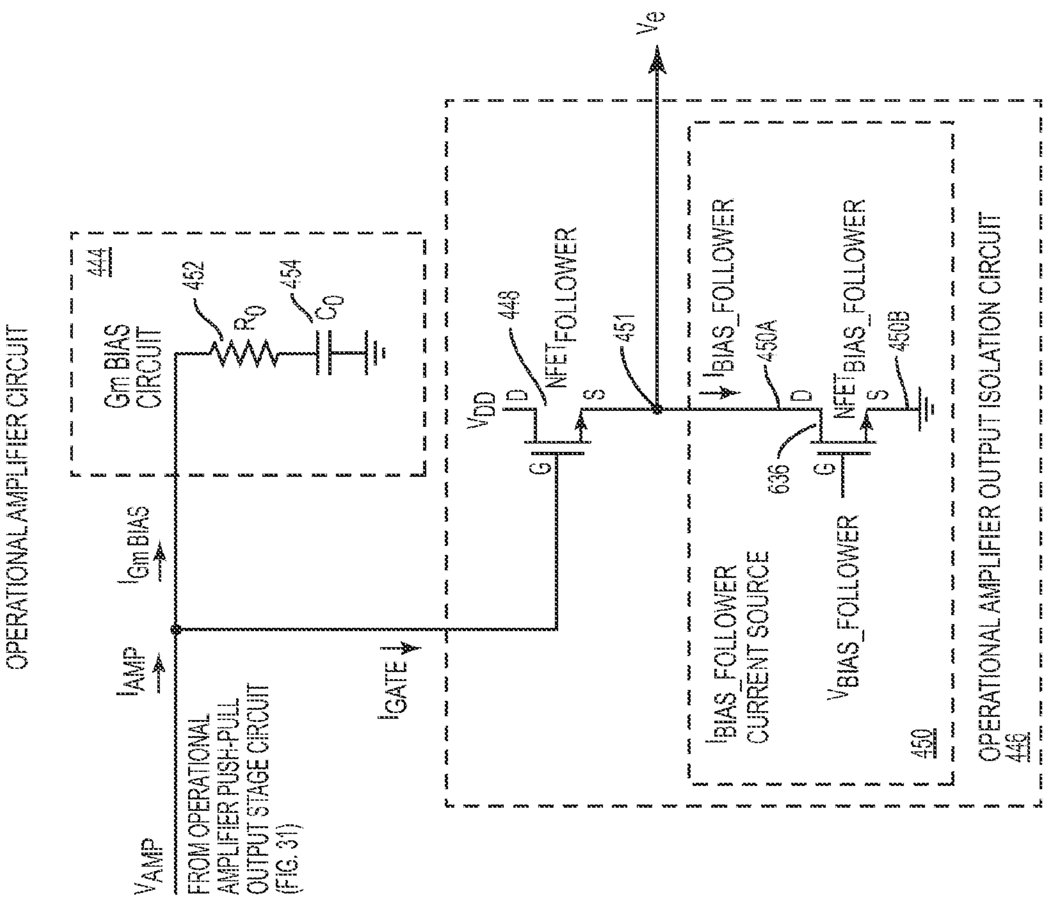
FIG. 32C depicts an example embodiment of the Gm bias circuit and operational amplifier isolation circuit of the embodiment of the operational amplifier circuitry.
Figure 33:
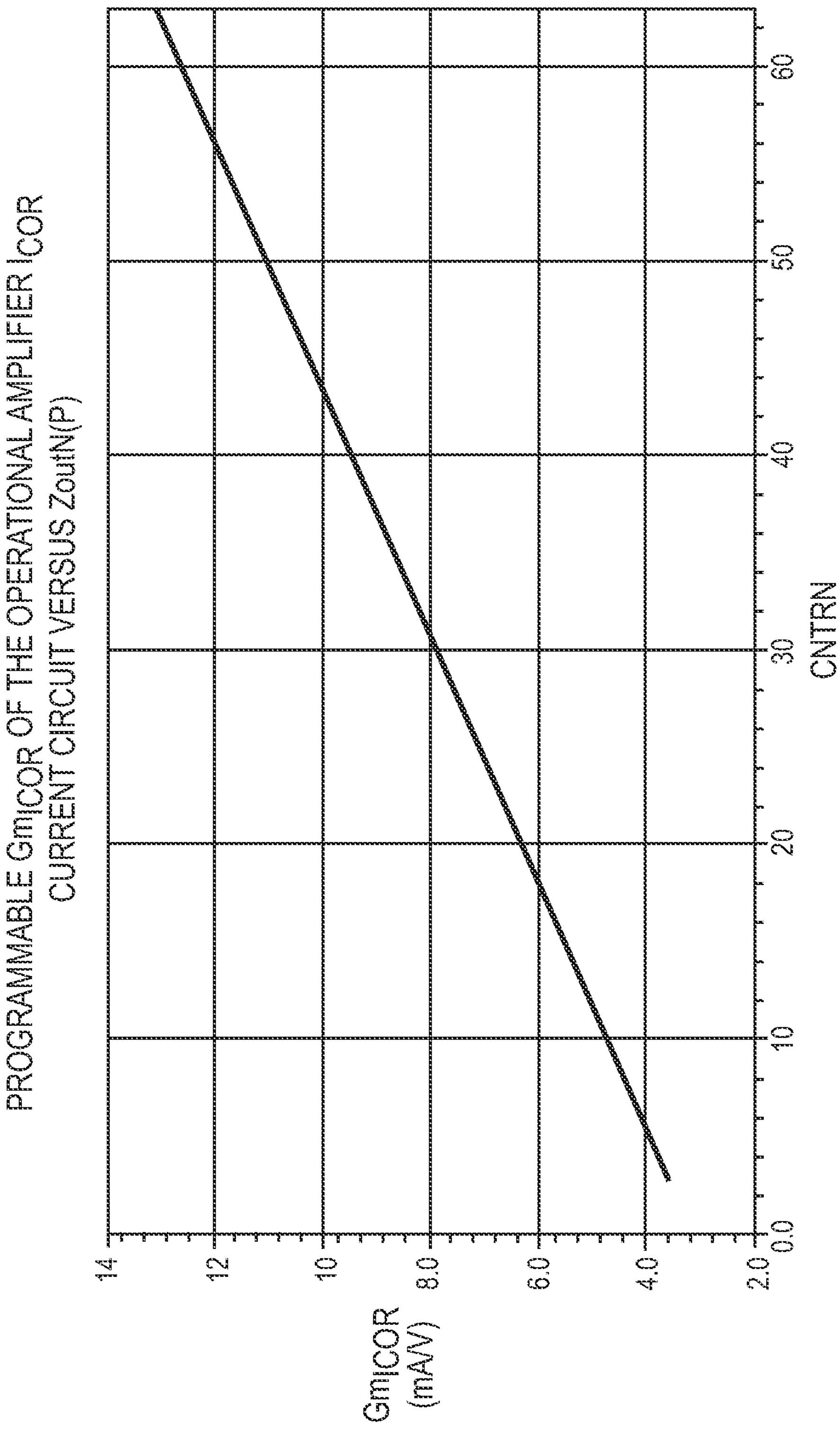
FIG. 33 depicts a graphical representation of the programmable transconductance (Gm) output current function of an example embodiment of the operational amplifier controlled $I_{COR}$ current circuit.

The individual control signals of the $I_{COR}$ source current weight control bus 478, CNTR_CP_BUS (5:0), and the $I_{COR}$ sink current weight control bus 480, CNTR_CN_BUS (5:0), may be characterized as corresponding to a six bit programmable control word CNTRN, where the least significant bit corresponds to the state of the CNTR_CP0 and CNTR_CN0, and the most significant bit corresponds to the state of CNTR_CP5 and CNTR_CN5. As a result, the programmable control word CNTRN may be characterized as having the binary weighted values of between 0 and 63. Thus, the six bit programmable control word may be characterized as the function CNTRN=P, such that 0≤P≤63. Thus, the programmable $I_{COR}$ transconductance, $Gm_{ICOR}$, of the operational amplifier controlled $I_{COR}$ current circuit 470 may be characterized by equation (10) as follows:

$$Gm_{ICOR}(P) = \frac{(P + P_{OFFSET})}{R_0} \qquad (10)$$

where $P_{OFFSET}$ reflects the contribution of the substantially symmetric $I_{COR}$ current push-pull output stage 493. FIG. 33 depicts the programmable $I_{COR}$ transconductance $Gm_{ICOR}$ of the operational amplifier controlled $I_{COR}$ current circuit 470 versus the value (P) of the programmable control word, CNTRN. In some embodiments, the channel width ratio of the seventh mirrored PFET 506, $PFET_{A6}$ to the channel width of the seventh mirrored NFET 543, $NFET_{A6}$ may be configured such that $P_{OFFSET}$ has a minimum value of around 20. In the case where $P_{OFFSET}=20$, the minimum programmable $I_{COR}$ transconductance $Gm_{ICOR\_MIN}=20/R_0$, where $R_0$ is the bias resistance of the bias resistor 452 of the Gm bias circuit 444, depicted in FIG. 32C.

Furthermore, relative channel widths of the first mirrored PFET 494, $PFET_{A0}$, the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, the sixth mirrored PFET 504, $PFET_{A5}$, and the seventh mirrored PFET 506, $PFET_{A6}$, to the channel width of the first push-pull output PFET 486, $PFET_A$, and the relative channel widths of first mirrored NFET 532, $NFET_{A0}$, the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, the sixth mirrored NFET 542, $NFET_{A5}$, and the seventh mirrored NFET 543, $NFET_{A6}$, to the first push-pull output NFET 488, $NFET_A$, may be adjusted such that the operational amplifier output current, $I_{AMP}$, is proportional to the high frequency ripple compensation current 416, $I_{COR}$. It will be appreciated that when the operational amplifier controlled $I_{COR}$ current circuit 470 is configured to have the minimum programmable $I_{COR}$ transconductance $Gm_{ICOR\_MIN}$, the high frequency ripple compensation current 416, $I_{COR}$, is sourced only by the substantially symmetric $I_{COR}$ current push-pull output stage 493.

Typically, the ratio of the channel width of the first push-pull output PFET 486, $PFET_A$, to the channel width of the first mirrored PFET 494, $PFET_{A0}$, and the ratio of the channel width of the first push-pull output NFET 488, $NFET_A$, to the channel width of the first mirrored NFET 532, $NFET_{A0}$, is approximately set to one. However, in some embodiments, the ratio of the channel width of the first push-pull output PFET 486, $PFET_A$, to the channel width of the first mirrored PFET 494, $PFET_{A0}$, and the ratio of the channel width of the first push-pull output NFET 488, $NFET_A$, to the channel width of the first mirrored NFET 532, $NFET_{A0}$, may be greater than one or less than one. For example, in the case where the ratio of the channel width of the first push-pull output PFET 486, $PFET_A$, to the channel width of the first mirrored PFET 494, $PFET_{A0}$, and the ratio of the channel width of the first push-pull output NFET 488, $NFET_A$, to the channel width of the first mirrored NFET 532, $NFET_{A0}$, is less than one, the bias resistance, $R_0$, of the bias resistor 452, depicted in FIG. 32C, may be increased to obtain the same value of the programmable $I_{COR}$ transconductance, $Gm_{ICOR}$, of the operational amplifier controlled $I_{COR}$ current circuit 470, depicted in FIG. 32A, and reduce the Gm bias current, $I_{Gm\_BIAS}$. However, this may reduce the operational bandwidth of the operational amplifier 442.

FIG. 33 depicts a graphical representation of the programmable $I_{COR}$ transconductance, $Gm_{ICOR}$, of the operational amplifier controlled $I_{COR}$ current circuit 470 provided at the operational amplifier controlled $I_{COR}$ current output 470A as a function of the six bit programmable control word, CNTRN, formed by the bits of the $I_{COR}$ source current weight control bus 478, CNTR_CP_BUS (5:0), and the $I_{COR}$ sink current weight control bus 480, CNTR_CN_BUS (5:0). The programmable control word, CNTRN, may be characterized as having the binary weighted values equal to "P" such that 0≤P≤63. As depicted in FIG. 33, the programmable $I_{COR}$ transconductance, $Gm_{ICOR}$, is substantially linear with respect to "P" for 0≤P≤63. The minimum programmable $I_{COR}$ transconductance $Gm_{ICOR\_MIN}$, corresponds to the value of $Gm_{ICOR}(0)$. In other words, the programmable $I_{COR}$ transconductance, $Gm_{ICOR}$, of the operational amplifier controlled $I_{COR}$ current circuit 470 may be configured to provide 64 transconductance values.

Figure 32B:
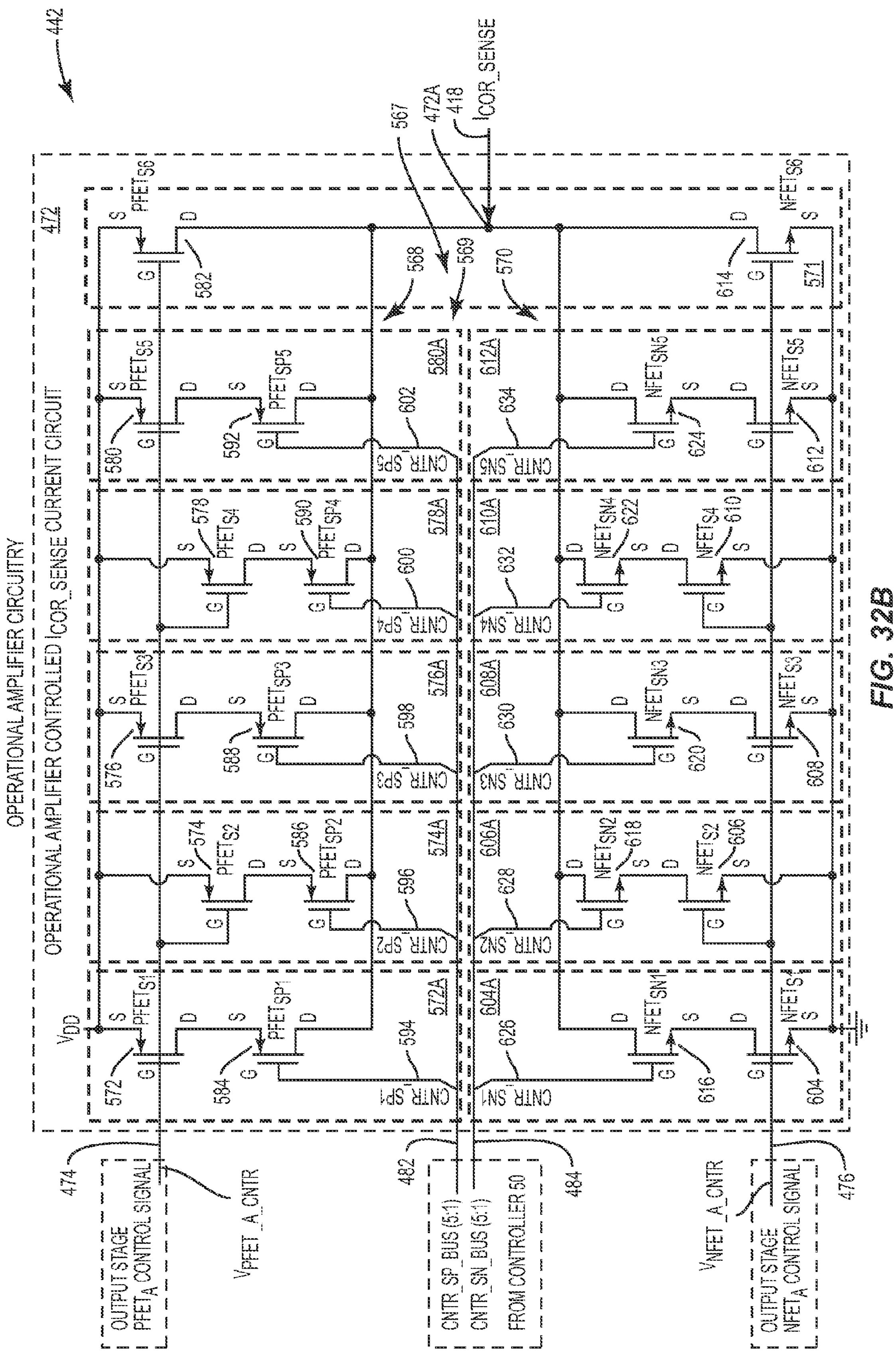
FIG. 32B depicts an example embodiment of the operational amplifier controlled $I_{COR\_SENSE}$ current circuit of an operational amplifier.

The embodiment of the operational amplifier controlled $I_{COR\_SENSE}$ current circuit 472, depicted in FIG. 32B, is similar in form and function to the embodiment of the operational amplifier controlled $I_{COR}$ current circuit 470 depicted in FIG. 32A. Similar to the operational amplifier controlled $I_{COR}$ current circuit 470, the operational amplifier controlled $I_{COR\_SENSE}$ current circuit 472 may be configured as an array of mirrored transistor element arranged to form a substantially symmetric push-pull output stage 567 for providing the scaled high frequency ripple compensation current estimate 418, $I_{COR\_SENSE}$. The substantially symmetric push-pull output stage 567 may include a programmable array of mirrored sense source current elements 568 and a programmable array of mirrored sense sink current elements 570 coupled to form a substantially symmetric programmable $I_{COR\_SENSES}$ push-pull output stage 569. Each of the mirrored transistor elements in the programmable array of mirrored sense source current elements 568 is associated with a corresponding transistor element of the mirrored transistor elements in the programmable array of mirrored sense sink current elements 570.

The substantially symmetric programmable $I_{COR\_SENSES}$ push-pull output stage 569 may further include mirrored transistor elements configured to form a substantially symmetric $I_{COR\_SENSE}$ current push-pull output stage 571. The substantially symmetric $I_{COR\_SENSE}$ current push-pull output stage 571 may be configured to provide an $I_{COR\_SENSE}$ offset current carrying capacity in the case when the programmable array of mirrored sense source current elements 568 and the programmable array of mirrored sense sink current elements 570 are disabled or turned off. Accordingly, the substantially symmetric $I_{COR\_SENSE}$ current push-pull output stage 571 complements the operation of the substantially symmetric $I_{COR}$ current push-pull output stage 493. Accordingly, as will be described, the minimum $I_{COR\_SENSE}$ transconductance, $Gm_{ICOR\_SENSE\_MIN}$ of the operational amplifier controlled $I_{COR\_SENSE}$ current circuit 472 is scaled by the sense scaling factor, $C_{SENSE\_SCALING}$, such that $Gm_{ICOR\_SENSE\_MIN}=Gm_{ICOR\_MIN}\times C_{SENSE\_SCALING}$.

However, by way of example and not by limitation, unlike the substantially symmetric programmable push-pull output stage 491 of the operational amplifier controlled $I_{COR}$ current circuit 470, depicted in FIG. 32A, which includes six programmable sense mirrored source current elements and six programmable sense mirrored sink current elements, as will be described, the embodiment of the substantially symmetric programmable $I_{COR\_SENSES}$ push-pull output stage 569 of the operational amplifier controlled $I_{COR\_SENSE}$ current circuit 472, depicted in FIG. 32B, includes five programmable sense mirrored source current elements and five corresponding programmable sense mirrored sink current elements. In addition, the channel widths of the sense mirrored transistor element of the operational amplifier controlled $I_{COR\_SENSE}$ current circuit 472 may be scaled by the sense scaling factor, $C_{SENSE\_SCALING}$, such that the scaled high frequency ripple compensation current estimate 418, $I_{COR\_SENSE}$, generated by the operational amplifier controlled $I_{COR\_SENSE}$ current circuit 472, is a fractional representation of the high frequency ripple compensation current 416, $I_{COR}$, generated by the operational amplifier controlled $I_{COR}$ current circuit 470. For example, in some embodiments of the operational amplifier controlled $I_{COR\_SENSE}$ current circuit 472, the sense scaling factor, $C_{SENSE\_SCALING}$, is 1/20. In other words, the magnitude of the high frequency ripple compensation current 416, $I_{COR}$, is substantially linearly related to the scaled high frequency ripple compensation current estimate 418, $I_{COR\_SENSE}$, by the sense scaling factor, $C_{SENSE\_SCALING}$, such that $I_{COR}=I_{COR\_SENSE}\times C_{SENSE\_SCALING}$.

In addition, as described above, in some embodiments of the operational amplifier controlled $I_{COR\_SENSE}$ current circuit 472, the programmable array of mirrored sense source current elements 568 and the programmable array of mirrored sense sink current elements 570 may each have fewer mirrored transistor elements than the programmable array of mirrored source current elements 490 and the programmable array of mirrored sink current elements 492 of the operational amplifier controlled $I_{COR}$ current circuit 470. For example, because the embodiment of the operational amplifier controlled $I_{COR\_SENSE}$ current circuit 472, depicted in FIG. 32B, only includes five programmable sense mirrored source current elements and five corresponding programmable sense mirrored sink current elements, changes in the magnitude of the current of the high frequency ripple compensation current 416, $I_{COR}$, due to the operation of the first programmable mirrored source current element 494A and the first programmable mirrored sink current element 532A are not represented by a corresponding change in the magnitude of current of the scaled high frequency ripple compensation current estimate 418, $I_{COR\_SENSE}$.

The substantially symmetric push-pull output stage 567 may include a first sense mirrored PFET 572, $PFET_{S1}$, a second sense mirrored PFET 574, $PFET_{S2}$, a third sense mirrored PFET 576, $PFET_{S3}$, a fourth sense mirrored PFET 578, $PFET_{S4}$, a fifth sense mirrored PFET 580, $PFET_{S5}$, and a sixth sense mirrored PFET 582, $PFET_{S6}$. The respective channel widths of each of the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, and the fifth sense mirrored PFET 580, $PFET_{S5}$, may be configured such that the current carrying capacity of each one of the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, and the fifth sense mirrored PFET 580, $PFET_{S5}$, is fractionally related to the current carrying capacity of the second mirrored PFET 496, $PFET_{A1}$, the third mirrored PFET 498, $PFET_{A2}$, the fourth mirrored PFET 500, $PFET_{A3}$, the fifth mirrored PFET 502, $PFET_{A4}$, and the sixth mirrored PFET 504, $PFET_{A5}$, of the operational amplifier controlled $I_{COR}$ current circuit 470, respectively, by the sense scaling factor, $C_{SENSE\_SCALING}$. In other words, the channel widths of the transistor elements of the programmable array of mirrored sense source current elements 568 of the operational amplifier controlled $I_{COR\_SENSE}$ current circuit 472 are configured such that the current providing capacity of the programmable array of mirrored sense source current elements 568 is fractionally related to the current providing capacity of the programmable array of mirrored source current elements 490 of the operational amplifier controlled $I_{COR}$ current circuit 470. As an example, the channel width of the first sense mirrored PFET 572, $PFET_{S1}$, may be substantially related to the channel width of the second mirrored PFET 496, $PFET_{A1}$, as a function of the sense scaling factor, $C_{SENSE\_SCALING}$. The channel width of the second sense mirrored PFET 574, $PFET_{S2}$, may be substantially related to the channel widths of the third mirrored PFET 498, $PFET_{A2}$, as a function of the sense scaling factor, $C_{SENSE\_SCALING}$. The channel width of the third sense mirrored PFET 576, $PFET_{S3}$, may be substantially related to the channel width of the fourth mirrored PFET 500, $PFET_{A3}$, as a function of the sense scaling factor, $C_{SENSE\_SCALING}$. The channel width of the fourth sense mirrored PFET 578, $PFET_{S4}$, may be substantially related to the channel width of the fifth mirrored PFET 502, $PFET_{A4}$, as a function of the sense scaling factor, $C_{SENSE\_SCALING}$. The channel width of the fifth sense mirrored PFET 580, $PFET_{S5}$, may be substantially related to the channel width of the sixth mirrored PFET 504, $PFET_{A5}$, as a function of the sense scaling factor, $C_{SENSE\_SCALING}$. As a result, the current carrying capacity of the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, the fifth sense mirrored PFET 580, $PFET_{S5}$, are also configured to be substantially binary weighted. For example, the channel width of the mirrored source transistor elements of the programmable array of mirrored sense source current elements 568 may be configured such that the current carrying capacity of the second sense mirrored PFET 574, $PFET_{S2}$, is substantially twice the current carrying capacity of the first sense mirrored PFET 572, $PFET_{S1}$, the current carrying capacity of the third sense mirrored PFET 576, $PFET_{S3}$ is substantially twice the current carrying capacity of the second sense mirrored PFET 574, $PFET_{S2}$, the current carrying capacity of the fourth sense mirrored PFET 578, $PFET_{S4}$ is substantially twice the current carrying capacity of the third sense mirrored PFET 576, $PFET_{S3}$, and the current carrying capacity of the fifth sense mirrored PFET 580, $PFET_{S5}$, is substantially twice the current carrying capacity of the fourth sense mirrored PFET 578, $PFET_{S4}$. As a result, the current carrying capacities of the transistor elements of the programmable array of mirrored sense source current elements 568 may be substantially related to the corresponding transistor elements of the programmable array of mirrored source current elements 490 of the operational amplifier controlled $I_{COR}$ current circuit 470 by the sense scaling factor, $C_{SENSE\_SCALING}$, in order to maintain the fractional relationship of the scaled high frequency ripple compensation current estimate 418, $I_{COR\_SENSE}$, generated by the operational amplifier control $I_{COR\_SENSE}$ current circuit 472, to the high frequency ripple compensation current 416, $I_{COR}$, generated by the operational amplifier controlled $I_{COR}$ current circuit 470.

The programmable array of mirrored sense source current elements 568 may further include a first control sense mirrored PFET 584, $PFET_{SP1}$, a second control sense mirrored PFET 586, $PFET_{SP2}$, a third control sense mirrored PFET 588, $PFET_{SP3}$, a fourth control sense mirrored PFET 590, $PFET_{SP4}$, and a fifth control sense mirrored PFET 592, $PFET_{SP5}$. The first control sense mirrored PFET 584, $PFET_{SP1}$, the second control sense mirrored PFET 586, $PFET_{SP2}$, the third control sense mirrored PFET 588, $PFET_{SP3}$, the fourth control sense mirrored PFET 590, $PFET_{SP4}$, and the fifth control sense mirrored PFET 592, $PFET_{SP5}$, may be used in conjunction with the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, the fifth sense mirrored PFET 580, $PFET_{S5}$, and the $I_{COR\_SENSE}$ source current weight control bus 482, CNTR_SP_BUS (5:1) to create a first control sense mirrored PFET 584, $PFET_{SP1}$, a second control sense mirrored PFET 586, $PFET_{SP2}$, a third control sense mirrored PFET 588, $PFET_{SP3}$, a fourth control sense mirrored PFET 590, $PFET_{SP4}$, and a fifth control sense mirrored PFET 592, $PFET_{SP5}$, respectively, to form a first programmable sense mirrored source current element 572A, a second programmable sense mirrored source current element 574A, a third programmable sense mirrored source current element 576A, a fourth programmable sense mirrored source current element 578A, and a fifth programmable sense mirrored source current element 580A.

As further depicted in FIG. 32B, the programmable array of mirrored sense source current elements 568 may be operably coupled to the $I_{COR\_SENSE}$ source current weight control bus 482, CNTR_SP_BUS (5:1). The $I_{COR\_SENSE}$ source current weight control bus 482, CNTR_SP_BUS (5:1) may include a first control sense mirrored PFET signal 594, CNTR_SP1, coupled to the gate of the first control sense mirrored PFET 584, $PFET_{SP1}$, a second control sense mirrored PFET signal 596, CNTR_SP2, coupled to the gate of the second control sense mirrored PFET 586, $PFET_{SP2}$, a third control sense mirrored PFET signal 598, CNTR_SP3, coupled to the gate of the third control sense mirrored PFET 588, $PFET_{SP3}$, a fourth control sense mirrored PFET signal 600, CNTR_SP4, coupled to the gate of the fourth control sense mirrored PFET 590, $PFET_{SP4}$, and a fifth control sense mirrored PFET signal 602, CNTR_SP5, coupled to the gate of the fifth control sense mirrored PFET 592, $PFET_{SP5}$.

The first control sense mirrored PFET signal 594, CNTR_SP1, may be configured to control the operational state (ON/OFF) of the first control sense mirrored PFET 584, $PFET_{SP1}$. The second control sense mirrored PFET signal 596, CNTR_SP2, may be configured to control the operational state (ON/OFF) of the second control sense mirrored PFET 586, $PFET_{SP2}$. The third control sense mirrored PFET signal 598, CNTR_SP3, may be configured to control the operational state (ON/OFF) of the third control sense mirrored PFET 588, $PFET_{SP3}$. The fourth control sense mirrored PFET signal 600, CNTR_SP4, may be configured to control the operational state (ON/OFF) of the fourth control sense mirrored PFET 590, $PFET_{SP4}$. The fifth control sense mirrored PFET signal 602, CNTR_SP5 may be configured to control the operational state (ON/OFF) of the fifth control sense mirrored PFET 592, $PFET_{SP5}$.

The first programmable sense mirrored source current element 572A may be formed by coupling the source of the first sense mirrored PFET 572, $PFET_{S1}$, to the circuit supply voltage, $V_{DD}$, and the drain of the first sense mirrored PFET 572, $PFET_{S1}$, to the source of the first control sense mirrored PFET 584, $PFET_{SP1}$. The drain of the first control sense mirrored PFET 584, $PFET_{SP1}$, is coupled to the operational amplifier controlled $I_{COR\_SENSE}$ current output 472A. The second programmable sense mirrored source current element 574A may be formed by coupling the source of the second sense mirrored PFET 574, $PFET_{S2}$, to the circuit supply voltage, $V_{DD}$, and the drain of the second sense mirrored PFET 574, $PFET_{S2}$, to the source of the second control sense mirrored PFET 586, $PFET_{SP2}$. The drain of the second control sense mirrored PFET 586, $PFET_{SP2}$, is coupled to the operational amplifier controlled $I_{COR\_SENSE}$ current output 472A. The third programmable sense mirrored source current element 576A, may be formed by coupling the source of the third sense mirrored PFET 576, $PFET_{S3}$, to the circuit supply voltage, $V_{DD}$, and the drain of the third sense mirrored PFET 576, $PFET_{S3}$, to the source of the third control sense mirrored PFET 588, $PFET_{SP3}$. The drain of the third control sense mirrored PFET 588, $PFET_{SP3}$, is coupled to the operational amplifier controlled $I_{COR\_SENSE}$ current output 472A. The fourth programmable sense mirrored source current element 578A may be formed by coupling the source of the fourth sense mirrored PFET 578, $PFET_{S4}$, to the circuit supply voltage, $V_{DD}$, and the drain of the fourth sense mirrored PFET 578, $PFET_{S4}$, to the source of the fourth control sense mirrored PFET 590, $PFET_{SP4}$. The drain of the fourth control sense mirrored PFET 590, $PFET_{SP4}$, is coupled to the operational amplifier controlled $I_{COR\_SENSE}$ current output 472A. The fifth programmable sense mirrored source current element 580A may be formed by coupling the source of the fifth sense mirrored PFET 580, $PFET_{S5}$, to the circuit supply voltage, $V_{DD}$, and the drain of the fifth sense mirrored PFET 580, $PFET_{S5}$, to the source of the fifth control sense mirrored PFET 592, $PFET_{SP5}$. The drain of the fifth control sense mirrored PFET 592, $PFET_{SP4}$, is coupled to the operational amplifier controlled $I_{COR\_SENSE}$ current output 472A.

The gate of each of the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, the fifth sense mirrored PFET 580, $PFET_{S5}$, and the sixth sense mirrored PFET 582, $PFET_{S6}$, is coupled to the output stage $PFET_A$ control signal 474 such that the each of the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, the fifth sense mirrored PFET 580, $PFET_{S5}$, and the sixth sense mirrored PFET 582, $PFET_{S6}$, is current mirrored to the first push-pull output PFET 486, $PFET_A$, of the operational amplifier push-pull output stage circuit 468. As a result, the gate voltage for each of the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, the fifth sense mirrored PFET 580, $PFET_{S5}$, and the sixth sense mirrored PFET 582, $PFET_{S6}$, is substantially set equal to the $PFET_A$ control voltage, $V_{PFET\_A\_CNTR}$, provided by the output stage $PFET_A$ control signal 474.

Accordingly, the magnitude of the current provided by the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, and the fifth sense mirrored PFET 580, $PFET_{S5}$, is governed by the $PFET_A$ control voltage, $V_{PFET\_A\_CNTR}$. The controller 50 may configure the $I_{COR\_SENSE}$ source current weight control bus 482, CNTR_SP_BUS (5:1), to selectively place the first programmable sense mirrored source current element 572A, the second programmable sense mirrored source current element 574A, the third programmable sense mirrored source current element 576A, the fourth programmable sense mirrored source current element 578A, and the fifth programmable sense mirrored source current element 580A, in an OFF state or an ON state to govern the contribution of current sourced by each of the first sense mirrored PFET 572, $PFET_{S1}$, the second sense mirrored PFET 574, $PFET_{S2}$, the third sense mirrored PFET 576, $PFET_{S3}$, the fourth sense mirrored PFET 578, $PFET_{S4}$, and the fifth sense mirrored PFET 580, $PFET_{S5}$, to form the scaled high frequency ripple compensation current estimate 418, $I_{COR\_SENSE}$. Because the sixth sense mirrored PFET 582, $PFET_{S6}$, is not part of a programmable source current element, the sixth sense mirrored PFET 582, $PFET_{S6}$, sources current to the output of the operational amplifier controlled $I_{COR\_SENSE}$ current output 472A dependent upon the $PFET_A$ control voltage, $V_{PFET\_A\_CNTR}$. The current sourced by the sixth sense mirrored PFET 582, $PFET\text{-}_{S6}$, may be used to provide the $I_{COR\_SENSE}$ offset current carrying capacity of the substantially symmetric $I_{COR\_SENSE}$ current push-pull output stage 571.

As a non-limiting example, the programmable array of mirrored sense sink current elements 570 may include fewer mirrored transistor elements than the programmable array of mirrored sink current elements 492 of the operational amplifier controlled $I_{COR}$ current circuit 470. However, in order for the substantially symmetric push-pull output stage 567 to be balanced, the programmable array of mirrored sense source current elements 568 and the programmable array of mirrored sense sink current elements 570 have complementary numbers of mirrored transistor elements. Accordingly, in the example embodiment of the operational amplifier controlled $I_{COR\_SENSE}$ current circuit 472, the substantially symmetric push-pull output stage 567 further includes a first sense mirrored NFET 604, $NFET_{S1}$, a second sense mirrored NFET 606, $NFET_{S2}$, a third sense mirrored NFET 608, $NFET_{S3}$, a fourth sense mirrored NFET 610, $NFET_{S4}$, a fifth sense mirrored NFET 612, $NFET_{S5}$, and a sixth sense mirrored NFET 614, $NFET_{S6}$. The first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, and the fifth sense mirrored NFET 612, $NFET_{S5}$, may be configured to form the programmable array of mirrored sense sink current elements 570.

Similar to the substantially symmetric push-pull output stage 567, the channel widths of the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, and the sixth sense mirrored NFET 614, $NFET_{S6}$, are configured such that current carrying capacity of each one of the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, and the sixth sense mirrored NFET 614, $NFET_{S6}$, is fractionally related to the current carrying capacity of the second mirrored NFET 534, $NFET_{A1}$, the third mirrored NFET 536, $NFET_{A2}$, the fourth mirrored NFET 538, $NFET_{A3}$, the fifth mirrored NFET 540, $NFET_{A4}$, the sixth mirrored NFET 542, $NFET_{A5}$, and the seventh mirrored NFET 543, $NFET_{A6}$, of the programmable array of mirrored sink current elements 492, respectively, by the sense scaling factor, $C_{SENSE\_SCALING}$.

In other words, the channel widths of the transistor elements of the programmable array of mirrored sense sink current elements 570 of the operational amplifier controlled $I_{COR\_SENSE}$ current circuit 472 are configured such that the current providing capacity of the programmable array of mirrored sense sink current elements 570 is fractionally related to the current providing capacity of the programmable array of mirrored sink current elements 492 of the operational amplifier controlled $I_{COR}$ current circuit 470. As an example, the channel width of the first sense mirrored NFET 604, $NFET_{S1}$, may be substantially related to the channel widths of the second mirrored NFET 534, $NFET_{A1}$, as a function of the sense scaling factor, $C_{SENSE\_SCALING}$. The channel width of the second sense mirrored NFET 606, $NFET_{S2}$, may be substantially related to the channel width of the third mirrored NFET 536, $NFET_{A2}$, as a function of the sense scaling factor, $C_{SENSE\_SCALING}$. The channel width of the third sense mirrored NFET 608, $NFET_{S3}$, may be substantially related to the channel width of the fourth mirrored NFET 538, $NFET_{A3}$, as a function of the sense scaling factor, $C_{SENSE\_SCALING}$. The channel width of the fourth sense mirrored NFET 610, $NFET_{S4}$, may be substantially related to the channel width of the fifth mirrored NFET 540, $NFET_{A4}$, as a function of the sense scaling factor, $C_{SENSE\_SCALING}$. The channel width of the fifth sense mirrored NFET 612, $NFET_{S5}$, may be substantially related to the channel width of the sixth mirrored NFET 542, $PFET_{A5}$, as a function of the sense scaling factor, $C_{SENSE\_SCALING}$.

As a result, the current carrying capacity of the second sense mirrored NFET 606, $NFET_{S2}$, is substantially twice the current carrying capacity of the first sense mirrored NFET 604, $NFET_{S1}$, the current carrying capacity of the third sense mirrored NFET 608, $NFET_{S3}$ is substantially twice the current carrying capacity of the second sense mirrored NFET

606, $NFET_{S2}$, the current carrying capacity of the fourth sense mirrored NFET 610, $NFET_{S4}$ is substantially twice the current carrying capacity of the third sense mirrored NFET 608, $NFET_{S3}$, and the current carrying capacity of the fifth sense mirrored NFET 612, $NFET_{S5}$, is substantially twice the current carrying capacity of the fourth sense mirrored NFET 610, $NFET_{S4}$. Thus the channel widths of the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, are substantially configured to sink binary weighted current.

As a result, similar to the programmable array of mirrored sense source current elements 568, the current carrying capacities of the transistor elements of the programmable array of mirrored sense sink current elements 570 may be substantially related to the corresponding transistor elements of the programmable array of mirrored sink current elements 492 of the operational amplifier controlled $I_{COR}$ current circuit 470 by the sense scaling factor, $C_{SENSE\_SCALING}$, in order to maintain the fractional relationship of the scaled high frequency ripple compensation current estimate 418, $I_{COR\_SENSE}$, generated by the operational amplifier control $I_{COR\_SENSE}$ current circuit 472, to the high frequency ripple compensation current 416, $I_{COR}$, generated by the operational amplifier controlled $I_{COR}$ current circuit 470.

The programmable array of mirrored sense sink current elements 570 may further include a first control sense mirrored NFET 616, $NFET_{SN1}$, a second control sense mirrored NFET 618, $NFET_{SN2}$, a third control sense mirrored NFET 620, $NFET_{SN3}$, a fourth control sense mirrored NFET 622, $NFET_{SN4}$, and a fifth control sense mirrored NFET 624, $NFET_{SN5}$. The first control sense mirrored NFET 616, $NFET_{SN1}$, the second control sense mirrored NFET 618, $NFET_{SN2}$, the third control sense mirrored NFET 620, $NFET_{SN3}$, the fourth control sense mirrored NFET 622, $NFET_{SN4}$, and the fifth control sense mirrored NFET 624, $NFET_{SN5}$, may be used in conjunction with the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, and the $I_{COR\_SENSE}$ sink current weight control bus 484, CNTR_SN_BUS (5:1) to form a first programmable sense mirrored sink current element 604A, a second programmable sense mirrored sink current element 606A, a third programmable sense mirrored sink current element 608A, a fourth programmable sense mirrored sink current element 610A, and a fifth programmable sense mirrored sink current element 612A.

In some alternative embodiments of the operational amplifier circuitry 440A, portions of the $I_{COR\_SENSE}$ source current weight control bus 482, CNTR_SP_BUS (5:1), the $I_{COR\_SENSE}$ sink current weight control bus 484, CNTR_SN_BUS (5:1), the $I_{COR}$ source current weight control bus 478, CNTR_CP_BUS (5:0), and the $I_{COR}$ sink current weight control bus 480, CNTR_CN_BUS (5:0) may be combined to form a single control bus that controls both the operational amplifier controlled $I_{COR}$ current circuit 470 and the operational amplifier controlled $I_{COR\_SENSE}$ current circuit 472.

As further depicted in FIG. 32B, the programmable array of mirrored sense sink current elements 570 may be operably coupled to the $I_{COR\_SENSE}$ sink current weight control bus 484, CNTR_SN_BUS (5:1). The $I_{COR\_SENSE}$ sink current weight control bus 484, CNTR_SN_BUS (5:1) may include a first control sense mirrored NFET signal 626, CNTR_SN1, coupled to the gate of the first control sense mirrored NFET 616, $NFET_{SN1}$, a second control sense mirrored NFET signal 628, CNTR_SN2, coupled to the gate of the second control sense mirrored NFET 618, $NFET_{SN2}$, a third control sense mirrored NFET signal 630, CNTR_SN3, coupled to the gate of the third control sense mirrored NFET 620, $NFET_{SN3}$, a fourth control sense mirrored NFET signal 632, CNTR_SN4, coupled to the gate of the fourth control sense mirrored NFET 622, $NFET_{SN4}$, and a fifth control sense mirrored NFET signal 634, CNTR_SN5, coupled to the gate of the fifth control sense mirrored NFET 624, $NFET_{SN5}$.

The first control sense mirrored NFET signal 626, CNTR_SN1, may be configured to control the operational state (ON/OFF) of the first control sense mirrored NFET 616, $NFET_{SN1}$. The second control sense mirrored NFET signal 628, CNTR_SN2, may be configured to control the operational state (ON/OFF) of the second control sense mirrored NFET 618, $NFET_{SN2}$. The third control sense mirrored NFET signal 630, CNTR_SN3, may be configured to control the operational state (ON/OFF) of the third control sense mirrored NFET 620, $NFET_{SN3}$. The fourth control sense mirrored NFET signal 632, CNTR_SN4, may be configured to control the operational state (ON/OFF) of the fourth control sense mirrored NFET 622, $NFET_{SN4}$. The fifth control sense mirrored NFET signal 634, CNTR_SN5 may be configured to control the operational state (ON/OFF) of the fifth control sense mirrored NFET 624, $NFET_{SN5}$.

The first programmable sense mirrored sink current element 604A may be formed by coupling the source of the first sense mirrored NFET 604, $NFET_{S1}$, to ground, and the drain of the first sense mirrored NFET 604, $NFET_{S1}$, to the source of the first control sense mirrored NFET 616, $NFET_{SN1}$. The drain of the first control sense mirrored NFET 616, $NFET_{SN1}$, is coupled to the operational amplifier controlled $I_{COR\_SENSE}$ current output 472A. The second programmable sense mirrored sink current element 606A may be formed by coupling the source of the second sense mirrored NFET 606, $NFET_{S2}$, to ground, and the drain of the second sense mirrored NFET 606, $NFET_{S2}$, to the source of the second control sense mirrored NFET 618, $NFET_{SN2}$. The drain of the second control sense mirrored NFET 618, $NFET_{SN2}$, is coupled to the operational amplifier controlled $I_{COR\_SENSE}$ current output 472A. The third programmable sense mirrored sink current element 608A, may be formed by coupling the source of the third sense mirrored NFET 608, $NFET_{S3}$, to ground, and the drain of the third sense mirrored NFET 608, $NFET_{S3}$, to the source of the third control sense mirrored NFET 620, $NFET_{SN3}$. The drain of the third control sense mirrored NFET 620, $NFET_{SN3}$, is coupled to the operational amplifier controlled $I_{COR\_SENSE}$ current output 472A. The fourth programmable sense mirrored sink current element 610A may be formed by coupling the source of the fourth sense mirrored NFET 610, $NFET_{S4}$, to ground, and the drain of the fourth sense mirrored NFET 610, $NFET_{S4}$, to the source of the fourth control sense mirrored NFET 622, $NFET_{SN4}$. The drain of the fourth control sense mirrored NFET 622, $NFET_{SN4}$, is coupled to the operational amplifier controlled $I_{COR\_SENSE}$ current output 472A. The fifth programmable sense mirrored sink current element 612A may be formed by coupling the source of the fifth sense mirrored NFET 612, $NFET_{S5}$, to ground, and the drain of the fifth sense mirrored NFET 612, $NFET_{S5}$, to the source of the fifth control sense mirrored NFET 624, $NFET_{SN5}$. The drain of the fifth control sense mirrored NFET 624, $NFET_{SN4}$, is coupled to the operational amplifier controlled $I_{COR\_SENSE}$ current output 472A.

The gate of each of the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, and the sixth sense mirrored NFET 614, $NFET_{S6}$, is coupled to the output stage $NFET_A$ control signal 476 such that the each of the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, and the sixth sense mirrored NFET 614, $NFET_{S6}$, is current mirrored to the first push-pull output NFET 488, $NFET_A$, of the operational amplifier push-pull output stage circuit 468. As a result, the gate voltage for each of the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, and the sixth sense mirrored NFET 614, $NFET_{S6}$, is substantially set equal to the $NFET_A$ control voltage, $V_{NFET\_A\_CNTR}$, provided by the output stage $NFET_A$ control signal 476.

Accordingly, the magnitude of the current provided by the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, is governed by the $NFET_A$ control voltage, $V_{NFET\_A\_CNTR}$, provided by the output stage $NFET_A$ control signal from the operational amplifier front-end stage circuit 466.

The controller 50 may configure the $I_{COR\_SENSE}$ sink current weight control bus 484, CNTR_SN_BUS (5:1), to selectively place the first programmable sense mirrored sink current element 604A, the second programmable sense mirrored sink current element 606A, the third programmable sense mirrored sink current element 608A, the fourth programmable sense mirrored sink current element 610A, and the fifth programmable sense mirrored sink current element 612A, in an OFF state or an ON state to govern the contribution of current sunk by each of the first sense mirrored NFET 604, $NFET_{S1}$, the second sense mirrored NFET 606, $NFET_{S2}$, the third sense mirrored NFET 608, $NFET_{S3}$, the fourth sense mirrored NFET 610, $NFET_{S4}$, the fifth sense mirrored NFET 612, $NFET_{S5}$, and the sixth sense mirrored NFET 614, $NFET_{S6}$. Because the sixth sense mirrored NFET 614, $NFET_{S6}$, is not part of a programmable sink current element, the sixth sense mirrored NFET 614, $NFET_{S6}$, sinks current from the output of the operational amplifier controlled $I_{COR\_SENSE}$ current output 472A dependent upon the $NFET_A$ control voltage, $V_{NFET\_A\_CNTR}$.

Accordingly, the substantially symmetric $I_{COR\_SENSE}$ current push-pull output stage 571 is formed by coupling the source of the sixth sense mirrored PFET 582, $PFET_{S6}$, to the circuit supply voltage, $V_{DD}$, and the source of the sixth sense mirrored NFET 614, $NFET_{S6}$, to ground. The drain of the sixth sense mirrored PFET 582, $PFET_{S6}$, and the drain of the sixth sense mirrored NFET 582, $NFET_{S6}$, are each coupled to the operational amplifier controlled $I_{COR\_SENSE}$ current output 472A. As previously described, the gate of the sixth sense mirrored PFET 582, $PFET_{S6}$, is coupled to the output stage $PFET_A$ control signal 474 and the gate of the sixth sense mirrored NFET 614, $NFET_{S6}$, are coupled to the output stage $NFET_A$ control signal 476. The sixth sense mirrored PFET 582, $PFET_{S6}$, and the sixth sense mirrored NFET 614, $NFET_{S6}$, form the substantially symmetric $I_{COR\_SENSE}$ current push-pull output stage 571 that is mirrored to the operational amplifier output current, $I_{AMP}$, provided by the operational amplifier push-pull output state circuit 468.

Furthermore, the channel width of the sixth sense mirrored PFET 582, $PFET_{S6}$, and the sixth sense mirrored NFET 614, $NFET_{S6}$, are configured to be proportionally scaled to the seventh mirrored PFET 506, $PFET_{A6}$, and the seventh mirrored NFET 543, $NFET_{A6}$, such that the $I_{COR\_SENSE}$ offset current capacity is fractionally related to the $I_{COR}$ offset current carrying capacity by the sense scaling factor, $C_{SENSE\_SCALING}$.

In order to configure the programmable array of mirrored sense source current elements 568 and the programmable array of mirrored sense sink current elements 570 to operate as a substantially symmetric programmable $I_{COR\_SENSES}$ push-pull output stage 569, the controller 50 controls the $I_{COR\_SENSE}$ source current weight control bus 482, CNTR_SP_BUS (5:1), and the $I_{COR\_SENSE}$ sink current weight control bus 484, CNTR_SN_BUS (5:1), such that the operational state of the first programmable sense mirrored source current element 572A is associated with the operational state of the corresponding first programmable sense mirrored sink current element 604A, the operational state of the second programmable sense mirrored source current element 574A is associated with the operational state of the corresponding second programmable sense mirrored sink current element 606A, the operational state of the third programmable sense mirrored source current element 576A is associated with the operational state of the corresponding third programmable sense mirrored sink current element 608A, the operational state of the fourth programmable sense mirrored source current element 578A is associated with the operational state of the fourth programmable sense mirrored sink current element 610A, and the operational state of the fifth programmable sense mirrored source current element 580A is associated with the operational state of the corresponding fifth programmable sense mirrored sink current element 612A.

In addition, to maintain proper scaling between the scaled high frequency ripple compensation current estimate 418, $I_{COR\_SENSE}$, and the high frequency ripple compensation current 416, $I_{COR}$, the current carrying capacity of the first programmable sense mirrored source current element 572A, the second programmable sense mirrored source current element 574A, the third programmable sense mirrored source current element 576A, the fourth programmable sense mirrored source current element 578A, the fifth programmable sense mirrored source current element 580A, the first programmable sense mirrored sink current element 604A, the second programmable sense mirrored sink current element 606A, the third programmable sense mirrored sink current element 608A, the fourth programmable sense mirrored sink current element 610A, and the fifth programmable sense mirrored sink current element 612A, and the symmetric $I_{COR\_SENSE}$ current push-pull output stage 571 are scaled based on the sense scaling factor, $C_{SENSE\_SCALING}$, with respect to the current carrying capacity of the second programmable mirrored source current element 496A, the third programmable mirrored source current element 498A, the fourth programmable mirrored source current element 500A, the fifth programmable mirrored source current element 502A, the sixth programmable mirrored source current element 504A, the second programmable mirrored sink current element 534A, the third programmable mirrored sink current element 536A, the fourth programmable mirrored sink current element 538A, the fifth programmable mirrored sink current element 540A, the sixth programmable mirrored sink current element 542A, and the substantially symmetric $I_{COR}$ current push-pull output stage 493.

In some embodiments, the controller configures the $I_{COR\_SENSE}$ source current weight control bus 482, CNTR_SP_ BUS (5:1) and the $I_{COR\_SENSE}$ sink current weight control bus 484, CNTR_SN_BUS (5:1), based on the five most significant bits of the programmable control word, CNTRN, used to configure the programmable $I_{COR}$ transconductance, $Gm_{ICOR}$, of the operational amplifier controlled $I_{COR}$ current circuit 470.

As an example, the controller 50 may configure the $I_{COR\_SENSE}$ source current weight control bus 482, CNTR_SP_BUS (5:1) and the $I_{COR\_SENSE}$ sink current weight control bus 484, CNTR_SN_BUS (5:1), to substantially track the operation of the $I_{COR}$ source current weight control bus 478, CNTR_CP_BUS (5:0), and the $I_{COR}$ sink current weight control bus 480, CNTR_CN_BUS (5:0) in order to maintain the sense scaling factor, $C_{SENSE\_SCALING}$, relationship between the scaled high frequency ripple compensation current estimate 418, $I_{COR\_SENSE}$, and the high frequency ripple compensation current 416, $I_{COR}$.

Illustratively, in the embodiment of the operational amplifier controlled $I_{COR\_SENSE}$ current circuit 472 depicted in FIG. 32B, which includes five programmable sense mirrored source current elements and five corresponding programmable sense mirrored sink current elements, the controller 50 may configure the second control mirrored PFET signal 522, CNTR_CP1, the second control mirrored NFET signal 558, CNTR_CN1, the first control sense mirrored PFET signal 594, CNTR_SP1, and the first control sense mirrored NFET signal 626, CNTR_SN1, to have the same on/off state based on the most significant bits of the programmable control word, CNTRN. The controller 50 may configure the third control mirrored PFET signal 524, CNTR_CP2, the third control mirrored NFET signal 560, CNTR_CN2, the second control sense mirrored PFET signal 596, CNTR_SP2, and the second control sense mirrored NFET signal 628, CNTR_SN2, to have the same on/off state based on the most significant bits of the programmable control word, CNTRN. The controller 50 may also configure the fourth control mirrored PFET signal 526, CNTR_CP3, the fourth control mirrored NFET signal 562, CNTR_CN3, the third control sense mirrored PFET signal 598, CNTR_SP3, and the third control sense mirrored NFET signal 630, CNTR_SN3, to have the same on/off state based on the most significant bits of the programmable control word, CNTRN. The controller 50 may also configure the fifth control mirrored PFET signal 528, CNTR_CP4, the fifth control mirrored NFET signal 564, CNTR_CN4, the fourth control sense mirrored PFET signal 600, CNTR_SP4, and the fourth control sense mirrored NFET signal 632, CNTR_SN4, to have the same on/off state based on the most significant bits of the programmable control word, CNTRN. And, the controller 50 may also configure the sixth control mirrored PFET signal 530, CNTR_CP5, the sixth control mirrored NFET signal 566, CNTR_CN5, the fifth control sense mirrored PFET signal 602, CNTR_SP5, and the fifth control sense mirrored NFET signal 634, CNTR_SN5, to have the same on/off state based on the most significant bits of the programmable control word, CNTRN.

As an example, the controller 50 may configure the $I_{COR\_SENSE}$ source current weight control bus 482, CNTR_SP_BUS(5:1) and the $I_{COR\_SENSE}$ sink current weight control bus 484, CNTR_SN_BUS(5:1), to substantially track the operation of the $I_{COR}$ source current weight control bus 478, CNTR_CP_BUS(5:0), and the $I_{COR}$ sink current weight control bus 480, CNTR_CN_BUS(5:0) in order to maintain the sense scaling factor, $C_{SENSE\_SCALING}$, relationship between the scaled high frequency ripple compensation current estimate 418, $I_{COR\_SENSE}$, and the high frequency ripple compensation current 416, $I_{COR}$.

Illustratively, in the embodiment of the operational amplifier controlled $I_{COR\_SENSE}$ current circuit 472 depicted in FIG. 32B, which includes five programmable sense mirrored source current elements and five corresponding programmable sense mirrored sink current elements, the controller 50 may configure the second control mirrored PFET signal 522, CNTR_CP1, the second control mirrored NFET signal 558, CNTR_CN1, the first control sense mirrored PFET signal 594, CNTR_SP1, and the first control sense mirrored NFET signal 626, CNTR_SN1, to have the same on/off state based on the most significant bits of the programmable control word, CNTRN. The controller 50 may configure the third control mirrored PFET signal 524, CNTR_CP2, the third control mirrored NFET signal 560, CNTR_CN2, the second control sense mirrored PFET signal 596, CNTR_SP2, and the second control sense mirrored NFET signal 628, CNTR_SN2, to have the same on/off state based on the most significant bits of the programmable control word, CNTRN. The controller 50 may also configure the fourth control mirrored PFET signal 526, CNTR_CP3, the fourth control mirrored NFET signal 562, CNTR_CN3, the third control sense mirrored PFET signal 598, CNTR_SP3, and the third control sense mirrored NFET signal 630, CNTR_SN3, to have the same on/off state based on the most significant bits of the programmable control word, CNTRN. The controller 50 may also configure the fifth control mirrored PFET signal 528, CNTR_CP4, the fifth control mirrored NFET signal 564, CNTR_CN4, the fourth control sense mirrored PFET signal 600, CNTR_SP4, and the fourth control sense mirrored NFET signal 632, CNTR_SN4, to have the same on/off state based on the most significant bits of the programmable control word, CNTRN. And, the controller 50 may also configure the sixth control mirrored PFET signal 530, CNTR_CP5, the sixth control mirrored NFET signal 566, CNTR_CN5, the fifth control sense mirrored PFET signal 602, CNTR_SP5, and the fifth control sense mirrored NFET signal 634, CNTR_SN5, to have the same on/off state based on the most significant bits of the programmable control word, CNTRN.

In addition, the controller 50 is configured to control the $I_{COR}$ source current weight control bus 478, CNTR_CP_BUS (5:0), the $I_{COR}$ sink current weight control bus 480, CNTR_CN_BUS(5:0), the $I_{COR\_SENSE}$ source current weight control bus 482, CNTR_SP_BUS(5:1), and the $I_{COR\_SENSE}$ sink current weight control bus 484, CNTR_SN_BUS(5:1), to maintain the desired scaling between the scaled high frequency ripple compensation current estimate 418, $I_{COR\_SENSE}$, and the high frequency ripple compensation current 416, $I_{COR}$.

The programmable $I_{COR\_SENSE}$ transconductance, $Gm_{ICOR\_SCALED}$, of the operational amplifier controlled $I_{COR\_SENSE}$ current circuit 472 is similar to the programmable $I_{COR}$ transconductance, $Gm_{ICOR}$, of the operational amplifier controlled $I_{COR}$ current circuit 470, except that the programmable $I_{COR\_SENSE}$ transconductance, $Gm_{ICOR\_SCALED}$, of the operational amplifier controlled $I_{COR\_SENSE}$ current circuit 472, $Gm_{ICOR\_SCALED}$, is reduced by a factor of the sense scaling factor, $C_{SENSE\_SCALING}$. In addition, the granularity of the programmability of the programmable $I_{COR\_SENSE}$ transconductance, $Gm_{ICOR\_SCALED}$, of the operational amplifier controlled $I_{COR\_SENSE}$ current circuit is limited by the five bits of the $I_{COR\_SENSE}$ source current weight control bus 482, CNTR_SP_BUS(5:1) and the five bits of the $I_{COR\_SENSE}$ sink current weight control bus 484, CNTR_SN_BUS(5:1).

Continuing with the description of the operational amplifier circuitry 440A depicted in FIG. 31A, FIG. 32C depicts an example embodiment of the Gm bias circuit and operational amplifier isolation circuit of the embodiment of the operational amplifier circuitry depicted in FIG. 31A. As previously discussed with respect to FIG. 27A, the Gm bias circuit 444 may include the bias resistor 452 coupled in series with the bias capacitor 454 between the operational amplifier output 442C (not shown) and ground. As previously described, a Gm bias current, $I_{Gm\_BIAS}$, passes through the bias resistor 452 and the bias capacitor 454 to ground. Accordingly, as previously described, the operational amplifier transconductance, $Gm_{OP\_AMP}$, of the operational amplifier 442 may be set as a function of the bias resistance, $R_0$, of the bias resistor 452. Because operation of the Gm bias circuit 444 has been previously described with respect to the operational amplifier circuitry 440A, depicted in FIG. 27A, further additional further description is not provided here.

FIG. 32C further depicts the operational amplifier output isolation circuit 446 that includes an operational amplifier output isolation circuit input in communication with the follower NFET 448, $NFET_{FOLLOWER}$, where the source of the follower NFET 448, $NFET_{FOLLOWER}$, is coupled in series to the $I_{BIAS\_FOLLOWER}$ current source 450. The drain of the follower NFET 448, $NFET_{FOLLOWER}$, is coupled to the circuit supply voltage, $V_{DD}$. The gate voltage at the gate of the follower NFET 448, $NFET_{FOLLOWER}$ is equal to the operational amplifier output voltage, $V_{AMP}$. As previously discussed, with respect to FIG. 27A, the gate current, $I_{GATE}$, that flows into the gate of the follower NFET 448, $NFET_{FOLLOWER}$, approaches zero due to the high gate impedance of the follower NFET 448, $NFET_{FOLLOWER}$. The $I_{BIAS\_FOLLOWER}$ current source 450 may include a bias follower NFET 636, $NFET_{BIAS\_FOLLOWER}$. The source of the bias follower NFET 636, $NFET_{BIAS\_FOLLOWER}$ is coupled to the first node 450A of the $I_{BIAS\_FOLLOWER}$ current source 450. The source of the bias follower NFET 636, $NFET_{BIAS\_FOLLOWER}$ is coupled to the first node 450B, where the first node 450B is coupled to ground. The gate of the bias follower NFET 636, $NFET_{BIAS\_FOLLOWER}$, is coupled to a follower bias voltage, $V_{BIAS\_FOLLOWER}$, that may be provided by a biasing circuit (not shown) associated with the operational amplifier circuitry 440A. As previously discussed with respect to FIG. 27A, the feedback voltage, $V_e$, is provided at an isolated feedback node 451 created at the junction of the source of the follower NFET 448, $NFET_{FOLLOWER}$, to the drain of the bias follower NFET 636, $NFET_{BIAS\_FOLLOWER}$. The isolated feedback node 451 provides the feedback voltage, $V_e$, as an output of the operational amplifier output isolation circuit 446. Accordingly, as previously discussed, from a small signal perspective, the follower NFET 448, $NFET_{FOLLOWER}$, provides an isolated feedback node 451 such that, referring back to the open loop ripple compensation assist circuit 414B, depicted in FIG. 27A, the feedback current 456 does not impact the Gm bias current, $I_{Gm\_BIAS}$, that is used to set the operational amplifier transconductance, $Gm_{OP\_AMP}$, of the operational amplifier 442, depicted in FIG. 31A.

Figure 27B:
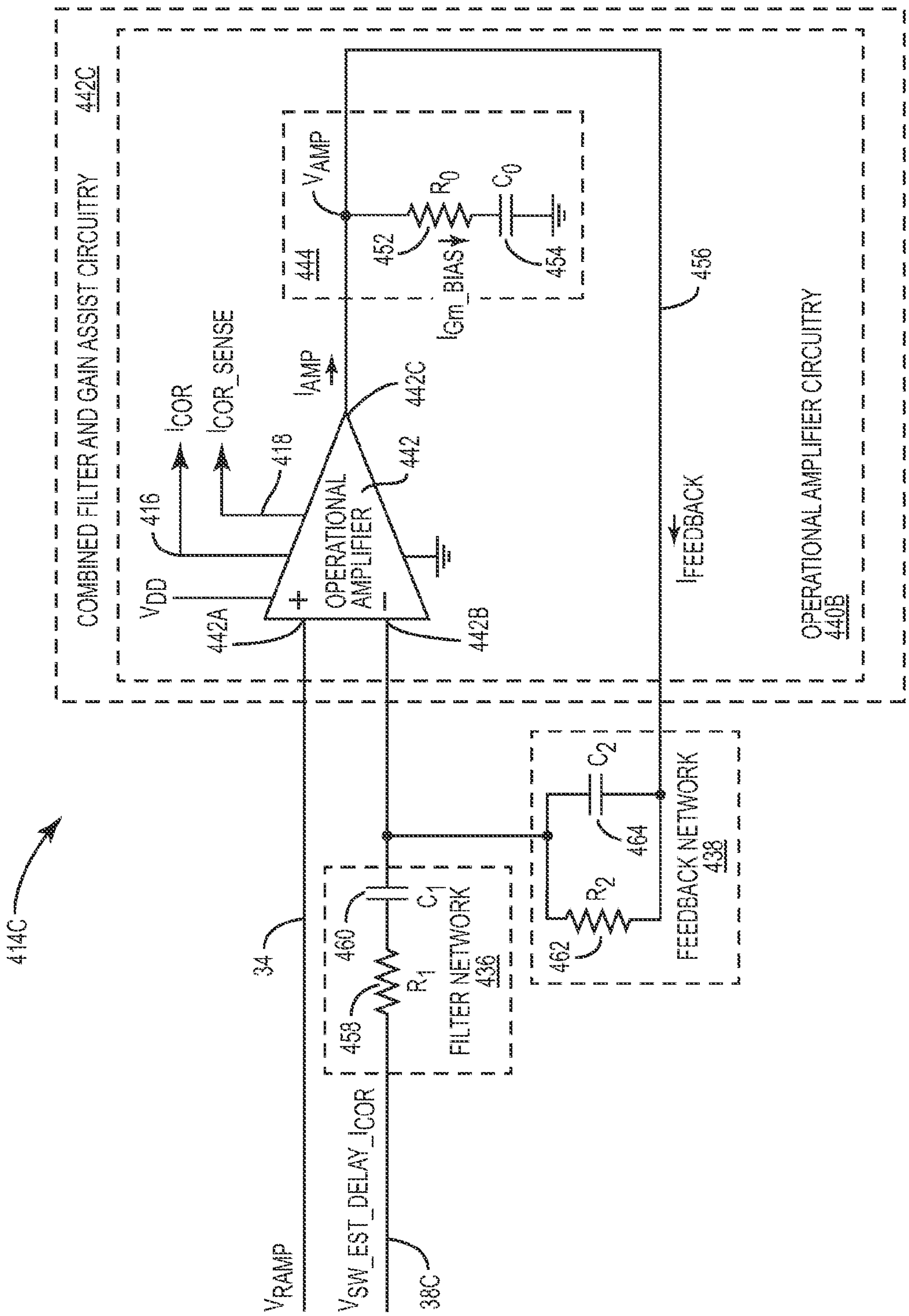
FIG. 27B that depicts an alternative embodiment of the open loop ripple compensation assist circuit of FIGS. 23A-23D.

In contrast to the open loop ripple compensation assist circuit 414B, depicted in FIG. 27A and the operational amplifier circuitry 440A, depicted in FIG. 31A, an alternative example of the open loop ripple compensation assist circuit 414, depicted in FIG. 27B, is an open loop ripple compensation assist circuit 414C that does not include the operational amplifier output isolation circuit 446. Except for the exclusion of the operational amplifier output isolation circuit 446, the open loop ripple compensation assist circuit 414C is similar in form and function to the open loop ripple compensation assist circuit 414B. Likewise, while controller 50 is not depicted in FIG. 27A, it will be understood that as depicted in FIGS. 23A-D, controller 50 (not shown) may configure the various elements of the open loop ripple compensation assist circuit 414C depicted in FIG. 27B.

As a result, the open loop ripple compensation assist circuit 414C includes a combined filter and gain circuitry 422C having only the operational amplifier circuitry 440B. Thus, unlike the operational amplifier circuitry 440B, depicted in FIG. 27A and FIG. 31A, the operational amplifier circuitry 440B, depicted in FIG. 27B and FIG. 31B, does not include the operational amplifier output isolation circuit 446. As a result, the operational amplifier output 442C of the operational amplifier 442 is tied directly to the feedback network 438.

Figure 31B:
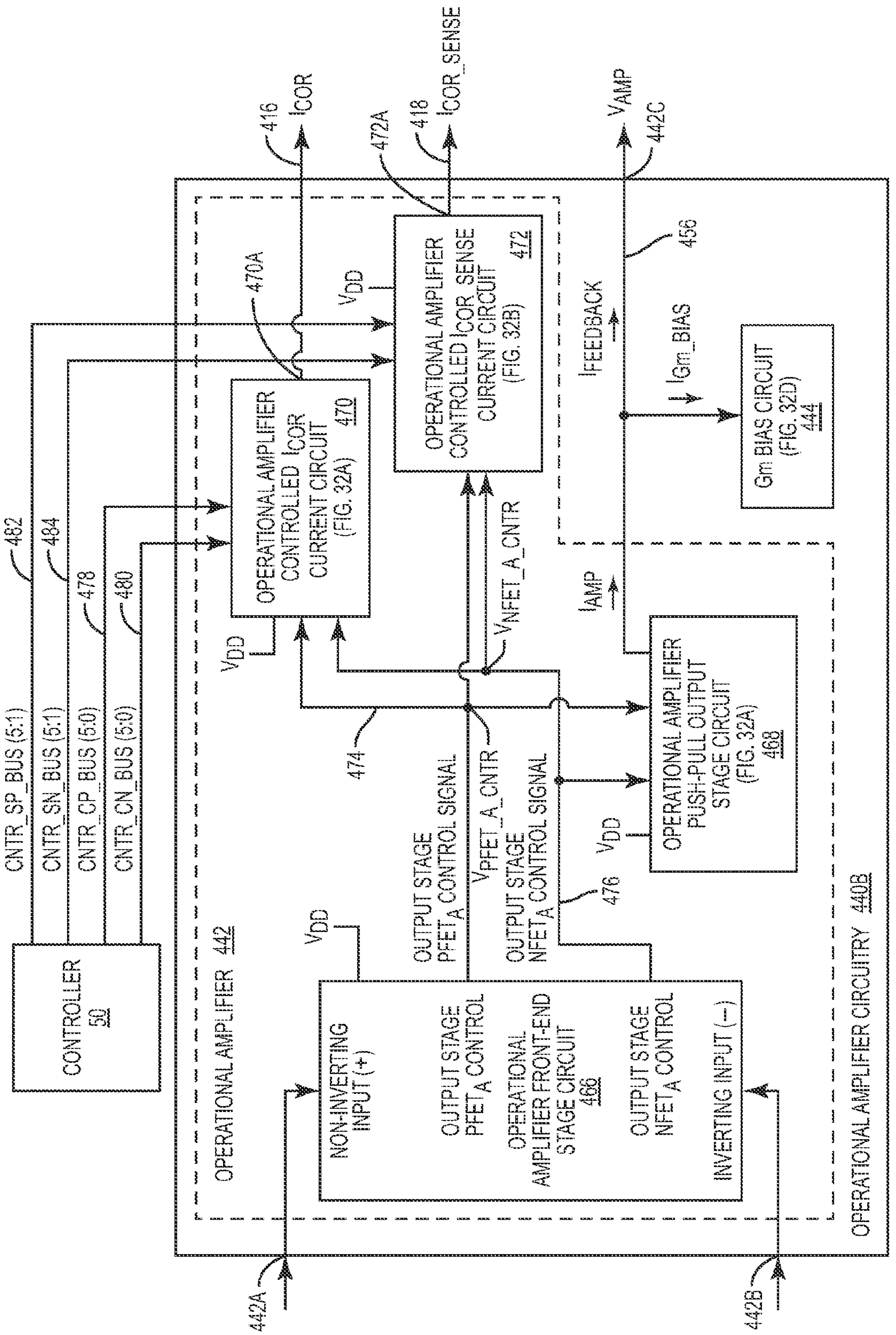
FIG. 31B depicts an example embodiment of the operational amplifier depicted in FIG. 27B, where the Operational Amplifier Output Isolation Circuit is eliminated.
Figure 32D:
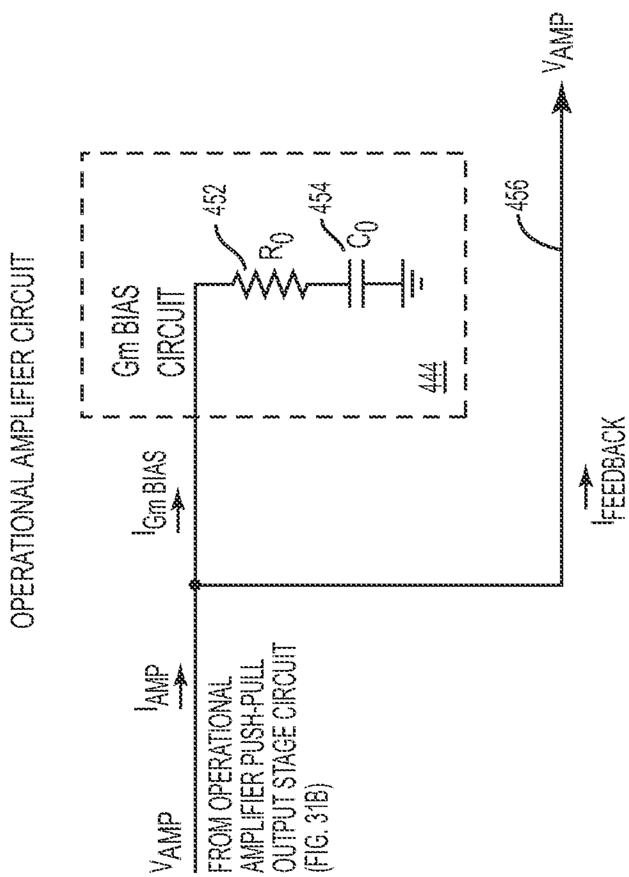
FIG. 32D depicts an example embodiment of the Gm bias circuit of the operational amplifier.

Referring briefly to the embodiment of the operational amplifier circuitry 440B, depicted in FIG. 31B, the operational amplifier circuitry 440B is similar in form and function to the operational amplifier circuitry 440A, depicted in FIG. 31A, except, the operational amplifier output isolation circuit 446, depicted in FIG. 32C, is eliminated. Thus, as depicted in FIG. 32D, the Gm bias circuit 444 is not isolated from the feedback network 438, depicted in FIG. 27B.

Accordingly, the operational amplifier output 442C may be configured to provide the operational amplifier output current, $I_{AMP}$, to provide the Gm bias current, $I_{Gm\_BIAS}$, and the feedback current 456, $I_{FEEDBACK}$. In order to obtain ripple rejection response characteristics that are similar to the ripple rejection response characteristics obtained using the embodiment of the open loop ripple compensation assist circuit 414B, depicted in FIG. 27A, the ratio of the Gm bias current, $I_{Gm\_BIAS}$, to the feedback current 456, $I_{FEEDBACK}$, must be controlled such that the feedback current 456, $I_{FEEDBACK}$, is at least 20 dB lower in amplitude than the Gm bias current, $I_{Gm\_BIAS}$, passing through the Gm bias circuit 444. In other words, to minimize the non-isolative effect of providing the feedback current 456, $I_{FEEDBACK}$, directly from the operational amplifier output 442C, it is desirable for the ratio of $I_{Gm\_BIAS}/I_{FEEDBACK} \geq 10$.

The series impedance of the bias resistance, $R_0$, of the bias resistor 452, and the bias capacitance, $C_0$, of the bias capacitor 454, form a transconductance setting impedance, $Z_{Gm}$. The parallel impedance of the feedback resistance, $R_2$, of the feedback resistor 462 and the feedback capacitance, $C_2$, of the feedback capacitor 464 in combination with the series impedance of the filter resistance, $R_1$, of the filter resistor 458 and the filter capacitance, $C_1$, of the filter capacitor 460 form a feedback current setting impedance, $Z_{FEEDBACK}$.

To ensure the ratio of $I_{Gm\_BIAS}/I_{FEEDBACK} \geq 10$, the fixed valued resistances and capacitances and the programmable valued resistances and capacitances of the respective bias resistor 452, feedback capacitor 464, filter resistor 458, filter capacitor 460, may be configured such that $Z_{Gm}$, $\geq 10\times Z_{FEEDBACK}$.

Thus, in some embodiments of the open loop ripple compensation assist circuit 414B, the controller 50 may configure the filter resistor 458 to have a resistance value substantially equal to the filter resistance, $R_1$, the feedback resistor 462 to have a resistance value substantially equal to the feedback resistance, $R_2$, the filter capacitor 460 to have a capacitance value substantially equal to the filter capacitance, $C_1$, and the feedback capacitor 464 to have a capacitance value substantially equal to the feedback capacitance, $C_2$, such that relative to the series impedance formed by the bias resistance, $R_0$, of the bias resistor 452, and the bias capacitance, $C_0$, of the bias capacitor 454, result in the feedback current 456, $I_{FEEDBACK}$, passing through the parallel impedance of the feedback resistor 462 and feedback capacitor 464 to be around $1/10^{th}$ the magnitude of the Gm bias current, $I_{Gm\_BIAS}$, passing through the bias resistor 452 and the bias capacitor 454 in the range of frequencies near or within operational bandwidth of the linear RF power amplifier 22. In other words, in some embodiments of the open loop ripple compensation assist circuit 414C, the impedances of the filter network 436 and the feedback network 438 are configured such that the ratio of the transconductance setting impedance, $Z_{Gm}$, to the feedback current setting impedance, $Z_{FEEDBACK}$, minimizes the impact of the feedback current 456, $I_{FEEDBACK}$, on the operational amplifier transconductance, $Gm_{OP\_AMP}$, of the operational amplifier 442 set based on the bias resistance, $R_0$, of the bias resistor 452. Illustratively, for the ratio of $Z_{Gm}$:$Z_{FEEDBACK}$, equal to or greater than 1:10, the magnitude of the feedback current 456, $I_{FEEDBACK}$, relative to the Gm bias current, $I_{Gm\_BIAS}$, may minimally affects the operational amplifier transconductance, $Gm_{OP\_AMP}$, of the operational amplifier 442. In other embodiments, the ratio of $Z_{Gm}$:$Z_{FEEDBACK}$, may equal to or greater than 1:8 without substantially impacting the ability to set the operational amplifier transconductance, $Gm_{OP\_AMP}$, of the operational amplifier circuitry 442 based on the bias resistance, $R_0$, of the bias resistor 452.

However, in some embodiments of the open loop ripple compensation assist circuit 414C, depicted in FIG. 27B, the relative impedance relationship between the transconductance setting impedance, $Z_{Gm}$, and the feedback current setting impedance, $Z_{FEEDBACK}$, may result in reduced ripple rejection response characteristics of the pseudo-envelope follower power management systems.

Figure 28A:
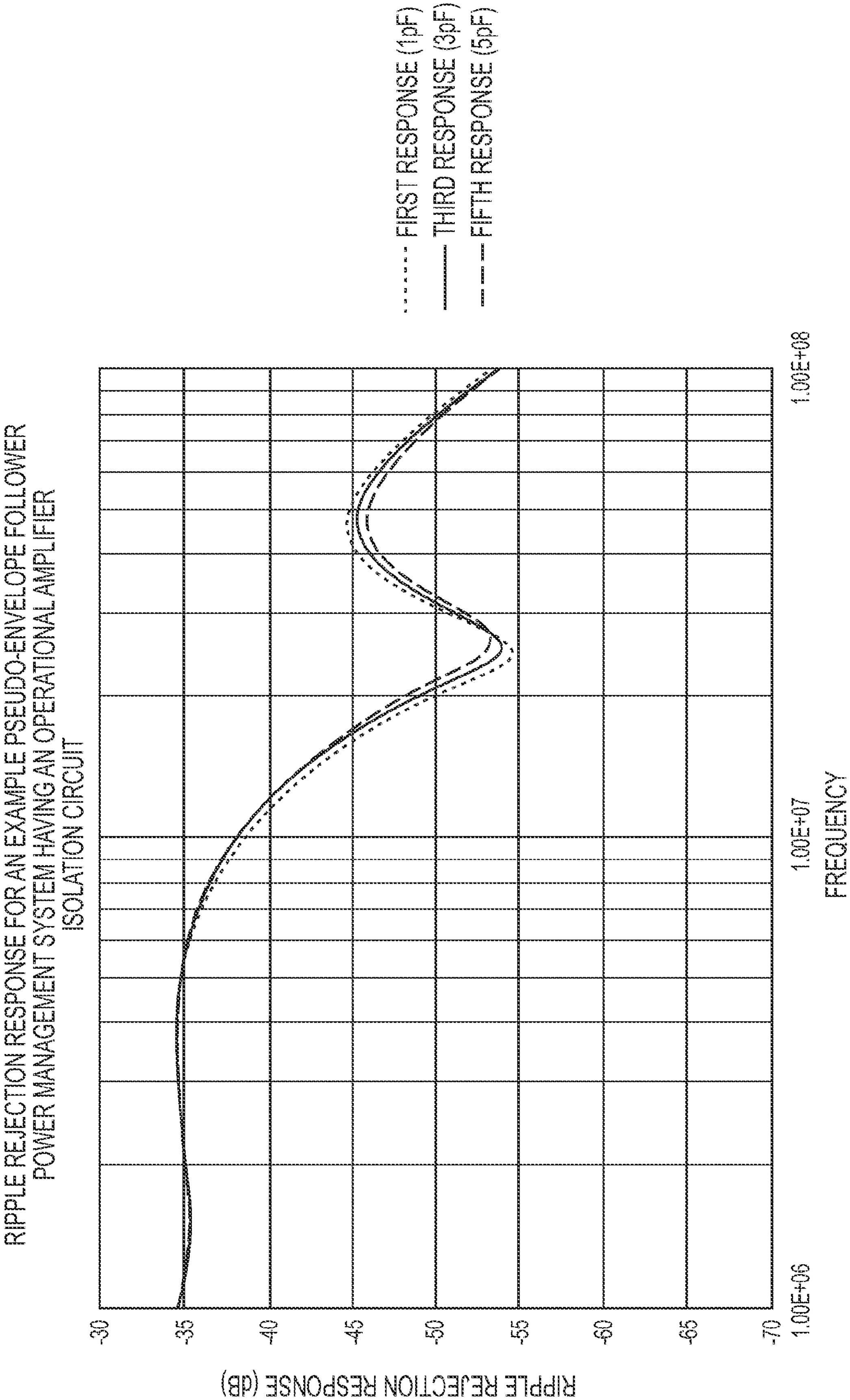
FIG. 28A depicts example ripple rejection response curves for an example pseudo-envelope follower power management system having an operational amplifier isolation circuit.

By way of example, and not by limitation, FIG. 28A depicts the ripple rejection response characteristics of an embodiment of the pseudo-envelope follower power management systems similar to the pseudo-envelope follower power management systems depicted in FIGS. 23A-D, where the open loop ripple compensation assist circuit 414, depicted in FIGS. 23A-D, is similar to the open loop ripple compensation assist circuit 414B, depicted in FIG. 27A. For the sake of illustration, and not by way of limitation, the bias resistance, $R_0$, of the bias resistor 452 is substantially equal to 500Ω, and the bias capacitance, $C_0$, of the bias capacitor 454 is substantially equal to 100 pF. For the sake of simplicity, and not by way of limitation, the ripple rejection response curves are based on configuring the resistance values of the filter resistor 458 and the feedback resistor 462 such that $R_1=R_2$. In addition, for the sake of simplicity, and not by way of limitation, the ripple rejection response curves are based on configuring the capacitance values of the filter capacitor 460 and the feedback capacitor 464 such that $C_1=C_2$.

FIG. 28A depicts a first ripple rejection response curve labeled "FIRST RESPONSE (1 pF)," a second ripple rejection response curve labeled "SECOND RESPONSE (3 pF)," and a third ripple rejection response curve labeled "THIRD RESPONSE (5 pF)" for a pseudo-envelope follower power management system similar to the pseudo-envelope follower power management systems depicted in FIGS. 23A-D, where the open loop ripple compensation assist circuit 414, depicted in FIGS. 23A-D, is similar to the open loop ripple compensation assist circuit 414B, depicted in FIG. 27A. The first ripple rejection response curve is for the case where the filter capacitance, $C_1$ and the feedback capacitance, $C_2$ are substantially equal to 1 pF, ($C_1=C_2=1$ pF), and the filter resistance $R_1$ and the feedback resistance, $R_2$ are substantially equal to 26.5 KΩ, ($R_1=R_2=26.5$ KΩ). Referring back to the mapping between the elements of equation (7) and equation (9), for $R_1=R_2=26.5$ KΩ and $C_1=C_2=1$ pF, the open loop ripple compensation assist circuit 414B provides a high pass filtering response, where the first corner frequency, $f_{c1}$, and the second corner frequency, $f_{C2}$, are approximately 6.003 MHz. The second ripple rejection response curve is for the case where the filter capacitance, $C_1$ and the feedback capacitance, $C_2$ are substantially equal to 3 pF, ($C_1=C_2=3$ pF), and the filter resistance $R_1$ and the feedback resistance, $R_2$ are substantially equal to 26.5 KΩ ($R_1=R_2=8.3$ KΩ). Referring back to the mapping between the elements of equation (7) and equation (9), for $R_1=R_2=8.8$ KΩ and $C_1=C_2=3$ pF, the open loop ripple compensation assist circuit 414B provides a high pass filtering response, where the first corner frequency, $f_{c1}$, and the second corner frequency, $f_{C2}$, are approximately 6.026 MHz. The third ripple rejection response curve is for the case where the filter capacitance, $C_1$ and the feedback capacitance, $C_2$ are substantially equal to 5 pF, ($C_1=C_2=5$ pF), and the filter resistance $R_1$ and the feedback resistance, $R_2$ are substantially equal to 5.3 KΩ, ($R_1=R_2=8.3$ KΩ). Referring back to the mapping between the elements of equation (7) and equation (9), for $R_1=R_2=5.3$ KΩ and $C_1=C_2=5$ pF, the open loop ripple compensation assist circuit 414B provides a high pass filtering response, where the first corner frequency, $f_{c1}$, and the second corner frequency, $f_{C2}$, are approximately 6.003 MHz. The first ripple rejection response curve, the second ripple rejection response curve, and the third ripple rejection response curve are substantially similar with respect to placement, width, and depth of the notch in the ripple rejection response of the above-described pseudo-envelope follower power management systems.

As depicted in FIG. 28A, the ripple rejection response curves for the embodiments of the pseudo-envelope follower power management systems similar to the pseudo-envelope follower power management systems, depicted in FIGS. 23A-D, that include the open loop ripple compensation assist circuit 414B, depicted in FIG. 27A, which includes the operational amplifier output isolation circuit 446, are substantially insensitive to the values of the filter resistance, $R_1$, the feedback resistance, $R_2$, the filter capacitance, $C_1$, and the feedback capacitance, $C_2$. In addition, the depth of the notch in the first ripple rejection response curve, the second ripple rejection response curve, and the third ripple rejection response curve are substantially similar. Thus, advantageously, the values of the filter resistance, $R_1$, the feedback resistance, $R_2$, the filter capacitance, $C_1$, and the feedback capacitance, $C_2$. filter resistance, $R_1$, the feedback resistance, $R_2$, the filter capacitance, $C_1$, the feedback capacitance, $C_2$, of the open loop ripple compensation assist circuit 414B may be selected such that parasitic capacitances and resistances present in the layout and circuitry of the example pseudo-envelope follower power management system minimally impact the location, width, and depth of the notch.

Figure 28B:
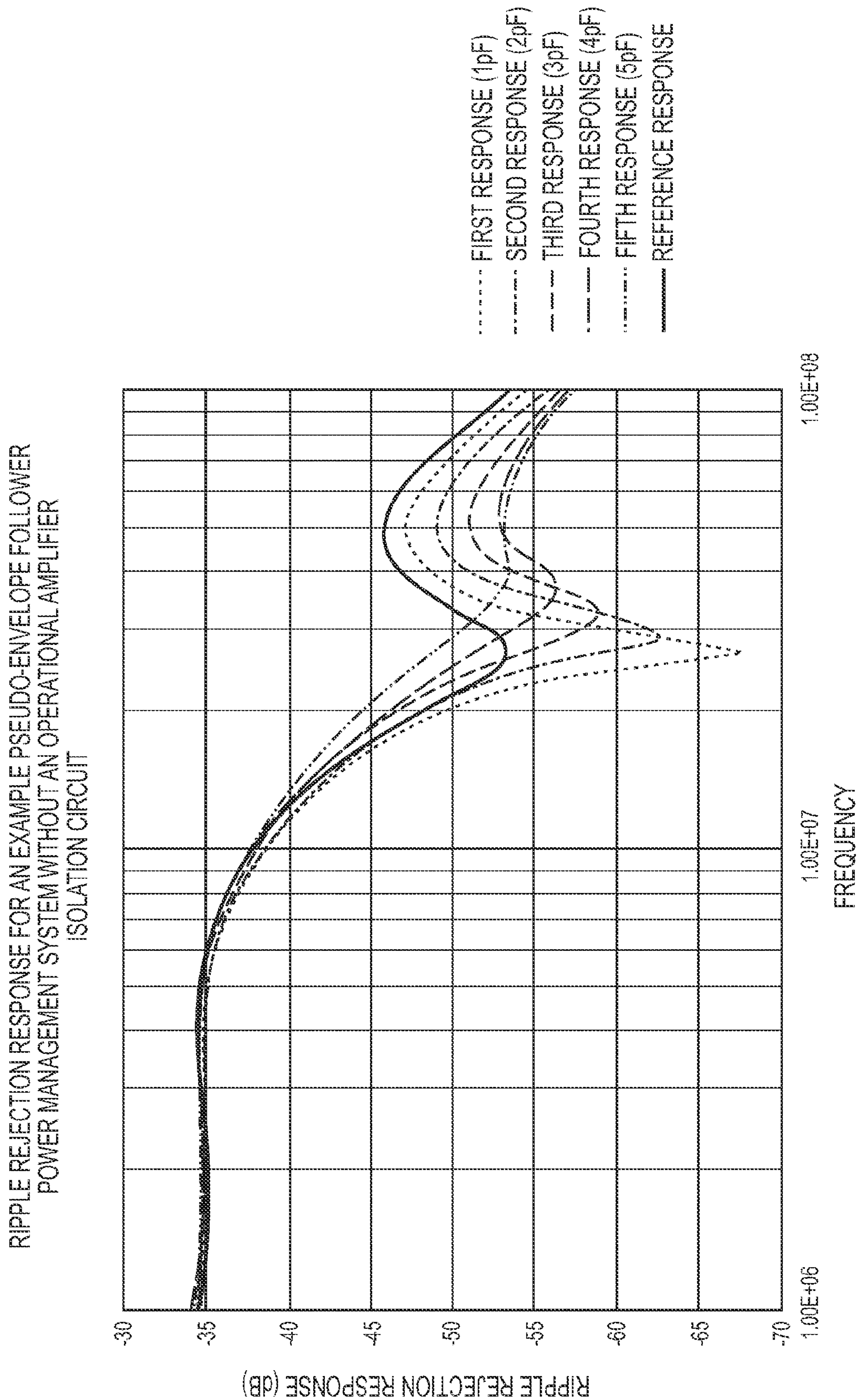
FIG. 28B depicts example ripple rejection response curves for an example pseudo-envelope follower power management system not having an operational amplifier isolation circuit.

As another non-limiting example, FIG. 28B depicts ripple rejection response curves for an embodiment of the pseudo-envelope follower power management systems similar to the pseudo-envelope follower power management systems depicted in FIGS. 23A-D, where the open loop ripple compensation assist circuit 414, depicted in FIGS. 23A-D, is similar to the open loop ripple compensation assist circuit 414C, depicted in FIG. 27B. In addition, FIG. 28 also depicts a reference ripple rejection curve, labeled "REFERENCE RESPONSE," which is the reference rejection response of the open loop ripple compensation assist circuit 414B, depicted in FIG. 27A, for the case where the filter capacitance, $C_1$ and the feedback capacitance, $C_2$ are substantially equal to 5 pF, ($C_1=C_2=5$ pF), and the filter resistance $R_1$ and the feedback resistance, $R_2$ are substantially equal to 5.3 KΩ, ($R_1=R_2=8.3$ KΩ).

FIG. 28B depicts a ripple rejection response curve, labeled "REFERENCE RESPONSE," that corresponds to, for the embodiment of the pseudo-envelope follower power management systems, depicted in FIG. 27A, where the capacitance values of the filter capacitor 460 and the feedback capacitor 464 such that $C_1=C_2=5$ pF and the resistance values of the filter resistor 458 and the feedback resistor 462 are substantially set such that $R_1=R_2=5.3$KΩ. FIG. 28A further depicts a first ripple rejection response curve labeled "FIRST RESPONSE (1 pF)," a second ripple rejection response curve labeled "SECOND RESPONSE (2 pF)," a third ripple rejection response curve labeled "THIRD RESPONSE (3 pF)," a fourth ripple rejection response curve labeled "THIRD RESPONSE (4 pF)" and a fifth ripple rejection response curve labeled "THIRD RESPONSE (5 pF)" for a pseudo-envelope follower power management system similar to the pseudo-envelope follower power management systems depicted in FIGS. 23A-D, where the open loop ripple compensation assist circuit 414, depicted in FIGS. 23A-D, is similar to the open loop ripple compensation assist circuit 414C, depicted in FIG. 27B.

The first ripple rejection response curve is for the case where the filter capacitance, $C_1$ and the feedback capacitance, $C_2$ are substantially equal to 1 pF, ($C_1$=$C_2$=1 pF), and the filter resistance $R_1$ and the feedback resistance, $R_2$ are substantially equal to 26.5 KΩ, ($R_1$=$R_2$=26.5 KΩ).

The second ripple rejection response curve is for the case where the filter capacitance, $C_1$ and the feedback capacitance, $C_2$ are substantially equal to 2 pF, ($C_1$=$C_2$=2 pF), and the filter resistance $R_1$ and the feedback resistance, $R_2$ are substantially equal to 13.25 KΩ, ($R_1$=$R_2$=13.25 KΩ).

The third ripple rejection response curve is for the case where the filter capacitance, $C_1$ and the feedback capacitance, $C_2$ are substantially equal to 3 pF, ($C_1$=$C_2$=3 pF), and the filter resistance $R_1$ and the feedback resistance, $R_2$ are substantially equal to 8.8 KΩ, ($R_1$=$R_2$=8.8 KΩ).

The fourth ripple rejection response curve is for the case where the filter capacitance, $C_1$ and the feedback capacitance, $C_2$ are substantially equal to 3 pF, ($C_1$=$C_2$=4 pF), and the filter resistance $R_1$ and the feedback resistance, $R_2$ are substantially equal to 6.6 KΩ, ($R_1$=$R_2$=6.6 KΩ).

The fifth ripple rejection response curve is for the case where the filter capacitance, $C_1$ and the feedback capacitance, $C_2$ are substantially equal to 5 pF, ($C_1$=$C_2$=5 pF), and the filter resistance $R_1$ and the feedback resistance, $R_2$ are substantially equal to 5.3 KΩ, ($R_1$=$R_2$=5.3 KΩ).

In contrast to the ripple rejection response curves depicted in FIG. 28A, ripple rejection response curves, depicted in FIG. 28B, vary substantially based on the values of the filter resistance, $R_1$, the feedback resistance, $R_2$, the filter capacitance, $C_1$, the feedback capacitance, $C_2$. For example, the notch depth and location of the first ripple rejection response curve labeled "FIRST RESPONSE (1 pF), depicted in FIG. 28B, is substantially different than the location, width, and depth of the notch of the first ripple rejection response curve labeled "FIFTH RESPONSE (5 pF), depicted in FIG. 28B. In addition, advantageously, the typical depth of the notch in the first ripple rejection response curve, the second ripple rejection response curve labeled, the third ripple rejection response curve, the fourth ripple rejection response curve, and the fifth ripple rejection response curve, depicted in FIG. 28B, is deeper than the "Reference Response," which represents the ripple rejection response curves obtained with the open loop ripple compensation assist circuit 414B.

FIG. 29A depicts an embodiment of the programmable delay circuitry 432, depicted in FIG. 24, as the programmable delay circuitry 432A, where the embodiment of the programmable delay circuitry 432A includes both fixed delay circuitry 638 and variable delay circuitry 640A. The fixed delay circuitry 638 includes an input stage 642 including an input node 642A, a first PFET 644, $PFET_1$, a first NFET 646, $NFET_1$, a first fixed current source 648, a second fixed current source 650, and a first fixed delay capacitor 652. The first fixed delay capacitor 652 has a first delay capacitance, $C_{DELAY1}$. The input node 642A of the input stage 642 is configured to receive an input voltage, $V_{IN}$, having a digital logic level signal, where the digital logic level signal is to be delayed by the programmable delay circuitry 432A. The input stage 642 is formed by coupling the gate of the first PFET 644, $PFET_1$, and the gate of the first NFET 646, $NFET_1$, to the input node 642A. The first fixed current source 648 is coupled between the circuit supply voltage, $V_{DD}$, and the source of the first PFET 644, $PFET_1$. The second fixed current source 650 is coupled between the source of the first NFET 646, $NFET_1$, and ground. The first fixed delay capacitor 652 is coupled between ground and the drain of the first PFET 644, $PFET_1$, and the drain of the first NFET 646. During normal operation, when the input voltage, $V_{IN}$, at the input node 642A is sufficiently low such that the input voltage, $V_{IN}$ is substantially equal to a logic low threshold voltage, the first PFET 644, $PFET_1$, is configured to be in a conducting state and the first NFET 646, $NFET_1$, is configured to be in a non-conducting state. When the first PFET 644, $PFET_1$, is turned on, the first fixed current source 648 sources a fixed bias current, $I_{BIAS}$, to the first fixed delay capacitor 652 with a first fixed capacitor current, $I_{C1}$. Assuming that most of the first fixed bias current, $I_{BIAS}$, from the first fixed current source 648 is used to charge the first fixed delay capacitor 652, the first fixed capacitor current, $I_{C1}$, is substantially equal to the fixed bias current, $I_{BIAS}$, provided from the first fixed current source 648 through first PFET 644, $PFET_1$. As the first fixed delay capacitor 652 is charged, the first delay voltage, $V_{D1}$, continues to increase and eventually rises above a voltage level that is greater than a logic high threshold voltage that may trigger an action by the variable delay circuitry 640A.

Otherwise, when the input voltage, $V_{IN}$, at the input node 642A is sufficiently high such that the input voltage, $V_{IN}$ is substantially equal to a logic high threshold voltage, the first PFET 644, $PFET_1$, is configured to be in a non-conducting state and the first NFET 646, $NFET_1$, is configured to be in a conducting state. When the first NFET 646, $NFET_1$, is turned on, the second fixed current source 650 sinks a fixed bias current, $I_{BIAS}$, from the first fixed delay capacitor 652 to generate the first fixed capacitor current, $I_{C1}$, of opposite magnitude than when the first fixed delay capacitor 652 is being charged by the first fixed current source 648. Assuming that most of the fixed bias current, $I_{BIAS}$, sunk through the first NFET 646, $NFET_1$ by the second fixed current source 650 is used to discharge the first fixed delay capacitor 652, the magnitude of the first fixed capacitor current, $I_{C1}$, is substantially equal to the magnitude of the fixed bias current, $I_{BIAS}$, sunk by the second fixed current source 650 through first NFET 646, $NFET_1$. As the first fixed delay capacitor 652 is discharged, the first delay voltage, $V_{D1}$, continues to decreases and eventually falls below a voltage level that is less than a logic low threshold voltage that may trigger an action by the variable delay circuitry 640A.

Because the first fixed current source 648 and the second fixed current source 650 each source and sink, respectively, a current equal to the fixed bias current, $I_{BIAS}$, the first fixed delay capacitor 652 is charged and discharged at the same rate. The first fixed delay time associated with the fixed delay circuitry 638 is due to the generation of the first delay voltage, $V_{D1}$. Because the current sourced by the fixed current source 648 and sunk by the fixed current source 640 are substantially equal, the rise time and fall time of the first delay voltage, $V_{D1}$, are substantially equal. Effectively, the first fixed delay time is due to the time required to propagate the digital logic state represented by the input voltage, $V_{IN}$, through the fixed delay circuitry 638 and provide first delay voltage, $V_{D1}$, that represents a digital logic state to an input stage 654 of the variable delay circuitry 640A.

The variable delay circuitry 640A includes the input stage 654 having an input node 654A coupled to the drain of the first PFET 644, $PFET_1$, the drain of the first NFET 646, $NFET_1$, and the first fixed delay capacitor 652. The variable delay circuitry 640A further includes a second PFET 656, $PFET_2$, a second NFET 658, $NFET_2$, a first variable current source 660, a second variable current source 662, and a second fixed delay capacitor 664. The second fixed delay capacitor 664 has a second delay capacitance, $C_{DELAY2}$.

The input stage 654 of the variable delay circuitry 640A is formed by coupling the gate of the second PFET 656, $PFET_2$, and the gate of the second NFET 658, $NFET_2$, to the input node 654A. The variable delay circuitry 640A is further formed by coupling the first variable current source 660 between the circuit supply voltage, $V_{DD}$, and the source of the second PFET 656, $PFET_2$, such that the first variable current source 660 may provide a variable bias current, $I_{BIAS\_VAR}$, to the source of the second PFET 656, $PFET_2$ when the second PFET 656, $PFET_2$, is in a conducting state. In addition, the second variable current source 662 is coupled between the source of the second NFET 658, $NFET_2$, and ground such that the second variable current source 662 may sink a variable bias current, $I_{BIAS\_VAR}$, from the source of the second NFET 658, $NFET_2$, when the second NFET 658, $NFET_2$, is in a conducting state. The second fixed delay capacitor 664 is coupled between ground and the drain of the second PFET 656, $PFET_2$, and the drain of the second NFET 658.

In addition, the variable delay circuitry 640A further includes an output buffer stage 666 that includes a third PFET 668, $PFET_3$ operably coupled to a third NFET 670, $NFET_3$ to form an input node 666A. The output buffer stage 666 includes an input node 666A formed by coupling the gate of the third PFET 668, $PFET_3$, to the gate of the third NFET 670, $NFET_3$. The source of the third PFET 668, $PFET_3$, is couple to the circuit supply voltage, $V_{DD}$. The source of the third NFET 670, $NFET_3$, is coupled to ground. The output buffer stage 666 further includes an output buffer stage output 672 that corresponds to the output of the programmable delay circuitry 432A. The output buffer stage output 672 may be formed by coupling the drain of the third PFET 668, $PFET_3$, to the drain of the third NFET 670, $NFET_3$. The output buffer stage 666 is configured to generate an output voltage, $V_{OUT}$, at the output buffer stage output 672. Generally, the output voltage, $V_{OUT}$, generated by the output buffer stage 666 at the output buffer stage output 672 will represent either a digital logic high state or a digital logic low state. For example, when the output voltage, $V_{OUT}$, is substantially equal to the circuit supply voltage, $V_{DD}$, the output voltage, $V_{OUT}$, represents a digital logic high state. When the output voltage, $V_{OUT}$, is substantially equal to the ground voltage, the output voltage, $V_{OUT}$, represents a digital logic low state.

During operation of the variable delay circuitry 640A, a second delay voltage, $V_{D2}$, increases as the second fixed delay capacitor 664 is charged and decreases as the second fixed delay capacitor 664 is discharged. When the second delay voltage, $V_{D2}$, is sufficiently low such that the second delay voltage, $V_{D2}$, is substantially equal to or below a logic low threshold voltage, the third PFET 668, $PFET_3$, is configured to be in a conducting state and the third NFET 670, $NFET_3$ is configured to be in a non-conducting state. In this case, when the third PFET 668, $PFET_3$, is turned on, the output buffer stage output 672 is coupled to the circuit supply voltage, $V_{DD}$, via the third PFET 668, $PFET_3$. As a result, the output voltage, $V_{OUT}$, at the output buffer stage output 672 is substantially equal to the circuit supply voltage, $V_{DD}$, and the output voltage, $V_{OUT}$, represents a digital logic high state.

However, when the second delay voltage, $V_{D2}$, is sufficiently high such that the second delay voltage, $V_{D2}$, is substantially equal to or above a logic high threshold voltage, the third PFET 668, $PFET_3$, is configured to be in a non-conducting state and the third NFET 670, $NFET_3$ is configured to be in a conducting state. In this case, the third NFET 670, $NFET_3$, is turned on and the output buffer stage output 672 is coupled to ground via the third NFET 670, $NFET_3$. As a result, the output voltage, $V_{OUT}$, at the output buffer stage output 672 is substantially equal to the ground voltage, and the output voltage, $V_{OUT}$, represents a digital logic low state.

During normal operation, when the first delay voltage, $V_{D1}$, at the input node 654A is sufficiently low to be equal to or lower than a logic low threshold voltage, the second PFET 656, $PFET_2$, is configured to be in a conducting state and the second NFET 658, $NFET_2$, is configured to be in a non-conducting state. Accordingly, when the second PFET 656, $PFET_2$, is turned on, the first variable current source 660 sources the variable bias current, $I_{BIAS\_VAR}$, through the second PFET 656, $PFET_2$, to charge the second fixed delay capacitor 664 with a second fixed capacitor current, $I_{C2}$. Assuming that most of the variable bias current, $I_{BIAS\_VAR}$, from the first variable current source 660 is used to charge the second fixed delay capacitor 664, the second fixed capacitor current, $I_{C2}$ is substantially equal to the variable bias current, $I_{BIAS\_VAR}$, provided by the first variable current source 660. As the second fixed delay capacitor 664 is charged by the variable bias current, $I_{BIAS\_VAR}$, the magnitude of the second delay voltage, $V_{D2}$, continues to increase and eventually rises above a voltage level that is greater than the logic high threshold voltage that may trigger an action by the output buffer stage 666. For example, once the second delay voltage, $V_{D2}$, reaches or exceeds the logic high threshold voltage, the output buffer stage 666 will trigger so as to generate an output voltage, $V_{OUT}$ that represents a digital logic low state.

Otherwise, during normal operation, when the first delay voltage, $V_{D1}$, at the input node 654A is sufficiently high to be equal to exceed a logic high threshold voltage, the second PFET 656, $PFET_2$, is configured to be in a non-conducting state and the second NFET 658, $NFET_2$, is configured to be in a conducting state. Accordingly, when the second NFET 658, $NFET_2$, is turned on, the second variable current source 662 sinks the variable bias current, $I_{BIAS\_VAR}$, through the second NFET 658, $NFET_2$, to discharge the second fixed delay capacitor 664 with the second fixed capacitor current, $I_{C2}$, by removing charge from the second fixed delay capacitor 664. Assuming that most of the variable bias current, $I_{BIAS\_VAR}$, sunk by the second variable current source 662 is used to discharge the second fixed delay capacitor 664, the magnitude of the second fixed capacitor current, $I_{C2}$, that removes charge from the second fixed delay capacitor 664 is substantially equal to the variable bias current, $I_{BIAS\_VAR}$, sunk by second variable current source 662. As the second fixed delay capacitor 664 is discharged by the variable bias current, $I_{BIAS\_VAR}$, the magnitude of the second delay voltage, $V_{D2}$, continues to decrease or eventually fall below a voltage level that is less than the logic low threshold voltage that may trigger an action by the output buffer stage 666. For example, once the second delay voltage, $V_{D2}$, reaches or falls below the logic low threshold voltage, the output buffer stage 666 will trigger, and the output buffer stage 666 will generate an output voltage, $V_{OUT}$, that represents a digital logic high state.

The variable delay time provided by the variable delay circuitry 640A is created by the time period required to charge and discharge the second fixed delay capacitor 664 with the variable bias current, $I_{BIAS\_VAR}$, where the variable bias current, $I_{BIAS\_VAR}$, varies in magnitude. As depicted in FIG. 29A, the first variable current source 660 and the second variable current source 662 are each configured to respectively source and sink currents that are both equal to the variable bias current, $I_{BIAS\_VAR}$. As a result, the variable delay time of the variable delay circuitry 640A is symmetrically divided into equal parts. However, in some embodiments, the first variable current source 660 and the second variable current source 662 may source and sink different magnitudes of current. Depending upon the magnitude of the variable bias current, $I_{BIAS\_VAR}$, the time to charge and discharge the second delay fixed capacitor 664 such that the magnitude of the second delay voltage, $V_{D2}$, changes logic state represented by the output voltage, $V_{OUT}$, at output buffer stage output 672 may change.

Furthermore, as depicted in FIG. 24, the controller 50 may be configured to control the programmable delay circuitry 432. Accordingly, although not depicted in FIG. 29A, in some embodiments of the programmable delay circuitry 432A, the controller 50 may be further configured to control the first variable current source 660 and the second variable current source 662 to set the magnitude of the variable bias current, $I_{BIAS\_VAR}$, and thereby the variable delay time provided by the variable delay circuitry 640A.

FIG. 29B depicts the programmable delay circuitry 432B, which is another embodiment of the programmable delay circuitry 432, depicted in FIG. 24. The embodiment of the programmable delay circuitry 432B, depicted in FIG. 29B, is similar to the programmable delay circuitry 432A, depicted in FIG. 29A, except the embodiment of the variable delay circuitry 640A, depicted in FIG. 29A, is replaced by the variable delay circuitry 640B, depicted in FIG. 29B.

As depicted in FIG. 29B, the programmable delay circuitry 432B is similar to the programmable delay circuitry 432A, depicted in FIG. 29A, except the first variable current source 660, the second variable current source 662, and the second fixed delay capacitor 664 are replaced, respectively, with a third fixed current source 674, a fourth fixed current source 678, and a variable delay capacitor 680. In addition, for the sake of clarity, and not by way of limitation, the voltage across the variable delay capacitor 680 is the third voltage, $V_{D3}$. The variable delay capacitor 680 having a variable delay capacitance $C_{DELAY\_VAR}$, where the capacitance value of the variable delay capacitance $C_{DELAY\_VAR}$, may be programmatically configured.

As discussed relative to the programmable delay circuitry 432A, the operational parameters of the programmable delay circuitry 432B may be configured by the controller 50, (not depicted in FIG. 29B), which is depicted in FIG. 24. For example, the variable delay capacitor 680 may be a capacitor array or a varactor under the control of the controller 50. Accordingly, as will be described, the controller 50 may be configured to increase the variable delay capacitance, $C_{DELAY\_VAR}$, of the variable delay capacitor 680 in order to increase the delay time provided by the programmable delay circuitry 432B. Likewise, the controller 50 may be configured to decrease the variable delay capacitance, $C_{DELAY\_VAR}$, of the variable delay capacitor 680 to decrease the delay time provided by the programmable delay circuitry 432B.

Continuing with the description of the programmable delay circuitry 432B, depicted in FIG. 29B, the function and operation of the fixed delay circuitry 638 of the programmable delay circuitry 432B, and thereby the fixed delay time provided by the fixed delay circuitry 638, are substantially the same in the programmable delay circuitry 432B, depicted in FIG. 29B. Accordingly, description of the fixed delay circuitry 638 is omitted.

As discussed above, the variable delay circuitry 640B is similar to the variable delay circuitry 640A except that the variable delay circuitry 640B replaces the first variable current source 660, the second variable current source 662, and the second fixed delay capacitor 664 of the variable delay circuitry 640A, with the third fixed current source 674, the fourth fixed current source 678, and the variable delay capacitor 680, respectively. Thus, the variable delay circuitry 640B includes the input stage 654 having the input node 654A, the second PFET 656, $PFET_2$, the second NFET 658, $NFET_2$, the third fixed current source 674, the fourth fixed current source 678, and the variable delay capacitor 680 having a variable delay capacitance, $C_{DELAY\_VAR}$, where the controller 50 (not shown) may be configured to change the capacitance value of the variable delay capacitance, $C_{DELAY\_VAR}$.

Similar to the variable delay circuitry 640A, the variable delay circuitry 640B also includes the output buffer stage 666 that includes the third PFET 668, $PFET_3$, and the third NFET 670, $NFET_3$. The output buffer stage 666 includes the input node 666A formed by coupling the gate of the third PFET 668, $PFET_3$, to the gate of the third NFET 670, $NFET_3$. The source of the third PFET 668, $PFET_3$, is coupled to the circuit supply voltage, $V_{DD}$. The source of the third NFET 670, $NFET_3$, is coupled to ground. The output buffer stage output 672 of the output buffer stage 666, which is also the output of the programmable delay circuitry 432B, is formed by coupling the drain of the third PFET 668, $PFET_3$, to the drain of the third NFET 670, $NFET_3$. The output buffer stage 666 is configured to generate an output voltage, $V_{OUT}$, at the output buffer stage output 672. For example, as will be discussed, a third delay voltage, $V_{D3}$, across the variable delay capacitor 680 increases and decreases at a rate that depends on the capacitance value of the variable delay capacitance, $C_{DELAY\_VAR}$, of the variable delay capacitor 680 and the magnitude of a variable capacitance current, $I_{C\_VAR}$, that charges and discharges the variable delay capacitor 680. When the third delay voltage, $V_{D3}$, across the variable delay capacitor 680 is sufficiently low such that the third delay voltage, $V_{D3}$ is substantially equal to a logic low threshold voltage, the third PFET 668, $PFET_3$, is configured to be in a conducting state and the third NFET 670, $NFET_3$, is configured to be in a non-conducting state. In this case, when the third PFET 668, $PFET_3$, is turned on, the output buffer stage output 672 is coupled to the circuit supply voltage, $V_{DD}$. As a result, the output voltage, $V_{OUT}$, at the output buffer stage output 672 is substantially equal to the circuit supply voltage, $V_{DD}$, when the third PFET 668, $PFET_3$, is in the conducting state. However, when the third delay voltage, $V_{D3}$, across the variable delay capacitor 680 is sufficiently high such that the third delay voltage, $V_{D3}$ is substantially equal to a logic high threshold voltage, the third NFET 670, $NFET_3$, is configured to be in a conducting state and the third PFET 668, $PFET_3$, is configured to be in a non-conducting state. In this case, when the third NFET 670, $NFET_3$, is turned on, the output buffer stage output 672 is coupled to ground. As a result, the output voltage, $V_{OUT}$, at the output buffer stage output 672 is substantially equal to the ground voltage when the third NFET 670, $NFET_3$, is turned on. In this way, the output voltage, $V_{OUT}$, at the output buffer stage output 672 toggles between a digital logic high state and a logic log state.

Continuing with the description of the variable delay circuitry 640B, depicted in FIG. 29B, the variable delay circuitry 640B includes an input stage 654 having an input node 654A configured to receive the signal generated by the charging and discharging of the first fixed delay capacitor 652, where the first fixed delay capacitor 652 has a capacitance value substantially equal to the first fixed delay capacitance, $C_{DELAY1}$. The voltage generated across the first fixed delay capacitor 652 is substantially equal to the first delay voltage, $V_{D1}$. The input stage 654 is formed by coupling the gate of the second PFET 656, $PFET_2$, and the gate of the second NFET 658, $NFET_2$, to the input node 654A. The third fixed current source 674 is coupled between the circuit supply voltage, $V_{DD}$, and the source of the second PFET 656, $PFET_2$. The fourth fixed current source 678 is coupled between the source of the second NFET 658, $NFET_2$, and ground. The variable delay capacitor 680 is coupled between ground and the drain of the second PFET 656, $PFET_2$, and the drain of the second NFET 658.

During normal operation, when the first delay voltage, $V_{D1}$, at the input node 654A is sufficiently low, the second PFET 656, $PFET_2$, is configured to be in a conducting state. At the same time, when the first delay voltage, $V_{D1}$, at the input node 654A is sufficiently low to turn on the second PFET 656, $PFET_2$, the second NFET 658, $NFET_2$, is configured to be in a non-conducting state. When the second PFET 656, $PFET_2$, is turned on, the third fixed current source 674 sources a second fixed bias current, $I_{BIAS2}$, to charge the variable delay capacitor 680. The second fixed bias current, $I_{BIAS2}$, charges the variable delay capacitor 680 with a variable capacitance current, $I_{C\_VAR}$. The rate of change in the third delay voltage, $V_{D3}$, across the variable delay capacitor 680 depends upon the capacitance value of the variable delay capacitance, $C_{DELAY\_VAR}$, of the variable delay capacitor 680 and the magnitude of the variable capacitance current, $I_{C\_VAR}$. Assuming that most of the second fixed bias current, $I_{BIAS2}$, from the third fixed current source 674 is used to charge the variable delay capacitor 680, the variable capacitance current, $I_{C\_VAR}$, is substantially equal to the second fixed bias current, $I_{BIAS2}$. As the variable delay capacitor 680 is charged by the second fixed bias current, $I_{BIAS2}$, the magnitude of the third delay voltage, $V_{D3}$, increases. As described above, after the third delay voltage, $V_{D3}$, increases to a logic high threshold voltage, the third PFET 668, $PFET_3$, is turned off and the third NFET 670, $NFET_3$, is turned on, which changes the output voltage, $V_{OUT}$, at the output buffer stage output 672 to be substantially equal to ground.

Otherwise, when the first delay voltage, $V_{D1}$, at the input node 654A is sufficiently high, the second NFET 658, $NFET_2$, is configured to be in a conducting state and the fourth fixed current source 678 is permitted to sink a second fixed bias current, $I_{BIAS2}$, in order to discharges the variable delay capacitor 680. At the same time, when the first delay voltage, $V_{D1}$, at the input node 654A is sufficiently low to turn on the second NFET 658, $NFET_2$, the second PFET 656, $PFET_2$, is configured to be in a non-conducting state. When the second NFET 658, $NFET_2$, is turned on, the fourth fixed current source 678 sinks the second fixed bias current, $I_{BIAS2}$, to discharge the variable delay capacitor 680 with a current substantially equal to $I_{C\_VAR}$. The rate of change in the third delay voltage, $V_{D3}$, across the variable delay capacitor 680 depends upon the capacitance value of the variable delay capacitance, $C_{DELAY\_VAR}$, of the variable delay capacitor 680 and the magnitude of the variable capacitance current, $I_{C\_VAR}$. Assuming that most of the second fixed bias current, $I_{BIAS2}$, from the fourth fixed current source 678 is used to discharge the variable delay capacitor 680, the variable capacitance current, $I_{C\_VAR}$, is substantially equal to the second fixed bias current, $I_{BIAS2}$. As the variable delay capacitor 680 is discharged by the second fixed bias current, $I_{BIAS2}$, the magnitude of the third delay voltage, $V_{D3}$, decreases. As described above, after the third delay voltage, $V_{D3}$, decreases to a logic low threshold voltage, the third NFET 670, $NFET_3$, is turned off and the third PFET 668, $PFET_3$, is turned on, which changes the output voltage, $V_{OUT}$, at the output buffer stage output 672 to be substantially equal to the circuit supply voltage, $V_{DD}$.

The variable delay time provided by the variable delay circuitry 640B is created by the time period required to charge and discharge the variable delay capacitor 680, which depends upon the capacitance value of the variable capacitance, $C_{DELAY\_VAR}$, and the magnitude of the second fixed bias current, $I_{BIAS2}$. Because the variable delay capacitor 680 is either charged or discharged using a current substantially equal to the second fixed bias current, $I_{BiAS2}$, either sourced by the third fixed current source 674 or sunk by the fourth fixed current source 678, the variable time period required for the third delay voltage, $V_{D3}$, to increase to the logic high threshold voltage or decrease to the logic high threshold voltage used to trigger the operation of the operation of the output buffer stage 666 is dependent upon the variable capacitance, $C_{DELAY\_VAR}$ of the variable delay capacitor 680.

As previously discussed with respect to FIG. 24, although not depicted in FIG. 29B, the controller 50 may be configured to control the programmable delay circuitry 432B. Accordingly, although not depicted in FIG. 29B, in some embodiments of the programmable delay circuitry 432B, the controller 50 may be further configured to control the variable capacitance, $C_{DELAY\_VAR}$ of the variable delay capacitor 680 in order to change the delay time provided by the programmable delay circuitry 432B. Assuming that the third fixed current source 674 and the fourth fixed current source 678 respectively source and sink the second fixed bias current, $I_{BIAS2}$, where the second fixed bias current, $I_{BIAS2}$, is constant, the variable delay capacitor current, $I_{C\_VAR}$, will likewise be constant. Consequently, the variable delay time provided by the variable delay circuitry 640B when charging the variable delay capacitor 680 is substantially equal to the variable delay time provided by the variable delay circuitry 640B when discharging the variable delay capacitor 680. In alternative embodiments of the variable delay circuitry 640B, the third fixed current source 674 and the fourth fixed current source 678 could be configured to source and sink different magnitudes of current. In this case, the variable delay time of the variable delay circuitry 640B would have a charging period and a discharging period, where the charging period would not equal the discharging period.

FIG. 30 depicts a programmable delay circuitry 432C, which is another embodiment of the programmable delay circuitry 432, depicted in FIG. 24. Although the controller 50 is not depicted in FIG. 30, similar to the programmable delay circuitry 432, depicted in FIG. 24, it will be understood that the controller 50, depicted in FIG. 35, may be configured to control, configure, align, or change the parameter values and functions of the various circuits and elements to be described as being part of or related to the embodiment of the programmable delay circuitry 432C, depicted in FIG. 30.

The programmable delay circuitry 432C, depicted in FIG. 30, is configured to delay a single digital logic level signal. It will be understood that embodiments of the programmable delay circuitry 432, depicted in FIG. 24, that are configured to delay multiple digital logic level signals may include multiple embodiments of the programmable delay circuitry 432C arranged in parallel to provide a delay signal path for each of the multiple digital logic level signals to be delayed.

In addition, total delay time provided by the programmable delay circuitry 432C may include a fixed delay time and a variable delay time, where the variable delay time may be configured based on the programmable delay parameter(s), as discussed above. In addition, the fixed delay time may be sub-divided and distributed between the input buffer circuit 682 and the variable delay circuitry 684.

As depicted in FIG. 30, the programmable delay circuitry 432C includes an input buffer circuit 682, a variable delay circuitry 684, a voltage divider circuit 686, and a bias current and mirror circuit 688. The input buffer circuit 682 may include a first input buffer circuit 690 having a first input buffer input 690A configured to receive an input voltage, $V_{IN}$, where the input voltage, $V_{IN}$, is a digital logic level signal. The digital logic signal may have either a digital logic high state or a digital logic low state. The digital logic signal may have either a digital logic high state or a digital logic low state. The first input buffer circuit 690 may include a first PFET 692, $PFET_1$, and a first NFET 694, $NFET_1$. The gate of the first PFET 692, $PFET_1$, and the gate of the first NFET 694, $NFET_1$, may be coupled to form the first input buffer input 690A of the first input buffer circuit 690. The source of the first PFET 692, $PFET_1$, may be coupled to the circuit supply voltage, $V_{DD}$. The source of the first NFET 694, $NFET_1$, may be coupled to ground. The drain of the first PFET 692, $PFET_1$, and the drain of the first NFET 694, $NFET_1$, may be coupled to form a first input buffer output at a first voltage node 696.

The input buffer circuit 682 may further include a second input buffer circuit 698 operably coupled to the first input buffer output at the first voltage node 696. The second input buffer circuit 698 may include a second PFET 700, $PFET_2$, and a second NFET 702, $NFET_2$. The gate of the second PFET 700, $PFET_2$, and the gate of the second NFET 702, $NFET_2$, may be coupled to the drain of the first PFET 692, $PFET_1$, and the drain of the first NFET 694, $NFET_2$, at the first voltage node 696. The source of the second PFET 700, $PFET_2$, may be coupled to the circuit supply voltage, $V_{DD}$. The source of the second NFET 702, $NFET_2$, may be coupled to ground. The drain of the second PFET 700, $PFET_2$, and the drain of the second NFET 702, $NFET_2$, may be coupled to form a second input buffer output at a second voltage node 704.

During operation of the first input buffer circuit 690, when the input voltage, $V_{IN}$, at the first input buffer input 690A is sufficiently low such that the input voltage, $V_{IN}$ is substantially equal to or less than a logic low threshold voltage, the first PFET 692, $PFET_1$, is configured to be in a conducting state and couples the circuit supply voltage, $V_{DD}$, to the first voltage node 696. As a result, the voltage level at the first voltage node 696 is substantially equal to the circuit supply voltage, $V_{DD}$, and the first input buffer circuit 690 provides an output voltage level representative of a digital logic high state at the first voltage node 696. In addition, the first NFET 694, $NFET_1$, is configured to be in a non-conducting state when the input voltage, $V_{IN}$, at the first input buffer input 690A is sufficiently low such that the input voltage, $V_{IN}$ is substantially equal to or less than the logic low threshold voltage.

However, when the input voltage, $V_{IN}$, at the first input buffer input 690A is sufficiently high such that the input voltage, $V_{IN}$ is substantially equal to or greater than a logic high threshold voltage, the first NFET 694, $NFET_1$, is configured to be in a conducting state and couples the first voltage node 696 to ground. As a result, the voltage level at the first voltage node 696 is substantially equal to ground, and the first input buffer circuit 690 provides an output voltage level representative of a digital logic low state at the first voltage node 696. In addition, the first PFET 692, $PFET_1$, is configured to be in a non-conducting state when the input voltage, $V_{IN}$, at the first input buffer input 690A is sufficiently high such that the input voltage, $V_{IN}$ is substantially equal to or greater than the logic high threshold voltage.

In a similar fashion, the operation of the second input buffer circuit 698 is dependent on the voltage level at the first voltage node 696, which is coupled to the first input buffer output of the first input buffer circuit 690. Accordingly, when the first input buffer circuit 690 provides a digital logic low state at the first voltage node 696 such that the voltage level at the first voltage node 696 is substantially equal to or less than the logic low threshold voltage, the second PFET 700, $PFET_2$, is configured to be in a conducting state and couples the circuit supply voltage, $V_{DD}$, to the second voltage node 704. As a result, the voltage level at the second input buffer circuit 698 is substantially equal to the circuit supply voltage, $V_{DD}$, and the second input buffer circuit 698 provides a digital logic high state at the second voltage node 704. In addition, the second NFET 702, $NFET_2$, is configured to be in a non-conducting state when the first input buffer circuit 690 provides an output voltage level representative of a digital logic low state at the first voltage node 696.

However, in a similar fashion as the operation of the first input buffer circuit 690, when the first input buffer circuit 690 provides a digital logic high state at the first voltage node 696 such that the voltage level at the first voltage node 696 is substantially equal to or higher than the logic low threshold voltage, the second NFET 702, $NFET_2$, is configured to be in a conducting state and couples the second voltage node 704 to ground. As a result, the voltage level at the second input buffer circuit 698 is substantially equal to the ground voltage, and the second input buffer circuit 698 provides a digital logic low state at the second voltage node 704. In addition, the second PFET 700, $PFET_2$, is configured to be in a non-conducting state when the first input buffer circuit 690 provides an output voltage level representative of a digital logic high state at the first voltage node 696

It will be appreciated that the propagation time of the digital logic level signal, represented by the input voltage, $V_{IN}$, through the input buffer circuit may be considered as a first portion of a fixed delay provided by the programmable delay circuitry 432C and is a function of the switching time of the transistors. The first portion of the fixed delay time provided by the input buffer circuit 682 depends upon the switching time of the respective first input buffer circuit 690 and the second input buffer circuit 698. In some alternative embodiments of the programmable delay circuitry 432C, additional input buffer circuits, (not depicted in FIG. 30), may be added to the input buffer circuit 682 to increase the first portion of the fixed delay provided by the input buffer circuit 682. In addition to providing a first portion of the fixed delay time through the programmable delay circuitry 432C, the combination of the first input buffer circuit 690 and the second input buffer circuit 698, may also provide the further benefit of isolating analog characteristics of the input voltage, $V_{IN}$, that represents the digital logic level signal from the variable delay circuitry. In some embodiments of the programmable delay circuitry 432C, the number of input buffer circuits used to provide isolation between the input voltage, $V_{IN}$, and the variable delay circuitry 684 may result in improved controllability of the variable delay provided by the variable delay circuitry 684.

The variable delay circuitry 684 includes an input stage 706 including a third PFET 708, $PFET_3$, a third NFET 710, $NFET_3$, a fourth PFET 714, $PFET_4$, a fourth NFET 716, $NFET_4$, a fifth PFET 718, $PFET_5$, and a fifth NFET 718, $NFET_5$. As will be explained, a portion of the input stage 706 of the variable delay circuitry 684 may include a correction start voltage circuit 712 that is formed by the interconnections of the third PFET 708, $PFET_3$ and the third NFET 710, $NFET_3$, to the fourth PFET 714, $PFET_4$, and the fourth NFET 716, $NFET_4$. The variable delay circuitry 684 further includes a variable delay capacitor 722. In some embodiments, the variable delay capacitor 722 may be configured as a programmable capacitor array.

As depicted in FIG. 30, the variable delay capacitor 722 may be coupled between a third voltage node 724 and ground. The variable delay capacitor 722 is configured to have a variable delay capacitance, $C_{DELAY\_VAR}$. In addition, although not depicted in FIG. 30, the controller 50 (depicted in FIG. 24) may be configured to govern or set various parameters to adjust the capacitance value of the variable delay capacitance, $C_{DELAY\_VAR}$, in order to adjust the variable delay time, $T_{VARIABLE\_DELAY\_TIME}$, provided by the variable delay circuitry 684. For example, in some embodiments of the programmable delay circuitry 432C, the variable delay capacitor 722 may be configured to couple to the controller 50 (not shown), where the controller 50 is configured to control the capacitance value of the variable delay capacitance, $C_{DELAY\_VAR}$. in some embodiments of the programmable delay circuitry 432C, the variable delay capacitor 722 may be configured to increase as the value of a binary capacitor control word, CNTR_CD, increases, as described relative to FIG. 36.

For example, in some embodiments of the variable delay circuitry 684, the variable delay capacitor 722 may be configured as a programmable capacitor array. The programmable capacitor array may include multiple capacitors, where each of the capacitors is arranged in series with a switch element. Each switch element may have a switch state (open or closed) that may be controlled by the controller 50 such that the effective capacitance of the programmable capacitor array has a desired effective capacitance. In some embodiments, the programmable capacitor array may be a linear capacitor array, where each of the capacitors has the same value. In other embodiments, the programmable capacitor array may be a binary weighted capacitor array. The controller 50 may adjust the effective capacitance of the programmable capacitor array by controlling the switch state (open or closed) of each switch to combine different combinations of the multiple capacitors in parallel. Alternatively, the variable delay capacitor 722 may be a programmable varactor configured to be controlled by the controller 50. Depending on the topology and type of programmable capacitor, for example, the controller 50 may govern the effective capacitance of the programmable varactor by changing the distance between the two parallel plates that form the varactor or a voltage applied across the terminals of the varactor.

The variable delay circuitry 684 may further include an output buffer stage 726. By way of example, and not by way of limitation, the output buffer stage 726 depicted in FIG. 30 includes only one level of output buffering. Thus, as depicted in FIG. 30, the output buffer stage 726 includes a sixth PFET 728, PFET6, and a sixth NFET 730, $NFET_6$, operably coupled to form an output buffer having an output buffer output 732. The output buffer output 732 is formed by coupling the drain of the sixth PFET 728, PFET6, to the drain of the sixth NFET 730, $NFET_6$. The source of the sixth PFET 728, PFET6, is coupled to the circuit supply voltage, $V_{DD}$. The source of the sixth NFET 730, $NFET_6$ is coupled to ground.

However, similar to the input buffer circuit, some alternative embodiments of the variable delay circuitry 684 may include an embodiment of the output buffer stage 726 that includes multiple levels of output buffering in order to provide additional isolation between the interior circuitry of the variable delay circuitry 684 and the digital logic level signal to be generated by the programmable delay circuitry 432C. For example, some alternative embodiments of the variable delay circuitry 684 may include additional output buffering to improve the drive level at the output of the programmable delay circuitry 432C, where as depicted in FIG. 24, the programmable delay circuitry 432 is configured to drive the input of the buffer scalar 434 of the switch mode power supply converter 420.

The operation of the output buffer stage 726 depends upon the voltage level at the third voltage node 724. When the voltage level at the third voltage node 724 is equal to or less than the logic low threshold voltage such that the sixth PFET 728, $PFET_6$, is turned on and in the saturation state, the output buffer output 732 is effectively coupled to the circuit supply voltage, $V_{DD}$, through the sixth PFET 728, $PFET_6$. Simultaneously, the sixth NFET 730, $NFET_6$, is configured to be turned off when the sixth PFET 728, $PFET_6$ is turned on. As a result, the output buffer stage 726 provides an output voltage, $V_{OUT}$, substantially equal to the circuit supply voltage, $V_{DD}$, which represents a digital logic high state. Thus, when the voltage level at the third voltage node 724 is equal to or less than the logic low threshold voltage such that the sixth PFET 728, $PFET_6$ is turned, the output buffer stage 726 is triggered to transition from a digital logic low state to a digital logic low state at the output buffer output 732.

However, when the voltage level at the third voltage node 724 is equal to or greater than the logic high threshold voltage, such that the sixth NFET 730, $NFET_6$, is turned on and in the saturation state, the output buffer output 732 is effectively coupled to the ground through the sixth NFET 730, $NFET_6$. Simultaneously, the sixth PFET 728, $PFET_6$, is configured to be turned off when the sixth NFET 730, $NFET_6$ is turned on. As a result, the output buffer stage 726 provides an output voltage, $V_{OUT}$, substantially equal to ground, which represents a digital logic low state. Thus, when the voltage level at the third voltage node 724 is equal to or greater than the logic high threshold voltage such that the sixth PFET 728, $PFET_6$, is turned, the output buffer stage 726 is triggered to transition from a digital logic high state to a digital logic low state at the output buffer output 732.

The time period during which the digital logic level signal, represented by the voltage level at the third voltage node 724, propagates through the output buffer stage 726 may be a second portion of the fixed delay time provided by the programmable delay circuitry 432C. The second portion of the fixed delay time provided by the output buffer stage 726 depends on the switching time of the output buffer stage 726. Some alternative embodiments of the variable delay circuitry 684 may include additional output buffering. Accordingly, the propagation time through the output buffer stage of the variable delay circuitry 684 may be increased by addition of additional output buffering. Thus, the fixed delay time of the programmable delay circuitry 432C includes the first portion of the fixed delay time of the input buffer circuit 682 and the second portion of the fixed delay time of the output buffer stage 726.

Returning to the description of the variable delay circuitry 684 depicted in FIG. 30, to form the input stage 706 of the variable delay circuitry 684, the gate of the fourth PFET 714, $PFET_4$, and the gate of the fourth NFET 716, $NFET_4$, are coupled to the second input buffer output at the second voltage node 704. The source of the fourth PFET 714, $PFET_4$, is coupled to the drain of the fifth PFET 718, $PFET_5$. The source of the fifth PFET 718, $PFET_5$, is coupled to the circuit supply voltage, $V_{DD}$. The source of the fourth NFET 716, $NFET_4$, is coupled to the drain of the fifth NFET 720, $NFET_5$. The source of the fifth NFET 720, $NFET_5$, is coupled to ground. As will be described with respect to the operation of the voltage divider circuit 686 and the bias current and mirror circuit 688, the bias current and mirror circuit 688 is configured to generate a first gate voltage on the gate of the fifth PFET 718, $PFET_5$, such that the fifth PFET 718, $PFET_5$, is configured to provide a first bias current, $I_{BIAS\_1}$, when the fourth PFET 714, $PFET_4$, is turned on. Similarly, the bias current and mirror circuit 688 is further configured to generate a second gate voltage on the gate of the fifth NFET 720, $NFET_5$, such that the fifth NFET 720, $NFET_5$, is configured to sink a second bias current, $I_{BIAS\_2}$, when the fourth NFET 716, $PFET_4$, is turned on. The drain of the fourth PFET 714, $PFET_4$, is coupled to the drain of the fourth NFET 716, $NFET_4$, to provide an input stage output at the third voltage node 724. The variable delay capacitor 722 is coupled between the third voltage node 724 and ground. As a result, the variable delay capacitor 722 is coupled to the drain of the fourth PFET 714, $PFET_4$, the drain of the fourth NFET 716, $NFET_4$, the gate of the sixth PFET 728, $PFET_6$, and the gate of the sixth NFET 730, $NFET_6$. The fourth PFET 714, $PFET_4$, and the fourth NFET 716, $NFET_4$, are configured such that when the fourth PFET 714, $PFET_4$, is in a conducting mode of operation (ON), the fourth NFET 716, $NFET_4$, is in a non-conducting mode (OFF). Likewise, the fourth PFET 714, $PFET_4$, and the fourth NFET 716, $NFET_4$, are configured such that when the fourth NFET 716, $NFET_4$, is in a conducting mode (ON) of operation, the fourth PFET 714, $PFET_4$, is in a non-conducting mode (OFF).

Accordingly, the fixed delay time of the programmable delay circuitry 432C may further include a third portion of the fixed delay time, where the third portion of the fixed delay time is associated with the switching time of the fourth PFET 714, $PFET_4$, and the switching time of the fourth NFET 716, $NFET_4$.

As a result, when the voltage level on the second voltage node 704 is substantially equal to or less than the logic low threshold voltage such that the fourth PFET 714, $PFET_4$, is in the conducting mode of operation (ON), the first bias current, $I_{BIAS\_1}$, passes through the fourth PFET 714, $PFET_4$, pushes charge into the variable delay capacitor 722 to charge the variable delay capacitor 722. As the variable delay capacitor 722 is charged, the voltage across the variable delay capacitor 722, which is substantially equal to the voltage level on the third voltage node 724, increases. However, when the voltage level on the second voltage node 704 is substantially equal to or greater than the logic high threshold voltage such that the fourth NFET 716, $NFET_4$, is in the conducting mode of operation (ON), the second bias current, $I_{BIAS\_2}$, sunk by the fifth NFET 720, $NFET_5$, passes through the fourth NFET 716, $NFET_4$, and pulls charge from the variable delay capacitor 722 to discharge the variable delay capacitor 722. As a result, the voltage across the variable delay capacitor 722, which is substantially equal to the voltage level on the third voltage node 724, falls.

The correction start voltage circuit 712 is formed by coupling the gate of the third PFET 708, $PFET_3$ and the gate of the third NFET 710, $NFET_3$, to the second voltage node 704, such that the gates of the third PFET 708, $PFET_3$, the third NFET 710, $NFET_3$, the fourth PFET 714, $PFET_4$, and the fourth NFET 716, $NFET_4$, are coupled. The source of the third PFET 708, $PFET_3$, is coupled to the circuit supply voltage, $V_{DD}$. The drain of the third PFET 708, $PFET_3$, is coupled to the source of the fourth NFET 716, $NFET_4$, and the drain of the fifth NFET 720, $NFET_5$. The source of the third NFET 710, $NFET_3$, is coupled to ground. The drain of the third NFET 710, $NFET_3$, is coupled to the source of the fourth PFET 714, $PFET_4$, and the drain of the fifth PFET 718, $PFET_5$.

The correction start voltage circuit 712 is configured to provide a first known voltage level at the source of the fourth PFET 714, $PFET_4$, while the fourth PFET 714, $PFET_4$, is in the non-conducting state such that the voltage level present at the source of the fourth PFET 714, $PFET_4$, is at the first known voltage level at the moment the fourth PFET 714, $PFET_4$ transitions from the non-conducting state to the conducting state. In order to provide the first known voltage level at the source of the fourth PFET 714, $PFET_4$, while the fourth PFET 714, $PFET_4$, is in the non-conducting state, the third NFET 710, $NFET_3$, is configured to be turned on when the while the fourth PFET 714, $PFET_4$, is in the non-conducting state. As a result, the source of the fourth PFET 714, $PFET_4$, is coupled to ground through the third NFET 710, $NFET_3$. In the embodiment of the correction start voltage circuit 712 depicted in FIG. 30, the first known voltage is substantially equal to ground. However, in alternative embodiments, the source of the third NFET 710, $NFET_3$. may be coupled to a voltage level other than ground such that the first known voltage is not substantially equal to ground. As an example, in some embodiments, the correction start voltage circuit 712 may be configured such that the first known voltage is substantially equal to one half the circuit supply voltage, $V_{DD}/2$.

In some embodiments of the correction start voltage circuit 712, the parasitic capacitance of the source of the fourth PFET 714, $PFET_4$, the parasitic capacitance of the drain of the fifth PFET 718, $PFET_5$, and/or a combination thereof is configured such that the voltage level present on the source of the fourth PFET 714, $PFET_4$, remains at the first known voltage level momentarily at the moment the fourth PFET 714, $PFET_4$ transitions from the non-conducting state to the conducting state. In other embodiments of the correction start voltage circuit 712, the parasitic capacitance of the drain of the third NFET 710, $NFET_3$, may also be configured to improve the ability of the correction start voltage circuit 712 to provide the first known voltage on the source of the fourth PFET 714, $PFET_4$, momentarily at the moment the fourth PFET 714, $PFET_4$, transitions from the non-conducting state to the conducting state. In addition, the third NFET 710, $NFET_3$ may be further configured to turn off just prior to or coincidentally with the fourth PFET 714, $PFET_4$, transitioning from the non-conducting state to the conducting state. Otherwise, after the charge present in the parasitic capacitance(s) is discharged, the voltage level on the source of the fourth PFET 714, $PFET_4$, is determined by the operational state of the fourth PFET 714, $PFET_4$, and the first bias current, $I_{BIAS\_1}$, provided by the fifth PFET 718, $PFET_5$.

In a similar fashion, the correction start voltage circuit 712 is configured to provide a second known voltage level at the source of the fourth NFET 716, $NFET_4$, while the fourth NFET 716, $NFET_4$, is in the non-conducting state such that the voltage level present at the source of the fourth NFET 716, $NFET_4$, is at the second known voltage level at the moment the fourth NFET 716, $NFET_4$ transitions from the non-conducting state to the conducting state. In order to provide the second known voltage level at the source of the fourth NFET 716, $NFET_4$, while the fourth NFET 716, $NFET_4$, is in the non-conducting state, the third PFET 708, $PFET_3$, is configured to be turned on when the fourth NFET 716, $NFET_4$, is in the non-conducting state. As a result, the source of the fourth NFET 716, $NFET_4$, is coupled through the third PFET 708, $PFET_3$, to the circuit supply voltage $V_{DD}$. As a result, in the embodiment of the correction start voltage circuit 712 depicted in FIG. 30, the second known voltage is substantially equal to the circuit supply voltage, $V_{DD}$. However, in alternative embodiments, the source of the third PFET 708, $PFET_3$. may be coupled to a voltage level other than the circuit supply voltage, $V_{DD}$, such that the second known voltage is not substantially equal to the circuit supply voltage, $V_{DD}$. As an example, in some embodiments, the correction start voltage circuit 712 may be configured such that the second known voltage is substantially equal to one half the circuit supply voltage, $V_{DD}/2$.

In some embodiments of the correction start voltage circuit 712, the parasitic capacitance of the source of the fourth NFET 716, $NFET_4$, the parasitic capacitance of the drain of the fifth NFET 720, $NFET_5$, and/or a combination thereof is configured such that the voltage level present on the source of the fourth NFET 716, $NFET_4$, remains at the second known voltage level momentarily at the moment the fourth NFET 716, $NFET_4$ transitions from the non-conducting state to the conducting state. In other embodiments of the correction start voltage circuit 712, the parasitic capacitance of the drain of the third PFET 708, $PFET_3$, may also be configured to improve the ability of the correction start voltage circuit 712 to provide the second known voltage on the source of the fourth NFET 716, $NFET_4$, momentarily at the moment the fourth NFET 716, $NFET_4$, transitions from the non-conducting state to the conducting state. In addition, the third PFET 708, $PFET_3$ may be further configured to turn off just prior to or coincidentally with the fourth NFET 716, $NFET_4$, transitioning from the non-conducting state to the conducting state. Otherwise, after the charge present in the parasitic capacitance(s) is discharged, the voltage level on the source of the fourth NFET 716, $NFET_4$, is determined by the operational state of the fourth NFET 716, $NFET_4$, and the second bias current, $I_{BIAS\_2}$, sunk by the fifth NFET 720, $NFET_5$.

Advantageously, because the correction start voltage circuit 712 is configured to ensure the voltage level on the source of the fourth PFET 714, $PFET_4$, is substantially equal to the first known voltage when the fourth PFET 714, $PFET_4$, is in the non-conducting state and the voltage level on the source of the fourth NFET 716, $NFET_4$, is substantially equal to the second known voltage when the fourth NFET 716, $NFET_4$, is in the non-conducting state, the initial change in the voltage level at the third voltage node 724 that occurs as a result of charge stored in the capacitances associated with the source of the fourth PFET 714, $PFET_4$, or the charge stored in the capacitances associated with the source of the fourth NFET 716, $NFET_4$, (referred to as a state transition voltage charge) is predictable and substantially consistent. As a result, the state transition voltage charge may be controlled such that the voltage across the variable delay capacitor 722 is not substantially disturbed when either the fourth PFET 714, $PFET_4$, or the fourth NFET 716, $NFET_4$, transition to be in the conducting state.

For example, as previously described, when the second input buffer circuit 698 provides a digital logic high state, the second input buffer provides an output voltage at the second voltage node 704 substantially equal to the circuit supply voltage, $V_{DD}$. In this case, the gate of the fourth NFET 716, $NFET_4$, is greater than the logic high threshold level. As a result, the fourth NFET 716, $NFET_4$, turns on and discharges the variable delay capacitor 722 until the voltage level at the third voltage node 724 is substantially equal to ground. In addition, the third NFET 710, $NFET_3$, of the correction start voltage circuit 712 is configured to turn on and couple the source of the fourth PFET 714, $PFET_4$, to ground such that the charge stored on the source of the fourth PFET 714, PFET-$_4$, is at a voltage level substantially equal to ground. As a result, the charge stored on the source of the fourth PFET 714, $PFET_4$, minimally affects the charging period, $\Delta T_{CHARGING\_PERIOD}$, of the variable delay circuitry 684, where the charging period, $\Delta T_{CHARGING\_PERIOD}$, is a period of time during which the variable delay capacitor 722 is being charged until the third voltage node 724 is equal to or exceeds the logic high threshold voltage of the output buffer stage 726.

Similarly, when the second input buffer circuit 698 provides a digital logic low state, the second input buffer provides an output voltage at the second voltage node 704 substantially equal to ground. In this case, the gate of the fourth PFET 714, $PFET_4$, is less than the logic low threshold level. As a result, fourth PFET 714, $PFET_4$, turns on and charges the variable delay capacitor 722 until the voltage level at the third voltage node 724 is substantially equal to the circuit supply voltage, $V_{DD}$. In addition, the third PFET 708, $PFET_3$, of the correction start voltage circuit 712 is configured to turn on and couple the source of the fourth NFET 716, $NFET_4$, to the circuit supply voltage, $V_{DD}$, such that the charge stored on the source of the fourth NFET 716, $NFET_4$, is at a voltage level substantially equal to ground. As a result, the charge stored on the source of the fourth NFET 716, $NFET_4$, minimally affect the charging period, $\Delta T_{DISCHARGING\_PERIOD}$, of the variable delay circuitry 684, where the charging period, $\Delta T_{DISCHARGING\_PERIOD}$, is a period of time during which the variable delay capacitor 722 is being discharged until the third voltage node 724 is equal to or less than the logic low threshold voltage of the output buffer stage 726.

Otherwise, if the correction start voltage circuit 712 is not present, the source of the fourth PFET 714, $PFET_4$, and the source of the fourth NFET 716, $NFET_4$, will each tend to float to an undetermined voltage level when either the fourth PFET 714, $PFET_4$, or the fourth NFET 716, $NFET_4$, are in the non-conducting state. As a result, state transition voltage change is unpredictable.

The operation of the output buffer stage 726 depends upon the voltage level at the third voltage node 724. When the voltage level at the third voltage node 724 is equal to or less than the logic low threshold voltage such that the sixth PFET 728, $PFET_6$ is turned on and in the saturation state, the output buffer output 732 is effectively coupled to the circuit supply voltage, $V_{DD}$, through the sixth PFET 728, $PFET_6$. Simultaneously, sixth NFET 730, $NFET_6$, is configured to be turned off when the sixth PFET 728, $PFET_6$ is turned on. As a result, the output buffer stage 726 provides an output voltage, $V_{OUT}$, substantially equal to the circuit supply voltage, $V_{DD}$, which represents a digital logic high state.

However, when the voltage level at the third voltage node 724 is equal to or greater than the logic high threshold voltage such that the sixth NFET 730, $NFET_6$ is turned on and in the saturation state, the output buffer output 732 is effectively coupled to the ground through the sixth NFET 730, $NFET_6$. Simultaneously, the sixth PFET 728, $PFET_6$, is configured to be turned off when the sixth NFET 730, $NFET_6$ is turned on. As a result, the output buffer stage 726 provides an output voltage, $V_{OUT}$, substantially equal to ground, which represents a digital logic low state.

The variable delay time, $T_{VARIABLE\_DELAY\_TIME}$, provided by the variable delay circuitry 684 is a function of a charging period, $\Delta T_{CHARGING\_PERIOD}$ and a discharging period, $\Delta T_{DISCHARGING\_PERIOD}$, of the variable delay capacitor. The charging period, $\Delta T_{CHARGING\_PERIOD}$, is a period of time during which the variable delay capacitor 722 is being charged until the third voltage node is equal to or exceeds the logic high threshold voltage. During the charging period, $\Delta T_{CHARGING\_PERIOD}$, the change in the voltage across the variable delay capacitor 722, necessary to change the digital logic state at the input of the output buffer stage 726, is the charging voltage change, $\Delta_{DELAY\_VAR\_CAP\_CHARGING}$. The discharging period, $\Delta T_{DISCHARGING\_PERIOD}$, is a period of time during which the variable delay capacitor 722 is being charged until the third voltage node 724 is equal to or exceed the logic high threshold voltage. During the discharging period, $\Delta T_{DISCHARGING\_PERIOD}$, the change in the voltage across the variable delay capacitor 722, necessary to change the digital logic state at the input of the output buffer stage 726, is the discharging voltage change, $\Delta_{DELAY\_VAR\_CAP\_DISCHARGING}$.

The average variable delay time, $T_{AVERAGE\_VARIABLE\_DELAY}$, provided by the variable delay circuitry 684 is provided by equation (11):

$$T_{AVERAGE\_VARIABLE\_DELAY} = \frac{T_{CHARGEING\_PERIOD} + T_{DISCHARGING\_PERIOD}}{2}. \quad (11)$$

The charging period, $\Delta T_{CHARGING\_PERIOD}$, of the variable delay capacitor 722 is dependent upon the capacitance value of the variable delay capacitance, $C_{DELAY\_VAR}$, and the magnitude of the variable delay capacitor current, $I_{C\_VAR}$, where the magnitude of the variable delay capacitor current, $I_{C\_VAR}$, is substantially equal to the first bias current, $I_{BIAS\_1}$ during the charging period, $\Delta T_{CHARGING\_PERIOD}$. Similarly, the discharging period, $\Delta T_{DISCHARGING\_PERIOD}$, of the variable delay capacitor 722 is dependent upon the capacitance value of the variable delay capacitance, $C_{DELAY\_VAR}$, and the magnitude of the variable delay capacitor current, $I_{C\_VAR}$, where the magnitude of the variable delay capacitor current, $I_{C\_VAR}$, is substantially equal to the second bias current, $I\text{-}_{BIAS\_2}$ during the discharging period, $\Delta T_{DISCHARGING\_PERIOD}$.

During the charging period, $\Delta T_{CHARGING\_PERIOD}$, the variable delay capacitor current, $I_{C\_VAR}$, is given by equation (12):

$$I_{C\_VAR} = \frac{\Delta V_{DELAY\_VAR\_CAP\_CHARGING} \times C_{DELAY\_VAR}}{\Delta T_{CHARGING\_PERIOD}} \quad (12)$$

Similarly, during the discharging period, $\Delta T_{DISCHARGING\_PERIOD}$, the variable delay capacitor current, $I_{C\_VAR}$, is given by equation (13) as follows:

$$I_{C\_VAR} = \frac{\Delta V_{DELAY\_VAR\_CAP\_DISCHARGING} \times C_{DELAY\_VAR}}{\Delta T_{DISCHARGING\_PERIOD}} \quad (13)$$

Assuming the variable delay capacitor current, $I_{C\_VAR}$, is substantially equal to the first bias current, $I_{BIAS\_1}$, provided by the fifth PFET 718, $PFET_5$, during the charging period, $\Delta T_{CHARGING\_PERIOD}$, the charging period, $\Delta T_{CHARGING\_PERIOD}$, is given by equation (14) as follows:

$$\Delta T_{CHARGING\_PERIOD} = \frac{\Delta V_{DELAY\_VAR\_CAP\_CHARGING} \times C_{DELAY\_VAR}}{I_{BIAS\_1}}. \quad (14)$$

Likewise, assuming the magnitude of the variable delay capacitor current, $I_{C\_VAR}$, is substantially equal to the second bias current, $I_{BIAS\_2}$, sunk by the fifth NFET 720, $NFET_5$, during the discharging period, $\Delta T_{DISCHARGING\_PERIOD}$, the discharging period, $\Delta T_{DISCHARGING\_PERIOD}$, is given by equation (15):

$$\Delta T_{DISCHARGEING\_PERIOD} = \frac{\Delta V_{DELAY\_VAR\_CAP\_DISCHARGING} \times C_{DELAY\_VAR}}{I_{BIAS\_2}}. \quad (15)$$

In some embodiments of the programmable delay circuitry 432C the channel width of the fifth PFET 718, $PFET_5$, and the channel width of the fifth NFET 720, $NFET_5$, are configured such that the first bias current, $I_{BIAS\_1}$, is substantially equal to the second bias current, $I_{BIAS\_2}$, where the magnitude of the first bias current, $I_{BIAS\_1}$, and the magnitude of the second bias current, $I_{BIAS\_2}$, are substantially equal to a bias current, $I_{BIAS}$.

Some embodiments of the output buffer stage 726 may be configured such that the charging voltage change, $\Delta_{DELAY\_VAR\_CAP\_CHARGING}$, is substantially equal to the discharging voltage change, $\Delta_{DELAY\_VAR\_CAP\_DISCHARGING}$. For example, in some embodiments, the output buffer stage 726 logic low threshold voltage and a logic high threshold are configured such that the voltage change, $\Delta_{DELAY\_VAR\_CAP\_CHARGING}$, is substantially equal to the discharging voltage change, $\Delta_{DELAY\_VAR\_CAP\_DISCHARGING}$. In the case where the magnitude of the charging voltage change, $\Delta_{DELAY\_VAR\_CAP\_CHARGING}$, is substantially equal to the magnitude of the discharging voltage change, $\Delta_{DELAY\_VAR\_CAP\_DISCHARGING}$, such that the magnitude of the charging voltage change, $\Delta_{DELAY\_VAR\_CAP\_CHARGING}$, and the magnitude of the discharging voltage change, $\Delta_{DELAY\_VAR\_CAP\_DISCHARGING}$, are substantially equal to a transition voltage change, $\Delta_{DELAY\_VAR\_CAP\_TRANSITION}$, the variable delay time, $T_{VARIABLE\_DELAY\_TIME}$, of the variable delay circuitry 684 is given by equation (16):

$$\Delta T_{VARIABLE\_DELAY\_TIME} = \frac{\Delta V_{DELAY\_VAR\_CAP\_TRANSITION} \times C_{DELAY\_VAR}}{I_{BIAS}}. \quad (16)$$

In other embodiments of the programmable delay circuitry 432C, the channel width of the fifth PFET 718, $PFET_5$, and the channel width of the fifth NFET 720, $NFET_5$, may be configured such that the first bias current, $I_{BIAS\_1}$, is not substantially equal to the second bias current, $I_{BIAS\_2}$. In this case, the charging period, $\Delta T_{CHARGING\_PERIOD}$, and the discharging period, $\Delta T_{DISCHARGING\_PERIOD}$, may not be substantially equal. As an example, in some embodiments, the charging period, $\Delta T_{CHARGING\_PERIOD}$, is longer than the discharging period, $\Delta T_{DISCHARGING\_PERIOD}$. In other embodiments, the charging period, $\Delta T_{CHARGING\_PERIOD}$, is less than the discharging period, $\Delta T_{DISCHARGING\_PERIOD}$.

As an alternative embodiment, the logic low threshold voltage and the logic high threshold of the output buffer stage 726 may be configured such the charging voltage change, $\Delta_{DELAY\_VAR\_CAP\_CHARGING}$, is substantially equal to the discharging voltage change, $\Delta_{DELAY\_VAR\_CAP\_DISCHARGING}$.

Figure 36:
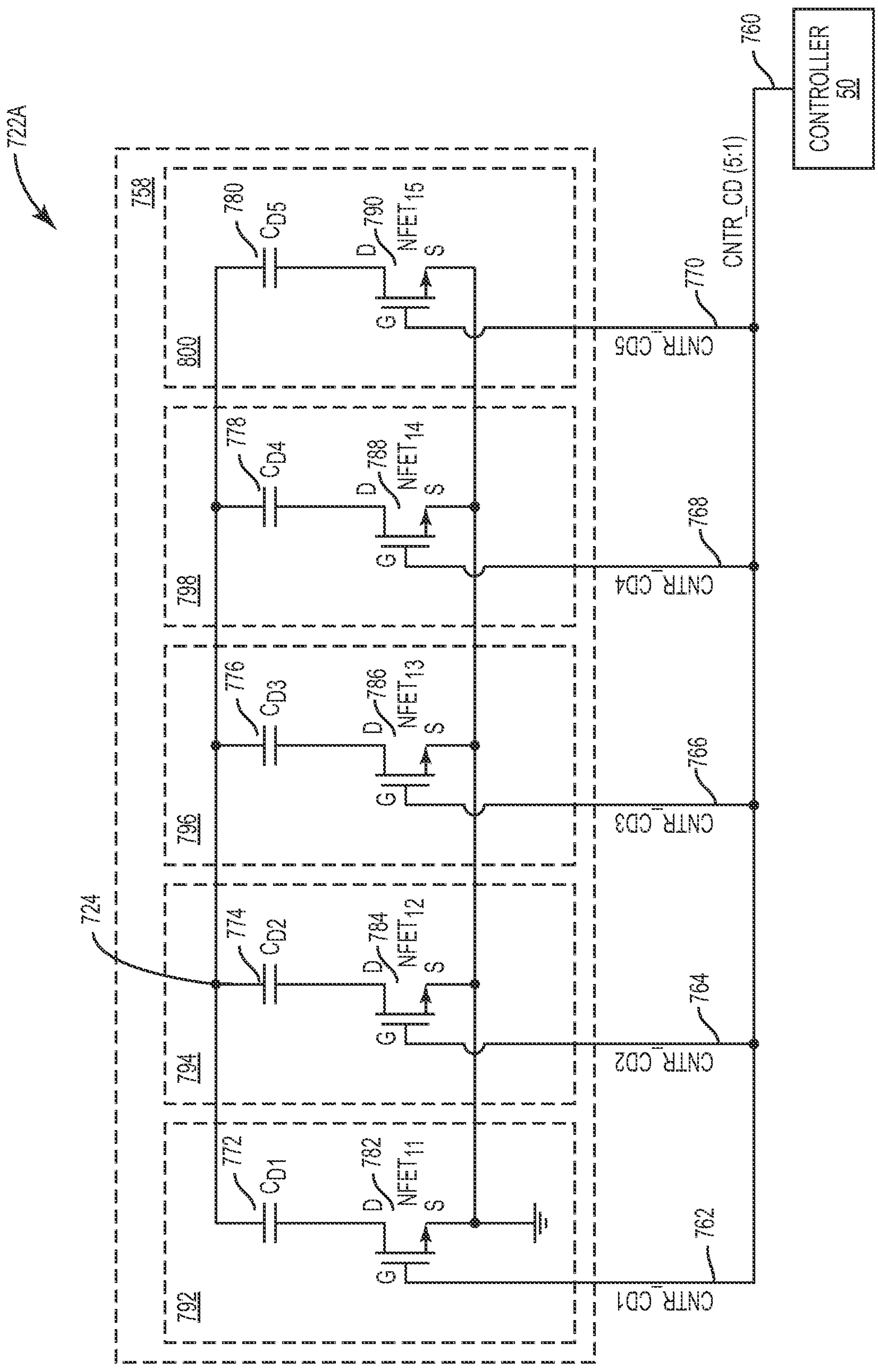
FIG. 36 depicts an example embodiment of a variable delay capacitor.

In addition, as discussed above, in some embodiments of the programmable delay circuitry 432C, the controller 50, as depicted in FIG. 24, may be coupled to the variable delay capacitor 722. The controller 50 may be configured to control the capacitance value of the variable delay capacitance, $C_{DELAY\_VAR}$, based on a binary capacitor control word, CNTR_CD, such that as the value of the binary capacitor control word, CNTR_CD increases, the variable delay capacitance, $C_{DELAY\_VAR}$, linearly increases or decreases in a substantially linear fashion. In some alternative embodiments of the variable delay capacitor 722, the variable delay capacitance, $C_{DELAY\_VAR}$, has a minimum capacitance value, $C_{DELAY\_VAR\_MIN}$, that corresponds to the minimum delay provided by charging and discharging of the variable delay capacitor 722 of the variable delay circuitry 684. As an example, the minimum capacitance value, $C_{DELAY\_VAR\_MIN}$, of the variable delay capacitor 722 may be provided by a fixed capacitance (not depicted) in parallel with a programmable binary capacitor array. An example of a programmable binary capacitor array is depicted in FIG. 36.

Furthermore, as discussed above, in some embodiments of the programmable delay circuitry 432C, the controller 50, as depicted in FIG. 24, may be configured to control the capacitance value of the variable delay capacitance, $C_{DELAY\_VAR}$, based on a binary capacitor control word, CNTR_CD, such that as the value of the binary capacitor control word, CNTR_CD increases, the variable delay capacitance, $C_{DELAY\_VAR}$, linearly increases or decreases in a substantially linear fashion. As a result, the variable delay circuitry 684 may be configured such that the variable delay time, $T_{VARIABLE\_DELAY\_TIME}$, increases in a substantially linear fashion as the variable delay capacitance, $C_{DELAY\_VAR}$, increases in a substantially linear fashion. In addition, the delay step size, $\Delta_{VARIABLE\_DELAY\_TIME}$, of the variable delay circuitry 684 between any two adjacent values of the variable delay capacitance, $C_{DELAY\_VAR}$, may be substantially equal.

Because the first input buffer circuit 690, the second input buffer circuit 698, the input stage 706 of the variable delay circuitry 684, the correction start voltage circuit 712, and the output buffer stage 726 are substantially symmetric in construction, the first input buffer circuit 690, the second input buffer circuit 698, the input stage 706 of the variable delay circuitry 684, the correction start voltage circuit 712, and the output buffer stage 726 may be configured such that the logic low threshold voltage and the logic high threshold voltage tend to proportionally track the circuit supply voltage, $V_{DD}$. As a result, the magnitude of the charging voltage change, $\Delta_{DELAY\_VAR\_CAP\_CHARGING}$, and the magnitude of the discharging voltage change, $\Delta_{DELAY\_VAR\_CAP\_DISCHARGING}$, will also tend to proportionally track the circuit supply voltage. However, the variations in the variable delay time, $T_{VARIABLE\_DELAY\_TIME}$, provided by the variable delay circuitry 684 due to changes in the voltage level of the circuit supply voltage, $V_{DD}$, may be minimized by configuring the programmable delay circuitry 432C such that the magnitude of the first bias current, $I_{BIAS\_1}$, and the magnitude of the second bias current, $I_{BIAS\_2}$, change proportionally with respect to a change in the voltage level of the circuit supply voltage, $V_{DD}$.

As an example, the voltage divider circuit 686 and bias current and mirror circuit 688 may be configured such that the first bias current, $I_{BIAS\_1}$, provided by the fifth PFET 718, $PFET_5$, and the second bias current, $I_{BIAS\_2}$, sunk by the fifth NFET 720, $NFET_5$, are related to the voltage level of the circuit supply voltage, $V_{DD}$, such that the variations in the variable delay time, $T_{VARIABLE\_DELAY\_TIME}$, provided by the variable delay circuitry 684 due to changes in the voltage level of the circuit supply voltage, $V_{DD}$, may be minimized.

The bias current and mirror circuit 688 includes a seventh PFET 734, $PFET_7$, a seventh NFET 736, $NFET_7$, an eighth PFET 738, $PFET_8$, an eighth NFET 740, $PFET_9$, a bias reference current setting resistor 744, and a bias resistor 746. The bias reference current setting resistor 744 has a bias reference current setting resistance, $R_3$. The bias resistor 746 has a bias resistance, $R_4$.

The source of the seventh PFET 734, $PFET_7$, is coupled to the circuit supply voltage, $V_{DD}$. The gate of the seventh PFET 734, $PFET_7$, is coupled to the source of the seventh PFET 734, $NFET_7$, and the drain of the eighth NFET 740, $NFET_8$. In addition, the gate and drain of the seventh PFET 734, $PFET_7$, is coupled to the gate of the fifth PFET 718, $PFET_5$.

The gate and drain of the seventh PFET 734, $PFET_7$, is coupled to the drain of the eighth NFET 740, $NFET_8$, The source of the eighth NFET 740, $NFET_8$, is coupled to the drain of the seventh NFET 736, $NFET_7$. The sources of the eighth NFET 740, $NFET_8$, and the seventh NFET 736, $NFET_7$, are coupled to ground. The gate of the seventh NFET 736, $NFET_7$, is coupled to the drain and gate of the ninth NFET 742, $NFET_9$. In addition, the gate of the seventh NFET 736, $NFET_7$, and the gate and drain of the ninth NFET 742, $NFET_9$, are coupled to the gate of the fifth NFET 720, $NFET_5$, of the variable delay circuitry 684.

The bias reference current setting resistor 744 is coupled between the circuit supply voltage, $V_{DD}$, and the source of the eighth PFET 738, $PFET_8$. The bias resistor 746 is coupled between the drain of the eighth PFET 738, $PFET_8$, and the drain and gate of the ninth NFET 742, $NFET_9$, and the gate of the seventh NFET 736, $NFET_7$.

The voltage divider circuit 686 includes a first voltage divider resistor 748, a tenth PFET 750, $PFET_{10}$, an eleventh PFET 752, $PFET_{11}$, and a second voltage divider resistor 754. The first voltage divider resistor 748 has a first voltage divider resistance, $R_1$. The second voltage divider resistor 754 has a second voltage divider resistance, $R_2$. The first voltage divider resistance, $R_1$, of the first voltage divider resistor 748 is substantially equal to the second voltage divider resistance, $R_2$, of the second voltage divider resistor 754.

The first voltage divider resistor 748 is coupled between the circuit supply voltage, $V_{DD}$, and the source of the tenth PFET 750, $PFET_{10}$. The gate of the tenth PFET 750, $PFET_{10}$, is coupled to the drain of the tenth PFET 750, $PFET_{10}$ and the source of the eleventh PFET 752, $PFET_{11}$. The gate of the eleventh PFET 752, $PFET_{11}$, is coupled to the drain of the eleventh PFET 752, $PFET_{11}$. The second voltage divider resistor 754 is coupled between the drain of the eleventh PFET 752, $PFET_{11}$, and ground. Because the gate of the tenth PFET 750, $PFET_{10}$, is coupled to the drain of the tenth PFET 750, and the gate of the eleventh PFET 752, $PFET_{11}$, is coupled to the drain of the eleventh PFET 752, $PFET_{11}$, both the tenth PFET 750, $PFET_{10}$, and the eleventh PFET 752, $PFET_{11}$, are biased to be on in a saturation mode of operation. The source-to-drain voltage across the tenth PFET 750, $PFET_{10}$, and the source-to-drain voltage across the eleventh PFET 752, $PFET_{11}$, are substantially equal. Because the first voltage divider resistance, $R_1$, of the first voltage divider resistor 748 is substantially equal to the second voltage divider resistance, $R_2$, of the second voltage divider resistor 754, the voltage divider circuit 686 may be configured to set a bias voltage substantially equal to one-half of the circuit supply voltage, $V_{DD}$, on the drain of the tenth PFET 750, $PFET_{10}$, and the source of the eleventh PFET 752, $PFET_{11}$.

The operation of the bias current and mirror circuit 688 is now explained with reference to the voltage divider circuit 686. The bias current and mirror circuit 688 is coupled to the voltage divider circuit 686 by coupling the gate of the eighth PFET 738, $PFET_8$, to the gate and drain of the eleventh PFET 752, $PFET_{11}$. The eighth PFET 738, $PFET_8$, of the bias current and mirror circuit 688 and the eleventh PFET 752, $PFET_{11}$, of the voltage divider circuit 686 are configured such that the gate-to-source voltage of the eighth PFET 738, $PFET_8$, is substantially equal to the gate-to-source voltage of the eleventh PFET 752, $PFET_{11}$. As a result, the voltage on the source of the eighth PFET 738, $PFET_8$, is substantially equal to the voltage on the source of the eleventh PFET 752, $PFET_{11}$. As discussed above with respect to the operation of the voltage divider circuit 686, the voltage on the source of the eleventh PFET 752, $PFET_{11}$, is substantially equal to $V_{DD}/2$. Accordingly, the voltage on the source of the eighth PFET 738, $PFET_8$, is also substantially equal to $V_{DD}/2$. The current through the bias reference current setting resistor 744, which is the reference bias current, $I_{BIAS\_REF}$, is provided by equation (17) as follows:

$$I_{BIAS\_REF} = \frac{V_{DD} - \frac{V_{DD}}{2}}{R_3} = \frac{V_{DD}}{2 \times R_3} \quad (17)$$

Accordingly, the drain-to-source current of the ninth NFET 742, $NFET_9$, is substantially equal to $I_{BIAS\_REF}$. Because the gate and drain of the ninth NFET 742, $NFET_9$, are coupled to the gate of the seventh NFET 736, $NFET_7$, and the gate of the fifth NFET 720, $NFET_5$, the source- to-drain current flowing through the ninth NFET 742, $NFET_9$, is mirrored such that the drain-to-source current flowing through the seventh NFET 736, $NFET_7$, and the drain-to-source current flowing through the fifth NFET 720, $NFET_5$, are proportional to the drain-to-source current flowing through the ninth NFET 742, $NFET_9$. Furthermore, the source-to-drain current flowing through the seventh PFET 734, $PFET_7$, is substantially equal to the drain-to-source current flowing through the seventh NFET 736, $NFET_7$. Because the gate-to-source voltage of the fifth PFET 718, $PFET_5$, is substantially equal to the gate voltage of the seventh PFET 734, $PFET_7$, the source-to-drain current of the seventh PFET 734, $PFET_7$, is proportional to the bias reference current, $I_{BIAS\_REF}$, where the bias reference current setting resistance, $R_3$, of the bias reference current setting resistor 744 sets the bias reference current, $I_{BIAS\_REF}$. As a result, the first bias current, $I_{BIAS\_1}$, proportionally tracks the circuit supply voltage, $V_{DD}$. Similarly, the second bias current, $I_{BIAS\_2}$, proportionally tracks the circuit supply voltage, $V_{DD}$.

Accordingly, the bias reference current setting resistance, $R_3$, resistance value may be configured to minimize the sensitivity of the variable delay time, $T_{VARIABLE\_DELAY\_TIME}$, provided by the variable delay circuitry 684 to a change in the voltage level of the circuit supply voltage, $V_{DD}$. In addition, in some embodiments, the channel width ratios of the channel width of the ninth NFET 742, $NFET_9$, to each of the channel widths of the seventh PFET 734, $PFET_7$, the seventh NFET 736, $NFET_7$, the fifth PFET 718, $PFET_5$ and the fifth NFET 720, $NFET_5$, may be configured to minimize the sensitivity of the variable delay time, $T_{VARIABLE\_DELAY\_TIME}$, provided by the variable delay circuitry 684 due to changes in the voltage level of the circuit supply voltage, $V_{DD}$.

FIG. 36 depicts an example embodiment of the variable delay capacitor 722, depicted in FIG. 30, as variable delay capacitor 722A. The variable delay capacitor 722A may be configured as a programmable capacitor array 758. The programmable capacitor array 758 may be coupled to the controller 50 via a variable capacitance control bus 760, CNTR_CD (5:1). The variable delay capacitor 722A has a variable delay capacitance, $C_{DELAY\_VAR}$. The controller 50 may be configured to control the variable delay capacitance, $C_{DELAY\_VAR}$, of the variable delay capacitor 722A by configuring the programmable capacitor array 758.

The variable capacitance control bus 760, CNTR_CD (5:1), may include a first capacitor control signal 762, CNTR_CD1, a second capacitor control signal 764, CNTR_CD2, a third capacitor control signal 766, CNTR_CD3, a fourth capacitor control signal 768, CNTR_CD4, and a fifth capacitor control signal 770, CNTR_CD5.

The programmable capacitor array 758 may include a first array capacitor 772, a second array capacitor 774, a third array capacitor 776, a fourth array capacitor 778, and a fifth array capacitor 780. The first array capacitor 772 may have a capacitance substantially equal to a first array capacitor capacitance, $C_{D1}$. The second array capacitor 774 may have a capacitance substantially equal to a second array capacitor capacitance, $C_{D2}$. The third array capacitor 776 may have a capacitance substantially equal to a third array capacitor capacitance, $C_{D3}$. The fourth array capacitor 778 may have a capacitance substantially equal to a fourth array capacitor capacitance, $C_{D4}$. The fifth array capacitor 780 may have a capacitance substantially equal to a fifth array capacitor capacitance, $C_{D5}$.

In addition, the programmable capacitor array 758 may further include a first switch element 782, $NFET_{11}$, a second switch element 784, $NFET_{12}$, a third switch element 786, $NFET_{13}$, a fourth switch element 788, $NFET_{14}$, and a fifth switch element 790, $NFET_{15}$. In FIG. 36, by way of example and not by way of limitation, the first switch element 782, $NFET_{11}$, the second switch element 784, $NFET_{12}$, the third switch element 786, $NFET_{13}$, the fourth switch element 788, $NFET_{14}$, and the fifth switch element 790, $NFET_{15}$ are each depicted as NFET devices.

The programmable capacitor array 758 includes a first programmable capacitance 792, a second programmable capacitance 794, a third programmable capacitance 796, a fourth programmable capacitance 798, and a fifth programmable capacitance 800. The first programmable capacitance 792 may be formed by coupling the first array capacitor 772 between the third voltage node 724 and the drain of the first switch element 782, $NFET_{11}$, where the source of the first switch element 782, $NFET_{11}$, is coupled to ground and the gate of first switch element 782, $NFET_{11}$, is coupled to the first capacitor control signal 762, CNTR_CD1, of the variable capacitance control bus 760, CNTR_CD (5:1). The second programmable capacitance 794 may be formed by coupling the second array capacitor 774 between the third voltage node 724 and the drain of the second switch element 784, $NFET_{12}$, where the source of the second switch element 784, $NFET_{12}$, is coupled to ground and the gate of second switch element 784, $NFET_{12}$, is coupled to the second capacitor control signal 764, CNTR_CD2, of the variable capacitance control bus 760, CNTR_CD (5:1). The third programmable capacitance 796 may be formed by coupling the third array capacitor 776 between the third voltage node 724 and the drain of the third switch element 786, $NFET_{13}$, where the source of the third switch element 786, $NFET_{13}$, is coupled to ground and the gate of third switch element 786, $NFET_{13}$, is coupled to the third capacitor control signal 766, CNTR_CD3, of the variable capacitance control bus 760, CNTR_CD (5:1). The fourth programmable capacitance 798 may be formed by coupling the fourth array capacitor 778 between the third voltage node 724 and the drain of the fourth switch element 788, $NFET_{14}$, where the source of the fourth switch element 788, $NFET_{14}$, is coupled to ground and the gate of fourth switch element 788, $NFET_{14}$, is coupled to the fourth capacitor control signal 768, CNTR_CD4, of the variable capacitance control bus 760, CNTR_CD (5:1). The fifth programmable capacitance 800 may be formed by coupling the fifth array capacitor 780 between the third voltage node 724 and the drain of the fifth switch element 790, $NFET_{15}$, where the source of the fifth switch element 790, $NFET_{15}$, is coupled to ground and the gate of the fifth switch element 790, $NFET_{15}$, is coupled to the fifth capacitor control signal 770, CNTR_CD5, of the variable capacitance control bus 760, CNTR_CD (5:1).

As an example, in some embodiments, the variable delay capacitor 722A is configured such that the programmable capacitor array 758 is a linearly programmable capacitor array. The variable delay capacitor 722A may be configured to be a linearly programmable capacitor array by configuring the first array capacitor capacitance, $C_{D1}$, the second array capacitor capacitance, $C_{D2}$, the third array capacitor capacitance, $C_{D3}$, the fourth array capacitor capacitance, $C_{D4}$, and the fifth array capacitor capacitance, $C_{D5}$, to have the same capacitance value.

As an alternative example, in some embodiments of the variable delay capacitor 722A, the programmable capacitor array 758 may be configured as a binary weighted programmable capacitor array. The binary weighted programmable capacitor array may be configured such that the second array capacitor capacitance, $C_{D2}$, has substantially twice the capacitance as the first array capacitor capacitance, $C_{D1}$, the third array capacitor capacitance, $C_{D3}$, has substantially twice the capacitance as the second array capacitor capacitance, $C_{D2}$, the fourth array capacitor capacitance, $C_{D4}$, has substantially twice the capacitance as the third array capacitor capacitance, $C_{D3}$, and the fifth array capacitor capacitance, $C_{D5}$, has substantially twice the capacitance as the fourth array capacitor capacitance, $C_{D4}$.

The controller 50 may be configured to selectively control the variable capacitance bus, CNTR_CD (5:1), to set the capacitance value of the variable delay capacitance, $C_{DELAY\_VAR}$, of the variable delay capacitor 722A. The first capacitor control signal 762, CNTR_CD1, the second capacitor control signal 764, CNTR_CD2, the third capacitor control signal 766, CNTR_CD3, the fourth capacitor control signal 768, CNTR_CD4, and the fifth capacitor control signal 770, CNTR_CD5, may form a binary capacitor control word, CNTR_CD, where 0≥CNTR_CD≥31.

Accordingly, the programmable capacitor array 758 may be configured such that as the value of the binary capacitor control word, CNTR_CD increases from 0 to 31, the effective capacitance of the programmable capacitor array 758 changes linearly.

Accordingly, returning to FIG. 30, with continuing reference to FIGS. 23A-27D, FIG. 24, FIGS. 27A-27B, and FIG. 36, in those embodiments of the programmable delay circuitry 432C that include an embodiment of the variable delay capacitor 722A, depicted in FIG. 36, the delay step size, $\Delta_{VARIABLE\_DELAY\_TIME}$, of the variable delay circuitry 684 between any two adjacent values of the variable delay capacitance, $C_{DELAY\_VAR}$, may be a function of the granularity of the effective capacitance of the binary capacitor control word, CNTR_CD changes, and the number of array capacitors present in the binary weighted programmable capacitor array. In some embodiments of the programmable delay circuitry 432C, the variable delay circuitry 684 may be configured such that the average delay step size, $\Delta_{VARIABLE\_DELAY\_TIME}$, of the variable delay time, $T_{VARIABLE\_DELAY\_TIME}$, is about 136 picoseconds. In other embodiments of the programmable delay circuitry 432C, the variable delay circuitry 684 may be configured such that the average delay step size, $\Delta_{VARIABLE\_DELAY\_TIME}$, of the variable delay time, $T_{VARIABLE\_DELAY\_TIME}$, is about 100 picoseconds.

Illustratively, by way of example, and not by limitation, in some embodiments of the programmable capacitor array 758 used to provide the variable delay capacitance, $C_{DELAY\_VAR}$, of the variable delay circuitry 684, the first array capacitor capacitance, $C_{D1}$, of the first array capacitor 772 may have a capacitance of around 18.25 pF. The second array capacitor capacitance, $C_{D2}$, of the second array capacitor 774 may have a capacitance of around 30.93 pF. The third array capacitor capacitance, $C_{D3}$, of the third array capacitor 776 may have a capacitance of around 61.86 pF. The fourth array capacitor capacitance, $C_{D4}$, of the fourth array capacitor 778 may have a capacitance of around 123.72 pF. The fifth array capacitor capacitance, $C_{D5}$, of the fifth array capacitor 780 may have a capacitance of around 247.45 pF.

Accordingly, referring to the example embodiments of the open loop ripple compensation assist circuit 414A, depicted in FIG. 24, the open loop ripple compensation assist circuit 414B, depicted in FIG. 27A, and the open loop ripple compensation assist circuit 414C, depicted in FIG. 27B, the variable delay capacitance, $C_{DELAY\_VAR}$, of the variable delay capacitor 722, depicted in FIG. 30, may be configured by the controller 50 by incrementally changing the variable delay time, $T_{VARIABLE\_DELAY\_TIME}$, provided by the programmable delay circuitry 432C, depicted in FIG. 30, in steps substantially equal to the average delay step size, $\Delta_{VARIABLE\_DELAY\_TIME}$. For example, for the case where the average delay step size, $\Delta_{VARIABLE\_DELAY\_TIME}$, is substantially equal to 136 picoseconds, the high frequency ripple compensation current 416, $I_{COR}$, may be aligned to within an accuracy of less than 136 picoseconds. The precision of the average temporal alignment may be based upon the granularity of the capacitance values of the capacitors of the binary capacitor array.

Figure 37:
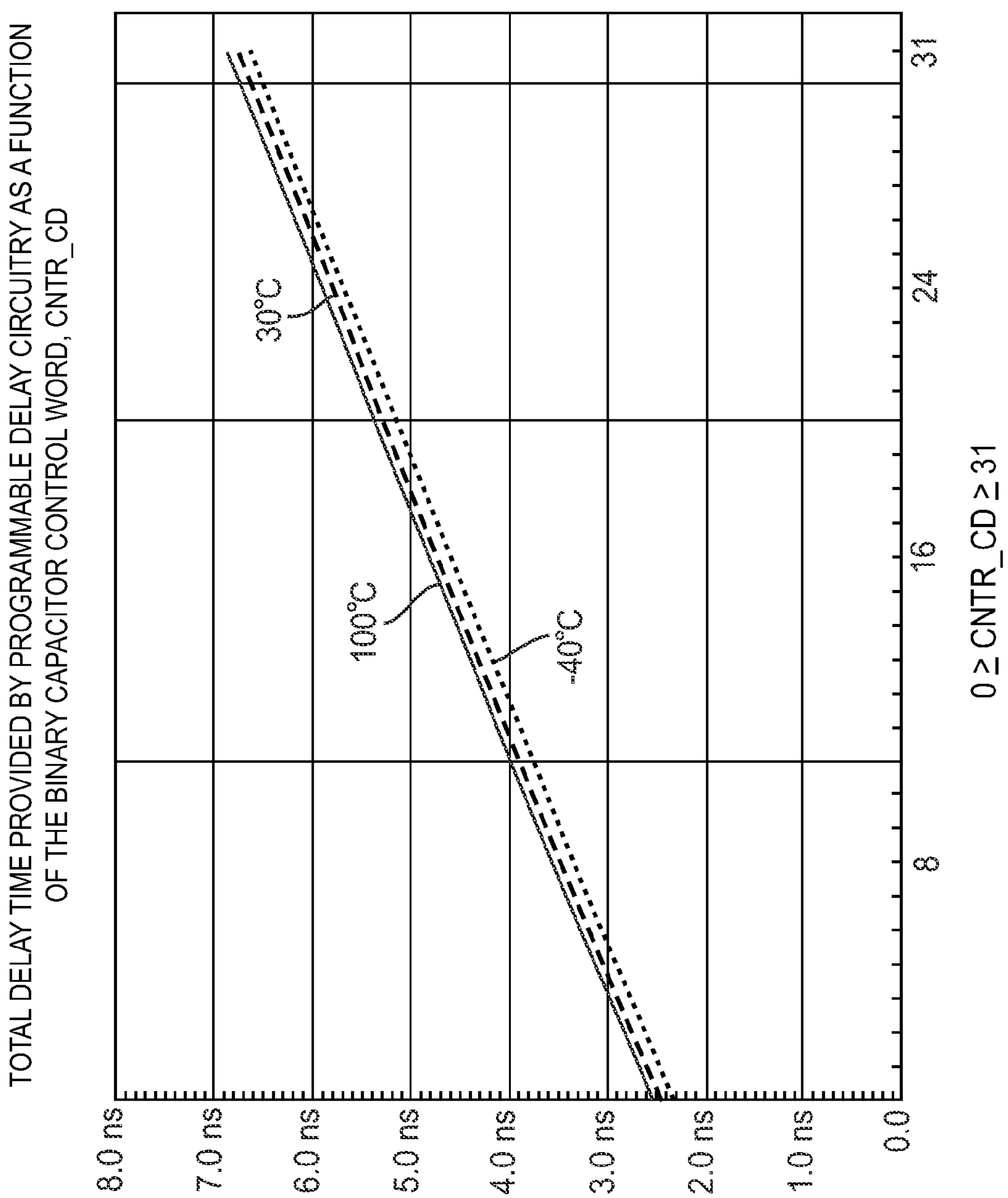
FIG. 37 depicts an example graph of the total delay time provided by the programmable delay circuit depicted in FIG. 30 as a function of the binary weighted programmable capacitor array.

FIG. 37 depicts an example graph of the total delay time provided by the programmable delay circuitry 432C, depicted in FIG. 30, as a function of the binary capacitor control word, CNTR_CD, of the programmable capacitor array 758, depicted in FIG. 36, with respect to temperature. As depicted in FIG. 37, the fixed delay time of the programmable delay circuitry 432C is approximately 2.45 ns when the programmable delay circuitry 432C operates at 30° C. The variable delay capacitance, $C_{DELAY\_VAR}$, of the variable delay capacitor 722 provides around 4 ns of variable delay time, $T_{VARIABLE\_DELAY\_TIME}$, with an average delay step size, $\Delta_{VARIABLE\_DELAY\_TIME}$, substantially equal to 132 ns.

Figure 34A:
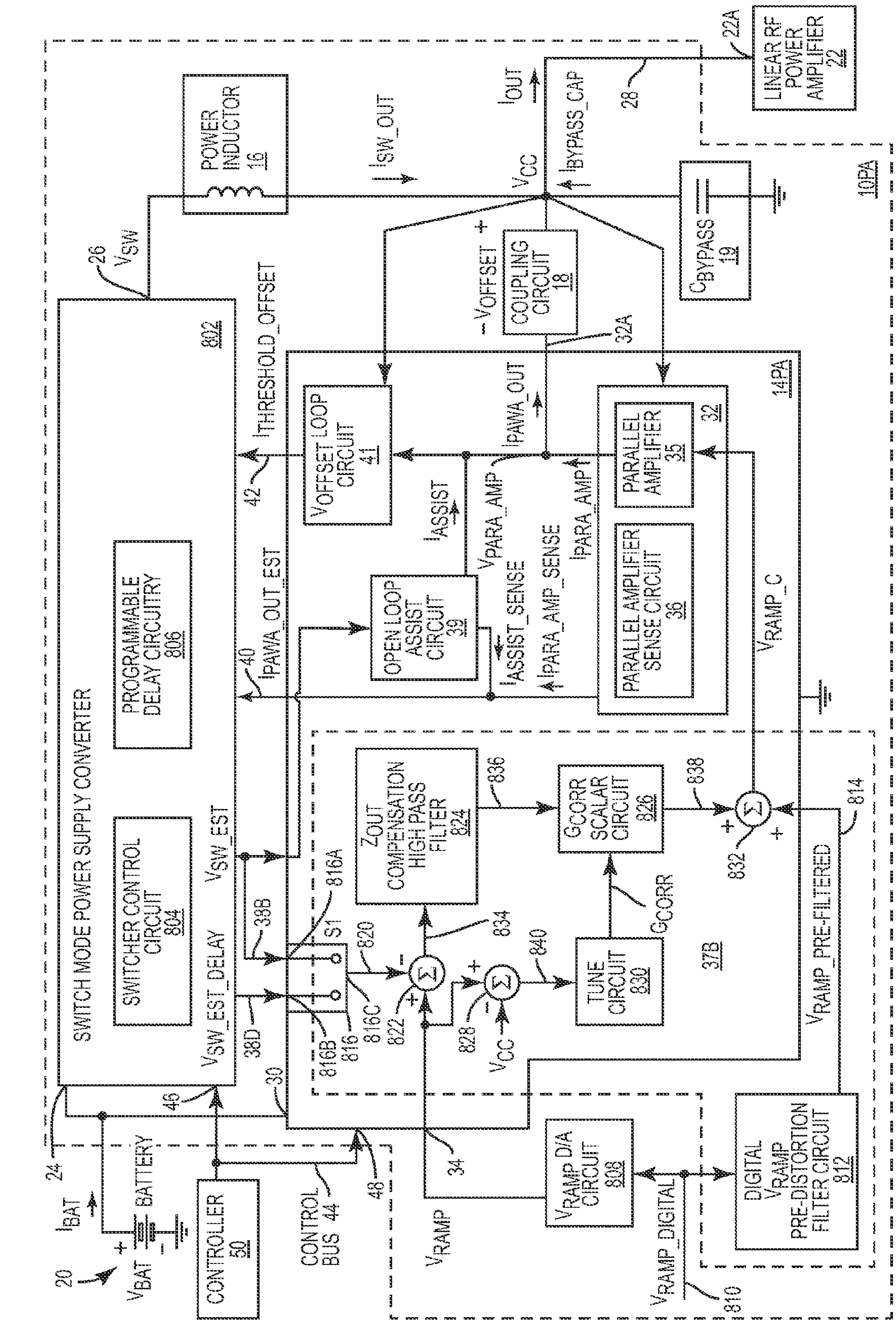
FIG. 34A depicts an embodiment of a parallel amplifier output impedance compensation circuit including a digital $V_{RAMP}$ pre-distortion filter circuit.

FIG. 34A depicts an example embodiment of a pseudo-envelope follower power management system 10PA that is similar in form and function to the pseudo-envelope follower power management system 10B, depicted in FIG. 2B. However, unlike the pseudo-envelope follower power management system 10B, depicted in FIG. 2B, the pseudo-envelope follower power management system 10PA may include a switch mode power supply converter 802 instead of the multi-level charge pump buck converter 12B. The switch mode power supply converter 802 may include a switcher control circuit 804 and programmable delay circuitry 806. In addition, unlike the pseudo-envelope follower power management system 10B, depicted in FIG. 2B, the pseudo-envelope follower power management system 10PA includes a parallel amplifier circuit 14PA.

Similar to the switch mode power supply converter 420 depicted in FIG. 24, but not by way of limitation, the switch mode power supply converter 802, depicted in FIGS. 34A-34E, may be either a multi-level charge pump buck converter or a buck converter. For example, the switch mode power supply converter 802 may be configured to be similar in form and function to the previously described embodiments of the multi-level charge pump buck converter 12M, depicted in FIG. 23A and FIG. 23C. Alternatively, in some embodiments, the switch mode power supply converter 802 may be configured to be similar in form and function to the buck converter 13L, depicted in FIG. 23B and FIG. 23D. However, unlike the switch mode power supply converter 420, depicted in FIG.

24, the switch mode power supply converter uses the switcher control circuit 804 in combination with the programmable delay circuitry 806 to generate a delayed estimated switching voltage output, 38D, $V_{SW\_EST\_DELAYED}$, instead of the delayed $I_{COR}$ estimated switching voltage output 38C, $V_{SW\_EST\_DELAY\_ICOR}$. Similar to the generation of the delayed $I_{COR}$ estimated switching voltage output 38C, $V_{SW\_EST\_DELAY\_ICOR}$, depicted in FIG. 24, controller 50 may configure the delay provided by the programmable delay circuitry 806 to temporally shift the delayed estimated switching voltage output, 38D, $V_{SW\_EST\_DELAYED}$, with respect to the estimated switching voltage output 38B, $V_{SW\_EST}$. Accordingly, similar to the generation of the delayed $I_{COR}$ estimated switching voltage output 38C, $V_{SW\_EST\_DELAY\_ICOR}$, depicted in FIG. 24, the controller 50 may temporally align the generation of the delayed estimated switching voltage output 38D, $V_{SW\_EST\_DELAYED}$, with respect to the $V_{RAMP}$ signal to improve performance of the circuitry and systems to be described.

In addition, some embodiments of the switch mode power supply converter 802 may include an FLL circuit (not depicted) similar to the FLL circuit 54. Likewise, as a non-limiting example, when the switch mode power supply converter 802 is configured as a multi-level charge pump buck converter, the switcher control circuit 804 may be similar to or incorporate various combinations of the operational features and functions of the embodiments of the switcher control circuits 52A-D, depicted in FIGS. 3A-D, the threshold detector and control circuits 132A-D, depicted in FIGS. 4A-D, and the circuitry and state machines depicted in FIGS. 5A-D and FIG. 6A-D that are associated with the logic circuits 148A-D, depicted in FIGS. 4A-D. Alternatively, as another non-limiting example, when the switch mode power supply converter 802 is configured as a buck converter, the switcher control circuit 804 may be similar to or incorporate the various combinations of the operational features and functions of the embodiments of the switcher control circuits 52E-H, depicted in FIGS. 3E-H, the threshold detector and control circuits 132E-H, depicted in FIGS. 4E-H, and the circuitry and state machine depicted in FIGS. 5E-H that are associated with the logic circuits 148E-H, depicted in FIGS. 4E-H.

Similar to the generation of the estimated switching voltage output 38B, $V_{SW\_EST}$, by the switcher control circuit 52 of the multi-level charge pump buck converter 12B, depicted in FIG. 2B, the delayed estimated switching voltage output 38D, $V_{SW\_EST\_DELAYED}$, provides an indication of the switching voltage output, $V_{SW}$, to be generated at the switching voltage output 26 based on the state of the switcher control circuit 804, except the delayed estimated switching voltage output 38D, $V_{SW\_EST\_DELAYED}$, may be delayed by an alignment period, $T_{ALIGNMENT}$. In contrast to the estimated switching voltage output 38B, $V_{SW\_EST}$, generated by embodiments of the switcher control circuits 52A-H, the delayed estimated switching voltage output 38D, $V_{SW\_EST\_DELAYED}$, provides an indication of the switching voltage, $V_{SW}$, to be generated at the switching voltage output 26 that may be delayed by the alignment period, $T_{ALIGNMENT}$, to compensate for delays in either the switch mode power supply converter 802 or the parallel amplifier circuit 14PA.

As an example, and not by way of limitation, similar to the delayed $I_{COR}$ estimated switching voltage output 38C, $V_{SW\_EST\_DELAY\_ICOR}$, depicted in FIG. 24, the programmable delay circuitry 806 of the switch mode power supply converter 802 may be configured by the controller 50 to provide a delay alignment period, $T_{ALIGNMENT}$, in order to generate the delayed estimated switching voltage output 38D, $V_{SW\_EST\_DELAYED}$. As a non-limiting example, the programmable delay circuitry 806 may be similar in form and function to the embodiments of the programmable delay circuitry 432, depicted in FIG. 24, including the programmable delay circuitry 432A, depicted in FIG. 29A, the programmable delay circuitry 432B, depicted in FIG. 29B, or the programmable delay circuitry 432C, depicted in FIG. 30.

In addition, the switcher control circuit 804 may include a threshold detector and control circuit (not shown) similar to the threshold detector and control circuit 132A of the switcher control circuit 52A, depicted in FIG. 3A, that generates the one or more switching voltage output cmos signal(s) 166, $V_{SW\_EST\_CMOS\_SIGNAL}$(s), to be provided to the programmable delay circuitry 806. Thus, similar to the switch mode power supply converter 420, depicted in FIG. 24, the controller 50 may configure the programmable delay circuitry 806 to delay the one or more switching voltage output cmos signal(s) 166, $V_{SW\_EST\_CMOS\_SIGNAL}$(s), by the alignment period, $T_{ALIGNMENT}$, in order to delay generation of the delayed estimated switching voltage output 38D, $V_{SW\_EST\_DELAYED}$, relative to the state of the switcher control circuit 804. In addition, similar to the switch mode power supply converter 420 depicted in FIG. 24, the controller 50 may configure the switch mode power supply converter 802 to scale the magnitude of the delayed estimated switching voltage output 38D, $V_{SW\_EST\_DELAYED}$, such that the magnitude of the delayed estimated switching voltage output 38D, $V_{SW\_EST\_DELAYED}$, tracks variations in the supply input 24, ($V_{BAT}$).

The pseudo-envelope follower power management system 10PA further includes a $V_{RAMP}$ digital-to-analog (D/A) circuit 808 and a parallel amplifier circuit 14PA that is similar in form and function to the parallel amplifier circuit 14B, depicted in FIG. 2B. However, unlike the parallel amplifier circuit 14B, the parallel amplifier circuit 14PA may be further configured to receive both the estimated switching voltage output 38B, $V_{SW\_EST}$, and the delayed estimated switching voltage output 38D, $V_{SW\_EST\_DELAYED}$, generated by the switch mode power supply converter 802. In addition, the $V_{RAMP}$ digital-to-analog (D/A) circuit 808 may be configured to receive a digital $V_{RAMP}$ signal 810, $V_{RAMP\_DIGITAL}$, from a baseband portion of a transceiver or modem (not depicted). The $V_{RAMP}$ digital-to-analog (D/A) circuit 808 converts the digital $V_{RAMP}$ signal 810, $V_{RAMP\_DIGITAL}$, to provide a version of the $V_{RAMP}$ signal in the analog domain. The version of the $V_{RAMP}$ signal may be either a differential or a single ended signal. The $V_{RAMP}$ digital-to-analog (D/A) circuit 808 provides the $V_{RAMP}$ signal to the first control input 34 of the parallel amplifier circuit 14PA.

The pseudo-envelope follower power management system 10PA includes a parallel amplifier output impedance compensation circuit 37B configured to generate a compensated $V_{RAMP}$ signal, $V_{RAMP\_C}$, for use by the parallel amplifier 35 in lieu of the $V_{RAMP}$ signal in order to reduce the high frequency ripple voltages generated in the parallel amplifier output voltage, $V\text{-}_{PARA\_AMP}$, by the parallel amplifier 35 at the parallel amplifier output 32A due to the non-ideal output impedance characteristics of the parallel amplifier 35. For example, as previously discussed with respect to the parallel amplifier output impedance compensation circuit 37A, depicted in FIG. 10, one of the non-ideal output impedance characteristics of the parallel amplifier 35 is that the parallel amplifier 35 an output impedance response that is inductive and increases approximately +6 dB/octave near and around the switching frequency of the switch mode power supply converter 802. Thus, for example, the output impedance of the parallel amplifier 35 may be characterized as having an parallel amplifier inductance, $L_{CORR}$, as previously discussed with respect to FIG. 10.

Returning to FIG. 34A, in addition, the parallel amplifier output impedance compensation circuit 37B includes a digital $V_{RAMP}$ pre-distortion filter circuit 812. The frequency response of the digital $V_{RAMP}$ pre-distortion filter circuit 812 may be configured to equalize the response of the pseudo-envelope follower power management system 10PA. As an example, the digital $V_{RAMP}$ pre-distortion filter circuit 812 may be configured to pre-distort the digital $V_{RAMP}$ signal 810, $V_{RAMP\_DIGITAL}$, in order to compensate for different combinations of the power inductor inductance of the power inductor 16 and the bypass capacitance, $C_{BYPASS}$, of the bypass capacitor 19, the transfer function of the parallel amplifier 35, the power amplifier associated inductance, $L_{PA}$, (not shown), and the power amplifier filter associated capacitance, $C_{PA}$, (not shown), and/or some combination thereof.

For example, the power amplifier associated inductance, $L_{PA}$, (not shown) includes any parasitic inductance or filter inductance added between the power amplifier supply voltage, $V_{CC}$, controlled by the parallel amplifier circuit 14PA, and the power amplifier collector 22A of a linear RF power amplifier 22. The power amplifier associated capacitance, $C_{PA}$, (not shown) includes any parasitic capacitance of a load line between the power amplifier supply voltage, $V_{CC}$, controlled by the parallel amplifier circuit 14PA and any added decoupling capacitance related to a power amplifier decoupling capacitor (not shown) coupled to the power amplifier collector 22A. The power amplifier associated inductance, $L_{PA}$, and the power amplifier associated capacitance, $C_{PA}$, (not shown) may be determined at the time of calibration of an electronic device that includes the pseudo-envelope follower power management system 10PA. The power amplifier associated inductance, $L_{PA}$, (not shown) in combination with the power amplifier associated capacitance, $C_{PA}$, (not shown) may form a power amplifier low pass filter (not shown) such that the frequency response of the combination of the power amplifier low pass filter and the pseudo-envelope follower power management system 10PA is not substantially flat through the operating frequency range of the linear RF power amplifier 22. Accordingly, the frequency response of the digital $V_{RAMP}$ pre-distortion filter circuit 812 may be configured to compensate the frequency response of the pseudo-envelope follower power management system 10PA such that the overall frequency response, as measured between the digital $V_{RAMP}$ signal 810, $V_{RAMP\_DIGITAL}$, and the power amplifier collector 22A, is substantially flat through the operating frequency range of the linear RF power amplifier 22.

As depicted in FIG. 34A, in some embodiments of the parallel amplifier output impedance compensation circuit 37B, the digital $V_{RAMP}$ pre-distortion filter circuit 812 is located in a digital baseband processing portion of a transceiver or modem of a communication device (not shown). The digital $V_{RAMP}$ pre-distortion filter circuit 812 is in communication with the parallel amplifier circuit 14PA, and provides a pre-filtered $V_{RAMP}$ signal 814, $V_{RAMP\_PRE\text{-}FILTERED}$. In some alternative embodiments of the pseudo-envelope follower power management system 10PA, (not shown), the digital $V_{RAMP}$ pre-distortion filter circuit 812 may be included in the parallel amplifier circuit 14PA.

Accordingly, unlike the parallel amplifier circuit 14B, depicted in FIG. 2B, the parallel amplifier circuit 14PA, depicted in FIG. 34A, includes a portion of a parallel amplifier output impedance compensation circuit 37B that is in communication with a digital $V_{RAMP}$ pre-distortion filter circuit 812. Whereas the embodiments of the parallel amplifier output impedance compensation circuit 37, depicted in FIG. 2B, and the parallel amplifier output impedance compensation circuit 37A, depicted in FIG. 10, are depicted as receiving an analog $V_{RAMP}$ signal, the digital $V_{RAMP}$ pre-distortion filter circuit 812 of the parallel amplifier output impedance compensation circuit 37B is configured to receive a digital $V_{RAMP}$ signal 810, $V_{RAMP\_DIGITAL}$, from the baseband portion of a transceiver or modem. The digital $V_{RAMP}$ pre-distortion filter circuit 812 provides a pre-filtered $V_{RAMP}$ signal 814, $V_{RAMP\_PRE\text{-}FILTERED}$. As will be discussed, the digital $V_{RAMP}$ pre-distortion filter circuit 812 filters the digital $V_{RAMP}$ signal 810, $V_{RAMP\_DIGITAL}$, to generate the pre-filtered $V_{RAMP}$ signal 814, $V_{RAMP\_PRE\text{-}FILTERED}$, to equalize the overall frequency response of the pseudo-envelope follower power management system 10PA.

Figure 35:
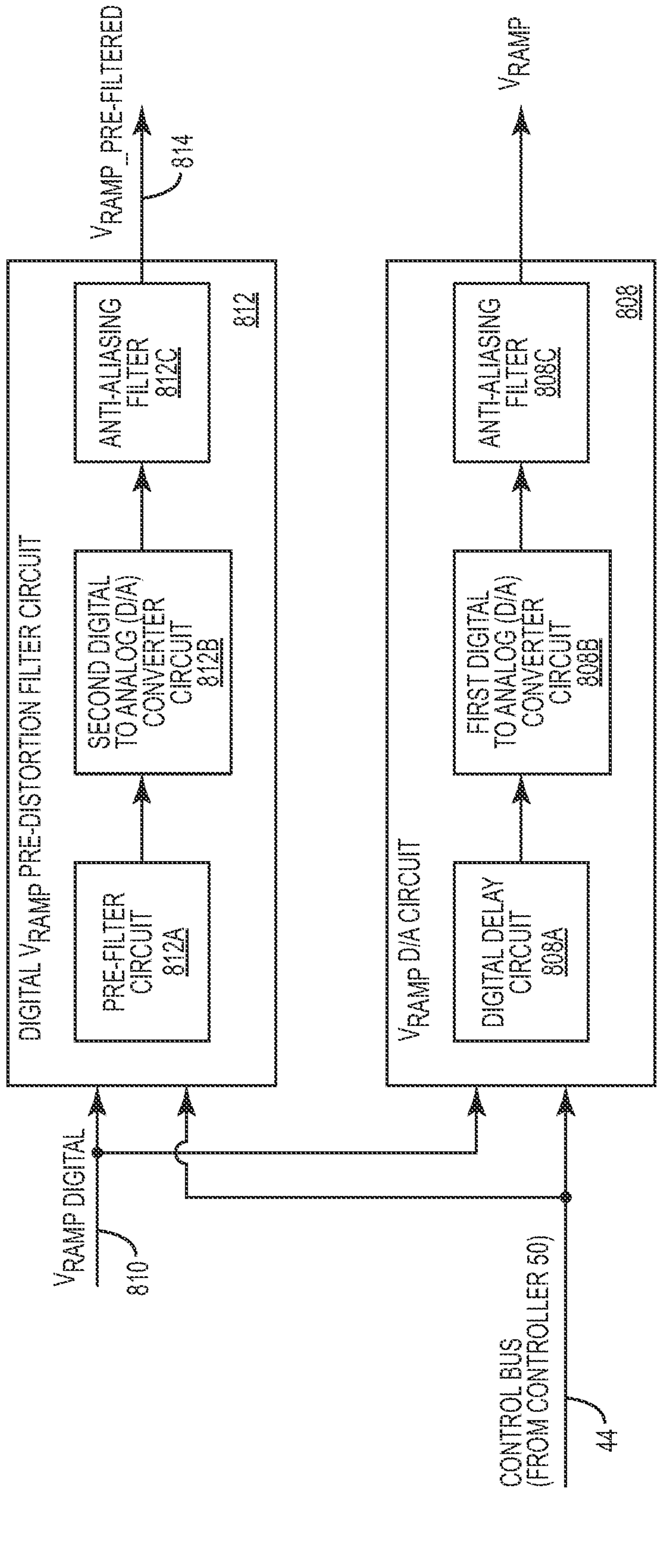
FIG. 35 depicts embodiments of the digital $V_{RAMP}$ pre-distortion filter and a $V_{RAMP}$ digital-to-analog (D/A) circuit.

FIG. 35 is described with continuing reference to FIG. 34A. FIG. 35 depicts an embodiment of $V_{RAMP}$ digital-to-analog (D/A) circuit 808 and the digital $V_{RAMP}$ pre-distortion filter circuit 812. As depicted in FIG. 35, the $V_{RAMP}$ digital-to-analog (D/A) circuit 808 may include a digital delay circuit 808A, a first digital-to-analog converter (D/A) circuit 808B, and an anti-aliasing filter 808C. The $V_{RAMP}$ digital-to-analog (D/A) circuit 808 may be coupled to the control bus 44, from controller 50 (not depicted), and configured to receive the digital $V_{RAMP}$ signal 810, $V_{RAMP\_DIGITAL}$. Via the control bus 44, the controller 50 may configure the operation of the digital delay circuit 808A, the first digital-to-analog (D/A) converter circuit 808B, and the anti-aliasing filter 808C. The $V_{RAMP}$ digital-to-analog (D/A) circuit 808 may be configured to generate the $V_{RAMP}$ signal in the analog domain. For example, in some embodiments, the $V_{RAMP}$ digital-to-analog (D/A) circuit 808 may generate a differential analog version of the $V_{RAMP}$ signal. The digital delay circuit 808A may be configured to receive the digital $V_{RAMP}$ signal 810, $V_{RAMP\_DIGITAL}$. The digital delay circuit 808A may be a programmable tapped delay line configured to delay the digital $V_{RAMP}$ signal 810, $V_{RAMP\_DIGITAL}$, such that the generated the $V_{RAMP}$ signal is temporally aligned with the pre-filtered $V_{RAMP}$ signal 814, $V_{RAMP\_PRE\text{-}FILTERED}$. The digital delay circuit provides the delayed version of the digital $V_{RAMP}$ signal 810, $V_{RAMP\_DIGITAL}$, to the first digital-to-analog (D/A) converter circuit 808B. The first digital-to-analog (D/A) converter circuit 808B converts the delayed version of the digital $V_{RAMP}$ signal 810, $V_{RAMP\_DIGITAL}$, into an analog representation of the $V_{RAMP}$ signal, which is anti-aliasing filtered by the anti-aliasing filter 808C to generate the $V_{RAMP}$ signal.

The digital $V_{RAMP}$ pre-distortion filter circuit 812 may include a pre-filter circuit 812A, a second digital-to-analog converter (D/A) circuit 812B, and an anti-aliasing filter 812C. The pre-filter circuit 812A may be configured to be either an infinite impulse response (IIR) filter or a finite impulse response (FIR) filter configured to receive the digital $V_{RAMP}$ signal 810, $V_{RAMP\_DIGITAL}$. The pre-filter circuit 812A may be configured by the controller 50 to control the frequency response of the pre-filter circuit 812A. The pre-filter circuit 812A may include one or more coefficients that may be configured by the controller 50 to shape the frequency response of the pre-filter circuit 812A.

As an example, in the case where the pre-filter circuit 812A is configured to be an infinite impulse response (IIR) filter, the pre-filter circuit 812A may include feed forward filter coefficients and feedback filter coefficients. Likewise, the pre-filter circuit 812A may be configured to be a multiple order filter. For example, in some embodiments of the digital $V_{RAMP}$ pre-distortion filter circuit 812, the pre-filter circuit 812A may be configured to be a first order filter. In alternative embodiments of the digital $V_{RAMP}$ pre-distortion filter circuit 812, the pre-filter circuit 812A may be a filter having two or more orders. As a result, the digital $V_{RAMP}$ pre-distortion filter circuit 812 may permit the controller to have additional degrees of control of the pre-distortion of the digital $V_{RAMP}$ signal 810, $V_{RAMP\_DIGITAL}$, which is used to provide a pre-distorted $V_{RAMP}$ signal. As an example, the controller 50 may configure the feed forward coefficients and the feedback coefficients of the digital $V_{RAMP}$ pre-distortion filter circuit 812 to provide frequency peaking to compensate for the low pass filter effect of the combination of the power amplifier associated inductance, $L_{PA}$, (not shown), and the power amplifier filter associated capacitance, $C_{PA}$, (not shown), as described above.

As an alternative case, in some embodiments the pre-filter circuit 812A may be a finite impulse response (FIR) filter having multiple weighting coefficients. The controller 50 may configure each of the weighting coefficients to configure the frequency response of the digital $V_{RAMP}$ pre-distortion filter circuit 812 to pre-distort the digital $V_{RAMP}$ signal, $V_{RAMP\_DIGITAL}$, to also equalize the overall frequency response of the pseudo-envelope follower power management system 10PA. In addition, the digital $V_{RAMP}$ pre-distortion filter circuit 812 may be further configured to compensate for the power amplifier associated inductance, $L_{PA}$, (not shown), and the power amplifier filter associated capacitance, $C_{PA}$, (not shown), such that the overall frequency response, as measured between the digital $V_{RAMP}$ signal 810, $V_{RAMP\_DIGITAL}$, and the power amplifier collector 22A, is substantially flat through the operating frequency range of the linear RF power amplifier 22.

The output of the pre-filter circuit 812A is digital to analog converted by the second digital-to-analog converter (D/A) circuit 812B, where the output of the second digital-to-analog converter (D/A) circuit 812B is anti-alias filtered by the anti-aliasing filter 812C to provide the pre-filtered $V_{RAMP}$ signal 814, $V_{RAMP\_PRE\text{-}FILTERED}$. The frequency response of the pre-filter circuit 812A may be configured to equalize the overall transfer function response between the digital $V_{RAMP}$ signal 810, $V_{RAMP\_DIGITAL}$, and the power amplifier collector 22A. As an example, the amount or shape of the equalization provided by the frequency response of the pre-filter circuit 812A, and thus the digital $V_{RAMP}$ pre-distortion filter circuit 812, may depend upon the bypass capacitance, $C_{BYPASS}$, of the bypass capacitor 19, the power amplifier associated inductance, $L_{PA}$, (not shown), the power amplifier associated capacitance, $C_{PA}$, (not shown), the frequency response of the parallel amplifier 35, and/or a combination thereof.

In addition, the controller 50 may adjust the frequency response of the pre-filter circuit 812A by modifying the one or more coefficients of the pre-filter circuit 812A to equalize the relative transfer function response between the power amplifier supply voltage $V_{CC}$, and the digital $V_{RAMP}$ signal 810, $V_{RAMP\_DIGITAL}$. The controller 50 adjusts the frequency response of the pre-filter circuit 812A such that the frequency response of the overall transfer function response between the digital $V_{RAMP}$ signal 810, $V_{RAMP\_DIGITAL}$, and the power amplifier collector 22A is substantially flattened through a desired frequency range. Illustratively, in some embodiments, the controller 50 may configure the equalization or frequency response of the pre-filter circuit 812A such that the frequency response of the overall transfer function response the digital $V_{RAMP}$ signal 810, $V_{RAMP\_DIGITAL}$, and the power amplifier collector 22A is substantially flattened out to around 20 MHz.

As an example, where the pre-filter circuit 812A is configured as an IIR filter, the pre-filter circuit 812A is configured to operate at a clock rate of about 312 MHz. Illustratively, for the case where the bypass capacitance, $C_{BYPASS}$, of the bypass capacitor 19 is approximately 2 nF, the controller 50 may configure the frequency response of the pre-filter circuit 812A to have a pole at approximately 14.5 MHz and a zero at approximately 20 MHz.

In addition, in some embodiments of the digital $V_{RAMP}$ pre-distortion filter circuit 812, the controller 50 may configure the equalization or frequency response provided by the pre-filter circuit 812A as a function of the operational bandwidth of the linear RF power amplifier 22 need to provide the wide-band modulation corresponding to a specific LTE band number. As an example, in a case where the LTE band has a 15 MHz bandwidth, the controller 50 may configure the digital $V_{RAMP}$ pre-distortion filter circuit 812 to provide additional $V_{RAMP}$ pre-distortion such that the radio frequency signal generated by the linear RF power amplifier falls within the spectrum mask requirements for an LTE 15 MHz test case.

Returning to FIG. 34A, the parallel amplifier output impedance compensation circuit 37B may further include an estimated switching voltage output selection switch 816, $S_1$, having a first input 816A configured to receive the estimated switching voltage output 38B, $V_{SW\_EST}$, a second input 816B configured to receive the delayed estimated switching voltage output 38D, $V_{SW\_EST\_DELAYED}$, and an estimated switching voltage output selection switch output 816C. The controller 50 may configure the estimated switching voltage output selection switch 816, $S_1$, to provide either the estimated switching voltage output 38B, $V_{SW\_EST}$, or the delayed estimated switching voltage output 38D, $V_{SW\_EST\_DELAYED}$, as an estimated switching voltage input signal 820, $V_{SW\_I}$, at the estimated switching voltage output selection switch output 816C.

The parallel amplifier output impedance compensation circuit 37B further includes a first subtracting circuit 822, $Z_{OUT}$ compensation high pass filter 824, a $G_{CORR}$ scalar circuit 826, a second subtracting circuit 828, a tune circuit 830, and a summing circuit 832. The first subtracting circuit 822 includes a positive terminal configured to receive the $V_{RAMP}$ signal provided to the first control input 34 of the parallel amplifier circuit 14PA and a negative terminal configured to receive the estimated switching voltage input signal 820, $V_{SW\_I}$. The first subtracting circuit 822 subtracts the estimated switching voltage input signal 820, $V_{SW\_I}$, from the $V_{RAMP}$ signal to generate an expected difference signal 834, which is provided to the $Z_{OUT}$ compensation high pass filter 824. The expected difference signal 834 represents the difference between the target voltage level of the power amplifier supply voltage $V_{CC}$, to be generated at the power amplifier supply output 28 in response to the $V_{RAMP}$ signal and the switching voltage, $V_{SW}$, to be provided at the switching voltage output 26 of the switch mode power supply converter 802 at the time when the parallel amplifier 35 generates the parallel amplifier output voltage, $V_{PARA\_AMP}$, at the parallel amplifier output 32A based on the difference between the power amplifier supply voltage, $V_{CC}$, and the $V_{RAMP}$ signal.

The frequency response of the $Z_{OUT}$ compensation high pass filter 824 may be configurable. As an example, the $Z_{OUT}$ compensation high pass filter 824 may include programmable time constants. The $Z_{OUT}$ compensation high pass filter 824 may include resistor arrays or capacitance arrays that may be configurable by the controller 50 to set the value of programmable time constants. For example, the resistor arrays may be binary weighted resistor arrays similar to the binary weighted resistor arrays previously described. The capacitor arrays may be binary weighted capacitor arrays similar to the binary weighted capacitor arrays previously described. The controller 50 may configure the programmable time constants of the $Z_{OUT}$ compensation high pass filter 824 to obtain a desired high pass filter response. In addition, the controller 50 may configure the programmable time constants of the $Z_{OUT}$ compensation high pass filter 824 to obtain a desired high pass filter response as a function of the operational bandwidth or the wide-bandwidth modulation associated with the LTE band number for which the linear RF power amplifier 22 is configured to operate.

Illustratively, in some embodiments, the $Z_{OUT}$ compensation high pass filter 824 may have a programmable time constant set to 40 nanoseconds. For example, the programmable time constant may be obtained by the controller 50 configuring the resistance of a programmable resistor to be substantially equal to 4K ohms and the capacitance of a programmable capacitor to be substantially equal to 10 pF. In this scenario, the high pass cutoff frequency, $f_{HPC}$, of the example $Z_{OUT}$ compensation high pass filter 824 may be approximately equal to 4 MHz. In some embodiments, the $Z_{OUT}$ compensation high pass filter 824 may be a multiple-order high pass filter having multiple programmable time constants. In the case where the $Z_{OUT}$ compensation high pass filter 824 is a multiple-order high pass filter, the controller 50 may be configured to set multiple programmable time constants to obtain a desired high pass frequency response from the $Z_{OUT}$ compensation high pass filter 824. As an example, the $Z_{OUT}$ compensation high pass filter 824 may be a second order high pass filter having a first time constant and a second time constant corresponding to a first high pass cutoff frequency, $f_{HPC1}$, and a second high pass cutoff frequency, $f_{HPC2}$. In this case, the controller 50 may configure the first time constant and the second time constant of the $Z_{OUT}$ compensation high pass filter 824 to obtain a desired high pass frequency response. In other embodiments, the $Z_{OUT}$ compensation high pass filter 824 may be configured as an active filter.

When the controller 50 configures the estimated switching voltage output selection switch 816, $S_1$, to provide the delayed estimated switching voltage output 38D, $V_{SW\_EST\_DELAYED}$, as the estimated switching voltage input signal 820, $V_{SW\_I}$, the controller 50 may configure the programmable delay circuitry 806 to provide a delay substantially equal to an alignment period, $T_{ALIGNMENT}$, in order to time align the indication of the switching voltage output, $V_{SW}$, represented by the estimated switching voltage input signal 820, $V_{SW\_I}$, with the $V_{RAMP}$ signal. The expected difference signal 834 is provided to the $Z_{OUT}$ compensation high pass filter 824. The $Z_{OUT}$ compensation high pass filter 824 high pass filters the expected difference signal 834 to generate an estimated high frequency ripple signal 836. The high pass filtering of the $Z_{OUT}$ compensation high pass filter 824 substantially extracts only the high frequency content of the expected difference signal 834, where the high frequency content of the expected difference signal 834 represents a scaled derivative of the ripple current in the inductor current, $I_{SW\_OUT}$, of the power inductor 16 generated by the switch mode power supply converter 802 due to the changes in the switching voltage, $V_{SW}$, associated with the estimated switching voltage input signal 820, $V_{SW\_I}$. Thus, the estimated high frequency ripple signal 836 represents an estimated high frequency ripple current at the power amplifier supply output 28 that may cause the parallel amplifier 35 to generate high frequency ripple voltages in the parallel amplifier output voltage, $V_{PARA\_AMP}$, at the parallel amplifier output 32A. The delay period provided by the programmable delay circuitry 806 may be configured by the controller 50 to temporally align the delayed estimated switching voltage output 38D, $V_{SW\_EST\_DELAYED}$, with the $V_{RAMP}$ signal to improve the accuracy of the estimated high frequency ripple signal 836.

In contrast, the controller 50 may configure the estimated switching voltage output selection switch 816, $S_1$, to provide the estimated switching voltage output 38B, $V_{SW\_EST}$, as the estimated switching voltage input signal 820, $V_{SW\_I}$, to the $Z_{OUT}$ compensation high pass filter 824. In this case, the $Z_{OUT}$ compensation high pass filter 824 high pass filters the expected difference signal 834 to generate the estimated high frequency ripple signal 836. The estimated high frequency ripple signal 836 substantially corresponds to a scaled derivative of a switcher ripple current in the inductor current, $I_{SW\_OUT}$, of the power inductor 16 based on the estimated switching voltage output 38B, $V_{SW\_EST}$. However, because the generation of the estimated switching voltage output 38B, $V_{SW\_EST}$, cannot be temporally aligned by adjusting a delay period provided by the programmable delay circuitry 806, the controller 50 may not configure the programmable delay circuitry 806 to minimize the peak-to-peak ripple voltages on the power amplifier supply voltage, $V_{CC}$, by improving the temporal alignment of the estimated switching voltage output 38B, $V_{SW\_EST}$, with respect to the $V_{RAMP}$ signal.

As previously discussed, the $Z_{OUT}$ compensation high pass filter 824 high pass filters the expected difference signal 834 generated based on the estimated switching voltage output 38B, $V_{SW\_EST}$, to generate the estimated high frequency ripple signal 836. The pass band of the $Z_{OUT}$ compensation high pass filter 824 extract only the high frequency content of the estimated switching voltage input signal 820, $V_{SW\_I}$, where the expected difference signal 834 represents the expected difference between the switching voltage output, $V_{SW}$, and the target voltage level of the power amplifier supply voltage, $V_{CC}$, based on the $V_{RAMP}$ signal.

Because the $Z_{OUT}$ compensation high pass filter 824 high pass filters the expected difference signal 834, the direct current content of the expected difference signal 834 is not present in the estimated high frequency ripple signal 836. The $G_{CORR}$ scalar circuit 826 scales the estimated high frequency ripple signal 836 based on a scaling factor, $G_{CORR}$, to generate a high frequency ripple compensation signal 838. The high frequency ripple compensation signal 838 is added to the pre-filtered $V_{RAMP}$ signal 814, $V_{RAMP\_PRE\text{-}FILTERED}$, by the summing circuit 832 to generate the compensated $V_{RAMP}$ signal, $V_{RAMP\_C}$. The high frequency ripple compensation signal 838 is added to the pre-filtered $V_{RAMP}$ signal 814, $V_{RAMP\_PRE\text{-}FILTERED}$, to compensate for the non-ideal output impedance of the parallel amplifier 35. The compensated $V_{RAMP}$ signal, $V_{RAMP\_C}$, is provided as an input to the parallel amplifier 35. The parallel amplifier generates the parallel amplifier output voltage, $V_{PARA\_AMP}$, based on the difference between the compensated $V_{RAMP}$ signal, $V_{RAMP\_C}$, and the power amplifier supply voltage, $V_{CC}$.

Generation of the scaling factor, $G_{CORR}$, will now be discussed. The second subtracting circuit 828 is configured to subtract the power amplifier supply voltage, $V_{CC}$, from the $V_{RAMP}$ signal to provide a $G_{CORR}$ feedback signal 840 that is received by the tune circuit 830. In some embodiments of the parallel amplifier output impedance compensation circuit 37B, the tune circuit 830 may be configured to dynamically provide the scaling factor, $G_{CORR}$, to the $G_{CORR}$ scalar circuit 826 based on the $G_{CORR}$ feedback signal 840. As an example, the controller 50 may configure the tune circuit 830 to provide a different value of the scaling factor, $G_{CORR}$, on a block-by-block transmission basis dependent upon the operational mode of the linear RF power amplifier 22. For example, the tune circuit 830 may be configured by the controller 50 during a calibration procedure to develop at least one $G_{CORR}$ curve. In other embodiments, the tune circuit 830 may have multiple $G_{CORR}$ curves that may be used to provide a scaling factor, $G_{CORR}$, based on the $G_{CORR}$ feedback signal 840 and the operational mode of the linear RF power amplifier 22. As an example, the controller 50 may configure the tune circuit 830 to use a particular one of the $G_{CORR}$ curves depending on the configuration and/or operational mode of the pseudo-envelope follower power management system 10PA, the parallel amplifier 35, or a combination thereof. Each $G_{CORR}$ curve may include several coefficients or values for the scaling factor, $G_{CORR}$, that correspond to the magnitude of the $G_{CORR}$ feedback signal 840. In some embodiments, the controller 50 may select a $G_{CORR}$ curve to be used on a block-by-block transmission basis depending on the operational mode of the linear RF power amplifier 22.

For example, the controller 50 may select a first $G_{CORR}$ curve to be used by the tune circuit 830 when the linear RF power amplifier 22 is in a first operational mode. The controller 50 may select a second $G_{CORR}$ curve to be used by the tune circuit 830 when the linear RF power amplifier 22 is in a second operational mode. In still other embodiments of the parallel amplifier output impedance compensation circuit 37B, the tune circuit 830 may only have one $G_{CORR}$ curve to be used by the tune circuit 830 to provide the scaling factor, $G_{CORR}$, to the $G_{CORR}$ scalar circuit 826 based on the $G_{CORR}$ feedback signal 840.

As an example, in some embodiments of the parallel amplifier output impedance compensation circuit 37B, the scaling factor, $G_{CORR}$, is tuned by the tune circuit 830 based on a built-in calibration sequence that occurs at power start-up. As an example, the controller 50 may configure the switch mode power supply converter 802 to operate with a switching frequency that is a fixed frequency to create a switcher ripple current in the inductor current, $I_{SW\_OUT}$, of the power inductor 16 at a frequency of concern for the pseudo-envelope follower power management system 10PA. In those cases where the switch mode power supply converter 802 is configured as a multi-level charge pump buck converter, the controller 50 may configure the switch mode power supply converter 802 to operate in a "bang-bang mode" of operation. When operating in the "bang-bang mode" of operation, the controller 50 configures the switcher control circuit 804 such that the switch mode power supply converter 802 operates in a fashion similar to a buck converter. Thus, when operating in the "bang-bang mode" of operation, the switch mode power supply converter 802 switcher control circuit 804 does not permit the switch mode power supply converter 802 to provide a boosted output voltage at the switching voltage output 26.

As a non-limiting example, to tune the scaling factor, $G_{CORR}$, the controller 50 may configure the switch mode power supply converter 802 to operate at a calibration frequency with a fixed duty cycle in order to create a switcher ripple current at the calibration frequency. For example, the controller 50 may set the calibration frequency to 10 MHz. The $V_{RAMP}$ signal is set to a constant value in order to create a constant output value for the power amplifier supply voltage, $V_{CC}$, at the power amplifier supply output 28. As discussed previously, the controller 50 may configure the switch mode power supply converter 802 to operate in a "bang-bang mode" of operation. The direct current voltage present at the power amplifier supply voltage, $V_{CC}$, will be primarily set by the duty cycle of the switch mode power supply converter 802. The direct current (DC) voltage may be mainly set by the duty cycle on the switching voltage output 26 of the switch mode power supply converter 802. The tune circuit 830 determines the peak-to-peak ripple voltage on the power amplifier supply voltage, $V_{CC}$, based on the $G_{CORR}$ feedback signal 840. Based on the magnitude of the peak-to-peak ripple voltage on the power amplifier supply voltage, $V_{CC}$, the tune circuit 830 adjusts the value of the scaling factor, $G_{CORR}$, until the peak-to-peak ripple voltage on the $G_{CORR}$ feedback signal 840 is minimized. In some embodiments, to adjust the value of the scaling factor, $G_{CORR}$, based on the $G_{CORR}$ feedback signal 840, the controller 50 may determine the degree of adjustment to provide based on the estimated power inductor inductance parameter, $L_{EST}$, the estimated bypass capacitor capacitance parameter, $C_{BYPASS\_EST}$, and the estimated power amplifier transconductance parameter, $K\_I_{OUT\_EST}$, as previously described. Based on the scaling factor, $G_{CORR}$, that provides the minimum the peak-peak ripple voltage on the power amplifier supply voltage, $V_{CC}$, the tune circuit 830 selects the scaling factor, $G_{CORR}$, to be provided to the $G_{CORR}$ scalar circuit 826. In some embodiments, the controller 50 may configure the switch mode power supply converter 802 to operate at various calibration frequencies to develop one or more $G_{CORR}$ curves, where each $G_{CORR}$ curve corresponds to an operational mode of the linear RF power amplifier 22.

The determination of the scaling factor, $G_{CORR}$, and/or the development of the $G_{CORR}$ curves is substantially orthogonal to the temporal alignment of the delayed estimated switching voltage output 38D, $V_{SW\_EST\_DELAYED}$. Thus, following calibration of the tune circuit 830 to provide the scaling factor, $G_{CORR}$, appropriate for the operational mode of the linear RF power amplifier 22, the controller 50 may be further configure to adjust the alignment period, $T_{ALIGNMENT}$, associated with the programmable delay circuitry 806 to temporally align the delayed estimated switching voltage output 38D, $V_{SW\_EST\_DELAYED}$, in order to further minimize the peak-to-peak ripple voltage on the power amplifier supply voltage, $V_{CC}$. Thus, after the controller 50 completes the calibration of the tune circuit 830 to minimize the peak-to-peak ripple voltage on the power amplifier supply voltage, $V_{CC}$, the controller 50 may configure the programmable delay circuitry 806 to iteratively adjust the alignment period, $T_{ALIGNMENT}$, provided by the programmable delay circuitry 806 to further minimize the peak-to-peak ripple voltage on the power amplifier supply voltage, $V_{CC}$. In some embodiments, the controller 50 may determine the alignment period, to be provided by the programmable delay circuitry 806, for different operational modes of the linear RF power amplifier 22.

Figure 34B:
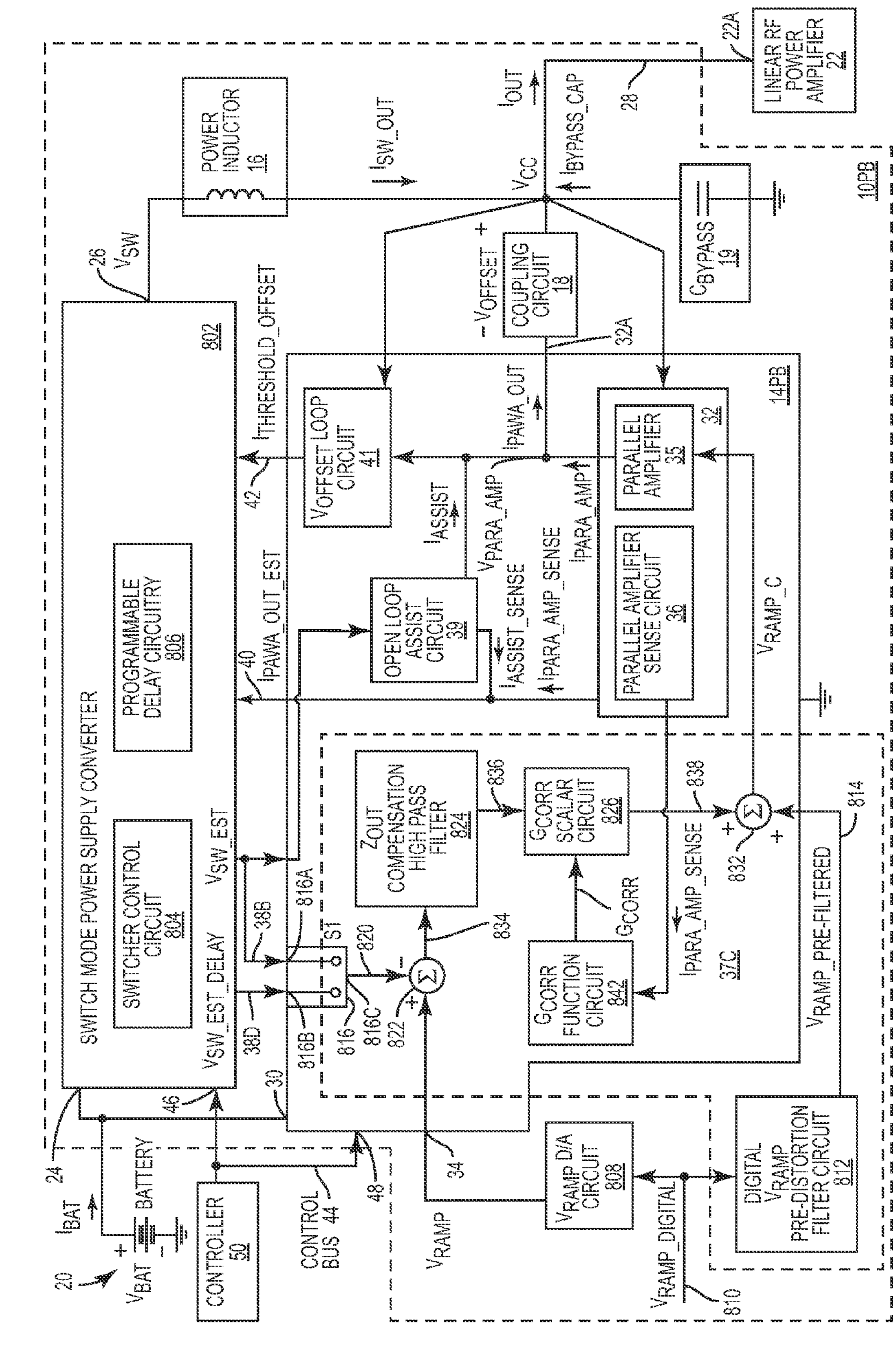
FIG. 34B depicts an alternative embodiment of a parallel amplifier output impedance compensation circuit.

FIG. 34B depicts another example embodiment of a pseudo-envelope follower power management system 10PB that is similar in form and function to the pseudo-envelope follower power management system 10PA, depicted in FIG. 34A. However, unlike the pseudo-envelope follower power management system 10PA, the pseudo-envelope follower power management system 10PB includes a parallel amplifier output impedance compensation circuit 37C that is divided between a parallel amplifier circuit 14PB and the digital baseband processing portion of a transceiver or modem. The example embodiment of the parallel amplifier output impedance compensation circuit 37C is similar in form and function to the parallel amplifier output impedance compensation circuit 37B, depicted in FIG. 34A, except the scaling factor, $G_{CORR}$, is provided by a $G_{CORR}$ function circuit 842 instead of the tune circuit 830, depicted in FIG. 35A.

The $G_{CORR}$ function circuit 842 is configured to receive the scaled parallel amplifier output current estimate, $I_{PARA\_AMP\_SENSE}$, generated by the parallel amplifier sense circuit 36 of the parallel amplifier circuitry 32. The value of the scaling factor, $G_{CORR}$, may be based on a $G_{CORR}$ scaling function, $G_{CORR}(I_{PARA\_AMP\_SENSE})$, where the $G_{CORR}$ scaling function, $G_{CORR}(I_{PARA\_AMP\_SENSE})$, characterizes values of the scaling factor, $G_{CORR}$, as a function of the scaled parallel amplifier output current estimate, $I_{PARA\_AMP\_SENSE}$. In some embodiments, the $G_{CORR}$ scaling function, $G_{CORR}(I_{PARA\_AMP\_SENSE})$, may be a polynomial function. In other embodiments, the $G_{CORR}$ scaling function, $G_{CORR}(I_{PARA\_AMP\_SENSE})$, may be a linear function. For example, the $G_{CORR}$ scaling function, $G_{CORR}(I_{PARA\_AMP\_SENSE})$, may have $G_{CORR}$ scaling function coefficients that may be configurable by the controller 50 via the control bus 44. As a non-limiting example, equation (18) provides an example of the $G_{CORR}$ scaling function, $G_{CORR}(I_{PARA\_AMP\_SENSE})$, having two $G_{CORR}$ scaling function coefficients. For example, the $G_{CORR}$ scaling function coefficients may include a first $G_{CORR}$ scaling function coefficient, $G_{CORR}(0)$, and a second $G_{CORR}$ scaling function coefficient, $G_{CORR}(1)$, where the $G_{CORR}$ scaling function, $G_{CORR}(I_{PARA\_AMP\_SENSE})$, is a linear function characterized by equation (18) as follows:

$$G_{CORR}(I_{PARA\_AMP\_SENSE})=G_{CORR}(0)+G_{CORR}(1)\times I_{PARA\_AMP\_SENSE} \quad (18)$$

The first $G_{CORR}$ scaling function coefficient, $G_{CORR}(0)$, may represent a scaling factor that is independent of the scaled parallel amplifier output current estimate, $I_{PARA\_AMP\_SENSE}$, and the second $G_{CORR}$ scaling function coefficient, $G_{CORR}(1)$, represents a first order coefficient of the $G_{CORR}$ scaling function, $G_{CORR}(I_{PARA\_AMP\_SENSE})$, that captures the dependency of the scaling factor, $G_{CORR}$, on the change of value of the parallel amplifier inductance, $L_{CORR}$, as a function of the parallel amplifier output current, $I_{PARA\_AMP}$. For example, in some embodiments, the second $G_{CORR}$ scaling function coefficient, $G_{CORR}(1)$ may be based on the parallel amplifier inductance estimate parameter, $L_{CORR\_EST}$, where the parallel amplifier inductance estimate parameter, $L_{CORR\_EST}$, is an estimated inductance of the parallel amplifier 35 between the frequencies 10 MHz and 30 MHz.

In addition, because the parallel amplifier output current, $I_{PARA\_AMP}$, may change depending upon the operational mode of the linear RF power amplifier 22, the values of the first $G_{CORR}$ scaling function coefficient, $G_{CORR}(0)$, and the value of the second $G_{CORR}$ scaling function coefficient, $G_{CORR}(1)$, may be calibrated for each mode of operation of the linear RF power amplifier 22. As an example, the $G_{CORR}$ function circuit 842 may include a first set of $G_{CORR}$ scaling function coefficients that correspond to a first LTE band number and a second set of $G_{CORR}$ scaling function coefficients that correspond to a second LTE band number. In other words, the controller 50 may configure the $G_{CORR}$ function circuit 842 to adaptively determine the $G_{CORR}$ scaling function coefficients to be used to characterize the $G_{CORR}$ scaling function, $G_{CORR}(I_{PARA\_AMP\_SENSE})$, based upon the operational mode of the pseudo-envelope follower power management system 10PB and/or the band of operation at which the linear RF power amplifier 22 is transmitting.

In some alternative embodiments, the $G_{CORR}$ function circuit 842 may be configured by the controller 50 to provide a fixed value of the scaling factor, $G_{CORR}$, as depicted in equation (19) as follows:

$$G_{CORR}=\frac{L_{CORR\_EST}}{L_{EST}} \quad (19)$$

where the estimated power inductor inductance parameter, $L_{EST}$, represents the measured or estimated inductance of the power inductor 16 between a specific range of frequencies and the parallel amplifier inductance estimate parameter, $L_{CORR\_EST}$, estimates the inductance of the parallel amplifier 35 between a specific range of frequencies, as discussed above.

Figure 34C:
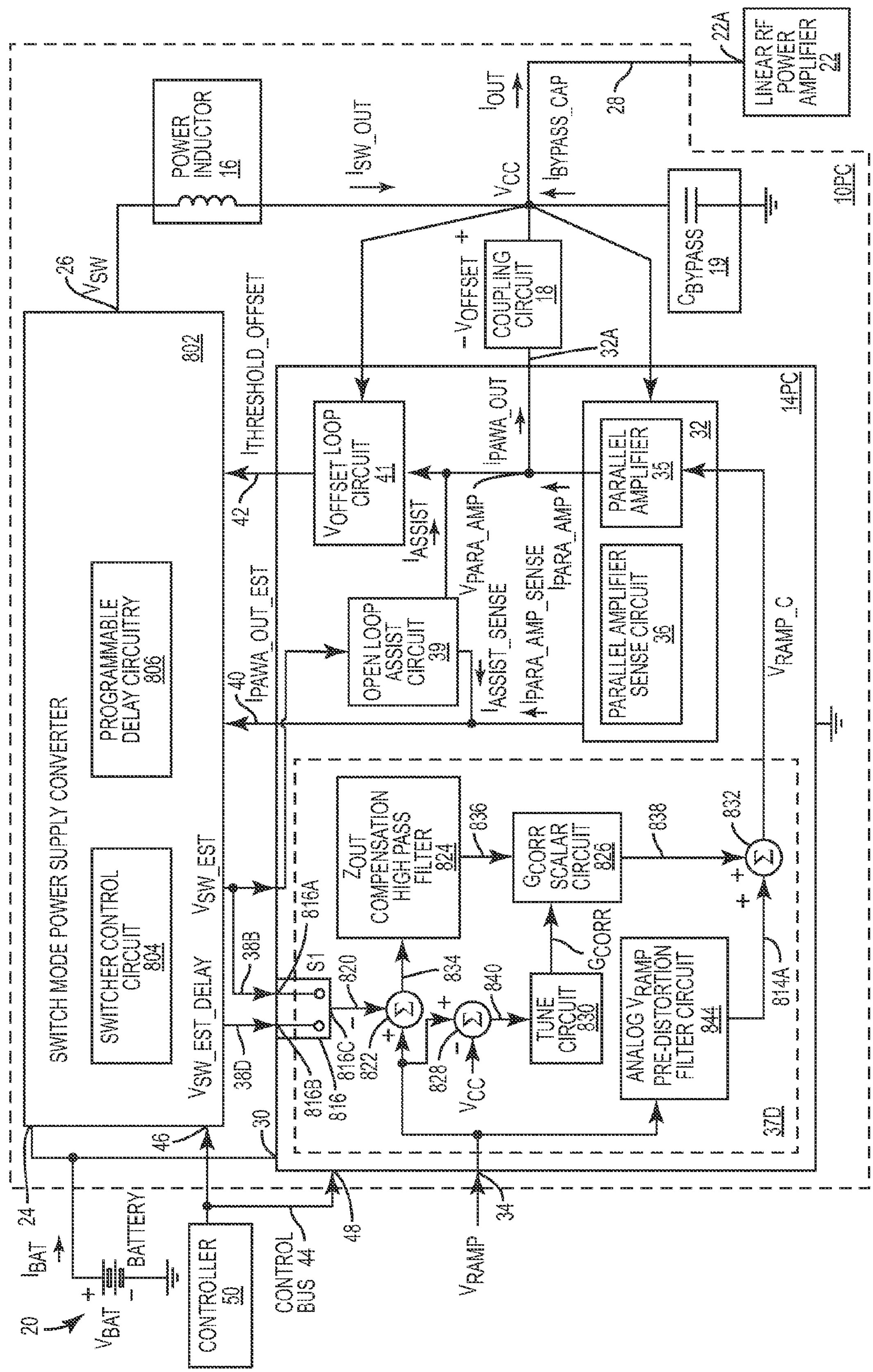
FIG. 34C depicts another embodiment of a parallel amplifier output impedance compensation circuit including an analog $V_{RAMP}$ pre-distortion filter circuit.

FIG. 34C depicts an example embodiment of a pseudo-envelope follower power management system 10PC that is similar in form and function to the pseudo-envelope follower power management system 10PA, depicted in FIG. 34A. However, unlike the pseudo-envelope follower power management system 10PA, depicted in FIG. 34A, the pseudo-envelope follower power management system 10PC includes a parallel amplifier circuit 14PC that includes a parallel amplifier output impedance compensation circuit 37D. Unlike the parallel amplifier output impedance compensation circuit 37B of the pseudo-envelope follower power management system 10PA, depicted in FIG. 34A, the parallel amplifier output impedance compensation circuit 37D, depicted in FIG. 34C, includes an analog $V_{RAMP}$ pre-distortion filter circuit 844 configured to receive the $V_{RAMP}$ signal in the analog domain. Similar to the digital $V_{RAMP}$ pre-distortion filter circuit 812, depicted in FIG. 34A, the analog $V_{RAMP}$ pre-distortion filter circuit 844 pre-distorts the $V_{RAMP}$ signal in the frequency domain to generate an analog pre-filtered $V_{RAMP}$ signal 814A, $V_{RAMP\_ANALOG\_PRE\text{-}FILTERED}$. The controller 50 may configure the analog $V_{RAMP}$ pre-distortion filter circuit 844 to filter the $V_{RAMP}$ signal such that the analog pre-filtered $V_{RAMP}$ signal 814A, $V_{RAMP\_ANALOG\_PRE\text{-}FILTERED}$, may be used to equalize the response of the pseudo-envelope follower power management system 10PC and compensate for the bypass capacitance, $C_{BYPASS}$, of the bypass capacitor 19, the power amplifier associated inductance, $L_{PA}$, (not shown), the power amplifier filter associated capacitance, $C_{PA}$, (not shown), and the frequency response of the transfer function of the parallel amplifier 35.

As a non-limiting example, the analog $V_{RAMP}$ pre-distortion filter circuit 844 may include programmable time constants that may be configured by the controller 50. The controller 50 may configure the frequency response of the analog $V_{RAMP}$ pre-distortion filter circuit 844 to equalize the response of the pseudo-envelope follower power management system 10PA by adjusting the value of the programmable time constants.

In some embodiments of the parallel amplifier circuit 14PC, the analog $V_{RAMP}$ pre-distortion filter circuit 844 may be configured to compensate for the transfer function of the parallel amplifier 35 in conjunction with the power amplifier filter associated capacitance, $C_{PA}$, the power amplifier associated inductance, $L_{PA}$, (not shown), and the bypass capacitance, $C_{BYPASS}$, of the bypass capacitor 19. For example, the controller 50 may configure the analog $V_{RAMP}$ pre-distortion filter circuit 844 to provide frequency peaking to compensate for the low pass filter response due to the combination of the power amplifier associated inductance, $L_{PA}$, (not shown) and the power amplifier associated capacitance, $C_{PA}$, (not shown) associated with the linear RF power amplifier 22. In some embodiments, the Laplace transfer function of the analog $V_{RAMP}$ pre-distortion filter circuit 844 may be represented by equation (20), as follows:

$$H(s)_{Analog\ Pre\text{-}Distortion\ Filter\ Circuit}=\frac{(1+\tau_{ZERO\_PRE}s)}{(1+\tau_{POLE\_PRE}s)} \quad (20)$$

where, $\tau_{ZERO\_PRE}$ is a first time constant associated with a real-zero in the Laplace transfer function of the analog $V_{RAMP}$ pre-distortion filter circuit 844, and $\tau_{POLE\_PRE}$ is a second time constant associated with real-pole in the Laplace transfer function of the analog $V_{RAMP}$ pre-distortion filter circuit 844. The first time constant, $\tau_{ZERO\_PRE}$, and the second time constant, $\tau_{POLE\_PRE}$, may be configured by the controller 50 to pre-distort the $V_{RAMP}$ signal prior to adding the high frequency ripple compensation signal 838 to compensate for the non-ideal parallel amplifier output impedance of the parallel amplifier 35. The controller 50 may configure the first time constant, $\tau_{ZERO\_PRE}$, and the second time constant, $\tau_{POLE\_PRE}$, of the analog $V_{RAMP}$ pre-distortion filter circuit 844 based on the RF modulation bandwidth of the linear RF power amplifier 22 associated with a wide-bandwidth modulation of a mode of operation of a communication device that includes the pseudo-envelope follower power management system 10PC. As an example, the controller 50 may configure the first time constant, $\tau_{ZERO\_PRE}$, and second time constant, $\tau_{POLE\_PRE}$, to provide peaking of the $V_{RAMP}$ signal in order to flatten the overall modulation frequency response of the pseudo-envelope follower power management system 10PC based on the wide-bandwidth modulation of a mode of operation of a communication device.

As another example, the controller 50 may configure the analog $V_{RAMP}$ pre-distortion filter circuit 844 to pre-distort the frequency response of the $V_{RAMP}$ signal such that the overall transfer function between the first control input 34, which receives the $V_{RAMP}$ signal, and the power amplifier collector 22A of the linear RF power amplifier 22 is substantially flat through the operating frequency range of the linear RF power amplifier 22. As a non-limiting example, the controller 50 may configure first time constant, $\tau_{ZERO\_PRE}$, to place a real-zero at around 11 MHz and the second time constant, $\tau_{POLE\_PRE}$, to locate a real-pole at around 20 MHz. Accordingly, the analog $V_{RAMP}$ pre-distortion filter circuit 844 may be configured to provide a peaking response in order to compensate for the frequency response of the pseudo-envelope follower power management system 10PC and the low pass filter effects of the combination of the power amplifier associated inductance, $L_{PA}$, (not shown), and the power amplifier filter associated capacitance, $C_{PA}$, (not shown).

Otherwise, similar to the parallel amplifier output impedance compensation circuit 37B, depicted in FIG. 34A, the parallel amplifier output impedance compensation circuit 37D, depicted in FIG. 34C, may include an estimated switching voltage output selection switch 816, $S_1$, having a first input 816A configured to receive the estimated switching voltage output 38B, $V_{SW\_EST}$, a second input 816B configured to receive the delayed estimated switching voltage output 38D, $V_{SW\_EST\_DELAYED}$, and an estimated switching voltage output selection switch output 816C. The controller 50 may configure the estimated switching voltage output selection switch 816, $S_1$, to provide either the estimated switching voltage output 38B, $V_{SW\_EST}$, or the delayed estimated switching voltage output 38D, $V_{SW\_EST\_DELAYED}$, as an estimated switching voltage input signal 820, $V_{SW\_I}$, at the estimated switching voltage output selection switch output 816C.

The parallel amplifier output impedance compensation circuit 37D also includes the first subtracting circuit 822, the $Z_{OUT}$ compensation high pass filter 824, the $G_{CORR}$ scalar circuit 826, the second subtracting circuit 828, the tune circuit 830, and the summing circuit 832. The first subtracting circuit 822 is configured to subtract the estimated switching voltage input signal 820, $V_{SW\_I}$, from the $V_{RAMP}$ signal to generate an expected difference signal 834, which is provided to the $Z_{OUT}$ compensation high pass filter 824. As discussed previously, the controller 50 may configure the programmable time constants associated with the $Z_{OUT}$ compensation high pass filter 824 to high pass filter the expected difference signal 834 in order to generate an estimated high frequency ripple signal 836.

Alternatively, the controller 50 may configure the estimated switching voltage output selection switch 816, $S_1$, to provide the estimated switching voltage output 38B, $V_{SW\_EST}$, as the estimated switching voltage input signal 820, $V_{SW\_I}$, to the $Z_{OUT}$ compensation high pass filter 824. In this case, the $Z_{OUT}$ compensation high pass filter 824 high pass filters the expected difference signal 834 to generate the estimated high frequency ripple signal 836. As such, the estimated high frequency ripple signal 836 substantially corresponds to a scaled derivative of a switcher ripple current in the inductor current, $I_{SW\_OUT}$, of the power inductor 16 based on the estimated switching voltage output 38B, $V_{SW\_EST}$. Similar to the parallel amplifier output impedance compensation circuit 37B, when the controller configures the estimated switching voltage output selection switch 816, $S_1$, to provide the estimated switching voltage output 38B, $V_{SW\_EST}$, as the estimated switching voltage input signal 820, $V_{SW\_I}$, the controller does not have the ability to adjust temporal alignment of the estimated switching voltage output 38B, $V_{SW\_EST}$, with the $V_{RAMP}$ signal in order to minimize the peak-to-peak ripple voltage on the power amplifier supply voltage, $V_{CC}$, due to the non-ideal output impedance of the parallel amplifier 35.

In contrast, when the controller 50 configures the estimated switching voltage output selection switch 816, $S_1$, to provide the delayed estimated switching voltage output 38D, $V_{SW\_EST\_DELAYED}$, as the estimated switching voltage input signal 820, $V_{SW\_I}$, the controller 50 may adjust the delay provided by the programmable delay circuitry 806 to temporally align the delayed estimated switching voltage output 38D, $V_{SW\_EST\_DELAYED}$, with the $V_{RAMP}$ signal.

The $Z_{OUT}$ compensation high pass filter 824 high pass filters the expected difference signal 834 to generate an estimated high frequency ripple signal 836 that may be scaled by the $G_{CORR}$ scalar circuit 826 to create the high frequency ripple compensation signal 838. The high frequency ripple compensation signal 838 is added to the analog pre-filtered $V_{RAMP}$ signal 814A, $V_{RAMP\_ANALOG\_PRE\text{-}FILTERED}$, to form the compensated $V_{RAMP}$ signal, $V_{RAMP\_C}$. The compensated $V_{RAMP}$ signal, $V_{RAMP\_C}$, is provided as an input to the parallel amplifier 35. The parallel amplifier generates the parallel amplifier output voltage, $V_{PARA\_AMP}$, based on the difference between the compensated $V_{RAMP}$ signal, $V_{RAMP\_C}$, and the power amplifier supply voltage, $V_{CC}$, at the power amplifier supply output 28.

The operation, configuration, and calibration of the tune circuit 830 of the parallel amplifier output impedance compensation circuit 37D, depicted in FIG. 34C, is substantially similar to the operation of the tune circuit 830 previously described with respect to the embodiment of the parallel amplifier output impedance compensation circuit 37B, depicted in FIG. 34A. As such, a detailed description of the operation of the tune circuit 830 herein is omitted.

Figure 34D:
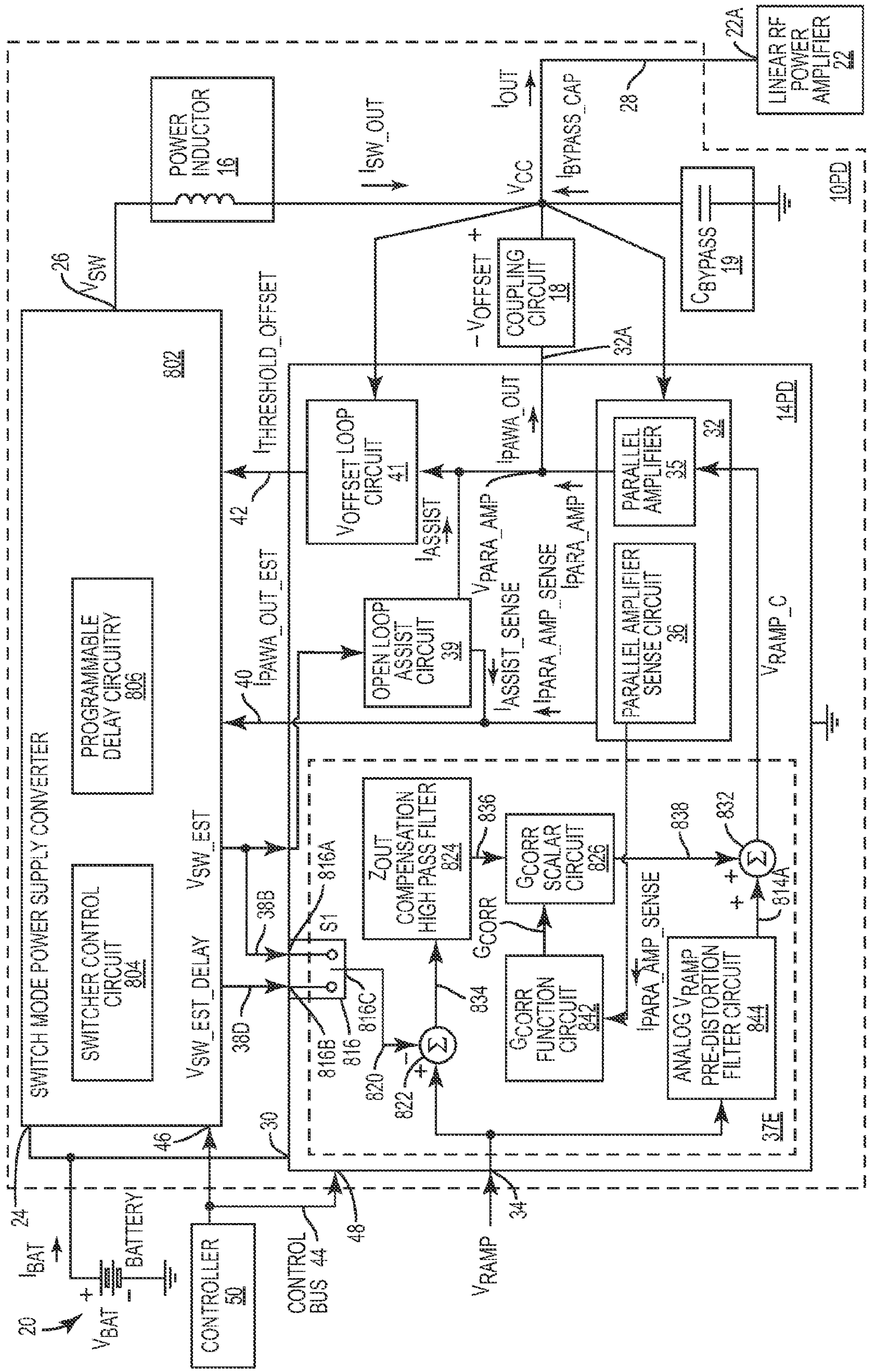
FIG. 34D depicts an alternative embodiment of a parallel amplifier output impedance compensation circuit.

FIG. 34D depicts an example embodiment of a pseudo-envelope follower power management system 10PD that is similar to the pseudo-envelope follower power management system 10PC, depicted in FIG. 34C. However, the pseudo-envelope follower power management system 10PD includes a parallel amplifier circuit 14PD. The parallel amplifier circuit 14PD includes a parallel amplifier output impedance compensation circuit 37E configured to provide the compensated $V_{RAMP}$ signal, $V_{RAMP\_C}$ to the parallel amplifier 35. Similar to the parallel amplifier output impedance compensation circuit 37D, depicted in FIG. 34C, the parallel amplifier output impedance compensation circuit 37E includes an analog $V_{RAMP}$ pre-distortion filter circuit 844 configured to receive the $V_{RAMP}$ signal in the analog domain. In addition, as previously described with respect to the analog $V_{RAMP}$ pre-distortion filter circuit 844, the controller 50 may configure the frequency response of the analog $V_{RAMP}$ pre-distortion filter circuit 844 to pre-distort the received the $V_{RAMP}$ signal.

Illustratively, as described before, the first time constant, $\tau_{ZERO\_PRE}$, and second time constant, $\tau_{POLE\_PRE}$, may be adjusted by controller 50 to provide peaking of the $V_{RAMP}$ signal in order to equalize the overall frequency response between the first control input 34, which received the $V_{RAMP}$ signal, and the power amplifier collector 22A of a linear RF power amplifier 22. The controller 50 may configure the frequency response of the analog $V_{RAMP}$ pre-distortion filter circuit 844 to equalize the response of the pseudo-envelope follower power management system 10PA by adjusting the value of the programmable time constants of the analog $V_{RAMP}$ pre-distortion filter circuit 844, as previously described. In addition, similar to the parallel amplifier output impedance compensation circuit 37D, the controller 50 may configure the analog $V_{RAMP}$ pre-distortion filter circuit 844 of the parallel amplifier output impedance compensation circuit 37E to pre-distort the frequency response of the $V_{RAMP}$ signal such that the overall transfer function between the first control input 34, which received the $V_{RAMP}$ signal, and the power amplifier collector 22A of a linear RF power amplifier 22 is substantially flat through the operating frequency range of the linear RF power amplifier 22. For example, as described above, the controller 50 may configure the analog $V_{RAMP}$ pre-distortion filter circuit 844 to provide frequency peaking to compensate for the low pass filter response due to the combination of the power amplifier associated inductance, $L_{PA}$, (not shown) and the power amplifier associated capacitance, $C_{PA}$, (not shown) associated with the linear RF power amplifier 22.

However, unlike the parallel amplifier output impedance compensation circuit 37D, depicted in FIG. 34C, the parallel amplifier output impedance compensation circuit 37E, depicted in FIG. 34D, is configured to provide a high frequency ripple compensation signal 838 to generate the compensated $V_{RAMP}$ signal, $V_{RAMP\_C}$, in a fashion that is similar to the parallel amplifier output impedance compensation circuit 37C, depicted in FIG. 34B, where the scaling factor, $G_{CORR}$, is provided by the $G_{CORR}$ function circuit 842. Thus, similar to the parallel amplifier output impedance compensation circuit 37C, depicted in FIG. 34B, the parallel amplifier output impedance compensation circuit 37E includes a $G_{CORR}$ function circuit 842 configured to provide the scaling factor, $G_{CORR}$, to the $G_{CORR}$ scalar circuit 826. The form and function of the $G_{CORR}$ function circuit 842 of the parallel amplifier output impedance compensation circuit 37E is similar to the operation of the $G_{CORR}$ function circuit 842 of parallel amplifier output impedance compensation circuit 37C, depicted in FIG. 34B.

Accordingly, the parallel amplifier output impedance compensation circuit 37E, may include an estimated switching voltage output selection switch 816, $S_1$, having a first input 816A configured to receive the estimated switching voltage output 38B, $V_{SW\_EST}$, a second input 816B configured to receive the delayed estimated switching voltage output 38D, $V_{SW\_EST\_DELAYED}$, and an estimated switching voltage output selection switch output 816C. The controller 50 may configure the estimated switching voltage output selection switch 816. $S_1$, to provide either the estimated switching voltage output 38B, $V_{SW\_EST}$, or the second input configured to receive the delayed estimated switching voltage output 38D, $V_{SW\_EST\_DELAYED}$, as a estimated switching voltage input signal 820, $V_{SW\_I}$, at the estimated switching voltage output selection switch output 816C. As discussed above, if the controller 50 configures the estimated switching voltage output selection switch 816, $S_1$, to provide the delayed estimated switching voltage output 38D, $V_{SW\_EST\_DELAYED}$, the controller 50 may configure the delay provided by the programmable delay circuitry 806 to temporally optimize the relationship between estimated switching voltage input signal 820, $V_{SW\_I}$, and the $V_{RAMP}$ signal to minimize the high frequency voltage ripple generated as a result of the non-ideal output impedance characteristics of the parallel amplifier 35.

Similar to the parallel amplifier output impedance compensation circuit 37C, the parallel amplifier output impedance compensation circuit 37E also includes the first subtracting circuit 822, $Z_{OUT}$ compensation high pass filter 824, the $G_{CORR}$ scalar circuit 826, and the summing circuit 832. The first subtracting circuit 822 is configured to subtract the estimated switching voltage input signal 820, $V_{SW\_I}$, from the $V_{RAMP}$ signal to generate an expected difference signal 834, which is provided to the $Z_{OUT}$ compensation high pass filter 824. Similar to the operation of the parallel amplifier output impedance compensation circuit 37D, depicted in FIG. 34C, the controller 50 may configure the programmable time constants associated with of the $Z_{OUT}$ compensation high pass filter 824 to high pass filter the expected difference signal 834 in order to generate an estimated high frequency ripple signal 836, which is scaled by $G_{CORR}$ scalar circuit 826 to create the high frequency ripple compensation signal 838.

Unlike the parallel amplifier output impedance compensation circuit 37D, depicted in FIG. 34C, the parallel amplifier output impedance compensation circuit 37E, depicted in FIG. 34D, provides the scaling factor, $G_{CORR}$, to the $G_{COOR}$ scalar circuit 826 from the $G_{CORR}$ function circuit 842. The $G_{CORR}$ function circuit 842 of the parallel amplifier output impedance compensation circuit 37E, depicted in FIG. 34D, is similar in form and function to the $G_{CORR}$ function circuit 842 of the parallel amplifier output impedance compensation circuit 37C, depicted in FIG. 34B. For example, the $G_{CORR}$ function circuit 842 of the parallel amplifier output impedance compensation circuit 37E may be configured to receive the scaled parallel amplifier output current estimate, $I_{PARA\_AMP\_SENSE}$, generated by the parallel amplifier sense circuit 36 of the parallel amplifier circuitry 32. In some embodiments of the parallel amplifier output impedance compensation circuit 37E, the $G_{CORR}$ function circuit 842 provides the scaling factor, $G_{CORR}$, to the $G_{CORR}$ scalar circuit 826 as a function of the scaled parallel amplifier output current estimate, $I_{PARA\_AMP\_SENSE}$, as previously described with respect to the parallel amplifier output impedance compensation circuit 37C, depicted in FIG. 34B. Alternatively, in some embodiments of the parallel amplifier output impedance compensation circuit 37E, the $G_{CORR}$ function circuit 842 may be configured by the controller 50 to provide the scaling factor, $G_{CORR}$, based on the ratio of the parallel amplifier inductance estimate parameter, $L_{CORR\_EST}$, to the estimated power inductor inductance parameter, $L_{EST}$, of the pseudo-envelope follower power management system 10PD, as described in equation (19), which is described above.

Alternatively, in some embodiments of the parallel amplifier output impedance compensation circuit 37E, controller 50 characterizes the $G_{CORR}$ function circuit 842 during either calibration of the pseudo-envelope follower power management system 10PD as described relative to the parallel amplifier output impedance compensation circuit 37C depicted in FIG. 34B, the details of which are omitted here for the sake of brevity.

Figure 34E:
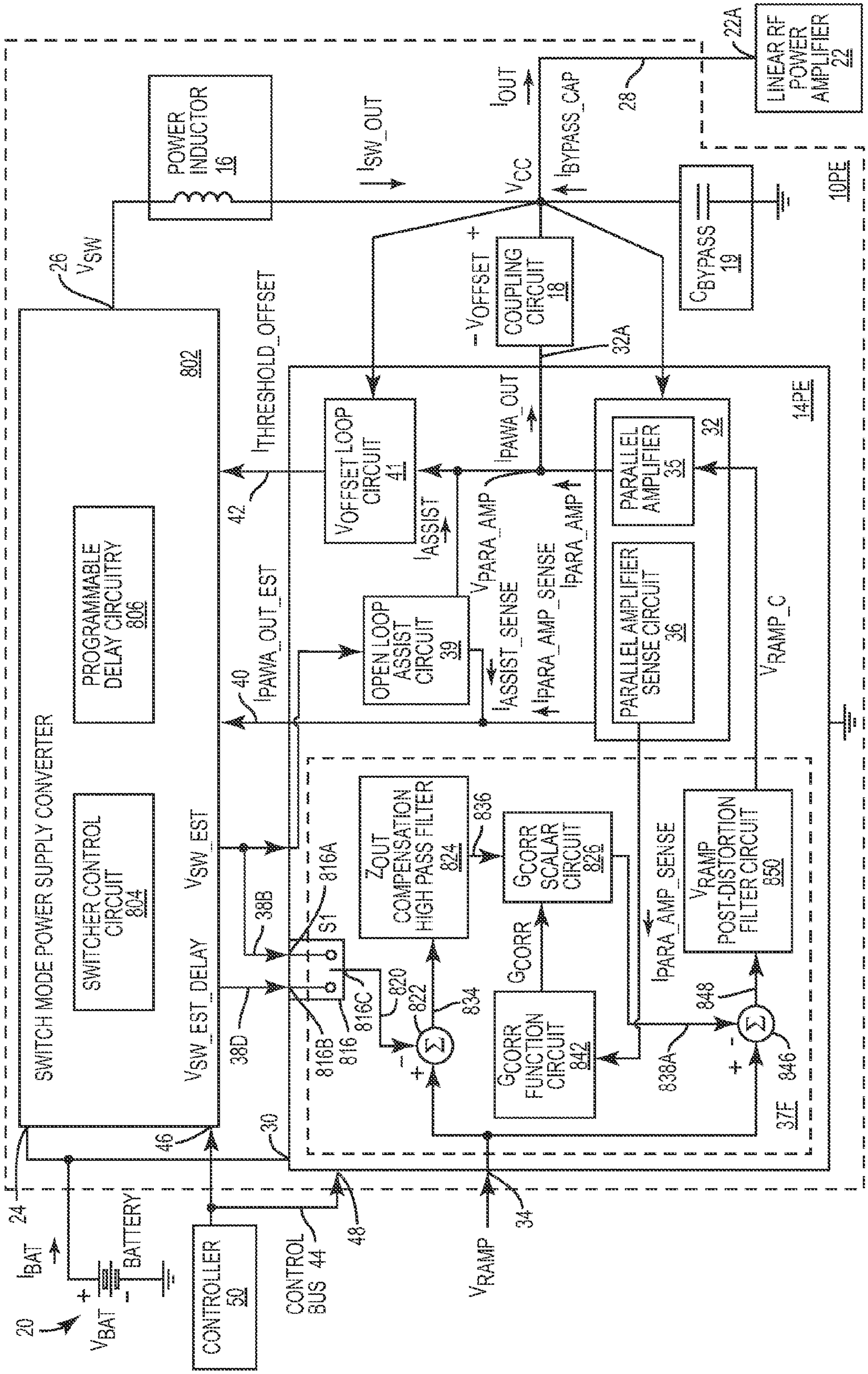
FIG. 34E depicts an alternative embodiment of a parallel amplifier output impedance compensation circuit.

FIG. 34E depicts an example embodiment of a pseudo-envelope follower power management system 10PE that is similar to the pseudo-envelope follower power management system 10PD, depicted in FIG. 34D. However, the pseudo-envelope follower power management system 10PE includes a parallel amplifier circuit 14PE. The parallel amplifier circuit 14PE includes a parallel amplifier output impedance compensation circuit 37F that is similar to the parallel amplifier output impedance compensation circuit 37E. However, unlike the parallel amplifier output impedance compensation circuit 37E, depicted in FIG. 34D, the parallel amplifier output impedance compensation circuit 37F, depicted in FIG. 34E, applies a parallel output impedance correction signal 838A to the $V_{RAMP}$ signal prior to applying equalization of the input signal provided to the parallel amplifier 35.

Similar to the parallel amplifier output impedance compensation circuit 37E, depicted in FIG. 34D, the parallel amplifier output impedance compensation circuit 37E, depicted in FIG. 34F, may include an estimated switching voltage output selection switch 816, $S_1$, having a first input 816A configured to receive the estimated switching voltage output 38B, $V_{SW\_EST}$, a second input 816B configured to receive the delayed estimated switching voltage output 38D, $V_{SW\_EST\_DELAYED}$. The controller 50 may configure the estimated switching voltage output selection switch 816, $S_1$, to provide either the estimated switching voltage output 38B, $V_{SW\_EST}$, or the delayed estimated switching voltage output 38D, $V_{SW\_EST\_DELAYED}$, as the estimated switching voltage input signal 820, $V_{SW\_I}$, to the first subtracting circuit 822. The first subtracting circuit 822 is configured to subtract the estimated switching voltage input signal 820, $V_{SW\_I}$, from the $V_{RAMP}$ signal to generate an expected difference signal 834, which is provided to the $Z_{OUT}$ compensation high pass filter 824. As previously described, the controller 50 may configure the programmable time constants associated with of the $Z_{OUT}$ compensation high pass filter 824 to high pass filter the expected difference signal 834 in order to generate an estimated high frequency ripple signal 836. The estimated high frequency ripple signal 836 is then scaled by the $G_{CORR}$ scalar circuit 826 based on the scaling factor, $G_{CORR}$, received from the $G_{CORR}$ function circuit 842 to generate the high frequency ripple compensation signal 838A. The operation and configuration of the $G_{CORR}$ function circuit 842, depicted in FIG. 34E, is similar in form and function as the $G_{CORR}$ function circuit 842, previously described and depicted in FIG. 34B and FIG. 34D, and therefore a detailed description of the calibration, function and operation of the $G_{CORR}$ function circuit 842 is here omitted.

Unlike the previously described embodiments of the parallel amplifier output impedance compensation circuits 37B-E, depicted in FIG. 34A-D, the parallel amplifier output impedance compensation circuit 37F, depicted in FIG. 34E, includes a pre-distortion subtraction circuit 846 configured to subtract the high frequency ripple compensation signal 838A from the $V_{RAMP}$ signal prior to pre-distorting the $V_{RAMP}$ signal to form a non-filtered parallel amplifier output impedance compensated signal 848. The non-filtered parallel amplifier output impedance compensated signal 848 represents a $V_{RAMP}$ signal that has been compensated to take into consideration the non-ideal output impedance characteristics of the parallel amplifier 35. The parallel amplifier output impedance compensation circuit 37F further includes a $V_{RAMP}$ post-distortion filter circuit 850 configured to filter the non-filtered parallel amplifier output impedance compensated signal 848 to generate the compensated $V_{RAMP}$ signal, $V_{RAMP\_C}$.

The $V_{RAMP}$ post-distortion filter circuit 850 may have a Laplace transfer function similar to the transfer function described by equation (21), as follows:

$$H(s)_{V_{RAMP}\ Post\text{-}Distortion\ Filter\ Circuit} = \frac{(1+\tau_{ZERO\_POST}s)}{(1+\tau_{POLE\_POST}s)} \tag{21}$$

where, $\tau_{ZERO\_POST}$, is a first post distortion time constant associated with zero in the $V_{RAMP}$ post-distortion filter circuit 850 and, $\tau_{POLE\_POST}$, is a second post distortion time constant associated with pole of the $V_{RAMP}$ post-distortion filter circuit 850. The first post distortion time constant, $\tau_{ZERO\_POST}$, and the second post distortion time constant, $\tau_{POLE\_POST}$, may be configured to distort the non-filtered parallel amplifier output impedance compensated signal 848 to equalize the overall modulation frequency response of the pseudo-envelope follower power management system 10PE. As an example, similar to the analog $V_{RAMP}$ pre-distortion filter circuit 844, depicted in FIG. 34C and FIG. 34D, the controller 50 may be configured to adjust the first post distortion time constant, $\tau_{ZERO\_POST}$, and the post distortion time constant, $\tau_{POLE\_POST}$, to provide peaking of the non-filtered parallel amplifier output impedance compensation signal 848 in order to equalize the overall modulation frequency response of the pseudo-envelope follower power management system 10PE, depicted in FIG. 34E, as well as the low pass filtering characteristics of the combination of the power amplifier associated inductance, $L_{PA}$, (not shown), and the power amplifier filter associated capacitance, $C_{PA}$, (not shown). The controller 50 may configure of the first post distortion time constant, $\tau_{ZERO\_POST}$, and the second post distortion time constant, $\tau_{POLE\_POST}$, such that the transfer function of the $V_{RAMP}$ post-distortion filter circuit 850 is based on the RF modulation bandwidth of the linear RF power amplifier 22 associated with a wide-bandwidth modulation of a mode of operation of electronic device or mobile terminal that includes the pseudo-envelope follower power management system 10PE. As an example, the controller 50 may configure the first post distortion time constant, $\tau_{ZERO\_PRE}$, and second post distortion time constant, $\tau_{POLE\_POST}$, to provide peaking of the non-filtered parallel amplifier output impedance compensation signal 848 in order to flatten the overall modulation frequency response of the pseudo-envelope follower power management system 10PC based on the wide-bandwidth modulation of a mode of operation of electronic device or mobile terminal.

Figure 38A:
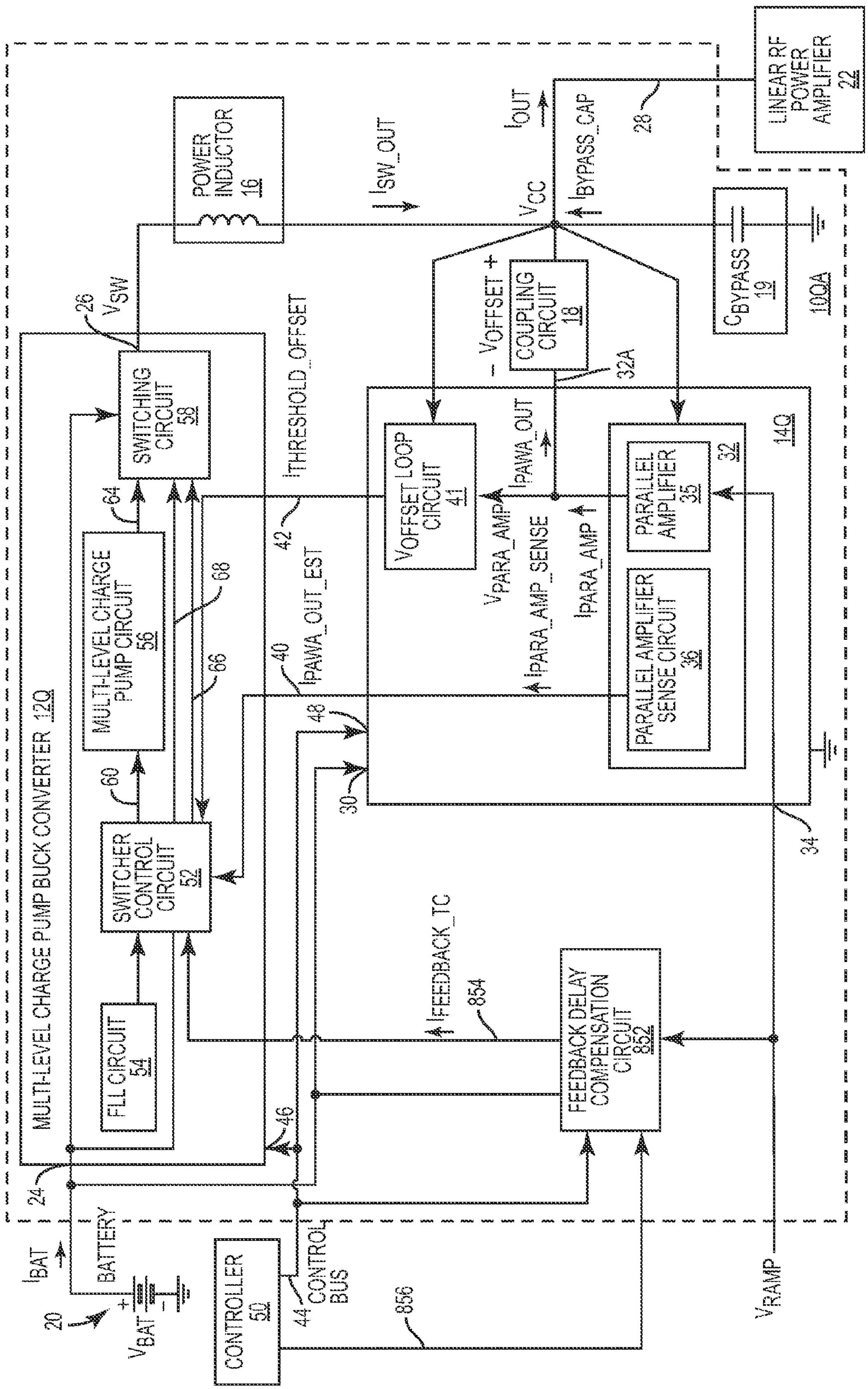
FIG. 38A depicts an example embodiment of a pseudo-envelope follower power management system that includes a feedback delay compensation circuit in combination with a multi-level charge pump buck converter.

FIG. 38A depicts an embodiment of a pseudo-envelope follower power management system 10QA. As a non-limiting example, the pseudo-envelope follower power management system 10QA includes a multi-level charge pump buck converter 12Q, a parallel amplifier circuit 14Q, the power inductor 16, the coupling circuit 18, the bypass capacitor 19, and the power amplifier supply output 28. Similar to the previously described embodiments of the pseudo-envelope follower power management systems, the multi-level charge pump buck converter 12Q and the parallel amplifier circuit 14QA of the embodiment of a pseudo-envelope follower power management system 10QA may be configured to operate in tandem with the power inductor 16, the coupling circuit 18, and the bypass capacitor 19 to generate a power amplifier supply voltage, $V_{CC}$, at the power amplifier supply output 28 of the for a linear RF power amplifier 22. The power inductor 16 is coupled between the switching voltage output 26 and the power amplifier supply output 28. The bypass capacitor 19 is coupled between the power amplifier supply output 28 and ground. In addition, the parallel amplifier circuit 14Q may be coupled to the battery 20 and the controller 50. The parallel amplifier circuit 14Q may include a parallel amplifier output 32A and be configured to receive the power amplifier supply voltage, $V_{CC}$, as a feedback voltage. The coupling circuit 18 may be coupled between the parallel amplifier output 32A and the power amplifier supply output 28. In addition, the parallel amplifier circuit 14Q may be configured to regulate the power amplifier supply voltage, $V_{CC}$, based on the difference between the $V_{RAMP}$ signal and the power amplifier supply voltage, $V_{CC}$. Likewise, as an example, the parallel amplifier circuit 14Q may be configured to provide the parallel amplifier circuit output current estimate 40, $I_{PAWA\_OUT\_EST}$, and the threshold offset current 42, $I_{THRESHOLD\_OFFSET}$, to the multi-level charge pump buck converter 12Q as feedback signals to govern the operation of the multi-level charge pump buck converter 12Q.

As an example, in the pseudo-envelope follower power management system 10QA depicted in FIG. 38A, the parallel amplifier circuit 14Q acts as a master to control the power amplifier supply voltage, $V_{CC}$, at the power amplifier supply output 28 while controlling the multi-level charge pump buck converter 12Q. The parallel amplifier circuit 14Q regulates the power amplifier supply voltage, $V_{CC}$, by sourcing and sinking current through the coupling circuit 18, based on the received $V_{RAMP}$ signal, to compensate for either the over or under generation of the power inductor current, $I_{SW\_OUT}$, provided from the power inductor 16 due to changes in the switching voltage, $V_{SW}$, provided at the switching voltage output 26 of the multi-level charge pump buck converter 12Q. The parallel amplifier circuit 14Q controls the changes in the switching voltage, $V_{SW}$, provided at the switching voltage output 26 based on the parallel amplifier circuit output current estimate 40, $I_{PAWA\_OUT\_EST}$, and the threshold offset current 42, $I_{THRESHOLD\_OFFSET}$, provided to the multi-level charge pump buck converter 12Q as feedback signals. The parallel amplifier circuit 14Q may include a parallel amplifier circuit delay. The parallel amplifier circuit delay is the period of time in the $V_{RAMP}$ processing path between the first control input 34 and the power amplifier supply output 28. As an example, the parallel amplifier circuit delay of the embodiment of the parallel amplifier circuit 14Q depicted in FIG. 38A may include the period of time between the $V_{RAMP}$ signal arriving at the first control input 34 and a change in the value of the power amplifier supply voltage, $V_{CC}$, generated by the parallel amplifier circuit 14Q in response to the $V_{RAMP}$ signal arriving at the first control input 34. The parallel amplifier circuit delay may be due to the internal propagation of the $V_{RAMP}$ signal through the parallel amplifier 35 and/or portions of the parallel amplifier circuitry 32 and pre-processing circuitry. Pre-processing delay associated with pre-processing circuitry may include the propagation delay between the first control input 34 and input of the parallel amplifier 35. As an example, depicted in FIG. 34C, the pre-processing delay associated with the $V_{RAMP}$ signal may include the propagation or signal processing delay associated with the analog $V_{RAMP}$ pre-distortion filter circuit 844 and the summing circuit 832. In addition, the feedback delay may vary depending on the operational state of the parallel amplifier circuit 14Q.

Returning to FIG. 38A, the pseudo-envelope follower power management system 10QA may include delays that can affect the operation of the switcher control circuit 52 and cause increases in the magnitude of the parallel amplifier output current, $I_{PARA\_AMP}$, provided by the parallel amplifier 35. The delays in the pseudo-envelope follower power management system 10QA may result in the parallel amplifier 35 either sourcing or sinking additional current to regulate the power amplifier supply voltage, $V_{CC}$. The increase in magnitude of the parallel amplifier output current, $I_{PARA\_AMP}$, provided by the parallel amplifier 35, may contribute to reduced power efficiency.

As a non-limiting example, in some cases, the delays may be internal to the switcher control circuit 52. In other cases, the delays that reduce the power efficiency of the pseudo-envelope follower power management system 10QA may be related to feedback delays. One example of feedback delay is the time period associated with generation of the scaled parallel amplifier output current estimate, $I_{PARA\_AMP\_SENSE}$, which is also referred to as a parallel amplifier feedback delay. For example, the parallel amplifier circuit 14Q may configure the parallel amplifier sense circuit 36 to generate the scaled parallel amplifier output current estimate, $I_{PARA\_AMP\_SENSE}$. The parallel amplifier circuit 14Q may use the scaled parallel amplifier output current estimate, $I_{PARA\_AMP\_SENSE}$, to provide at least a portion of the parallel amplifier circuit output current estimate 40, $I_{PAWA\_OUT\_EST}$. The parallel amplifier circuit output current estimate 40, $I_{PAWA\_OUT\_EST}$, is provided as a feedback signal to the multi-level charge pump buck converter 12Q such that the parallel amplifier circuit 14Q may control changes in the switching voltage, $V_{SW}$, based on the magnitude of the parallel amplifier circuit output current estimate 40, $I_{PAWA\_OUT\_EST}$, in order to minimize the magnitude of the parallel amplifier output current, $I_{PARA\_AMP}$, provided by the parallel amplifier 35. The feedback delay associated with generating and providing the scaled parallel amplifier output current estimate, $I_{PARA\_AMP\_SENSE}$, to the switcher control circuit 52 may delay the response of the multi-level charge pump buck converter 12Q to changes in the $V_{RAMP}$ signal. As a result, the response of the multi-level charge pump buck converter 12Q to a change in the $V_{RAMP}$ signal may be delayed such that the inductor current provided from the power inductor 16 may not correlate to the change in the target voltage level of the power amplifier supply voltage $V_{CC}$, which is represented by the $V_{RAMP}$ signal. As a result, the parallel amplifier output current, $I_{PARA\_AMP}$, sourced or sunk by the parallel amplifier 35 may be increased due to the feedback delay associated with generation of the scaled parallel amplifier output current estimate, $I_{PARA\_AMP\_SENSE}$, due to the lag in the response time of the multi-level charge pump buck converter 12Q. By minimizing the magnitude of the parallel amplifier output current, $I_{PARA\_AMP}$, provided by the parallel amplifier 35, the power efficiency of the pseudo-envelope follower power management system 10QA may be improved.

As another example, in the case where the parallel amplifier circuit output current estimate 40, $I_{PAWA\_OUT\_EST}$, also includes contributions from the scaled high frequency ripple compensation current estimate 418, $I_{COR\_SENSE}$, as depicted in FIG. 23A, and/or the scaled open loop assist circuit output current estimate, $I_{ASSIST\_SENSE}$, as depicted in FIG. 23C, delays associated with the generation of the scaled high frequency ripple compensation current estimate 418, $I_{COR\_SENSE}$, and/or the scaled open loop assist circuit output current estimate, $I_{ASSIST\_SENSE}$, may also contribute to the reduced power efficiency of the pseudo-envelope follower power management system 10QA. Thus, the parallel amplifier circuit 14Q may have a parallel amplifier circuit feedback delay associated with generation of the parallel amplifier circuit output current estimate 40, $I_{PAWA\_OUT\_EST}$, which is an estimate of the parallel amplifier circuit output current, $I_{PAWA\_OUT}$.

In order to compensate for the delays in the pseudo-envelope follower power management system 10QA that may contribute to reduced power efficiency, the example embodiment of the pseudo-envelope follower power management system 10QA depicted in FIG. 38A further includes a feedback delay compensation circuit 852 configured to minimize the negative impact of feedback delay on the power conversion efficiency of the pseudo-envelope follower power management system 10QA.

In some embodiments of the pseudo-envelope follower power management system 10QA, the feedback delay compensation circuit 852 may be incorporated into the multi-level charge pump buck converter 12Q. For the sake of simplicity of description of operation of the feedback delay compensation circuit 852, and not by way of limitation, the operation and functionality of the multi-level charge pump buck converter 12Q may be similar to the operation and function of either the multi-level charge pump buck converter 12A, depicted in FIG. 2A, or the multi-level charge pump buck converter 12B, depicted in FIG. 2B. Also, for the sake of simplicity of description of the feedback delay compensation circuit 852, and not by way of limitation, neither the feed forward control signal 38, $V_{SWITCHER}$, nor the estimated switching voltage output 38B, $V_{SW\_EST}$, are depicted in FIG. 38A.

In addition, some embodiments of the parallel amplifier circuit 14Q may include the parallel amplifier circuitry 32 and the $V_{OFFSET}$ loop circuit 41. For example, some embodiments of the parallel amplifier circuit 14Q may include an embodiment of the $V_{OFFSET}$ loop circuit 41 similar to the embodiment of the $V_{OFFSET}$ loop circuit 41 depicted in FIG. 8, the $V_{OFFSET}$ loop circuit 41A depicted in FIG. 18A, or the $V_{OFFSET}$ loop circuit 41B depicted in FIG. 18B. However, as will be discussed, some embodiments of the parallel amplifier circuit 14Q do not include an embodiment of the $V_{OFFSET}$ loop circuit 41. In addition, although not depicted for the sake of simplicity, some embodiments of the parallel amplifier circuit 14Q depicted in FIG. 38A may include an embodiment of the parallel amplifier output impedance compensation circuit 37, an embodiment of the open loop assist circuit 39, similar to the open loop assist circuit 39A, depicted in FIG. 9A, or the open loop assist circuit 39B, depicted in FIG. 9B, and/or an embodiment of the open loop ripple compensation assist circuit 414 similar to the open loop ripple compensation assist circuit 414A, depicted in FIG. 24, the open loop ripple compensation assist circuit 414B, depicted in FIG. 27A, the open loop ripple compensation assist circuit 414C, depicted in FIG. 27B, and/or a combination thereof, as previously described.

While FIG. 38A depicts that the parallel amplifier circuit output current estimate 40, $I_{PAWA\_OUT\_EST}$, provided to the multi-level charge pump buck converter 12Q only includes the scaled parallel amplifier output current estimate, $I_{PARA\_AMP\_SENSE}$, this is by way of example and not by limitation. Accordingly, as an example, some embodiments of the parallel amplifier circuit 14Q may provide a parallel amplifier circuit output current estimate 40, $I_{PAWA\_OUT\_EST}$, that includes the summation of the scaled parallel amplifier output current estimate, $I_{PARA\_AMP\_SENSE}$, and the scaled high frequency ripple compensation current estimate 418, $I_{COR\_SENSE}$, as depicted in FIG. 23A. Likewise, as another example, some embodiments of the parallel amplifier circuit 14Q may provide a parallel amplifier circuit output current estimate 40, $I_{PAWA\_OUT\_EST}$, that includes the summation of the scaled parallel amplifier output current estimate, $I_{PARA\_AMP\_SENSE}$, the scaled high frequency ripple compensation current estimate 418, $I_{COR\_SENSE}$, and the scaled open loop assist circuit output current estimate, $I_{ASSIST\_SENSE}$, as depicted in FIG. 23C. In addition, as depicted in FIG. 2A and FIG. 2B, some embodiments of the parallel amplifier circuit 14Q may provide a parallel amplifier circuit output current estimate 40, $I_{PAWA\_OUT\_EST}$, that includes the summation of the scaled parallel amplifier output current estimate, $I_{PARA\_AMP\_SENSE}$, and the scaled open loop assist circuit output current estimate, $I_{ASSIST\_SENSE}$, as depicted in FIG. 23C.

For example, and not by way of limitation, the pseudo-envelope follower power management system 10QA may be configured similar in form and function to some of the other embodiments of the pseudo-envelope follower power management systems, described above, that include a multi-level charge pump buck converter. As a non-limiting example, some embodiments of the multi-level charge pump buck converter 12Q may be configured, in form and function, similar to multi-level charge pump buck converter and operate similar to the multi-level charge pump buck converters 12, 12A, 12B, 12C, 12H, 12I, 12J, 12L, and 12M, depicted in FIGS. 1A-B, FIGS. 2A-B, FIGS. 18A-B, FIG. 14, FIG. 15, FIG. 16, FIG. 17B, FIG. 23A, and FIG. 23C, except, the multi-level charge pump buck converter 12Q is further configured to receive a feedback delay compensation signal 854, $I_{FEEDBACK\_TC}$, from the feedback delay compensation circuit 852. In some embodiments of the pseudo-envelope follower power management system 10QA, the feedback delay compensation circuit 852 may be incorporated into the multi-level charge pump buck converter 12Q. However, for the sake of simplicity of description, and not by way of limitation, the feedback delay compensation circuit 852, depicted in FIG. 38A, is shown as being separate from the multi-level charge pump buck converter 12Q.

Returning to the description of the feedback delay compensation circuit 852 depicted in FIG. 38A, some example embodiments of the feedback delay compensation circuit 852 may provide a feedback delay compensation signal 854, $I_{FEEDBACK\_TC}$, to the multi-level charge pump buck converter 12Q. As depicted in FIG. 38A, the switcher control circuit 52 may be configured to receive the parallel amplifier circuit output current estimate 40, $I_{PAWA\_OUT\_EST}$, and the threshold offset current 42, $I_{THRESHOLD\_OFFSET}$, and the feedback delay compensation signal 854, $I_{FEEDBACK\_TC}$. The switcher control circuit 52 may be further configured to use the parallel amplifier circuit output current estimate 40, $I_{PAWA\_OUT\_EST}$, and the threshold offset current 42, $I_{THRESHOLD\_OFFSET}$, and the feedback delay compensation signal 854, $I_{FEEDBACK\_TC}$, to govern the operation of the multi-level charge pump circuit 56 and the switching circuit 58 to control or govern the switching voltage, $V_{SW}$, provided at the switching voltage output 26 of the multi-level charge pump buck converter 12Q.

FIG. 38A further depicts that the feedback delay compensation circuit 852 may be coupled to the battery 20 and configured to communicate with the controller 50 via the control bus 44. The feedback delay compensation circuit 852 may generate the feedback delay compensation signal 854, $i_{FEEDBACK\_TC}$, based on a slope of a derivative of the $V_{RAMP}$ signal. For example, the feedback delay compensation circuit 852 may determine the slope of the derivative of the $V_{RAMP}$ signal by high pass filtering the $V_{RAMP}$ signal with a capacitor/resistor network (not shown), where the capacitor/resistor network (not shown) has a high pass corner frequency, $f_{HP\_CF}$. Alternatively, the feedback delay compensation circuit 852 may determine the slope of the derivative of the $V_{RAMP}$ signal by high pass filtering the $V_{RAMP}$ signal with an active filter (not shown) to generate the derivative of the $V_{RAMP}$ signal, where the active filter (not shown) has a high pass corner frequency, $f_{HP\_CF}$.

In addition, in some embodiments, the feedback delay compensation circuit 852 may be coupled to the controller via the control bus 44, a capacitor array control bus 856, or a combination thereof. In some embodiments, the controller 50 may be configured to modify the high pass corner frequency, $f_{HP\_CF}$, and control the 90 degree phase lead of the high pass filtering response in order to maximize the power efficiency of either the parallel amplifier 35 or the pseudo-envelope follower power management system 10QA as a whole.

Prior to discussing the operation of the multi-level charge pump buck converter 12Q with respect to the feedback delay compensation signal 854, $I_{FEEDBACK\_TC}$, the embodiments of the feedback delay compensation circuit 852 depicted in FIG. 39A and FIG. 39B will be described. FIG. 39B depicts a feedback delay compensation circuit 852A, which is a differential embodiment of the feedback delay compensation circuit 852, depicted in FIG. 39A. As depicted in FIG. 39B, the $V_{RAMP}$ signal may be a differential $V_{RAMP}$ signal having a non-inverted $V_{RAMP}$ signal component, $V_{RAMP}+$, and an inverted $V_{RAMP}$ signal component, $V_{RAMP}-$.

Figure 39A:
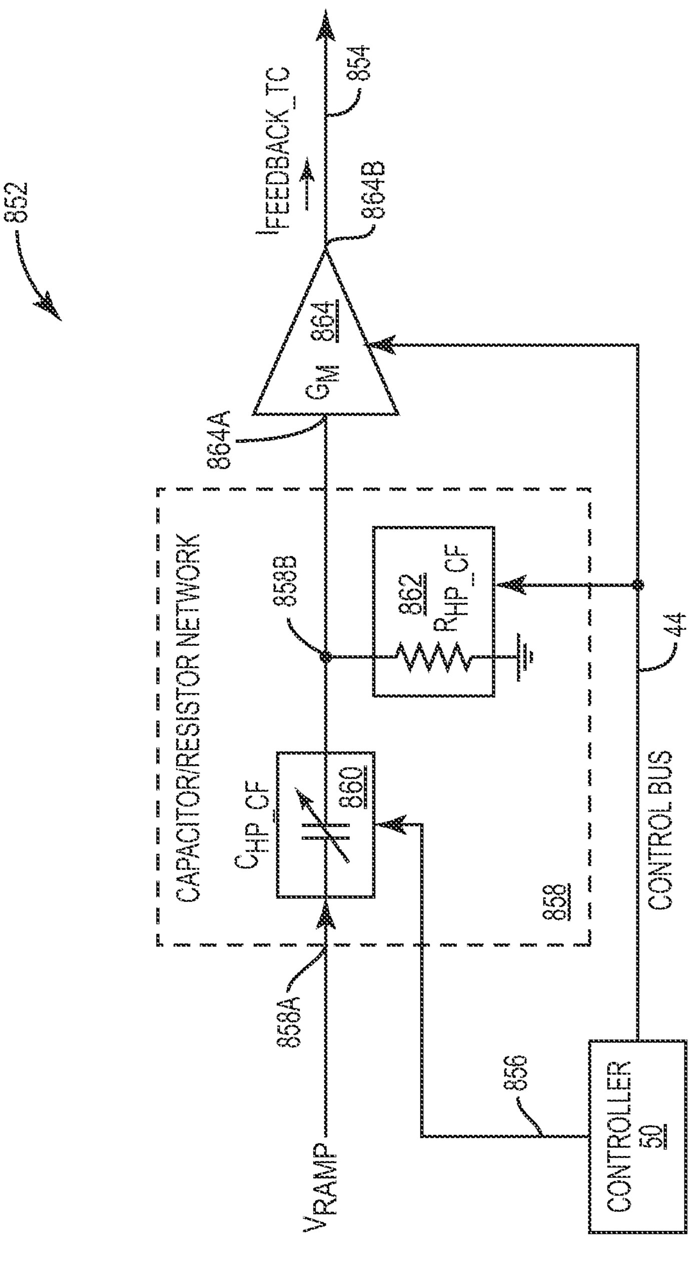
Figure 39B:
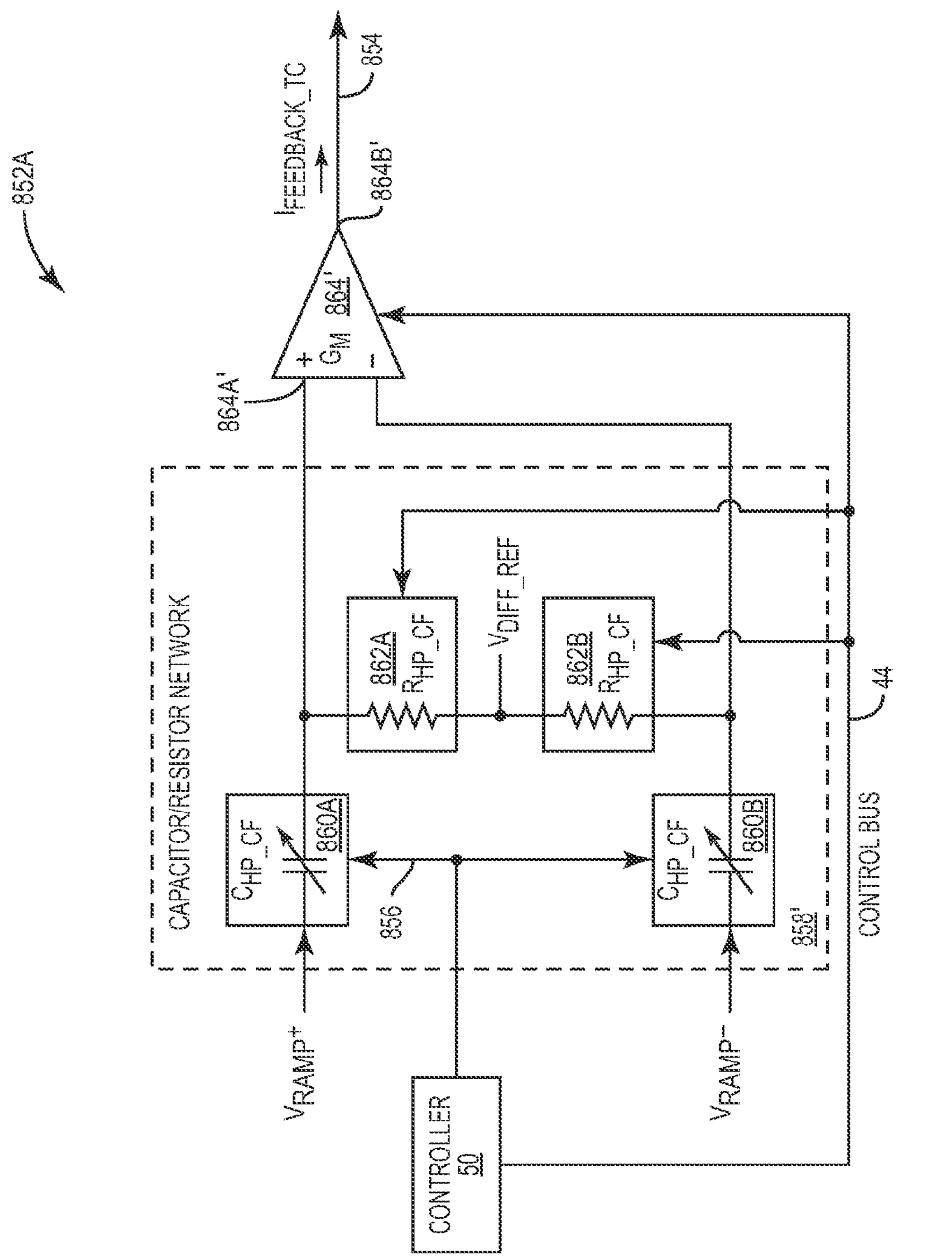

FIG. 39A depicts an example embodiment of the feedback delay compensation circuit 852, which will be discussed with continuing reference to FIG. 38A. The feedback delay compensation circuit 852 includes a capacitor/resistor network 858 having a high pass derivative filter capacitor 860 and a high pass derivative filter resistor 862 and a Gm feedback compensation circuit 864. The Gm feedback compensation circuit 864 may include an input port 864A and a feedback delay compensation signal output 864B configured to provide the feedback delay compensation signal 854, $I_{FEEDBACK\_TC}$. The capacitor/resistor network 858 may have an input port 858A configured to receive the $V_{RAMP}$ signal. The capacitor/resistor network 858 may have an output port 858B coupled to the input port 864A of the Gm feedback compensation circuit 864. The high pass derivative filter capacitor 860 is coupled between the input port 858A of the capacitor/resistor network 858 and the output port of the capacitor/resistor network 858. The high pass derivative filter resistor 862 is coupled between the output port of the capacitor/resistor network 858 and ground. The output port of the capacitor/resistor network 858 is coupled to the input port 864A of the Gm feedback compensation circuit 864.

The high pass derivative filter capacitor 860 may have a capacitance level substantially equal to a high pass corner frequency capacitance, $C_{HP\_CF}$. The high pass derivative filter resistor 862 may have a resistance level substantially equal to a high pass corner frequency resistance, $R_{HP\_CF}$. The high pass derivative filter capacitor 860 and the high pass derivative filter resistor 862 of the capacitor/resistor network 858 may be configured to form a high pass filter. The capacitor/resistor network 858 high pass filters the $V_{RAMP}$ signal to generate a high pass filtered $V_{RAMP}$ signal. The high pass filtered $V_{RAMP}$ signal provides a 90 degree phase lead below the high pass corner frequency, $f_{HP\_CF}$, of the capacitor/resistor network as compared to the $V_{RAMP}$ signal, where the slope of the derivative of the $V_{RAMP}$ signal provides an indication of whether the target voltage for the power amplifier supply voltage, $V_{CC}$, is increasing or decreasing.

Because the derivative of the $V_{RAMP}$ signal is used to generate the feedback delay compensation signal 854, $I_{FEEDBACK\_TC}$, the feedback delay compensation signal 854, $I_{FEEDBACK\_TC}$, effectively provides a feedback current to the switcher control circuit 52 that has a 90 degree phase lead, as compared to the $V_{RAMP}$ signal, below the high pass corner frequency, $f_{HP\_CF}$, of the capacitor/resistor network 858. As a result, the feedback delay compensation signal 854, $I_{FEEDBACK\_TC}$, provides an early indication of the direction in which the target voltage for the power amplifier supply voltage, $V_{CC}$, is headed based to the switcher control circuit 52. For example, if the slope of the derivative of the $V_{RAMP}$ signal is positive, the feedback delay compensation signal 854, $I_{FEEDBACK\_TC}$, provides an indication that the target voltage for the power amplifier supply voltage, $V_{CC}$, is increasing to the switcher control circuit 52, which is independent of the parallel amplifier circuit output current estimate 40, $I_{PAWA\_OUT\_EST}$. Alternatively, when the slope of the derivative of the $V_{RAMP}$ signal is negative, the feedback delay compensation signal 854, $I_{FEEDBACK\_TC}$, provides an indication that the target voltage for the power amplifier supply voltage, $V_{CC}$, is decreasing to the switcher control circuit 52, which is also is independent of the parallel amplifier circuit output current estimate 40, $I_{PAWA\_OUT\_EST}$. For example, the switcher control circuit 52 may be configured to use the information contained in the feedback delay compensation signal 854, $I_{FEEDBACK\_TC}$, to raise or lower the effective thresholds used by the switcher control circuit 52 to control changes between modes of operation of the multi-level charge pump buck converter 12Q, where each mode of operation corresponds to a particular voltage level of the switching voltage, $V_{SW}$, provided at the switching voltage output 26 to the power inductor 16.

The capacitor/resistor network 858 includes a high pass corner time constant, $\tau_{HF\_CF}$, substantially equal to the product of the high pass corner frequency capacitance, $C_{HP\_CF}$, and the high pass frequency resistance, $R_{HP\_CF}$. The high pass corner frequency, $f_{HP\_CF}$, of the capacitor/resistor network 858 is provided by equation (22) as follows:

$$f_{HP\_CF} = \frac{1}{(2 \times \pi \times C_{HP\_CF} \times R_{HP\_CF})} \tag{22}$$

As will be discussed, in some embodiments of the feedback delay compensation circuit 852, the high pass corner frequency, $f_{HP\_CF}$, of the capacitor/resistor network 858 may be configured by the controller 50. For example, in some embodiments, the high pass corner frequency resistance, $R_{HP\_CF}$, of the high pass derivative filter resistor 862 may be a programmable resistance. For example, the high pass derivative filter resistor 862 may be a binary weighted resistor array. In other embodiments, the high pass derivative filter resistor 862 may be a fixed value resistor. Likewise, the high pass corner frequency capacitance, $C_{HP\_CF}$, of the high pass derivative filter capacitor 860 may be a programmable capacitance. For example, the high pass derivative filter capacitor 860 may be a binary weighted capacitor array. However, in some embodiments, the high pass derivative filter capacitor 860 may be a fixed value capacitor.

In some embodiments of the feedback delay compensation circuit 852, the controller 50 may be configured to change the high pass corner frequency, $f_{HP\_CF}$, to between 30 MHz to 50 MHz in 5 MHz increments. In other embodiments of the feedback delay compensation circuit 852, the feedback delay compensation circuit 852 may be configured to limit the bandwidth of the feedback delay compensation signal 854, $I_{FEEDBACK\_TC}$, to improved stability.

The Gm feedback compensation circuit 864 may be configured to generate the feedback delay compensation signal 854, $I_{FEEDBACK\_TC}$, based on the slope of the derivative output response of the capacitor/resistor network 858. In other words, the Gm feedback compensation circuit 864 may be configured to generate the feedback delay compensation signal 854, $I_{FEEDBACK\_TC}$, based on the high pass filtered $V_{RAMP}$ signal, where the slope of the high pass filtered $V_{RAMP}$ signal indicates the direction in which the target voltage for the power amplifier supply voltage, $V_{CC}$, is heading in response to the $V_{RAMP}$ signal. Because the feedback delay compensation signal 854, $I_{FEEDBACK\_TC}$, is based on the derivative of the $V_{RAMP}$ signal, the rate of change of the $V_{RAMP}$ signal results in a change in the magnitude (positive or negative) of the feedback delay compensation signal 854, $I_{FEEDBACK\_TC}$. For example, when the slope of the derivative of the $V_{RAMP}$ signal is positive, the Gm feedback compensation circuit 864 may be configured to source current such that the feedback delay compensation signal 854, $I_{FEEDBACK\_TC}$, has a positive magnitude. However, when the slope of the derivative of the $V_{RAMP}$ signal is negative, the Gm feedback compensation circuit 864 may be configured to sink current such that the feedback delay compensation signal 854, $I_{FEEDBACK\_TC}$, has a negative magnitude. In addition, the greater the slope of the derivative of the $V_{RAMP}$ signal, the large the magnitude of the feedback delay compensation signal 854, $I_{FEEDBACK\_TC}$.

The Gm feedback compensation circuit 864 may be coupled to the controller 50 via control bus 44. The Gm feedback compensation circuit 864 may have a Gm feedback compensation transconductance, $Gm_{FEEDBACK\_TC}$. In some embodiments of the Gm feedback compensation circuit 864, the Gm feedback compensation transconductance, $Gm_{FEEDBACK\_TC}$, may be programmable by the controller 50. Accordingly, the controller 50 may adjust the magnitude of the feedback delay compensation signal 854, $I_{FEEDBACK\_TC}$, by increasing or decreasing the Gm feedback compensation transconductance, $Gm_{FEEDBACK\_TC}$. For example, in some cases, the controller 50 may increase or decrease the Gm feedback compensation transconductance, $Gm_{FEEDBACK\_TC}$, with an increment size of 0.1 A/V, where 0.7 A/V≤$Gm_{FEEDBACK\_TC}$≤⅓A/V.

As an example, in some embodiments of the pseudo-envelope follower power management system 10QA, the effects of feedback delay on the power efficiency of the parallel amplifier circuit 14Q may vary depending on the operational mode of the communication device. For example, the parallel amplifier circuit feedback delay may change depending on the configuration of the parallel amplifier circuit 14Q and/or the operational mode of the communication device. Alternatively, depending on the signal processing path associated with the operational mode of the communication device, the feedback delay of the parallel amplifier circuit 14Q may vary. As another example, the parallel amplifier feedback delay may vary depending on the configuration of the operation of the pseudo-envelope follower power management system 10QA and/or the parallel amplifier 35. For example, the parallel amplifier delay may vary depending on the operational mode of the communication device or the band of operation that the communication device is using within a network. As another example, the feedback delay associated with the generation of the scaled high frequency ripple compensation current estimate 418, $I_{COR\_SENSE}$, may be dependent upon the band of operation of the communication device or the temporal alignment of the frequency ripple compensation assist current 414. Thus, in some embodiments, the controller 50 may configure the high pass corner frequency, $f_{HP\_CF}$, based on the operational state of the parallel amplifier circuit 14Q in order to compensate for increases or decrease in the feedback delays associated with generation of the parallel amplifier circuit output current estimate 40, $I_{PAWA\_OUT\_EST}$, in order to maximize the power efficiency of the parallel amplifier circuit 14Q, the parallel amplifier 35, or the pseudo-envelope follower power management system 10QA, depicted in FIG. 38A, and the pseudo-envelope follower power management system 10QB, depicted in FIG. 38B.

The controller 50 may configure the high pass corner frequency, $f_{HP\_CF}$, of the high pass filter to set the apparent gain of the feedback delay compensation circuit 852 at a given frequency. As a non-limiting example, some embodiments of the feedback delay compensation circuit 852 may be configured such that the high pass frequency resistance, $R_{HP\_CF}$, is substantially equal to 25.3 KΩ. In addition, the high pass derivative filter capacitor 860 may be binary capacitor array, where the high pass corner frequency capacitance, $C_{HP\_CF}$, may have a capacitance value that ranges between 0 Farads to 3 pF in increments substantially equal to 0.2 pF. When the capacitance of the high pass corner frequency capacitance, $C_{HP\_CF}$, equals zero Farads, the feedback delay compensation circuit 852 may be effectively disabled. For the case where the high pass corner frequency capacitance, $C_{HP\_CF}$, is configured to have a capacitance substantially equal to 0.2 pF, an apparent gain of the high pass derivative filter capacitor 860 may be substantially equal to −12 dBm at 10 MHz. However, for the case where the high pass corner frequency capacitance, $C_{HP\_CF}$, is configured to have a capacitance substantially equal to 3 pF, the apparent gain of the high pass derivative filter capacitor 860 may be substantially equal to 10 dBm at 10 MHz. Thus, the aggressiveness of the feedback compensation provided by the feedback delay compensation circuit 852 may be configured by adjusting the high pass corner frequency, $f_{HP\_CF}$. As an example, as the high pass corner frequency capacitance, $C_{HP\_CF}$, increases, the high pass corner frequency, $f_{HP\_CF}$, decreases, which increases the apparent gain of the feedback delay compensation circuit 852. Because the apparent gain of the feedback delay compensation circuit 852 is increased, the magnitude of the feedback delay compensation signal 854, $I_{FEEDBACK\_TC}$, increases, which tends to improve the power efficiency of the parallel amplifier circuit 14Q. For example, as the apparent gain of the feedback delay compensation circuit 852 is increased, the magnitude of the parallel amplifier output current, $I_{PARA\_AMP}$, generated by the parallel amplifier 35 may tend to decrease. However, in the case where the apparent gain of the feedback delay compensation circuit 852 is too high, the switcher control circuit 52 may pre-maturely change the switching voltage, $V_{SW}$, which may increase the magnitude of the parallel amplifier output current, $I_{PARA\_AMP}$, generated by the parallel amplifier 35. Thus, depending on the operational mode of the pseudo-envelope follower power management system 10QA and/or the band of operation of the communication device, the controller 50 may configure the high pass corner frequency, $f_{HP\_CF}$, of the high pass filter to maximize power efficiency either the parallel amplifier 35 or the parallel amplifier circuit 14Q as a whole.

As another example, the controller 50 may configure the high pass corner time constant, $\tau_{HF\_CF}$, by programmably changing the capacitance of the high pass corner frequency capacitance $C_{HP\_CF}$, the resistance value of the high pass frequency resistance, $R_{HP\_CF}$, and/or a combination thereof. Similarly, the controller 50 may adjust the high pass corner frequency, $f_{HP\_CF}$, based on the operational state of the pseudo-envelope follower power management system 10QA in order to maximize power efficiency of the system. For example, during configuration of the pseudo-envelope follower power management system 10QA, the controller 50 may be configured to store high pass corner frequency parameters that correspond to various operational states of either the parallel amplifier 35, the pseudo-envelope follower power management system 10QA, and/or a combination thereof. Each of the stored high pass corner frequency parameters may be associated with a particular operational state of the parallel amplifier 35, the pseudo-envelope follower power management system 10QA, and/or a combination thereof. The high pass corner frequency parameters may include settings to adjust the value of the high pass corner frequency capacitance $C_{HP\_CF}$, the value of the high pass frequency resistance, $R_{HP\_CF}$, and/or a combination thereof. In some embodiments, only the high pass derivative filter capacitor 860 is configured to be programmable whereas the high pass derivative filter resistor 862 is configured to have a fixed value. In other embodiments, only the high pass derivative filter resistance 862 is configured to be programmable whereas the high pass derivative filter capacitor 860 is configured to have a fixed value.

As another example, the feedback delay compensation circuit 852 may be configured to set the high pass corner frequency, $f_{HP\_CF}$, to a first frequency value when the pseudo-envelope follower power management system 10QA is in a first operational mode and set the high pass corner frequency, $f_{HP\_CF}$, to a second frequency when the pseudo-envelope follower power management system 10QA is in a second operational mode in order to maximize the power efficiency of the pseudo-envelope follower power management system 10QA in each operation mode. Alternatively, the high pass corner frequency, $f_{HP\_CF}$, may be set only during calibration of the pseudo-envelope follower power management system 10QA. The high pass corner frequency, $f_{HP\_CF}$, may be independently set from the bandwidth of the feedback delay compensation signal 854, $I_{FEEDBACK\_TC}$. For example, the controller 50 may configure Gm feedback compensation circuit 864 to limit the frequency pass band of the Gm feedback compensation circuit 864 in order to the improve stability of the pseudo-envelope follower power management system 10QA when operating in a particular operational mode. For example, for the case where the feedback delay of the parallel amplifier circuit is 5 ns, the controller 50 may configure the high pass corner frequency, $f_{HP\_CF}$, to be substantial equal to 40 MHz and the Gm feedback compensation transconductance, $Gm_{FEEDBACK\_TC}$, to be substantially equal to 1 A/V in order to maximize the power efficiency of the parallel amplifier 35.

As an example, the high pass derivative filter capacitor 860 may be coupled to the controller 50 via the capacitor array control bus 856. The high pass derivative filter capacitor 860 may be configured to be a binary weighted programmable capacitor array similar to the programmable capacitor array 758, depicted in FIG. 36. The high pass derivative filter capacitor 860 may include several capacitors arranged in parallel that may be switched in parallel to provide an equivalent capacitance level. The high pass derivative filter capacitor 860 may also have a bypass mode to set the high pass corner frequency capacitance, $C_{HP\_CF}$, equal to zero Farads. The capacitor array control bus 856 may be multi-bit control bus configured to selectively switch in or out one or more of the binary weighted capacitors that are in a parallel arrangement or to switch into the bypass mode. Similar to the variable capacitance control bus 760, CNTR_CD (5:1), depicted in FIG. 36, the capacitor array control bus 856 may include multiple bits that may form a binary word that may be used by the controller 50 to control the capacitance of the high pass derivative filter capacitor 860. The high pass derivative filter capacitor 860 may be configured to be a binary weighted programmable capacitor array such that the effective capacitance of the high pass derivative filter capacitor 860 may be a linearly controlled capacitance similar to the programmable capacitor array 758, depicted in FIG. 36. For example, in some embodiments of the feedback delay compensation circuit 852, the high pass corner frequency capacitance, $C_{HP\_CF}$ of the high pass derivative filter capacitor 860 may be controlled by controller 50 to have a capacitance range of between 0.2 pF to 3 pF. As a result, the high pass filter having a high pass corner frequency, $f_{HP\_CF}$, of the capacitor/resistor network 858 may be adjusted by modifying the high pass corner frequency capacitance, $C_{HP\_CF}$, of the high pass derivative filter capacitor 860.

FIG. 39B depicts a differential feedback delay compensation circuit 852A, which is another embodiment of the feedback delay compensation circuit 852 depicted in FIG. 39A. The differential feedback delay compensation circuit 852A will be discussed with continuing reference to FIG. 38A. The differential feedback delay compensation circuit 852A functions in a similar fashion as the previously described feedback delay compensation circuit 852, depicted in FIG. 39A, except the signal processing is done differentially. The differential feedback delay compensation circuit 852A may be configured to generate the feedback delay compensation signal 854, $I_{FEEDBACK\_TC}$, based on the derivative the differential $V_{RAMP}$ signal.

FIG. 39B depicts a differential capacitor/resistor network 858' configured to receive the differential $V_{RAMP}$ signal. In some embodiments, the differential capacitor/resistor network 858' is a differential high pass filter. Similar to the capacitor/resistor network 858, depicted in FIG. 39A, the differential capacitor/resistor network 858' may act as a high pass filter to provide the derivative of the differential $V_{RAMP}$ signal, where the high pass filter has a high pass corner frequency, $f_{HP\_CF}$, that corresponds to the high pass corner time constant, $\tau_{HF\_CF}$. The differential capacitor/resistor network 858' includes a non-inverted high pass filter input configured to receive the non-inverted $V_{RAMP}$+ signal component and an inverted high pass filter input configured to receive the inverted $V_{RAMP}$ signal component, $V_{RAMP}$−. The differential capacitor/resistor network 858' may include a non-inverted high pass filtered output and an inverted high pass filtered output. The non-inverted high pass filtered output may be formed by coupling a first high pass derivative filter capacitor 860A to a first high pass derivative filter resistor 862A, where the first high pass derivative filter resistor 862A is coupled between the non-inverted high pass filtered output and a differential reference voltage, $V_{DIFF\_REF}$. The inverted high pass filtered output may be formed by coupling a second high pass derivative filter capacitor 860B to a second high pass derivative filter resistor 862B, where the second high pass derivative filter resistor 862B is coupled between the inverted high pass filtered output and the differential reference voltage, $V_{DIFF\_REF}$. The first high pass derivative filter capacitor 860A may be coupled between the non-inverted high pass filter input and the non-inverted high pass filtered output. The second high pass derivative filter capacitor 860B may be coupled between the inverted high pass filter input and the inverted high pass filtered output. The differential reference voltage, $V_{DIFF\_REF}$, may provide a common voltage reference for the non-inverted $V_{RAMP}$ signal component, $V_{RAMP}$+, and the inverted $V_{RAMP}$ signal component, $V_{RAMP}$—. In some embodiments the differential reference voltage, $V_{DIFF\_REF}$, is tied to ground. The differential capacitor/resistor network 858' high pass filters the differential $V_{RAMP}$ signal to generate a high pass filtered $V_{RAMP}$ signal, where the high pass filtered $V_{RAMP}$ signal is used as the derivative of the $V_{RAMP}$ signal. The high pass filtered $V_{RAMP}$ signal is provided as a differential signal between the non-inverted high pass filtered output and the inverted high pass filtered output.

The first high pass derivative filter capacitor 860A and the second high pass derivative filter capacitor 860B may each be configured as a binary capacitor array that is similar in form and function to the high pass derivative filter capacitor 860. Via the capacitor array control bus 856, the controller 50 may configure the capacitance value of the first high pass derivative filter capacitor 860A and the second high pass derivative filter capacitor 860B to be substantially equal to the high pass corner frequency capacitance, $C_{HP\_CF}$. As a non-limiting example, the high pass corner frequency capacitance, $C_{HP\_CF}$, may have a capacitance between 0 farads and 3 pF in increments substantially equal to 0.2 pF. When the capacitance of the high pass corner frequency capacitance, $C_{HP\_CF}$, equals zero, the differential feedback delay compensation circuit 852A may be effectively disabled. Similarly, in some embodiments, the first high pass derivative filter resistor 862A and the second high pass derivative filter resistor 862B may be configured as binary resistor arrays. Via the control bus 44, the controller 50 may configure the first high pass derivative filter resistor 862A and the second high pass derivative filter resistor 862B to have a resistance level substantially equal to the high pass corner frequency resistance, $R_{HP\_CF}$. The differential capacitor/resistor network 858' has a high pass corner time constant, $\tau_{HF\_CF}$. The high pass corner time constant, $\tau_{HF\_CF}$, is the product of the high pass corner frequency capacitance, $C_{HP\_CF}$, and the high pass frequency resistance, $R_{HP\_CF}$. The controller 50 may be configured to adjust the high pass corner frequency capacitance, $C_{HP\_CF}$, the high pass frequency resistance, $R_{HP\_CF}$, and/or a combination thereof in order to configure the high pass corner time constant, $\tau_{HF\_CF}$. However, in some embodiments, (not shown) the first high pass derivative filter capacitor 860A and the second high pass derivative filter capacitor 860B may be fixed value capacitors while the first high pass derivative filter resistor 862A and the second high pass derivative filter resistor 862B may be programmable. In other embodiments, the first high pass derivative filter capacitor 860A and the second high pass derivative filter capacitor 860B may be programmable while the first high pass derivative filter resistor 862A and the second high pass derivative filter resistor 862B have a fixed value.

The differential Gm feedback compensation circuit 864' includes an inverting input and a non-inverting input. The non-inverting input of the differential Gm feedback compensation circuit 864' may be in communication with the first high pass derivative filter capacitor 860A and the first high pass derivative filter resistor 862A, which form the non-inverted high pass filtered output of the differential capacitor/resistor network 858'. The inverting input of the differential Gm feedback compensation circuit 864' may be in communication with the second high pass derivative filter capacitor 860B and the second high pass derivative filter resistor 862B, which form the inverted high pass filtered output of the differential capacitor/resistor network 858'. The differential Gm feedback compensation circuit 864' may be configured to generate the feedback delay compensation signal 854, $I_{FEEDBACK\_TC}$, based on the derivative output response of the differential capacitor/resistor network 858'. In the case where the slope of the derivative of the differential $V_{RAMP}$ signal is positive, the magnitude of the feedback delay compensation signal 854, $I_{FEEDBACK\_TC}$, is a positive. As a result, the differential Gm feedback compensation circuit 864' sources current when the slope of the derivative of the differential $V_{RAMP}$ signal is positive. In the case where the slope of the derivative of the differential $V_{RAMP}$ signal is negative, the feedback delay compensation signal 854, $I_{FEEDBACK\_TC}$, is a negative current. In other words, the differential Gm feedback compensation circuit 864' sinks current when the slope of the derivative of the $V_{RAMP}$ signal is negative. Similar to the Gm feedback compensation circuit 864, depicted in FIG. 39A, the differential Gm feedback compensation circuit 864' also has a Gm feedback compensation transconductance, $Gm_{FEEDBACK\_TC}$, that may be configured by the controller 50. Similar to the feedback delay compensation circuit 852, depicted in FIG. 39A, the controller 50 may configure the Gm feedback compensation transconductance, $Gm_{FEEDBACK\_TC}$, of the differential Gm feedback compensation circuit 864' to optimize or calibrate the magnitude of the feedback delay compensation signal 854, $I_{FEEDBACK\_TC}$.

Returning to FIG. 38A, the application of the feedback delay compensation signal 854, $I_{FEEDBACK\_TC}$, in the multi-level charge pump buck converter 12Q will now be discussed. For the sake of simplicity, and not by way of limitation, the parallel amplifier circuit output current estimate 40, $I_{PAWA\_OUT\_EST}$, is assumed to be substantially equal to the scaled parallel amplifier output current estimate, $I_{PARA\_AMP\_SENSE}$. Accordingly, the parallel amplifier circuit output current estimate 40, $I_{PAWA\_OUT\_EST}$, reflects the magnitude of the parallel amplifier output current, $I_{PARA\_AMP}$, generated by the parallel amplifier 35.

Although the feedback delay compensation signal 854, $I_{FEEDBACK\_TC}$, provides a 90 degree phase lead with respect to the $V_{RAMP}$ signal, the feedback delay compensation circuit 852 may have a signal generation propagation delay associated with generation of the feedback delay compensation signal 854, $I_{FEEDBACK\_TC}$. In order to temporally align the feedback delay compensation signal 854, $I_{FEEDBACK\_TC}$, with the operation of the parallel amplifier 35, the parallel amplifier circuit delay may be adjusted. As an example, in some embodiments, the parallel amplifier circuit 14Q may be configured to add a feedback compensation propagation delay between the first control input 34 and the output of the parallel amplifier 35. As an example, the parallel amplifier circuit delay may be a fixed delay added to the parallel amplifier 35, the parallel amplifier circuitry 32, and/or a combination thereof. In other embodiments, the feedback compensation propagation delay may be added by adjusting the propagation time through a combination of the pre-processing circuitry, the parallel amplifier circuitry 32, the parallel amplifier 35, and/or a combination thereof. In other embodiments, the parallel amplifier circuit delay may be a programmable delay that is configured by the controller 50.

Figure 3I:
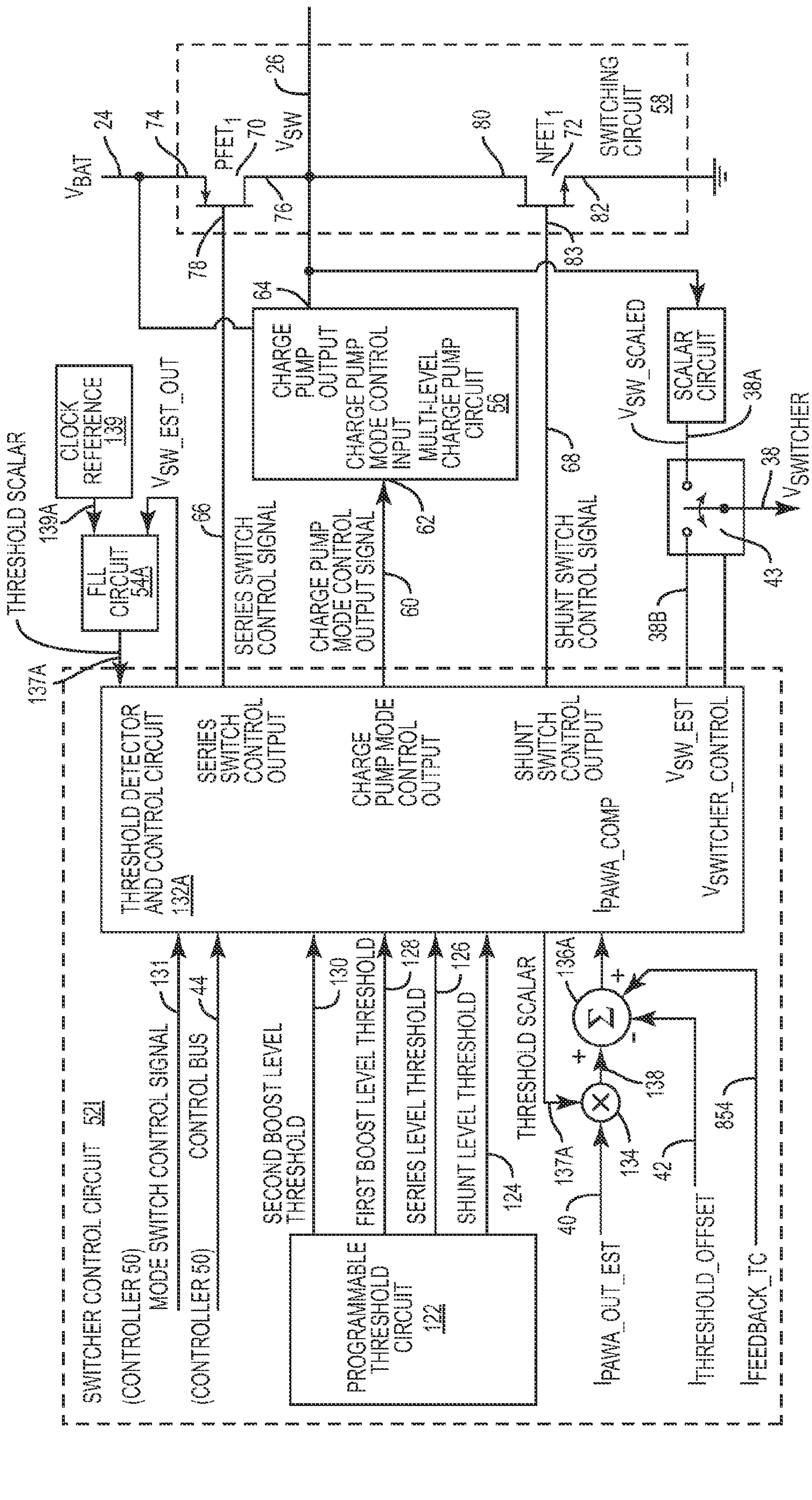
FIG. 3I depicts an embodiment of a switcher control circuit for a multi-level charge pump buck converter having feedback compensation.

As depicted in FIG. 38A, some embodiments of the multi-level charge pump buck converter 12Q may be configured to interoperate with an FLL circuit 54 in a fashion similar to the multi-level charge pump buck converter 12A, depicted in FIG. 2A, or the multi-level charge pump buck converter 12B, depicted in FIG. 2B. FIG. 3I depicts an embodiment of the switcher control circuit 52I that is configured to interoperate with the FLL circuit 54. The switcher control circuit 52I, depicted in FIG. 3I, is similar in form and function to the embodiment of the switcher control circuit 52A, depicted in FIG. 3A, except, as depicted in FIG. 3I, the switcher control circuit 52I is further configured to receive and use the feedback delay compensation signal 854, $I_{FEEDBACK\_TC}$ to control the operation of the multi-level charge pump buck converter 12Q. Unlike the switcher control circuit 52A depicted in FIG. 3A, FIG. 3I depicts that the switcher control circuit 52I includes a summing circuit 136A configured to receive a scaled parallel amplifier output current estimate 138 from the multiplier circuit 134, the threshold offset current 42, and the feedback delay compensation signal 854, $I_{FEEDBACK\_TC}$. The summing circuit 136A subtracts the threshold offset current 42 from the sum of the scaled parallel amplifier output current estimate 138 and the feedback delay compensation signal 854, $I_{FEEDBACK\_TC}$, to form a compensated parallel amplifier circuit output current estimate, $I_{PAWA\_COMP}$, that is received by the threshold detector and control circuit 132I, depicted in FIG. 4I. The compensated parallel amplifier circuit output current estimate, $I_{PAWA\_COMP}$, may also be referred to as a composite feedback signal.

Figure 4I:
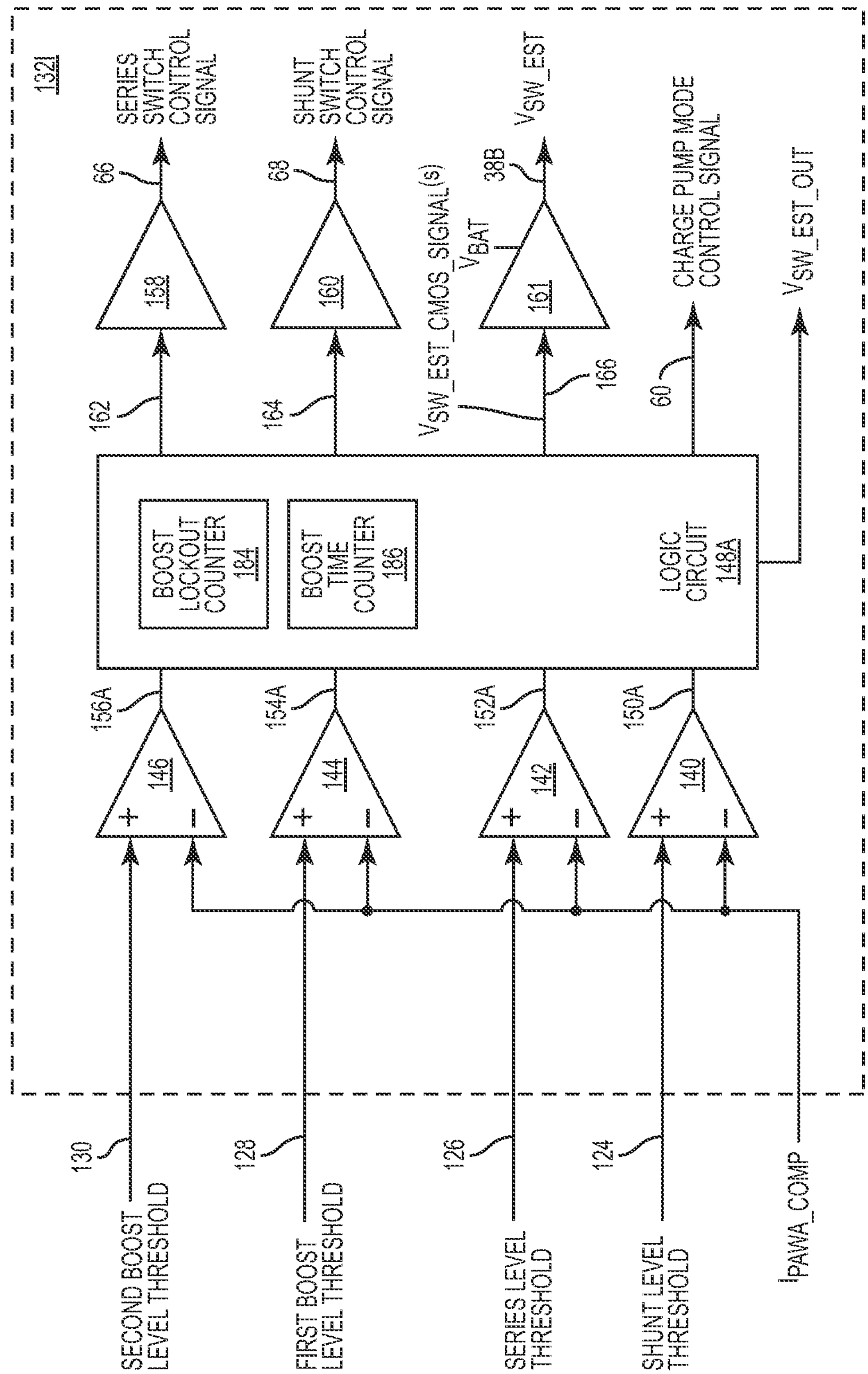
FIG. 4I depicts an embodiment of a threshold detector and control circuit of a multi-level charge pump buck converter that includes feedback compensation.

The threshold detector and control circuit 132I, depicted in FIG. 4I, is similar in form and function to the threshold detector and control circuit 132A, depicted in FIG. 4A. The threshold detector and control circuit 132I includes the shunt level threshold 124, the series level threshold 126, the first boost level threshold 128, and the second boost level threshold 130, coupled to the positive terminal of the first comparator 140, the second comparator 142, the third comparator 144, and the fourth comparator 146, respectively. Operationally, the threshold detector and control circuit 132I, depicted in FIG. 4I, functions substantially the same as the threshold detector and control circuit 132A, depicted in FIG. 4A. However, the effective level of the shunt level threshold 124, the series level threshold 126, the first boost level threshold 128, and the second boost level threshold 130 relative to the compensated parallel amplifier circuit output current estimate, $I_{PAWA\_COMP}$, may be raised or lowered based on the magnitude of the feedback delay compensation signal 854, $I_{FEEDBACK\_TC}$. Because the magnitude of the feedback delay compensation signal 854, $I_{FEEDBACK\_TC}$, depends on the slope of the derivative of the $V_{RAMP}$ signal, the effective level of the shunt level threshold 124, the series level threshold 126, the first boost level threshold 128, and the second boost level threshold 130 relative to the compensated parallel amplifier circuit output current estimate, $I_{PAWA\_COMP}$, are changed based on the rate of change of the $V_{RAMP}$ signal and the direction of the change. For example, in the case where the slope of the derivative of the $V_{RAMP}$ signal is positive, the magnitude of the feedback delay compensation signal 854, $I_{FEEDBACK\_TC}$, is positive, which will tend to increase the magnitude of the compensated parallel amplifier circuit output current estimate, $I_{PAWA\_COMP}$. As a result, the relative magnitude of the shunt level threshold 124, the series level threshold 126, the first boost level threshold 128, and the second boost level threshold 130 decrease with respect to the magnitude of the scaled parallel amplifier output current estimate, $I_{PARA\_AMP\_SENSE}$. In contrast, for example, in the case where the slope of the derivative of the $V_{RAMP}$ signal is negative, the feedback delay compensation signal 854, $I_{FEEDBACK\_TC}$, is negative, which will tend to decrease the magnitude of the compensated parallel amplifier circuit output current estimate, $I_{PAWA\_COMP}$. Because the decrease the magnitude of the compensated parallel amplifier circuit output current estimate, $I_{PAWA\_COMP}$, is lowered by the feedback delay compensation signal 854, $I_{FEEDBACK\_TC}$, the relative magnitude of the shunt level threshold 124, the series level threshold 126, the first boost level threshold 128, and the second boost level threshold 130 increase with respect to the magnitude of the scaled parallel amplifier output current estimate, $I_{PARA\_AMP\_SENSE}$.

For example, for the case where the magnitude of the $V_{RAMP}$ signal is increasing, such that the slope of the derivative of the $V_{RAMP}$ signal is positive, the feedback delay compensation signal 854, $I_{FEEDBACK\_TC}$, will tend to increase the magnitude of the compensated parallel amplifier circuit output current estimate, $I_{PAWA\_COMP}$. As a result, the magnitude of the scaled parallel amplifier output current estimate, $I_{PARA\_AMP\_SENSE}$, needed to increase the compensated parallel amplifier circuit output current estimate, $I_{PAWA\_COMP}$, to a level that causes one of the first comparator 140, the second comparator 142, the third comparator 144, or the fourth comparator 146, to transition to a digital logic low state is decreased. In other words, the effect of the feedback delay compensation signal 854, $I_{FEEDBACK\_TC}$, being positive is to lower the threshold points at which each of the shunt level indication 150A, the series level indication 152A, the first boost level indication 154A, or the second boost level indication 156A transitions from being de-asserted to being asserted. As a result, the switcher control circuit 52I will tend to increase the switching voltage, $V_{SW}$, based on the in the magnitude of the $V_{RAMP}$ signal sooner than if the feedback delay compensation signal 854, $I_{FEEDBACK\_TC}$, was not present because the switcher control circuit 52I does not have to depend solely on the magnitude of the scaled parallel amplifier output current estimate, $I_{PARA\_AMP\_SENSE}$, to provide an indication of whether the target voltage for the power amplifier supply voltage, $V_{CC}$, is being increased based on the increase in the magnitude of the $V_{RAMP}$ signal.

As another example, for the case where the magnitude of the $V_{RAMP}$ signal is decreasing, such that the slope of the derivative of the $V_{RAMP}$ signal is negative, the feedback delay compensation signal 854, $I_{FEEDBACK\_TC}$, will tend to decrease the magnitude of the compensated parallel amplifier circuit output current estimate, $I_{PAWA\_COMP}$. As a result, the magnitude of the scaled parallel amplifier output current estimate, $I_{PARA\_AMP\_SENSE}$, needed to decrease the compensated parallel amplifier circuit output current estimate, $I_{PAWA\_COMP}$, to a level that causes one of the first comparator 140, the second comparator 142, the third comparator 144, or the fourth comparator 146, to transition from a digital logic low state to a digital logic high state is decreased. In other words, the effect of the feedback delay compensation signal 854, $I_{FEEDBACK\_TC}$, being negative is to increase the threshold points at which each of the shunt level indication 150A, the series level indication 152A, the first boost level indication 154A, or the second boost level indication 156A transitions from being asserted to being de-asserted. As a result, the switcher control circuit 52I will tend to decrease the switching voltage, $V_{SW}$, based on the in the magnitude of the $V_{RAMP}$ signal sooner than if the feedback delay compensation signal 854, $I_{FEEDBACK\_TC}$, was not present because the switcher control circuit 52I does not have to depend solely on the magnitude of the scaled parallel amplifier output current estimate, $I_{PARA\_AMP\_SENSE}$, to provide an indication that the target voltage for the power amplifier supply voltage, $V_{CC}$, is being decreased based on the decreased magnitude of the $V_{RAMP}$ signal. Alternatively, when the $V_{RAMP}$ signal is decreasing, the feedback delay compensation signal 854, $I_{FEEDBACK\_TC}$, lowers the value of the compensated parallel amplifier circuit output current estimate, $I_{PAWA\_COMP}$. Because the compensated parallel amplifier circuit output current estimate, $I_{PAWA\_COMP}$, is lower in value, the magnitude of the scaled parallel amplifier output current estimate, $I_{PARA\_AMP\_SENSE}$, needed such that the compensated parallel amplifier circuit output current estimate, $I_{PAWA\_COMP}$, causes the first comparator 140, the second comparator 142, the third comparator 144, or the fourth comparator 146, to transition from a digital logic low state to a logic high state is increased. As a result, the switcher control circuit 52I will tend to decrease the switching voltage, $V_{SW}$, sooner than if the feedback delay compensation signal 854, $I_{FEEDBACK\_TC}$, was not present.

FIG. 4I depicts the threshold and control circuit 132I of the switcher control circuit 52I. The threshold and control circuit 132I is similar in form and function to the threshold and control circuit 132A, depicted in FIG. 4A, except the compensated parallel amplifier circuit output current estimate, $I_{PAWA\_COMP}$, includes a contribution from the feedback delay compensation signal 854, $I_{FEEDBACK\_TC}$. Thus, the operation of the first state machine, depicted in FIG. 5A, and the second state machine, depicted in FIG. 5B, associated with the logic circuit 148A will be influenced by the magnitude of the feedback delay compensation signal 854, $I_{FEEDBACK\_TC}$. As an example, the behavior of the first state machine, depicted in FIG. 5A, and the second state machine, depicted in FIG. 6A, associated with the logic circuit 148A relative to the magnitude of the scaled parallel amplifier output current estimate, $I_{PARA\_AMP\_SENSE}$, will change depending on the feedback delay compensation signal 854, $I_{FEEDBACK\_TC}$. In the case where the $V_{RAMP}$ signal is increasing such that the slope of the derivative of the $V_{RAMP}$ signal is positive, the feedback delay compensation signal 854, $I_{FEEDBACK\_TC}$, tends to increase the magnitude of the compensated parallel amplifier circuit output current estimate, $I_{PAWA\_COMP}$. As a result, the first state machine of the logic circuit 148A will tend to shift into a mode of operation that provides a higher switching voltage, $V_{SW}$, at the switching voltage output 26 for a corresponding lower magnitude scaled parallel amplifier output current estimate, $I_{PARA\_AMP\_SENSE}$, because the effect is to lower the threshold points at which each of the shunt level indication 150A, the series level indication 152A, the first boost level indication 154A, or the second boost level indication 156A transitions from being de-asserted to being asserted due to the feedback delay compensation signal 854, $I_{FEEDBACK\_TC}$.

As a result, for example, when the first state machine associated with the logic circuit 148A, depicted in FIG. 5A, is in the shunt output mode 188A, the first state machine transitions to the series output mode 190A when the scaled parallel amplifier output current estimate, $I_{PARA\_AMP\_SENSE}$, is at a lower magnitude due to the feedback delay compensation signal 854, $I_{FEEDBACK\_TC}$. In this case, the addition of the feedback delay compensation signal 854, $I_{FEEDBACK\_TC}$, causes the first state machine to advance in time to the point at which the first state machine transitions from the shunt output mode 188A to the series output mode 190A in response to an increase in the magnitude of the $V_{RAMP}$ signal, where the increase in the magnitude of the $V_{RAMP}$ signal indicates that the target voltage for the power amplifier supply voltage, $V_{CC}$, will be increased. Because the feedback delay compensation signal 854, $I_{FEEDBACK\_TC}$, provides an earlier indication that the target voltage for the power amplifier supply voltage, $V_{CC}$, is being increased, based on the positive slope of the derivative of the $V_{RAMP}$ signal, the feedback delay compensation signal 854, $I_{FEEDBACK\_TC}$, compensates for the feedback delay associated with the generation of the scaled parallel amplifier output current estimate, $I_{PARA\_AMP\_SENSE}$, by lowering the effective threshold level of the series level threshold 126, which is provided as an input to the positive terminal of the second comparator 142.

As a second example, when the slope of the derivative of the $V_{RAMP}$ signal is negative, the feedback delay compensation signal 854, $I_{FEEDBACK\_TC}$, will lower the magnitude of the compensated parallel amplifier circuit output current estimate, $I_{PAWA\_COMP}$. As a result, the first state machine will tend to shift to a mode of operation that provides a lower switching voltage, $V_{SW}$, at the switching voltage output 26 for a particular magnitude of the scaled parallel amplifier output current estimate, $I_{PARA\_AMP\_SENSE}$. For example, as depicted in FIG. 5A, when the first state machine of the logic circuit 148A, depicted in FIG. 4I, is in the series output mode 190A, the first state machine transitions from the series output mode 190A to the shunt output mode 188A when the compensated parallel amplifier circuit output current estimate, $I_{PAWA\_COMP}$, is less than the shunt level threshold 124. Because the feedback delay compensation signal 854, $I_{FEEDBACK\_TC}$, lowers the compensated parallel amplifier circuit output current estimate, $I_{PAWA\_COMP}$, when the slope of the derivative of the $V_{RAMP}$ signal is negative, the transition from the series output mode 190A to the shunt output mode 188A for a particular magnitude of the scaled parallel amplifier output current estimate, $I_{PARA\_AMP\_SENSE}$, occurs earlier than if the feedback delay compensation signal 854, $I_{FEEDBACK\_TC}$, was not used to form the compensated parallel amplifier circuit output current estimate, $I_{PAWA\_COMP}$. Because the feedback delay compensation signal 854, $I_{FEEDBACK\_TC}$, provides an earlier indication that the target voltage for the power amplifier supply voltage, $V_{CC}$, is being decreased, based on the negative slope of the derivative of the $V_{RAMP}$ signal, the feedback delay compensation signal 854, $I_{FEEDBACK\_TC}$, compensates for the feedback delay associated with the generation of the scaled parallel amplifier output current estimate, $I_{PARA\_AMP\_SENSE}$, by raising the effective threshold level of the series level threshold 126, which is provided as an input to the positive terminal of the first comparator 140. The effect is to advance in time when the first state machine of the logic circuit 148A transitions from the series output mode 190A to the shunt output mode 188A relative to the decrease in the magnitude of the $V_{RAMP}$ signal, where the decrease in the magnitude of the $V_{RAMP}$ signal indicates that the target voltage for the power amplifier supply voltage, $V_{CC}$, is decreasing. As a result, the switching voltage, $V_{SW}$, will be lowered sooner in response to the $V_{RAMP}$ signal decreasing in value than if the feedback delay compensation signal 854, $I_{FEEDBACK\_TC}$, was not present.

The feedback delay compensation signal 854, $I_{FEEDBACK\_TC}$, compensates for the feedback delay associated with the generation of the scaled parallel amplifier output current estimate, $I_{PARA\_AMP\_SENSE}$, by lowering or raising the effective threshold level of the shunt level threshold 124, the series level threshold 126, the first boost level threshold 128, and the second boost level threshold 130 as a function of the slope of the $V_{RAMP}$ signal, where the slope of the $V_{RAMP}$ signal indicates a corresponding increase or decrease in the target voltage for the power amplifier supply voltage, $V_{CC}$. The feedback delay compensation signal 854, $I_{FEEDBACK\_TC}$, likewise impacts the operational performance of the second state machine of the logic circuit 148A of the threshold detector and control circuit 132I, depicted in FIG. 6A, in a similar fashion.

Returning to FIG. 38A, because the $V_{RAMP}$ signal represents the target voltage for the power amplifier supply voltage, $V_{CC}$, the parallel amplifier 35 is configured to generate a parallel amplifier output current, $I_{PARA\_AMP}$, to drive the power amplifier supply voltage, $V_{CC}$, to the target voltage until the multi-level charge pump buck converter 12Q responds to the change in the target voltage level for the power amplifier supply voltage, $V_{CC}$. Because the feedback delay compensation signal 854, $I_{FEEDBACK\_TC}$, provides an early indication of the target voltage level for the power amplifier supply voltage, $V_{CC}$, based on the slope of the derivative of the $V_{RAMP}$ signal, the multi-level charge pump buck converter 12Q responds to the change in the $V_{RAMP}$ signal when the parallel amplifier output current, $I_{PARA\_AMP}$, is at a lower magnitude, which reduces the average current sourced and sunk by the parallel amplifier 35.

Figure 3J:
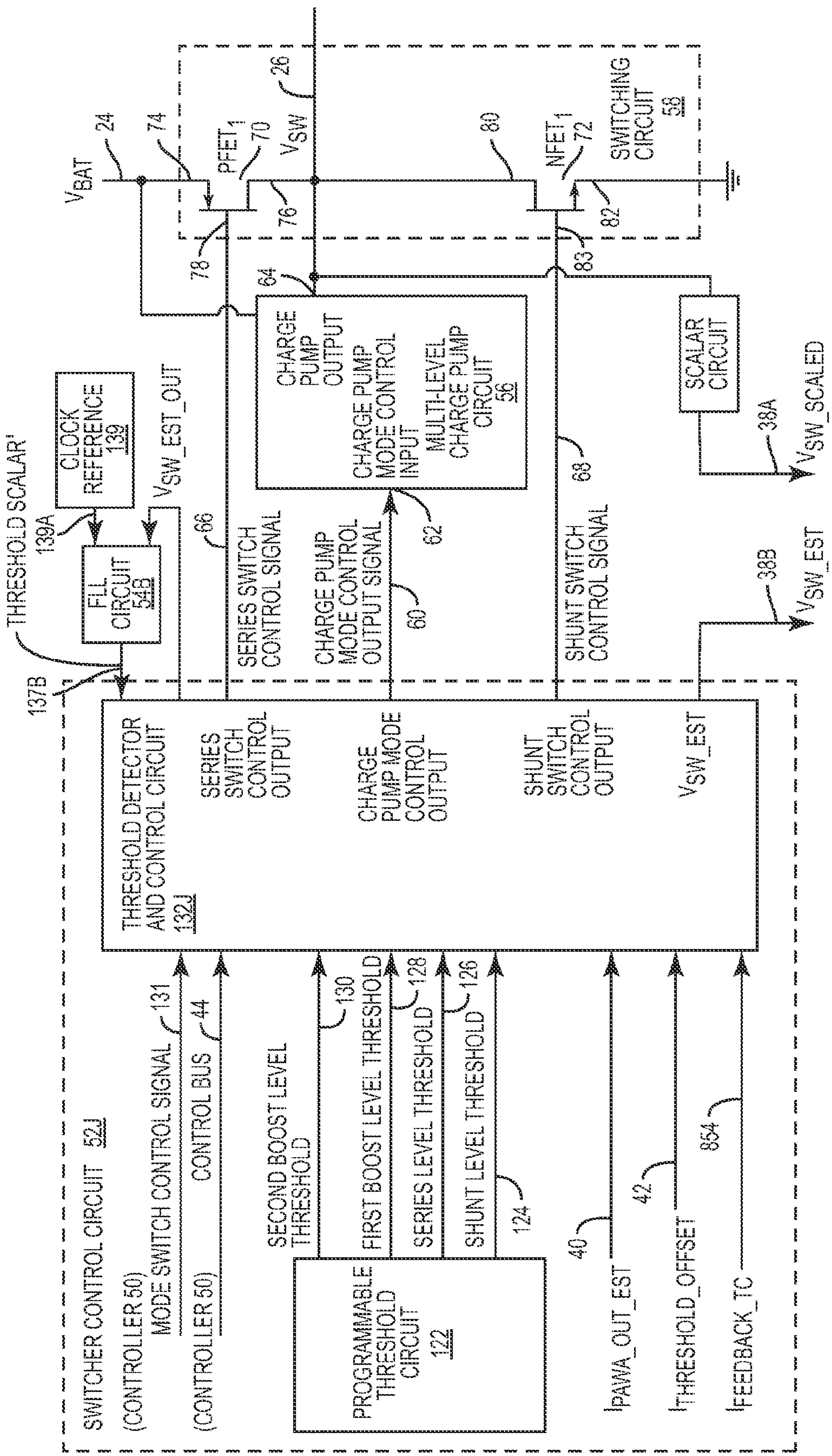
FIG. 3J depicts an embodiment of a switcher control circuit for a multi-level charge pump buck converter having feedback compensation.
Figure 4J:
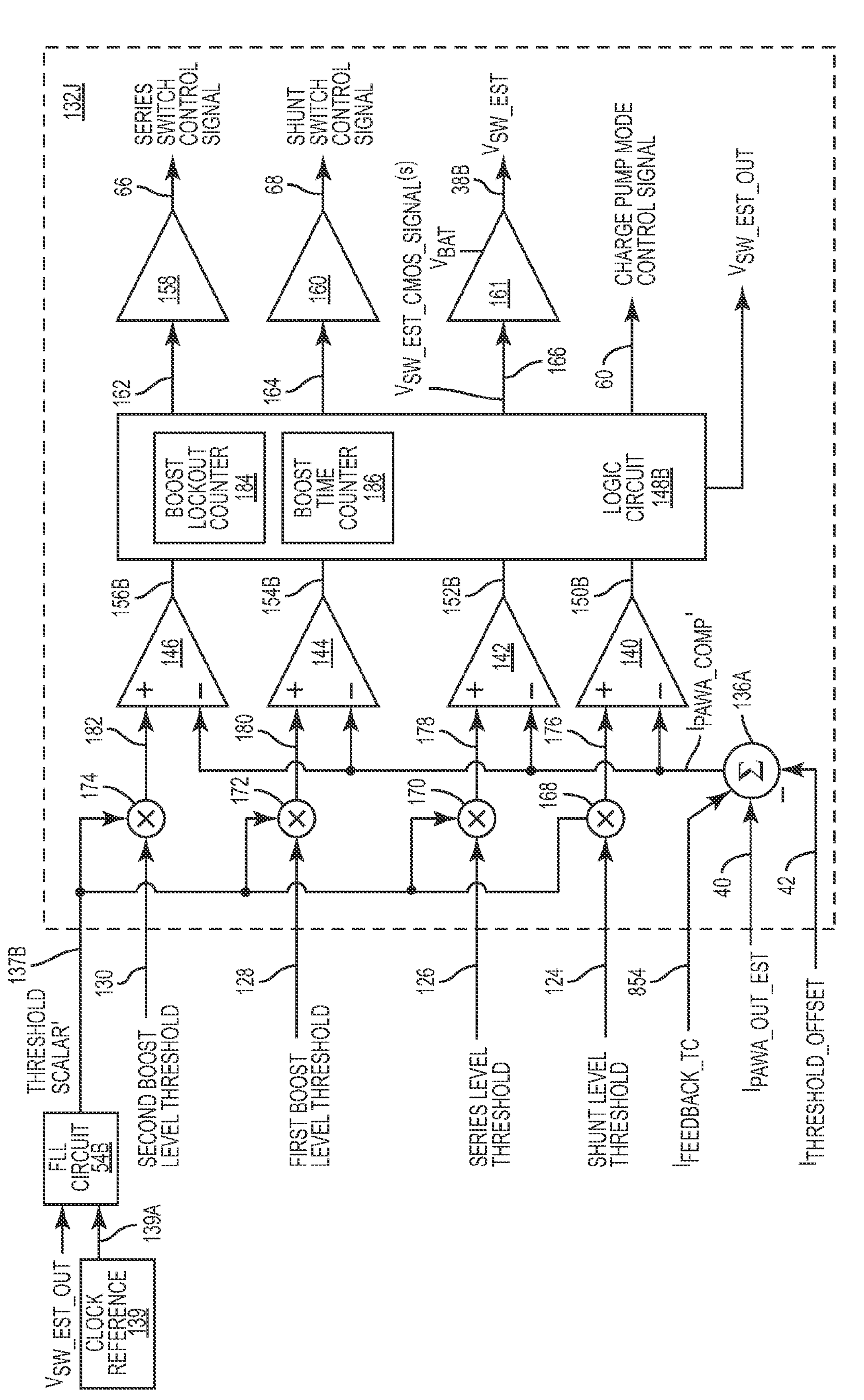
FIG. 4J depicts an embodiment of a threshold detector and control circuit of a multi-level charge pump buck converter that includes feedback compensation.

Some embodiments of the multi-level charge pump buck converter 12Q, depicted in FIG. 38A, are configured to interoperate with the FLL circuit 54. As an example, the multi-level charge pump buck converter 12Q may include a switcher control circuit 52 similar to the switcher control circuit 52J depicted in FIG. 3J. The switcher control circuit 52J, depicted in FIG. 3J, is similar in form and function to the switcher control circuit 52B, depicted in FIG. 3B. However, unlike the switcher control circuit 52B depicted in FIG. 3B, the switcher control circuit 52J depicted in FIG. 3J includes a threshold and control circuit 132J configured to receive the feedback delay compensation signal 854, $I_{FEEDBACK\_TC}$. FIG. 4J depicts that the threshold and control circuit 132J is similar in form and function to the threshold and control circuit 132B, depicted in FIG. 4B, except the threshold and control circuit 132J depicted in FIG. 4J includes a summing circuit 136A configured to receive the parallel amplifier circuit output current estimate 40, $I_{PAWA\_OUT\_EST}$, generated by the parallel amplifier circuit, the threshold offset current 42, $I_{THRESHOLD\_OFFSET}$, and the feedback delay compensation signal 854, $I_{FEEDBACK\_TC}$. The summing circuit 136A subtracts the threshold offset current 42, $I_{THRESHOLD\_OFFSET}$, from the sum of the parallel amplifier circuit output current estimate 40, $I_{PAWA\_OUT\_EST}$, and the feedback delay compensation signal 854, $I_{FEEDBACK\_TC}$, to generate a compensated parallel amplifier circuit output current estimate, $I_{PAWA\_COMP}'$, which may be used as a composite feedback signal for the first comparator 140, the second comparator 142, the third comparator 144, and the fourth comparator 146. Similar to the operation of the threshold and control circuit 132B depicted in FIG. 3B, the compensated parallel amplifier circuit output current estimate, $I_{PAWA\_COMP}'$ is provided to the negative terminal of each of the first comparator 140, the second comparator 142, the third comparator 144, and the fourth comparator 146.

Similar to the operation of the threshold detector and control circuit 132I, depicted in FIG. 4I, the feedback delay compensation signal 854, $I_{FEEDBACK\_TC}$, may be used to raise or lower the compensated parallel amplifier circuit output current estimate, $I_{PAWA\_COMP}'$ depending upon the slope of the $V_{RAMP}$ signal, which is used to form the feedback delay compensation signal 854, $I_{FEEDBACK\_TC}$. As a result, similar to the behavior of the first state machine, depicted in FIG. 5A, and the second state machine, depicted in FIG. 6A, associated with the logic circuit 148A, depicted in FIG. 4I, the behavior of the first state machine, depicted in FIG. 5B, and the second state machine, depicted in FIG. 6B, associated with the logic circuit 148B of the threshold detector and control circuit 132J, depicted in FIG. 4J, relative to the magnitude of the scaled parallel amplifier output current estimate, $I_{PARA\_AMP\_SENSE}$, will change depending on the feedback delay compensation signal 854. In the case where the $V_{RAMP}$ signal is increasing such that the slope of the derivative of the $V_{RAMP}$ signal is positive, the feedback delay compensation signal 854, $I_{FEEDBACK\_TC}$, tends to increase the magnitude of a compensated parallel amplifier circuit output current estimate, $I_{PAWA\_COMP}'$. As a result, the first state machine of the logic circuit 148B of the threshold detector and control circuit 132J, depicted in FIG. 4J, will tend to shift into a mode of operation that provides a higher switching voltage, $V_{SW}$, at the switching voltage output 26 for a corresponding lower magnitude scaled parallel amplifier output current estimate, $I_{PARA\_AMP\_SENSE}$, because the effect is to lower the threshold points at which each of the shunt level indication 150B, the series level indication 152B, the first boost level indication 154B, or the second boost level indication 156B transitions from being de-asserted to being asserted due to the feedback delay compensation signal 854, $I_{FEEDBACK\_TC}$.

As a result, for example, when the first state machine associated with the logic circuit 148B, depicted in FIG. 5B, is in the shunt output mode 188B, the first state machine transitions to the series output mode 190B when the scaled parallel amplifier output current estimate, $I_{PARA\_AMP\_SENSE}$, is at a lower magnitude due to the feedback delay compensation signal 854, $I_{FEEDBACK\_TC}$. In this case, the addition of the feedback delay compensation signal 854, $I_{FEEDBACK\_TC}$, is to cause the first state machine to advance in time to the point at which the first state machine transitions from the shunt output mode 188B to the series output mode 190B in response to an increase in the magnitude of the $V_{RAMP}$ signal, where the increase in the magnitude of the $V_{RAMP}$ signal indicates that the target voltage for the power amplifier supply voltage, $V_{CC}$, will be increased. Because the feedback delay compensation signal 854, $I_{FEEDBACK\_TC}$, provides an earlier indication that the target voltage for the power amplifier supply voltage, $V_{CC}$, is being increased, based on the positive slope of the derivative of the $V_{RAMP}$ signal, the feedback delay compensation signal 854, $I_{FEEDBACK\_TC}$, compensates for the feedback delay associated with the generation of the scaled parallel amplifier output current estimate, $I_{PARA\_AMP\_SENSE}$, by lowering the effective threshold level of the series level threshold 126, which is provided as an input to the positive terminal of the second comparator 142.

As a second example, when the slope of the derivative of the $V_{RAMP}$ signal is negative, the feedback delay compensation signal 854, $I_{FEEDBACK\_TC}$, will lower the magnitude of the compensated parallel amplifier circuit output current estimate, $I_{PAWA\_COMP}'$. As a result, the first state machine associated with the logic circuit 148B of the threshold and control circuit 132J will tend to shift to a mode of operation that provides a lower switching voltage, $V_{SW}$, at the switching voltage output 26 for a particular magnitude of the scaled parallel amplifier output current estimate, $I_{PARA\_AMP\_SENSE}$. For example, as depicted in FIG. 5B, when the first state machine of the logic circuit 148B, depicted in FIG. 4J, is in the series output mode 190B, the first state machine transitions from the series output mode 190B to the shunt output mode 188B when the compensated parallel amplifier circuit output current estimate, $I_{PAWA\_COMP}'$, is less than the shunt level threshold. Because the feedback delay compensation signal 854, $I_{FEEDBACK\_TC}$, lowers the compensated parallel amplifier circuit output current estimate, $I_{PAWA\_COMP}$, when the slope of the derivative of the $V_{RAMP}$ signal is negative, the transition from the series output mode 190B to the shunt output mode 188B for a particular magnitude of the scaled parallel amplifier output current estimate, $I_{PARA\_AMP\_SENSE}$, occurs earlier than if the feedback delay compensation signal 854, $I_{FEEDBACK\_TC}$, was not used to form the compensated parallel amplifier circuit output current estimate, $I_{PAWA\_COMP}'$. Because the feedback delay compensation signal 854, $I_{FEEDBACK\_TC}$, provides an earlier indication that the target voltage for the power amplifier supply voltage, $V_{CC}$, is being decreased, based on the negative slope of the derivative of the $V_{RAMP}$ signal, the feedback delay compensation signal 854, $I_{FEEDBACK\_TC}$, compensates for the feedback delay associated with the generation of the scaled parallel amplifier output current estimate, $I_{PARA\_AMP\_SENSE}$, by raising the effective threshold level of the series level threshold 126, which is provided as an input to the positive terminal of the first comparator 140. The effect is to advance in time when the first state machine of the logic circuit 148B transitions from the series output mode 190B to the shunt output mode 188B relative to the decrease in the magnitude of the $V_{RAMP}$ signal, where the decrease in the magnitude of the $V_{RAMP}$ signal indicates that the target voltage for the power amplifier supply voltage, $V_{CC}$, is decreasing. As a result, the switching voltage, $V_{SW}$, will be lowered sooner in response to the $V_{RAMP}$ signal decreasing in value than if the feedback delay compensation signal 854, $I_{FEEDBACK\_TC}$, was not present.

The feedback delay compensation signal 854, $I_{FEEDBACK\_TC}$, compensates for the feedback delay associated with the generation of the scaled parallel amplifier output current estimate, $I_{PARA\_AMP\_SENSE}$, by lowering or raising the effective threshold level of the shunt level threshold 124, the series level threshold 126, the first boost level threshold 128, and the second boost level threshold 130 as a function of the slope of the $V_{RAMP}$ signal, where the slope of the $V_{RAMP}$ signal indicates a corresponding increase or decrease in the target voltage for the power amplifier supply voltage, $V_{CC}$. The feedback delay compensation signal 854, $I_{FEEDBACK\_TC}$, likewise impacts the operational performance of the second state machine of the logic circuit 148B of the threshold detector and control circuit 132J, depicted in FIG. 6B.

As a first example, when the feedback delay compensation signal 854, $I_{FEEDBACK\_TC}$, is greater than zero, the first state machine tends to shift to a mode of operation that provides a higher switching voltage, $V_{SW}$, at the switching voltage output 26 at a corresponding lower magnitude scaled parallel amplifier output current estimate, $I_{PARA\_AMP\_SENSE}$. However, when the feedback delay compensation signal 854, $I_{FEEDBACK\_TC}$, is less than zero, the first state machine tends to shift to a mode of operation that provides a lower switching voltage, $V_{SW}$, at the switching voltage output 26 at a corresponding lower magnitude scaled parallel amplifier output current estimate, $I_{PARA\_AMP\_SENSE}$.

For example, in the case where the slope of derivative of the $V_{RAMP}$ signal is positive, the $V_{RAMP}$ signal is increasing in value and the magnitude of the feedback delay compensation signal 854, $I_{FEEDBACK\_TC}$, will be positive. As a result, the feedback delay compensation signal 854, $I_{FEEDBACK\_TC}$, tends to increase the value of the compensated parallel amplifier circuit output current estimate, $I_{PAWA\_COMP}$, which effectively lowers the magnitude of the scaled parallel amplifier output current estimate, $I_{PARA\_AMP\_SENSE}$, need to trigger a change in the output of the first comparator 140, the second comparator 142, the third comparator 144, and the fourth comparator 146. Thus, the addition of the feedback delay compensation signal 854, $I_{FEEDBACK\_TC}$, effectively lowers the shunt level threshold 124, the series level threshold 126, the first boost level threshold 128, and the second boost level threshold 130, relative to the magnitude of the scaled parallel amplifier output current estimate, $I_{PARA\_AMP\_SENSE}$.

Returning to FIG. 38A, as discussed previously, because the $V_{RAMP}$ signal represents the target voltage for the power amplifier supply voltage, $V_{CC}$, the parallel amplifier 35 is configured to generate a parallel amplifier output current, $I_{PARA\_AMP}$, to drive the power amplifier supply voltage, $V_{CC}$, to the target voltage until the multi-level charge pump buck converter 12Q responds to the change in the target voltage level for the power amplifier supply voltage, $V_{CC}$. Because the feedback delay compensation signal 854, $I_{FEEDBACK\_TC}$, provides an early indication of the target voltage level for the power amplifier supply voltage, $V_{CC}$, based on the slope of the derivative of the $V_{RAMP}$ signal, the multi-level charge pump buck converter 12Q responds to the change in the $V_{RAMP}$ signal sooner than if the multi-level charge pump buck converter 12Q was being configured solely based on the scaled parallel amplifier output current estimate, $I_{PARA\_AMP\_SENSE}$. Accordingly, the multi-level charge pump buck converter 12Q tends to respond to the change in the $V_{RAMP}$ signal when the parallel amplifier output current, $I_{PARA\_AMP}$, has a lower magnitude, which reduces the average current sourced and sunk by the parallel amplifier 35.

Figure 3K:
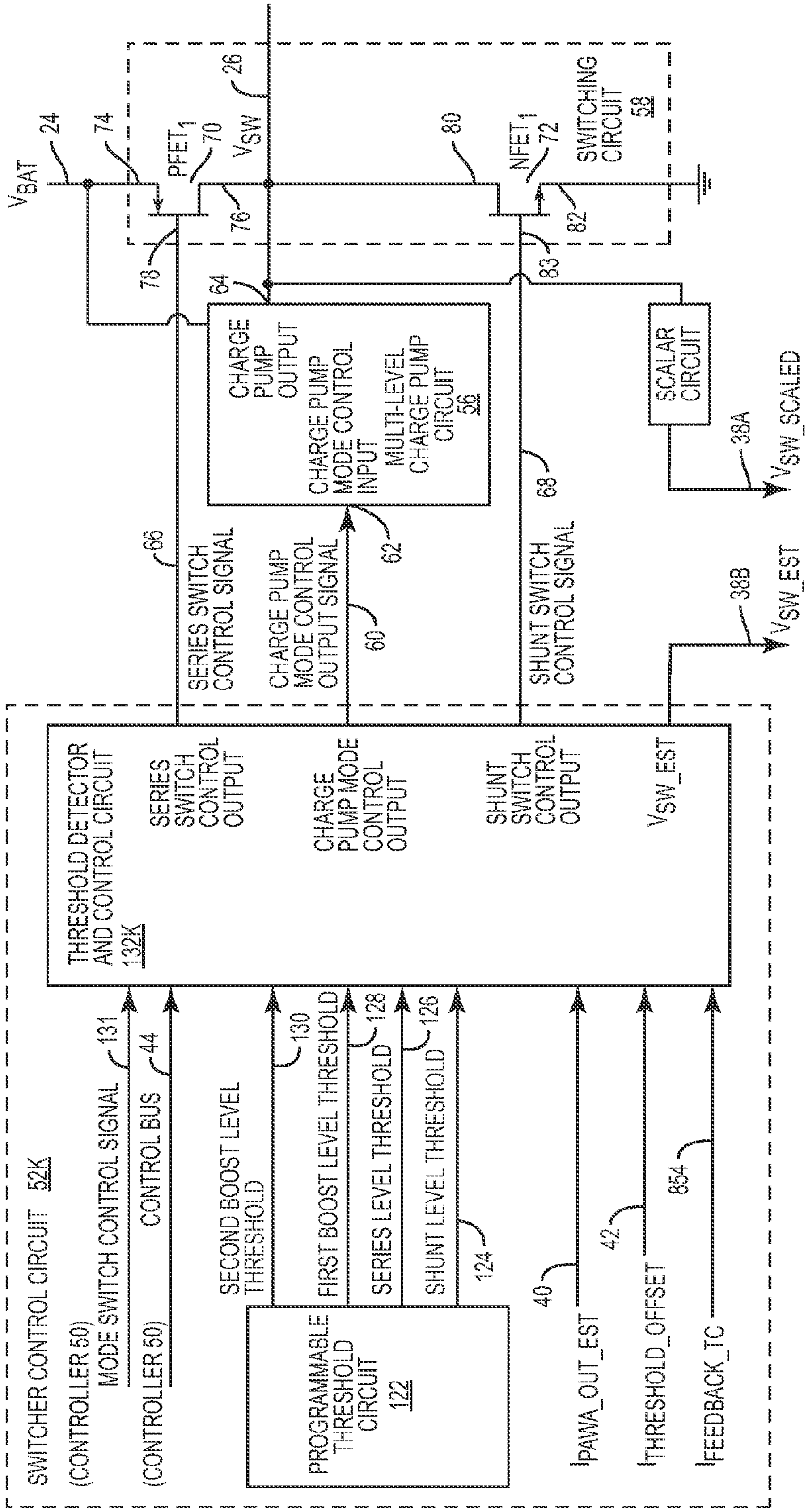
FIG. 3K depicts an embodiment of a switcher control circuit for a multi-level charge pump buck converter having feedback compensation.
Figure 4K:
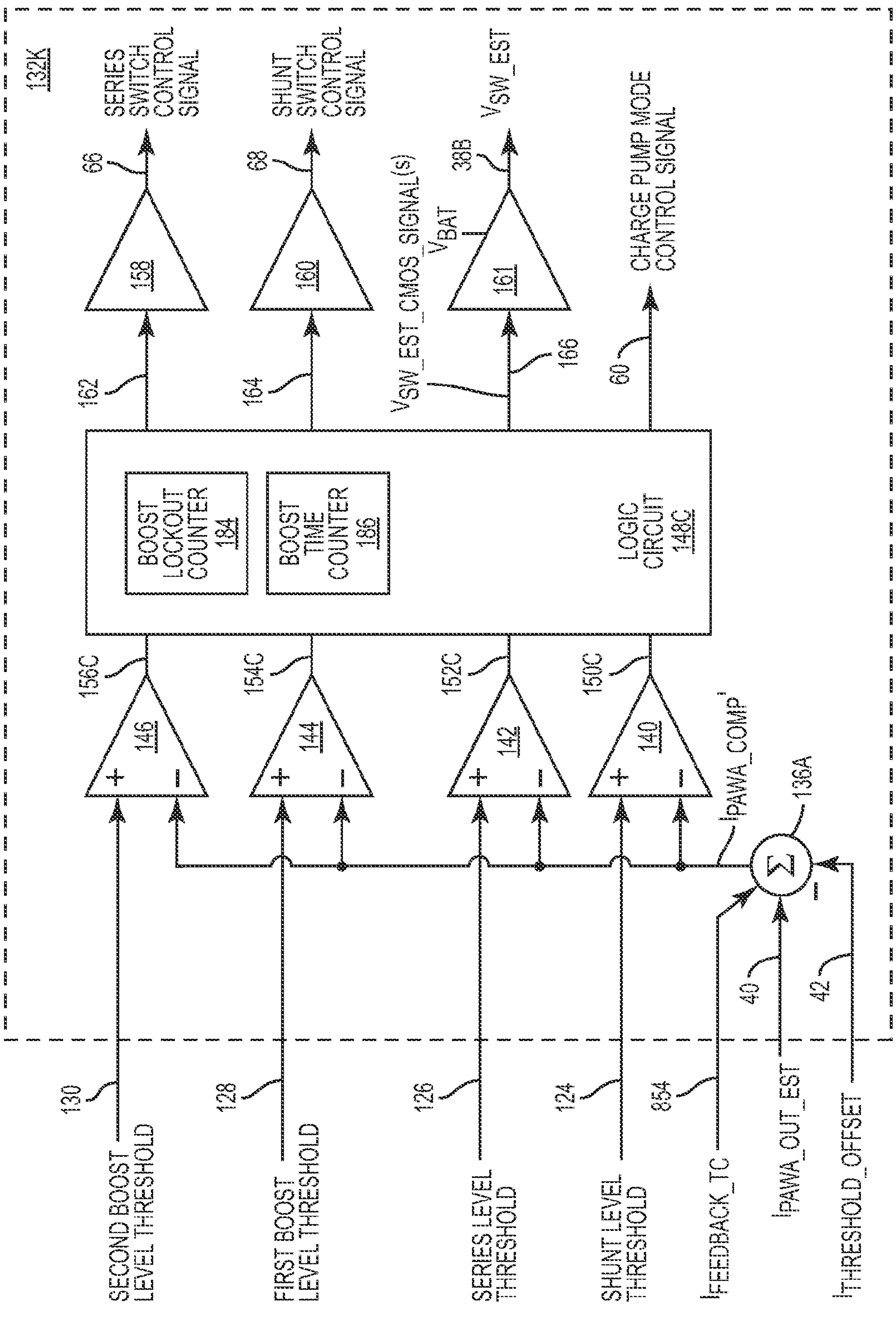
FIG. 4K depicts another embodiment of a threshold detector and control circuit of a multi-level charge pump buck converter that includes feedback compensation.

Although FIG. 38A depicts the multi-level charge pump buck converter 12Q as having the FLL circuit 54, some embodiments of the multi-level charge pump buck converter 12Q may not include the FLL circuit 54 or the FLL circuit 54 may be disabled. In this case, the switcher control circuit 52 of the multi-level charge pump buck converter 12Q may be configured similar to the switcher control circuit 52K depicted in FIG. 3K. The switcher control circuit 52K, depicted in FIG. 3K, is similar in form and function to the switcher control circuit 52C, depicted in FIG. 3C, except the threshold detector and control circuit 132K is configured to receive the feedback delay compensation signal 854, $I_{FEEDBACK\_TC}$. As depicted in FIG. 4K, the threshold detector and control circuit 132K is similar in form and function to the threshold detector and control circuit 132C, depicted in FIG. 3C, except the threshold detector and control circuit 132K, depicted in FIG. 4K, includes the summing circuit 136A configured to receive the parallel amplifier circuit output current estimate 40, $I_{PAWA\_OUT\_EST}$, the threshold offset current 42, $I_{THRESHOLD\_OFFSET}$, and the feedback delay compensation signal 854, $I_{FEEDBACK\_TC}$. The summing circuit 136A subtracts the threshold offset current 42, $I_{THRESHOLD\_OFFSET}$, from the sum of the parallel amplifier circuit output current estimate 40, $I_{PAWA\_OUT\_EST}$, and the feedback delay compensation signal 854, $I_{FEEDBACK\_TC}$, to generate a compensated parallel amplifier circuit output current estimate, $I_{PAWA\_COMP}'$, which may be used as a composite feedback signal for the first comparator 140, the second comparator 142, the third comparator 144, and the fourth comparator 146. Similar to the operation of the threshold and control circuit 132C depicted in FIG. 3C, the threshold and control circuit 132K is configured such that the compensated parallel amplifier circuit output current estimate, $I_{PAWA\_COMP}'$ is provided to the negative terminal of each of the first comparator 140, the second comparator 142, the third comparator 144, and the fourth comparator 146. Similar to the previously described threshold detector and control circuit 132I, depicted in FIG. 4I, and the threshold detector and control circuit 132J, depicted in FIG. 4J, the feedback delay compensation signal 854, $I_{FEEDBACK\_TC}$, may be used to raise or lower the compensated parallel amplifier circuit output current estimate, $I_{PAWA\_COMP}'$ depending on the slope of the derivative of the $V_{RAMP}$ signal, which is used to generate the feedback delay compensation signal 854, $I_{FEEDBACK\_TC}$.

Accordingly, similar to the behavior of the first state machine, depicted in FIG. 5A, and the second state machine, depicted in FIG. 6A, associated with the logic circuit 148A, and the first state machine, depicted in FIG. 5B and the second state machine depicted in FIG. 6B, associated with the logic circuit 148B, the behavior of the first state machine, depicted in FIG. 5C, and the second state machine, depicted in FIG. 6C, associated with the logic circuit 148C of the threshold and control circuit 132K, depicted in FIG. 4K, changes relative to the magnitude of the scaled parallel amplifier output current estimate, $I_{PARA\_AMP\_SENSE}$, depending on whether the feedback delay compensation signal 854 is positive or negative. As a first example, in the case where the $V_{RAMP}$ signal is increasing such that the slope of the derivative of the $V_{RAMP}$ signal is positive, the feedback delay compensation signal 854, $I_{FEEDBACK\_TC}$, tends to increase the magnitude of the compensated parallel amplifier circuit output current estimate, $I_{PAWA\_COMP}'$. As a result, the first state machine of the logic circuit 148C, depicted in FIG. 5C, tends to shift into a mode of operation that provides a higher switching voltage, $V_{SW}$, at the switching voltage output 26 for a corresponding lower magnitude scaled parallel amplifier output current estimate, $I_{PARA\_AMP\_SENSE}$, because the effect is to lower the threshold points at which each of the shunt level indication 150C, the series level indication 152C, the first boost level indication 154C, or the second boost level indication 156C transitions from being de-asserted to being asserted due to the feedback delay compensation signal 854, $I_{FEEDBACK\_TC}$. As a result, the addition of the feedback delay compensation signal 854, $I_{FEEDBACK\_TC}$, to form the compensated parallel amplifier circuit output current estimate, $I_{PAWA\_COMP}'$, is to cause the first state machine, depicted in FIG. 5C, to advance in time to the point at which the first state machine of the logic circuit 148C transitions from the shunt output mode 188C to the series output mode 190C in response to an increase in the magnitude of the $V_{RAMP}$ signal, where the increase in the magnitude of the $V_{RAMP}$ signal indicates that the target voltage for the power amplifier supply voltage, $V_{CC}$, will be increased. Because the feedback delay compensation signal 854, $I_{FEEDBACK\_TC}$, provides an earlier indication that the target voltage for the power amplifier supply voltage, $V_{CC}$, is being increased, based on the positive slope of the derivative of the $V_{RAMP}$ signal, the feedback delay compensation signal 854, $I_{FEEDBACK\_TC}$, compensates for the feedback delay associated with the generation of the scaled parallel amplifier output current estimate, $I_{PARA\_AMP\_SENSE}$, by lowering the effective threshold level of the series level threshold 126, which is provided as an input to the positive terminal of the second comparator 142. Similarly, in the case where the slope of the derivative of the $V_{RAMP}$ signal is negative, the feedback delay compensation signal 854, $I_{FEEDBACK\_TC}$, will lower the magnitude of the compensated parallel amplifier circuit output current estimate, $I_{PAWA\_COMP}'$. As a result, the transition from the series output mode 190C to the shunt output mode 188A for a particular magnitude of the scaled parallel amplifier output current estimate, $I_{PARA\_AMP\_SENSE}$, occurs earlier than if the feedback delay compensation signal 854, $I_{FEEDBACK\_TC}$, was not used to form the compensated parallel amplifier circuit output current estimate, $I_{PAWA\_COMP}$. Because the negative slope of the derivative of the $V_{RAMP}$ signal provides an earlier indication that the target voltage for the power amplifier supply voltage, $V_{CC}$, is being decreased, the feedback delay compensation signal 854, $I_{FEEDBACK\_TC}$, compensates for the feedback delay associated with the generation of the scaled parallel amplifier output current estimate, $I_{PARA\_AMP\_SENSE}$, by raising the effective threshold level of the series level threshold 126, which is provided as an input to the positive terminal of the first comparator 140. The effect is to advance in time when the first state machine of the logic circuit 148C transitions from the series output mode 190C to the shunt output mode 188C in response to the decrease in the magnitude of the $V_{RAMP}$ signal, where the decrease in the magnitude of the $V_{RAMP}$ signal indicates that the target voltage for the power amplifier supply voltage, $V_{CC}$, is decreasing. As a result, the switching voltage, $V_{SW}$, will be lowered sooner in response to the $V_{RAMP}$ signal decreasing in value than if the feedback delay compensation signal 854, $I_{FEEDBACK\_TC}$, was not present, which reduces the average current sourced and sunk by the parallel amplifier 35.

Figure 3L:
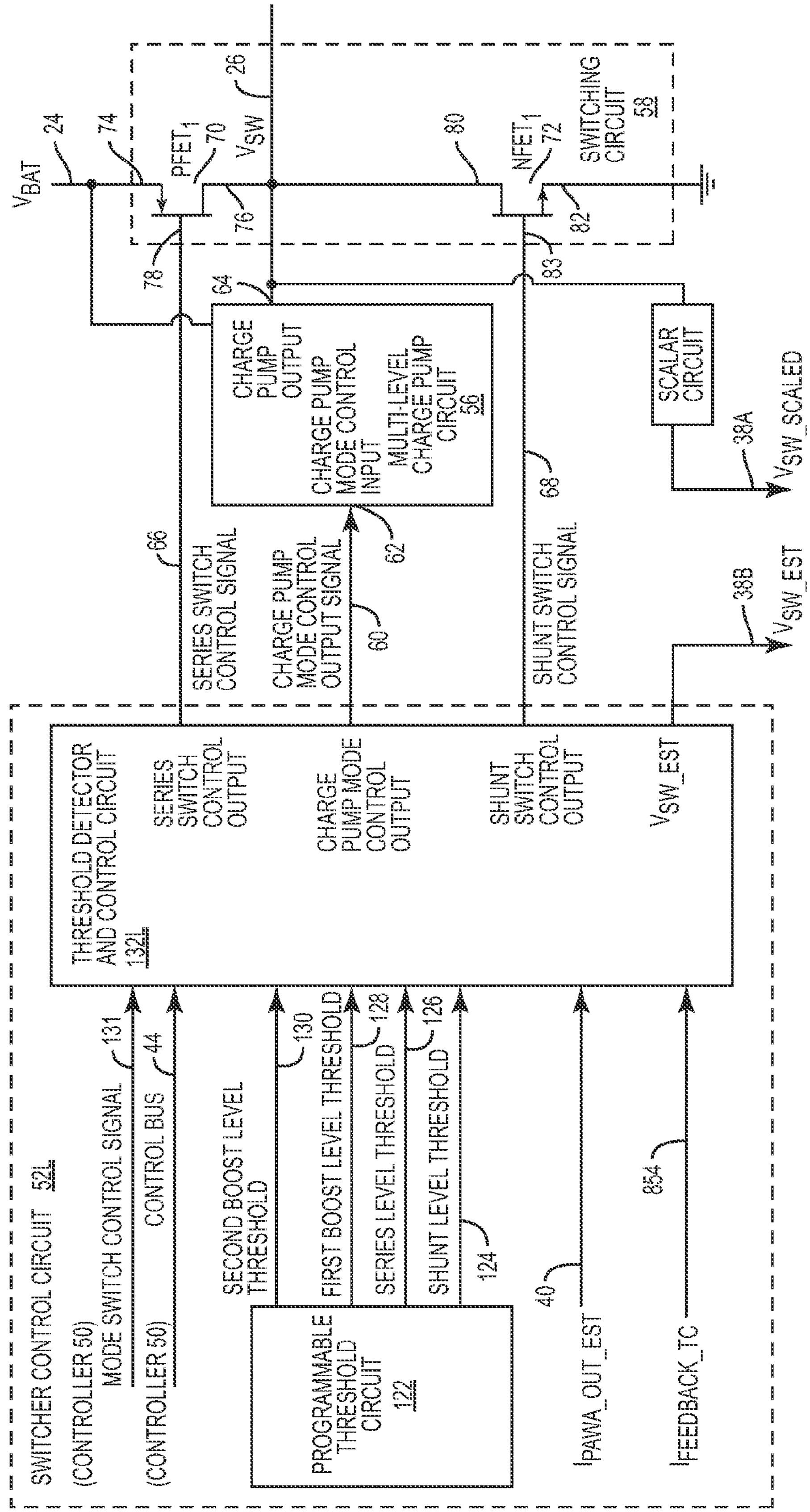
FIG. 3L depicts an embodiment of a switcher control circuit for a multi-level charge pump buck converter having feedback compensation.
Figure 4L:
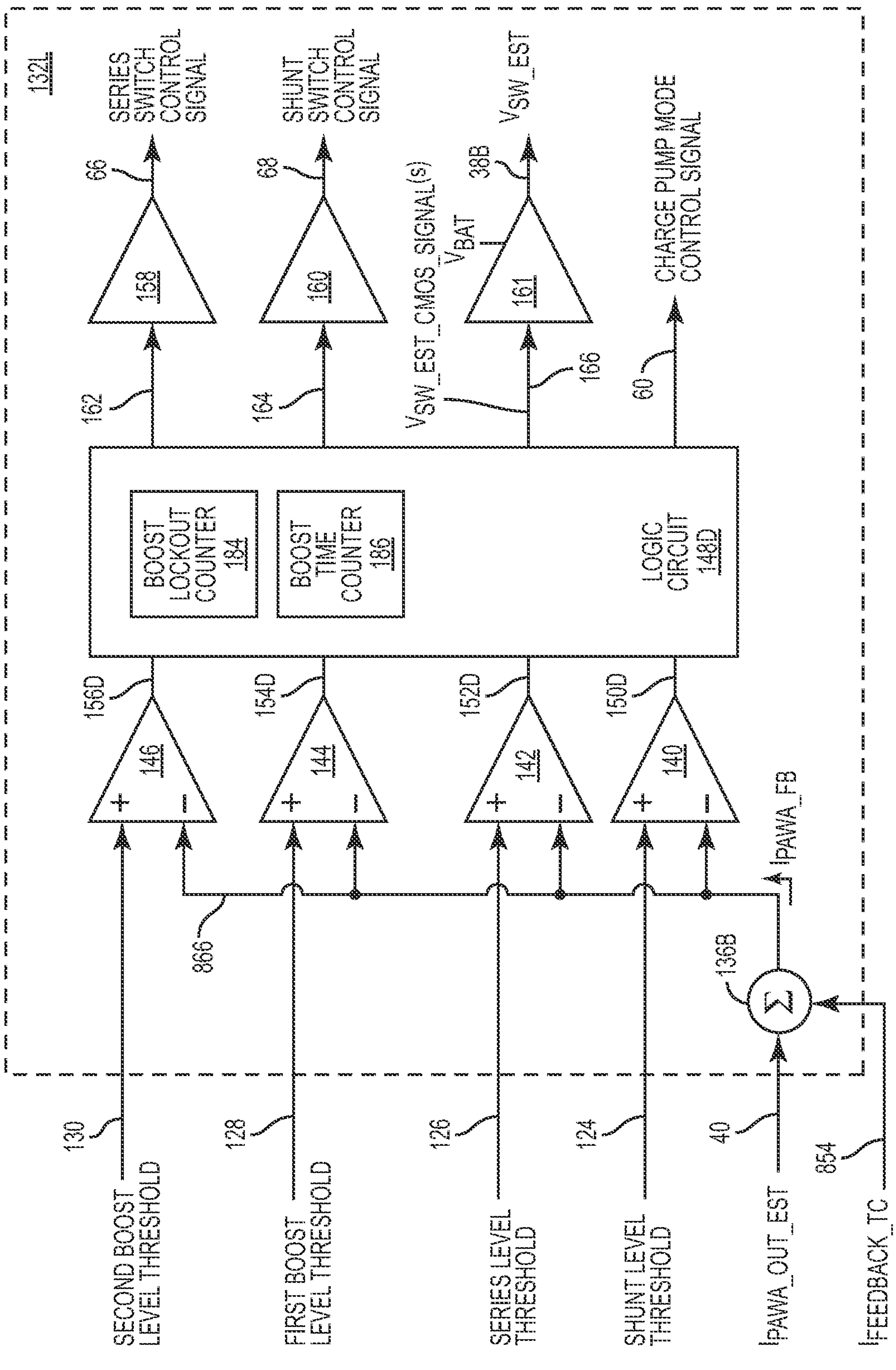
FIG. 4L depicts another embodiment of a threshold detector and control circuit of a multi-level charge pump buck converter that includes feedback compensation.

Although FIG. 38A depicts the multi-level charge pump buck converter 12Q as having a $V_{OFFSET}$ loop circuit 41, some embodiments of the multi-level charge pump buck converter 12Q may not include a $V_{OFFSET}$ loop circuit 41. For example, in the case where the coupling circuit 18 is a wire, the offset voltage, $V_{OFFSET}$, generated across the coupling circuit 18 is approximately zero. By way of example, and not by limitation, for an embodiment of the multi-level charge pump buck converter 12Q that does not include the $V_{OFFSET}$ loop circuit 41, the multi-level charge pump buck converter 12Q may include a switcher control circuit 52 similar to the switcher control circuit 52L, depicted in FIG. 3L. The switcher control circuit 52L, depicted in FIG. 3L, is similar in form and function to the switcher control circuit 52D, depicted in FIG. 3D. However, unlike the switcher control circuit 52D, depicted in FIG. 3D, the switcher control circuit 52L includes a threshold and control circuit 132L configured to receive the feedback delay compensation signal 854, $I_{FEEDBACK\_TC}$. FIG. 4L depicts an embodiment of the threshold and control circuit 132L that is similar in form and function to the embodiment of the threshold and control circuit 132D, depicted in FIG. 4D. However, unlike the threshold and control circuit 132D depicted in FIG. 4D, the threshold and control circuit 132L, depicted in FIG. 4L, includes a summer circuit 136B configured to receive the feedback delay compensation signal 854, $I_{FEEDBACK\_TC}$, and the parallel amplifier circuit output current estimate 40, $I_{PAWA\_OUT\_EST}$. The summer circuit 136B adds the feedback delay compensation signal 854, $I_{FEEDBACK\_TC}$, and the parallel amplifier circuit output current estimate 40, $I_{PAWA\_OUT\_EST}$, to generate a feedback compensated parallel amplifier circuit estimate 866, $I_{PAWA\_FB}$, which may be used as a composite feedback signal for the first comparator 140, the second comparator 142, the third comparator 144, and the fourth comparator 146. In addition, the feedback compensated parallel amplifier circuit estimate 866, $I_{PAWA\_FB}$, is coupled to the negative terminal of the first comparator 140, the second comparator 142, the third comparator 144, and the fourth comparator 146, respectively. The threshold and control circuit 132L includes the logic circuit 148D. The operation of the first state machine and the second state machine of the logic circuit 148D is changed by the addition of the feedback delay compensation signal 854, $I_{FEEDBACK\_TC}$, to form the feedback compensated parallel amplifier circuit estimate 866, $I_{PAWA\_FB}$. For example, unlike the operation of the first state machine, depicted in FIG. 5D, and the second state machine, depicted in FIG. 6D, the first state machine, depicted in FIG. 5L, and the second state machine, depicted in FIG. 6L, of logic circuit 148D as used by the threshold detector and control circuit 132L, depicted in FIG. 4L, transition between the operational states of second state machine the based on the feedback compensated parallel amplifier circuit estimate 866, $I_{PAWA\_FB}$, instead of the parallel amplifier circuit output current estimate 40, $I_{PAWA\_OUT\_EST}$.

Figure 5L:
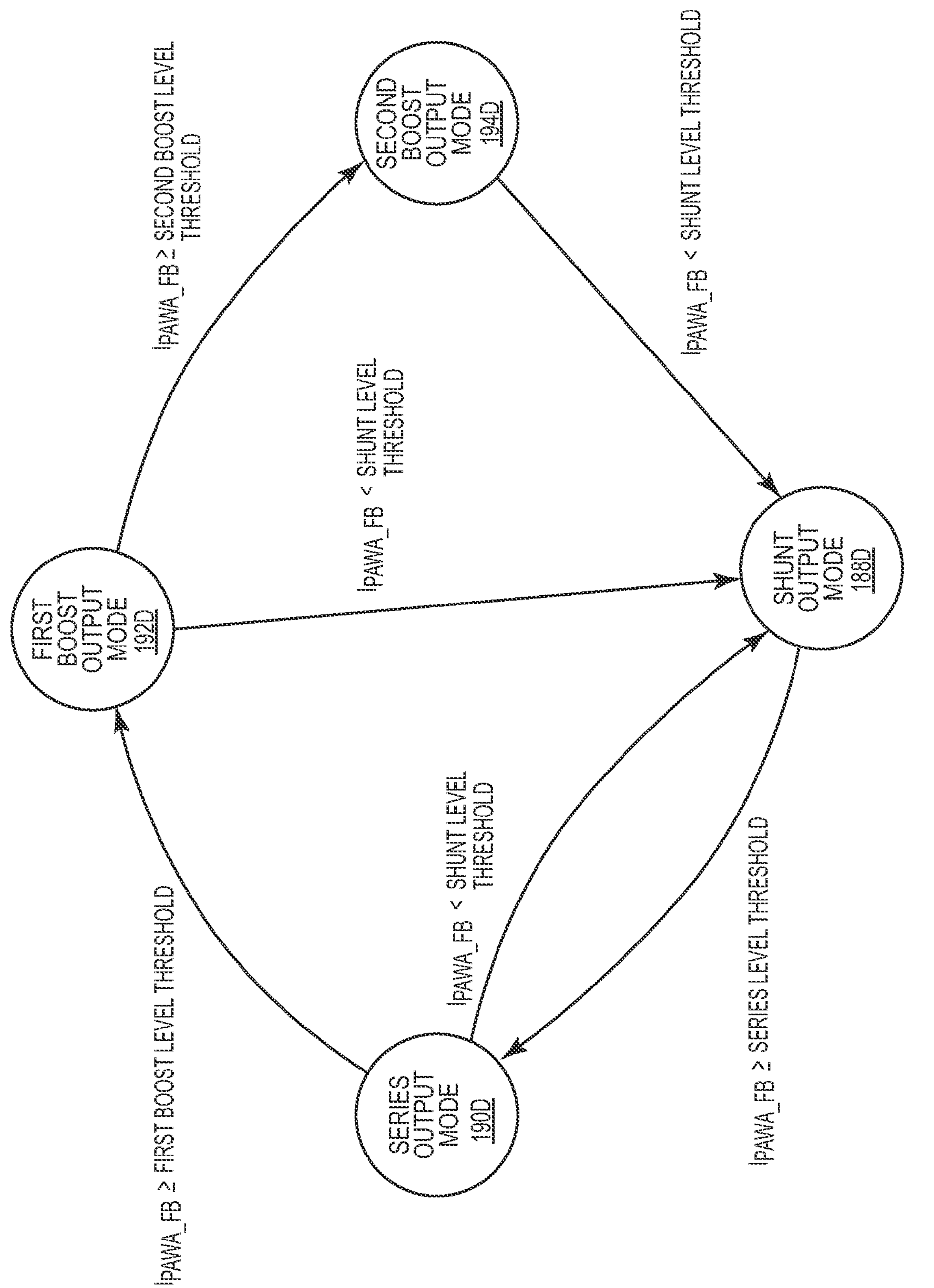
FIG. 5L depicts an embodiment of a first state machine of the threshold detector and control circuit of FIG. 4L.

As an example, operation of the first state machine of the logic circuit 148D of the threshold and control circuit 132L, depicted in FIG. 4L, is depicted in FIG. 5L. As depicted in FIG. 5L, the transitions between the shunt output mode 188D, the series output mode 190D, the first boost output mode 192D, and the second boost output mode 194D, of the first state machine, depicted in FIG. 5L, are dependent upon the feedback compensated parallel amplifier circuit estimate 866, $I_{PAWA\_FB}$. For example, in the first state machine, depicted in FIG. 5L, the logic circuit 148D transitions the first state machine from the shunt output mode 188D to the series output mode 190D when the feedback compensated parallel amplifier circuit estimate 866, $I_{PAWA\_FB}$, is greater than or equal to the series level threshold 126. Similarly, the logic circuit 148D transitions the first state machine from the series output mode 190D to the shunt output mode 188D when the feedback compensated parallel amplifier circuit estimate 866, $I_{PAWA\_FB}$, is less than the shunt level threshold 124. The logic circuit 148D transitions the first state machine from the series output mode 190D to the first boost output mode 192D when the feedback compensated parallel amplifier circuit estimate 866, $I_{PAWA\_FB}$, is greater than or equal to the first boost level threshold 128. The logic circuit 148D transitions the first state machine from the first boost output mode 192D to the second boost output mode 194D when the feedback compensated parallel amplifier circuit estimate 866, $I_{PAWA\_FB}$, is greater than or equal to the second boost level threshold 130. The logic circuit 148D transitions the first state machine from the first boost output mode 192D to the shunt output mode 188D when the feedback compensated parallel amplifier circuit estimate 866, $I_{PAWA\_FB}$, is less than the shunt level threshold 124. Similarly, the logic circuit 148D transitions the first state machine from the second boost output mode 194D to the shunt output mode 188D when the feedback compensated parallel amplifier circuit estimate 866, $I_{PAWA\_FB}$, is less than the shunt level threshold 124. Otherwise, the operation of the first state machine of the logic circuit 148D, with respect to the shunt output mode 188D, the series output mode 190D, the first boost output mode 192D, and the second boost output mode 194D, is substantially the same as the operation of the first state machine, depicted in FIG. 5D.

Figure 6L:
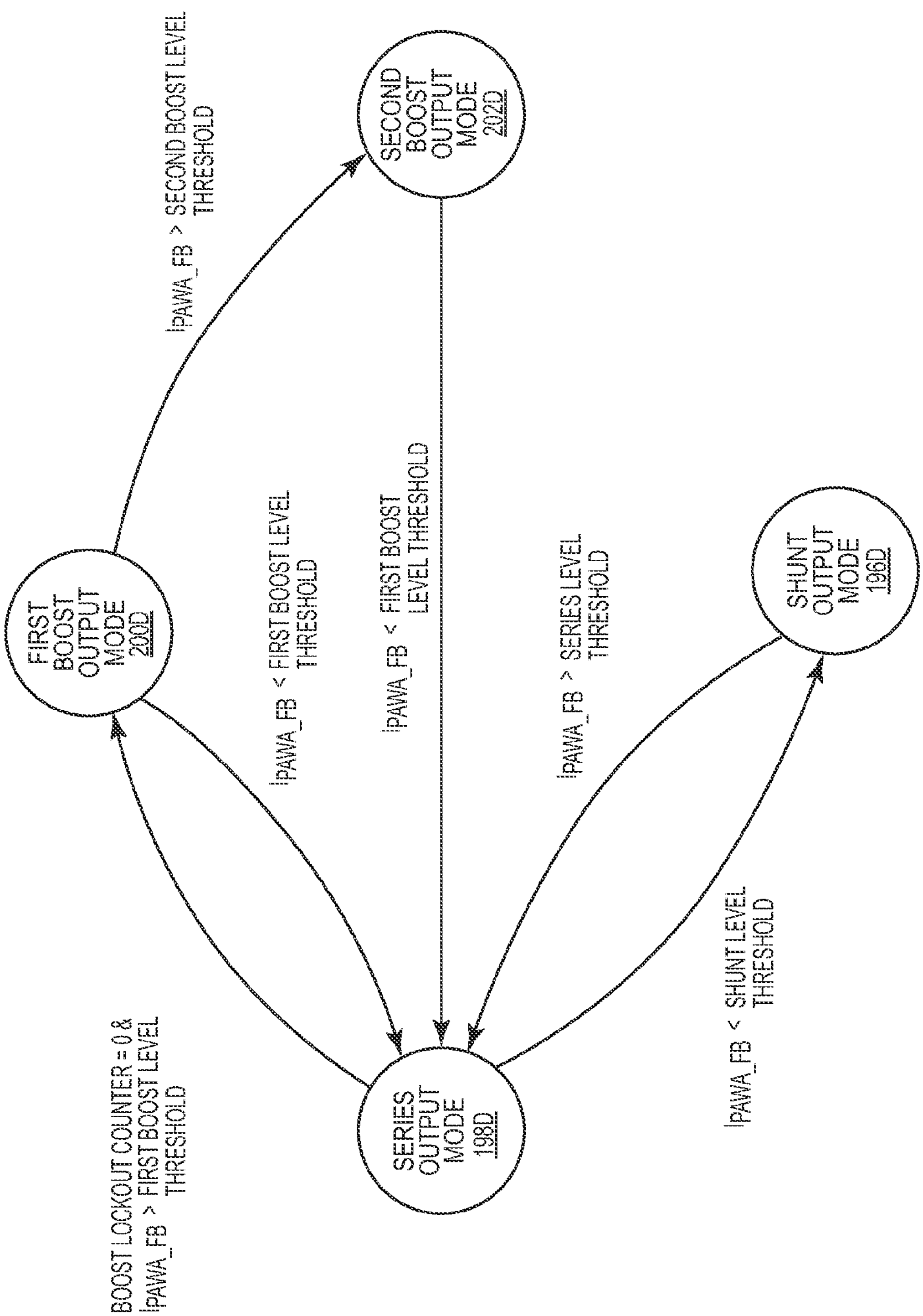
FIG. 6L depicts an embodiment of a second state machine of the threshold detector and control circuit of FIG. 4L.

Similarly, as another example, the second machine of the logic circuit 148D of the threshold and control circuit 132L, depicted in FIG. 4L, is depicted in FIG. 6L. As depicted in FIG. 6L, the transitions between the shunt output mode 196D, the series output mode 198D, the first boost output mode 200D, and the second boost output mode 202D of the second state machine are dependent upon the feedback compensated parallel amplifier circuit estimate 866, $I_{PAWA\_FB}$.

For example, in the second state machine depicted in FIG. 6L, the logic circuit 148D transitions the second state machine from the shunt output mode 196D to the series output mode 198D when the feedback compensated parallel amplifier circuit estimate 866, $I_{PAWA\_FB}$, is greater than or equal to the series level threshold 126. Similarly, the logic circuit 148D transitions the second state machine from the series output mode 198D to the shunt output mode 196D when the feedback compensated parallel amplifier circuit estimate 866, $I_{PAWA\_FB}$, is less than the shunt level threshold 124. The logic circuit 148D transitions the second state machine from the series output mode 198D to the first boost output mode 200D when the feedback compensated parallel amplifier circuit estimate 866, $I_{PAWA\_FB}$, is greater than or equal to the first boost level threshold 128 and the boost lockout counter=0. The logic circuit 148D transitions the second state machine from the first boost output mode 200D to the series output mode 198D when the feedback compensated parallel amplifier circuit estimate 866, $I_{PAWA\_FB}$, is less than the first boost level threshold 128. The logic circuit 148D transitions the second state machine from the first boost output mode 200D to the second boost output mode 202D when feedback compensated parallel amplifier circuit estimate 866, $I_{PAWA\_FB}$, is greater than or equal to the second boost level threshold 130. The logic circuit 148D transitions the second state machine from the second boost output mode 202D to the series output mode 198D when the feedback compensated parallel amplifier circuit estimate 866, $I_{PAWA\_FB}$, is less than the first boost level threshold 128. Otherwise, the operation of the second state machine of the logic circuit 148D of threshold detector and control circuit 132L, depicted in FIG. 6L, with respect to the shunt output mode 196D, the series output mode 198D, the first boost output mode 200D, and the second boost output mode 202D, is substantially the same as the operation of the second state machine depicted in FIG. 6D. Because operation of the shunt output mode 196D, the series output mode 198D, the first boost output mode 200D, and the second boost output mode 202D have been otherwise previously described in detail with respect to the operation of the second state machine depicted in FIG. 6D, a detailed discussion of the operation of the shunt output mode 196D, the series output mode 198D, the first boost output mode 200D, and the second boost output mode 202D are here omitted.

Operationally, when the slope of the derivative of the $V_{RAMP}$ signal is positive, the feedback delay compensation signal 854, $I_{FEEDBACK\_TC}$, is positive, which increases the magnitude of the feedback compensated parallel amplifier circuit estimate 866, $I_{PAWA\_FB}$. As a result, each of the shunt level indication 150D, the series level indication 152D, the first boost level indication 154D, or the second boost level indication 156D will tend to transition from being de-asserted to being asserted when the magnitude of the scaled parallel amplifier output current estimate, $I_{PARA\_AMP\_SENSE}$, is lower. Thus, when the $V_{RAMP}$ signal is increasing in magnitude, the switcher control circuit 52L, depicted in FIG. 3L, tends to increase the switching voltage, $V_{SW}$, sooner than if the feedback delay compensation signal 854, $I_{FEEDBACK\_TC}$, was not added to the parallel amplifier circuit output current estimate 40, $I_{PAWA\_OUT\_EST}$, to form the feedback compensated parallel amplifier circuit estimate 866, $I_{PAWA\_FB}$. Similarly, when the slope of the derivative of the $V_{RAMP}$ signal is negative, the feedback delay compensation signal 854, $I_{FEEDBACK\_TC}$, will decrease the magnitude of the feedback compensated parallel amplifier circuit estimate 866, $I_{PAWA\_FB}$. As a result, each of the shunt level indication 150D, the series level indication 152D, the first boost level indication 154D, or the second boost level indication 156D will tend to transition from being asserted to being de-asserted when the magnitude of the scaled parallel amplifier output current estimate, $I_{PARA\_AMP\_SENSE}$, is lower. Accordingly, the first state machine, depicted in FIG. 5L, and the second state machine, depicted in FIG. 6L, tends to shift to a mode of operation that provides a lower switching voltage, $V_{SW}$, at the switching voltage output 26 at a corresponding lower magnitude of the parallel amplifier circuit output current estimate 40, $I_{PAWA\_OUT\_EST}$, because the feedback delay compensation signal 854, $I_{FEEDBACK\_TC}$, provides an early indication of the direction in which the target voltage level for the power amplifier supply voltage, $V_{CC}$, to the multi-level charge pump buck converter 12Q.

In some embodiments of the switcher control circuit 52 of the multi-level charge pump buck converter 12Q, depicted in FIG. 38A, the negative terminal of the first comparator 140, the second comparator 142, the third comparator 144, and the fourth comparator 146 do not all receive a composite feedback signal that is adjusted based on the feedback delay compensation signal 854, $I_{FEEDBACK\_TC}$. In other words, some embodiments of the threshold detector and control circuits of the embodiments of the switcher control circuit 52 may provide a first control signal to the negative terminal of each of the first comparator 140 and the second comparator 142, and a second signal to the negative terminal of the third comparator 144, and the fourth comparator 146, where the level of the second control signal is independent of the feedback delay compensation signal 854, $I_{FEEDBACK\_TC}$.

Figure 3M:
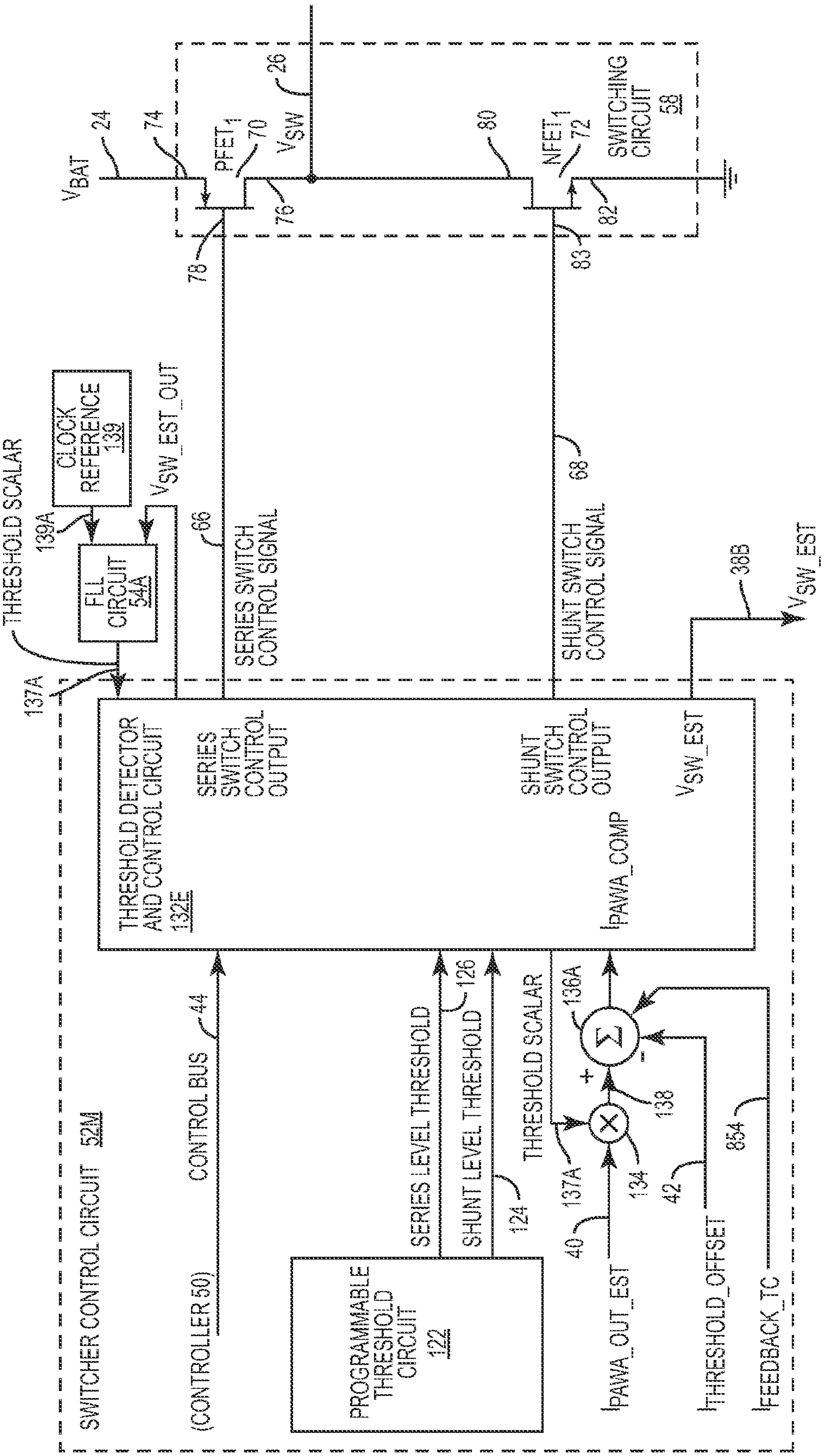
FIG. 3M depicts an embodiment of a switcher control circuit for a buck converter having feedback compensation.
Figure 3N:
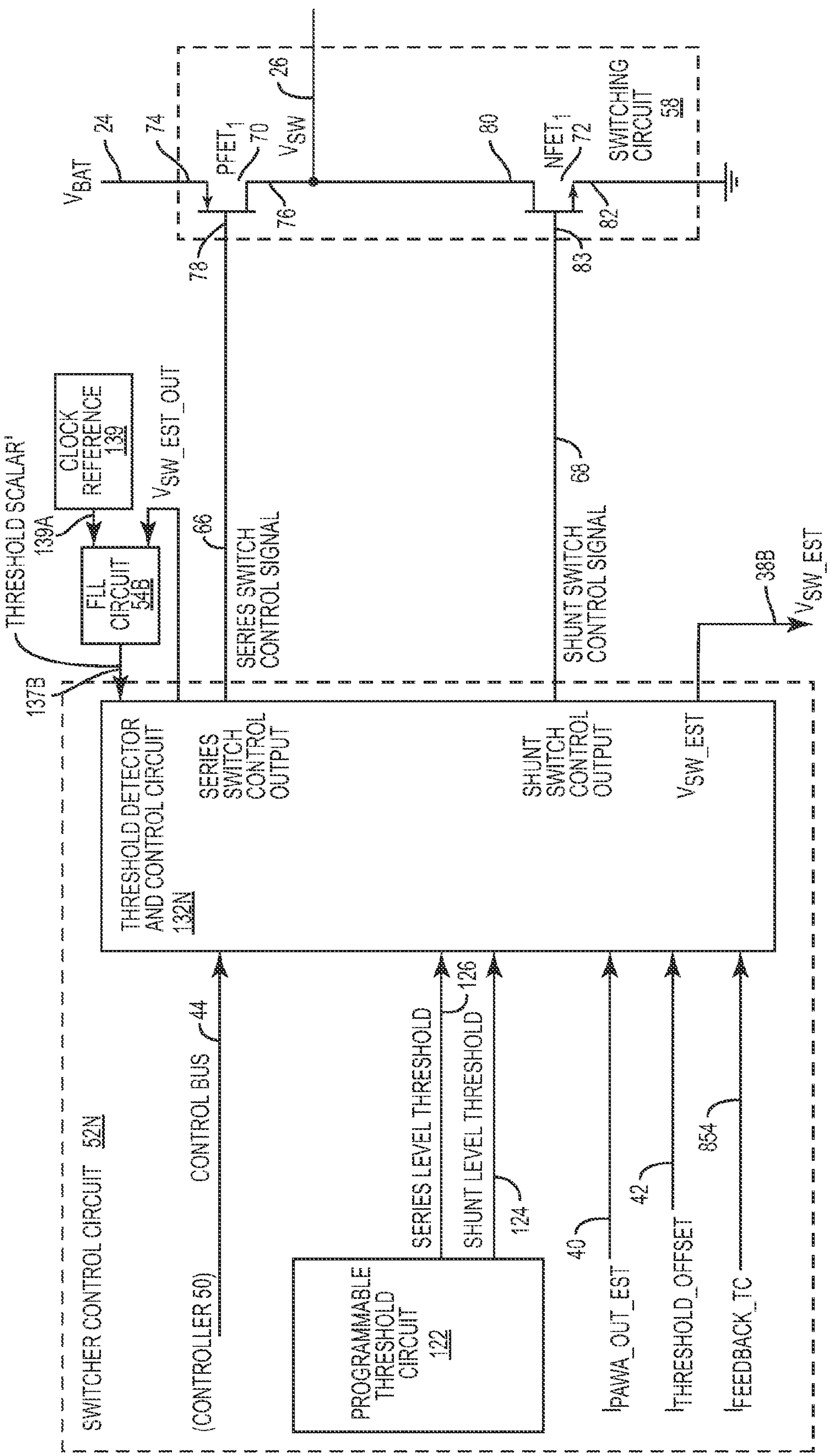
FIG. 3N depicts an embodiment of a switcher control circuit for a buck converter having feedback compensation.
Figure 3P:
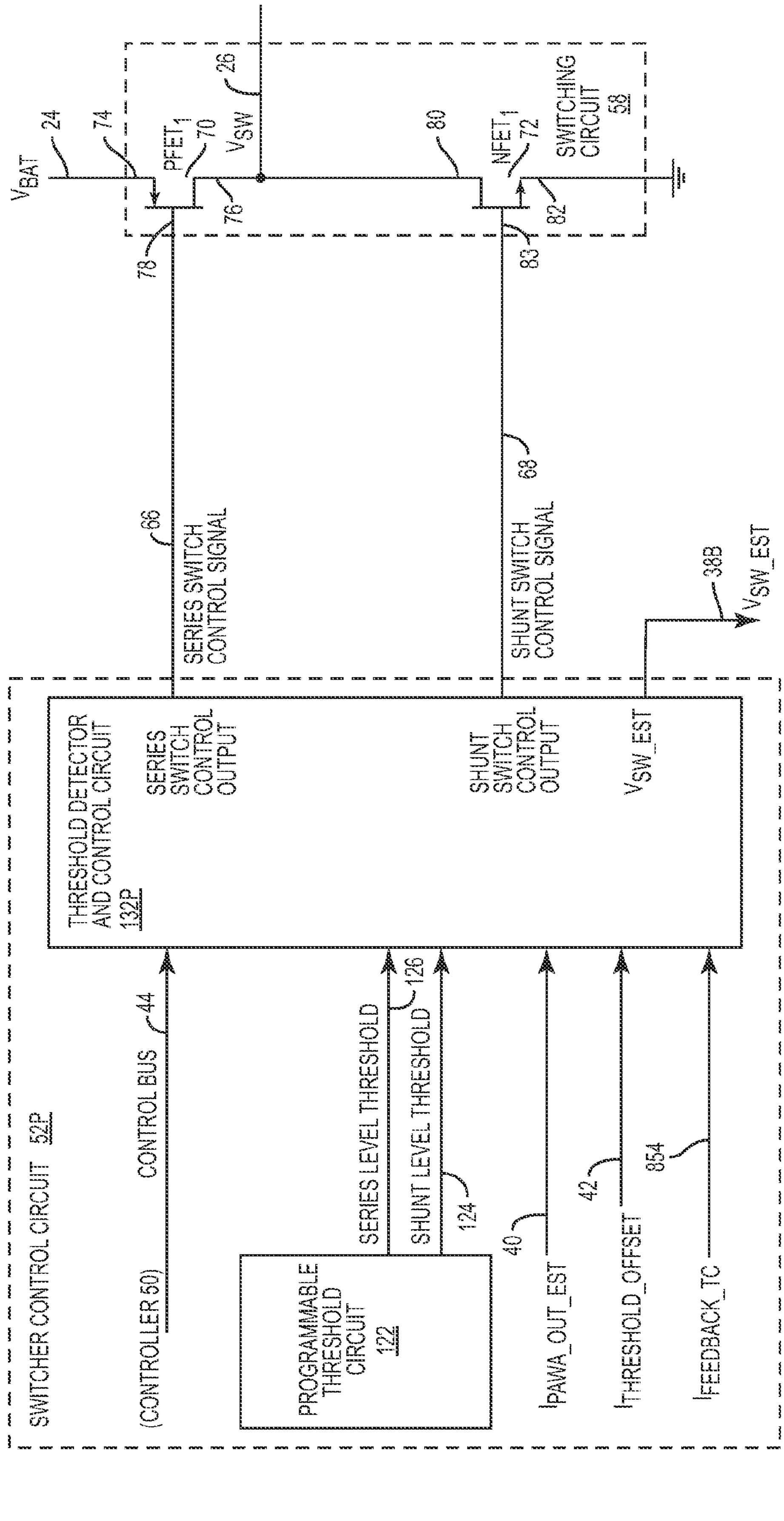
FIG. 3P depicts an embodiment of a switcher control circuit for a buck converter having feedback compensation.
Figure 3Q:
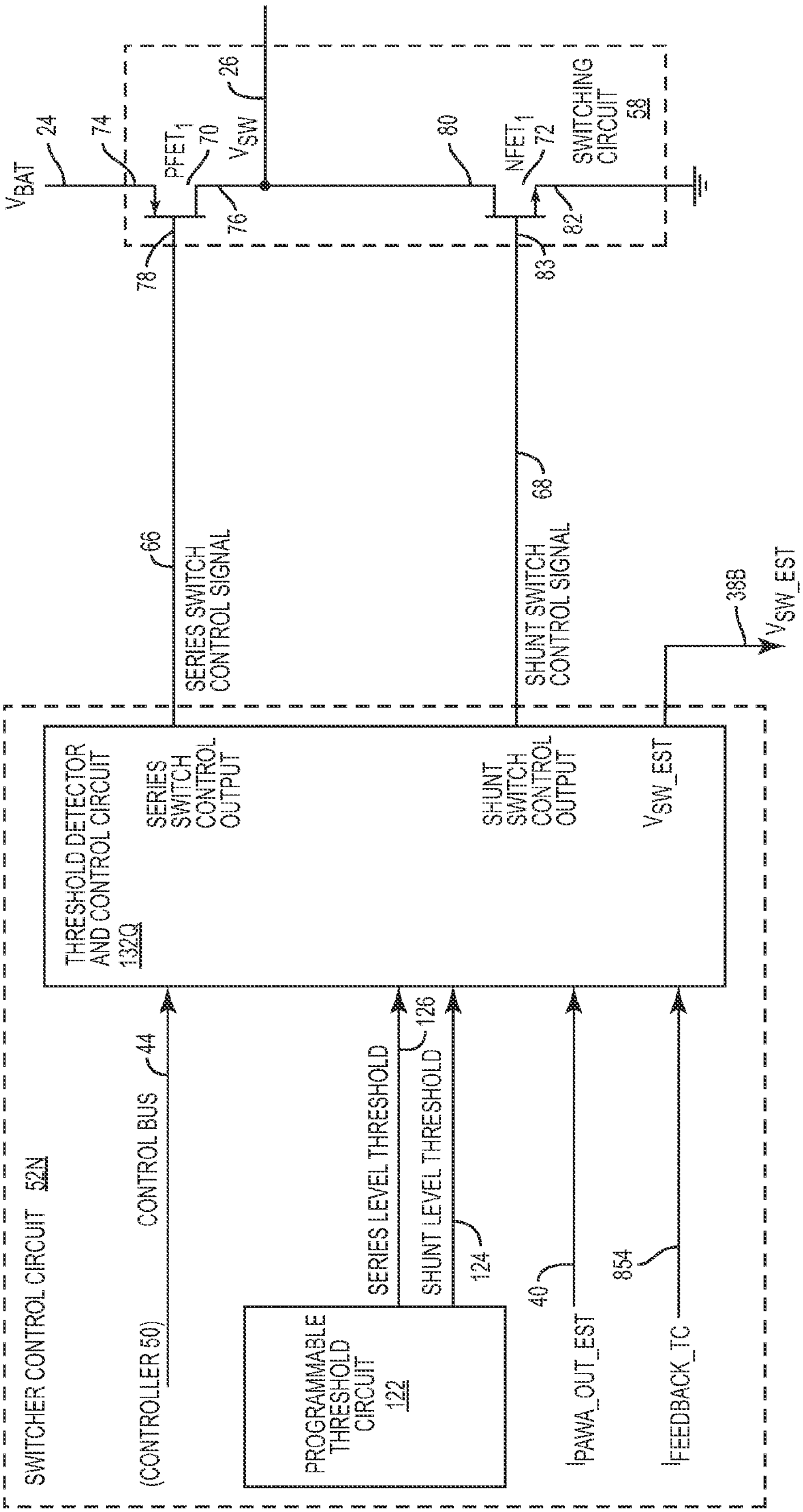
FIG. 3Q depicts an embodiment of a switcher control circuit for a buck converter having feedback compensation.
Figure 3R:
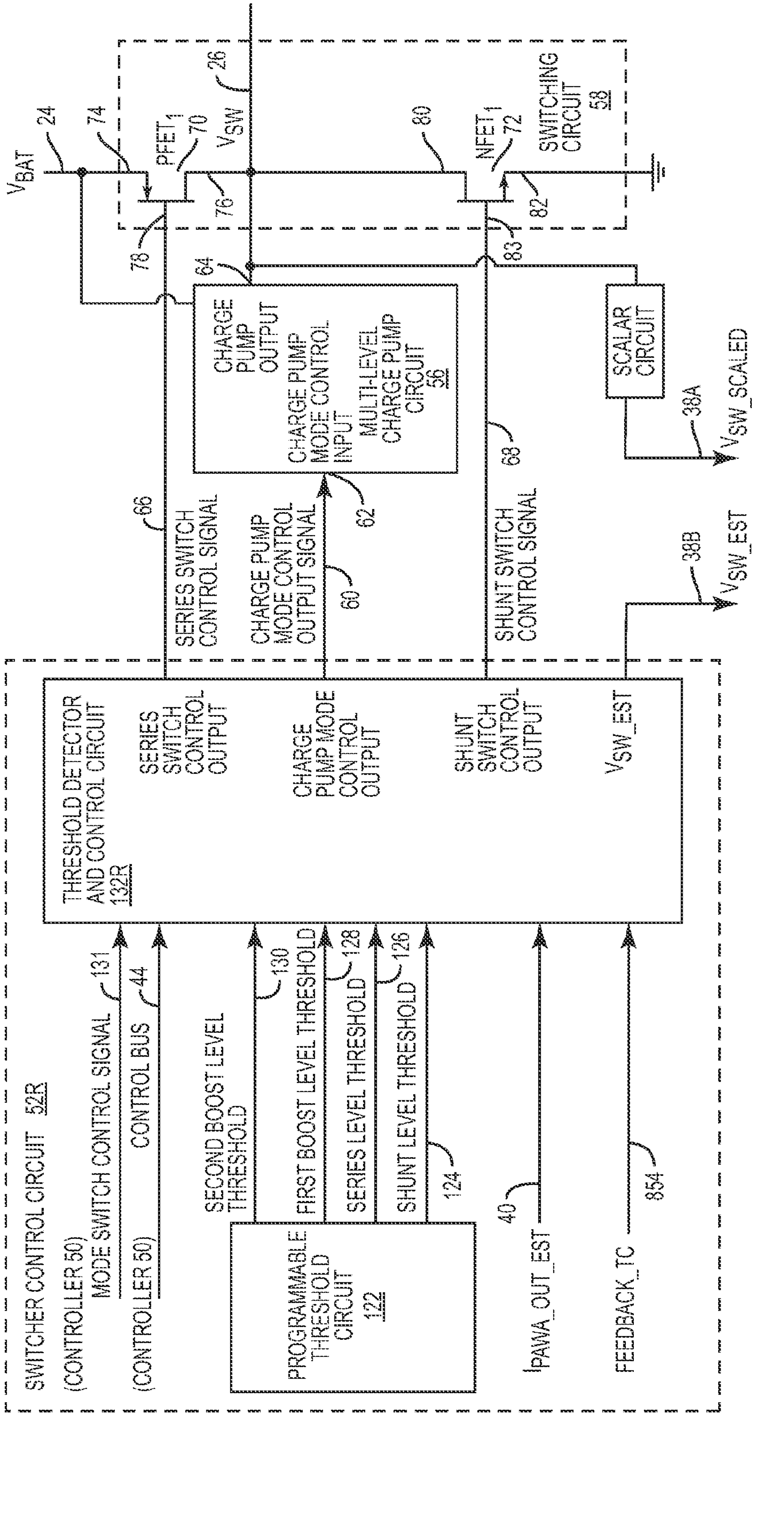
FIG. 3R depicts an embodiment of a switcher control circuit for a multi-level charge pump buck converter having feedback compensation.

As a non-limiting example, some embodiments of the switcher control circuit 52 of the multi-level charge pump buck converter 12Q may be similar to the switcher control circuit 52R depicted in FIG. 3R. The switcher control circuit 52R, depicted in FIG. 3R, may be similar in form and function to the switcher control circuit 52L depicted in FIG. 3L. However, unlike the switcher control circuit 52L depicted in FIG. 3L, the switcher control circuit 52R, depicted in FIG. 3R, includes the threshold detector and control circuit 132R depicted in FIG. 4R.

Figure 5R:
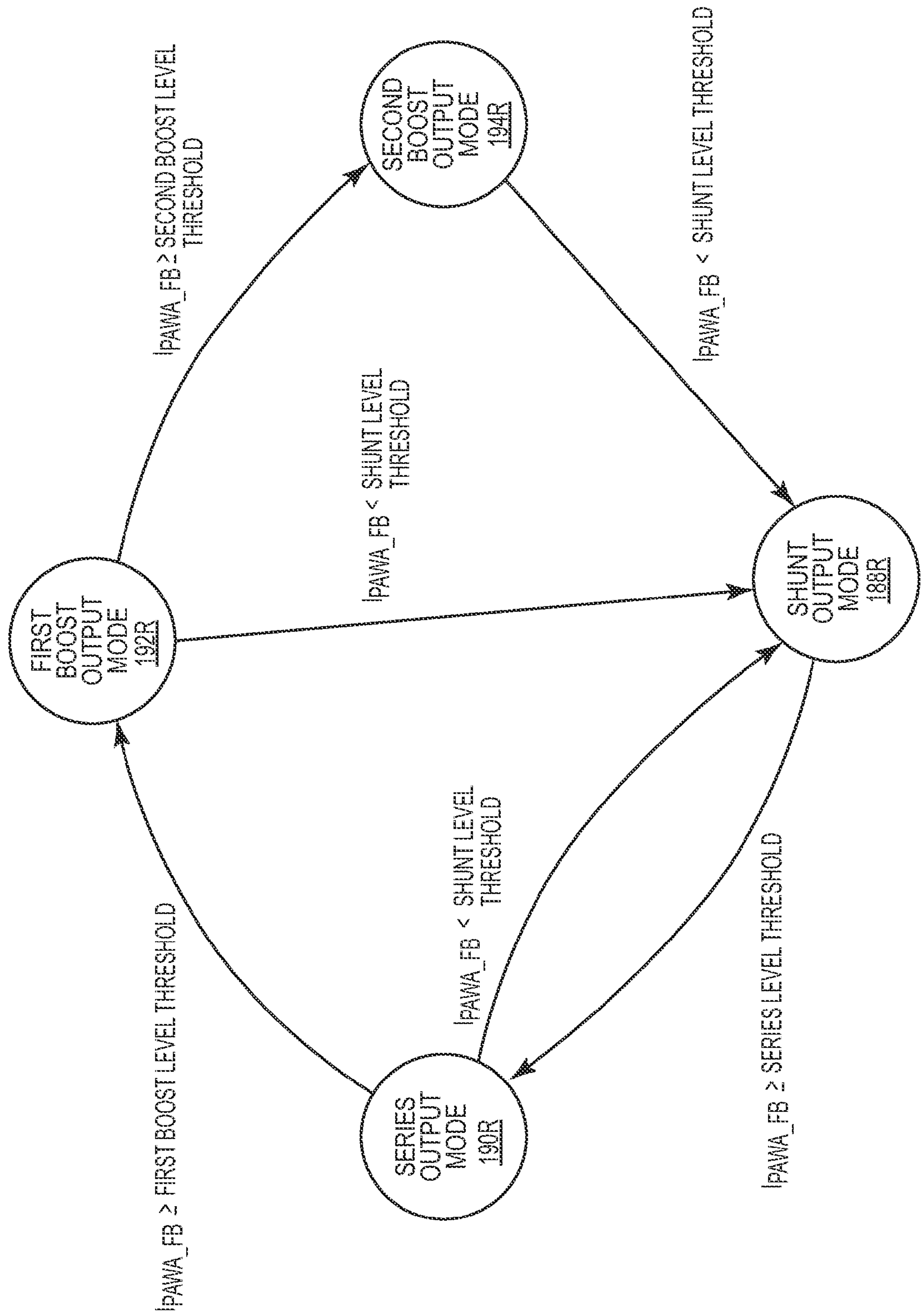
FIG. 5R depicts an embodiment of a first state machine of the threshold detector and control circuit of FIG. 4R.
Figure 6R:
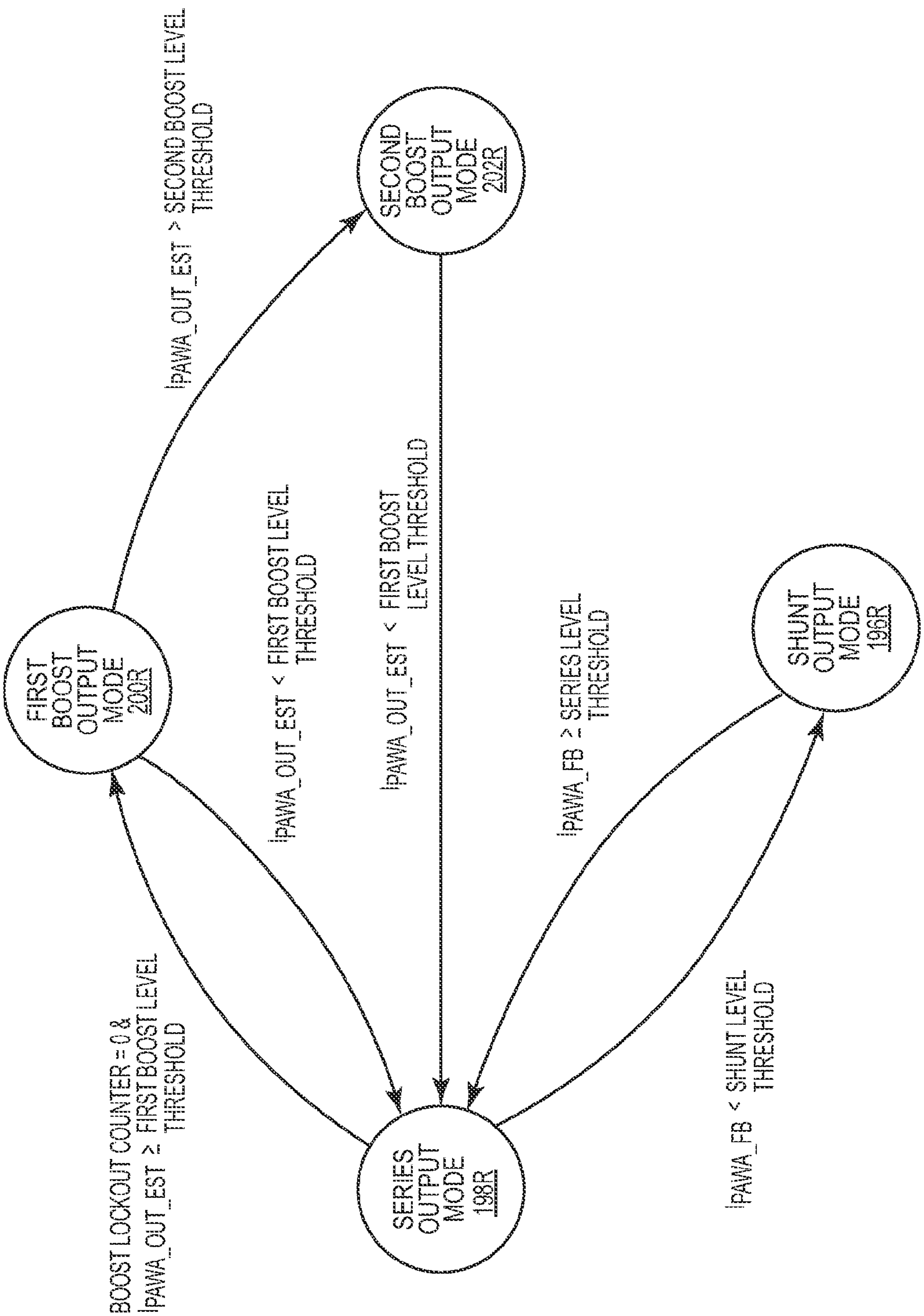
FIG. 6R depicts an embodiment of a second state machine of the threshold detector and control circuit of FIG. 4R.

The threshold detector and control circuit 132R is similar in form and function to the threshold detector and control circuit 132L except the negative terminal of the first comparator 140, the second comparator 142, the third comparator 144, and the fourth comparator 146 are not each coupled to the feedback compensated parallel amplifier circuit estimate 866, $I_{PAWA\_FB}$. Instead, the negative terminal of each of the first comparator 140 and the second comparator 142 receives the feedback compensated parallel amplifier circuit estimate 866, $I_{PAWA\_FB}$. However, the negative terminal of the third comparator 144 and the fourth comparator 146 receive the parallel amplifier circuit output current estimate 40, $I_{PAWA\_OUT\_EST}$. In addition, the logic circuit 148D is replaced by the logic circuit 148R. The logic circuit 148R is similar in form and function to the logic circuit 148D. The logic circuit 148R includes a boost lockout counter 184 and a boost time counter 186, as described above. The first state machine associated with the logic circuit 148R is depicted in FIG. 5R. The second state machine associated with the logic circuit 148R is depicted in FIG. 6R.

As a result, when the feedback compensated parallel amplifier circuit estimate 866, $I_{PAWA\_FB}$, is greater than or equal to the shunt level threshold 124, the output of the first comparator 140 is set to a digital logic low state to assert the shunt level indication 150R. When the feedback compensated parallel amplifier circuit estimate 866, $I_{PAWA\_FB}$, is less than the shunt level threshold 124, the output of the first comparator 140 is set to a digital logic high state to de-assert the shunt level indication 150R. The shunt level indication 150R is provided as an input to the logic circuit 148R. Similarly, when the feedback compensated parallel amplifier circuit estimate 866, $I_{PAWA\_FB}$, is greater than or equal to the series level threshold 126, the output of the second comparator 142 is set to a digital logic low state to the series level indication 152R. However, when the feedback compensated parallel amplifier circuit estimate 866, $I_{PAWA\_FB}$, is less than the series level threshold 126, the output of the second comparator 142 is set to a digital logic high state to de-assert the series level indication 152R. The series level indication 152R is provided as an input to the logic circuit 148R.

In addition, when the parallel amplifier circuit output current estimate 40, $I_{PAWA\_OUT\_EST}$, is greater than the first boost level threshold 128, the output of the third comparator 146 is set to a digital logic low state to assert the first boost level indication 154R. When the parallel amplifier circuit output current estimate 40, $I_{PAWA\_OUT\_EST}$, is less than the first boost level threshold 128, the output of the third comparator 146 is set to a digital logic high state to de-assert the first boost level indication 154R. The first boost level indication 154R is provided as an input to the logic circuit 148R. Similarly, when the parallel amplifier circuit output current estimate 40, $I_{PAWA\_OUT\_EST}$, is greater than the second boost level threshold 130, the output of the fourth comparator 146 is set to a digital logic low state to assert the second boost level indication 156R. When the parallel amplifier circuit output current estimate 40, $I_{PAWA\_OUT\_EST}$, is less than the second boost level threshold 130, the output of the fourth comparator 146 is set to a digital logic high state to de-assert the second boost level indication 156R. The second boost level indication 156R is provided as an input to the logic circuit 148R.

As a result, the generation of the shunt level indication 150R and the series level indication 152R is affected by the magnitude of the feedback delay compensation signal 854, $I_{FEEDBACK\_TC}$, from the feedback delay compensation circuit 852. In the case where the $V_{RAMP}$ signal is increasing, the feedback delay compensation circuit 852 increases the value of the feedback compensated parallel amplifier circuit estimate 866, $I_{PAWA\_FB}$, such that a lower magnitude of the parallel amplifier circuit output current estimate 40, $I_{PAWA\_OUT\_EST}$, will trigger the shunt level indication 150R or the series level indication 152R. Thus, referring to the diagram of the first state machine associated with the logic circuit 148R, depicted in FIG. 5R, the feedback delay compensation signal 854, $I_{FEEDBACK\_TC}$, affects the condition for transitioning from the shunt output mode 188R to the series output mode 190R. In addition, the feedback delay compensation signal 854, $I_{FEEDBACK\_TC}$, affects the conditions for transitioning from the series output mode 190R, the first boost output mode 192R, and the second boost output mode 194R to the shunt output mode 188R. However, the feedback delay compensation signal 854, $I_{FEEDBACK\_TC}$, does not affect the condition for transitioning from the series output mode 190R to the first boost output mode 192R or the condition for transitioning from the first boost output mode 192R to the second boost output mode 194R.

The operation of the first state machine associated with the logic circuit 4R, depicted in FIG. 4R, will be described with continuing reference to FIG. 3R and FIG. 5R. In the shunt output mode 188R, the logic circuit 148R configures the series switch control output 162 such that the series switch 70 is in an open state (not conducting). The logic circuit 148R also configures the shunt switch control output 164 such that the shunt switch 72 is in a closed state (conducting). In addition, the logic circuit 148R configures the charge pump mode control signal 60 to instruct the multi-level charge pump circuit 56 to be in a charging mode of operation. As a result, the switching voltage output 26 of FIG. 3R is configured to provide a switching voltage, $V_{SW}$, substantially equal to ground. In response to assertion of the series level indication 152R, which indicates that the feedback compensated parallel amplifier circuit estimate 866, $I_{PAWA\_FB}$, is greater than or equal to the series level threshold 126, the logic circuit 148R configures the first state machine to transition to the series output mode 190R. Otherwise the state machine remains in the shunt output mode 188R.

In the series output mode 190R, the logic circuit 148R configures the series switch control output 162 such that the series switch 70 (FIG. 3R) is in a closed state (conducting). The logic circuit 148R also configures the shunt switch control output 164 such that the shunt switch 72 (FIG. 3R) is in an open state (not conducting). In addition, the logic circuit 148R configures the charge pump mode control signal 60 to instruct the multi-level charge pump circuit 56 to be in a charging mode of operation. As a result, the switching voltage output 26 of FIG. 3R is configured to provide a switching voltage, $V_{SW}$, substantially equal to the direct current (DC) voltage, $V_{BAT}$.

In response to de-assertion of the shunt level indication 150R, which indicates that feedback compensated parallel amplifier circuit estimate 866, $I_{PAWA\_FB}$, is less than the shunt level threshold 124, the logic circuit 148R configures the first state machine to transition to the shunt output mode 188R. However, in response to assertion of the first boost level indication 154R, which indicates that the parallel amplifier circuit output current estimate 40, $I_{PAWA\_OUT\_EST}$, is greater than or equal to the first boost level threshold 128, the logic circuit 148R configures the first state machine to transition to the first boost output mode 192R. Otherwise, the first state machine remains in the series output mode 190R.

In the first boost output mode 192R, the logic circuit 148R configures the series switch control output 162 such that the series switch 70 is in an open state (not conducting). The logic circuit 148R also configures the shunt switch control output 164 such that the shunt switch 72 is in an open state (not conducting). In addition, the logic circuit 148R configures the charge pump mode control signal 60 to instruct the multi-level charge pump circuit 56 to be in a first boost mode of operation to provide $1.5\times V_{BAT}$ at the charge pump output 64. As a result, the switching voltage output 26 of FIG. 3R is configured to provide a switching voltage, $V_{SW}$, substantially equal to $1.5\times V_{BAT}$. In response to de-assertion of the shunt level indication 150R, which indicates that the feedback compensated parallel amplifier circuit estimate 866, $I_{PAWA\_FB}$, is less than the shunt level threshold 124, the logic circuit 148R configures the first state machine to transition to the shunt output mode 188R. However, in response to assertion of the second boost level indication 156R, which indicates that the parallel amplifier circuit output current estimate 40, $I_{PAWA\_OUT\_EST}$, is greater than or equal to the second boost level threshold 130, the logic circuit 148R configures the first state machine to transition to the second boost output mode 194R. Otherwise, the first state machine remains in the first boost output mode 192R.

Figure 4M:
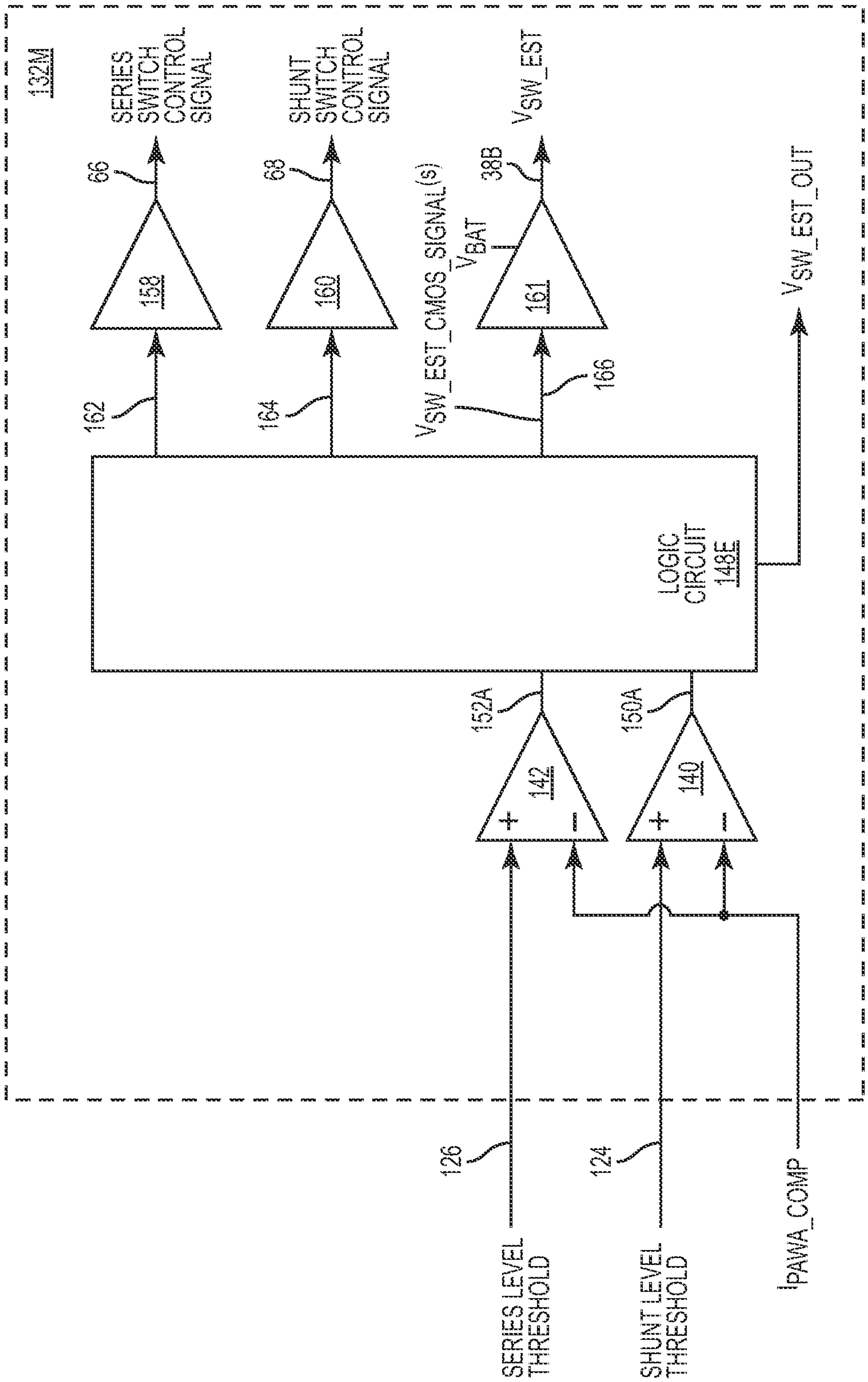
FIG. 4M depicts an embodiment of a threshold detector and control circuit of a buck converter that includes feedback compensation.
Figure 4N:
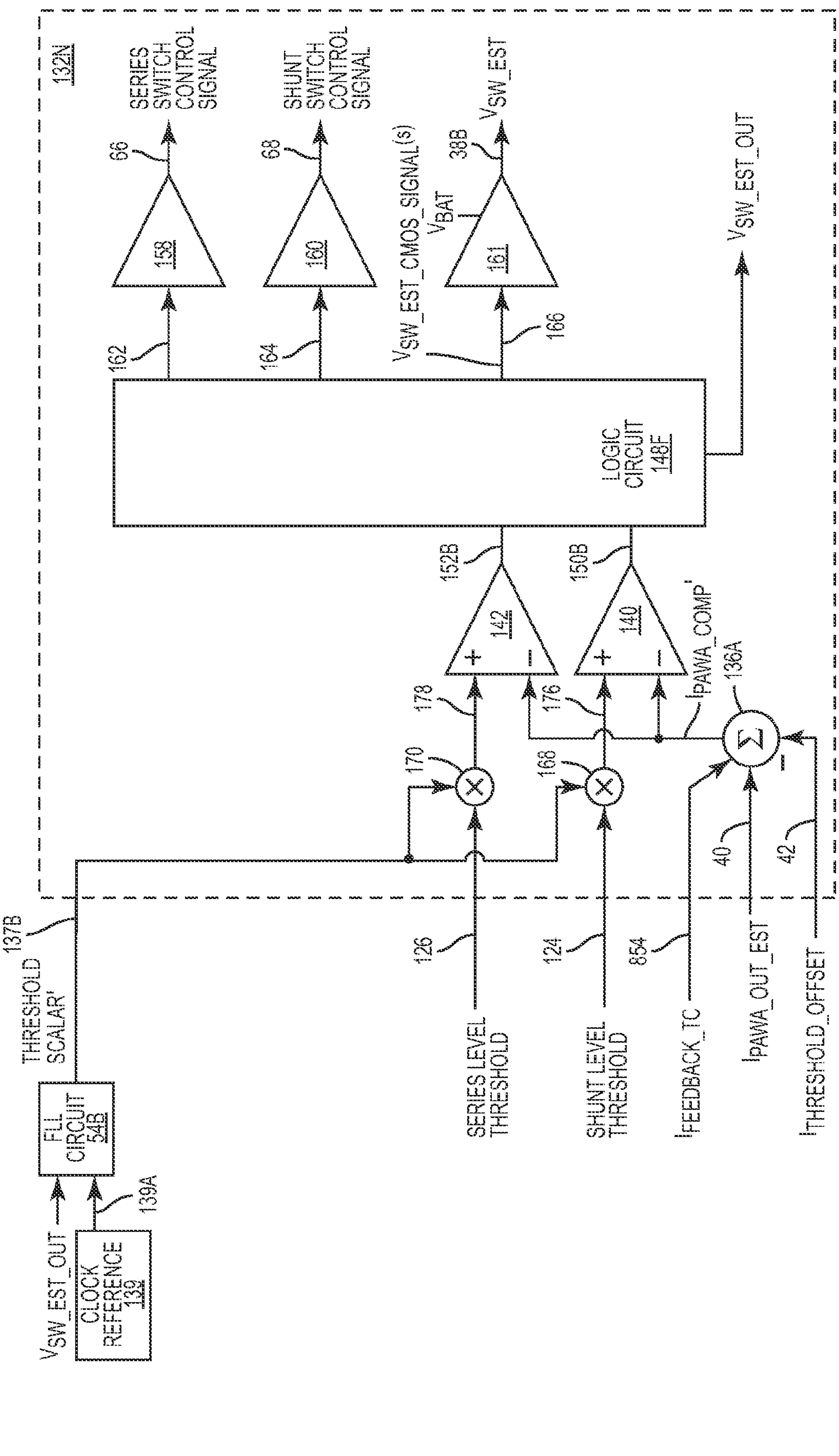
FIG. 4N depicts another embodiment of a threshold detector and control circuit of a buck converter that includes feedback compensation.
Figure 4P:
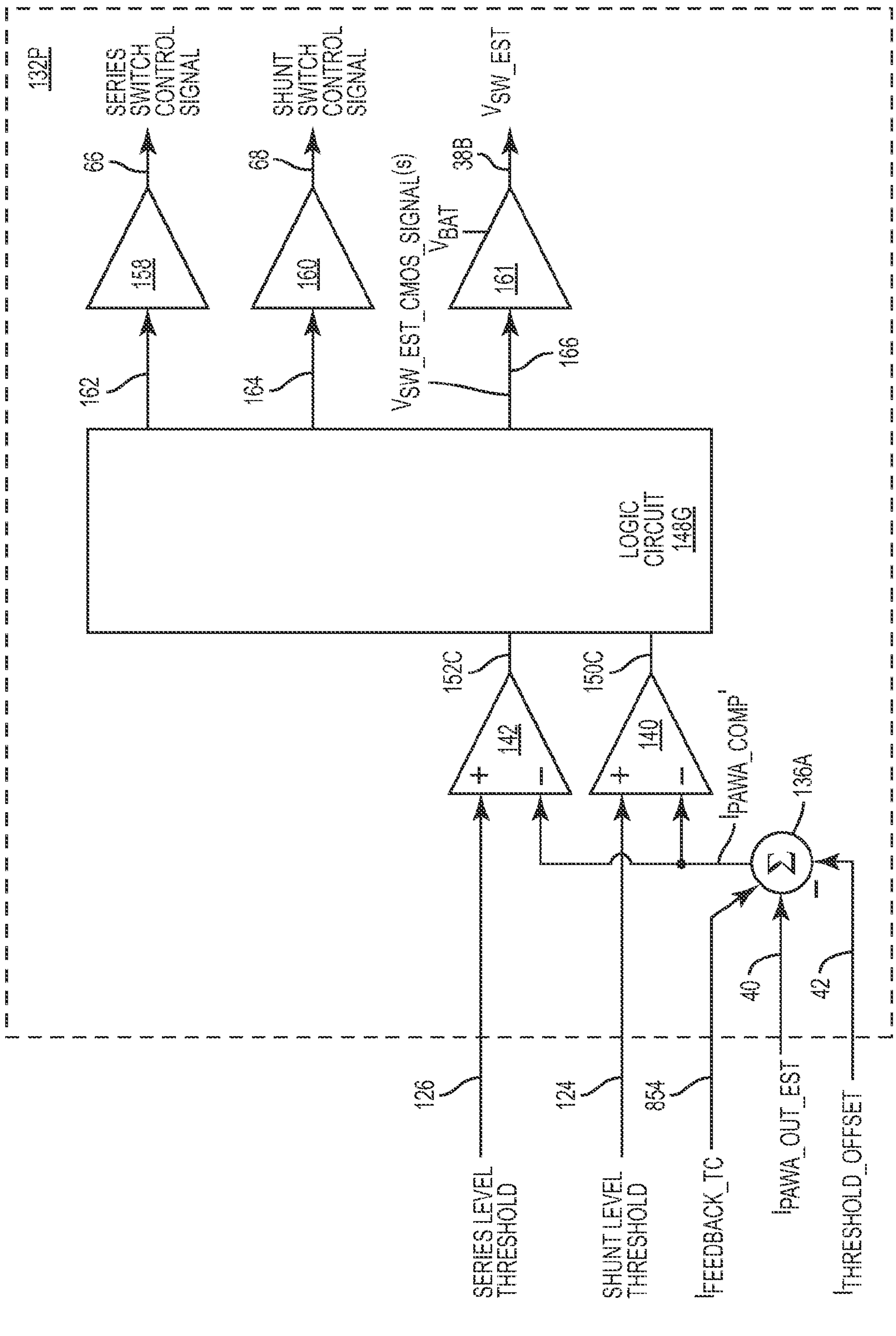
FIG. 4P depicts another embodiment of a threshold detector and control circuit of a buck converter that includes feedback compensation.
Figure 4Q:
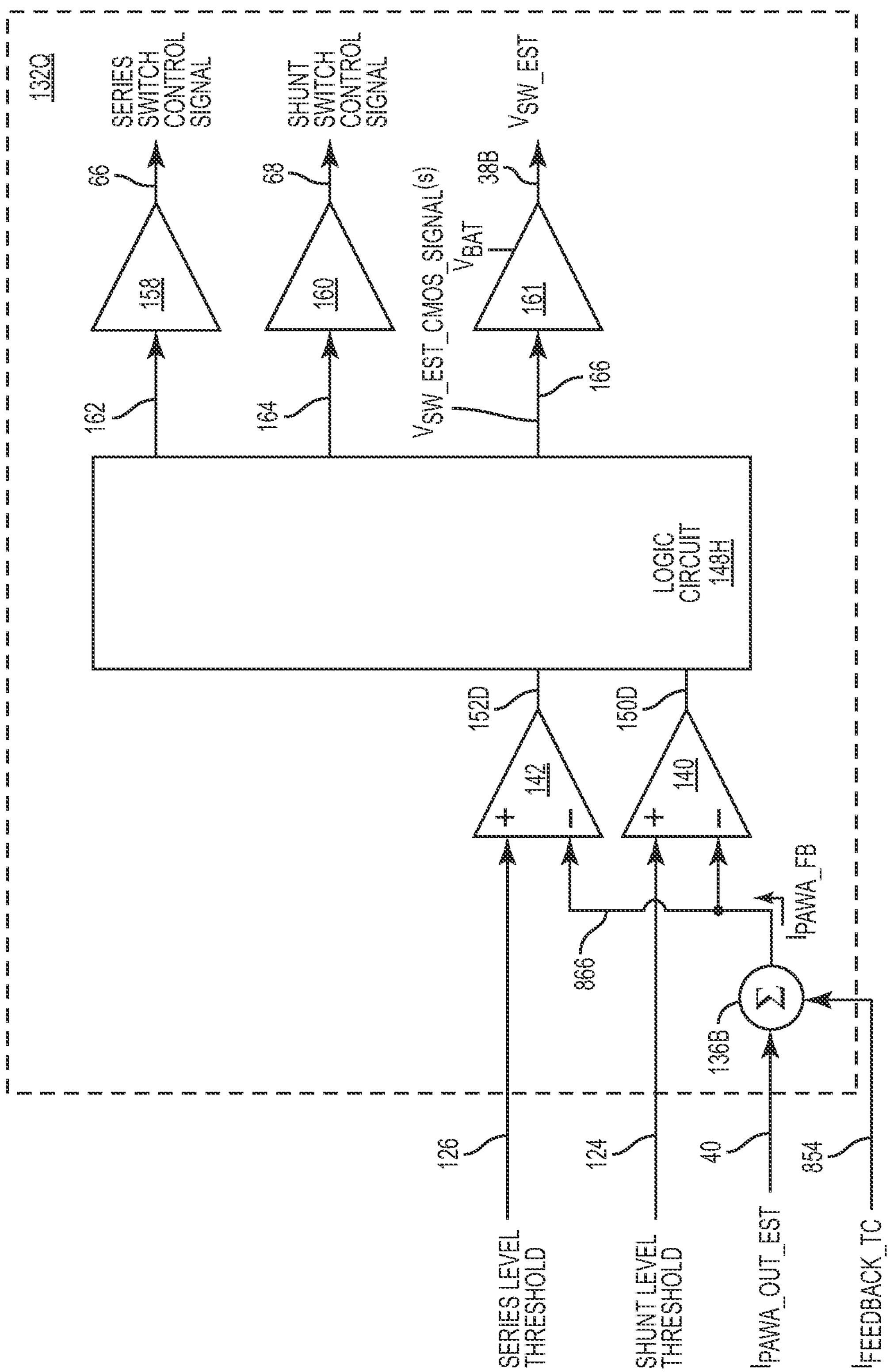
FIG. 4Q depicts another embodiment of a threshold detector and control circuit of a buck converter that includes feedback compensation.
Figure 4R:
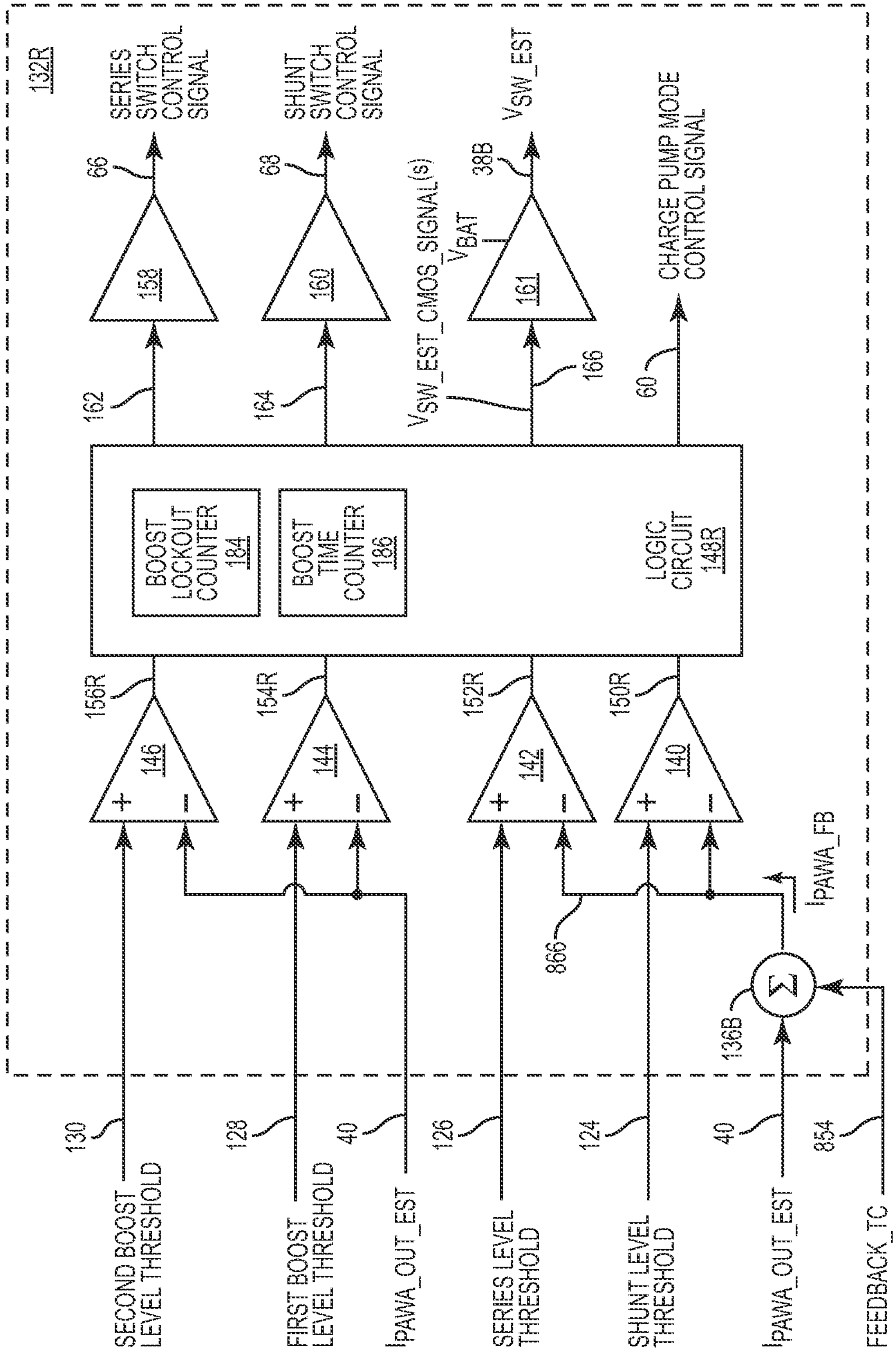
FIG. 4R depicts another embodiment of a threshold detector and control circuit of a multi-level charge pump buck converter that includes feedback compensation.

In the second boost output mode 194R, the logic circuit 148R, depicted in FIG. 4R, configures the series switch control output 162 such that the series switch 70, depicted in FIG. 3R, is in an open state (not conducting). The logic circuit 148R also configures the shunt switch control output 164 such that the shunt switch 72, depicted in FIG. 3R, is in an open state (not conducting). In addition, the logic circuit 148R configures the charge pump mode control signal 60 to instruct the multi-level charge pump circuit 56 to be in a second boost mode of operation to provide $2\times V_{BAT}$ at the charge pump output 64. As a result, the switching voltage output 26, depicted in FIG. 3R, is configured to provide a switching voltage, $V_{SW}$, substantially equal to $2\times V_{BAT}$. In response to de-assertion of the shunt level indication 150R, which indicates that the feedback compensated parallel amplifier circuit estimate 866, $I_{PAWA\_FB}$, is less than the shunt level threshold 124, the first state machine transitions to the shunt output mode 188R. Otherwise, the state machine remains in the second boost output mode 194R.

As a result, the transition from the shunt output mode 188R to the series output mode 190R and the transition back into the shunt output mode 188R may be affected by the feedback delay compensation signal 854, $I_{FEEDBACK\_TC}$. Otherwise, transitions between the series output mode 190R and the first boost output mode 192R and between the first boost output mode 192R and the second boost output mode 194R are not affected by the feedback delay compensation signal 854, $I_{FEEDBACK\_TC}$.

Operation of the second state machine of the logic circuit 148R, depicted in FIG. 6R, will now be described with continuing reference to FIG. 3R and FIG. 4R. The second state machine includes a shunt output mode 196R, a series output mode 198R, a first boost output mode 200R, and a second boost output mode 202R. In addition, the second state machine uses the above-described boost lockout counter 184 and boost time counter 186 of the logic circuit 148R, which are the same in function and form as the boost lockout counter 184 and boost time counter 186 of the logic circuit 148R.

In the shunt output mode 196R, the logic circuit 148R configures the series switch control output 162 such that the series switch 70 is in an open state (not conducting). The logic circuit 148R also configures the shunt switch control output 164 such that the shunt switch 72 is in a closed state (conducting). In addition, the logic circuit 148R configures the charge pump mode control signal 60 to instruct the multi-level charge pump circuit 56 to be in a charging mode of operation. As a result, the switching voltage output 26, depicted in FIG. 3R, is configured to provide a switching voltage, $V_{SW}$, substantially equal to ground. If the boost lockout counter 184 is enabled, the boost lockout counter 184 continues to count down. In response to assertion of the series level indication 152R, which indicates that the feedback compensated parallel amplifier circuit estimate 866, $I_{PAWA\_FB}$, is greater than or equal to the series level threshold 126, the second state machine transitions to the series output mode 198R. Otherwise the second state machine remains in the shunt output mode 196R.

In the series output mode 198R, the logic circuit 148R configures the series switch control output 162 such that the series switch 70 is in a closed state (conducting). The logic circuit 148R also configures the shunt switch control output 164 such that the shunt switch 72 is in an open state (not conducting). In addition, the logic circuit 148R configures the charge pump mode control signal 60 to instruct the multi-level charge pump circuit 56 to be in a charging mode of operation. As a result, the switching voltage output 26, depicted in FIG. 3R, is configured to provide a switching voltage, $V_{SW}$, substantially equal to the direct current (DC) voltage, $V_{BAT}$. If the boost lockout counter 184 is enabled, the boost lockout counter 184 continues to count down. In response to de-assertion of the shunt level indication 150R, which indicates that the feedback compensated parallel amplifier circuit estimate 866, $I_{PAWA\_FB}$, is less than the shunt level threshold 124, the logic circuit 148R configures the second state machine to transition to the shunt output mode 196R. However, in response to assertion of the first boost level indication 154R, which indicates that the parallel amplifier circuit output current estimate 40, $I_{PAWA\_OUT\_EST}$, is greater than or equal to the first boost level threshold 128, the logic circuit 148R determines whether both the minimum charge time indicator is de-asserted and the first boost level indication 154R is asserted. If the minimum charge time indicator is de-asserted and the first boost level indication 154R is asserted, the logic circuit 148R configures the second machine to transition to the first boost output mode 200R. Otherwise, the logic circuit 148R prevents the second state machine from transitioning to the first boost output mode 200R until the minimum time indicator is de-asserted. Once both the minimum charge time indicator is de-asserted and the first boost level indication 154R is asserted, the logic circuit 148R configures the second state machine to transition to the first boost output mode 200R, resets the counter output of the boost time counter 186, and enables the boost time counter 186 to begin counting up. Otherwise, the second state machine remains in the series output mode 198R.

In the first boost output mode 200R, the logic circuit 148R configures the series switch control output 162 such that the series switch 70 is in an open state (not conducting). The logic circuit 148R also configures the shunt switch control output 164 such that the shunt switch 72 is in an open state (not conducting). In addition, the logic circuit 148R configures the charge pump mode control signal 60 to instruct the multi-level charge pump circuit 56 to be in a first boost mode of operation to provide $1.5\times V_{BAT}$ at the charge pump output 64. As a result, the switching voltage output 26 of FIG. 3R is configured to provide a switching voltage, $V_{SW}$, substantially equal to $1.5\times V_{BAT}$. In response to de-assertion of the first boost level indication 154R, which indicates that the parallel amplifier circuit output current estimate 40, $I_{PAWA\_OUT\_EST}$, is less than the first boost level threshold 128, the logic circuit 148R configures the second state machine to transition to the series output mode 198R. If the count output of the boost time counter 186 exceeds the maximum boost time parameter, the logic circuit 148R asserts a minimum charge time indicator. In response to the minimum charge time indicator being asserted, the logic circuit 148R sets the count value of the boost lockout counter 184 and enables the boost lockout counter 184 to begin counting down. However, in response to assertion of the second boost level indication 156R, which indicates that the parallel amplifier circuit output current estimate 40, $I_{PAWA\_OUT\_EST}$, is greater than or equal to the second boost level threshold 130, the logic circuit 148R configures the second state machine to transition to the second boost output mode 202R. Otherwise, the second state machine remains in the first boost output mode 200R.

In the second boost output mode 202R, the logic circuit 148R configures the series switch control output 162 such that the series switch 70 is in an open state (not conducting). The logic circuit 148R also configures the shunt switch control output 164 such that the shunt switch 72 is in an open state (not conducting). In addition, the logic circuit 148R configures the charge pump mode control signal 60 to instruct the multi-level charge pump circuit 56 to be in a second boost mode of operation to provide $2\times V_{BAT}$ at the charge pump output 64. As a result, the switching voltage output 26 of FIG. 3R is configured to provide a switching voltage, $V_{SW}$, substantially equal to $2\times V_{BAT}$.

In response to de-assertion of the first boost level indication 154R, which indicates that the parallel amplifier circuit output current estimate 40, $I_{PAWA\_OUT\_EST}$, is less than the first boost level threshold 128, the logic circuit 148R configures the second state machine to transition to the series output mode 198R. If the count output of the boost time counter 186 exceeds the maximum boost time parameter, the logic circuit 148R asserts a minimum charge time indicator. In response to the minimum charge time indicator being asserted, the logic circuit 148R sets the count value of the boost lockout counter 184 and enables the boost lockout counter 184 to begin counting down. Otherwise, the second state machine remains in the second boost output mode 202R.

Accordingly, the feedback delay compensation signal 854, $I_{FEEDBACK\_TC}$, only affect the operation of the second state machine associated with the logic circuit 148R when the second state machine is transitioning between the shunt output mode 196R and the series output mode 198R.

As a result, the transitions from the shunt output mode 196R to the series output mode 198R may be affected by the feedback delay compensation signal 854, $I_{FEEDBACK\_TC}$. Otherwise, transitions between the series output mode 198R and the first boost output mode 200R, between the first boost output mode 200R and the second boost output mode 202R are not affected by the feedback delay compensation signal 854, $I_{FEEDBACK\_TC}$.

Figure 38B:
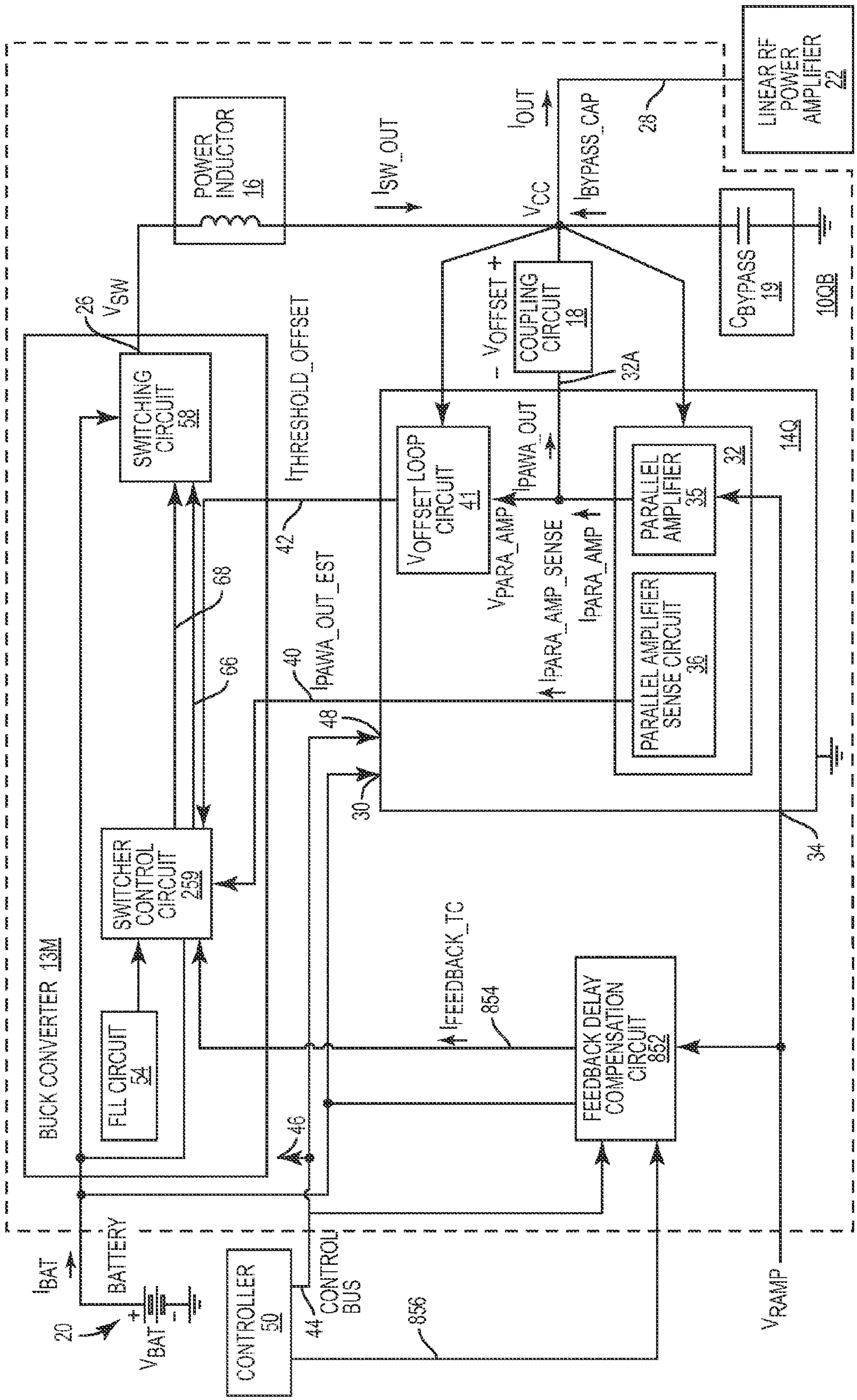

FIG. 38B depicts another embodiment of a pseudo-envelope follower power management system 10QB configured to minimize the negative impact of feedback delay on the power conversion efficiency of the pseudo-envelope follower power management system 10QB. The embodiment of the pseudo-envelope follower power management system 10QB depicted in FIG. 38B is similar in form and function to the pseudo-envelope follower power management system 10QA depicted in FIG. 38A except the multi-level charge pump buck converter 12Q is replaced with a buck converter 13M. The buck converter 13M is similar in form and function to the previously described embodiments of the buck converters 13A, 13G, 13K, 13L depicted respectively in FIGS. 18C-D, FIG. 13, FIG. 17A, FIG. 23B and FIG. 23D, except the buck converter 13M is configured to receive the feedback delay compensation signal 854, $I_{FEEDBACK\_TC}$, from the feedback delay compensation circuit 852. As depicted in FIG. 38B, the switcher control circuit 259 is configured to receive the parallel amplifier circuit output current estimate 40, $I_{PAWA\_OUT\_EST}$, the parallel amplifier circuit output current estimate 40, $I_{PAWA\_OUT\_EST}$, and the feedback delay compensation signal 854, $I_{FEEDBACK\_TC}$.

The parallel amplifier circuit 14Q in the pseudo-envelope follower power management system 10QB depicted in FIG. 38B functions similar to the manner in which the parallel amplifier circuit 14Q acts in the pseudo-envelope follower power management system 10QB depicted in FIG. 38B. Thus, the parallel amplifier circuit 14Q acts as a master to control the power amplifier supply voltage, $V_{CC}$, at the power amplifier supply output 28 while controlling the buck converter 13M. The parallel amplifier circuit 14Q regulates the power amplifier supply voltage, $V_{CC}$, by sourcing and sinking current through the coupling circuit 18, based on the received $V_{RAMP}$ signal, to compensate for either the over or under generation of the power inductor current, $I_{SW\_OUT}$, provided from the power inductor 16 due to changes in the switching voltage, $V_{SW}$, provided at the switching voltage output 26 of the buck converter 13M. The parallel amplifier circuit 14Q controls the changes in the switching voltage, $V_{SW}$, provided at the switching voltage output 26, based on the parallel amplifier circuit output current estimate 40, $I_{PAWA\_OUT\_EST}$, and the threshold offset current 42, $I_{THRESHOLD\_OFFSET}$, provided to the buck converter 13M as feedback signals to govern the operation of the buck converter 13M. As discussed previously with respect to the pseudo-envelope follower power management system 10QA depicted in FIG. 38A, by way of example, and not by limitation, the parallel amplifier circuit output current estimate 40, $I_{PAWA\_OUT\_EST}$, depicted in FIG. 38B, is formed by the scaled parallel amplifier output current estimate, $I_{PARA\_AMP\_SENSE}$, from the parallel amplifier sense circuit 36. Thus, as discussed above, in other embodiments of the pseudo-envelope follower power management system 10QB, the parallel amplifier circuit output current estimate 40, $I_{PAWA\_OUT\_EST}$, may also include contributions from the scaled high frequency ripple compensation current estimate 418, $I_{COR\_SENSE}$, and/or the scaled open loop assist circuit output current estimate, $I_{ASSIST\_EST}$. Accordingly, while FIG. 38A depicts that the parallel amplifier circuit output current estimate 40, $I_{PAWA\_OUT\_EST}$, provided to the multi-level charge pump buck converter 12Q only includes the scaled parallel amplifier output current estimate, $I_{PARA\_AMP\_SENSE}$, this is by way of example and not by limitation. As previously discussed, other embodiments of the parallel amplifier circuit 14Q of the pseudo-envelope follower power management system 10QB may include an embodiment of the open loop assist circuit 39, depicted in FIG. 2A, and/or an embodiment of the open loop ripple compensation assist circuit 414 depicted in FIG. 23B. Thus, in some embodiments of the pseudo-envelope follower power management system 10QB, the parallel amplifier circuit output current estimate 40, $I_{PAWA\_OUT\_EST}$, may further include the scaled high frequency ripple compensation current estimate 418, $I_{COR\_SENSE}$, and/or the scaled open loop assist circuit output current estimate, $I_{ASSIST\_SENSE}$.

In some embodiments of the pseudo-envelope follower power management system 10QB, the feedback delay compensation circuit 852 may be incorporated into the buck converter 13M. However, for the sake of simplicity of description, and not by way of limitation, the feedback delay compensation circuit 852 depicted in FIG. 38B is shown as being separate from the buck converter 13M.

Similar to the operation of the switcher control circuit 52 of the multi-level charge pump buck converter 12Q depicted in FIG. 38A, the switcher control circuit 259 may be configured to use to raise or lower the effective thresholds used by the switcher control circuit 259 to control changes between modes of operation of the buck converter 13M, where each mode of operation corresponds to a particular voltage level of the switching voltage, $V_{SW}$, provided at the switching voltage output 26 to the power inductor 16.

The operation of the embodiment of the feedback delay compensation circuit 852 depicted in FIG. 39A and the embodiment of the feedback delay compensation circuit 852A depicted in FIG. 39B described above are applicable to the various embodiments of the buck converter 13M that are configured to use the feedback delay compensation signal 854, $I_{FEEDBACK\_TC}$, generated by the feedback delay compensation circuit 852. For the sake of simplicity, and not by way of limitation, the discussion of the embodiments of the buck converter 13M that are configured to use the feedback delay compensation signal 854, $I_{FEEDBACK\_TC}$, will be done with the understanding that the parallel amplifier circuit output current estimate 40, $I_{PAWA\_OUT\_EST}$, depicted in FIG. 38B, is substantially equal to the scaled parallel amplifier output current estimate, $I_{PARA\_AMP\_SENSE}$.

As depicted in FIG. 38B, some embodiments of the buck converter 13M may be configured to interoperate with an FLL circuit 54 in a fashion similar to the buck converter 13A depicted in FIG. 18C. One example embodiment of the switcher control circuit 259 of the buck converter 13M is the switcher control circuit 52M, depicted in FIG. 3M, which is configured to interoperate with the FLL circuit 54. The switcher control circuit 52M, depicted in FIG. 3M, is similar in form and function to the embodiment of the switcher control circuit 52E depicted in FIG. 3E, except, the switcher control circuit 52M, depicted in FIG. 3M, is configured to receive the feedback delay compensation signal 854, $I_{FEEDBACK\_TC}$. Unlike the switcher control circuit 52E, depicted in FIG. 3E, the switcher control circuit 52M includes a summing circuit 136A configured to receive a scaled parallel amplifier output current estimate 138 from the multiplier circuit 134, the threshold offset current 42, $I_{THRESHOLD\_OFFSET}$, and the feedback delay compensation signal 854, $I_{FEEDBACK\_TC}$. The summing circuit 136A subtracts the threshold offset current 42, $I_{THRESHOLD\_OFFSET}$, from the sum of the scaled parallel amplifier output current estimate 138 and the feedback delay compensation signal 854, $I_{FEEDBACK\_TC}$, to form a compensated parallel amplifier circuit output current estimate, $I_{PAWA\_COMP}$, that is received by the threshold detector and control circuit 132E. The compensated parallel amplifier circuit output current estimate $I_{PAWA\_COMP}$, may be used as a composite feedback signal for the first comparator 140 and the second comparator 142, as depicted in FIG. 4E. The threshold detector and control circuit 132E, depicted in FIG. 4E, includes the shunt level threshold 124 and the series level threshold 126 coupled to the positive terminal of the first comparator 140 and the second comparator 142, respectively. The negative terminal of the first comparator 140 and the second comparator 142 are configured to receive the compensated parallel amplifier circuit output current estimate $I_{PAWA\_COMP}$.

Operationally, the threshold detector and control circuit 132E functions substantially the same as previously described relative to the buck converter 13A, depicted in FIG. 18C. However, the effective level of the shunt level threshold 124 and the series level threshold 126 relative to the compensated parallel amplifier circuit output current estimate, $I_{PAWA\_COMP}$, may be raised or lowered by the feedback delay compensation signal 854, $I_{FEEDBACK\_TC}$. For example, in the case where the slope of the $V_{RAMP}$ signal is positive, the magnitude of the feedback delay compensation signal 854, $I_{FEEDBACK\_TC}$, is positive, which will tend to raise the magnitude of the compensated parallel amplifier circuit output current estimate, $I_{PAWA\_COMP}$. Because the feedback delay compensation signal 854, $I_{FEEDBACK\_TC}$, will tend to increase the magnitude of the compensated parallel amplifier circuit output current estimate, $I_{PAWA\_COMP}$, the relative magnitude of the magnitude of the scaled parallel amplifier output current estimate, $I_{PARA\_AMP\_SENSE}$, needed to cause the shunt level indication 150A and the series level indication 152A to transition from being de-asserted to being asserted is asserted is decreased. In other words, when the slope of the $V_{RAMP}$ signal is positive, the feedback delay compensation signal 854, $I_{FEEDBACK\_TC}$, lowers the magnitude of the scaled parallel amplifier output current estimate, $I_{PARA\_AMP\_SENSE}$, at which each of the first comparator 140 and the second comparator 142, transitions from a digital logic low state to a digital logic high state. As a result, the switcher control circuit 52M, depicted in FIG. 3M, tends to increase the switching voltage, $V_{SW}$, sooner than if the feedback delay compensation signal 854, $I_{FEEDBACK\_TC}$, was not present. Alternatively, when the $V_{RAMP}$ signal is decreasing such that the slope of the derivative of the $V_{RAMP}$ signal is negative, the magnitude of the feedback delay compensation signal 854, $I_{FEEDBACK\_TC}$, is negative, which will tend to lower the magnitude of the compensated parallel amplifier circuit output current estimate, $I_{PAWA\_COMP}$. Because the feedback delay compensation signal 854, $I_{FEEDBACK\_TC}$, will tend to lower the magnitude of the compensated parallel amplifier circuit output current estimate, $I_{PAWA\_COMP}$, the magnitude of the scaled parallel amplifier output current estimate, $I_{PARA\_AMP\_SENSE}$, needed to cause the shunt level indication 150A and the series level indication 152A to transition from being asserted to being de-asserted is decreased. As a result, when the slope of the derivative of the $V_{RAMP}$ signal is negative, the feedback delay compensation signal 854, $I_{FEEDBACK\_TC}$, tends to cause the switcher control circuit 52M, depicted in FIG. 3M, to decrease the switching voltage, $V_{SW}$, sooner than if the feedback delay compensation signal 854, $I_{FEEDBACK\_TC}$, was not present.

As an example, the behavior of the first state machine, depicted in FIG. 5E, associated with the logic circuit 148E, depicted in FIG. 4E, relative to the magnitude of the scaled parallel amplifier output current estimate, $I_{PARA\_AMPSENSE}$, changes depending on the value of the feedback delay compensation signal 854. As a first example, when the feedback delay compensation signal 854, $I_{FEEDBACK\_TC}$, raises the compensated parallel amplifier circuit output current estimate, $I_{PAWA\_COMP}$, the first state machine tends to shift to a mode of operation that provides a higher switching voltage, $V_{SW}$, at the switching voltage output 26. As a result, for example, when the first state machine, depicted in FIG. 5E, is in the shunt output mode 188E, the first state machine tends to transition to the series output mode 190E when the scaled parallel amplifier output current estimate, $I_{PARA\_AMP\_SENSE}$, is at a lower magnitude. This effectively causes the first state machine to advance in time the transition from the shunt output mode 188E to the series output mode 190E in response to the $V_{RAMP}$ signal. The earlier transition by the first state machine from the shunt output mode 188E to the series output mode 190E is due to the feedback delay compensation signal 854, $I_{FEEDBACK\_TC}$, lowering the effective threshold level of the series level threshold 126 by increasing the magnitude of the compensated parallel amplifier circuit output current estimate, $I_{PAWA\_COMP}$. As a result, the feedback delay compensation signal 854, $I_{FEEDBACK\_TC}$, compensates for the feedback delay associated with the generation of the scaled parallel amplifier output current estimate, $I_{PARA\_AMP\_SENSE}$, by lowering the effective threshold level of the series level threshold 126.

However, as a second example, when the slope of the derivative of the $V_{RAMP}$ signal is negative, the magnitude of the feedback delay compensation signal 854, $I_{FEEDBACK\_TC}$, will lower the magnitude of the compensated parallel amplifier circuit output current estimate, $I_{PAWA\_COMP}$. As a result, the first state machine tends to shift to a mode of operation that provides a lower switching voltage, $V_{SW}$, at the switching voltage output 26. For example, when the first state machine, depicted in FIG. 5E, is in the series output mode 190E, the first state machine tends to transition to the shunt output mode 188E more readily with respect to the scaled parallel amplifier output current estimate, $I_{PARA\_AMP\_SENSE}$, because the feedback delay compensation signal 854, $I_{FEEDBACK\_TC}$, is lowering the compensated parallel amplifier circuit output current estimate, $I_{PAWA\_COMP}$. This effectively causes the first state machine to advance in time the transition from the series output mode 190E to the shunt output mode 188E.

As another alternative embodiment of the buck converter 13M, depicted in FIG. 38B, that interoperates with the FLL circuit 54, the buck converter 13M may include a switcher control circuit 259 similar to the switcher control circuit 52N depicted in FIG. 3N. The switcher control circuit 52N depicted in FIG. 3N is similar in form and function to the switcher control circuit 52F, depicted in FIG. 3F. However, unlike the switcher control circuit 52F depicted in FIG. 3F, the switcher control circuit 52N, depicted in FIG. 3N, includes a threshold and control circuit 132N configured to receive the feedback delay compensation signal 854, $I_{FEEDBACK\_TC}$. As depicted in FIG. 4N, the threshold and control circuit 132N includes the logic circuit 148F and is similar in form and function to the threshold and control circuit 132F, depicted in FIG. 4F, except the threshold and control circuit 132N includes a summing circuit 136A configured to receive the parallel amplifier circuit output current estimate 40, $I_{PAWA\_OUT\_EST}$, generated by the parallel amplifier circuit 14Q, depicted in FIG. 38B, the threshold offset current 42, $I_{THRESHOLD\_OFFSET}$, and the feedback delay compensation signal 854, $I_{FEEDBACK\_TC}$. The summing circuit 136A subtracts the threshold offset current 42, $I_{THRESHOLD\_OFFSET}$, from the sum of the parallel amplifier circuit output current estimate 40, $I_{PAWA\_OUT\_EST}$, and the feedback delay compensation signal 854, $I_{FEEDBACK\_TC}$, to generate a compensated parallel amplifier circuit output current estimate, $I_{PAWA\_COMP}'$, which may be used as a composite feedback signal for the first comparator 140 and the second comparator 142, depicted in FIG. 4N. Similar to the operation of the threshold and control circuit 132F, depicted in FIG. 4F, the threshold and control circuit 132N depicted in FIG. 4N is configure to provide the compensated parallel amplifier circuit output current estimate, $I_{PAWA\_COMP}'$ to the negative terminal of the first comparator 140 and the second comparator 142, depicted in FIG. 4N.

Similar to the operation of the threshold detector and control circuit 132M, depicted in FIG. 4M, the threshold detector and control circuit 132N is configured such that the feedback delay compensation signal 854, $I_{FEEDBACK\_TC}$, can raise or lower the compensated parallel amplifier circuit output current estimate, $I_{PAWA\_COMP}'$ depending upon the slope of the derivative of the $V_{RAMP}$ signal. As a result, similar to the behavior of the first state machine, depicted in FIG. 5E, associated with the logic circuit 148E, the behavior of the first state machine, depicted in FIG. 5F, associated with the logic circuit 148F, relative to the magnitude of the scaled parallel amplifier output current estimate, $I_{PARA\_AMP\_SENSE}$, will change depending on the slope of the $V_{RAMP}$ signal used to generate the feedback delay compensation signal 854, $I_{FEEDBACK\_TC}$.

As a first example, for the case where the slope of the $V_{RAMP}$ signal is positive, the magnitude of the feedback delay compensation signal 854, $I_{FEEDBACK\_TC}$, will be positive, which increases the magnitude of the compensated parallel amplifier circuit output current estimate, $I_{PAWA\_COMP}'$. As a result, the first state machine, depicted in FIG. 5F, will have a greater tendency to shift to or stay in the series output mode 190F. However, for the case where the slope of the $V_{RAMP}$ signal is negative, the feedback delay compensation signal 854, $I_{FEEDBACK\_TC}$, is negative, which decreases the magnitude of the compensated parallel amplifier circuit output current estimate, $I_{PAWA\_COMP}'$. As a result, the first state machine, depicted in FIG. 5F, will have a greater tendency to shift to or stay in the shunt output mode 188F.

For example, in the case where the $V_{RAMP}$ signal is increasing in magnitude, the slope of the derivative of the $V_{RAMP}$ signal is positive. The magnitude of the feedback delay compensation signal 854, $I_{FEEDBACK\_TC}$, is positive, which increases the magnitude of the compensated parallel amplifier circuit output current estimate, $I_{PAWA\_COMP}'$. Because the feedback delay compensation signal 854, $I_{FEEDBACK\_TC}$, will tend to increase the magnitude of the compensated parallel amplifier circuit output current estimate, $I_{PAWA\_COMP}'$, the feedback delay compensation signal 854, $I_{FEEDBACK\_TC}$, effectively decreases the effective threshold points at which the shunt level indication 150B and the series level indication 152B transition from being de-asserted to being asserted with respect to the magnitude of the scaled parallel amplifier output current estimate, $I_{PARA\_AMP\_SENSE}$. Thus, the buck converter 13M will tend to respond to the change in the $V_{RAMP}$ signal when the parallel amplifier output current, $I_{PARA\_AMP}$, is at a lower magnitude, which reduces the average current sourced and sunk by the parallel amplifier 35.

Although FIG. 38B depicts the buck converter 13M as having the FLL circuit 54, some embodiments of the buck converter 13M may not include the FLL circuit 54 or the FLL circuit 54 may be disabled. In this case, the switcher control circuit 259 of the buck converter 13M may be configured similar to the switcher control circuit 52P depicted in FIG. 3P. The switcher control circuit 52P, depicted in FIG. 3P, is similar in form and function to the switcher control circuit 52G, depicted in FIG. 3G, except the switcher control circuit 52P includes a threshold detector and control circuit 132P that is configured to receive the feedback delay compensation signal 854, $I_{FEEDBACK\_TC}$. As depicted in FIG. 4P, the threshold detector and control circuit 132P is similar in form and function to the threshold detector and control circuit 132G, depicted in FIG. 3G, except the threshold detector and control circuit 132P includes the summing circuit 136A configured to receive the parallel amplifier circuit output current estimate 40, $I_{PAWA\_OUT\_EST}$, the threshold offset current 42, $I_{THRESHOLD\_OFFSET}$, and the feedback delay compensation signal 854, $I_{FEEDBACK\_TC}$. The summing circuit 136A subtracts the threshold offset current 42, $I_{THRESHOLD\_OFFSET}$, from the sum of the parallel amplifier circuit output current estimate 40, $I_{PAWA\_OUT\_EST}$, and the feedback delay compensation signal 854, $I_{FEEDBACK\_TC}$, to generate a compensated parallel amplifier circuit output current estimate, $I_{PAWA\_COMP}'$, which may be used as a composite feedback signal for the first comparator 140 and the second comparator 142, depicted in FIG. 4P.

As depicted in FIG. 4P, the threshold detector and control circuit 132P is configured such that the feedback delay compensation signal 854, $I_{FEEDBACK\_TC}$, can raise or lower the compensated parallel amplifier circuit output current estimate, $I_{PAWA\_COMP}'$ depending upon the slope of the derivative of the $V_{RAMP}$ signal. As a result, the behavior of the first state machine of the logic circuit 146G, depicted in FIG. 5G, relative to the magnitude of the scaled parallel amplifier output current estimate, $I_{PARA\_AMP\_SENSE}$, will change depending on the slope of the $V_{RAMP}$ signal used to generate the feedback delay compensation signal 854.

As a first example, referring to FIG. 5G with continuing reference to FIG. 4P, for the case where the slope of the $V_{RAMP}$ signal is positive, the magnitude of the feedback delay compensation signal 854, $I_{FEEDBACK\_TC}$, is positive, which will tend to increase the magnitude of the compensated parallel amplifier circuit output current estimate, $I_{PAWA\_COMP}'$. As a result, the first state machine, depicted in FIG. 5G, will have a greater tendency to shift to or stay in the series output mode 190G. However, for the case where the slope of the $V_{RAMP}$ signal is negative, the magnitude of the feedback delay compensation signal 854, $I_{FEEDBACK\_TC}$, is negative, which will tend to decrease the magnitude of the compensated parallel amplifier circuit output current estimate, $I_{PAWA\_COMP}'$. As a result, the first state machine, depicted in FIG. 5G, will have a greater tendency to shift to or stay in the shunt output mode 188G.

For example, in the case where the slope of derivative of the $V_{RAMP}$ signal is positive, the $V_{RAMP}$ signal is increasing in magnitude. The magnitude of the feedback delay compensation signal 854, $I_{FEEDBACK\_TC}$, is positive, which tends to increase the value of the compensated parallel amplifier circuit output current estimate, $I_{PAWA\_COMP}'$. Because the feedback delay compensation signal 854, $I_{FEEDBACK\_TC}$, will tend to increase the magnitude of the compensated parallel amplifier circuit output current estimate, $I_{PAWA\_COMP}'$, the feedback delay compensation signal 854, $I_{FEEDBACK\_TC}$, effectively decreases the effective threshold points at which the shunt level indication 150C or the series level indication 152C transition from being de-asserted to being asserted with respect to the magnitude of the scaled parallel amplifier output current estimate, $I_{PARA\_AMP\_SENSE}$. Thus, the buck converter 13M having the switch control circuit 52P, depicted in FIG. 3P, will tend to responds to the change in the $V_{RAMP}$ signal when the parallel amplifier output current, $I_{PARA\_AMP}$, is at a lower magnitude, which reduces the average current sourced and sunk by the parallel amplifier 35.

Although FIG. 38B depicts the buck converter 13M as having a $V_{OFFSET}$ loop circuit 41, some embodiments of the buck converter 13M may not include a $V_{OFFSET}$ loop circuit 41. For example, in the case where the coupling circuit 18 is a wire, the offset voltage, $V_{OFFSET}$, generated across the coupling circuit 18 is approximately zero. By way of example, and not by limitation, for an embodiment of the buck converter 13M that does not include the $V_{OFFSET}$ loop circuit 41, the buck converter 13M may include a switcher control circuit 259 similar to the switcher control circuit 52Q depicted in FIG. 3Q. The switcher control circuit 52Q depicted in FIG. 3Q is similar in form and function to the switcher control circuit 52H depicted in FIG. 3H. However, unlike the switcher control circuit 52H, depicted in FIG. 3H, the switcher control circuit 52Q includes a threshold and control circuit 132Q configured to receive the feedback delay compensation signal 854, $I_{FEEDBACK\_TC}$.

FIG. 4Q depicts an embodiment of the threshold and control circuit 132Q that is similar in form and function to the embodiment of the threshold and control circuit 132H, depicted in FIG. 4H. However, unlike threshold and control circuit 132H, depicted in FIG. 4H, the threshold and control circuit 132Q includes a summer circuit 136B configured to receive the feedback delay compensation signal 854, $I_{FEEDBACK\_TC}$, and the parallel amplifier circuit output current estimate 40, $I_{PAWA\_OUT\_EST}$. The summer circuit 136B adds the feedback delay compensation signal 854, $I_{FEEDBACK\_TC}$, and the parallel amplifier circuit output current estimate 40, $I_{PAWA\_OUT\_EST}$, to generate a feedback compensated parallel amplifier circuit estimate 866, $I_{PAWA\_FB}$, which may be used as a composite feedback signal for the first comparator 140 and the second comparator 142, depicted in FIG. 4Q. The feedback compensated parallel amplifier circuit estimate 866, $I_{PAWA\_FB}$, is coupled to the negative terminal of the first comparator 140 and the second comparator 142. Similar to the threshold and control circuit 132H, depicted in FIG. 4H, the threshold and control circuit 132Q, depicted in FIG. 4Q, includes the logic circuit 148H.

The operation of the first state machine of the logic circuit 148H is changed by the addition of the feedback delay compensation signal 854, $I_{FEEDBACK\_TC}$, to form the feedback compensated parallel amplifier circuit estimate 866, $I_{PAWA\_FB}$. For example, unlike the operation of the first state machine, depicted in FIG. 5H, of logic circuit 148H, the transition between the states of the first state machine of the logic circuit 148H used in the threshold and control circuit 132Q, depends on the feedback compensated parallel amplifier circuit estimate 866, $I_{PAWA\_FB}$, instead of the parallel amplifier circuit output current estimate 40, $I_{PAWA\_OUT\_EST}$.

Figure 5Q:
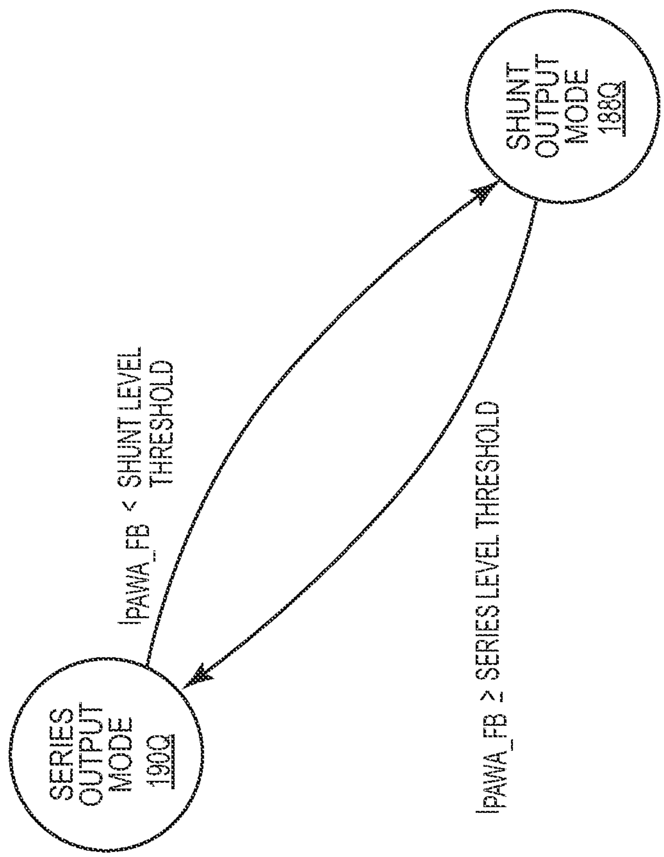
FIG. 5Q depicts an embodiment of a first state machine of the threshold detector and control circuit of FIG. 4Q.

As an example, the operation of the first state machine of the logic circuit 148H of the threshold and control circuit 132Q, depicted in FIG. 4Q, is depicted in FIG. 5Q. As depicted in FIG. 5Q, the transitions between the shunt output mode 188Q and the series output mode 190Q are dependent upon the feedback compensated parallel amplifier circuit estimate 866, $I_{PAWA\_FB}$. For example, the logic circuit 148H transitions the first state machine from the shunt output mode 188Q to the series output mode 190Q when the feedback compensated parallel amplifier circuit estimate 866, $I_{PAWA\_FB}$, is greater than or equal to the series level threshold 126. Similarly, the logic circuit 148H transitions the first state machine from the series output mode 190Q to the shunt output mode 188Q when the feedback compensated parallel amplifier circuit estimate 866, $I_{PAWA\_FB}$, is less than the shunt level threshold 124. Otherwise, the form and function of the shunt output mode 188Q and the series output mode 190Q are substantially the same as the shunt output mode 188H and series output mode 190H of the state first machine of the logic circuit 148H, depicted in FIG. 5H.

Thus, when the slope of the derivative of the $V_{RAMP}$ signal is positive, the magnitude of the feedback delay compensation signal 854, $I_{FEEDBACK\_TC}$, is positive, which will tend to increase the magnitude of the feedback compensated parallel amplifier circuit estimate 866, $I_{PAWA\_FB}$. As a result, the effective threshold level at which the shunt level indication 150D and the series level indication 152D transition from being de-asserted to being asserted is lowered relative to the magnitude of the scaled parallel amplifier output current estimate, $I_{PARA\_AMP\_SENSE}$. Accordingly, the switcher control circuit 52Q will tend to increase the switching voltage, $V_{SW}$, sooner than if the feedback delay compensation signal 854, $I_{FEEDBACK\_TC}$, was not added to the parallel amplifier circuit output current estimate 40, $I_{PAWA\_OUT\_EST}$, to form the feedback compensated parallel amplifier circuit estimate 866, $I_{PAWA\_FB}$ when the slope of the derivative of the $V_{RAMP}$ signal is positive. Similarly, when the slope of the derivative of the $V_{RAMP}$ signal is negative, the magnitude of the feedback delay compensation signal 854, $I_{FEEDBACK\_TC}$, is negative, which will tend to reduce the magnitude of the feedback compensated parallel amplifier circuit estimate 866, $I_{PAWA\_FB}$, relative to the scaled parallel amplifier output current estimate, $I_{PARA\_AMP\_SENSE}$. As a result, as depicted in FIG. 5Q, the first state machine of the logic circuit 148H as used in the threshold and control circuit 132Q will tend to shift to a mode of operation that provides a lower switching voltage, $V_{SW}$, at the switching voltage output 26 when the magnitude the parallel amplifier circuit output current estimate 40, $I_{PAWA\_OUT\_EST}$, is lower because feedback delay compensation signal 854, $I_{FEEDBACK\_TC}$, provides an early indication of the direction in which the target voltage level for the power amplifier supply voltage, $V_{CC}$, to the buck converter 13M. Thus, as described above, the example embodiments of the multi-level charge pump buck converter 12M, depicted in FIG. 38A, and the example embodiments of buck converter 13M, depicted in FIG. 38B, the feedback delay compensation signal 854, $I_{FEEDBACK\_TC}$, compensates for the feedback delay associated with generation of the scaled parallel amplifier output current estimate, $I_{PARA\_AMP\_SENSE}$, by providing an early indication of the direction in which the target voltage level of the power amplifier supply voltage, $V_{CC}$, is moving based on the slope of the derivative of the $V_{RAMP}$ signal.

In some alternative embodiments (not depicted) of the pseudo-envelope follower power management system 10QA and the pseudo-envelope follower power management system 10QB, the switcher controller circuit 52 may be configured to change the shunt level threshold 124, the series level threshold 126, the first boost level threshold 128, and the second boost level threshold 130 based on the feedback delay compensation signal 854, $I_{FEEDBACK\_TC}$. As a result, the threshold levels at which the first comparator 140, the second comparator 142, the third comparator 144, and the fourth comparator 146 change between an asserted state and an unasserted state are modified by the feedback delay compensation signal 854, $I_{FEEDBACK\_TC}$, in order to compensate for the feedback delay.

Those skilled in the art will recognize improvements and modifications to the embodiments of the present disclosure. All such improvements and modifications are considered within the scope of the concepts disclosed herein and the claims that follow.

What is claimed:

1. A pseudo-envelope follower power management system with high frequency ripple compensation comprising:
- a switch mode power supply converter configured to:
  - generate a switching output voltage; and
  - generate a switching voltage output estimate which provides an early indication of a future voltage level of the switching output voltage;
- an open loop high frequency ripple compensation assist circuit configured to: receive the switching voltage output estimate and a $V_{RAMP}$ signal;
  - generate a high frequency ripple compensation current based on the switching voltage output estimate and the $V_{RAMP}$ signal; and
  - apply the high frequency ripple compensation current to a power amplifier supply output to reduce a high frequency ripple current at the power amplifier supply output.

2. The pseudo-envelope follower power management system with high frequency ripple compensation of claim 1 wherein the high frequency ripple compensation current is generated in a frequency band located substantially near a transmit to receive duplex offset for a band of operation in a communication network.

3. The pseudo-envelope follower power management system with high frequency ripple compensation of claim 2 wherein the frequency band of the high frequency ripple compensation current has a bandwidth substantially equal to a bandwidth of a receiver channel frequency band for the band of operation.

4. The pseudo-envelope follower power management system with high frequency ripple compensation of claim 2 wherein the switch mode power supply converter includes programmable delay circuitry configured to delay generation of the switching voltage output estimate by a programmable delay period.

5. The pseudo-envelope follower power management system with high frequency ripple compensation of claim 4 wherein the programmable delay period is configured to temporally align the switching voltage output estimate and the $V_{RAMP}$ signal to position a notch in a ripple rejection response of the power amplifier supply output near the transmit to receive duplex offset for the band of operation.

6. The pseudo-envelope follower power management system with high frequency ripple compensation of claim 1 wherein the open loop high frequency ripple compensation assist circuit is further configured to generate a scaled high frequency ripple compensation current estimate based on the high frequency ripple compensation current.

7. The pseudo-envelope follower power management system with high frequency ripple compensation of claim 6 wherein the switch mode power supply converter is further configured to receive a feedback signal, wherein the feedback signal is based on the scaled high frequency ripple compensation current estimate.

8. The pseudo-envelope follower power management system with high frequency ripple compensation of claim 7 wherein the switch mode power supply converter is further configured to adjust the switching output voltage based on the feedback signal.

9. The pseudo-envelope follower power management system with high frequency ripple compensation of claim 8 further comprising a parallel amplifier configured to;
- receive the $V_{RAMP}$ signal and a power amplifier supply voltage from the power amplifier supply output, wherein the parallel amplifier is configured to generate a parallel amplifier output current based on a difference between the $V_{RAMP}$ signal and the power amplifier supply voltage; and
- apply the parallel amplifier output current to the power amplifier supply output.

10. The pseudo-envelope follower power management system with high frequency ripple compensation of claim 9 wherein the parallel amplifier is further configured to generate a scaled parallel amplifier output current estimate based on the parallel amplifier output current; and
- wherein the feedback signal is further based on the scaled parallel amplifier output current estimate.

11. The pseudo-envelope follower power management system with high frequency ripple compensation of claim 1 wherein the open loop high frequency ripple compensation assist circuit further comprises:
- a filter network having a first node configured to receive the switching voltage output estimate and a second node;
- a feedback network including a first node in communication with the second node of the filter network and a second node;
- an operational amplifier including a non-inverting input configured to receive the $V_{RAMP}$ signal, an inverting input in communication with the second node of the filter network and the first node of the feedback network, an operational amplifier output in communication with the second node of the feedback network, wherein the operational amplifier is configured to generate the high frequency ripple compensation current.

12. The pseudo-envelope follower power management system with high frequency ripple compensation of claim 11 wherein the operational amplifier includes a first push-pull output stage in communication with the operational amplifier output, wherein the first push-pull output stage is configured to generate an operational amplifier output current.

13. The pseudo-envelope follower power management system with high frequency ripple compensation of claim 12 wherein the open loop high frequency ripple compensation assist circuit further comprises:
- a bias capacitor having a bias capacitance and a bias resistor arranged in series between the operational amplifier output and a reference voltage;
- wherein the first push-pull output stage has a first stage transconductance; and wherein the bias capacitance is configured such that the first stage transconductance of the first push-pull output stage is substantially equal to a transconductance of the bias resistor in a frequency band located substantially near a transmit to receive duplex offset for a band of operation in a communication network.

14. The pseudo-envelope follower power management system with high frequency ripple compensation of claim 12 wherein the open loop high frequency ripple compensation assist circuit further comprises:

an operational amplifier output isolation circuit including a high impedance input in communication with the operational amplifier output and an isolated feedback node in communication with the second node of the feedback network.

15. The pseudo-envelope follower power management system with high frequency ripple compensation of claim 11 wherein the operational amplifier is further configured to generate a scaled high frequency ripple compensation current estimate as a function of the high frequency ripple compensation current.

16. The pseudo-envelope follower power management system with high frequency ripple compensation of claim 12 wherein the operational amplifier further includes a second push-pull output stage configured to generate the high frequency ripple compensation current, wherein the high frequency ripple compensation current is mirrored to the operational amplifier output current.

17. The pseudo-envelope follower power management system with high frequency ripple compensation of claim 16 wherein the operational amplifier further includes a third push-pull output stage configured to generate a scaled high frequency ripple compensation current estimate as a function of the high frequency ripple compensation current based on a sense scaling factor.

18. The pseudo-envelope follower power management system with high frequency ripple compensation of claim 16 wherein the second push-pull output stage includes a programmable second output stage transconductance.

19. The pseudo-envelope follower power management system with high frequency ripple compensation of claim 18 wherein the open loop high frequency ripple compensation assist circuit is configured to adjust a magnitude of the high frequency ripple compensation current based on the programmable second output stage transconductance.

20. The pseudo-envelope follower power management system with high frequency ripple compensation of claim 19 wherein the programmable second output stage transconductance is a substantially linear function of a programmable transconductance parameter.

21. The pseudo-envelope follower power management system with high frequency ripple compensation of claim 11 wherein the filter network is associated with a first corner frequency and the feedback network is associated with a second corner frequency; and wherein the first corner frequency has a programmable range between 3 MHz and 11.5 MHz and the second corner frequency has a programmable range between 3 MHz and 11.5 MHz.

22. The pseudo-envelope follower power management system with high frequency ripple compensation of claim 21 wherein the first corner frequency is substantially equal to 6 MHz, and the second corner frequency is substantially equal to 6 MHz.

23. The pseudo-envelope follower power management system with high frequency ripple compensation of claim 1, wherein the switch mode power supply converter is configured to operate as a buck converter.

24. The pseudo-envelope follower power management system with high frequency ripple compensation of claim 1, wherein the switch mode power supply converter is configured to operate as a multi-level charge pump buck converter.

25. The pseudo-envelope follower power management system with high frequency ripple compensation of claim 1 wherein the switch mode power supply converter further includes programmable delay circuitry, a switcher control circuit, and a buffer scalar;

wherein the switcher control circuit is configured to generate a digital switching voltage output signal that represents a state of the switcher control circuit used to control generation of the switching output voltage by the switch mode power supply converter;

wherein the programmable delay circuitry is configured to receive the digital switching voltage output signal, and delay the digital switching voltage output signal by a programmable delay period to generate a delayed digital switching voltage output signal; and wherein the buffer scalar is configured to receive the delayed digital switching voltage output signal, and generate the switching voltage output estimate based on the delayed digital switching voltage output signal and the buffer scalar.

26. A method for reducing high frequency ripple currents at a power amplifier supply output comprising:

generating a switching output voltage and a switching voltage output estimate with a switch mode power supply converter, wherein the switching voltage output estimate provides an early indication of a future voltage level of the switching output voltage;

receiving the switching voltage output estimate and a $V_{RAMP}$ signal at an open loop high frequency ripple compensation assist circuit;

generating a high frequency ripple compensation current based on the switching voltage output estimate and the $V_{RAMP}$ signal; and applying the high frequency ripple compensation current to the power amplifier supply output to reduce a high frequency ripple current at the power amplifier supply output.

27. The method for reducing high frequency ripple currents at the power amplifier supply output of claim 26 wherein generating the high frequency ripple compensation current based on the switching voltage output estimate and the $V_{RAMP}$ signal comprises:

generating the high frequency ripple compensation current within a frequency band located substantially near a transmit to receive duplex offset for a band of operation in a communication network.

28. The method for reducing high frequency ripple currents at the power amplifier supply output of claim 27 wherein the frequency band of the high frequency ripple compensation current has a bandwidth substantially equal to a bandwidth of a receiver channel frequency band for the band of operation.

29. The method for reducing high frequency ripple currents at the power amplifier supply output of claim 28 wherein generating the switching voltage output estimate further comprises:

delaying generation of the switching voltage output estimate by a programmable delay period to temporally align the switching voltage output estimate and the $V_{RAMP}$ signal to position a notch in a ripple rejection response of the power amplifier supply output near the transmit to receive duplex offset for the band of operation.

30. The method for reducing high frequency ripple currents at the power amplifier supply output of claim 29 further comprising:

generating a scaled high frequency ripple compensation current estimate based on the high frequency ripple compensation current.

31. The method for reducing high frequency ripple currents at the power amplifier supply output of claim 30 further comprising:

forming a feedback signal based on the scaled high frequency ripple compensation current estimate;

providing the feedback signal to the switch mode power supply converter; and adjusting the switching output voltage based on the feedback signal.

32. The method for reducing high frequency ripple currents at the power amplifier supply output of claim 26, wherein the switch mode power supply converter is configured to be a buck converter.

33. The method for reducing high frequency ripple currents at the power amplifier supply output of claim 26, wherein the switch mode power supply converter is configured to be a multi-level charge pump buck converter.

* * * * *